US012765211B2

(12) United States Patent
Helander et al.

(10) Patent No.: US 12,765,211 B2
(45) Date of Patent: Oct. 13, 2026

(54) DEVICE INCLUDING A LOW-INDEX COATING AND A RADIATION-MODIFYING LAYER

(71) Applicant: OTI LUMIONICS INC., Mississauga (CA)

(72) Inventors: Michael Helander, Mississauga (CA); Zhibin Wang, Mississauga (CA); Yi-Lu Chang, Mississauga (CA); Qi Wang, Mississauga (CA); Yingjie Zhang, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 298 days.

(21) Appl. No.: 18/030,984

(22) PCT Filed: Oct. 11, 2021

(86) PCT No.: PCT/IB2021/059300
§ 371 (c)(1),
(2) Date: Apr. 7, 2023

(87) PCT Pub. No.: WO2022/074637
PCT Pub. Date: Apr. 14, 2022

(65) Prior Publication Data

US 2023/0413649 A1 Dec. 21, 2023

Related U.S. Application Data

(60) Provisional application No. 63/181,100, filed on Apr. 28, 2021, provisional application No. 63/163,453,
(Continued)

(51) Int. Cl.

| | |
|---|---|
| ***H10K 59/38*** | (2023.01) |
| ***H10K 59/12*** | (2023.01) |
| ***H10K 59/80*** | (2023.01) |

(52) U.S. Cl.
CPC .......... *H10K 59/38* (2023.02); *H10K 59/879* (2023.02); *H10K 59/12* (2023.02)

(58) Field of Classification Search
CPC ................ H10K 59/38; H10K 59/879; H10K 2102/331; B82Y 30/00
See application file for complete search history.

(56) References Cited

U.S. PATENT DOCUMENTS

| | | | |
|---|---|---|---|
| 2,876,247 | A | 3/1959 | Ratz et al. |
| 3,094,536 | A | 6/1963 | Kenney et al. |

(Continued)

FOREIGN PATENT DOCUMENTS

| | | | |
|---|---|---|---|
| CA | 2074331 | A1 | 1/1993 |
| CA | 2544380 | C | 1/2014 |

(Continued)

OTHER PUBLICATIONS

International Preliminary Report on Patentability for PCT/IB2021/052980, dated Oct. 20, 2022.

(Continued)

*Primary Examiner* — Nduka E Ojeh
(74) *Attorney, Agent, or Firm* — Foley & Lardner LLP

(57) ABSTRACT

A semiconductor device having a plurality of layers deposited on a substrate and extending in at least one lateral aspect defined by a lateral axis thereof comprises at least one low(er)-index coating disposed on a first layer surface and at least one EM radiation-modifying layer embedded within the at least one low(er)-index coating and comprising at least one particle structure comprising a deposited material. Embedding the at least one particle structure of the at least one EM radiation-modifying layer within the at least one low(er)-index coating modifies the absorption spectrum of the at least one EM radiation-modifying layer for EM radiation passing at least partially therethrough at a non-zero (Continued)

angle relative to the lateral aspect therein in at least a part of the EM spectrum. A lower part comprising a first at least one low(er)-index coating may be disposed between the first layer surface and the at least one EM radiation-modifying layer and a second part comprising a second at least one low(er)-index coating may be disposed on the at least one EM radiation-modifying layer.

47 Claims, 77 Drawing Sheets

Related U.S. Application Data filed on Mar. 19, 2021, provisional application No. 63/158,185, filed on Mar. 8, 2021, provisional application No. 63/153,834, filed on Feb. 25, 2021, provisional application No. 63/141,857, filed on Jan. 26, 2021, provisional application No. 63/122,421, filed on Dec. 7, 2020, provisional application No. 63/107,393, filed on Oct. 29, 2020, provisional application No. 63/090,098, filed on Oct. 9, 2020.

(56) References Cited

U.S. PATENT DOCUMENTS 3,140,143 A 7/1964 Kaspaul et al.
3,169,933 A 2/1965 Kenney
3,597,457 A 8/1971 Robinson et al.
3,928,480 A 12/1975 Tabushi et al.
3,978,030 A 8/1976 Resnick
4,022,928 A 5/1977 Piwcyzk
4,119,635 A 10/1978 Omodei-Sale et al.
4,188,486 A 2/1980 Tsukamoto et al.
4,379,155 A 4/1983 Omodei-Sale et al.
4,431,786 A 2/1984 Squire
4,594,399 A 6/1986 Anderson et al.
4,622,179 A 11/1986 Eda
4,749,637 A 6/1988 Hayashida et al.
4,803,005 A 2/1989 Juhlke et al.
4,832,983 A 5/1989 Nagatomi et al.
4,885,211 A 12/1989 Tang et al.
4,927,735 A 5/1990 Era et al.
4,960,538 A 10/1990 Itoh et al.
5,009,986 A 4/1991 Kawaguchi et al.
5,015,758 A 5/1991 Pilgrim et al.
5,034,309 A 7/1991 Tai et al.
5,059,862 A 10/1991 Vanslyke et al.
5,061,596 A 10/1991 Albert et al.
5,075,203 A 12/1991 Katayose et al.
5,219,706 A 6/1993 Tai et al.
5,232,635 A 8/1993 Van Moer et al.
5,260,435 A 11/1993 Sawada et al.
5,378,589 A 1/1995 Sawada et al.
5,399,936 A 3/1995 Namiki et al.
5,420,301 A 5/1995 Ackermann et al.
5,428,152 A 6/1995 Hayashida et al.
5,446,142 A 8/1995 Itoh et al.
5,484,685 A 1/1996 Tai et al.
5,512,095 A 4/1996 Sens et al.
5,550,290 A 8/1996 Mizuta et al.
5,652,285 A 7/1997 Coggio et al.
5,739,545 A 4/1998 Guha et al.
5,824,799 A 10/1998 Buechler et al.
5,872,357 A 2/1999 Flanagan
5,883,177 A 3/1999 Colaianna et al.
5,895,228 A 4/1999 Biebuyck et al.
5,916,481 A 6/1999 Willey
5,935,721 A 8/1999 Shi et al.
5,997,754 A 12/1999 Yamaha et al.
6,016,033 A 1/2000 Jones et al.
6,171,715 B1 1/2001 Sato et al.
6,191,433 B1 2/2001 Roitman et al.
6,251,687 B1 6/2001 Buechler et al.
6,285,039 B1 9/2001 Kobori et al.
6,329,490 B1 12/2001 Yamashita et al.
6,361,886 B2 3/2002 Shi et al.
6,407,408 B1 6/2002 Zhou et al.
6,465,115 B2 10/2002 Shi et al.
6,468,590 B2 10/2002 Biebuyck et al.
6,472,468 B1 10/2002 Omura
6,517,958 B1 2/2003 Sellinger et al.
6,538,374 B2 3/2003 Hosokawa
6,608,009 B2 8/2003 Akada et al.
6,635,364 B1 10/2003 Igarashi
6,638,644 B2 10/2003 Zheng et al.
6,682,785 B2 1/2004 Wingen et al.
6,787,468 B2 9/2004 Kim et al.
6,794,061 B2 9/2004 Liao et al.
6,835,950 B2 12/2004 Brown et al.
6,852,429 B1 2/2005 Li et al.
6,878,469 B2 4/2005 Yoon et al.
6,899,963 B1 5/2005 Zheng et al.
6,900,470 B2 5/2005 Kobayashi et al.
6,927,270 B2 8/2005 Lichtenhan et al.
6,995,035 B2 2/2006 Cok et al.
7,018,713 B2 3/2006 Padiyath et al.
7,053,255 B2 5/2006 Ikeda et al.
7,056,601 B2 6/2006 Cosimbescu et al.
7,099,299 B2 8/2006 Liang et al.
7,105,298 B2 9/2006 Liu et al.
7,115,684 B2 10/2006 Vanspeybroeck et al.
7,160,819 B2 1/2007 Conley et al.
7,166,240 B2 1/2007 Ishida et al.
7,169,482 B2 1/2007 Aziz et al.
7,173,276 B2 2/2007 Choi et al.
7,175,815 B2 2/2007 Yamasaki et al.
7,192,659 B2 3/2007 Ricks et al.
7,193,015 B1 3/2007 Mabry et al.
7,217,683 B1 5/2007 Blanski et al.
7,252,893 B2 8/2007 Ricks et al.
7,259,267 B2 8/2007 Pleschke et al.
7,280,731 B2 10/2007 Rantala
7,306,856 B2 12/2007 Igarashi et al.
7,319,129 B2 1/2008 Yoshida et al.
7,326,293 B2 2/2008 Randall et al.
7,326,371 B2 2/2008 Conley et al.
7,361,796 B2 4/2008 Ikeda et al.
7,363,308 B2 4/2008 Dillon et al.
7,365,486 B2 4/2008 Lee et al.
7,373,060 B2 5/2008 Satake et al.
7,402,948 B2 7/2008 Yamazaki et al.
7,427,783 B2 9/2008 Lee et al.
7,449,509 B2 11/2008 Marks et al.
7,449,539 B2 11/2008 Morimoto et al.
7,470,315 B2 12/2008 Vonwiller et al.
7,479,462 B2 1/2009 Rantala et al.
7,491,975 B2 2/2009 Kubota
7,495,389 B2 2/2009 Noguchi et al.
7,504,526 B2 3/2009 Kubota et al.
7,579,304 B2 8/2009 Liu et al.
7,651,787 B2 1/2010 Seo et al.
7,670,695 B2 3/2010 Wakabayashi et al.
7,674,914 B2 3/2010 Egawa et al.
7,701,132 B2 4/2010 Oh
7,728,510 B2 6/2010 Oh
7,733,009 B2 6/2010 Kondakov et al.
7,776,457 B2 8/2010 Lee et al.
7,790,892 B2 9/2010 Ikeda et al.
7,816,667 B2 10/2010 Park et al.
7,816,861 B2 10/2010 Choi et al.
7,820,864 B2 10/2010 Umemoto
7,833,632 B2 11/2010 Kawamura et al.
7,839,074 B2 11/2010 Ikeda et al.
7,839,083 B2 11/2010 Kubota
7,851,071 B2 12/2010 Yamamoto et al.
7,867,629 B2 1/2011 Yamamoto et al.
7,887,931 B2 2/2011 Cosimbescu et al.
7,897,667 B2 3/2011 Mabry et al.
7,910,687 B2 3/2011 Busing et al.
7,919,196 B2 4/2011 Kim et al.
7,947,519 B2 5/2011 Lee et al.
7,947,974 B2 5/2011 Kondakov

(56) References Cited

U.S. PATENT DOCUMENTS 7,956,351 B2 6/2011 Choi
7,973,306 B2 7/2011 Kim et al.
7,986,672 B2 7/2011 Tiedemann et al.
7,998,540 B2 8/2011 Goulding et al.
7,999,459 B2 8/2011 Chun et al.
8,004,180 B2 8/2011 Seo
8,025,815 B2 9/2011 Kawamura et al.
8,030,838 B2 10/2011 Kwak et al.
8,044,580 B2 10/2011 Yamazaki et al.
8,071,226 B2 12/2011 Je et al.
8,076,839 B2 12/2011 Kuma et al.
8,089,066 B2 1/2012 Yamazaki et al.
8,097,349 B2 1/2012 Yamamoto et al.
8,115,376 B2 2/2012 Fujioka et al.
8,174,185 B2 5/2012 Park et al.
8,217,570 B2 7/2012 Kawamura et al.
8,222,634 B2 7/2012 Lee et al.
8,232,350 B2 7/2012 Fujita et al.
8,237,351 B2 8/2012 Sung et al.
8,257,620 B2 9/2012 Cranor et al.
8,278,378 B2 10/2012 Jung et al.
8,310,149 B2 11/2012 Lifka et al.
8,318,878 B2 11/2012 Sudo et al.
8,318,995 B2 11/2012 Kubota et al.
8,319,095 B2 11/2012 Sharma
8,343,637 B2 1/2013 Parham et al.
8,346,024 B2 1/2013 Vonwiller et al.
8,362,469 B2 1/2013 Suh
8,399,720 B2 3/2013 Umemoto
8,518,489 B2 8/2013 Shin et al.
8,530,596 B2 9/2013 Sano et al.
8,541,113 B2 9/2013 Je et al.
8,568,902 B2 10/2013 Kubota et al.
8,568,965 B2 10/2013 Kitamura et al.
8,586,202 B2 11/2013 Imai et al.
8,586,689 B2 11/2013 Jung et al.
8,586,703 B2 11/2013 Yang et al.
8,592,053 B2 11/2013 Kawakami et al.
8,618,595 B2 12/2013 Korgel et al.
8,629,222 B2 1/2014 Takizawa et al.
8,653,302 B2 2/2014 Umemoto
8,679,647 B2 3/2014 Pflumm et al.
8,679,656 B2 3/2014 Kobayashi et al.
8,703,303 B2 4/2014 Yamamoto et al.
8,729,530 B2 5/2014 Nagao et al.
8,759,818 B2 6/2014 Lecloux et al.
8,766,306 B2 7/2014 Lifka et al.
8,779,655 B2 7/2014 Nishimura
8,785,006 B2 7/2014 Ikeda et al.
8,795,422 B2 8/2014 Ganapathiappan et al.
8,795,847 B2 8/2014 Heil et al.
8,795,855 B2 8/2014 Klubek et al.
8,809,838 B2 8/2014 Jeong et al.
8,816,117 B2 8/2014 Marciniec et al.
8,852,756 B2 10/2014 Vestweber et al.
8,853,675 B2 10/2014 Kubota et al.
8,859,110 B2 10/2014 Fuchs et al.
8,859,111 B2 10/2014 Parham et al.
8,872,206 B2 10/2014 Chung et al.
8,877,356 B2 11/2014 Spindler et al.
8,883,324 B2 11/2014 Yabunouchi et al.
8,895,972 B2 11/2014 Chung et al.
8,921,840 B2 12/2014 Kim et al.
8,940,568 B2 1/2015 Mohan et al.
8,952,946 B2 2/2015 Fukunaga et al.
8,957,413 B2 2/2015 Song et al.
8,963,137 B2 2/2015 Lee et al.
8,963,414 B2 2/2015 Sawabe et al.
8,986,852 B2 3/2015 Stoessel et al.
8,987,516 B2 3/2015 Umemoto
8,993,123 B2 3/2015 Buesing et al.
8,994,010 B2 3/2015 Choi et al.
8,999,534 B2 4/2015 Shimokawa et al.
9,006,565 B2 4/2015 Abusleme et al.
9,018,621 B2 4/2015 Park et al.
9,024,301 B2 5/2015 Kawamura et al.
9,024,307 B2 5/2015 Lee
9,040,962 B2 5/2015 Adamovich et al.
9,051,344 B2 6/2015 Lin et al.
9,064,755 B2 6/2015 Park et al.
9,076,993 B2 7/2015 Kim et al.
9,088,004 B2 7/2015 Chung et al.
9,093,403 B2 7/2015 Kim et al.
9,093,669 B2 7/2015 Park et al.
9,105,865 B2 8/2015 Chung et al.
9,105,867 B2 8/2015 Verschuuren et al.
9,113,536 B2 8/2015 Oka et al.
9,117,402 B2 8/2015 Lee et al.
9,126,970 B2 9/2015 Pflumm et al.
9,169,274 B2 10/2015 Mizuki et al.
9,214,636 B2 12/2015 Takashima et al.
9,219,234 B2 12/2015 Kubota et al.
9,231,030 B2 1/2016 Choi et al.
9,245,934 B2 1/2016 Chung et al.
9,246,105 B2 1/2016 Sun
9,246,123 B2 1/2016 Kim et al.
9,257,654 B2 2/2016 Kawakami et al.
9,276,220 B2 3/2016 Kim et al.
9,287,339 B2 3/2016 Lee et al.
9,293,515 B2 3/2016 Choi et al.
9,312,312 B1 4/2016 Tsai et al.
9,331,308 B2 5/2016 Choi et al.
9,353,027 B2 5/2016 Kawamura et al.
9,444,064 B2 9/2016 Kaiser et al.
9,450,027 B2 9/2016 Pang et al.
9,450,033 B2 9/2016 Suh et al.
9,471,172 B2 10/2016 Sirois
9,478,591 B2 10/2016 Nam et al.
9,487,724 B2 11/2016 Xu et al.
9,502,601 B1 11/2016 Smith et al.
9,508,957 B2 11/2016 Forrest et al.
9,515,280 B2 12/2016 Yun et al.
9,537,116 B2 1/2017 Lamansky et al.
9,548,456 B2 1/2017 Lee et al.
9,570,471 B2 2/2017 Heo et al.
9,583,716 B2 2/2017 Ikeda et al.
9,595,681 B2 3/2017 Mujica-Fernaud et al.
9,608,207 B2 3/2017 Takaku et al.
9,624,193 B2 4/2017 Aihara et al.
9,627,645 B2 4/2017 Cui et al.
9,647,042 B2 5/2017 Li et al.
9,660,195 B2 5/2017 Kawamura et al.
9,666,812 B2 5/2017 Lee et al.
9,680,108 B2 6/2017 Ito et al.
9,711,734 B2 7/2017 Kim
9,711,751 B2 7/2017 Prushinskiy et al.
9,728,726 B2 8/2017 Takaku et al.
9,741,973 B2 8/2017 Song et al.
9,748,318 B2 8/2017 Shim et al.
9,755,165 B2 9/2017 Nishide et al.
9,776,983 B2 10/2017 Marchionni et al.
9,786,846 B2 10/2017 Kubota et al.
9,791,760 B2 10/2017 Garcia et al.
9,793,491 B2 10/2017 Hwang et al.
9,812,657 B2 11/2017 Kravchuk et al.
9,831,457 B2 11/2017 Kang et al.
9,859,520 B2 1/2018 Kim
9,882,140 B2 1/2018 Han et al.
9,890,181 B2 2/2018 Jiang et al.
9,892,672 B2 2/2018 Lee et al.
9,896,621 B2 2/2018 Kim et al.
9,954,039 B2 4/2018 Im et al.
9,960,216 B2 5/2018 Lee et al.
9,960,260 B2 5/2018 Xu et al.
9,960,386 B2 5/2018 Thompson et al.
9,966,554 B2 5/2018 Lee et al.
10,022,951 B2 7/2018 Liu et al.
10,026,906 B2 7/2018 Jung et al.
10,032,843 B2 7/2018 Lee et al.
10,062,850 B2 8/2018 Jung et al.
10,084,019 B2 9/2018 Shim et al.
10,084,150 B1 9/2018 Lou
10,090,370 B2 10/2018 Lee et al.
10,147,769 B2 12/2018 Lee et al.

(56) References Cited

U.S. PATENT DOCUMENTS 10,153,450 B2 12/2018 Kawamura
10,158,094 B2 12/2018 Lee et al.
10,174,059 B2 1/2019 Warner et al.
10,177,206 B2 1/2019 Jung et al.
10,181,573 B2 1/2019 Im et al.
10,186,568 B2 1/2019 Kim et al.
10,205,101 B2 2/2019 Kubota et al.
10,224,386 B2 3/2019 Rieutort-Louis et al.
10,240,084 B2 3/2019 Molaire
10,263,185 B2 4/2019 Matsueda et al.
10,269,879 B2 4/2019 Shim et al.
10,270,033 B2 4/2019 Chang et al.
10,276,641 B2 4/2019 Lou
10,297,762 B2 5/2019 Zeng et al.
10,355,246 B2 7/2019 Helander et al.
10,361,375 B2 7/2019 Zeng et al.
10,442,823 B2 10/2019 Warner et al.
10,501,583 B2 12/2019 Song et al.
10,550,226 B2 2/2020 Valsecchi et al.
10,584,137 B2 3/2020 Warner
10,683,313 B2 6/2020 Choi et al.
10,700,304 B2 6/2020 Helander et al.
10,707,531 B1 7/2020 Harrup et al.
11,008,350 B2 5/2021 Diao et al.
11,040,991 B2 6/2021 Hayashi et al.
11,043,636 B2 6/2021 Helander et al.
11,046,885 B2 6/2021 Kim et al.
11,145,702 B2 10/2021 Chang et al.
11,152,587 B2 10/2021 Chang et al.
11,222,929 B2 1/2022 Wang et al.
11,355,734 B2 6/2022 Abe et al.
11,469,377 B2 10/2022 Yokoyama et al.
11,634,578 B2 4/2023 Eckel et al.
11,856,841 B2 12/2023 Kim et al.
2001/0051447 A1 12/2001 Usami
2002/0090811 A1 7/2002 Kim et al.
2002/0189392 A1 12/2002 Molstad
2003/0196987 A1 10/2003 Kung et al.
2003/0219625 A1 11/2003 Wolk et al.
2004/0018383 A1 1/2004 Aziz et al.
2004/0058193 A1 3/2004 Hatwar
2004/0152910 A1 8/2004 Fukuoka et al.
2004/0249027 A1 12/2004 Lim et al.
2004/0249070 A1 12/2004 Lim et al.
2004/0266087 A1 12/2004 Greier et al.
2005/0052118 A1 3/2005 Lee et al.
2005/0070196 A1 3/2005 Colombo et al.
2005/0168140 A1 8/2005 Nakamura et al.
2005/0175770 A1 8/2005 Liao et al.
2005/0181232 A1 8/2005 Ricks et al.
2005/0211958 A1 9/2005 Conley et al.
2005/0234210 A1 10/2005 Andrianov et al.
2005/0245648 A1 11/2005 Lim et al.
2005/0261389 A1 11/2005 Bratolavsky et al.
2005/0271899 A1 12/2005 Brown et al.
2005/0284336 A1 12/2005 Okada et al.
2006/0019116 A1 1/2006 Conley et al.
2006/0043858 A1 3/2006 Ikeda et al.
2006/0125390 A1 6/2006 Oh
2006/0154105 A1 7/2006 Yamamoto et al.
2006/0182993 A1 8/2006 Ogata et al.
2006/0210830 A1 9/2006 Funahashi et al.
2006/0246315 A1 11/2006 Begley et al.
2007/0003785 A1 1/2007 Slusarek et al.
2007/0077349 A1 4/2007 Newman et al.
2007/0178405 A1 8/2007 Kanda et al.
2007/0252517 A1 11/2007 Owczarczyk et al.
2007/0252521 A1 11/2007 Kondakov et al.
2007/0289623 A1 12/2007 Atwater
2008/0001123 A1 1/2008 Inoue et al.
2008/0012475 A1 1/2008 Oyamada et al.
2008/0033530 A1 2/2008 Zberg et al.
2008/0093986 A1 4/2008 Inoue et al.
2008/0103315 A1 5/2008 Egawa et al.
2008/0105865 A1 5/2008 Oyamada et al.
2008/0166593 A1 7/2008 Stoessel et al.
2008/0203905 A1 8/2008 Je et al.
2008/0258612 A1 10/2008 Kim et al.
2008/0265216 A1 10/2008 Hartmann et al.
2008/0286607 A1 11/2008 Nomura et al.
2008/0286610 A1 11/2008 Deaton et al.
2008/0303422 A1 12/2008 Vestweber et al.
2009/0033208 A1 2/2009 Nagayama et al.
2009/0066239 A1 3/2009 Yabunouchi
2009/0081827 A1 3/2009 Yang et al.
2009/0093641 A1 4/2009 Dolbier et al.
2009/0145483 A1 6/2009 Kim et al.
2009/0179196 A1 7/2009 Adachi et al.
2009/0199903 A1 8/2009 Oyamada et al.
2009/0233125 A1 9/2009 Choi et al.
2009/0236973 A1 9/2009 Yabe et al.
2009/0239986 A1 9/2009 Kim et al.
2010/0052526 A1 3/2010 Je et al.
2010/0078628 A1 4/2010 Chi et al.
2010/0080903 A1 4/2010 Tamitsuji et al.
2010/0108997 A1 5/2010 Kim et al.
2010/0113767 A1 5/2010 Gessner et al.
2010/0117028 A1 5/2010 Takeshima et al.
2010/0122725 A1 5/2010 Buchine et al.
2010/0126567 A1 5/2010 Kaufman
2010/0151180 A1 6/2010 Bravet et al.
2010/0193768 A1 8/2010 Habib
2010/0239821 A1 9/2010 Nagao et al.
2010/0244197 A1 9/2010 Arena et al.
2010/0286407 A1 11/2010 Kimura et al.
2010/0314615 A1 12/2010 Mizuki et al.
2010/0327240 A1 12/2010 Cranor et al.
2011/0006289 A1 1/2011 Mizuki et al.
2011/0091508 A1 4/2011 Esfand et al.
2011/0094889 A1 4/2011 Shin et al.
2011/0102308 A1 5/2011 Nakamura et al.
2011/0121271 A1 5/2011 Jeon et al.
2011/0156016 A1 6/2011 Kawamura et al.
2011/0168257 A1 7/2011 Kochergin
2011/0175031 A1 7/2011 Matsunami et al.
2011/0186820 A1 8/2011 Kim et al.
2011/0198582 A1 8/2011 Horiuchi et al.
2011/0204772 A1 8/2011 Egawa
2011/0220886 A1 9/2011 Takeshima et al.
2011/0285276 A1 11/2011 Kadoma et al.
2011/0297923 A1 12/2011 Mizuki et al.
2011/0309307 A1 12/2011 Zeika et al.
2012/0003484 A1 1/2012 Roehrig et al.
2012/0018770 A1 1/2012 Lu et al.
2012/0032138 A1 2/2012 Kim et al.
2012/0043533 A1 2/2012 Mizuki et al.
2012/0049228 A1 3/2012 Walter et al.
2012/0056165 A1 3/2012 Kawamura et al.
2012/0091885 A1 4/2012 Kim et al.
2012/0104422 A1 5/2012 Lee et al.
2012/0112169 A1 5/2012 Mizuki et al.
2012/0126274 A1 5/2012 Jagt et al.
2012/0146030 A1 6/2012 You et al.
2012/0181520 A1 7/2012 Kim et al.
2012/0181922 A1 7/2012 Kawamura et al.
2012/0187541 A1 7/2012 Arena et al.
2012/0235561 A1 9/2012 Ikeda et al.
2012/0266939 A1 10/2012 Fortmann et al.
2012/0266957 A1 10/2012 Wang et al.
2013/0020561 A1 1/2013 Suzuki et al.
2013/0026526 A1 1/2013 Lahijani
2013/0049024 A1 2/2013 Choi et al.
2013/0056784 A1 3/2013 Lee et al.
2013/0112952 A1 5/2013 Adamovich et al.
2013/0153878 A1 6/2013 Mizuki et al.
2013/0175509 A1 7/2013 Kim et al.
2013/0187143 A1 7/2013 Nishimura et al.
2013/0200780 A1 8/2013 Lee
2013/0221338 A1 8/2013 Kawamura et al.
2014/0014925 A1 1/2014 Jung et al.
2014/0070236 A1 3/2014 Chen et al.
2014/0103306 A1 4/2014 Moon et al.
2014/0110680 A1 4/2014 Choe
2014/0148877 A1 5/2014 Pan et al.

(56) References Cited

U.S. PATENT DOCUMENTS

2014/0159011 A1 6/2014 Suzuki et al.
2014/0168742 A1 6/2014 Hashimura et al.
2014/0178752 A1 6/2014 Park et al.
2014/0183500 A1 7/2014 Ikeda et al.
2014/0186983 A1 7/2014 Kim et al.
2014/0209154 A1 7/2014 Naughton et al.
2014/0225085 A1 8/2014 Hayashi et al.
2014/0231761 A1 8/2014 Kim et al.
2014/0239273 A1 8/2014 Mizutani et al.
2014/0246657 A1 9/2014 Kim et al.
2014/0291653 A1 10/2014 Ikeda et al.
2014/0299866 A1 10/2014 Ruske et al.
2014/0318596 A1 10/2014 Juluri et al.
2014/0319511 A1 10/2014 Mizuki et al.
2014/0326985 A1 11/2014 Mizuki et al.
2014/0332772 A1 11/2014 Han et al.
2014/0346406 A1 11/2014 Lee et al.
2014/0346482 A1 11/2014 Mizuki et al.
2014/0353601 A1 12/2014 Cho et al.
2014/0367654 A1 12/2014 Kim et al.
2015/0036234 A1 2/2015 Ben-Yakar et al.
2015/0090989 A1 4/2015 Matsumoto et al.
2015/0097171 A1 4/2015 Kim et al.
2015/0123086 A1 5/2015 Lee
2015/0144902 A1 5/2015 Do et al.
2015/0144909 A1 5/2015 Byun et al.
2015/0171337 A1 6/2015 Jung et al.
2015/0184104 A1 7/2015 Xu et al.
2015/0194614 A1 7/2015 Kravchuk et al.
2015/0194634 A1 7/2015 Kang et al.
2015/0200312 A1 7/2015 Watanabe et al.
2015/0228923 A1 8/2015 Schicktanz et al.
2015/0284580 A1 10/2015 Kawakami et al.
2015/0287846 A1 10/2015 Helander et al.
2015/0303336 A1 10/2015 Lefebvre et al.
2015/0333266 A1 11/2015 Ito et al.
2015/0376768 A1 12/2015 Veres et al.
2016/0005976 A1 1/2016 Mizuki et al.
2016/0013438 A1 1/2016 Im et al.
2016/0043325 A1 2/2016 Gorohmaru et al.
2016/0079543 A1 3/2016 Park et al.
2016/0099411 A1 4/2016 Kim et al.
2016/0104859 A1 4/2016 Kim et al.
2016/0116696 A1* 4/2016 Modavis ................ H10K 50/85
385/14
2016/0133846 A1 5/2016 Ishii et al.
2016/0149156 A1 5/2016 Kim et al.
2016/0155952 A1 6/2016 Hwang et al.
2016/0155979 A1 6/2016 Yim et al.
2016/0163770 A1 6/2016 Kim et al.
2016/0180763 A1 6/2016 Park et al.
2016/0181527 A1 6/2016 Mizuki et al.
2016/0181543 A1 6/2016 Ito et al.
2016/0197308 A1 7/2016 Jeong
2016/0211454 A1 7/2016 Kim et al.
2016/0211458 A1 7/2016 Ito et al.
2016/0211459 A1 7/2016 Ito et al.
2016/0222295 A1 8/2016 Lo et al.
2016/0225992 A1 8/2016 Ito et al.
2016/0233437 A1 8/2016 Suzuki et al.
2016/0240821 A1 8/2016 Carroll et al.
2016/0260901 A1 9/2016 Kim et al.
2016/0267830 A1 9/2016 Kimura
2016/0268520 A1 9/2016 Mizuki et al.
2016/0284998 A1 9/2016 Kawamura et al.
2016/0293888 A1 10/2016 Shim et al.
2016/0308137 A1 10/2016 Park et al.
2016/0308162 A1 10/2016 Yoo et al.
2016/0329521 A1 11/2016 Kim et al.
2016/0333137 A1 11/2016 Pan
2016/0351114 A1 12/2016 Lee
2016/0351638 A1 12/2016 Im et al.
2016/0351818 A1 12/2016 Kim et al.
2016/0372524 A1 12/2016 Yun et al.
2016/0380198 A1 12/2016 Mizuki et al.
2016/0380235 A1 12/2016 Kim et al.
2017/0012221 A1 1/2017 Buesing et al.
2017/0018733 A1 1/2017 Jin et al.
2017/0033166 A1 2/2017 Shim et al.
2017/0033317 A1* 2/2017 Kajimoto ............... H10K 50/82
2017/0062755 A1 3/2017 Im et al.
2017/0090082 A1 3/2017 Cheah et al.
2017/0090083 A1 3/2017 Takishita et al.
2017/0100607 A1 4/2017 Pan et al.
2017/0104166 A1 4/2017 Jeong et al.
2017/0110689 A1 4/2017 Yang et al.
2017/0117469 A1 4/2017 Ito et al.
2017/0125495 A1 5/2017 Lee et al.
2017/0125506 A1 5/2017 Kim
2017/0125687 A1 5/2017 Ikeda et al.
2017/0125703 A1 5/2017 Suzuki et al.
2017/0155078 A1 6/2017 Lee
2017/0162111 A1 6/2017 Kang et al.
2017/0170246 A1 6/2017 Im et al.
2017/0179397 A1 6/2017 Kim et al.
2017/0179402 A1 6/2017 Kim et al.
2017/0183291 A1 6/2017 Ito et al.
2017/0186831 A1 6/2017 Nam et al.
2017/0190610 A1 7/2017 Joseph et al.
2017/0197998 A1 7/2017 Pan
2017/0220844 A1 8/2017 Jones et al.
2017/0222155 A1 8/2017 Cha et al.
2017/0222188 A1 8/2017 Lee et al.
2017/0222190 A1 8/2017 Kwon et al.
2017/0237023 A1 8/2017 Kim et al.
2017/0256722 A1 9/2017 Shim et al.
2017/0256747 A1 9/2017 Lee et al.
2017/0279064 A1 9/2017 Wallikewitz et al.
2017/0309822 A1 10/2017 Mizuki et al.
2017/0313650 A1 11/2017 Stoessel et al.
2017/0317154 A1 11/2017 Heo
2017/0317284 A1 11/2017 Mizuki et al.
2017/0324045 A1 11/2017 Takahashi et al.
2017/0325314 A1* 11/2017 Uchida .................. H05B 33/24
2017/0330797 A1 11/2017 Lai et al.
2017/0338438 A1 11/2017 Kwon et al.
2017/0342318 A1 11/2017 Kim et al.
2017/0357139 A1 12/2017 Smith et al.
2018/0006239 A1 1/2018 Yokoyama et al.
2018/0006264 A1 1/2018 Lee et al.
2018/0006267 A1 1/2018 Sakamoto
2018/0018838 A1 1/2018 Fankhauser et al.
2018/0019398 A1 1/2018 Mizuki et al.
2018/0019408 A1 1/2018 Ko
2018/0033362 A1 2/2018 Yamazaki et al.
2018/0040685 A1 2/2018 Yeo et al.
2018/0061323 A1 3/2018 Kwon et al.
2018/0062088 A1 3/2018 Cho et al.
2018/0062104 A1 3/2018 Kwon et al.
2018/0083217 A1 3/2018 Chung et al.
2018/0090063 A1 3/2018 Ying et al.
2018/0102499 A1 4/2018 Pyo et al.
2018/0120492 A1 5/2018 Lee et al.
2018/0123054 A1 5/2018 Gorohmaru et al.
2018/0123055 A1 5/2018 Park et al.
2018/0123078 A1 5/2018 Byun et al.
2018/0127385 A1 5/2018 Jung et al.
2018/0130949 A1 5/2018 Kim et al.
2018/0145262 A1 5/2018 Zeng et al.
2018/0148586 A1 5/2018 Reichert et al.
2018/0158881 A1 6/2018 Lim et al.
2018/0166518 A1 6/2018 Kim
2018/0197927 A1 7/2018 Tan et al.
2018/0198052 A1 7/2018 Park
2018/0198076 A1 7/2018 Takahashi et al.
2018/0198080 A1 7/2018 Noh et al.
2018/0212060 A1 7/2018 Kang et al.
2018/0219058 A1 8/2018 Xiang et al.
2018/0226455 A1 8/2018 Kim et al.
2018/0240990 A1 8/2018 Choi et al.
2018/0261797 A1 9/2018 Lee
2018/0265777 A1 9/2018 Ambrosek et al.
2018/0273563 A1 9/2018 Choi et al.
2018/0294436 A1 10/2018 Choi et al.

(56) References Cited

U.S. PATENT DOCUMENTS

2018/0306949 A1 10/2018 Matsumoto et al.
2018/0309071 A1 10/2018 Jeon et al.
2018/0309073 A1 10/2018 Nakamura et al.
2018/0309085 A1 10/2018 Park et al.
2018/0315934 A1 11/2018 Nakata et al.
2018/0315936 A1 11/2018 Hirade et al.
2018/0323377 A1 11/2018 Mizuki et al.
2018/0337219 A1 11/2018 Rhee et al.
2018/0340032 A1 11/2018 Campbell et al.
2018/0342682 A1 11/2018 Park et al.
2018/0349665 A1 12/2018 He
2018/0366678 A1 12/2018 Chi et al.
2019/0013342 A1 1/2019 Kato et al.
2019/0036032 A1 1/2019 Denker et al.
2019/0081111 A1 3/2019 Lee et al.
2019/0088204 A1 3/2019 Zhang et al.
2019/0106611 A1 4/2019 Yang et al.
2019/0127328 A1 5/2019 Orimoto et al.
2019/0130822 A1 5/2019 Jung et al.
2019/0131365 A1 5/2019 Jung
2019/0135827 A1 5/2019 Altenbach et al.
2019/0148666 A1 5/2019 Li et al.
2019/0157620 A1 5/2019 Forrest et al.
2019/0207132 A1 7/2019 Park et al.
2019/0207156 A1 7/2019 Gil
2019/0219875 A1* 7/2019 Jung ................ G02F 1/133617
2019/0237517 A1 8/2019 Hack
2019/0250450 A1 8/2019 Li
2019/0253591 A1 8/2019 Chen et al.
2019/0273125 A1 9/2019 Takechi
2019/0280026 A1 9/2019 Takeuchi
2019/0317629 A1 10/2019 Jung et al.
2019/0325805 A1 10/2019 Moon et al.
2019/0340980 A1 11/2019 Yum et al.
2019/0341435 A1 11/2019 Chang et al.
2019/0341575 A1 11/2019 Chung et al.
2019/0348627 A1 11/2019 Lee et al.
2019/0355288 A1 11/2019 Choi et al.
2019/0363156 A1 11/2019 Ohara et al.
2019/0386242 A1 12/2019 Choi et al.
2020/0035951 A1 1/2020 Cheon et al.
2020/0041709 A1* 2/2020 Lee ........................ G02B 6/005
2020/0044197 A1 2/2020 Shedletsky et al.
2020/0064968 A1 2/2020 Kim et al.
2020/0075683 A1 3/2020 Polyakov et al.
2020/0075693 A1 3/2020 Polyakov et al.
2020/0075864 A1 3/2020 Helander et al.
2020/0099836 A1 3/2020 Chao
2020/0105843 A1 4/2020 Baek et al.
2020/0111401 A1 4/2020 Zhao et al.
2020/0124927 A1 4/2020 Kim et al.
2020/0133040 A1 4/2020 Bang et al.
2020/0136077 A1 4/2020 Lee et al.
2020/0144429 A1 5/2020 Naughton et al.
2020/0159284 A1 5/2020 Mathew et al.
2020/0176530 A1 6/2020 Baek
2020/0194676 A1 6/2020 Chang et al.
2020/0194730 A1 6/2020 Park et al.
2020/0209729 A1 7/2020 Chen et al.
2020/0212130 A1 7/2020 Kim et al.
2020/0212131 A1 7/2020 Kim et al.
2020/0219915 A1 7/2020 Kim et al.
2020/0231437 A1 7/2020 Enomura et al.
2020/0236259 A1 7/2020 Nakamura et al.
2020/0243622 A1* 7/2020 Chung ............... H10K 59/8791
2020/0265798 A1 8/2020 Choi et al.
2020/0280017 A1 9/2020 Helander et al.
2020/0286972 A1 9/2020 Seo et al.
2020/0295093 A1 9/2020 Thompson et al.
2020/0295293 A1 9/2020 Menon et al.
2020/0295307 A1 9/2020 Fusella et al.
2020/0312926 A1 10/2020 Bae et al.
2020/0328366 A1 10/2020 Layton et al.
2020/0357871 A1 11/2020 Chung et al.
2020/0363894 A1 11/2020 Park et al.
2020/0365664 A1 11/2020 Jeon et al.
2020/0365667 A1 11/2020 Jo et al.
2020/0365674 A1 11/2020 Jeon et al.
2020/0381489 A1 12/2020 Hwang et al.
2020/0388791 A1* 12/2020 Zhang ................ H10K 85/6572
2020/0394964 A1 12/2020 Hyun et al.
2020/0395430 A1 12/2020 Jeong et al.
2020/0403024 A1 12/2020 Lin et al.
2020/0409412 A1 12/2020 Kim et al.
2020/0411605 A1 12/2020 Moon et al.
2020/0411606 A1 12/2020 Kim et al.
2021/0013273 A1 1/2021 Jeong et al.
2021/0018805 A1 1/2021 Baek et al.
2021/0020704 A1 1/2021 Kim
2021/0028244 A1 1/2021 Jeong et al.
2021/0028248 A1 1/2021 Kim et al.
2021/0036070 A1 2/2021 Jeon et al.
2021/0043875 A1 2/2021 Lee et al.
2021/0056884 A1 2/2021 Choi et al.
2021/0057494 A1 2/2021 Chung et al.
2021/0057496 A1 2/2021 Bae et al.
2021/0065620 A1 3/2021 Yang et al.
2021/0066648 A1 3/2021 Chung et al.
2021/0066661 A1 3/2021 Kim et al.
2021/0083019 A1 3/2021 Jang et al.
2021/0091157 A1 3/2021 Oh et al.
2021/0107825 A1 4/2021 Zhang et al.
2021/0118961 A1 4/2021 Lee et al.
2021/0126059 A1 4/2021 Chang et al.
2021/0134901 A1 5/2021 Sung et al.
2021/0134926 A1 5/2021 Song
2021/0143231 A1 5/2021 Chae et al.
2021/0143244 A1 5/2021 Kim et al.
2021/0151544 A1 5/2021 Kim et al.
2021/0167320 A1 6/2021 Kim et al.
2021/0175297 A1 6/2021 Kim
2021/0175298 A1 6/2021 Park
2021/0183983 A1 6/2021 Bang et al.
2021/0183986 A1 6/2021 Shin et al.
2021/0183991 A1 6/2021 Shin et al.
2021/0184155 A1 6/2021 Chae et al.
2021/0191552 A1 6/2021 Bok et al.
2021/0193688 A1 6/2021 Shin et al.
2021/0193765 A1 6/2021 Kim et al.
2021/0193769 A1 6/2021 Bok et al.
2021/0193781 A1 6/2021 Shim et al.
2021/0200366 A1 7/2021 Bok et al.
2021/0202532 A1 7/2021 Kim et al.
2021/0202595 A1 7/2021 Lee et al.
2021/0202617 A1 7/2021 Cho
2021/0202628 A1 7/2021 Kim et al.
2021/0202641 A1 7/2021 Shin et al.
2021/0202680 A1 7/2021 Shin et al.
2021/0202683 A1 7/2021 Lee et al.
2021/0202880 A1 7/2021 Kim et al.
2021/0210564 A1 7/2021 Chae et al.
2021/0210584 A1 7/2021 Youn et al.
2021/0225292 A1 7/2021 Park et al.
2021/0225958 A1 7/2021 Ko et al.
2021/0225970 A1 7/2021 Ryu et al.
2021/0233976 A1 7/2021 Lee
2021/0240026 A1 8/2021 Yeke Yazdandoost et al.
2021/0241671 A1 8/2021 Lee et al.
2021/0241719 A1 8/2021 Choi et al.
2021/0249492 A1 8/2021 Choi et al.
2021/0249633 A1 8/2021 Fusella et al.
2021/0249635 A1 8/2021 Cho et al.
2021/0257419 A1 8/2021 Jang et al.
2021/0257594 A1 8/2021 Kim et al.
2021/0265431 A1 8/2021 Yun et al.
2021/0280825 A1 9/2021 Beon et al.
2021/0305537 A1* 9/2021 Song ................... H10K 59/879
2021/0313410 A1 10/2021 Kim et al.
2021/0320278 A1 10/2021 Chung et al.
2021/0351261 A1 11/2021 Kim et al.
2021/0359025 A1 11/2021 Jung et al.
2021/0371967 A1 12/2021 Varagnolo et al.
2021/0376007 A1 12/2021 Choi et al.
2021/0376300 A1 12/2021 Moon et al.

(56) References Cited

U.S. PATENT DOCUMENTS

| | | | |
|---|---|---|---|
| 2021/0376301 | A1 | 12/2021 | Kim et al. |
| 2021/0408167 | A1 | 12/2021 | Kim et al. |
| 2022/0013749 | A1 | 1/2022 | Kim et al. |
| 2022/0025134 | A1 | 1/2022 | Wehrmann et al. |
| 2022/0045144 | A1 | 2/2022 | Lee et al. |
| 2022/0045160 | A1 | 2/2022 | Lee et al. |
| 2022/0052125 | A1 | 2/2022 | Choi et al. |
| 2022/0052291 | A1 | 2/2022 | Lee et al. |
| 2022/0068830 | A1 | 3/2022 | Lee et al. |
| 2022/0069048 | A1 | 3/2022 | Bok et al. |
| 2022/0085326 | A1 | 3/2022 | Chai et al. |
| 2022/0093697 | A1 | 3/2022 | Hong et al. |
| 2022/0102446 | A1 | 3/2022 | Baek et al. |
| 2022/0106477 | A1 | 4/2022 | Lee et al. |
| 2022/0123081 | A1 | 4/2022 | Park et al. |
| 2022/0123260 | A1 | 4/2022 | Chung et al. |
| 2022/0149316 | A1 | 5/2022 | Kim et al. |
| 2022/0223667 | A1 | 7/2022 | Choi et al. |
| 2022/0225006 | A1 | 7/2022 | Allec et al. |
| 2022/0271254 | A1 | 8/2022 | Ran et al. |
| 2022/0372180 | A1 | 11/2022 | Abe et al. |
| 2022/0382067 | A1 | 12/2022 | Mermillod-Anselme et al. |
| 2022/0392963 | A1 | 12/2022 | Chen et al. |
| 2022/0398759 | A1 | 12/2022 | Schindler et al. |
| 2022/0415871 | A1 | 12/2022 | Steckel |
| 2023/0008148 | A1 | 1/2023 | Hyun et al. |
| 2023/0022628 | A1 | 1/2023 | Abe et al. |
| 2023/0043940 | A1 | 2/2023 | Bae et al. |
| 2023/0048617 | A1 | 2/2023 | Kim et al. |
| 2023/0053320 | A1 | 2/2023 | Park et al. |
| 2023/0057334 | A1 | 2/2023 | Yang et al. |
| 2023/0065135 | A1 | 3/2023 | Kim et al. |
| 2023/0087411 | A1 | 3/2023 | Niu et al. |
| 2023/0087691 | A1 | 3/2023 | Chen et al. |
| 2023/0094087 | A1 | 3/2023 | Ji et al. |
| 2023/0094620 | A1 | 3/2023 | Lee et al. |
| 2023/0103050 | A1 | 3/2023 | Lee et al. |
| 2023/0105374 | A1 | 4/2023 | Jeong et al. |
| 2023/0112955 | A1 | 4/2023 | Lee et al. |
| 2023/0113586 | A1 | 4/2023 | Hong et al. |
| 2023/0117800 | A1 | 4/2023 | Kim et al. |
| 2023/0143745 | A1 | 5/2023 | Lee et al. |
| 2023/0152640 | A1 | 5/2023 | Woo et al. |
| 2023/0157052 | A1 | 5/2023 | Kim et al. |
| 2023/0157103 | A1 | 5/2023 | Lee et al. |
| 2023/0165050 | A1 | 5/2023 | Bok et al. |
| 2023/0172026 | A1 | 6/2023 | Lee |
| 2023/0172053 | A1 | 6/2023 | Ko et al. |
| 2023/0172553 | A1 | 6/2023 | An et al. |
| 2023/0184938 | A1 | 6/2023 | Hannan et al. |
| 2023/0189547 | A1 | 6/2023 | Lee et al. |
| 2023/0189616 | A1 | 6/2023 | Kim et al. |
| 2023/0200196 | A1 | 6/2023 | Sung et al. |
| 2023/0209891 | A1 | 6/2023 | Ma |
| 2023/0226643 | A1 | 7/2023 | Kim et al. |
| 2023/0258785 | A1 | 8/2023 | Mandai et al. |
| 2023/0276675 | A1 | 8/2023 | Jing |
| 2023/0284481 | A1 | 9/2023 | Kim et al. |
| 2023/0288252 | A1 | 9/2023 | Eaton et al. |
| 2023/0292549 | A1 | 9/2023 | Seo et al. |
| 2023/0292573 | A1 | 9/2023 | Lee et al. |
| 2023/0320178 | A1 | 10/2023 | Park et al. |
| 2023/0329035 | A1 | 10/2023 | Yun et al. |
| 2023/0371348 | A1 | 11/2023 | Wang et al. |
| 2024/0122065 | A1 | 4/2024 | Matsumoto et al. |

FOREIGN PATENT DOCUMENTS

| | | | |
|---|---|---|---|
| CA | 2890253 | A1 | 5/2014 |
| CN | 1284508 | A | 2/2001 |
| CN | 1460682 | A | 12/2003 |
| CN | 1695257 | A | 11/2005 |
| CN | 1866572 | A | 11/2006 |
| CN | 1866575 | A | 11/2006 |
| CN | 1961436 | A | 5/2007 |
| CN | 101299419 | A | 11/2008 |
| CN | 100526288 | C | 8/2009 |
| CN | 101617064 | A | 12/2009 |
| CN | 101730938 | A | 6/2010 |
| CN | 101932618 | A | 12/2010 |
| CN | 102099942 | A | 6/2011 |
| CN | 1625552 | B | 9/2011 |
| CN | 1696124 | B | 2/2012 |
| CN | 1784388 | B | 2/2012 |
| CN | 102455215 | A | 5/2012 |
| CN | 102456713 | A | 5/2012 |
| CN | 102618042 | | 8/2012 |
| CN | 102738409 | A | 10/2012 |
| CN | 101812021 | B | 12/2012 |
| CN | 102352090 | B | 4/2013 |
| CN | 101267022 | B | 8/2014 |
| CN | 103992481 | A | 8/2014 |
| CN | 104037359 | A | 9/2014 |
| CN | 104103766 | A | 10/2014 |
| CN | 104347803 | A | 2/2015 |
| CN | 104769149 | A | 7/2015 |
| CN | 101503393 | B | 8/2015 |
| CN | 204651324 | U | 9/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 105580144 | A | 5/2016 |
| CN | 105720207 | A | 6/2016 |
| CN | 103843153 | B | 7/2016 |
| CN | 106206995 | A | 12/2016 |
| CN | 106317025 | A | 1/2017 |
| CN | 104672458 | B | 2/2017 |
| CN | 103788087 | B | 5/2017 |
| CN | 104558016 | B | 6/2017 |
| CN | 106946859 | A | 7/2017 |
| CN | 106992267 | A | 7/2017 |
| CN | 107021986 | A | 8/2017 |
| CN | 107273826 | A | 10/2017 |
| CN | 107424955 | A | 12/2017 |
| CN | 107522744 | A | 12/2017 |
| CN | 107564945 | A | 1/2018 |
| CN | 107573329 | A | 1/2018 |
| CN | 107573485 | A | 1/2018 |
| CN | 107573582 | A | 1/2018 |
| CN | 107808895 | A | 3/2018 |
| CN | 107946480 | A | 4/2018 |
| CN | 105849930 | B | 6/2018 |
| CN | 105671525 | B | 8/2018 |
| CN | 108364967 | A | 8/2018 |
| CN | 108376019 | A | 8/2018 |
| CN | 108389878 | A | 8/2018 |
| CN | 108418928 | A | 8/2018 |
| CN | 108431981 | A | 8/2018 |
| CN | 105359289 | B | 9/2018 |
| CN | 108496098 | A | 9/2018 |
| CN | 108496260 | A | 9/2018 |
| CN | 108630830 | A | 10/2018 |
| CN | 108767136 | A | 11/2018 |
| CN | 108881531 | A | 11/2018 |
| CN | 108900659 | A | 11/2018 |
| CN | 106189093 | B | 12/2018 |
| CN | 109119446 | B | 1/2019 |
| CN | 109299631 | A | 2/2019 |
| CN | 106046688 | B | 3/2019 |
| CN | 109461758 | A | 3/2019 |
| CN | 109585663 | A | 4/2019 |
| CN | 109599030 | A | 4/2019 |
| CN | 109742132 | A | 5/2019 |
| CN | 109817672 | A | 5/2019 |
| CN | 109817694 | A | 5/2019 |
| CN | 109830495 | A | 5/2019 |
| CN | 109920931 | A | 6/2019 |
| CN | 109950293 | A | 6/2019 |
| CN | 110061014 | A | 7/2019 |
| CN | 110071150 | B | 7/2019 |
| CN | 209087844 | U | 7/2019 |
| CN | 110112182 | A | 8/2019 |
| CN | 110144551 | A | 8/2019 |

(56) References Cited

FOREIGN PATENT DOCUMENTS

| | | | |
|---|---|---|---|
| CN | 110265474 | A | 9/2019 |
| CN | 110275358 | A | 9/2019 |
| CN | 110277505 | A | 9/2019 |
| CN | 110301053 | A | 10/2019 |
| CN | 110323259 | A | 10/2019 |
| CN | 110365819 | A | 10/2019 |
| CN | 110391348 | A | 10/2019 |
| CN | 110416269 | A | 11/2019 |
| CN | 110429117 | A | 11/2019 |
| CN | 110444125 | A | 11/2019 |
| CN | 110459175 | A | 11/2019 |
| CN | 110473898 | A | 11/2019 |
| CN | 110473988 | A | 11/2019 |
| CN | 110491910 | A | 11/2019 |
| CN | 110491917 | A | 11/2019 |
| CN | 110491918 | A | 11/2019 |
| CN | 110492018 | A | 11/2019 |
| CN | 110518034 | A | 11/2019 |
| CN | 110570774 | A | 12/2019 |
| CN | 110619813 | A | 12/2019 |
| CN | 110620129 | A | 12/2019 |
| CN | 110634930 | A | 12/2019 |
| CN | 110649179 | A | 1/2020 |
| CN | 110660823 | A | 1/2020 |
| CN | 110676296 | A | 1/2020 |
| CN | 110718580 | A | 1/2020 |
| CN | 110727142 | A | 1/2020 |
| CN | 110752249 | A | 2/2020 |
| CN | 110767662 | A | 2/2020 |
| CN | 110767682 | A | 2/2020 |
| CN | 110767708 | A | 2/2020 |
| CN | 110767709 | A | 2/2020 |
| CN | 110767713 | A | 2/2020 |
| CN | 110767720 | A | 2/2020 |
| CN | 110767736 | A | 2/2020 |
| CN | 110767739 | A | 2/2020 |
| CN | 110767830 | A | 2/2020 |
| CN | 110767835 | A | 2/2020 |
| CN | 110767836 | A | 2/2020 |
| CN | 110767844 | A | 2/2020 |
| CN | 110780375 | A | 2/2020 |
| CN | 110782807 | B | 2/2020 |
| CN | 110783384 | A | 2/2020 |
| CN | 110783390 | A | 2/2020 |
| CN | 110783394 | A | 2/2020 |
| CN | 110783484 | A | 2/2020 |
| CN | 110783485 | A | 2/2020 |
| CN | 110783486 | A | 2/2020 |
| CN | 110785867 | A | 2/2020 |
| CN | 110828533 | A | 2/2020 |
| CN | 110828699 | A | 2/2020 |
| CN | 110832660 | A | 2/2020 |
| CN | 110854176 | A | 2/2020 |
| CN | 210052743 | U | 2/2020 |
| CN | 110867523 | A | 3/2020 |
| CN | 110867527 | A | 3/2020 |
| CN | 110890412 | A | 3/2020 |
| CN | 110914891 | A | 3/2020 |
| CN | 110923625 | A | 3/2020 |
| CN | 110928453 | A | 3/2020 |
| CN | 110931538 | A | 3/2020 |
| CN | 110943116 | A | 3/2020 |
| CN | 107887404 | B | 4/2020 |
| CN | 110956925 | A | 4/2020 |
| CN | 110970480 | A | 4/2020 |
| CN | 110989861 | A | 4/2020 |
| CN | 111009619 | A | 4/2020 |
| CN | 111020489 | A | 4/2020 |
| CN | 111028678 | A | 4/2020 |
| CN | 111029381 | A | 4/2020 |
| CN | 111029382 | A | 4/2020 |
| CN | 111029391 | A | 4/2020 |
| CN | 111046599 | A | 4/2020 |
| CN | 111048564 | A | 4/2020 |
| CN | 111063717 | A | 4/2020 |
| CN | 210272432 | U | 4/2020 |
| CN | 111129100 | A | 5/2020 |
| CN | 111129102 | A | 5/2020 |
| CN | 111142180 | A | 5/2020 |
| CN | 111155055 | A | 5/2020 |
| CN | 111180490 | A | 5/2020 |
| CN | 111192902 | A | 5/2020 |
| CN | 210467844 | U | 5/2020 |
| CN | 210575958 | U | 5/2020 |
| CN | 111046599 | B | 6/2020 |
| CN | 111223908 | A | 6/2020 |
| CN | 111261104 | A | 6/2020 |
| CN | 111261641 | A | 6/2020 |
| CN | 111292617 | A | 6/2020 |
| CN | 111293233 | A | 6/2020 |
| CN | 111293235 | A | 6/2020 |
| CN | 111293236 | A | 6/2020 |
| CN | 111312795 | A | 6/2020 |
| CN | 111341936 | A | 6/2020 |
| CN | 112928147 | A | 6/2020 |
| CN | 210668382 | U | 6/2020 |
| CN | 111383543 | A | 7/2020 |
| CN | 111383579 | A | 7/2020 |
| CN | 111403621 | A | 7/2020 |
| CN | 111435952 | A | 7/2020 |
| CN | 111435953 | A | 7/2020 |
| CN | 111490069 | A | 8/2020 |
| CN | 111524460 | A | 8/2020 |
| CN | 111524469 | A | 8/2020 |
| CN | 111554716 | A | 8/2020 |
| CN | 111584725 | A | 8/2020 |
| CN | 111584748 | A | 8/2020 |
| CN | 109449178 | B | 9/2020 |
| CN | 111640882 | A | 9/2020 |
| CN | 111668240 | A | 9/2020 |
| CN | 111682055 | A | 9/2020 |
| CN | 111682120 | A | 9/2020 |
| CN | 111710798 | A | 9/2020 |
| CN | 111725288 | A | 9/2020 |
| CN | 111739921 | A | 10/2020 |
| CN | 111739924 | A | 10/2020 |
| CN | 111755493 | A | 10/2020 |
| CN | 111755623 | A | 10/2020 |
| CN | 111799374 | A | 10/2020 |
| CN | 111834547 | A | 10/2020 |
| CN | 111862875 | A | 10/2020 |
| CN | 111863900 | A | 10/2020 |
| CN | 111863911 | A | 10/2020 |
| CN | 110783484 | B | 11/2020 |
| CN | 111883559 | A | 11/2020 |
| CN | 111883560 | A | 11/2020 |
| CN | 111900190 | A | 11/2020 |
| CN | 111987120 | A | 11/2020 |
| CN | 112002749 | A | 11/2020 |
| CN | 110783386 | B | 12/2020 |
| CN | 112037704 | A | 12/2020 |
| CN | 112054048 | A | 12/2020 |
| CN | 112071886 | A | 12/2020 |
| CN | 112071887 | A | 12/2020 |
| CN | 112103318 | A | 12/2020 |
| CN | 112159594 | A | 1/2021 |
| CN | 112234082 | A | 1/2021 |
| CN | 112271263 | A | 1/2021 |
| CN | 112310325 | A | 2/2021 |
| CN | 112382651 | A | 2/2021 |
| CN | 112420618 | A | 2/2021 |
| CN | 108807487 | B | 3/2021 |
| CN | 109728048 | B | 3/2021 |
| CN | 109860237 | B | 3/2021 |
| CN | 112436029 | A | 3/2021 |
| CN | 112436030 | A | 3/2021 |
| CN | 112436031 | A | 3/2021 |
| CN | 112436032 | A | 3/2021 |
| CN | 112562518 | A | 3/2021 |
| CN | 112635533 | A | 4/2021 |
| CN | 112687193 | A | 4/2021 |
| CN | 111192902 | B | 5/2021 |
| CN | 112838115 | A | 5/2021 |
| CN | 112861763 | A | 5/2021 |

(56) References Cited

FOREIGN PATENT DOCUMENTS

| | | | |
|---|---|---|---|
| CN | 112864186 | A | 5/2021 |
| CN | 112864211 | A | 5/2021 |
| CN | 112864216 | A | 5/2021 |
| CN | 112864338 | A | 5/2021 |
| CN | 112885876 | A | 6/2021 |
| CN | 112885976 | A | 6/2021 |
| CN | 112928149 | A | 6/2021 |
| CN | 112928225 | A | 6/2021 |
| CN | 112951878 | A | 6/2021 |
| CN | 112952021 | A | 6/2021 |
| CN | 112992991 | A | 6/2021 |
| CN | 113013360 | A | 6/2021 |
| CN | 113053978 | A | 6/2021 |
| CN | 113053985 | A | 6/2021 |
| CN | 113054133 | A | 6/2021 |
| CN | 113054134 | A | 6/2021 |
| CN | 113066940 | A | 7/2021 |
| CN | 113077749 | A | 7/2021 |
| CN | 113078199 | A | 7/2021 |
| CN | 113096581 | A | 7/2021 |
| CN | 113126825 | A | 7/2021 |
| CN | 111341817 | B | 8/2021 |
| CN | 113241367 | A | 8/2021 |
| CN | 113327972 | A | 8/2021 |
| CN | 113327973 | A | 8/2021 |
| CN | 113383611 | A | 9/2021 |
| CN | 113394261 | A | 9/2021 |
| CN | 113416925 | A | 9/2021 |
| CN | 113497206 | A | 10/2021 |
| CN | 113629205 | A | 11/2021 |
| CN | 113629207 | A | 11/2021 |
| CN | 113629208 | A | 11/2021 |
| CN | 113745271 | A | 12/2021 |
| CN | 113745433 | A | 12/2021 |
| CN | 109970981 | B | 4/2022 |
| CN | 110265702 | B | 6/2022 |
| CN | 114665036 | A | 6/2022 |
| CN | 114975812 | A | 8/2022 |
| CN | 112234082 | B | 11/2022 |
| DE | 19748109 | A1 | 5/1999 |
| EP | 0 375 967 | B1 | 3/1994 |
| EP | 0 357 360 | B1 | 6/1994 |
| EP | 0 464 959 | B1 | 12/1995 |
| EP | 1 465 874 | A2 | 10/2004 |
| EP | 1 213 337 | B1 | 11/2005 |
| EP | 1 816 114 | A1 | 8/2007 |
| EP | 1 850 368 | A1 | 10/2007 |
| EP | 1 873 162 | A1 | 1/2008 |
| EP | 1 299 913 | B1 | 3/2010 |
| EP | 2 180 029 | A1 | 4/2010 |
| EP | 2 202 283 | A1 | 6/2010 |
| EP | 1 602 648 | B1 | 4/2013 |
| EP | 2 028 249 | B1 | 5/2013 |
| EP | 1 621 597 | B1 | 9/2013 |
| EP | 2 722 350 | A1 | 4/2014 |
| EP | 1 834 945 | B1 | 7/2014 |
| EP | 2 270 897 | B1 | 12/2014 |
| EP | 1 009 044 | B1 | 7/2015 |
| EP | 2 473 564 | B1 | 2/2016 |
| EP | 2 998 997 | A1 | 3/2016 |
| EP | 2 197 979 | B1 | 12/2016 |
| EP | 3 182 477 | A1 | 6/2017 |
| EP | 3 185 325 | A1 | 6/2017 |
| EP | 2 248 849 | B1 | 7/2017 |
| EP | 3 240 036 | A1 | 11/2017 |
| EP | 3 316 311 | A1 | 5/2018 |
| EP | 3 331 045 | A1 | 6/2018 |
| EP | 3 336 899 | A1 | 6/2018 |
| EP | 2 434 558 | B1 | 7/2018 |
| EP | 3 396 728 | A1 | 10/2018 |
| EP | 3 406 752 | A1 | 11/2018 |
| EP | 3 499 576 | A1 | 6/2019 |
| EP | 3 703 147 | A1 | 9/2020 |
| EP | 3 149 012 | B1 | 10/2020 |
| EP | 3 731 293 | A1 | 10/2020 |
| GB | 1 096 600 | A | 12/1967 |
| GB | 1 188 212 | A | 4/1970 |
| IN | 229083 | B | 8/2007 |
| JP | 08-175813 | A | 7/1996 |
| JP | H08-175813 | A | 7/1996 |
| JP | 2001-352011 | A | 12/2001 |
| JP | 2002-212163 | A | 7/2002 |
| JP | 2003-068470 | A | 3/2003 |
| JP | 2003-306595 | A | 10/2003 |
| JP | 2004-079422 | A | 3/2004 |
| JP | 2004-335133 | A | 11/2004 |
| JP | 3588978 | B2 | 11/2004 |
| JP | 2004-352815 | A | 12/2004 |
| JP | 2005-041843 | A | 2/2005 |
| JP | 2006-100186 | A | 4/2006 |
| JP | 2006-156390 | A | 6/2006 |
| JP | 2006-202872 | A | 8/2006 |
| JP | 2006-277973 | A | 10/2006 |
| JP | 2006-278549 | A | 10/2006 |
| JP | 2006-286929 | A | 10/2006 |
| JP | 2007-188854 | A | 7/2007 |
| JP | 2007-245113 | A | 9/2007 |
| JP | 4025111 | B2 | 12/2007 |
| JP | 4025136 | B2 | 12/2007 |
| JP | 4025137 | B2 | 12/2007 |
| JP | 2008-133263 | A | 6/2008 |
| JP | 2008-210665 | A | 9/2008 |
| JP | 4185097 | B2 | 11/2008 |
| JP | 2008-291006 | A | 12/2008 |
| JP | 2009-065220 | A | 3/2009 |
| JP | 2009-182354 | | 8/2009 |
| JP | 4308663 | B2 | 8/2009 |
| JP | 2009-535813 | A | 10/2009 |
| JP | 2009-277507 | A | 11/2009 |
| JP | 2010-072616 | A | 4/2010 |
| JP | 2010-152072 | A | 7/2010 |
| JP | 2010-258410 | A | 11/2010 |
| JP | 4655790 | B2 | 3/2011 |
| JP | 2011-173972 | A | 9/2011 |
| JP | 2011-210677 | A | 10/2011 |
| JP | 4846982 | B2 | 12/2011 |
| JP | 2012-044125 | A | 3/2012 |
| JP | 4970934 | B2 | 7/2012 |
| JP | 4972844 | B2 | 7/2012 |
| JP | 2012-253015 | A | 12/2012 |
| JP | 2012-531426 | A | 12/2012 |
| JP | 5093879 | B2 | 12/2012 |
| JP | 2013-026300 | A | 2/2013 |
| JP | 5166961 | B2 | 3/2013 |
| JP | 5198657 | B2 | 5/2013 |
| JP | 5233074 | B2 | 7/2013 |
| JP | 2013-173771 | A | 9/2013 |
| JP | 2013-189321 | A | 9/2013 |
| JP | 2013-219278 | A | 10/2013 |
| JP | 5381748 | B2 | 1/2014 |
| JP | 2014-032851 | A | 2/2014 |
| JP | 2014-517999 | A | 7/2014 |
| JP | 5572134 | B2 | 8/2014 |
| JP | 2014-236212 | A | 12/2014 |
| JP | 2014-240374 | A | 12/2014 |
| JP | 5645849 | B2 | 12/2014 |
| JP | 2015-023023 | A | 2/2015 |
| JP | 2015-099773 | A | 5/2015 |
| JP | 2015-103525 | A | 6/2015 |
| JP | 5749870 | B1 | 7/2015 |
| JP | 2015-159164 | A | 9/2015 |
| JP | 2016-039249 | A | 3/2016 |
| JP | 2017-503317 | A | 1/2017 |
| JP | 2017-154283 | A | 9/2017 |
| JP | 2017-162616 | A | 9/2017 |
| JP | 2018-006115 | A | 1/2018 |
| JP | 2018-533183 | A | 11/2018 |
| JP | 2019-507899 | A | 3/2019 |
| JP | 2019-508733 | A | 3/2019 |
| JP | 2019-096439 | A | 6/2019 |
| JP | 2019-536249 | A | 12/2019 |
| JP | 2020-518107 | | 6/2020 |
| JP | 2020-520076 | A | 7/2020 |
| JP | 6786081 | B2 | 11/2020 |

(56) References Cited

FOREIGN PATENT DOCUMENTS

| | | | |
|---|---|---|---|
| JP | 2022-537479 | A | 8/2022 |
| JP | 7135919 | B2 | 9/2022 |
| JP | 2022-153102 | A | 10/2022 |
| JP | 7222320 | B2 | 2/2023 |
| JP | 2023-544281 | A | 10/2023 |
| KR | 100691543 | B1 | 3/2007 |
| KR | 100826364 | B1 | 5/2008 |
| KR | 100858816 | B1 | 9/2008 |
| KR | 20090128427 | A | 12/2009 |
| KR | 20100041043 | A | 4/2010 |
| KR | 20100054630 | A | 5/2010 |
| KR | 20100066424 | A | 6/2010 |
| KR | 20100069216 | A | 6/2010 |
| KR | 20100123735 | A | 11/2010 |
| KR | 100998838 | B1 | 12/2010 |
| KR | 101020350 | B1 | 3/2011 |
| KR | 101036391 | B1 | 5/2011 |
| KR | 20110123701 | A | 11/2011 |
| KR | 20120067644 | A | 6/2012 |
| KR | 20130077276 | A | 7/2013 |
| KR | 101317511 | B1 | 10/2013 |
| KR | 20140062258 | A | 5/2014 |
| KR | 10-20140069711 | A | 6/2014 |
| KR | 20140126108 | A | 10/2014 |
| KR | 101530266 | B1 | 6/2015 |
| KR | 20150103510 | A | 9/2015 |
| KR | 101561479 | B1 | 10/2015 |
| KR | 20150120906 | A | 10/2015 |
| KR | 20150127368 | A | 11/2015 |
| KR | 101640772 | B1 | 7/2016 |
| KR | 101661925 | B1 | 10/2016 |
| KR | 20170024182 | A | 3/2017 |
| KR | 20170030168 | A | 3/2017 |
| KR | 20170075865 | A | 7/2017 |
| KR | 1020180075589 | A | 7/2018 |
| KR | 20180115655 | A | 10/2018 |
| KR | 20180121304 | A | 11/2018 |
| KR | 20190020930 | A | 3/2019 |
| KR | 1020190086756 | A | 7/2019 |
| KR | 102028264 | B1 | 10/2019 |
| KR | 10-20200037025 | A | 4/2020 |
| KR | 20200126463 | A | 11/2020 |
| KR | 20210002829 | A | 1/2021 |
| KR | 20210075549 | A | 6/2021 |
| KR | 20210079850 | A | 6/2021 |
| KR | 20210083043 | A | 7/2021 |
| KR | 20210084869 | A | 7/2021 |
| KR | 20210085263 | A | 7/2021 |
| KR | 20210086033 | A | 7/2021 |
| KR | 1020210095913 | A | 8/2021 |
| KR | 10-20220090181 | A | 6/2022 |
| KR | 1020220135161 | A | 10/2022 |
| TW | I227655 | B | 2/2005 |
| TW | 201105775 | A | 2/2011 |
| TW | I363054 | B | 5/2012 |
| TW | I485137 | B | 5/2015 |
| TW | I499653 | B | 9/2015 |
| TW | 201819593 | A | 6/2018 |
| TW | 201929219 | A | 7/2019 |
| WO | WO-98/18804 | A1 | 5/1998 |
| WO | WO-99/17892 | A1 | 4/1999 |
| WO | WO-00/71647 | A1 | 11/2000 |
| WO | WO-02/096913 | A1 | 12/2002 |
| WO | WO-2004/083295 | A1 | 9/2004 |
| WO | WO-2006/070711 | A1 | 7/2006 |
| WO | WO-2006/070712 | A1 | 7/2006 |
| WO | WO-2006/093193 | A1 | 9/2006 |
| WO | WO-2008/018599 | A1 | 2/2008 |
| WO | WO-2008/069586 | A1 | 6/2008 |
| WO | WO-2008/105294 | A1 | 9/2008 |
| WO | WO-2009/044675 | A1 | 4/2009 |
| WO | WO-2009/102054 | A1 | 8/2009 |
| WO | WO-2010/094378 | A1 | 8/2010 |
| WO | WO-2010/114256 | A2 | 10/2010 |
| WO | WO-2010/114263 | A2 | 10/2010 |
| WO | WO-2010/122810 | A1 | 10/2010 |
| WO | WO-2010/134350 | A1 | 11/2010 |
| WO | WO-2010/151006 | A1 | 12/2010 |
| WO | WO-2011/012212 | A1 | 2/2011 |
| WO | WO-2011/027276 | A1 | 3/2011 |
| WO | WO-2011/042374 | A1 | 4/2011 |
| WO | WO-2011/049284 | A1 | 4/2011 |
| WO | WO-2011/074252 | A1 | 6/2011 |
| WO | WO-2011/074253 | A1 | 6/2011 |
| WO | WO-2011/107417 | A1 | 9/2011 |
| WO | WO-2011/115378 | A1 | 9/2011 |
| WO | WO-2011/129096 | A1 | 10/2011 |
| WO | WO-2011/136379 | A1 | 11/2011 |
| WO | WO-2012/070535 | A1 | 5/2012 |
| WO | WO-2013/109030 | A1 | 7/2013 |
| WO | WO-2013/100724 | A4 | 10/2013 |
| WO | WO-2013/152446 | A1 | 10/2013 |
| WO | WO-2013/180456 | A1 | 12/2013 |
| WO | WO-2013/183851 | A1 | 12/2013 |
| WO | WO-2013/187007 | A1 | 12/2013 |
| WO | WO-2014/024880 | A1 | 2/2014 |
| WO | WO-2014/025317 | A1 | 2/2014 |
| WO | WO-2014/031360 | A1 | 2/2014 |
| WO | WO-2014/071518 | A1 | 5/2014 |
| WO | WO-2014/104144 | A1 | 7/2014 |
| WO | WO-2014/163228 | A1 | 10/2014 |
| WO | WO-2015/005440 | A1 | 1/2015 |
| WO | WO-2015/033559 | A1 | 3/2015 |
| WO | WO-2015/041352 | A1 | 3/2015 |
| WO | WO-2016/042098 | A1 | 3/2016 |
| WO | WO-2016/042781 | A1 | 3/2016 |
| WO | WO-2016/056364 | A1 | 4/2016 |
| WO | WO-2017/072678 | A1 | 5/2017 |
| WO | WO-2017/100944 | A1 | 6/2017 |
| WO | WO-2018/100559 | A1 | 6/2018 |
| WO | WO-2018/103747 | A1 | 6/2018 |
| WO | WO-2018/198052 | A1 | 11/2018 |
| WO | WO-2018/206575 | A1 | 11/2018 |
| WO | WO-2018/211460 | A1 | 11/2018 |
| WO | WO-2018/216545 | A1 | 11/2018 |
| WO | WO-2019/002198 | A1 | 1/2019 |
| WO | WO-2019/006749 | A1 | 1/2019 |
| WO | WO-2019/047126 | A1 | 3/2019 |
| WO | WO-2019/062221 | A1 | 4/2019 |
| WO | WO-2019/062236 | A1 | 4/2019 |
| WO | WO-2019/088594 | A2 | 5/2019 |
| WO | WO-2019/102661 | A1 | 5/2019 |
| WO | WO-2019/113490 | A1 | 6/2019 |
| WO | WO-2019/141198 | A1 | 7/2019 |
| WO | WO-2019/147012 | A1 | 8/2019 |
| WO | WO-2019/150327 | A1 | 8/2019 |
| WO | WO-2019/178782 | A1 | 9/2019 |
| WO | WO-2019/199131 | A1 | 10/2019 |
| WO | WO-2019/199139 | A1 | 10/2019 |
| WO | WO-2019/199693 | A1 | 10/2019 |
| WO | WO-2019/200862 | A1 | 10/2019 |
| WO | WO-2019/215591 | A1 | 11/2019 |
| WO | WO-2019/215630 | A2 | 11/2019 |
| WO | WO-2019/233298 | A1 | 12/2019 |
| WO | WO-2019/242510 | A1 | 12/2019 |
| WO | WO-2020/029559 | A1 | 2/2020 |
| WO | WO-2020/029612 | A1 | 2/2020 |
| WO | WO-2020/029621 | A1 | 2/2020 |
| WO | WO-2020/045262 | A1 | 3/2020 |
| WO | WO-2020/052232 | A1 | 3/2020 |
| WO | WO-2020/057208 | A1 | 3/2020 |
| WO | WO-2020/079456 | A1 | 4/2020 |
| WO | WO-2020/092266 | A1 | 5/2020 |
| WO | WO-2020/105015 | A1 | 5/2020 |
| WO | WO-2020/134914 | A1 | 7/2020 |
| WO | WO-2020/178804 | A | 9/2020 |
| WO | WO-2020/178804 | A1 | 9/2020 |
| WO | WO-2020/191889 | A1 | 10/2020 |
| WO | WO-2020/192051 | A1 | 10/2020 |
| WO | WO-2020/195917 | A1 | 10/2020 |
| WO | WO-2020/199445 | A1 | 10/2020 |
| WO | WO-2020/212953 | A1 | 10/2020 |
| WO | WO-2020/219267 | A1 | 10/2020 |
| WO | WO-2020/221633 | A1 | 11/2020 |

(56) References Cited

FOREIGN PATENT DOCUMENTS

| | | | |
|---|---|---|---|
| WO | WO-2020/225778 | A1 | 11/2020 |
| WO | WO-2020/226383 | A1 | 11/2020 |
| WO | WO-2020/232692 | A1 | 11/2020 |
| WO | WO-2020/243740 | A1 | 12/2020 |
| WO | WO-2020/261191 | A1 | 12/2020 |
| WO | WO-2021/012400 | A1 | 1/2021 |
| WO | WO-2021/017320 | A1 | 2/2021 |
| WO | WO-2021/055547 | A2 | 3/2021 |
| WO | WO-2021/079927 | A1 | 4/2021 |
| WO | WO-2021/088953 | A1 | 5/2021 |
| WO | WO-2021/120761 | A1 | 6/2021 |
| WO | WO-2021/233773 | A1 | 11/2021 |
| WO | WO-2021/250643 | A1 | 12/2021 |
| WO | WO-2022/035527 | A1 | 2/2022 |
| WO | WO-2022/097043 | A1 | 5/2022 |
| WO | WO-2022/101429 | A1 | 5/2022 |
| WO | WO-2022/192005 | A1 | 9/2022 |
| WO | WO-2022/203222 | A1 | 9/2022 |
| WO | WO-2022/203276 | A1 | 9/2022 |
| WO | WO-2022/203323 | A1 | 9/2022 |
| WO | WO-2022/229208 | A1 | 11/2022 |
| WO | WO-2023/278000 | A1 | 1/2023 |
| WO | WO-2023/013697 | A1 | 2/2023 |
| WO | WO-2023/043579 | A1 | 3/2023 |
| WO | WO-2023/156317 | A1 | 8/2023 |
| WO | WO-2023/156449 | A1 | 8/2023 |

OTHER PUBLICATIONS

International Search Report and Witten Opinion for PCT Application No. PCT/IB2022/000066 dated Jun. 30, 2022.

International Search Report and Written Opinion for PCT Application No. PCT/IB2021/052980 dated Aug. 2, 2021 (10 pages).

International Search Report and Written Opinion for PCT Application No. PCT/IB2021/054230 dated Aug. 2, 2021 (9 pages).

International Search Report and Written Opinion for PCT Application No. PCT/IB2021/055232 dated Sep. 22, 2021 (12 pages).

International Search Report and Written Opinion for PCT Application No. PCT/IB2021/056685 dated Oct. 26, 2021 (7 pages).

International Search Report and Written Opinion for PCT Application No. PCT/IB2021/058323 dated Dec. 8, 2021 (12 pages).

International Search Report and Written Opinion for PCT Application No. PCT/IB2021/059300 dated Dec. 23, 2021 (15 pages).

International Search Report and Written Opinion for PCT Application No. PCT/IB2021/060062 dated Feb. 18, 2022 (12 pages).

Kachan et al., "High-absorbing Gradient Multilayer Coatings with Silver Nanoparticles," Applied Physics B, 2006, 84, pp. 281-287.

Malonowski, P. et al., "71-3: Organic Photolithography for Displays with Integrated Fingerprint Scanner," SID Symposium Digest of Technical Papers, vol. 50, Issue 1, 2019, pp. 107-1010, ISSN: 0097-996X/19/4802-1007. Retrieved from the internet https://lirias.kuleuven.be/retrieve/550644.

Rycenga et al., "Controlling the Synthesis and Assembly of Silver Nanostructures for Plasmonic Applications," Chemical Reviews, 2011, 111(6), pp. 3669-3712.

"PubChem Substructure Fingerprint v1.3." retrieved from https://ftp.ncbi.nlm.nih.gov/pubchem/specifications/pubchem_fingerprints.pdf.

Abraham, Michael H., et al. "Determination of molar refractions and Abraham descriptors for tris (acetylacetonato)chromium(III), tris (acetylacetonato)iron(III) and tris (acetylacetonato)cobalt(III)." New Journal of Chemistry 41.23 (2017): 14259-14265.

Abroshan, H. et al. "66-3: Active Learning for the Design of Novel OLED Materials." SID Symposium Digest of Technical Papers. 53.1 (2022).

Adams, R. O., A. Digiallonardo, and C. W. Nordin. "Films of rare earth oxides formed by electron beam evaporation." Thin Solid Films 154.1-2 (1987): 101-108.

Aftab, Alina. "Sintering Behavior, Structural, and Catalytic Properties of Ytterbium Oxide (Yb2O3)." (2019).

Ahn, J. K., et al., "Vapor-phase deposition-based self-assembled monolayer for an electrochemical sensing platform", AIP Advances, 2020, 10(4), 045213.

Ai, Lianghui, et al. "Synthesis and flame retardant properties of cyclophosphazene derivatives containing boron." Polymer Degradation and Stability 155 (2018): 250-261.

Akada, Misaho, et al. "Superconducting phase sequence in RxC60 fullerides (R= Sm and Yb)." Physical Review B 73.9 (2006): 094509.

Akada, Misaho, et al. "Superconductivity appearing from C60 doped with rare-earth metals." Science and Technology of Advanced Materials 7.S1 (2006): S83.

Alaaeddine, Ali, et al. "Synthesis and characterization of novel alternating fluorinated copolymers bearing oligo (ethylene oxide) side chains." Journal of Polymer Science Part A: Polymer Chemistry 51.4 (2013): 977-986.

Alexandra, M. Z. "Lanthanide ß-diketonate glyme complexes exhibiting unusual co-ordination modes." Journal of the Chemical Society, Dalton Transactions 15 (1993): 2379-2386.

Alhadid A. et al., "Design of Deep Eutectic Systems: A Simple Approach for Preselecting Eutectic Mixture Constituents (Supplementary Material)", Molecules, 25.5 (2020): 1077.

Alhadid A. et al., "Design of Deep Eutectic Systems: A Simple Approach for Preselecting Eutectic Mixture Constituents", Molecules, 25.5 (2020): 1077.

Alipour, Mojtaba, and Zahra Safari. "Photophysics of OLED materials with emitters exhibiting thermally activated delayed fluorescence and used in hole/electron transporting layer from optimally tuned range-separated density functional theory." The Journal of Physical Chemistry C 123.1 (2018): 746-761.

Allcock, H. R. "Recent advances in phosphazene (phosphonitrilic) chemistry." chemical Reviews 72.4 (1972): 315-356.

Allcock, H. R., and D. B. Patterson. "Phosphorus-nitrogen compounds. 27. Ring-ring and ring-chain equilibration of dimethylphosphazenes. Relation to phosphazene polymerization." Inorganic Chemistry 16.1 (1977): 197-200.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H. R., J. L. Schmutz, and Karen M. Kosydar. "A new route for poly (organophosphazene) synthesis. Polymerization, copolymerization, and ring-ring equilibration of trifluoroethoxy-and chloro-substituted cyclotriphosphazenes1, 2." Macromolecules 11.1 (1978): 179-186.

Allcock, H. R., R. L. Kugel, and K. J. Valan. "Phosphonitrilic compounds. VI. High molecular weight poly (alkoxy-and aryloxyphosphazenes)." Inorganic Chemistry 5.10 (1966): 1709-1715.

Allcock, H. R., W. J. Cook, and D. P. Mack. "Phosphonitrilic compounds. XV. High molecular weight poly [bis (amino) phosphazenes] and mixed-substituent poly (aminophosphazenes)." Inorganic Chemistry 11.11 (1972): 2584-2590.

Allcock, H.R. "Phosphorus-nitrogen Compounds", pp. 400-407, Academic Press (1972).

Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.

Allcock, Harry R. "The expanding field of polyphosphazene high polymers." Dalton Transactions 45.5 (2016): 1856-1862.

Allcock, Harry R., and Chen Chen. "Polyphosphazenes: phosphorus in inorganic-organic polymers." The Journal of Organic Chemistry 85.22 (2020): 14286-14297.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Dennis C. Ngo. "Synthesis of poly [bis (phosphazo) phosphazenes] bearing aryloxy and alkoxy side groups." Macromolecules 25.11 (1992): 2802-2810.

Allcock, Harry R., and Michael L. Turner. "Ring expansion and polymerization of transannular bridged cyclotriphosphazenes and their spirocyclic analogs." Macromolecules 26.1 (1993): 3-10.

(56) References Cited

OTHER PUBLICATIONS

Allcock, Harry R., and R. L. Kugel. "Synthesis of high polymeric alkoxy-and aryloxyphosphonitriles." Journal of the American Chemical Society 87.18 (1965): 4216-4217.
Allcock, Harry R., and Young Baek Kim. "Synthesis, characterization, and modification of poly (organophosphazenes) with both 2, 2, 2-trifluoroethoxy and phenoxy side groups." Macromolecules 27.14 (1994): 3933-3942.
Allcock, Harry R., et al. "Controlled refractive index polymers: polyphosphazenes with chlorinated- and fluorinated-, aryloxy-and alkoxy-side-groups." Chemistry of materials 15.2 (2003): 473-477.
Allcock, Harry R., et al. "Hydrophobic and superhydrophobic polyphosphazenes." Journal of adhesion science and technology 23.3 (2009): 435-445.
Allcock, Harry R., et al. "Plasma surface functionalization of poly [bis (2, 2, 2-trifluoroethoxy) phosphazene] films and nanofibers." Langmuir 23.15 (2007): 8103-8107.
Allcock, Harry R., et al. "Poly (monophosphazophosphazenes): New polymers with N: PR3 side groups." Macromolecules 27.26 (1994): 7556-7564.
Allcock, Harry R., et al. "Syntheses and structures of cyclic and short-chain linear phosphazenes bearing 4-phenylphenoxy side groups." Journal of the American Chemical Society 113.7 (1991): 2628-2634.
Allcock, Harry R., Gayann S. McDonnell, and James L. Desorcie. "Ring expansion and equilibration in organophosphazenes and the relationship to polymerization." Inorganic chemistry 29.19 (1990): 3839-3844.
Allcock, Harry R., Lee B. Steely, and Anurima Singh. "Hydrophobic and superhydrophobic surfaces from polyphosphazenes." Polymer international 55.6 (2006): 621-625.
Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {02C12H8}], 1, 3-[N3P3 (OCH2CF3) 4 {02C12H8}], 1, 1-[N3P3 (OCH2CF3) 4 {02C10H6}], and 1, 3-[N3P3 (OCH2CF3) 4} O2C10H6}]." Inorganic chemistry 31.21 (1992): 4354-4364.
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Amat, Miguel A., and Gregory C. Rutledge. "Liquid-vapor equilibria and interfacial properties of n-alkanes and perfluoroalkanes by molecular simulation." The Journal of chemical physics 132.11 (2010): 114704.
Aneta Wiatrowska, et al. "Ultra-Precise Deposition for Display Manufacturing: from Rapid Prototyping to Mass Production", The 21st international meeting on information display, Seoul, Korea.
Aqra, Fathi, and Ahmed Ayyad. "Surface free energy of alkali and transition metal nanoparticles." Applied surface science 314 (2014): 308-313.
Araki, H. and Naka, K., "Syntheses and Properties of Dumbbell-Shaped POSS Derivatives Linked by Luminescent p-Conjugated Units", Polymer Chemistry, 50.20 (2012):4170-4181.
Araki, H. and Naka, K., "Syntheses and Properties of Star- and Dumbbell-Shaped POSS Derivatives Containing Isobutyl Groups", Polymer Journal, 44 (2012):340-346.
Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.
Arvanitidis, J., et al. "Raman spectroscopic study of the rare-earth fullerides Eu6-xSrxC60." Nanoscale 3.6 (2011): 2490-2493.
Arvanitidis, J., et al. "Temperature-induced valence transition and associated lattice collapse in samarium fulleride." Nature 425.6958 (2003): 599-602.
Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.
Aubouy, Miguel, Manoel Manghi, and Elie Raphaël. "Interfacial properties of polymeric liquids." Physical Review Letters 84.21 (2000): 4858.
Azimi, Gisele, et al. "Hydrophobicity of rare-earth oxide ceramics." Nature materials 12.4 (2013): 315-320.
Azimi, Gisele, et al. Supplementary Information for "Hydrophobicity of rare-earth oxide ceramics." Nature materials 12.4 (2013): 315-320.
Azimi, Gisele, et al. Supplementary material for "Hydrophobicity of rare-earth oxide ceramics." Nature materials 12.4 (2013): 315-320.
Bae, J. et al. "Optically recoverable, deep ultraviolet (UV) stable and transparent sol-gel fluoro siloxane hybrid material for a UV LED encapsulant." RSC advances 6.32 (2016): 26826-26834.
Baek, Jang-Yeol, et al. "New asymmetrical limb structured blue emitting material for OLED." Optical Materials Express 4.6 (2014): 1151-1158.
Baek, Seungin, et al. "74-2: Diffracted Image Retrieving with Deep Learning." SID Symposium Digest of Technical Papers. vol. 51. No. 1. 2020.
Balague, J., et al. "Synthesis of fluorinated telomers. Part 1. Telomerization of vinylidene fluoride with perfluoroalkyl iodides." Journal of Fluorine Chemistry 70.2 (1995): 215-223.
Baradie, B. et al. "Synthesis and characterization of novel polysiloxane-grafted fluoropolymers." Canadian journal of chemistry 83.6-7 (2005): 553-558.
Barrett, Eric W., et al. "Patterning poly (organophosphazenes) for selective cell adhesion applications." Biomacromolecules 6.3 (2005): 1689-1697.
Barry, B., "Routes to Silsesquioxanes Functionalization—Capping of DDSQs for the Synthesis of Asymmetric POSS Compounds", Masters Thesis, Michigan State University (2019).
Batsanov, S. S., G. N. Grigor'eva, and N. P. Sokolova. "Optical properties of oxides of the rare-earth metals." Journal of Structural Chemistry 3.3 (1962): 323-325.
Bechtolsheim, C. V., V. Zaporojtchenko, and F. Faupel. "Interface structure and formation between gold and trimethylcyclohexane polycarbonate." Journal of materials research 14.9 (1999): 3538-3543.
Becke-Goehring, Margot, and Ekkehard Fluck. "Phosphonitrilic chlorides from phosphorus pentachloride." Angewandte Chemie International Edition in English 1.6 (1962): 281-285.
Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.
Ben'kovskii, V. G., T. M. Bogoslovskaya, and M. Kh Nauruzov. "Density, surface tension and refractive index of aromatic hydrocarbons at low temperatures." Chemistry and Technology of Fuels and Oils 2.1 (1966): 23-26.
Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.
Bertolucci, M. et al. "Wetting Behavior of Films of New Fluorinated Styrene—Siloxane Block Copolymers." Macromolecules 37.10 (2004): 3666-3672.
Besli, S. et al., "Bridged Cyclophosphazenes Resulting From Deprotonation Reactions of Cyclotriphophazenes Bearing a P-NH Group", 40.19 (2011):5307.
Besli, S. et al., "Bridged Cyclophosphazenes Resulting From Deprotonation Reactions of Cyclotriphophazenes Bearing a P-NH Group", Dalton Trans., 40.19 (2011):5307.
Besli, Serap, et al. "Regiochemical control in the substitution reactions of cyclotriphosphazene derivatives with secondary amines." Inorganic Chemistry 57.19 (2018): 12066-12077.
Bézière, Nicolas, and Ntziachristos, Vasilis. "Optoacoustic Imaging of Naphthalocyanine: Potential for Contrast Enhancement and Therapy Monitoring." Naphthalocyanine In Optoacoustic Imaging 56.2 (2015): 323-328.
Biddlestone, M., and R. A. Shaw. "A two-ring assembly phosphazene." Chemical Communications (London) 7 (1968): 407-408.

(56) References Cited

OTHER PUBLICATIONS

Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F.Sputtering and Plasma Polymerization in Inert and Active Gas", Thin Solid Films, 41.3 (1977):329-339.
Bierwagen, Oliver, et al. "Oxygen-deficient oxide growth by subliming the oxide source material: The cause of silicide formation in rare earth oxides on silicon." Crystal growth & design 13.8 (2013): 3645-3650.
Blanchet, G.B., "Deposition of Amorphous Fluoropolymers Thin Films by Laser Ablation", Appl. Phys. Lett. 62 (1993):479-481.
Blanco, I., "The Rediscovery of POSS: A Molecule Rather than a Filler", Polymers, 10.8 (2018):904-914.
Böhm, E., et al. "Novel transport materials for high-performance fluorescent and phosphorescent OLEDs." Journal of Information Display 12.3 (2011): 141-144.
Boyne, D. et al., "Vacuum Thermal Evaporation of Polyaniline Doped with Camphor Sulfonic Acid", Journal of Vacuum Science & Technology A, 33.3 (2015):031510.
Breu, Josef, et al. "Crystal Structure of fac-Ir (ppy) 3 and Emission Properties under Ambient Conditions and at High Pressure." Chemistry of materials 17.7 (2005): 1745-1752.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Brown, Douglas E., et al. "Poly [(vinyloxy) cyclophosphazenes]." Macromolecules 34.9 (2001): 2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Calhoun, Harry P. "Studies on the ligand properties of phosphonitrilic derivatives." Diss. University of British Columbia, 1973.
Camino, G. et al., "Polydimethylsiloxane Thermal Degradation Part 1. Kinetic Aspects", Polymer, 42.6 (2001):2395-2402.
Cao, Xuewei, et al. "Raman scattering of ytterbium intercalated C60 compounds." Journal of Raman Spectroscopy 31.6 (2000): 461-463.
Carolina Martinez Ceballos, Evelyn, et al. "Synthesis and characterization of polyphosphazenes modified with hydroxyethyl methacrylate and lactic acid." International Journal of Polymer Science 2013 (2013).
Carriedo, Gabino A., et al. "Preparation of a new type of phosphazene high polymers containing 2, 2'-dioxybiphenyl groups." Macromolecules 29.16 (1996): 5320-5325.
Casas-Solvas, Juan M., Joshua D. Howgego, and Anthony P. Davis. "Synthesis of substituted pyrenes by indirect methods." Organic & Biomolecular Chemistry 12.2 (2014): 212-232.
Casella, Girolamo, et al. "Cyclo-and polyphosphazenes for biomedical applications." Molecules 27.23 (2022): 8117.
Chaiprasert, T. et al. "Vinyl-functionalized Janus ring siloxane: potential precursors to hybrid functional materials." Materials 14.8 (2021): 2014.
Chambrier, Isabelle, et al. "Synthesis of Porphyrin-CdSe Quantum Dot Assemblies: Controlling Ligand Binding by Substituent Effects." Inorganic chemistry 54.15 (2015): 7368-7380.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007):1045-1074.
Chang, Li, et al. "A smart surface with switchable wettability by an ionic liquid." Nanoscale 9.18 (2017): 5822-5827.
Charpentier, P. A., et al. "Continuous polymerizations in supercritical carbon dioxide: chain-growth precipitation polymerizations." Macromolecules 32.18 (1999): 5973-5975.
Chen, B. J., X. W. Sun, and S. C. Tan. "Transparent organic light-emitting devices with LiF/Mg: Ag cathode." Optics express 13.3 (2005): 937-941.
Chen, G. K. J., and J. Chen. "Flexible displays: Flexible AMOLED manufacturing." Handbook of Visual Display Technology; Chen, J., Cranton, W., Fihn, M., Eds (2016).
Chen, Hsiao-Fan, et al. "1,3,5-Triazine derivatives as new electron transport-type host materials for highly efficient green phosphorescent OLEDs." Journal of Materials Chemistry 19.43 (2009): 8112-8118.
Chen, W. et al., "Highly Thermal Stable Phenolic Resin Based on Double-Decker-Shaped POSS Nanocomposites for Supercapacitors", Polymers, 12.9 (2020):2151-2165.
Chen, Yu-Hung, et al. "58.2: High-Performance Large-Size OLED Tv with Ultra Hd Resolution." SID Symposium Digest of Technical Papers. vol. 46. No. 1. 2015.
Cheng, Yu, et al. "Delivery and efficacy of a cancer drug as a function of the bond to the gold nanoparticle surface." Langmuir 26.4 (2010): 2248-2255.
Cheviré, François, Franck Tessier, and Roger Marchand. "Optical properties of rare-earth oxides and oxynitrides, . . . Towards 'second generation' UV absorbers." Silicates industriels 69.5-6 (2004): 159-163.
Chi, Dam Hieu, et al. "Pressure-induced structural phase transition in fullerides doped with rare-earth metals." Physical Review B 67.9 (2003): 094101.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
Ching, Suet Ying. "Plasmonic properties of silver-based alloy thin films." Diss. Hong Kong Baptist University, 2015.
Cho, H.U. et al. "17-1: Invited Paper: Enhancement of Current Efficiency for OLED Devices Using Meta-Heuristic Algorithm." SID Symposium Digest of Technical Papers. 52.1 (2021).
Cho, H.U. et al. "Enhancement of Current Efficiency for OLED Devices Using Meta-Heuristic Algorithm." 2021 Virtual Display Week International Symposium (2021).
Cho, Song Yun, and Harry R. Allcock. "Novel highly fluorinated perfluorocyclobutane-based phosphazene polymers for photonic applications." Chemistry of Materials 19.25 (2007): 6338-6344.
Choi, B. K. et al. "48-1: Invited Paper: Next Generation Highly Efficient and Stable Phosphorescent Emitting Materials For OLEDs." SID Symposium Digest of Technical Papers 51.1 (2020).
Choi, B. K. et al. "Next Generation Highly Efficient and Stable Phosphorescent Emitting Materials For OLEDs." SID2020 Symposium.
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Çiftçi, Gönül Yenilmez, et al. "Investigation of the structural properties of 2-naphthylamine substituted cyclotetraphosphazenes." Polyhedron 77 (2014): 1-9.
Citrin, P. H., et al. "Distorted and inequivalently charged C60 anions in Yb2.75 C60." Physical Review B 56.9 (1997): 5213.
Condorelli, Guglielmo G., Graziella Malandrino, and Ignazio L. Fragalà. "Engineering of molecular architectures of ß-diketonate precursors toward new advanced materials." Coordination chemistry reviews 251.13-14 (2007): 1931-1950.
Cordes, D.B. et al., "Recent Developments in the Chemistry of Cubic Polyhedral Oligosilsesquioxanes", Chem. Rev., 110 (2010):2081-2173.

(56) References Cited

OTHER PUBLICATIONS

Cosnahan, T., et al., "Modelling of a vacuum metallization patterning method for organic electronics", Surface and Coatings Technology, 2018, 336, 128.
Crowder, Gene A., et al. "Vapor pressures and triple point temperatures for several pure fluorocarbons." Journal of Chemical and Engineering Data 12.4 (1967): 481-485.
Cuny, Philippe, Monique Acquaviva, and Michèle Gilewicz. "Phenanthrene degradation, emulsification and surface tension activities of a Pseudomonas putida strain isolated from a coastal oil contaminated microbial mat." Ophelia 58.3 (2004): 283-287.
Dalvi, V.H. and Rossky, P.J., "Molecular Origins of Fluorocarbon Hydrophobicity", PNAS, 107.31 (2010):13603-13607.
Dams, Rudy, and Klaus Hintzer. "Industrial aspects of fluorinated oligomers and polymers." (2016): 1-31.
Das, Prajwalita, et al. "Recent advancements in the synthesis of pentafluorosulfanyl (SF5)-containing heteroaromatic compounds." Tetrahedron Letters 58.52 (2017): 4803-4815.
Dash, P. and Y. C.H. "How much battery does dark mode save? An accurate OLED display power profiler for modern smartphones." Proceedings of the 19th Annual International Conference on Mobile Systems, Applications, and Services (2021).
David, Robert, Neumann, A. Wilhelm. "A Theory for the Surface Tensions and Contact Angles of HydrogenBonding Liquids." Langmuir 30.39 (2014):11634-11639.
Dawood, Kamal M. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. vol. 9270. SPIE, 2014.
De Wilde, W., "Evaporation of Polytetrafluoroethylene by Electron Bombardment of the Bulk Material", Thin Solid Films, 24.1 (1974):101-111.
Devaux, Didier, et al. "Crosslinked perfluoropolyether solid electrolytes for lithium ion transport." Solid State Ionics 310 (2017): 71-80.
Di Nicola, Giovanni, Gianluca Coccia, and Mariano Pierantozzi. "Surface tension of silanes: A new equation." Fluid Phase Equilibria 418 (2016): 88-93.
Dikarev, Evgeny V., Haitao Zhang, and Bo Li. "Heterometallic bismuth-transition metal homoleptic ß-diketonates." Journal of the American Chemical Society 127.17 (2005): 6156-6157.
Dolbier, William R. Jr., and Kanishchev, Oleksandr S. "Chapter One—SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.
Dong, H. et al., "Surface Properties and Thermal Stability of a Novel Low-Surface-Energy Polybenzoxazine/Clay Nanocomposites", Polymer Composites, 33.8 (2012):1313-1320.
Drelich, J. et al., "Hydrophilic and Superhydrophilic Surfaces and Materials", Soft Matter, 7.21 (2011):9804-9828.
Drelich, Jaroslaw, et al. "Hydrophilic and Superhydrophilic Surfaces and Materials." Soft Matter, 7.21 (2011): 9804-9828.
Du, Libin, et al. "Fluoropolymer synthesis in supercritical carbon dioxide." The Journal of Supercritical Fluids 47.3 (2009): 447-457.
Dubrovskii, Vladimir. "Fundamentals of Nucleation Theory." Nucleation Theory and Growth of Nanostructures. Springer, Berlin, Heidelberg, 2014. 1-73.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ebnesajjad, S. "Fluoroplastics: vol. 1: Non-Melt Processible Fluoroplastics. 2000." Plastics Design Library: United States of America, Norwich, NY, Chapter 11.
Ebnesajjad, Sina. "Introduction to fluoropolymers." Applied Plastics Engineering Handbook. William Andrew Publishing, 2011. 49-60.
Edrissi, M., et al. "Novel Method for the Preparation of Copper Phthalocyanin Blue Nanoparticles in an Electrochemical Cell Irradiated by Microwave (Research Note)". International Journal of Engineering, 20.3 (2007): 257-262.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols: A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Ellison, A. H., H. W. Fox, and W. A. Zisman. "Wetting of fluorinated solids by hydrogen-bonding liquids." The Journal of Physical Chemistry 57.7 (1953): 622-627.
Elmas, Gamze, et al. "Phosphorus-nitrogen compounds. Part 52. The reactions of octachlorocyclotetraphosphazene with sodium 3-(N-ferrocenylmethylamino)-1-propanoxide: Investigations of spectroscopic, crystallographic and stereogenic properties." Inorganica Chimica Acta 497 (2019): 119106.
Emerton, Neil, David Ren, and Tim Large. "28-1: Image Capture Through TFT Arrays." SID Symposium Digest of Technical Papers. vol. 51. No. 1. 2020.
Endo, Ayataka, et al. "Measurement of photoluminescence efficiency of Ir (III) phenylpyridine derivatives in solution and solid-state films." Chemical Physics Letters 460.1-3 (2008): 155-157.
English Translation of Office Action and Search Report for Chinese Application No. 202180041306.X dated Aug. 13, 2024, 11 pages.
English Translation of Office Action for Korean Application No. 10-2022-7037670 dated Nov. 20, 2024, 17 pages.
English translation of Office Action on Korean Application No. 10-2023-7022930 date Oct. 10, 2024.
Evers, Robert C. "Low glass transition temperature fluorocarbon ether bibenzoxazole polymers." Journal of Polymer Science: Polymer Chemistry Edition 16.11 (1978): 2833-2848.
Exner, O. "Conception and Significance of the Parachor." Nature 196.4857 (1962): 890-891.
Farrow, Darcie A., et al. "Polarized pump-probe measurements of electronic motion via a conical intersection." The Journal of Chemical Physics 128.14 (2008): 144510.
Faupel, F., et al. "Nucleation, growth, interdiffusion, and adhesion of metal films on polymers." AIP Conference Proceedings. vol. 491. No. 1. American Institute of Physics, 1999.
Feher, F.J. and Budzichowski, T.A., "Silasesquioxanes as Ligands in Inorganic and Organometallic Chemistry", Polyhedron, 14.22 (1995):3239-3253.
Feistel, G. R., and T. Moeller. "The geminal structure of the compound N3P3CI4 (NH2) 2." Journal of Inorganic and Nuclear Chemistry 29.11 (1967): 2731-2737.
Feng, Zhengyu, et al. "28-3: Pixel Design for Transparent MicroLED Display with Low Blurring."?SID Symposium Digest of Technical Papers. vol. 51. No. 1. 2020.
Finkenzeller, Walter J., and Hartmut Yersin. "Emission of Ir (ppy) 3. Temperature dependence, decay dynamics, and magnetic field properties." Chemical physics letters 377.3-4 (2003): 299-305.
Flaningam, Ora L. "Vapor pressures of poly (dimethylsiloxane) oligomers." Journal of Chemical and engineering Data 31.3 (1986): 266-272.
Flores-Camacho, Jose Manuel, et al. "Growth and optical properties of Ag clusters deposited on poly (ethylene terephthalate)." Nanotechnology 22.27 (2011): 275710.
Formica, Nadia, et al. "Ultrastable and Atomically Smooth Ultrathin Silver Films Grown on a Copper Seed Layer." ACS Applied Materials & Interfaces 5.8 (2013): 3048-3053.

(56) References Cited

OTHER PUBLICATIONS

Forrest, James A. "Reductions of the glass transition temperature in thin polymer films: Probing the length scale of cooperative dynamics." Physical Review E 61.1 (2000): R53-6.
Fowkes, Frederick M. "Attractive Forces at Interfaces." Industrial and Engineering Chemistry 56.12 (1964): 40-52.
Fox, H.W. et al., "Polyorganosiloxanes . . . Surface Active Properties", Ind. Eng. Chem., 39.11 (1947):1401-1409.
Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Furukawa, Yutaka, et al. "Fluorosilicone elastomer based on the poly [(3, 3, 3-trifluoropropyl) methyl-siloxane-co-(3, 3, 4, 4, 5, 5, 6, 6, 6-nonafluorohexyl) methylsiloxane]." Polymers for Advanced Technologies 13.1 (2002): 60-65.
Furukawa, Yutaka, et al. "Reactivity of cyclosiloxane with 3, 3, 4, 4, 5, 5, 6, 6, 6-nonafluorohexyl group and its application to fluorosilicone synthesis." Journal of applied polymer science 82.13 (2001): 3333-3340.
Fusella, Michael A., et al. "Plasmonic enhancement of stability and brightness in organic light-emitting devices." Nature 585.7825 (2020): 379-382.
Fushimi, Toshiki, and Harry R. Allcock. "Synthesis and optical properties of sulfur-containing monomers and cyclomatrix polyphosphazenes." Dalton transactions 39.22 (2010): 5349-5355.
Gabler, D.G. and Haw, J.F., "Hydrolysis Chemistry of the Chlorophosphazene Cyclic Trimer", Inorganic Chemistry, 29.20 (1990):4018-4021.
Gali, Sai Manoj, et al. "Ambipolarity and dimensionality of charge transport in crystalline group 14 phthalocyanines: A computational study." The Journal of Physical Chemistry C 122.5 (2018): 2554-2563.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Gao, Lichao, and Thomas J. McCarthy. "Teflon is hydrophilic. Comments on definitions of hydrophobic, shear versus tensile hydrophobicity, and wettability characterization." Langmuir 24.17 (2008): 9183-9188.
Garrick, Lloyd M. "Novel , New Aromatic SF 5 Derivatives ! Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Gelest, Inc., Fluorosilicone Fluids, p. 20, retrieved from <https://s3.amazonaws.com/gelest/product-brochures/Inert_Silicones.pdf> on Mar. 24, 2022.
Giebink, C. "Catastrophic OLED failure and pathways to address it" Department of Energy, url:https://www.energy.gov/sites/prod/files/2018/02/f48/giebink_oled-failure_nashville18_0.pdf (2018).
Gleria, Mario, et al. "Fluorine containing phosphazene polymers." Journal of Fluorine Chemistry 125.2 (2004): 329-337.
Glüge, J. et al., An Overview of the Uses of Per- and Polyfluoroalkyl Substances (PFAS), Environmental Science: Processes & Impacts, 20.12 (2020):2345-2373.
Glüge, J. et al., "An Overview of the Uses of Per- and Polyfluoroalkyl Substances (PFAS)-Electronic supplementary information 1", Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golemme, Gianni, and Anna Santaniello. "Perfluoropolymer/molecular sieve mixed-matrix membranes." Membranes 9.2 (2019): 19.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Graham, Paul, et al. "Fluoropolymers with very low surface energy characteristics." Journal of Fluorine Chemistry 104.1 (2000): 29-36.
Grant Norton, M. et al., "Pulsed Laser Ablation and Deposition of Fluorocarbon Polymers", Applied Surface Science, 96-98 (1996):617-620.
Grant, Trevor M., et al. "Multifunctional ternary additive in bulk heterojunction OPV: increased device performance and stability." Journal of Materials Chemistry A 5.4 (2017): 1581-1587.
Gray, Victor, et al. "Photophysical characterization of the 9,10-disubstituted anthracene chromophore and its applications in triplet-triplet annihilation photon upconversion." Journal of Materials Chemistry C 3.42 (2015): 11111-11121.
Green, Mark. "The nature of quantum dot capping ligands." Journal of Materials Chemistry 20.28 (2010): 5797-5809.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symphosium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Grzyll, Lawrence R., Charlie Ramos, and Dwight D. Back. "Density, viscosity, and surface tension of liquid quinoline, naphthalene, biphenyl, decafluorobiphenyl, and 1, 2-diphenylbenzene from 300 to 400 C." Journal of Chemical & Engineering Data 41.3 (1996): 446-450.
Guo, X. Andrew, Allen D. Hunter, and Jie Chen. "Preparation and characterization of acrylates and polyacrylates having variable fluorine contents and distributions." Journal of Polymer Science Part A: Polymer Chemistry 32.1 (1994): 47-56.
Haddon, R. C. "Electronic structure, conductivity and superconductivity of alkali metal doped (C60)." Accounts of chemical research 25.3 (1992): 127-133.
Hadi, A., et al. "Accelerated Design and Optimization of Novel OLED Materials", The 21st international meeting on information display, Seoul, Korea.
Halls, M. D., et al. "An Innovation Platform for Optoelectronics: Synergistic Acceleration of de Novo Design Powered by Multiscale Simulations and Machine Learning", The 21st international meeting on information display, Seoul, Korea.
Hammer, Nathan I., Todd Emrick, and Michael D. Barnes. "Quantum dots coordinated with conjugated organic ligands: new nanomaterials with novel photophysics." Nanoscale Research Letters 2.6 (2007): 282-290.
Han, Yoon Deok, et al. "Quantum dot and p-conjugated molecule hybrids: nanoscale luminescence and application to photoresponsive molecular electronics." NPG Asia Materials 6.6 (2014): e103-e103.
Handke, Bartosz, Lukasz Klita, and Wiktor Niemiec. "Self-assembly of dodecaphenyl POSS thin films." Surface Science 666 (2017): 70-75.
Hashimoto, A. "Evaporation kinetics of oxides of rare earth and refractory trace elements, and the chemical fractionation of hibonite by evaporation." Lunar and Planetary Science Conference. vol. 22. 1991.
Hashimoto, A. "Evaporation kinetics of REE oxides." Lunar and Planetary Science Conference. vol. 19. 1988.

(56) References Cited

OTHER PUBLICATIONS

Heaney, James B. "Evaluation of commercially supplied silver coated Teflon for spacecraft temperature control usage." (1974).
Hedley, Gordon J., Arvydas Ruseckas, and Ifor DW Samuel. "Ultrafast luminescence in Ir (ppy) 3." Chemical Physics Letters 450.4-6 (2008): 292-296.
Heinrich, Darina, Axel Haupt, and Dieter Lentz. "Synthesis of Cyclopentadiene Ligands with Fluorinated Substituents by Reaction of Cobaltocene with Fluoroalkenes." European Journal of Inorganic Chemistry 2014.30 (2014): 5103-5106.
Herzog, Axel, et al. "A Perfluorinated Nanosphere: Synthesis and Structure of Perfluoro-deca-B-methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hodges, A. M., et al. "New pentafluoro-?6-sulfanyl (SF5) perfluoroalkyl benzene derivatives." Journal of fluorine chemistry 114.1 (2002): 3-8.
Hoene, Joan Von, Robert G. Charles, and William M. Hickam. "Thermal decomposition of metal acetylacetonates: mass spectrometer studies." The Journal of Physical Chemistry 62.9 (1958): 1098-1101.
Hofbeck, Thomas, and Hartmut Yersin. "The triplet state of fac-Ir (ppy) 3." Inorganic chemistry 49.20 (2010): 9290-9299.
Hoge, J. "Novel Benzoxazine Based System for Flame Retardant Aircraft Interior Prepreg Applications" The Sixth Triennial International Aircraft Fire and Cabin Safety Research (2010).
Hoge, J. "Novel Benzoxazine Resin System for Flame Retardant Aircraft Interior Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hughes, Russell P., and Hernando A. Trujillo. "Selective solubility of organometallic complexes in saturated fluorocarbons. Synthesis of cyclopentadienyl ligands with fluorinated ponytails." Organometallics 15.1 (1996): 286-294.
Hwang, Hyeon-Deuk, and Hyun-Joong Kim. "UV-curable low surface energy fluorinated polycarbonate-based polyurethane dispersion." Journal of colloid and interface science 362.2 (2011): 274-284.
Hwang, S. et al., "ChemInform Abstract: Dendritic Macromolecules for Organic Light-Emitting Diodes", Chemical Society Reviews, 37.11 (2008):2543-2557.
Hyre, Ariel S., and Linda H. Doerrer. "A structural and spectroscopic overview of molecular lanthanide complexes with fluorinated O-donor ligands." Coordination Chemistry Reviews 404 (2020): 213098.
Iacono, S. T. et al. "Fluorinated polyhedral oligomeric silsesquioxanes (F-POSS)", Defense Technical Information Center, (2010) url:https://apps.dtic.mil/sti/tr/pdf/ADA521393.pdf.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Iacono, Scott T., et al. "Facile synthesis of hydrophobic fluoroalkyl functionalized silsesquioxane nanostructures." Chemical communications 47 (2007): 4992-4994.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.
Ikonnikov, D.A., "Controlling Multiple Diffraction with Quasiperiodic Gratings", Laser Phys. Lett., 16.12 (2019):126202.
Im, Yirang, et al. "Recent progress in high-efficiency blue-light-emitting materials for organic light-emitting diodes." Advanced Functional Materials 27.13 (2017): 1603007.
Imoto, H. et al., "Corner- and Side-Opened Cage Silsesquioxanes: Structural Effects on the Materials Properties", European Journal of Inorganic Chemistry, Sep. 2020 (2020):737-742.
Imoto, H. et al., "Tripodal Polyhedral Oligomeric Silsesquioxanes as a Novel Class of Three-Dimensional Emulsifiers", Polymer Journal, 47 (2015):609-615.
International Search Report and Written Opinion on PCT PCT/IB2022/062254 dated Mar. 13, 2023 (10 pages).
Ishii, Kenji, et al. "Ferromagnetism and giant magnetoresistance in the rare-earth fullerides Eu6-x SrxC60." Physical Review B 65.13 (2002): 134431.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jain, Akash, Gang Yang, and Samuel H. Yalkowsky. "Estimation of melting points of organic compounds." Industrial & engineering chemistry research 43.23 (2004): 7618-7621.
Jang, Sang Eok, et al. "Thermally stable fluorescent blue organic light-emitting diodes using spirobifluorene based anthracene host materials with different substitution position." Synthetic metals 160.11-12 (2010): 1184-1188.
Jarvis, N.L. and Zisman, W.A., "Surface Chemistry of Fluorochemicals", Defense Technical Information Center (1965):1-37.
Jarvis, N.L., Zisman, W.A., and Naval Research Lab Washington DC, "Surface Chemistry of Fluorochemicals", Defense Technical Information Center, (1965):1-37.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Jin, Y. et al. "Two-Tier Ensemble Deep Learning Model for Anomaly Detection in OLED Encapsulation Process" The 21st International Meeting on Information Display, Seoul, Korea (2021).
Johnson, P. G., and B. Tittle. "The preparation of perfluorinated carboxylic esters and perfluoro carbonates." Journal of Fluorine Chemistry 3.1 (1973): 1-6.
Joliton, Adrien, and Carreira, Erick M. "Ir-Catalyzed Preparation of SF5-Substituted Potassium Aryl Trifluoroborates via C—H Borylation and Their Application in the Suzuki-Miyaura Reaction." Organic Letters 15.20 (2013): 5147-5149.
Josefsen, Leanne B., and Ross W. Boyle. "Photodynamic therapy and the development of metal-based photosensitisers." Metal-based drugs 2008 (2008).
Jung, W. et al. "62-3: High Precise laser glass cutting for future display" Journal of the Society for Information Display 30.5 (2022): 462-470.
Jung, W. et al. "Extremely Precise Laser Glass Cutting Technology for Future Display", The 21st international meeting on information display, Seoul, Korea.
Jung, W. et al. "High-precision laser glass cutting for future display" Journal of the Society for Information Display 30.5 (2022): 462-470.

(56) References Cited

OTHER PUBLICATIONS

Kaesler, K., "The hidden defenders : Silane and siloxane impregnation protects construction materials", European coatings journal, 3 (2006):36-41.
Kajdas, C. "Nanoscale boundary lubrication of diamond-like carbon coatings with fluorinated compounds." Journal of Synthetic Lubrication 18.1 (2001): 17-38.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Ke, L., et al. "Panchromatic ternary/quaternary polymer/fullerene BHJ solar cells based on novel silicon naphthalocyanine and silicon phthalocyanine dye sensitizers." Journal of Materials Chemistry A 5.6 (2017): 2550-2562.
Khan, Sami. Hydrophobicity of rare-earth oxide ceramics and their application in promoting sustained drop-wise condensation. Diss. Massachusetts Institute of Technology, 2016.
Khanin, D. A., et al. "New hybrid materials based on cyclophosphazene and polysiloxane precursors: Synthesis and properties." Polymer 186 (2020): 122011.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.
Kido, Junji, and Toshio Matsumoto. "Bright organic electroluminescent devices having a metal-doped electron-injecting layer. "Applied Physics Letters 73.20 (1998): 2866-2868.
Kim, Beomjin, et al. "Synthesis and electroluminescence properties of highly efficient blue fluorescence emitters using dual core chromophores." Journal of Materials Chemistry C 1.3 (2013): 432-440.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, H. et al. "Reliability Characterization of Luminance Degradation of OLED Mobile Display Considering Color Difference Index Based on Usage Patterns." SID 2020 Symposium.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays."?SID Symposium Digest of Technical Papers. vol. 51. No. 1. 2020.
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, Kwon-Hyeon, and Jang-Joo Kim. "Origin and Control of Orientation of Phosphorescent and TADF Dyes for High-Efficiency OLEDs." Advanced Materials 30.42 (2018): 1705600.
Kim, Kyu-Sung, et al. "Blue light-emitting OLED using new spiro [fluorene-7, 9'-benzofluorene] host and dopant materials." Organic Electronics 9.5 (2008): 797-804.
Kim, S et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. "40-2: Long lifetime Phosphorescent Blue" 2022 Display Week International Symposium, San Jose (2022).
Kim, S. et al. "Machine-Learning-Assisted Materials Discovery of Blue Emitter for a More Efficient and Durable OLED Device." 2021 Virtual Display Week International Symposium (2021).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kim, Sinheui, et al. "Degradation of blue-phosphorescent organic light-emitting devices involves exciton-induced generation of polaron pair within emitting layers." Nature communications 9.1 (2018): 1-11.
Kim, T. et al., "Electrical Injection and Transport in Teflon-Diluted Hole Transport Materials", Organic Electronics, 83 (2020): 105754.
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kim, Y. et al. "17-2: Invited talk: Simulation Based Artificial Intelligence for Displays." 2021 Virtual Display Week International Symposium (2021).
King, Allison, et al. "Semicrystalline polyphosphazenes: A comparative study of topology, morphology, and contact angles for three fluorous and one aryl polyphosphazene." Polymer 54.3 (2013): 1123-1129.
Kireev, Vyacheslav V., V. I. Astrina, and Eugeny A. Chernyshev. "Oligomeric Alkoxyphosphazens." Russian Chemical Reviews 50.12 (1981): 1186.
Kisin, Srdjan. Adhesion changes at metal-polymer interfaces: Study of the copper-(acrylonitrile-butadiene-styrene) system. Diss. Dissertation, Technische Universiteit Eindhoven, 2007.
Kiskan, B., "Adapting Benzoxazine Chemistry for Unconventional Applications", Reactive and Functional Polymers, 129 (2018):76-88.
Knight Jr, L. B., et al. "Unusual behavior of vaporized magnesium under low pressure conditions." The Journal of Physical Chemistry 79.12 (1975): 1183-1190.
Kobayashi, Hideki, and Michael J. Owen. "Surface tension of liquid polysiloxanes having fluorinated alkyl side-chains." Die Makromolekulare Chemie: Macromolecular Chemistry and Physics 194.6 (1993): 1785-1792.
Kober, Ehrenfried, Henry Lederle, and Gerhard Ottmann. "Fluoroalkylphosphonitrilates: A New Class of Potential Fire-Resistant Hydraulic Fluids and Lubricants. I." Asle Transactions 7.4 (1964): 389-397.
Koh, K et al., "Precision Synthesis of a Fluorinated Polyhedral Oligomeric Silsesquioxane-Terminated Polymer and Surface Char-

(56) References Cited

OTHER PUBLICATIONS acterization of Its Blend Film with Poly(methyl methacrylate)", Macromolecules, 38.4 (2005):1264-1270.
Kohonenko, V. I., et al. "Density and surface tension of liquid rare earth metals, scandium, and yttrium." physica status solidi (a) 84.2 (1984): 423-432.
Koma, N. et al. "44.2: Novel Front-light System Using Fine-pitch Patterned Oled." SID Symposium Digest of Technical Papers, 39: 655-658. 2008.
Koplik, Richard. "Ultraviolet and visible spectrometry", url: https://web.vscht.cz/~poustkaj/SFA-9-UV_VIS_spectrometry.pdf.
Korich, Andrew L., and Peter M. Iovine. "Boroxine chemistry and applications: A perspective." Dalton Transactions 39.6 (2010): 1423-1431.
Kota, Arun K., Gibum Kwon, and Anish Tuteja. "The design and applications of superomniphobic surfaces." NPG Asia Materials 6.7 (2014): e109-e109.
Kota, Arun K., Gibum Kwon, and Anish Tuteja. "The design and applications of superomniphobic surfaces." NPG Asia Materials 6.7 (2014): e109.
Kovacik, P. et al., "Vacuum-Deposited Planar Heterojunction Polymer Solar Cells", ACS Appl. Mater. Interfaces, 3.1 (2011):11-15.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance?" Advances in Colloid and Interface Science 210 (2014): 65-71.
Krishnamurthy, S. S., P. M. Sundaram, and Michael Woods. "Studies of phosphazenes. 12. Reactions of N4P4Cl8 with dibenzylamine-isolation of an unusual" bicyclic "phosphazene, N4P4 [N (CH2Ph) 2] 6 (NCH2Ph)." Inorganic Chemistry 21.1 (1982): 406-410.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Kwak, Sang Woo, et al. "Synthesis and Electroluminescence Properties of 3-(Trifluoromethyl)phenyl-Substituted 9,10-Diarylanthracene Derivatives for Blue Organic Light-Emitting Diodes." Applied Sciences 7.11 (2017): 1109-1120.
Kwon, Sun-kap, et al. "Efficient micro-cavity top emission OLED with optimized Mg: Ag ratio cathode." Optics Express 25.24 (2017): 29906-29915.
Lanoux, S. and Mas, R.H., "Reactions of the Hydrolyzed Phosphazene N3P3(OCH2CF3)5ONa", Phosphorus and Sulfur and the Related Elements, 26.2 (1986):139-142.
Lederle, Henry, Ehrenfried Kober, and Gerhard Ottmann. "Fluoroaklyl Phosphonitrilates: A New Class of Potential Fire-Resistant Hydraulic Fluids and Lubricants." Journal of Chemical and Engineering Data 11.2 (1966): 221-228.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.
Lee, David KY, et al. "Synthesis and inclusion behavior of cyclotriphosphazene molecules with asymmetric spiro rings." Dalton Transactions 39.22 (2010): 5341-5348.
Lee, Donggu, et al. "The influence of sequential ligand exchange and elimination on the performance of P3HT: CdSe quantum dot hybrid solar cells." Nanotechnology 26.46 (2015): 465401.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J. et al. "55-2: Methods for Overcoming the Trade-off between Efficiency and Lifetime of Organic Light-Emitting Diodes: OLED Lifetime Simulation." SID2020 Symposium.
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, Jiun-Haw, et al. "Blue organic light-emitting diodes: current status, challenges, and future outlook." Journal of Materials Chemistry C 7.20 (2019): 5874-5888.
Lee, S. et al. "20-2: High Efficiency and Long Device Lifetime Green Organic Light Emitting Diodes using a Pt Complex." SID Symposium Digest of Technical Papers 51.1 (2020).
Lee, S. et al. "Highly Efficient and Long-lifetime Green OLED using a Pt Complex." 2020 Virtual Display Week International Symposium.
Lee, Sangwha, Joon-Seo Park, and T. Randall Lee. "The wettability of fluoropolymer surfaces: Influence of surface dipoles." Langmuir 24.9 (2008): 4817-4826.
Lei, Hui, et al. "Fluorine-free low surface energy organic coating for anti-stain applications." Progress in Organic Coatings 103 (2017): 182-192.
Lei, Ying Duan, Frank Wania, and Dan Mathers. "Temperature-dependent vapor pressure of selected cyclic and linear polydimethylsiloxane oligomers." Journal of Chemical & Engineering Data 55.12 (2010): 5868-5873.
Lenton, M. V., and B. Lewis. "Preparation and properties of some novel diaminotetra (fluoroalkoxy)-triphosphonitriles." Journal of the Chemical Society A: Inorganic, Physical, Theoretical (1966): 665-667.
Li, Chong, et al. "Photocontrolled Intramolecular Charge/Energy Transfer and Fluorescence Switching of Tetraphenylethene-Dithienylethene-Perylenemonoimide Triad with Donor-Bridge-Acceptor Structure." Chemistry—An Asian Journal 9.1 (2014): 104-109.
Li, L. et al., "Synthesis and Properties of Microporous Organic Polymers Based on Adamantane", Progress in Chemistry, 32 (2020):190-203.
Li, Lu, et al. "Fluorinated anthracene derivatives as deep-blue emitters and host materials for highly efficient organic light-emitting devices." RSC Advances 5.73 (2015): 59027-59036.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Meng, et al. "Facile fabrication of superhydrophobic surface from fluorinated poss acrylate copolymer via one-step breath figure method and its anti-corrosion property." Polymers 11.12 (2019): 1953.

(56) References Cited

OTHER PUBLICATIONS

Liu, Xiao, et al. "Substituent exchange reactions of linear oligomeric aryloxyphosphazenes with sodium 2, 2, 2-trifluoroethoxide." Inorganic chemistry 51.21 (2012): 11910-11916.
Liu, Xiao, et al. "Substituent exchange reactions with high polymeric organophosphazenes." Macromolecules 45.22 (2012): 9100-9109.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Liu, Z. et al., "Two-Dimensional Gratings of Hexagonal Holes for High Order Diffraction Suppression", Optics Express, 25.2 (2017): 1339-1349.
Lo, Angel SW, and István T. Horváth. "Fluorous ethers." Green Chemistry 17.10 (2015): 4701-4714.
Lowe, R.D. et al., "Deposition of Dense Siloxane Monolayers from Water and Trimethoxyorganosilane Vapor", Langmuir, 27.16 (2011):9928-9935.
Lu, Changqing, Jae-Ho Kim, and Darryl D. DesMarteau. "Synthesis of perfluoro-t-butyl trifluorovinyl ether and its copolymerization with TFE." Journal of Fluorine Chemistry 131.1 (2010): 17-20.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane-OH and Epoxy Resins", Journal of Applied Polymer Science, 106.6 (2007):4117-4123.
Lund, L. G., et al. "514. Phosphonitrilic derivatives. Part I. The preparation of cyclic and linear phosphonitrilic chlorides." Journal of the Chemical Society (Resumed) (1960): 2542-2547.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Maderna, Andreas, et al. "The syntheses of amphiphilic camouflaged carboranes as modules for supramolecular construction." Journal of the American Chemical Society 123.42 (2001): 10423-10424.
Magda van Leeuwen, et al. "The photochemistry and photophysics of a series of alpha octa(alkyl-substituted) silicon, zinc and palladium phthalocyanines." Photochemical & Photobiological Sciences 13.1 (2014): 62-69.
Maher, Andrew E., and Harry R. Allcock. "Influence of the n-Hexoxy Group on the Properties of Fluoroalkoxyphosphazene Polymers." Macromolecules 38.2 (2005): 641-642.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic-Superhydrophilic Surface", Scientific Reports, 8 (2018):18018.
Malandrino, Graziella, et al. "New thermally stable and highly volatile Precursors for lanthanum MOCVD: Synthesis and characterization of lanthanum. Beta.-Diketonate Glyme Complexes." Inorganic Chemistry 34.25 (1995): 6233-6234.
Mao, Hui-Ting, et al. "Recent progress in phosphorescent Ir (III) complexes for nondoped organic light-emitting diodes." Coordination Chemistry Reviews 413 (2020): 213283.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marchon, B., et al. "Fomblin Multidentate Lubricants for Ultra-Low Magnetic Spacing." IEEE Transactions on Magnetics 42.10 (2006): 2504-2506.
Marzari, N. et al. "Electronic-structure methods for materials design." Nature materials 20.6 (2021): 736-749.
McDowell, Matthew, Ashley E. Wright, and Nathan I. Hammer. "Semiconductor nanocrystals hybridized with functional ligands: New composite materials with tunable properties." Materials 3.1 (2010): 614-637.
McIntosh, Thomas J., et al. "Structure and Interactive Properties of Highly Fluorinated Phospholipid Bilayers." Biophysical Journal 71.4 (1996): 1853-1868.
McMasters, O. D., and K. A. Gschneidner Jr. "Ytterbium-magnesium system." Journal of the Less Common Metals 8.5 (1965): 289-298.
Medenbach, O., et al. "Refractive index and optical dispersion of rare earth oxides using a small-prism technique." Journal of Optics A: Pure and Applied Optics 3.3 (2001): 174.
Meinders, Marcel BJ, William Kloek, and Ton van Vliet. "Effect of surface elasticity on Ostwald ripening in emulsions." Langmuir 17.13 (2001): 3923-3929.
Melville, Owen A., Trevor M. Grant, and Beno?t H. Lessard. "Silicon phthalocyanines as N-type semiconductors in organic thin film transistors." Journal of Materials Chemistry C 6.20 (2018): 5482-5488.
Michel, U., et al. "Copolymerization of tetrafluoroethylene and 2, 2-bis (trifluoromethyl)-4, 5-difluoro-1, 3-dioxole in supercritical carbon dioxide." Macromolecules 36.19 (2003): 7107-7113.
Michele Ricks. Advanced OLED Materials Enabling Large-Size OLED Displays by Ink Jet Printing. OLEDs World Summit, Sep. 2020.
Mikhaylov, D.Y. and Budnikova, Y.H., "Fluoroalkylation of Organic Compounds", Russian Chemical Reviews, 82.9 (2013):835-864.
Mishra, Shashank, and Stephane Daniele. "Metal-organic derivatives with fluorinated ligands as precursors for inorganic nanomaterials." Chemical Reviews 115.16 (2015): 8379-8448.
Mittal, Kashmiri Lal, ed. Metallized plastics 3: fundamental and applied aspects. Springer Science & Business Media, 2012.
Modzelewski, Tomasz, and Harry R. Allcock. "An unusual polymer architecture for the generation of elastomeric properties in fluorinated polyphosphazenes." Macromolecules 47.19 (2014): 6776-6782.
Morgenstern, Karina, Georg Rosenfeld, and George Comsa. "Decay of two-dimensional Ag islands on Ag (111)." Physical review letters 76.12 (1996): 2113.
Mucur, et al., "Charge Carrier Performance of Phosphazene-based Ionic Liquids Doped Hole Transport Layer in Organic Light-emitting Diodes," Applied Physics A, Material Science & Processing, 2020, vol. 126, 923, pp. 1-14.
Mucur, S.P., et al. "Conventional and inverted organic light emitting diodes based on bright green emmisive polyfluorene derivatives." Polymer 151.12 (2018): 101-107.
Mugisawa, M. et al., "Synthesis and Application of Novel Fluoroalkyl End-Capped Cooligomers Having Adamantane as a Pendant Group", Colloid Polym Sci, 285 (2007):737-744.
Murano, Sven, et al. "30.3: Invited Paper: AMOLED Manufacturing—Challenges and Solutions from a Material Makers Perspective." SID Symposium Digest of Technical Papers. vol. 45. No. 1. 2014.
Muray, M. et al., "NMR Studies of Hydrolysis and Rearrangement Reactions of Cyclophosphazenes", Phosphorus, Sulfur, and Silicon and the Related Elements, 65.1-4 (1992):83-86.
Murcur, S.P., et al., "Charge Carrier Performance of Phosphazene-based Ionic Liquids Doped Hole Transport Layer in Organic Light-emitting Diodes," Applied Physics A, Material Science & Processing, (2020), vol. 126:923, pp. 1-14.
Murotani, Eisuke, et al. "Synthesis and polymerization of a novel perfluorinated monomer." Journal of Fluorine Chemistry 128.10 (2007): 1131-1136.
Murray, M. et al., "NMR Studies of Hydrolysis and Rearrangement Reactions of Cyclophosphazenes", Phosphorus, Sulfur, and Silicon and the Related Elements, 65.1-4 (1992):83-86.

(56) References Cited

OTHER PUBLICATIONS

Nabatova-Gabain, Nataliya, Yoko Wasai, and Taiju Tsuboi. "Spectroscopic ellipsometry study of Ir (ppy) 3 organic light emitting diode." Current Applied Physics 6.5 (2006): 833-838.
Nakamura, Daiki, et al. "68-4: Top-emission OLED Kawara-type Multidisplay with Auxiliary Electrode." SID Symposium Digest of Technical Papers. vol. 49. No. 1. 2018.
Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Navarrini, Walter, et al. "Low surface energy coatings covalently bonded on diamond-like carbon films." Diamond and related materials 19.4 (2010): 336-341.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on -CF3 Alignment", Langmuir, 15(1999):4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Notice of Reason for Rejection on Japanese Application No. 2023-518448 dated Dec. 22, 2023.
Nykänen, Virginia P. Silva, et al. "An efficient and stable star-shaped plasticizer for starch: cyclic phosphazene with hydrogen bonding aminoethoxy ethanol side chains." Green Chemistry 16.9 (2014): 4339-4350.
Office Action for Chinese Application No. 202180041306.X dated Aug. 13, 2024.
Office action for Japanese Application No. 2022-561483 dated Dec. 19, 2024, 12 pages.
Office action for Korean Application No. 10-2022-7037670 dated Nov. 20, 2024, 244 pages.
Office Action on Korean Application No. 10-2023-7013418 dated Mar. 28, 2024.
Office Action on Korean Application No. 10-2023-7022930 dated Oct. 10, 2024.
Office Action with English Translation for Chinese Patent Application No. 202180074135.0 dated Feb. 21, 2025, 20 pages.
Office action with English Translation for Japanese Application No. 2022-561483 dated Dec. 19, 2024, 12 pages.
Oh, Il-Kwon, et al. "Hydrophobicity of rare earth oxides grown by atomic layer deposition." Chemistry of Materials 27.1 (2015): 148-156.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohno, T. R., et al. "Yb and Yb—K fulleride formation, bonding, and electrical character." Physical Review B 46.16 (1992): 10437.
Ohring, Milton. Materials science of thin films. Elsevier, 2001.
Oka, M. and Satoshi, H. "Synthesis of photoresponsive cyclic poly (dimethyl siloxane) s from monodisperse linear precursors" Reactive and functional polymers 158 (2021): 104800.
Okamoto, Yoshiyuki, et al. "New amorphous perfluoro polymers: perfluorodioxolane polymers for use as plastic optical fibers and gas separation membranes." Polymers for Advanced Technologies 27.1 (2016): 33-41.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Olejnik, A. et al., "Silsesquioxanes in the Cosmetics Industry—Applications and Perspectives", Materials, 15.3 (2022):1126-1143.
Olshavsky, Michael, and Harry R. Allcock. "Polyphosphazenes with high refractive indices: optical dispersion and molar refractivity." Macromolecules 30.14 (1997): 4179-4183.
Ottmann, Gerhard, Henry Lederle, and Ehrenfried Kober. "Arylamino Polyfluoroalkoxy Phosphonitriles. New Class of Potential Fire-Resistant Hydraulic Fluids and Lubricants." Industrial & Engineering Chemistry Product Research and Development 5.2 (1966): 202-204.
Owen, M. J. "A review of significant directions in fluorosiloxane coatings" Surface Coatings International Part B: Coatings Transactions 87:B2 (2004).
Özdas, E., et al. "Superconductivity and cation-vacancy ordering in the rare-earth fulleride Yb2.75C60." Nature 375.6527 (1995): 126-129.
Pandharkar, Riddhish, et al. "A Computational Study of AIF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Pearson, Andrew J., et al. "Silicon phthalocyanines as dopant red emitters for efficient solution processed OLEDs." Journal of Materials Chemistry C 5.48 (2017): 12688-12698.
Peters, Richard D., et al. "Using Self-Assembled Monolayers Exposed to X-rays To Control the Wetting Behavior of Thin Films of Diblock Copolymers." Langmuir 16.10 (2000): 4625-4631.
Pham, J.Q. and Green, P.F., "The Glass Transition of Thin Film Polymer/Polymer Blends: Interfacial Interactions and Confinement", J. Chem. Phys., 116.13 (2002):5801-5806.
Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.
Pittman, Allen G., Dennis L. Sharp, and Barbara A. Ludwig. "Polymers derived from fluoroketones. II. Wetting properties of fluoroalkyl acrylates and methacrylates." Journal of Polymer Science Part A-1: Polymer Chemistry 6.6 (1968): 1729-1740.
Plajer, Alex J., et al. "A modular approach to inorganic phosphazane macrocycles." Angewandte Chemie International Edition 56.31 (2017): 9087-9090.
Plajer, Alex J., et al. "Conformational Control in Main Group Phosphazane Anion Receptors and Transporters." Journal of the American Chemical Society 142.2 (2019): 1029-1037.
Plajer, Alex J., et al. "Tailoring the Binding Properties of Phosphazane Anion Receptors and Transporters." Journal of the American Chemical Society 141.22 (2019): 8807-8815.
Plint, Trevor, Benoît H. Lessard, and Timothy P. Bender. "Assessing the potential of group 13 and 14 metal/metalloid phthalocyanines as hole transport layers in organic light emitting diodes." Journal of Applied Physics 119.14 (2016): 145502.
Prassides, Kosmas, Yasuhiro Takabayashi, and Takeshi Nakagawa. "Mixed valency in rare-earth fullerides." Philosophical Transactions of the Royal Society A: Mathematical, Physical and Engineering Sciences 366.1862 (2008): 151-161.

(56) References Cited

OTHER PUBLICATIONS

Pu, T. et al., "Effects of Structure Parameters on High-Order Diffraction Suppression of Quasi-Periodic Gratings", Journal of the Optical Society of America B, 35.4 (2018):711-717.
Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.
Quast, Matthew J., et al. "Synthesis and Physical Properties of Highly Branched Perfluorinated Polymers from AB and AB2 Monomers." Journal of Polymer Science Part A: Polymer Chemistry 53.16 (2015): 1880-1894.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.
Ratz, Rudi, et al. "A New Class of Stable Phosphonitrilic Acid Esters. Polyfluoroalkyl Phosphonitrilates." Journal of the American Chemical Society 84.4 (1962): 551-555.
Reichert, V.R. and Mathias, L.J., "Expanded Tetrahedral Molecules from 1,3,5,7-Tetraphenyladarnantane", Macromolecules, 27.24 (1994):7015-7023.
Ren, Zhongjie, and Yan, Shouke. "Polysiloxanes for optoelectronic applications." Progress in Materials Science 83 (2016): 383-416.
Rey, Nadège, et al. "Dumbbell-Shaped T8-POSS with Functional Organic Linkers." European Journal of Inorganic Chemistry 2019. 27 (2019): 3148-3156.
Ribeiro, Paulo, David L. Andrews, and Maria Raposo, eds. Optics, Photonics and Laser Technology 2017. vol. 222. Springer, 2019.
Riberiro, P et al., "Optics, Photonics and Laser Technology 2017", Chapters 2 and 3, Springer (2019).
Riess, Jean G. "Understanding the fundamentals of perfluorocarbons and perfluorocarbon emulsions relevant to in vivo oxygen delivery." Artificial cells, blood substitutes, and biotechnology 33.1 (2005): 47-63.
Ringe, E., "Shapes, Plasmonic Properties, and Reactivity of Magnesium Nanoparticles", J. Phys, Chem. C, 124 (2020):15665.
Roesky, H. W., and E. Niecke. "Darstellung von P3N3F5NH2 und P3N3F5NPCI3." Inorganic and Nuclear Chemistry Letters 4.8 (1968): 463-465.
Roesky, Herbert W. "Lineare und cyclische Chlorphosphazene." Chemische Berichte 105.4 (1972): 1439-1445.
Roesky, Herbert W., Walter Grosse Bowing, and Edgar Niecke. "Über die Darstellung von Fluorcyclotriphosphazenen mit Phosphazenseitenketten." Chemische Berichte 104.2 (1971): 653-660.
Roitman, James N., and Allen G. Pittman. "Wetting properties of acrylic polymers containing perfluoro-t-butyl side chains." Journal of Polymer Science Part B: Polymer Letters 10.7 (1972): 499-503.
Roitman, James N., and Allen G. Pittman. "Wetting properties of bis (trifluoromethyl) carbinyl acrylate polymers." Journal of Polymer Science: Polymer Chemistry Edition 12.7 (1974): 1421-1436.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Romack, T. J., J. M. DeSimone, and T. A. Treat. "Synthesis of tetrafluoroethylene-based, nonaqueous fluoropolymers in supercritical carbon dioxide." Macromolecules 28.24 (1995): 8429-8431.
Roy, M.R., "Surface Properties of Hard Fluorinated Amorphous Carbon Films Deposited by Pulsed-DC Discharges", Doctoral Thesis, Universitat de Barcelona (2012).
Rudy Dams and Klaus Hintzer, Chapter 1: Industrial Aspects of Fluorinated Oligomers and Polymers, in Fluorinated Polymers: vol. 2: Applications, 2016, pp. 1-31.
Rumyantcev, R. V., and G. K. Fukin. "Intramolecular C—F—Ln dative interactions in lanthanide complexes with fluorinated ligands." Russian Chemical Bulletin 66.9 (2017): 1557-1562.
Safonov, Alexey I., et al. "Deposition of thin composite films consisting of fluoropolymer and silver nanoparticles having surface plasmon resonance." Thin Solid Films 603 (2016): 313-316.
Sajoto, Tissa, et al. "Temperature dependence of blue phosphorescent cyclometalated Ir (III) complexes." Journal of the American Chemical Society 131.28 (2009): 9813-9822.
Sakamoto, Keiichi, and Eiko Ohno-Okumura. "Syntheses and functional properties of phthalocyanines." Materials 2.3 (2009): 1127-1179.
Sakka, Tetsuo, and Yukio H. Ogata. "Surface tension of fluoroalkanes in a liquid phase." Journal of fluorine chemistry 126.3 (2005): 371-375.
Sanju, K. S. "Synthesis of Organic Systems and Study of their Light Emitting Properties in Solution and Polymer Matrix." Chapter 1. https://shodhganga.inflibnet.ac.in/bitstream/10603/106813/8/08_chapter%201.pdf.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schenck, Rudolf, and G. Romer. "Uber die Phosphornitrilchloride und ihre Umsetzungen (I.)." Berichte der deutschen chemischen Gesellschaft (A and B Series) 57.8 (1924): 1343-1355.
Schilling, C.I. et al., "Fourfold Suzuki-Miyaura and Sonogashira Cross-Coupling Reactions on Tetrahedral Methane and Adamantane Derivatives", Eur. J. Org. Chem., Sep. 2011 (2011):1743-1754.
Schissel, Paul, and Alvin Warren Czanderna. "Reactions at the silver/polymer interface: a review." Solar Energy Materials 3.1-2 (1980): 225-245.
Schneider, Andreas, Stefan Kairies, and Klaus Rose. "Synthesis of alkoxysilyl substituted cyclophosphazenes and their properties in the sol-gel process." Silicon Chemistry. Springer, Vienna, 1999. 89-98.
Schrogel, Pamela, et al. "Phosphazene-based host materials for the use in blue phosphorescent organic light-emitting diodes." Chemistry of Materials 23.22 (2011): 4947-4953.
Schwab, Tobias. Top-Emitting OLEDs: Improvement of the Light Extraction Efficiency and Optimization of Microcavity Effects for White Emission. Diss. Saechsische Landesbibliothek-Staats- und Universitaetsbibliothek Dresden, 2014.
Search Report for European Application No. 21822884.9 dated Jul. 3, 2024, 3 pages.
Seebauer, E.G. and Allen, C.E., "Estimating Surface Diffusion Coefficients", Progress in Surface Science, 49.3 (1995): 265-330.
Senaweera, Sameera M., and Jimmie D. Weaver. "Selective Perfluoro-and Polyfluoroarylation of Meldrum's Acid." The Journal of Organic Chemistry 79.21 (2014): 10466-10476.
Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.
Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.
Sessler, C.D et al., "CF2H, a Hydrogen Bond Donor", J. Am. Chem. Soc., 139.27 (2017):9325-9332.
Shen, Mingmin, et al. "Destabilization of Ag nanoislands on Ag (100) by adsorbed sulfur." The Journal of chemical physics 135.15 (2011): 154701.
Shen, Wen-Jian, et al. "Spirobifluorene-linked bisanthracene: An efficient blue emitter with pronounced thermal stability." Chemistry of materials 16.5 (2004): 930-934.
Shen, Xiao-Min, et al. "Highly photostable silicon(IV) phthalocyanines containing adamantane moieties: synthesis, structure, and properties." Tetrahedron 66.46 (2010): 9041-9048.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, Lina, et al. "Two dimensional gratings of connected holes for high order diffraction suppression." Optics, Photonics and Laser Technology 2017 (2019): 55-74.

(56) References Cited

OTHER PUBLICATIONS

Shi, Shiming, et al. "56-1: Invited Paper: Research on Commercial Foldable AMOLED and Relevant Technologies."? SID Symposium Digest of Technical Papers. vol. 51. No. 1. 2020.
Shi, Yan X., et al. "Synthesis and hydrolytic studies on the air-stable [(4-CN-PhO)(E) P (μ-N t Bu)] 2 (E= O, S, and Se) cyclodiphosphazanes." Inorganic Chemistry 54.13 (2015): 6423-6432.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Shin, Dong-Youn, and Inyoung Kim. "Self-patterning of fine metal electrodes by means of the formation of isolated silver nanoclusters embedded in polyaniline." Nanotechnology 20.41 (2009): 415301.
Shirasaki, Yasuhiro. Efficiency loss mechanisms in colloidal quantum-dot light-emitting diodes. Diss. Massachusetts Institute of Technology, 2013.
Shizu, Katsuyuki, et al. "Highly efficient blue electroluminescence using delayed-fluorescence emitters with large overlap density between luminescent and ground states." The Journal of Physical Chemistry C 119.47 (2015): 26283-26289.
Silicone Fluids, p. 20, retrieved from <https://s3.amazonaws.com/gelest/product-brochures/Inert_Silicones.pdf> on Mar. 24, 2022.
Sim, Ying, et al. "Orthogonality in main group compounds: a direct one-step synthesis of air-and moisture-stable cyclophosphazanes by mechanochemistry." Chemical Communications 54.50 (2018): 6800-6803.
Singh, Anurima, Lee Steely, and Harry R. Allcock. "Poly [bis (2, 2, 2-trifluoroethoxy) phosphazene] superhydrophobic nanofibers." Langmuir 21.25 (2005): 11604-11607.
Singh, Rajendra Prasad, et al. "A Novel Synthesis of Hexakis (trifluoromethyl) cyclotriphosphazene. Single-Crystal X-ray Structures of N3P3 (CF3) 6 and N3P3F6." Inorganic Chemistry 39.2 (2000): 375-377.
Sinha, A., et al., "Area selective atomic layer deposition of titanium dioxide: Effect of precursor chemistry", Journal of Vacuum Science & Technology B: Microelectronics and Nanometer Structures Processing, Measurement, and Phenomena, 2006, 24(6), 2523.
Smith, Arthur RG, Paul L. Burn, and Ben J. Powell. "Spin-Orbit Coupling in Phosphorescent Iridium (III) Complexes." ChemPhysChem 12.13 (2011): 2429-2438.
Smith, Arthur RG, Paul L. Burn, and Benjamin J. Powell. "Exact exchange and the density functional theory of metal-to-ligand charge-transfer in fac-Ir (ppy) 3." Organic Electronics 33 (2016): 110-115.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Snyder Jr, Carl E. "Structural Modifications of Fluoro-alkyl S-Triazines and Their Lubricant Properties." Asle Transactions 14.3 (1971): 237-242.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Song, Hongwei, Olusegun J. llegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Song, Wook, and Jun Yeob Lee. "Degradation mechanism and lifetime improvement strategy for blue phosphorescent organic light-emitting diodes." Advanced Optical Materials 5.9 (2017): 1600901.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Spoljaric, S. et al., "Novel Elastomer-Dumbbell Functionalized POSS Composites: Thermomechanical and Morphological Properties", Journal of Applied Polymer Science, 123.1(2012):585-600.
Starr, F.W. et al., "Bound Layers 'Cloak' Nanoparticles in Strongly Interacting Polymer Nanocomposites", ACS Nano, 10.12 (2016):10960-10965.
Steely, Lee B., et al. "Foam formation from fluorinated polyphosphazenes by liquid CO2 processing." Polymer Engineering & Science 48.4 (2008): 683-686.
Stokes, H. N. "On trimetaphosphimic acid and its decomposition-products." Amer. chem. J. 18 (1986): 629-663.
Stokes, Ho No. "On the chloronitrides of phosphorus." Amer. Chem. 17 (1985): 275-291.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, J. et al. "Realizing Deep Blue Emission in Blue Phosphorescent Organic Light-Emitting Diodes", SID Symposium Digest of Technical Papers, 2020.
Sun, T. et al., "Reversible Switching between Superhydrophilicity and Superhydrophobicity", Angew. Chem. Int. Ed., 43.3 (2004):357-360.
Sundaram, P. M., et al. "The Reaction of N4P4Cl8 with Dibenzylamine: Formation of an Unusual Bicyclic Phosphazene, N4P4 [N (CH2Ph) 2] 6 (NCH2Ph), by Dealkylation." Phosphorus and Sulfur and the Related Elements 8.3 (1980): 373-374.
Süzen, Yasemin, and Simge Metinoglu. "Novel cyclomatrix-type polyphosphazene microspheres crosslinked with octachlorocyclotetraphosphazene: preparation and characterization." Anadolu University Journal of Science and Technology A—Applied Sciences and Engineering 18.5 (2017): 973-987.
Svorcik, V. et al., "Deposition of Polystyrene Films by Vacuum Evaporation", Journal of Materials Science Letters, 16 (1997):1564-1566.
Syafiq, A., et al. "Superhydrophilic Smart Coating for Self-Cleaning Application on Glass Substrate." Journal of Nanomaterials 2018 (2018).
Szabó, Dénes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.
Szabó, Dénes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of fluorine chemistry 126.4 (2005): 641-652.
Takele, H. et al., "Plasmonic Properties of Ag Nanoclusters in Various Polymer Matrices", Nanotechnology, 17.14 (2006):3499-3505.

(56) References Cited

OTHER PUBLICATIONS

Tang, Meixian, et al. "Inhibition of bacterial adhesion and biofilm formation by a textured fluorinated alkoxyphosphazene surface." Bioactive Materials 6.2 (2021): 447-459.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tao, C. et al., "Highly Icephobic Properties on Slippery Surfaces Formed From Polysiloxane and Fluorinated POSS", Progress in Organic Coatings, 103 (2017):48-59.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903-1906.
Thran, A., et al. "Condensation coefficients of Ag on polymers." Physical review letters 82.9 (1999): 1903.
Thurston, John H., et al. "Toward a General Strategy for the Synthesis of Heterobimetallic Coordination Complexes for Use as Precursors to Metal Oxide Materials:? Synthesis, Characterization, and Thermal Decomposition of Bi2(Hsal)6?M(Acac)3 (M = Al, Co, V, Fe, Cr)." Inorganic chemistry 43.10 (2004): 3299-3305.
Tian, Zhicheng, Chen Chen, and Harry R. Allcock. "New Mixed-Substituent Fluorophosphazene High Polymers and Small Molecule Cyclophosphazene Models: Synthesis, Characterization, and Structure Property Correlations." Macromolecules 48.5 (2015): 1483-1492.
Tian, Zhicheng, et al. "Limits to expanding the PN-F series of polyphosphazene elastomers." Polymer Engineering & Science 54.8 (2014): 1827-1832.
Tian, Zhicheng, et al. "Phosphazene high polymers and models with cyclic aliphatic side groups: new structure-property relationships." Macromolecules 48.13 (2015): 4301-4311.
Tokuchi. S et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Töpper, Tino, et al. "Tailoring the mass distribution and functional group density of dimethylsiloxane-based films by thermal evaporation." APL Materials 4.5 (2016): 056101.
Trautner, Frank, et al. "Gas-Phase Structure of Hexakis (trifluoromethyl)-cyclotriphosphazene,[(CF3) 2PN] 3." Inorganic Chemistry 39.23 (2000): 5398-5399.
Tsai, Yu-Hsiang, et al. "P-202: A Flexible Transparent OLED Display with FlexUPTM Technology." SID Symposium Digest of Technical Papers. vol. 48. No. 1. 2017.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsuji, Kosuke, and Tsuyoshi Tsujioka. "Metal patterning for organic electronics based on metal undeposition effect on soft polymer surfaces." 2011 International Conference on Solid State Devices and Materials, Nagoya, 2011, pp. 380-381.
Tsujioka, Tsuyoshi, and Akari Nishimura. "Selective noble-metal deposition modulation on photocurable polydimethylsiloxane films for electronics device applications." Applied Physics A 127 (2021): 1-8.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Metal-vapor integration/transportation based on metal-atom desorption from polymer surfaces with a low glass-transition temperature." Journal of Vacuum Science & Technology A 35.2 (2017).
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films." Journal of Materials Chemistry 20.43 (2010): 9623-9627.
Tu, Kuan-Heng, et al. "A cyano-rich small molecule dopant for organic thermoelectrics." Organic Electronics 87 (2020): 105978.
Tuteja, A. et al., "Designing Superoleophobic Surfaces", Science, 318.5856 (2007):1618-1622.
Ullah, Raja Summe, et al. "Synthesis of polyphosphazenes with different side groups and various tactics for drug delivery." RSC advances 7.38 (2017): 23363-23391.
Umemoto, Teruo, et al. "Discovery of practical production processes for arylsulfur pentafluorides and their higher homologues, bis- and tris(sulfur pentafluorides): Beginning of a new era of 'super- trifluoromethyl' arene chemistry and its industry." Beilstein Journal of Organic Chemistry 8 (2012): 461-471.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by lonized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by lonization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Vampola, K. J. et al. "12-1: Through-OLED Display Ambient Color Sensing." Apple, Cupertino CA.
Van de Grampel, R.D., "Surfaces of Fluorinated Polymer Systems", Doctoral Thesis, Technische Universiteit Eindhoven (2002).
Varagnolo, Silvia, et al. "Embedded-grid silver transparent electrodes fabricated by selective metal condensation," Journal of Materials Chemistry C 8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vasilak, L. et al., "A statistical paradigm for organic optoelectronic devices: normal force testing for adhesion of OPVs and OLEDs", ACS Appl. Mater. Interfaces, 9.15 (2017), 13347-13356.
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vassileva, P., et al. "XPS determination of the binding energies of phosphorus and nitrogen in phosphazenes." Journal of materials science 39.9 (2004): 3201-3202.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.

(56) References Cited

OTHER PUBLICATIONS

Wadley, Maurice L., et al. "Solvent Dependence of the Morphology of Spin-Coated Thin Films of Polydimethylsiloxane-Rich Polystyrene-block-Polydimethylsiloxane Copolymers." Macromolecules 45.13 (2012): 5538-5545.
Wahl, Helene, Delia A. Haynes, and Tanya le Roex. "A series of polymorphs of hexakis (4-fluorophenoxy) cyclotriphosphazene." Crystal growth & design 12.8 (2012): 4031-4038.
Walker, Amy V., et al. "Dynamics of interaction of magnesium atoms on methoxy-terminated self- assembled monolayers: an example of a reactive metal with a low sticking probability." The Journal of Physical Chemistry C 111.2 (2007): 765-772.
Walsh, Patrick N., Harold W. Goldstein, and David White. "Vaporization of Rare-Earth Oxides." Journal of the American Ceramic Society 43.5 (1960): 229-233.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, Hailiang, et al. "P-132: An Under-Display Camera Optical Structure for Full-Screen LCD." SID Symposium Digest of Technical Papers. vol. 51. No. 1. 2020.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Maw Ling, and Ho Sheng Wu. "Kinetic study of the substitution reaction of hexachlorocyclotriphosphazene with 2, 2, 2-trifluoroethanol by phase-transfer catalysis and separation of the products." Industrial & engineering chemistry research 29.10 (1990): 2137-2142.
Wang, Y. et al., "Substrate Effect on the Melting Temperature of Thin Polyethylene Films", Physical Review Letters, 96.2 (2006):028303.
Wang, Y., and Q. J. Wang. "Lubrication regimes." Encyclopedia of Tribology (2013): 1903-2158.
Wang, Y., and Q. J. Wang. "Lubrication regimes." Encyclopedia of Tribology (2013): 2056.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Wei, H. and Eilers, H., "Electrical Conductivity of Thin-Film Composites Containing Silver Nanoparticles Embedded in a Dielectric Teflon® AF Matrix (Pre-print version)", Thin Solid Films, 517.2 (2008):575-581.
Wei, Qiang, et al. "Small-Molecule Emitters with High Quantum Efficiency: Mechanisms, Structures, and Applications in OLED Devices." Advanced Optical Materials 6.20 (2018): 1800512.
Weigel, W.K. et al., "Direct Radical Functionalization Methods to Access Substituted Adamantanes and Diamondoids", Org. Biomol. Chem., 20 (2022):10-36.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Wheeler, Bob L., et al. "A silicon phthalocyanine and a silicon naphthalocyanine: synthesis, electrochemistry, and electrogenerated chemiluminescence." Journal of the American Chemical Society 106.24 (1984): 7404-7410.
Wilcock, Donald F. "Vapor pressure-viscosity relations in methylpolysiloxanes." Journal of the American Chemical Society 68.4 (1946): 691-696.
Winget, P. et al. "57-1: Accelerating Next-Generation Display Materials Development with a Smart Digital Chemistry Platform." SID Symposium Digest of Technical Papers 54.1 (2023).
Winter, R. W., et al. "The application of novel methodology for the synthesis of o-, m-, and p-(SF5-perfluoroethyl) benzene derivatives." Journal of fluorine chemistry 122.2 (2003): 251-253.
Wojtczak, L., "The Melting Point of Thin Films", Phys. Stat. Sol., 23.2 (1967):K163-K166.
Wolf, Florian F., Joerg-M. Neudoerfl, and Bernd Goldfuss. "Hydrogen-bonding cyclodiphosphazanes: superior effects of 3, 5-(CF 3) 2-substitution in anion-recognition and counter-ion catalysis." New Journal of Chemistry 42.7 (2018): 4854-4870.
Wolfgang Decker, Vast Films, Ltd. "Pattern Metallization: Selective Deposition of Metals on Polymer Films for Functional Applications" AIMCAL Fall Conference 2005.
Wu, Y. et al. "P-13.5: Investigation on Chromatic Dispersion of Reflection for CFOT Display" SID Symposium Digest of Technical Papers 54 (2023).
Wu, Yinghua, and Jean-Luc Brédas. "Simulations of the emission spectra of fac-tris (2-phenylpyridine) iridium and Duschinsky rotation effects using the Herman-Kluk semiclassical initial value representation method." The Journal of chemical physics 129.21 (2008): 214305.
Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.
Xia, Bo, M. W. Ruckman, and Myron Strongin. "Photoelectron study of Yb/C60 bilayers and the Yb fullerides formed at the interfaces." Physical Review B 48.19 (1993): 14623.
Xia, Zhen-Yuan, et al. "High performance organic light-emitting diodes based on tetra (methoxy)-containing anthracene derivatives as a hole transport and electron-blocking layer." Journal of Materials Chemistry 20.38 (2010): 8382-8388.
Xie, Changqing, et al. "Towards high-order diffraction suppression using two-dimensional quasi-periodic gratings." Optics, Photonics and Laser Technology 2017 (2019): 31-53.
Xie, J. et al., "Regioselective Synthesis of Methyl-Substituted Adamantanes for Promoting Oxidation Stability of High-Density Fuels", Energy Fuels, 34.4 (2020):4516-4524.
Xu, Guang-Rui, Miao-Jun Xu, and Bin Li. "Synthesis and characterization of a novel epoxy resin based on cyclotriphosphazene and its thermal degradation and flammability performance." Polymer degradation and stability 109 (2014): 240-248.
Xu, Haoran, et al. "Fabrication of copper patterns on polydimethylsiloxane through laser-induced selective metallization." Industrial & Engineering Chemistry Research 60.24 (2021): 8821-8828.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, Pengyun, et al. "Superhydrophobic ceramic coating: Fabrication by solution precursor plasma spray and investigation of wetting behavior." Journal of Colloid and Interface Science 523 (2018): 35-44.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).

(56) References Cited

OTHER PUBLICATIONS

Yamada, Toshikazu, et al. "Nanoparticle chemisorption printing technique for conductive silver patterning with submicron resolution." Nature communications 7.1 (2016): 1-9.
Yang, H. et al., "Catalyst-Controlled C—H Functionalization of Adamantanes Using Selective H-Atom Transfer", ACS Catal., 9.6 (2019):5708-5715.
Yang, J. et al. "25-4: Methodology and Correlation of AI-Based Design for OLED Materials." SID Symposium Digest of Technical Papers 52.1 (2021).
Yang, J. et al. "25.4: Methodology and Correlation of AI-Based Design for OLED Materials." SID2021 Symposium.
Yang, Jun-Yu, et al. "32-3: AMOLED IR Drop Compensation for Channel Length Modulation." SID Symposium Digest of Technical Papers. vol. 51. No. 1. 2020.
Yang, Min K., Roger H. French, and Edward W. Tokarsky. "Optical properties of Teflon® AF amorphous fluoropolymers." Journal of Micro/Nanolithography, MEMS, and MOEMS 7.3 (2008): 033010.
Yanyan, Z. H. U., F. A. N. G. Zebo, and L. I. U. Yongsheng. "Structural and optical properties of Er2O3 films." Journal of Rare Earths 28.5 (2010): 752-755.
Yao, Pan, et al. "Highly soluble and thermally stable copolyimides modified with trifluoromethyl and siloxane." Journal of Applied Polymer Science 132.13 (2015).
Yao, Wenqiang, Yongjun Li, and Xiaoyu Huang. "Fluorinated poly (meth) acrylate: Synthesis and properties." Polymer 55.24 (2014): 6197-6211.
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yersin, Hartmut, et al. "Design of a new mechanism beyond thermally activated delayed fluorescence toward fourth generation organic light emitting diodes." Chemistry of Materials 31.16 (2019): 6110-6116.
Yersin, Hartmut, et al. "The triplet state of organo-transition metal compounds. Triplet harvesting and singlet harvesting for efficient OLEDs." Coordination Chemistry Reviews 255.21-22 (2011): 2622-2652.
Yeung, Leo WY, Christopher Stadey, and Scott A. Mabury. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yoo, D. et al. "Retrosynthesis Planning for Thermally Activated Delayed Fluorescence Molecules" The 21st International Meeting on Information Display, Seoul, Korea (2021).
Yook, Kyoung Soo, and Jun Yeob Lee. "Organic materials for deep blue phosphorescent organic light-emitting diodes." Advanced materials 24.24 (2012): 3169-3190.
Yoshinaga, Harunobu, et al. "Spin-orbit coupling analyses of phosphorescence: the effects of cyclometalated ligand replacement in fac-Ir (ppy) 3 with various bpy ligands on blue phosphorescence." RSC advances 6.69 (2016): 65020-65030.
Youn, S. et al. "73-4: Novel Materials and Structures for High Efficiency and Long Lifetime Green Phosphorescent OLEDs in Automotive Applications." SID 2022 Symposium.
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yuan, Fulong, et al. "A modified method for preparation of a pure octachlorocyclotetraphosphazene." Phosphorus, Sulfur, and Silicon and the Related Elements 176.1 (2001): 77-81.
Yuan, Y., D. Grozea, and Z. H. Lu. "Fullerene-doped hole transport molecular films for organic light-emitting diodes." Applied Physics Letters 86.14 (2005).
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science 532 (2003): 300-305.
Zaporojtchenko, V., et al. "Determination of condensation coefficients of metals on polymer surfaces." Surface science 454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zarian, J., P. C. Painter, and M. M. Coleman. "Vibrational Spectra and Normal Coordinate Calculations of Chlorophosphazene Compounds. II. Octachlorocyclotetraphosphazene." Applied Spectroscopy 36.3 (1982): 272-277.
Zeng, Yang, et al. "28-4: Investigation of Moire Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianyu, et al. "Transparent white organic light-emitting devices with a LiF/Yb: Ag cathode." Optics letters 34.8 (2009): 1174-1176.
Zhang, Tianzhan, et al. "Bio-inspired superhydrophilic coatings with high anti-adhesion against mineral scales." NPG Asia Materials 10.3 (2018): e471-e471.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhang, Xu, et al. "General approach to compute phosphorescent OLED efficiency." The Journal of Physical Chemistry C 122.11 (2018): 6340-6347.
Zhang, Xuan, et al. "Synthesis of extended polycyclic aromatic hydrocarbons by oxidative tandem spirocyclization and 1, 2-aryl migration." Nature communications 8.1 (2017): 1-8.
Zhang, Yongjie, Mingshuai Fan, and Xiaopei Li. "Reaction of "unreactive" silicone: synthesis of long-chain alkyl fluorosilicone via a simple siloxane equilibration process." Polymer Bulletin 77.6 (2020): 2855-2871.
Zhang, Zhenhua. "74-3: Image Deblurring of Camera Under Display by Deep Learning."?SID Symposium Digest of Technical Papers. vol. 51. No. 1. 2020.

(56) References Cited

OTHER PUBLICATIONS

Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Zharkova, N. M., M. A. Kleinovskaya, and Yu K. Molokanov. "Evaporation of oligoorganic siloxanes under hgh vacuum." Chemistry and Technology of Fuels and Oils 5.4 (1969): 257-261.
Zheng, Bi-Yuan, et al. "Synthesis and antifungal photodynamic activities of a series of novel zinc(II) phthalocyanines substituted with piperazinyl moieties." Dyes and Pigments 99.1 (2013): 185-191.
Zheng, Dongxiao, Pei Zhao, and Liangliang Zhu. "Non-conjugated and p-conjugated functional ligands on semiconductive quantum dots." Composites Communications 11 (2019): 21-26.
Zhu, C. et al. "A novel synthetic UV-curable fluorinated siloxane resin for low surface energy coating." Polymers 10.9 (2018): 979.
Zhu, X. L., et al. "29.3: Very Bright and Efficient Top-Emitting OLED with Ultra-Thin Yb as Effective Electron Injector." SID Symposium Digest of Technical Papers. vol. 37. No. 1. Oxford, UK: Blackwell Publishing Ltd, 2006.
Zibarov, A. et al., "AB5 Derivatives of Cyclotriphosphazene for the Synthesis of Dendrons and Their Applications", Molecules, 26.13 (2021):4017-4040.
Decision of Rejection for CN Appl. No. 202180041306.X dated Mar. 31, 2025 (27 pages with English language translation).
Final Office Action on Korean Application No. 10-2022-7037670 dated Jul. 7, 2025 (14 pages).
JP Office Action on JP Appl. No. 2022-561483 dated Jul. 1, 2025 (8 pages with English language translation).
JP Office Action on JP Appl. No. 2023-515731 dated Jun. 6, 2025 (7 pages with English language translation).
KR Office Action on KR Application No. 10-2023-7015326 dated Jun. 25, 2025 (14 pages with English language translation).
Notice for Reasons for Rejection on Japanese Appl. No. 2022-576446 dated May 12, 2025 (8 pages with English language translation).
Notice of Reasons for Rejection on JP Appl. No. 2023-504772 dated May 21, 2025 (16 pages with English language translation).
Notification of Grounds for Refusal for Korean App. No. 10-2023-7005506 dated May 9, 2025 (13 pages with English language translation).
Office action with English Translation for Chinese Application No. 202180041306.X dated Jan. 14, 2025, 21 pages with English language translation.
English translation Office Action for Chinese Patent Application No. 2021800611499, 3 pages.
JP Notice of Reasons for Rejection on JP Appl. No. 2023-545811 dated Aug. 14, 2025 (11 pages with English translation) (Keyword: Eng trans).
JP Notice of Rejection on JP Appl. No. 2023-526153 dated Aug. 1, 2025 (10 pages with English language translation).
KR Office Action on KR Appl. No. 10-2023-7001216 dated Jun. 26, 2025 (20 Pages with English language translation).
KR Office Action on KR Appl. No. 10-2023-7030369 dated Jun. 26, 2025 (24 pages with English language translation).
International Search Report and Written Opinion for PCT Application No. PCT/IB2022/061385 dated Feb. 22, 2022, 7 pages.
Malinowski, et al., "Photolithography as Enabler of AMOLED Displays Beyond 1000 ppi," SID Symposium, Seminar, and Exhibition 2017, Display Week 2017. May 21, 2017 through May 26, 2017, pp. 623-262.
Notification of Transmittal of The International Search Report and Written Opinion for PCT Application No. PCT/IB2021/058663 dated Dec. 31, 2021, 8 pages.
Office Action on CN Appl. No. 202180055454.7 dated Sep. 27, 2025 (10 pages with English language translation).
First Office Action for Chinese Appl. No. 202180061149.9, dated Mar. 25, 2025, (16 pages with English translation).
Foreign Office Action on Japanese Appl. No. 2022-576446 dated Oct. 8, 2025 (4 pages, with English translation).
Search Report on Chinese Appl. No. 202180061149.9 dated Oct. 31, 2025 (1 page).
JP Decision of Refusal for JP Appl. No. 2023-526153 dated Feb. 24, 2026 (8 pages).
JP Notices of Reasons for Rejection for JP Appl. No. 2024-156739 dated Mar. 26, 2026 (4 pages).
JP Office Action for JP Appl. No. 2023-533235 dated Dec. 9, 2025 (14 pages).
KR Final Rejection for KR Appl. No. 10-2023-7001216 dated Mar. 19, 2026 (9 pages).
Luo, Yu-Ran, and J. Alistair Kerr. "Bond dissociation energies." CRC handbook of chemistry and physics. Vol. 89. No. 89. Boca Raton: New York: CRC Press, 2012. 65-98.
Tian, Yongchi, Quock Y. Ng, and Janos H. Fendler. "Monolayers prepared from phosphazene functionalized fluorocarbon surfactants." Langmuir 14.11 (1998): 3067-3070.
White, Ronald P., and Jane EG Lipson. "Polymer free volume and its connection to the glass transition." Macromolecules 49.11 (2016): 3987-4007.
First Office Action on Chinese Appl. No. 202180090780.1 dated Jun. 3, 2026 (23 pages with English translation).
Notice of Grounds for Refusal on Korean Appl. No. 10-2023-7030369 dated Apr. 9, 2026 (20 pages, with English translation).
EP Examination Report on EP Appl. No. 21822884.9 dated Jun. 2, 2026 (6 pages).
JP Decision of Refusal on JP Appl. No. 2023-533235 dated Jun. 4, 2026 (10 pages with English language translation).
KR Notification of Grounds for Refusal for KR Appl. No. 10-2025-7029907 dated Jul. 9, 2026 (9 pages with English translation).
CN First Office Action for CN Appl. 202280090720.4 dated Apr. 30, 2026 (10 Pages).
JP Decision on Refusal on JP Appl. No. 2023-515731 dated May 27, 2026 (4 pages with English language translation).

* cited by examiner

DEVICE INCLUDING A LOW-INDEX COATING AND A RADIATION-MODIFYING LAYER

RELATED APPLICATIONS

The present application is a National Stage Entry under 35 U.S.C. § 371 of International Application No. PCT/IB2021/059300, filed 11 Oct. 2021, which claims the benefit of priority to: US Provisional Patent Application Nos. U.S. 63/090,098 filed 9 Oct. 2020, U.S. 63/107,393 filed 29 Oct. 2020, U.S. 63/122,421 filed 7 Dec. 2020, U.S. 63/141,857 filed 26 Jan. 2021, U.S. 63/153,834 filed 25 Feb. 2021, U.S. 63/158,185 filed 8 Mar. 2021, U.S. 63/163,453 filed 19 Mar. 2021, and U.S. 63/181,100 filed 28 Apr. 2021, the contents of each of which are incorporated herein by reference in their entirety.

TECHNICAL FIELD

The present disclosure relates to layered semiconductor devices and in particular to an opto-electronic device having first and second electrodes separated by a semiconductor layer and having a conductive deposited material deposited thereon, patterned using a patterning coating, which may act as and/or be a nucleation-inhibiting coating (NIC) and/or such NIC.

BACKGROUND

In an opto-electronic device such as an organic light emitting diode (OLED), at least one semiconducting layer is disposed between a pair of electrodes, such as an anode and a cathode. The anode and cathode are electrically coupled with a power source and respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes. Various layers and coatings of such panels are typically formed by vacuum-based deposition processes.

In some applications, there may be an aim to provide a conductive and/or electrode coating in a pattern for each (sub-)pixel of the panel across either, or both of, a lateral and a cross-sectional aspect thereof, by selective deposition of at least one thin film of the conductive coating to form a device feature, such as, without limitation, an electrode and/or a conductive element electrically coupled therewith, during the OLED manufacturing process.

In some applications, there may be an aim to make the device substantially transparent therethrough, while still capable of emitting light therefrom. In some applications, the device comprises a plurality of light transmissive regions arranged between a plurality of light emissive regions or subpixels. Since light emissive regions generally include layers, coating, and/or components which attenuate or inhibit transmission of external light through such regions, the light transmissive regions are generally provided in non-emissive regions of the display panel where the presence of such layers, coating, and/or components, which attenuate or inhibit transmission of external light, may be omitted therefrom.

One method for doing so, in some non-limiting application, involves the interposition of a fine metal mask (FMM) during deposition of a deposited material, including as an electrode and/or a conductive element electrically coupled therewith and/or an EM radiation-modifying layer. However, such deposited material typically has relatively high evaporation temperatures, which impacts the ability to re-use the FMM and/or the accuracy of the pattern that may be achieved, with attendant increases in cost, effort, and complexity.

One method for doing so, in some non-limiting examples, involves depositing the electrode material and thereafter removing, including by a laser drilling process, unwanted regions thereof to form the pattern. However, the removal process often involves the creation and/or presence of debris, which may affect the yield of the manufacturing process.

Further, such methods may not be suitable for use in some applications and/or with some devices with certain topographical features.

In some non-limiting applications, there may be an aim to increase the transmission of photons, and/or to reduce absorption of photons, to provide an improved mechanism for along an optical path through at least a portion of the device in at least a wavelength sub-range of the electromagnetic (EM) spectrum, including, without limitation, by providing selective deposition of a deposited material.

In some non-limiting applications, there may be an aim to provide a mechanism for depositing a thin disperse layer of metal NPs in an opto-electronic device, which may impact the performance of the device in terms of optical properties, performance, stability, reliability, and/or lifetime.

BRIEF DESCRIPTION OF THE DRAWINGS

Examples of the present disclosure will now be described by reference to the following figures, in which identical reference numerals in different figures indicate identical and/or in some non-limiting examples, analogous and/or corresponding elements and in which.

Figure 1:
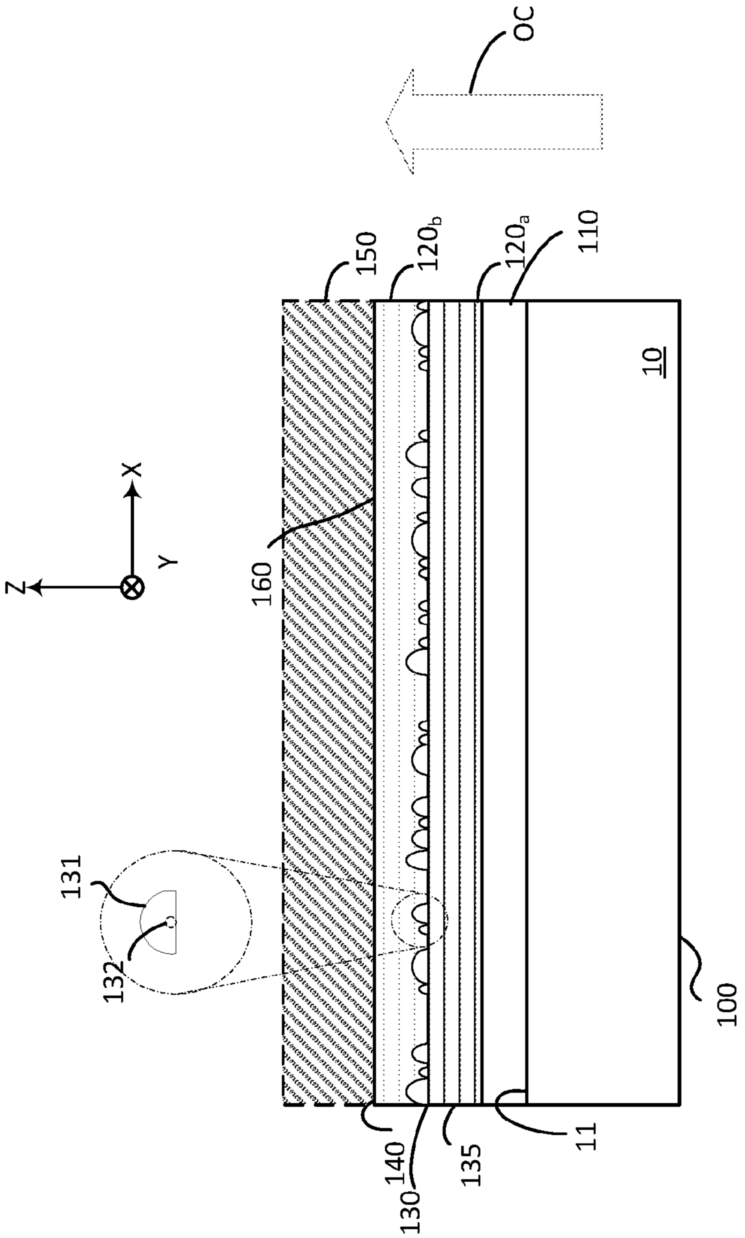
FIG. 1 is a simplified block diagram from a cross-sectional aspect, of an example device having a plurality of layers in a lateral aspect having at least one low(er)-index layer with a layer of at least one particle structure disposed therewithin and a high-index medium disposed thereover, according to an example.

In the present disclosure, a reference numeral having at least one numeric value (including without limitation, in subscript) and/or lower-case alphabetic character(s) (including without limitation, in lower-case) appended thereto, may be considered to refer to a particular instance, and/or subset thereof, of the element or feature described by the reference numeral. Reference to the reference numeral without reference to the appended value(s) and/or character(s) may, as the context dictates, refer generally to the element(s) or feature(s) described by the reference numeral, and/or to the set of all instances described thereby. Similarly, a reference numeral may have the letter "x' in the place of a numeric digit. Reference to such reference numeral may, as the context dictates, refer generally to the element(s) or feature(s) described by the reference numeral, where the character "x" is replaced by a numeric digit, and/or to the set of all instances described thereby.

In the present disclosure, for purposes of explanation and not limitation, specific details are set forth to provide a thorough understanding of the present disclosure, including, without limitation, particular architectures, interfaces and/or techniques. In some instances, detailed descriptions of well-known systems, technologies, components, devices, circuits, methods, and applications are omitted to not obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, to not obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses a semiconductor device having a plurality of layers deposited on a substrate and extending in at least one lateral aspect defined by a lateral axis. The device comprises at least one low(er)-index coating disposed on a first layer surface and at least one EM radiation-modifying layer embedded within the at least one low(er)-index coatings and comprising at least one particle structure comprising a deposited material. Embedding the at least one particle structure of the at least one EM radiation-modifying layer within the at least one low(er)-index coating modifies the absorption spectrum of the at least one EM radiation-modifying layer for EM radiation passing at least partially therethrough at a non-zero angle relative to the lateral aspect therein in at least a part of the EM spectrum.

According to a broad aspect, there is disclosed a semiconductor device having a plurality of layers deposited on a substrate and extending in at least one lateral aspect defined by a lateral axis thereof, comprising: at least one low(er)-index coating disposed on a first layer surface; at least one electromagnetic (EM) radiation-modifying layer embedded within the at least one low(er)-index coating and comprising at least one particle structure comprising a deposited material; wherein embedding the at least one particle structure of the at least one EM radiation-modifying layer within the at least one low(er)-index coating modifies an absorption spectrum of the at least one EM radiation-modifying layer for EM radiation passing at least partially therethrough at a non-zero angle relative to the lateral aspect therein in at least a part of the EM spectrum.

In some non-limiting examples, the at least one low(er)-index coating may comprise a lower part disposed between the first layer surface and the at least one EM radiation-modifying layer and an upper part disposed on the at least one EM radiation-modifying layer. In some non-limiting examples, the lower part may comprise a first low(er)-index coating and the upper part may comprise a second low(er)-index coating.

In some non-limiting examples, the device may comprise a higher-index medium disposed at an index interface with an exposed layer surface of the plurality of low(er)-index coatings, such that the EM radiation-modifying layer is disposed between the index interface and the first layer surface. In some non-limiting examples, the higher-index medium may comprise an organic compound. In some non-limiting examples, the higher-index medium may comprise a capping layer of the device. In some non-limiting examples, the device may comprise an air gap disposed beyond the higher-index medium. In some non-limiting examples, the higher-index medium may comprise a higher-index layer deposited on the index interface. In some non-limiting examples, the higher-index medium may be substantially transparent. In some non-limiting examples, the higher-index medium may comprise lithium fluoride (LiF).

In some non-limiting examples, an extinction coefficient of the higher-index medium may be at least one of no more than about: 0.1, 0.08, 0.05, 0.03, and 0.01 in at least a sub-range of a visible range of the EM spectrum.

In some non-limiting examples, the EM radiation-modifying layer may comprise a discontinuous layer of the at least one particle cluster.

In some non-limiting examples, the first low(er)-index coating may be comprised of a first low-index material and the second low(er)-index coating may be comprised of a second low-index material. In some non-limiting examples, the first low-index material and the second low-index material may be the same. In some non-limiting examples, at least one of: at least one of: the first low(er)-index coating and the first low-index material, and at least one of: the second low(er)-index coating and the second low-index material, may have a refractive index that is at least one of no more than about: 1.7, 1.6, 1.5, 1.45, 1.4, 1.35, 1.3, and 1.25. In some non-limiting examples, at least one of: at least one of: the first low(er)-index coating and the first low-index material, and at least one of: the second low(er)-index coating and the second low-index material, may have a refractive index that is at least one of between about: 1.2-1.6, 1.2-1.5, 1.25-1.45, and 1.25-1.4. In some non-limiting examples, at least one of: at least one of: the first low(er)-index coating and the first low-index material, and at least one of: the second low(er)-index coating and the second low-index material, has an extinction coefficient that is at least one of no more than about: 0.1, 0.08, 0.05, 0.03, and 0.01 in a visible wavelength range of the EM spectrum.

In some non-limiting examples, at least one of the plurality of low(er)-index coatings may be substantially transparent. In some non-limiting examples, an average layer thickness of at least one of the plurality of low(er)-index coatings may be at least one of no more than about: 60 nm, 50 nm, 40 nm, 30 nm, 20 nm, 10 nm, 8 nm, and 5 nm.

In some non-limiting examples, the absorption capability may be at least one of: increasing absorption in, decreasing absorption in, shifting up a wavelength range of, shifting down a wavelength range of, an absorption spectrum of EM radiation passing through the device, and any combination of any of these.

In some non-limiting examples, the part of the EM spectrum may correspond to at least one of: a visible range, an infrared (IR) range, a near-infrared (NIR) range, an ultraviolet (UV) range, a UV-A range, a UV-B range, a sub-range of any of these, and any combination of any of these, of the EM spectrum.

In some non-limiting examples, the deposited material may be a metal. In some non-limiting examples, the deposited material may comprise at least one of magnesium, silver, and ytterbium. In some non-limiting examples, the deposited material may be co-deposited with a co-deposited dielectric material.

In some non-limiting examples, the at least one particle structure may have a characteristic feature selected from at least one of: a size, size distribution, shape, surface coverage, configuration, deposited density, and composition. In some non-limiting examples, the at least one particle structure may have a percentage coverage of at least one of between about: 10-50%, 10-45%, 12-40%, 15-40%, 15-35%, 18-35%, 20-35%, and 20-30%. In some non-limiting examples, a majority of the at least one particle structures may have a maximum feature size of no more than at least one of about: 40 nm, 35 nm, 30 nm, 25 nm, and 20 nm. In some non-limiting examples, the at least one particle structure may have a feature size that is at least one of a mean and a median that is at least one of between about: 5-40 nm, 5-30 nm, 8-30 nm, 10-30 nm, 8-25 nm, 10-25 nm, 8-20 nm, 10-20 nm, 10-15 nm, and 8-15 nm.

In some non-limiting examples, the at least one particle structure may comprise a seed about which the deposited material tends to coalesce.

In some non-limiting examples, the device may further comprise a patterning coating disposed on a second layer surface, wherein: the first layer surface is an exposed layer surface of the patterning coating; an initial sticking probability against deposition of the deposited material on a surface of the patterning coating is substantially less than at least one of: 0.3 and the initial sticking probability against deposition of the deposited material on the second layer surface, such that the patterning coating is substantially devoid of a closed coating of the deposited material. In some non-limiting examples, the patterning coating may comprise at least one patterning material. In some non-limiting examples, the patterning coating may comprise a first patterning material having an initial sticking probability against deposition of the deposited material and a second patterning material having a second initial sticking probability against deposition of the deposited material, wherein the first initial sticking probability is substantially less than the second initial sticking probability. In some non-limiting examples, the first patterning material may be a nucleation inhibiting coating (NIC) material and the second patterning material may be selected from at least one of an electron transport layer (ETL) material, Liq, and lithium fluoride (LiF).

In some non-limiting examples, the layers may extend in a first portion and a second portion of the at least one lateral aspect, the at least one EM radiation-modifying layer may extend across the first portion, the device adapted to pass at least one EM signal through the first portion, at a non-zero angle relative to the layers.

In some non-limiting examples, the at least one EM signal may have a wavelength range in at least a part of at least one of the IR spectrum and the NIR spectrum.

In some non-limiting examples, the first portion may be substantially devoid of a closed coating of the deposited material. In some non-limiting examples, the first portion may correspond to at least part of a signal transmissive region.

In some non-limiting examples, the device may be adapted to accept the at least one EM signal therethrough, for exchange with at least one under-display component. In some non-limiting examples, the at least one under-display component may comprise at least one of: a receiver adapted to receive; and a transmitter adapted to emit, the at least one EM signal passing through the device. In some non-limiting examples, the receiver may be an IR detector and the transmitter may be an IR emitter. In some non-limiting examples, the transmitter may emit a first EM signal and the receiver may detect a second EM signal that is a reflection of the first EM signal. In some non-limiting examples, the exchange of the first and second EM signals may provide biometric authentication of a user. In some non-limiting examples, the device may form a display panel of a user device enclosing the under-display component therewith.

In some non-limiting examples, the second portion may comprise at least one emissive region for emitting the at least one EM signal at a non-zero angle relative to the layers.

In some non-limiting examples, the device may further comprise at least one semiconducting layer disposed on a layer thereof, wherein: each emissive region comprises a first electrode and a second electrode, the first electrode is disposed between the substrate and the at least one semiconducting layer, and the at least one semiconducting layer is disposed between the first electrode and the second electrode.

In some non-limiting examples, the device may further comprise at least one closed coating of the deposited material disposed on an exposed layer surface thereof in the second portion. In some non-limiting examples, the second electrode may comprise the at least one closed coating of the deposited material.

DESCRIPTION

Layered Device

The present disclosure relates generally to layered semiconductor devices, and more specifically, to opto-electronic devices. An opto-electronic device may generally encompass any device that converts electrical signals into photons and vice versa. In some non-limiting examples, the layered semiconductor device, including without limitation, the opto-electronic device, may serve as a face, including without limitation, a display panel, of a user device.

Those having ordinary skill in the relevant art will appreciate that, while the present disclosure is directed to opto-electronic devices, the principles thereof may be applicable to any panel having a plurality of layers, including without limitation, at least one layer of conductive deposited material 1631 (FIG. 16), including as a thin film, and in some non-limiting examples, through which electromagnetic (EM) signals may pass, entirely or partially, at a non-zero angle relative to a plane of at least one of the layers.

Turning now to FIG. 1, there may be shown a cross-sectional view of an example layered device 100. In some non-limiting examples, as shown in greater detail in FIG. 19, the device 100 may comprise a plurality of layers deposited upon a substrate 10.

A lateral axis, identified as the X-axis, may be shown, together with a longitudinal axis, identified as the Z-axis. A second lateral axis, identified as the Y-axis, may be shown as being substantially transverse to both the X-axis and the Z-axis. At least one of the lateral axes may define a lateral aspect of the device 100. The longitudinal axis may define a transverse aspect of the device 100.

The layers of the device 100 may extend in the lateral aspect substantially parallel to a plane defined by the lateral axes. Those having ordinary skill in the relevant art will appreciate that the substantially planar representation shown in FIG. 1 may be, in some non-limiting examples, an abstraction for purposes of illustration. In some non-limiting examples, there may be, across a lateral extent of the device 100, localized substantially planar strata of different thicknesses and dimension, including, in some non-limiting examples, the substantially complete absence of a layer, and/or layer(s) separated by non-planar transition regions (including lateral gaps and even discontinuities).

Thus, while for illustrative purposes, the device 100 may be shown in its cross-sectional aspect as a substantially stratified structure of substantially parallel planar layers, such device may illustrate locally, a diverse topography to define features, each of which may substantially exhibit the stratified profile discussed in the cross-sectional aspect.

Low(er)-Index Layers

Turning again to FIG. 1, in some non-limiting examples, respective ones of at least one low(er)-index layer 120 may be disposed, as part of a layered semiconductor device 100, on an exposed layer surface 11 of an underlying layer 110, in some non-limiting examples, across at least a part of the lateral aspect thereof. In some non-limiting examples, a first low(er)-index layer $\mathbf{120}_a$ may be disposed on the exposed layer surface 11 of the underlying layer 110 and a second low(er)-index layer $\mathbf{120}_b$ may be disposed on the exposed layer surface of the first low(er)-index layer $\mathbf{120}_a$.

In some non-limiting examples, the at least one low(er)-index layer(s) 120 may comprise a medium that has a low refractive index (low-index material).

In some non-limiting examples, a first low-index material for forming a first one of the low(er)-index layer(s) 120 may be the same or different from a second low-index material for forming a second one of the low(er)-index layer(s) 120.

In some non-limiting examples, at least one of the low (er)-index layer(s) 120, and/or the low-index material, in some non-limiting examples, when deposited as a film, and/or coating in a form, and under similar circumstances to the deposition of the at least one low(er)-index layer(s) 120 within the device 100, may exhibit a first refractive index.

In some non-limiting examples, a first low-index material for forming a first one of the low(er)-index layer(s) 120 may have a first refractive index that may be the same or different from a first refractive index of a second low-index material for forming a second one of the low(er)-index layer(s) 120.

In some non-limiting examples, the first refractive index may be determined and/or measured at a first wavelength range and/or at least one first wavelength thereof (first wavelength (range)). In some non-limiting examples, such first wavelength range may be at least one of between about: 315-400 nm, 450-460 nm, 510-540 nm, 600-640 nm, 456-

624 nm, 425-725 nm, 350-450 nm, 300-450 nm, 300-550 nm, 300-700 nm, 380-740 nm, 750-900 nm, 380-900 nm, or 300-900 nm.

In some non-limiting examples, a first maximum refractive index may correspond to a maximum value of the first refractive index measured within such first wavelength (range).

In some non-limiting examples, the first refractive index may vary by no more than at least one of about: 0.4, 0.3, 0.2, or 0.1 across such first wavelength (range).

In some non-limiting examples, the first refractive index may be no more than at least one of about: 1.7, 1.6, 1.5, 1.45, 1.4, 1.35, 1.3, or 1.25 at such first wavelength (range).

In some non-limiting examples, the first refractive index may be at least one of between about: 1.2-1.6, 1.2-1.5, 1.25-1.45, or 1.25-1.4 at such first wavelength (range).

In some non-limiting examples, at least one of the low(er)-index layer(s) 120, and/or the low-index material, in some non-limiting examples, when deposited as a film, and/or coating in a form, and under similar circumstances to the deposition of the at least one low(er)-index layer(s) 120 within the device 100, may exhibit a first extinction coefficient of no more than at least one of about: 0.1, 0.08, 0.05, 0.03, or 0.01 at such first wavelength (range).

In some non-limiting examples, the at least one low(er)-index layer(s) 120, and/or the low-index material, in some non-limiting examples, when deposited as a film, and/or coating in a form, and under similar circumstances to the deposition of the at least one low(er)-index layer(s) 120 within the device 100, may be substantially transparent.

Although not shown, in some non-limiting examples, the at least one low(er)-index layer(s) 120, and/or the low-index material, in some non-limiting examples, when deposited as a film, and/or coating in a form, and under similar circumstances to the deposition of the at least one low(er)-index layer(s) 120 within the device 100, may comprise a substantially porous coating and/or medium that has at least one void formed therewithin. Without wishing to be bound by any particular theory, it may be postulated that the presence of such pores and/or voids may contribute to a reduction in the first refractive index of the at least one low(er)-index layer(s) 120 relative to a layer comprised of a similar medium, but which is substantially devoid of such pores and/or voids. In some non-limiting examples, such substantially porous layer and/or medium may be considered to be at least one of: a microporous layer and/or medium that may contain, by way of non-limiting example, at least one pore and/or void having a diameter that is no more than about 2 nm, a mesoporous layer and/or medium that may contain, by way of non-limiting example, at least one pore and/or void having a diameter of between about 2-50 nm, and a macroporous layer and/or medium that may contain, by way of non-limiting example, at least one pore and/or void having a diameter that is at least about 50 nm.

In some non-limiting examples, the low-index material may comprise, and/or be formed by, at least one of an organic compound and an organic-inorganic hybrid material.

In some non-limiting examples, an average layer thickness of the at least one low(er)-index layer(s) 120 may be no more than at least one of about: 60 nm, 50 nm, 40 nm, 30 nm, 20 nm, 10 nm, 8 nm, or 5 nm.

Without wishing to be bound by any particular theory, it may be postulated that reducing an average layer thickness of the at least one low(er)-index layer(s) 120, including without limitation, to at least one of between about: 5-nm, or 5-15 nm, may, in some non-limiting examples, result in an increased fraction of extraction of EM radiation, including without limitation, through a reduction in absorption, and/or an increase in transmittance, while mitigating a likelihood of adversely affecting performance of the device 100 and/or a process of manufacturing same, because of the presence, in the device 100, of such low(er)-index layer 120.

Without wishing to be bound by any particular theory, it has now been found, somewhat surprisingly, that materials exhibiting relatively low surface tension, in particular those containing, and/or formed by, an organic material, may, in some non-limiting examples, exhibit a relatively low refractive index. This may be seen in Table 1 below, which sets out a surface tension and a refractive index obtained for various example materials:

TABLE 1

| Material | Surface Tension (dynes/cm) | Refractive Index |
|---|---|---|
| Tetradecafluorohexane | 12.23 | 1.252 |
| Perfluoro(methylcyclohexane) | 15.1 | 1.285 |
| Hexane | 18 | 1.375 |
| Octamethylcyclotetrasiloxane | 18.2 | 1.396 |
| Perfluorodecalin | 19.41 | 1.31 |
| Heptane | 19.5 | 1.3855 |
| Octane | 21 | 1.3951 |
| Nonane | 21.7 | 1.405 |
| Ethanol | 22.39 | 1.361 |
| Decane | 23.2 | 1.411 |
| Undecane | 23.5 | 1.417 |
| Dodecane | 24.2 | 1.421 |
| Tetradecane | 25.1 | 1.429 |
| Acetone | 25.2 | 1.36 |
| Hexadecane | 26 | 1.434 |
| Benzene | 28.88 | 1.501 |
| O-Xylene | 29.3 | 1.505 |
| Carbon Disulfide | 35.3 | 1.628 |
| Methyl salicylate | 38.71 | 1.536 |
| Lepidine | 43.2 | 1.62 |
| 1-Bromonaphthalene | 43.7 | 1.657 |
| Diiodomethane | 50.8 | 1.741 |
| Formamide | 58.3 | 1.449 |
| Glycerol | 63 | 1.4729 |
| Water | 72.8 | 1.333 |

Figure 2:
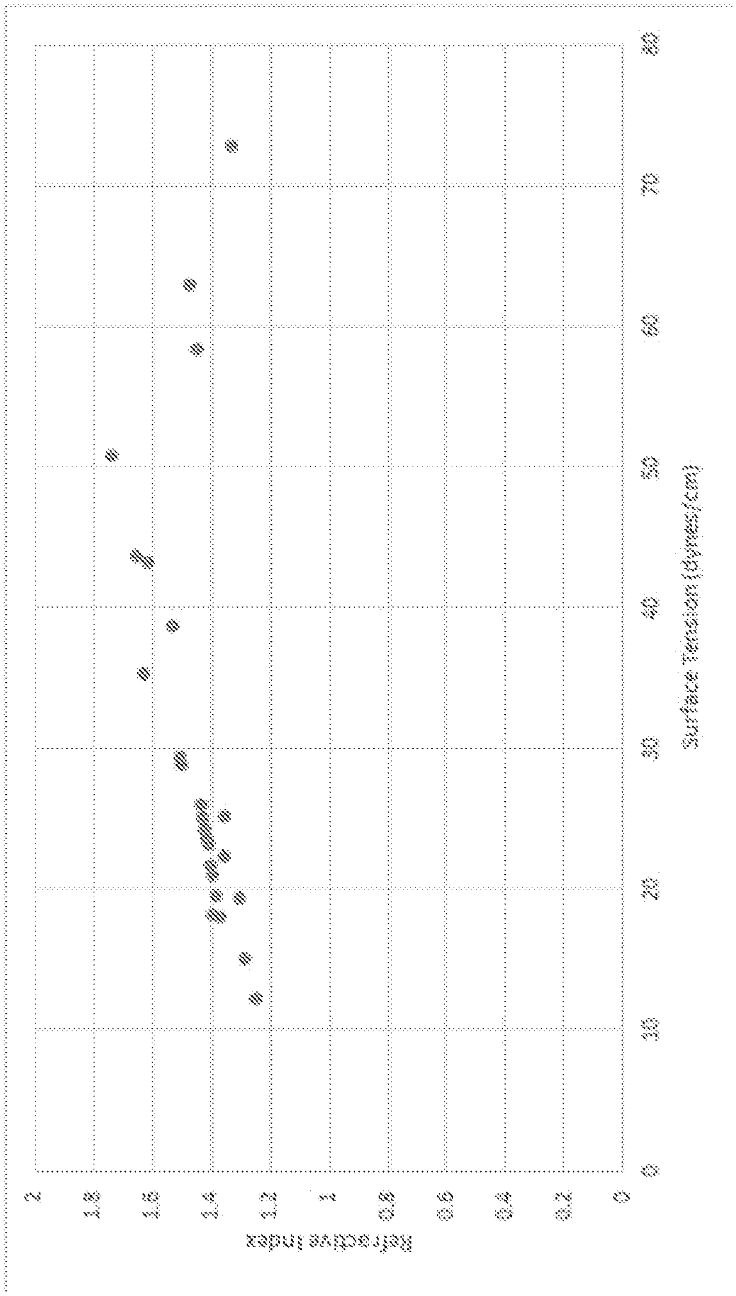
FIG. 2 is a graph plotting refractive index values as a function of surface energy for a variety of example materials according to an example.

FIG. 2 is a plot of the refractive index as a function of surface tension for the example materials set out in Table 1 above.

Based on the foregoing, it may be postulated that materials that exhibit relatively low surface energy may be suitable to act as a low-index material. In some non-limiting examples, the at least one low(er)-index layer(s) 120 may comprise a low-index material exhibiting a surface energy that is no more than about 25 dynes/cm and a first refractive index that may be no more than about 1.45.

In some non-limiting examples, the at least one low(er)-index layer(s) 120 may comprise a low-index material exhibiting a surface energy that is no more than about 20 dynes/cm and a first refractive index of no more than about 1.4.

The exposed layer surface 11 of an uppermost (last deposited) one of the at least one low(er)-index layer(s) 120 may define an index interface 140. A higher-index medium may be disposed on the index interface 140, that is, on the exposed layer surface 11 of the uppermost one of the at least one low(er)-index layer(s) 120. In some non-limiting examples, the higher-index medium may comprise a physical higher-index layer 150, which may be, in some non-limiting example, a CPL, TFE layer or other encapsulation layer 2650 (FIG. 26B), polarizing layer or other physical layer and/or coating that may be deposited upon the device 100 as part of a manufacturing process.

In some non-limiting examples, such higher-index layer 150 may comprise lithium fluoride (LiF).

Although not shown, in some non-limiting examples, the exposed layer surface 11 of the uppermost low(er)-index layer 120 may be provided at the index interface 140, with an air gap, whether during, or subsequent to, manufacture, and/or in operation.

In some non-limiting examples, the exposed layer surface 11 of the higher-index layer 150 may be disposed adjacent to an air gap. By way of non-limiting example, the high-index layer 150 may be disposed between the air gap and the uppermost low(er)-index layer 120.

Accordingly, in view of the foregoing, in some non-limiting examples, versions of the device 100 may be shown with only those layers of interest anterior to the index interface 140, with the understanding that, in some non-limiting examples, such index interface 140 may define an interface of the device 100 with a further medium, whether in the form of a physical higher-index layer 150, an air gap, and/or an air interface.

In some non-limiting examples, the higher-index layer 150, if present, may comprise a material that has a high refractive index (high-index material). Those having ordinary skill in the relevant art will appreciate that a CPL may typically exhibit a relatively high refractive index of at least one of at least about: 1.7, 1.8, or 1.9, in order to promote outcoupling of EM radiation emitted by and/or transmitted at least partially through the device 100.

In some non-limiting examples, the higher-index layer 150, if present, and/or the high-index material, in some non-limiting examples, when deposited as a film, and/or coating in a form, and under similar circumstances to the deposition of the higher-index layer 150 within the device 100, may exhibit a second refractive index.

In some non-limiting examples, the second refractive index may be determined and/or measured at a second wavelength range and/or at least one second wavelength thereof (second wavelength (range)).

In some non-limiting examples, such second wavelength range may be at least one of between about: 315-400 nm, 450-460 nm, 510-540 nm, 600-640 nm, 456-624 nm, 425-725 nm, 350-450 nm, 300-450 nm, 300-550 nm, 300-700 nm, 380-740 nm, 750-900 nm, 380-900 nm, or 300-900 nm.

In some non-limiting examples, a second maximum refractive index may correspond to a maximum value of the second refractive index measured within such second wavelength (range).

In some non-limiting examples, the second maximum refractive index may correspond to a wavelength within the second wavelength range that is different from a wavelength within the first wavelength range to which the first maximum refractive index may correspond.

In some non-limiting examples, the second refractive index may be at least one of at least about: 1.7, 1.8, or 1.9.

The second refractive index in the second wavelength (range) exceeds the first refractive index in the first wavelength (range).

In the present disclosure, the medium of which the at least one low(er)-index layer(s) 120 may be formed may be considered a low-index material provided that it has a first refractive index that is exceeded by the second refractive index of the high-index material, even if the first refractive index of the medium of which the at least one low(er)-index layer(s) 120 may be formed may not necessarily be considered to be low in comparison with the refractive index of other material(s) that may be employed in a typical opto-electronic device.

In some non-limiting examples, the second wavelength (range) may be the same and/or different from the first wavelength (range).

In some non-limiting examples, the second refractive index in the second wavelength (range) may exceed the first refractive index in the first wavelength (range) by at least one of at least about: 0.3, 0.4, 0.5, 0.7, 1.0, 1.2, 1.3, 1.4, or 1.5.

In some non-limiting examples, the second maximum refractive index may exceed the first maximum refractive index by at least one of at least about: 0.5, 0.7, 1.0, 1.2, 1.3, 1.4, 1.5, or 1.7.

In some non-limiting examples, the higher-index layer 150, and/or the high-index material, in some non-limiting examples, when deposited as a film, and/or coating in a form, and under similar circumstances to the deposition of the higher-index layer 150 within the device 100, may exhibit a second extinction coefficient of no more than at least one of about: 0.1, 0.08, 0.05, 0.03, or 0.01 at such second wavelength (range).

In some non-limiting examples, the higher-index layer 150, and/or the high-index material, in some non-limiting examples, when deposited as a film, and/or coating in a form, and under similar circumstances to the deposition of the higher-index layer 150 within the device 100, may be substantially transparent.

In some non-limiting examples, the high-index material may comprise, and/or be formed by, an organic compound.

In some non-limiting examples, the device 100 may be configured to substantially permit EM radiation to engage a surface of the device 100 along an optical path in at least a first direction indicated by the arrow OC at a non-zero angle to a plane of the underlying layer defined by a plurality of the lateral axes. The optical path may correspond to a (first) direction that may be at least one of: a direction from which EM radiation, emitted by the device 100, may be extracted therefrom (such as is shown by the orientation of the arrow OC in the figure), and a direction at which EM radiation may be incident on an exposed layer surface 11 of the device 100, and propagated at least partially therethrough, including without limitation, where the EM radiation may be incident on an exposed layer surface 11 of the substrate 10, opposite to that on which the various layers and/or coatings have been deposited, and transmitted at least partially through the substrate 10 and the various layers and/or coatings (not shown).

Those having ordinary skill in the relevant art will appreciate that there may be a scenario where EM radiation is both emitted by the device 100 and concomitantly, EM radiation is incident on an exposed layer surface 11 of the device 100 and transmitted at least partially therethrough. In such scenario, the direction of the optical path will, unless the context indicates to the contrary, be determined by the direction from which the EM radiation emitted by the device 100 may be extracted. In some non-limiting examples, the EM radiation transmitted entirely through the device 100 may be propagated in the same or a similar direction. Nevertheless, nothing in the present disclosure should be interpreted as limiting the propagation of EM radiation entirely through the device 100 to a direction that is the same or similar to the direction of propagation of EM radiation emitted by the device 100.

In the present disclosure, the propagation of EM radiation temporally in a given direction, including without limitation, as indicated by the arrow OC, may give rise to a directional convention, in which the at least one low(er)-index layer(s) 120 may be said to be "anterior" to, "ahead of", and/or "before" the higher-index layer 150 (if present) in the (first direction of propagation of the EM radiation in the) optical path.

In some non-limiting examples, the device 100 may be a top-emission opto-electronic device in which EM radiation (including without limitation, in the form of light and/or photons) may be emitted by the device 100 in at least the first direction.

Although not shown, in some non-limiting examples, the device 100 may comprise at least one light-transmissive region in which EM radiation incident on an exposed layer surface 11 of the substrate 10, on which the various layers and/or coatings have been deposited, may be transmitted through the substrate 10 and the various layers and/or coatings in at least the first direction, which would be, in such scenario, opposite to the direction shown by the arrow OC in the figure.

Those having ordinary skill in the relevant art will appreciate that the use of a CPL by itself to promote outcoupling of light emitted by an opto-electronic device so as to enhance its external quantum efficiency (EQE) may be well known.

Those having ordinary skill in the relevant art may reasonably expect that inclusion of at least one low(er)-index layer(s) 120 anterior to the higher-index medium in the optical path, may, in some non-limiting examples, create an index interface 140 between an uppermost one of such low(er)-index layer 120 and the higher-index medium, that might cause EM radiation to be reflected back therefrom toward the underlying layer 110, resulting in a reduced fraction of EM radiation that may be extracted from such a device 100.

However, it has now been found, somewhat surprisingly, that arranging the low(er)-index layer 120 having a first refractive index that may be lower than a second refractive index of the higher-index medium, to be anterior to such higher-index medium in the optical path, such that it lies between the underlying layer and the higher-index medium, may, in some non-limiting examples, exhibit enhanced outcoupling of EM radiation relative to an equivalent device that may lack such a low(er)-index layer 120 between the underlying layer 110 and the higher-index medium and thus, may increase a fraction of EM radiation that may be extracted from the device 100, at least in some non-limiting examples.

In some non-limiting examples, a (combined) average layer thickness of the at least one low(er)-index layer(s) 120 may be no more than an average layer thickness of the higher-index medium.

In some non-limiting examples, the underlying layer 110 may comprise a medium that has a high refractive index (high-index underlying material) such that the underlying layer 110 may comprise a higher-index underlying layer 110.

In some non-limiting examples, the higher-index underlying layer 110, and/or the high-index underlying material, in some non-limiting examples, when deposited as a film, and/or coating in a form, and under similar circumstances to the deposition of the higher-index underlying layer 110 within the device 100, may exhibit a third refractive index.

In some non-limiting examples, the third refractive index may be determined and/or measured at a third wavelength range and/or at least one third wavelength thereof (third wavelength (range)).

In some non-limiting examples, such third wavelength range may be at least one of between about: 315-400 nm, 450-460 nm, 510-540 nm, 600-640 nm, 456-624 nm, 425-725 nm, 350-450 nm, 300-450 nm, 300-550 nm, 300-700 nm, 380-740 nm, 750-900 nm, 380-900 nm, or 300-900 nm.

In some non-limiting examples, a third maximum refractive index may correspond to a maximum value of the third refractive index measured within such third wavelength (range).

In some non-limiting examples, the first maximum refractive index may correspond to a wavelength within the first wavelength range that is different from a wavelength within the third wavelength range to which the third maximum refractive index may correspond.

In some non-limiting examples, the third refractive index may be at least one of at least about: 1.7, 1.8, or 1.9.

In some non-limiting examples, the third refractive index in the third wavelength (range) may exceed the first refractive index in the first wavelength (range), such that in some non-limiting examples, the low(er)-index layer 120 may lie between two layers comprising a higher-index material, namely, the higher-index underlying layer 110 and the higher-index medium.

Figure 19:
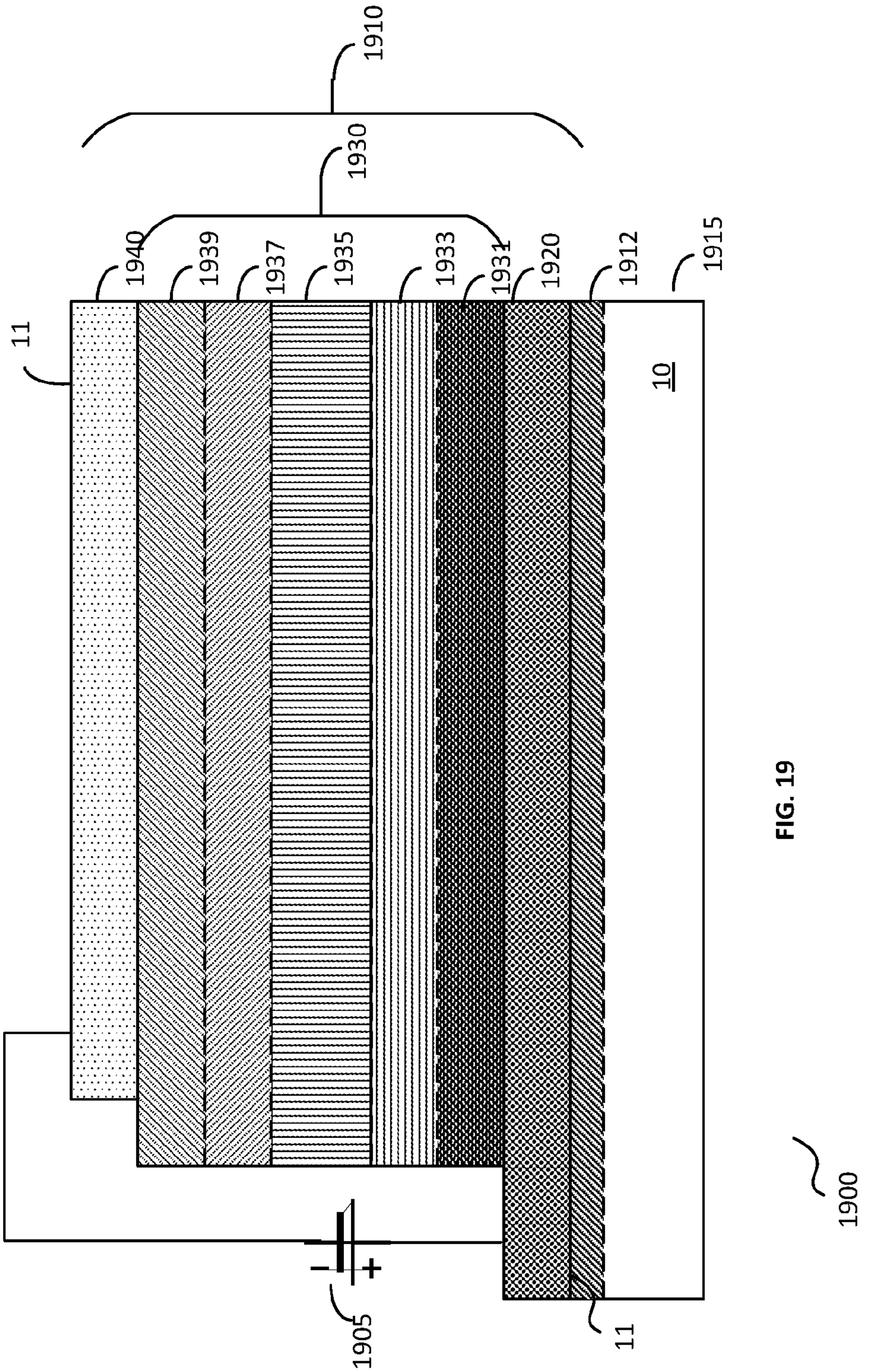
FIG. 19 is a block diagram from a cross-sectional aspect, of an example electro-luminescent device according to an example in the present disclosure.

By way of non-limiting example, the underlying layer 110 may comprise one of the at least one semiconducting layers 1930 (FIG. 19) of an organic stack of an opto-electronic device, including without limitation, an organic light-emitting diode (OLED). In some non-limiting examples, the underlying layer 110 may comprise one of the top-most semiconducting layers 1930, including without limitation, an electron transport layer (ETL) 1937 (FIG. 19), and/or an electron injection layer (EIL) 1939 (FIG. 19). Typically, ETL 1937 and/or EIL 1939 materials tend to have a relatively high refractive index.

Without wishing to be bound by any particular theory, it may be postulated that arranging a thin low(er)-index layer 120 comprising a low-index material having a first refractive index that is lower than a (second) refractive index of the higher-index layer 150 and/or a third refractive index of the underlying layer 110 may enhance transmission of EM radiation passing through the device 100, relative to devices in which no such low(er)-index layer 120 is present.

EM Radiation Modification

A nanoparticle (NP) is a particle structure 131 of matter whose predominant characteristic size is of nanometer (nm) scale, generally understood to be between about: 1-300 nm. At nm scale, NPs of a given material may possess unique properties (including without limitation, optical, chemical, physical, and/or electrical) relative to the same material in bulk form.

These properties may be exploited when a plurality of NPs is formed into a layer of a layered semiconductor device, including without limitation, an opto-electronic device, to improve its performance.

Current mechanisms for introducing such a layer of NPs into a device have some drawbacks.

First, typically, such NPs are formed into a close-packed layer, and/or dispersed into a matrix material, of such device. Consequently, the thickness of such an NP layer may be typically much thicker than the characteristic size of the NPs themselves. The thickness of such NP layer may impart undesirable characteristics in terms of device performance, device stability, device reliability, and/or device lifetime that may reduce or even obviate any perceived advantages provided by the unique properties of NPs.

Second, techniques to synthesize NPs, in and for use in such devices may introduce large amounts of carbon (C), oxygen (O), and/or sulfur (S) through various mechanisms.

By way of non-limiting example, wet chemical methods may be typically used to introduce NPs that have a precisely controlled characteristic size, size distribution, shape, surface coverage, configuration, and/or deposited density into a device. However, such methods typically employ an organic capping group (such as the synthesis of citrate-capped silver (Ag) NPs) to stabilize the NPs, but such organic capping groups introduce C, O, and/or S, into the synthesized NPs.

Still further, an NP layer deposited from solution may typically comprise C, O, and/or S, because of the solvents used in deposition.

Additionally, these elements may be introduced as contaminants during the wet chemical process and/or the deposition of the NP layer.

However introduced, the presence of a high amount of C, O, and/or S, in the NP layer of such a device, may erode the performance, stability, reliability, and/or lifetime of such device.

Third, when depositing an NP layer from solution, as the employed solvents dry, the NP layer tends to have non-uniform properties across the NP layer, and/or between different patterned regions of such layer. In some non-limiting examples, an edge of a given NP layer may be considerably thicker or thinner than an internal region of such NP layer, which disparities may adversely impact the device performance, stability, reliability, and/or lifetime.

Fourth, while there are other methods and/or processes, beyond wet chemical synthesis and solution deposition processes, of synthesizing and/or depositing NPs, including without limitation, a vacuum-based process such as, without limitation, PVD, existing methods tend to provide poor control of the characteristic size, size distribution, shape, surface coverage, configuration, deposited density, and/or dispersity of the NPs deposited thereby. By way of non-limiting example, in a conventional PVD process, the NPs tend to form a close-packed film as their size increases. As a result, methods such as conventional PVD methods are generally not well-suited to form an NP layer of large disperse NPs with low surface coverage. Rather, the poor control of characteristic size, size distribution, shape, surface coverage, configuration, and/or deposited density, imparted by such conventional methods may result in poor device performance, stability, reliability, and/or lifetime.

EM radiation-modifying coatings take advantage of plasmonics, a branch of nanophotonics, which studies the resonant interaction of EM radiation with metals. Those having ordinary skill in the relevant art will appreciate that metal NPs may exhibit LSP excitations and/or coherent oscillations of free electrons, whose optical response may be tailored by varying a characteristic size, size distribution, shape, surface coverage, configuration, deposited density, and/or composition of the nanostructures. Such optical response, in respect of EM radiation-modifying coatings, may include absorption of EM radiation incident thereon, thereby reducing reflection thereof and/or shifting to a lower or higher wavelength ((sub-) range) of the EM spectrum, including without limitation, the visible spectrum, and/or a sub-range thereof.

It has also been reported that arranging certain metal NPs near a medium having relatively low refractive index, may shift the absorption spectrum of such NPs to a lower wavelength (sub-) range (blue-shifted).

Accordingly, it may be further postulated that disposing particle material 135, in some non-limiting examples, as a discontinuous layer 160 of at least one particle structure 131 on an exposed layer surface 11 of an underlying one of the at least one low(er)-index coating 120, such that the at least one particle structure 131 is in physical contact with the underlying at least one low(er)-index coating 120, may, in some non-limiting examples, favorably shift the absorption spectrum of the particle material 135, including without limitation, blue-shift, such that it does not substantially overlap with a wavelength range of the EM spectrum of EM radiation being emitted by and/or transmitted at least partially through the device 100.

In some non-limiting examples, a peak absorption wavelength of the at least one particle structure 131 may be less than a peak wavelength of the EM radiation being emitted by and/or transmitted at least partially through the device 100. By way of non-limiting example, the particle material 135 may exhibit a peak absorption at a wavelength (range) that is at least one of no more than about: 470 nm, 460 nm, 455 nm, 450 nm, 445 nm, 440 nm, 430 nm, 420 nm, or 400 nm.

It has now been found, somewhat surprisingly, that providing particle material 135, including without limitation, in the form of at least one particle structure 131, including without limitation, those comprised of a metal, within and/or proximate to the at least one low(er)-index coating 120, may further impact the absorption and/or transmittance of EM radiation passing through the device 100, including without limitation, in the first direction, in at least a wavelength (sub-) range of the EM spectrum, including without limitation, the visible spectrum, and/or a sub-range thereof, passing in the first direction from and/or through the at least one low(er)-index layer(s) 120, the at least one particle structure(s) 131, and across the index interface 140.

In some non-limiting examples, absorption may be reduced, and/or transmittance may be facilitated, in at least a wavelength (sub-) range of the EM spectrum, including without limitation, the visible spectrum, and/or a sub-range thereof.

In some non-limiting examples, the absorption may be concentrated in an absorption spectrum that is a wavelength (sub-) range of the EM spectrum, including without limitation, the visible spectrum, and/or a sub-range thereof.

In some non-limiting examples, the absorption spectrum may be blue-shifted and/or shifted to a higher wavelength (sub-) range (red-shifted), including without limitation, to a wavelength (sub-) range of the EM spectrum, including without limitation, the visible spectrum, and/or a sub-range thereof, and/or to a wavelength (sub-) range of the EM spectrum that lies, at least in part, beyond the visible spectrum.

Thus, as shown in FIG. 1, in some non-limiting examples, the layered semiconductor device 100 may have as a layer thereof, an EM radiation-modifying (NP) layer 130 disposed on and/or over the exposed layer surface 11 of one of the at least one low(er)-index layer(s) 120 other than an uppermost low(er)-index layer 120 thereof, for at least one of: absorbing EM radiation incident thereon, or concomitantly, for reducing reflection of EM radiation incident on the device 100, modifying the spectrum of EM radiation emitted by the device 100, and modifying the spectrum of EM radiation transmitted through the device 100.

In some non-limiting examples, the EM radiation-modifying layer 130 may be substantially parallel to the index interface 140 and lie between the first (lowermost or first deposited) one of the at least one low(er)-index layer(s) $\mathbf{120}_a$ and the index interface 140. In some non-limiting examples, the EM radiation-modifying layer 130 may correspond to an exposed layer surface 11 of an underlying (earlier deposited) one of the at least one low(er)-index layer(s) 120 at an interface between two of the at least one low(er)-index layer(s) 120.

In some non-limiting examples, the EM radiation-modifying layer 130 may correspond to the exposed layer surface 11 of the lowermost one of the at least one low(er)-index layer(s) 120$_a$ and may thus be spaced apart from the exposed layer surface 11 of the underlying layer 110. In some non-limiting examples, a second one of the at least one low(er)-index layer(s) 120$_b$ may be thereafter deposited over and thereby cover at least one particle structure 131 of which the EM radiation-modifying layer 130 may be comprised, such that the first low(er)-index layer 120$_a$ and the second low(er)-index layer 120$_b$ surround the EM radiation-modifying layer 130 and the at least one particle structure(s) 131 thereof, and the EM radiation-modifying layer 130 lies within the at least one low(er)-index layer(s) 120 and is thus spaced apart from the exposed layer surface 11 of the uppermost one of the at least one low(er)-index layer(s) 120, in other words, the index layer 150.

Those having ordinary skill in the relevant art will appreciate that in some non-limiting examples, a plurality of EM radiation-modifying layers 120 may be disposed on one another, whether or not separated by additional layers, with varying lateral aspects and having different absorption spectra. In this fashion, the absorption of certain regions of the device may be tuned according to one or more desired absorption spectra.

A series of samples was fabricated to evaluate the suitability of an EM radiation-modifying layer 130 interposed between a first low(er)-index layer 120$_a$ and a second low(er)-index layer 120$_b$.

In each sample, a first low-index material was deposited on a glass substrate to an average layer thickness of 20 nm to form the first low(er)-index layer 120$_a$. The first low-index material has an initial sticking probability, against the deposition of Ag, that is low relative to an initial sticking probability, against the deposition of Ag, of glass.

Thereafter, the exposed layer surface 11 of the low(er)-index layer 120$_a$ was exposed to a vapor flux of Ag until a reference layer thickness of 20 nm was attained.

Thereafter, a different average layer thickness of a second low-index material, which was substantially identical to the first low-index material, was deposited to a different average layer thickness on the exposed layer surface 11 of each sample to form the second low(er)-index 120$_b$. A Reference Sample 1 was formed by not depositing the second low-index material, such that Reference Sample 1 was substantially devoid of a second low(er)-index layer 120$_b$. Sample 1A was formed by depositing the second low-index material to an average layer thickness of 5 nm. Sample 1B was formed by depositing the second low-index material to an average layer thickness of 10 nm. Sample 1C was formed by depositing the second low-index material to an average layer thickness of 15 nm.

Table 2 below shows measured transmittance values (expressed as a percentage relative to the intensity of light emitted by a light source) for various samples at various wavelengths. In each of the experiments performed to obtain these values, EM radiation at a known intensity was transmitted through the sample from the glass substrate side and the intensity of the EM radiation exiting the other side of the sample was measured at various wavelengths.

TABLE 2

| Sample | 400 nm | 450 nm | 550 nm | 700 nm |
|---|---|---|---|---|
| Reference Sample 1 | 78.2 | 89.1 | 93.0 | 93.4 |
| Sample 1A | 73.4 | 86.8 | 93.0 | 93.6 |
| Sample 1B | 70.0 | 84.6 | 92.8 | 93.2 |
| Sample 1C | 71.3 | 85.0 | 92.7 | 93.4 |

TABLE 2-continued

As may be seen, each of the samples of Table 2 show relatively little reduction in transmittance across the IR spectrum (700 nm) and even in a R(ed)/G(reen) region of the visible spectrum (550 nm). By contrast, as the average layer thickness of the second low-index material increases, there is shown an increased absorption (reduction in transmittance) in the visible spectrum, especially toward the B(lue) region of the visible spectrum (450 nm) and even more so in the UV (400 nm).

A series of samples was fabricated to evaluate the suitability of an EM radiation-modifying layer 130 interposed between a first low(er)-index layer 120$_a$ and a second low(er)-index layer 120$_b$.

In each sample, a first low-index material was deposited on a glass substrate to an average layer thickness of 20 nm to form the first low(er)-index layer 120$_a$. The first low-index material used was the same as the first low-index material used in Reference Sample 1, and Samples 1A, 1B, and 1C, the first low-index material used has an initial sticking probability, against the deposition of Ag, that is low relative to an initial sticking probability, against the deposition of Ag, of glass.

Thereafter, the exposed layer surface 11 of the low(er)-index layer 120$_a$ was exposed to a vapor flux of ytterbium (Yb) until a reference layer thickness of 2 nm was attained.

Thereafter, the exposed layer surface was exposed to a vapor flux of Ag until a reference layer thickness of 15 nm was attained.

Thereafter, a different average layer thickness of a second low-index material, which was substantially identical to the first low-index material used herein, was deposited to a different average layer thickness on the exposed layer surface 11 of each sample to form the second low(er)-index 120$_b$. A Reference Sample 2 was formed by not depositing the second low-index material, such that Reference Sample 2 was substantially devoid of a second low(er)-index layer 120$_b$. Sample 2A was formed by depositing the second low-index material to an average layer thickness of 25 nm. Sample 2B was formed by depositing the second low-index material to an average layer thickness of 40 nm.

By contrast, a Sample 2C was formed by not depositing the second low-index material, such that Sample 2C was substantially devoid of a second low(er)-index layer 120$_b$, but by depositing instead, a high-index material to form a higher-index layer 150 at an index interface 140 with the exposed layer surface 11 of the first low(er)-index layer 120$_a$.

Table 3 below shows measured transmittance values (expressed as a percentage relative to the intensity of EM radiation emitted by an EM radiation source) for various samples at various wavelengths. In each of the experiments performed to obtain these values, EM radiation in the form of light at a known intensity was transmitted through the sample from the glass substrate side and the intensity of the EM radiation exiting the other side of the sample was measured.

TABLE 3

| Sample | 400 nm | 450 nm | 550 nm | 700 nm |
|---|---|---|---|---|
| Reference Sample 2 | 67.5 | 71.6 | 80.2 | 85.4 |
| Sample 2A | 66.9 | 69.9 | 77.2 | 83.6 |
| Sample 2B | 70.9 | 72.5 | 78.7 | 84.5 |
| Sample 2C | 79.1 | 71.1 | 72.2 | 80.7 |

As may be seen, the measured transmittance values in Table 2 were reduced overall relative to the corresponding values in Table 3. As between Reference Sample 2 and Sample 2A, there is relatively little increase in absorption (reduction in transmittance) in the IR spectrum (700 nm), the visible spectrum (450 nm, 550 nm), and the UV (400 nm) with the introduction of the second low-index material. However, as the average layer thickness of the second low-index material increases (as between Samples 2A and 2B), a light reduction in absorption may be detected. By contrast, replacing the second low-index material with the higher-index material results in a substantial increase in absorption in both the IR spectrum (700 nm) and a R(ed)/G(reen) region of the visible spectrum. In the B(lue) region (450 nm) of the visible spectrum, Sample 2C exhibits a similar level of transmittance to those of Reference Sample 2 and Sample 2B, and in the UV (400 nm), there is detected a substantial increase in transmittance compared to those of Reference Sample 2, Sample 2A, and Sample 2B.

A series of samples was fabricated to evaluate the suitability of an index interface 140 between at least one low(er)-index layer 120 and a higher-index layer 150.

In each sample, a first low-index material was deposited on a glass substrate to an average layer thickness of 20 nm to form a first low(er)-index layer $\mathbf{120}_a$. The first low-index material used was substantially identical to the first low-index material used in Reference Sample 1, and Samples 1A, 1B, and 1C.

Thereafter, a different average layer thickness of a second low-index material, which was substantially identical to the first low-index material, was deposited to a different average layer thickness on the exposed layer surface 11 of the low(er)-index layer $\mathbf{120}_a$ of each sample to form the second low(er)-index $\mathbf{120}_b$. A Reference Sample 3 was formed by not depositing the second low-index material, such that Reference Sample 3 was substantially devoid of a second low(er)-index layer $\mathbf{120}_b$. Sample 3A was formed by depositing the second low-index material to an average layer thickness of 5 nm. Sample 3B was formed by depositing the second low-index material to an average layer thickness of 10 nm. Sample 3C was formed by depositing the second low-index material to an average layer thickness of 15 nm.

Thereafter, a high-index material was deposited to an average layer thickness of 40 nm on the exposed layer surface 11 of each sample to form a higher-index layer 150. The high index-index material used was substantially identical to the high-index material used in Sample 2C.

Table 4 below shows measured transmittance values (expressed as a percentage relative to the intensity of EM radiation emitted by an EM radiation source) for various samples at various wavelengths. In each of the experiments performed to obtain these values, EM radiation in the form of light at a known intensity was transmitted through the sample from the glass substrate side and the intensity of the EM radiation exiting the other side of the sample was measured.

TABLE 4

| Sample | 400 nm | 450 nm | 550 nm | 700 nm |
|---|---|---|---|---|
| Reference Sample 3 | 78.4 | 85.5 | 89.7 | 91.8 |
| Sample 3A | 77.6 | 85.0 | 89.8 | 92.1 |
| Sample 3B | 77.1 | 84.6 | 89.8 | 92.3 |
| Sample 3C | 76.6 | 84.7 | 90.7 | 93.3 |

As may be seen, as the average layer thickness of the second low-index material increases, there is shown a slight increase in transmittance across the IR spectrum (700 nm) and in a R(ed)/G(reen) region of the visible spectrum (550 nm). Toward the B(lue) region of the visible spectrum (450 nm) and in the UV (400 nm), there is a very slight decrease in transmittance as the average layer thickness of the second low-index material increases.

A series of samples was fabricated to evaluate the suitability of both an EM radiation-modifying layer 130 interposed between a first low(er)-index layer $\mathbf{120}_a$ and a second low(er)-index layer $\mathbf{120}_b$ and an index interface 140 between the at least one low(er)-index layer 120 and a higher-index layer 150.

In each sample, a first low-index material was deposited on a glass substrate to an average layer thickness of 20 nm to form the first low(er)-index layer $\mathbf{120}_a$. The first low-index material used was substantially identical to the first low-index material used in Reference Samples 1 and 3, and Samples 1A, 1B, 1C, 3A, 3B and 3C.

Thereafter, the exposed layer surface 11 of the low(er)-index layer $\mathbf{120}_a$ was exposed to a vapor flux of Ag until a reference layer thickness of 20 nm was attained.

Thereafter, a different average layer thickness of a second low-index material, which was substantially identical to the first low-index material, was deposited to a different average layer thickness on the exposed layer surface 11 of each sample to form the second low(er)-index $\mathbf{120}_b$. A Reference Sample 4 was formed by not depositing the second low-index material, such that Reference Sample 4 was substantially devoid of a second low(er)-index layer $\mathbf{120}_b$. Sample 4A was formed by depositing the second low-index material to an average layer thickness of 5 nm. Sample 4B was formed by depositing the second low-index material to an average layer thickness of 10 nm. Sample 4C was formed by depositing the second low-index material to an average layer thickness of 15 nm.

Thereafter, a high-index material was deposited to an average layer thickness of 40 nm on the exposed layer surface 11 of each sample to form a higher-index layer 150. The higher-index material used was substantially identical to the high-index material used in Reference Sample 3, and Samples 3A, 3B, and 3C.

Table 5 below shows measured transmittance values (expressed as a percentage relative to the intensity of EM radiation emitted by an EM radiation source) for various samples at various wavelengths. In each of the experiments performed to obtain these values, EM radiation in the form of light at a known intensity was transmitted through the sample from the glass substrate side and the intensity of the EM radiation exiting the other side of the sample was measured.

TABLE 5

| Sample | 400 nm | 450 nm | 550 nm | 700 nm |
|---|---|---|---|---|
| Reference Sample 4 | 69.5 | 64.2 | 83.5 | 89.5 |
| Sample 4A | 68.5 | 76.0 | 87.7 | 91.0 |
| Sample 4B | 66.8 | 79.3 | 88.3 | 91.4 |
| Sample 4C | 65.4 | 80.5 | 88.8 | 91.9 |

As may be seen, as the average layer thickness of the second low-index material increases, there is shown a slight increase in transmittance across the IR spectrum (700 nm) and at various wavelengths of the visible spectrum (450 nm, 550 nm). By contrast, in the UV (400 nm), there is a slight decrease in transmittance as the average layer thickness of the second low-index material increases.

It was further observed that Samples 4A, 4B, and 4C exhibited substantially higher transmittance across the visible spectrum compared to Reference Sample 4. By way of non-limiting example, as between Reference Sample 4 and Sample 4A in which the only difference in their sample fabrication was the presence of a 5 nm thick layer of the second low-index material in Sample 4A, the presence of such layer produced a substantial increase in transmittance by over 10% at wavelengths of 450 nm and 550 nm. Furthermore, the presence of the second low-index material did not substantially affect the transmittance at wavelengths corresponding to the UV spectrum (400 nm) and the IR spectrum (700 nm). Accordingly, it has now been somewhat surprisingly found that, at least in some non-limiting examples, providing a low-index material between the EM radiation-modifying layer and the higher-index layer may enhance transmittance of EM radiation in at least a part of the visible spectrum in comparison to devices in which no such low-index material is provided between the EM radiation-modifying layer and the higher-index layer.

In the foregoing samples, the first low-index material and the second low-index material had a refractive index of about 1.36 at wavelengths of about 460 nm, 500 nm, and at 550 nm. The high-index material had a refractive index of about 1.89 at a wavelength of about 460 nm, about 1.86 at a wavelength of about 500 nm, and about 1.83 at a wavelength of about 550 nm.

Figure 3:
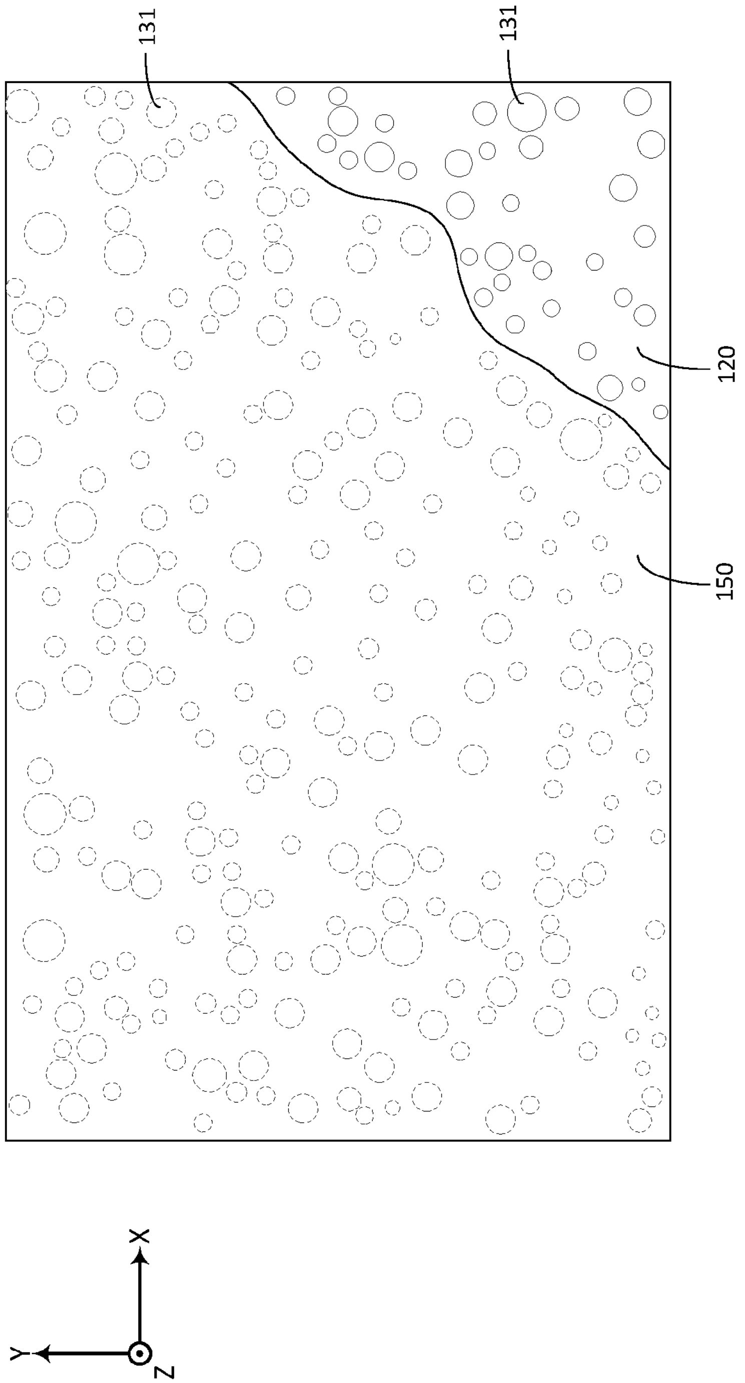
FIG. 3 is an example schematic diagram illustrating, in plan, partially cut-away, the device of FIG. 1, including the at least one low(er)-index layer underlying an EM radiation-modifying layer comprising at least one particle structure; and a higher-index layer deposited thereover according to an example in the present disclosure.

FIG. 3 is a simplified partially cut-away diagram in plan of the device 100. While some parts of the device 100 have been omitted from FIG. 3 for purposes of simplicity of illustration, it will be appreciated that various features described with respect thereto may be combined with those of no-limiting examples, provided therein.

In the figure, a pair of lateral axes, identified as the X-axis and Y-axis respectively, which in some non-limiting examples may be substantially transverse to one another, may be shown. At least one of these lateral axes may define a lateral aspect of the device 100.

In FIG. 3, the higher-index medium is embodied by a physical higher-index layer 150 that substantially extends across the at least one particle cluster 131 of the EM radiation-modifying layer 120. To the extent that any part of the exposed layer surface of the (underlying) at least one low(er)-index layer 120, on which the EM radiation-modifying layer 130 is disposed, is substantially devoid of particle material 135, including by way of non-limiting example, in gaps between the at least one particle structure(s) 131, the higher-index medium, including without limitation, any physical higher-index layer 150, may extend substantially across and be disposed on the exposed layer surface 11 of such low(er)-index layer 120.

While the EM radiation-modifying layer 130 may absorb EM radiation incident thereon from beyond the layered semiconductor device 100, thus reducing reflection, those having ordinary skill in the relevant art will appreciate that, in some non-limiting examples, the EM radiation-modifying layer 130 may absorb EM radiation incident thereon that is emitted by the device 100.

In some non-limiting examples, employing an EM radiation-modifying layer 130 as part of a layered semiconductor device 100 may reduce reliance on a polarizer therein.

In some non-limiting examples, the EM radiation-modifying layer 130 may be formed by depositing discrete metal particle structures 131, including as a discontinuous layer 160 as shown by way of non-limiting example in FIG. 1, or an intermediate stage layer (not shown), which in some non-limiting examples, may comprise NPs, of a given characteristic dimension, which in some non-limiting examples, may be a characteristic size, length, width, diameter, height, size distribution, shape, surface coverage, configuration, deposited density, and/or composition thereof.

In some non-limiting examples, at least one dimension, including without limitation, a characteristic dimension, of the at least one particle structure 131 along the EM radiation-modifying layer 130, may correspond to a wavelength range in which an absorption spectrum of the at least one particle structure 131 does not substantially overlap with a wavelength range of the EM spectrum of EM radiation being emitted by and/or transmitted at least partially through the device 100.

Those having ordinary skill in the relevant art will appreciate that, having regard to the mechanism by which materials are deposited, due to possible stacking and/or clustering of monomers and/or atoms, an actual size, height, weight, thickness, shape, profile, and/or spacing of the particle structures 131 in the EM radiation-modifying layer 130 may be, in some non-limiting examples, substantially non-uniform. Additionally, although the particle structures 131 in the EM radiation-modifying layer 130 are illustrated as having a given profile, this is intended to be illustrative only, and not determinative of any size, height, weight, thickness, shape, profile, and/or spacing of such particle structures 131.

In some non-limiting examples, the at least one particle structure 131 may have a characteristic dimension of no more than about 200 nm. In some non-limiting examples, the at least one particle structure 131 may have a characteristic diameter that may be at least one of between about: 1-200 nm, 1-160 nm, 1-100 nm, 1-50 nm, or 1-30 nm.

In some non-limiting examples, the particle structures 131 making up the EM radiation-modifying layer 130 may be, and/or comprise discrete metal plasmonic islands or clusters.

In some non-limiting examples, such particle structures 131 may be formed by depositing a scant amount, in some non-limiting examples, having an average layer thickness that may be on the order of a few, or a fraction of an angstrom, of a deposited material 1631 on an exposed layer surface 11 of an underlying layer, including without limitation, the first layer 110. In some non-limiting examples, the exposed layer surface 11 may be of a nucleation-promoting coating (NPC) 1820 (FIG. 18C).

In some non-limiting examples, the particle material 135 may comprise at least one of Ag, Yb, and/or magnesium (Mg).

Seeds

In some non-limiting examples, the size, height, weight, thickness, shape, profile, and/or spacing of the particle structures 131 in the EM radiation-modifying layer 130 may be, to a greater or lesser extent, specified by depositing seed material, as part of the EM radiation-modifying layer 130, in a templating layer at appropriate locations and/or at an appropriate density and/or stage of deposition. In some non-limiting examples, such seed material may act as a seed 132 or heterogeneity, to act as a nucleation site such that when a deposited material 1631 may tend to coalesce around each seed 132 to form the particle structures 131.

In some non-limiting examples, the seed material may comprise a metal, including without limitation, Yb or Ag. In some non-limiting examples, the seed material may have a high wetting property with respect to the deposited material 1631 deposited thereon and coalescing thereto.

In some non-limiting examples, the seeds 132 may be deposited in the templating layer, across the exposed layer surface 11 of the device 100, in some non-limiting examples, using an open mask and/or a mask-free deposition process, of the seed material.

EM Layer Patterning Coating

Figure 4:
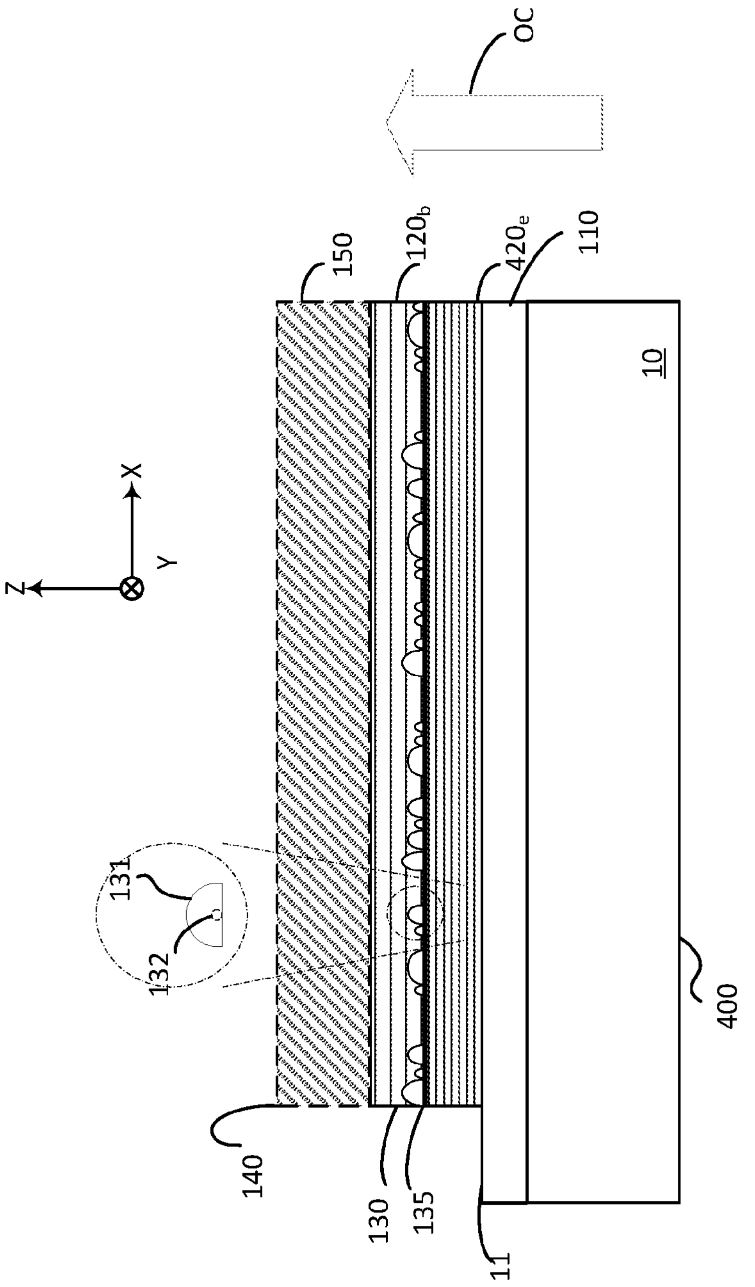
FIG. 4 is a simplified block diagram from a cross-sectional aspect, of an example version of the device of FIG. 1, wherein an underlying low(er)-index layer serves as an EM layer patterning coating according to an example in the present disclosure.

Turning now to FIG. 4, in which a version 400 of the device 100 is shown, with additional optional layers, in some non-limiting examples, one of the at least one low (er)-index layer(s) 120, whose exposed layer surface 11 has the EM radiation-modifying layer 130 deposited thereon, may act as an EM layer patterning coating $\mathbf{420}_e$, for purposes of depositing the EM radiation-modifying layer 130, by the interposition, between a patterning material 1511 (FIG. 15) of which the EM layer patterning coating $\mathbf{420}_e$ is comprised, and the exposed layer surface 11, of a shadow mask 1515 (FIG. 15), which in some non-limiting examples, may be a fine metal mask (FMM).

After selective deposition of the EM layer patterning coating $\mathbf{420}_e$, a deposited material 1631 may be deposited over the device 400, in some non-limiting examples, using an open mask and/or a mask-free deposition process, as, and/or to form, particle structures 131 therein that comprise the EM radiation-modifying layer 130, including without limitation, by coalescing around respective seeds 132, if any, that are not covered by the EM layer patterning coating $\mathbf{420}_e$.

The EM layer patterning coating $\mathbf{420}_e$ may provide a surface with a relatively low initial sticking probability against the deposition of the deposited material 1631, that may be substantially less than an initial sticking probability against the deposition of the deposited material 1631, of the exposed layer surface 11 of the underlying layer of the device 400.

Thus, the exposed layer surface 11 of the underlying layer may be substantially devoid of a closed coating 1240 (FIG. 12) of the deposited material 1631 that may be deposited to form the particle structures 131, including without limitation, by coalescing around the seeds 132 not covered by the EM layer patterning coating $\mathbf{420}_e$.

In this fashion, the EM layer patterning coating $\mathbf{420}_e$ may be selectively deposited, including without limitation, using a shadow mask 1515, to allow the deposited material 1631 to be deposited, including without limitation, using an open mask and/or a mask-free deposition process, so as to form particle structures 131, including without limitation, by coalescing around respective seeds 132.

In some non-limiting examples, the deposited material 1631 to be deposited over the exposed layer surface 11 of the device 400 may have a dielectric constant property that may, in some non-limiting examples, have been chosen to facilitate and/or increase the absorption, by the EM radiation-modifying layer 130, of EM radiation generally, or in some time-limiting examples, in a wavelength (sub-) range of the EM spectrum, including without limitation, the visible spectrum, and/or a sub-range and/or wavelength thereof, including without limitation, corresponding to a specific colour.

In some non-limiting examples, an EM layer patterning coating $\mathbf{420}_e$ may comprise a patterning material 1511 that exhibits a relatively low initial sticking probability with respect to the seed material and/or the deposited material 1631 such that the surface of such EM layer patterning coating $\mathbf{420}_e$ may exhibit an increased propensity to cause the deposited material 1631 (and/or the seed material) to be deposited as particle structures 131, in some examples, relative to non-EM layer patterning coating $\mathbf{420}_n$ and/or patterning materials 1511 of which they may be comprised, used for purposes of inhibiting deposition of a closed coating 1240 of the deposited material 1631, including the applications discussed herein, other than the formation of the EM radiation-modifying layer 130.

In some non-limiting examples, an EM layer patterning coating $\mathbf{420}_e$ may comprise a plurality of materials, wherein at least one material thereof is a patterning material 1511, including without limitation, a patterning material 1511 that exhibits such a relatively low initial sticking probability with respect to the deposited material 1631 and/or the seed material as discussed above.

In some non-limiting examples, a first one of the plurality of materials may be a patterning material 1511 that has a first initial sticking probability against deposition of the deposited material 1631 and/or the seed material and a second one of the plurality of materials may be a patterning material that has a second initial sticking probability against deposition of the deposited material 1631 and/or the seed material, wherein the second initial sticking probability exceeds the first initial sticking probability.

In some non-limiting examples, the first initial sticking probability and the second initial sticking probability may be measured using substantially identical conditions and parameters.

In some non-limiting examples, the first one of the plurality of materials may be doped, covered, and/or supplemented with the second one of the plurality of materials, such that the second material may act as a seed or heterogeneity, to act as a nucleation site for the deposited material 1631 and/or the seed material.

In some non-limiting examples, the second one of the plurality of materials may comprise an NPC 1820. In some non-limiting examples, the second one of the plurality of materials may comprise an organic material, including without limitation, a polycyclic aromatic compound, and/or a material comprising a non-metallic element including without limitation, O, S, nitrogen (N), or C, whose presence might otherwise be considered to be a contaminant in the source material, equipment used for deposition, and/or the vacuum chamber environment. In some non-limiting examples, the second one of the plurality of materials may be deposited in a layer thickness that is a fraction of a monolayer, to avoid forming a closed coating 1240 thereof. Rather, the monomers 1632 (FIG. 16) of such material may tend to be spaced apart in the lateral aspect so as to form discrete nucleation sites for the deposited material 1631 and/or seed material.

A series of samples was fabricated to evaluate the suitability of an EM radiation-modifying layer 130 formed by an EM layer patterning coating $\mathbf{420}_e$ comprising a mixture of a first patterning material $\mathbf{1511}_1$ and a second patterning material $\mathbf{1511}_2$. In all the samples, the first patterning material $\mathbf{1511}_1$ was a nucleation inhibiting coating (NIC) having a substantially low initial sticking probability against the deposition of Ag as a deposited material 1631. Three example materials were evaluated as the second patterning material 1511$_2$, namely an ETL 1937 (FIG. 19) material, Liq, which tends to have a relatively high initial sticking probability against the deposition of Ag as a deposited material 1631 and may be suitable, in some non-limiting examples, as an NPC 1820, and LiF.

For the ETL 1937 material, a number of samples were prepared by co-depositing the first patterning material 1511$_1$ and the ETL 1937 material in varying ratios, to an average layer thickness of 20 nm on an indium tin oxide (ITO) substrate and thereafter exposing the exposed layer surface 11 thereof to a vapor flux 1632 of Ag to a reference layer thickness of 15 nm.

Six samples were prepared, where the ratio of the ETL 1937 material to the first patterning material 1511$_1$ by % volume were respectively 1:99 (ETL Sample A), 2:98 (ETL Sample B), 5:95 (ETL Sample C), 10:90 (ETL Sample D), (ETL Sample E), and 40:60 (ETL Sample F). Additionally, two comparative samples were prepared, where the ratio of the ETL 1937 material to the first patterning material 1511$_1$ by % volume were respectively 0:100 (Comparative Sample 1) and 100:0 (Comparative Sample 2).

ETL Sample B exhibited a total surface coverage of 15.156%, a mean characteristic size of 13.6292 nm, a dispersity of 2.0462, a number average of the particle diameters of 14.5399 nm, and a size average of the particle diameters of nm.

ETL Sample C exhibited a total surface coverage of 22.083%, a mean characteristic size of 16.6985 nm, a dispersity of 1.6813, a number average of the particle diameters of 17.8372 nm, and a size average of the particle diameters of 23.1283 nm.

ETL Sample D exhibited a total surface coverage of 27.0626%, a mean characteristic size of 19.4518 nm, a dispersity of 1.5521, a number average of the particle diameters of 20.7487 nm, and a size average of the particle diameters of 25.8493 nm.

ETL Sample E exhibited a total surface coverage of 35.5376%, a mean characteristic size of 24.2092 nm, a dispersity of 1.6311, a number average of the particle diameters of 25.858 nm, and a size average of the particle diameters of 32.9858 nm.

FIGS. 5A-5E are respectively SEM micrographs of Comparative Sample 1, ETL Sample B, ETL Sample C, ETL Sample D, and ETL Sample E.

Figure 5A:
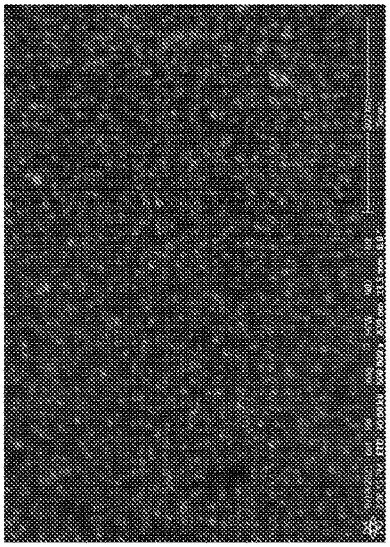
FIGS. 5A-5E are SEM micrographs of samples fabricated in examples of the present disclosure.
Figure 5B:
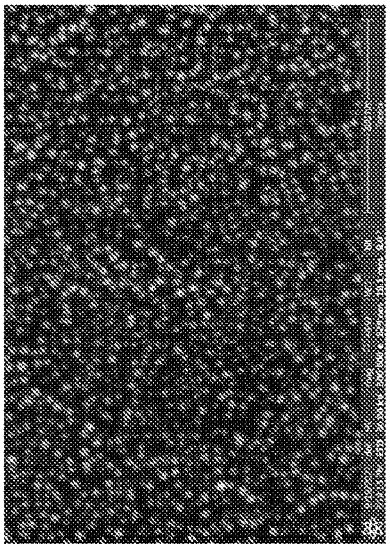
Figure 5C:
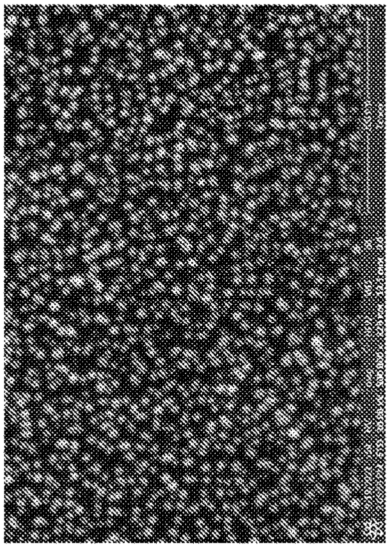
Figure 5D:
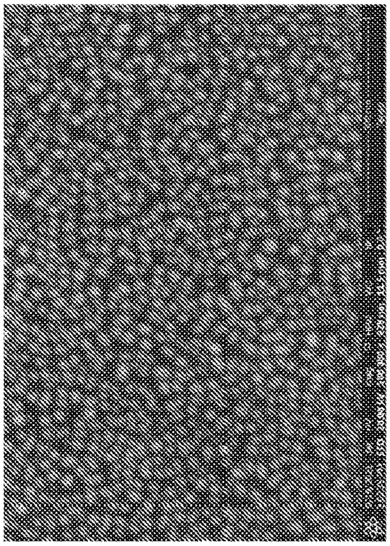
Figure 5E:
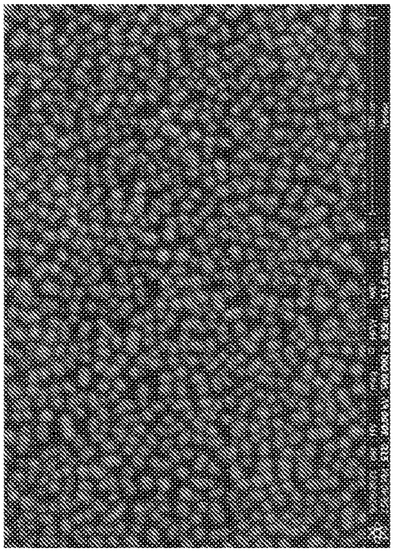
Figure 5F:
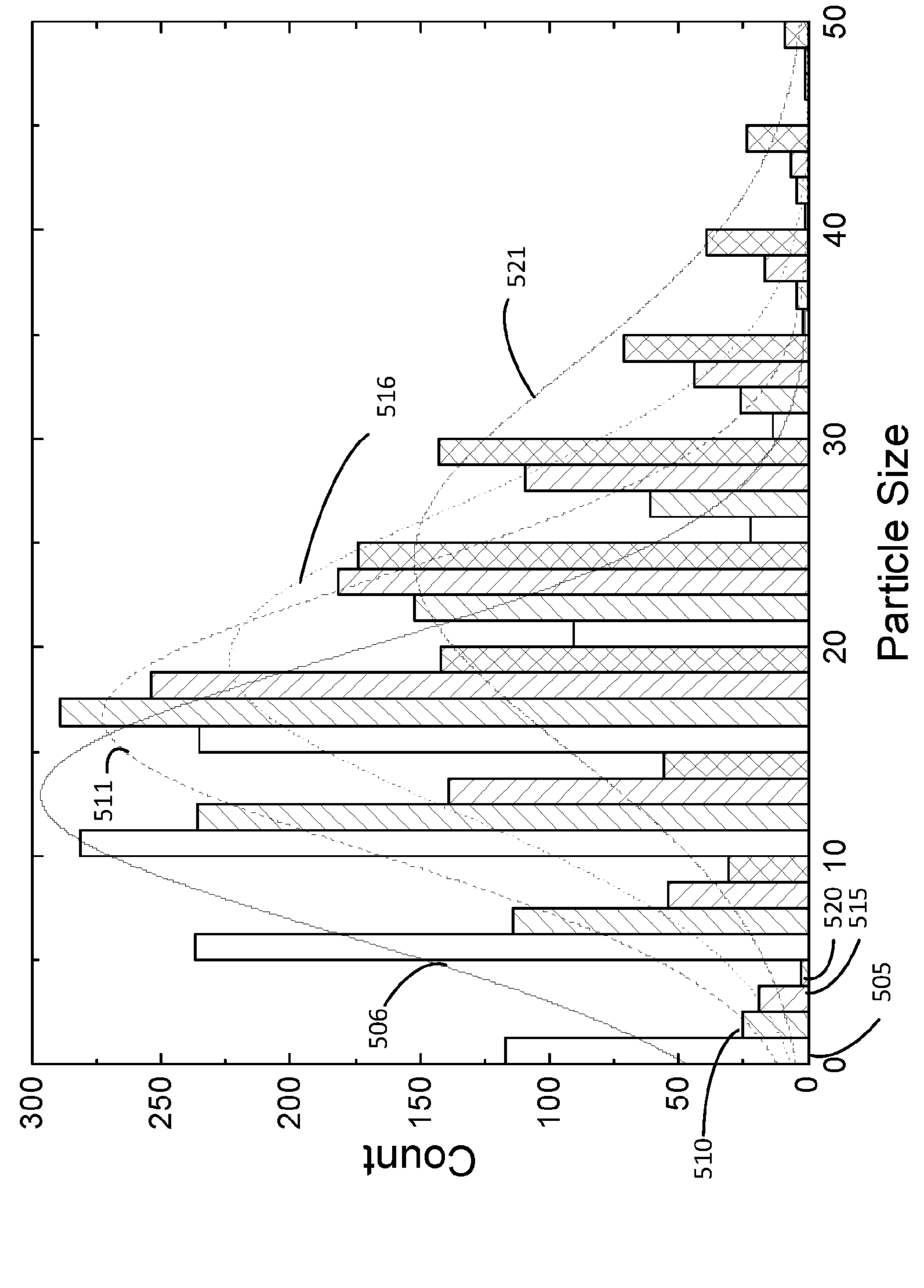
FIG. 5F is a chart of transmittance at various wavelengths based on analysis of the micrographs of FIGS. 5A-5E.
Figure 5G:
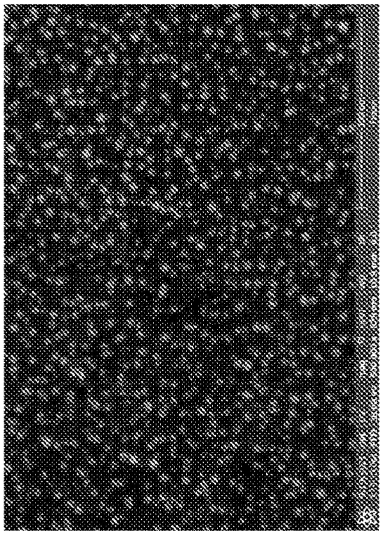
FIGS. 5G-5J are SEM micrographs of samples fabricated in examples of the present disclosure.
Figure 5H:
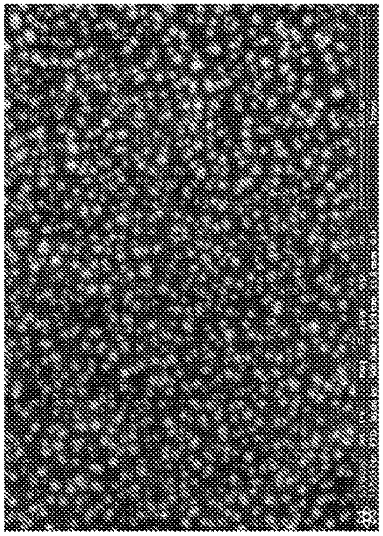
Figure 5I:
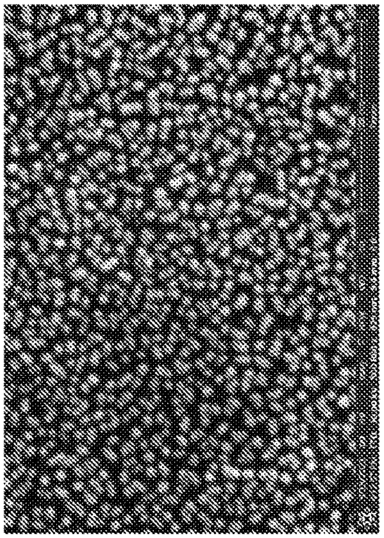
Figure 5J:
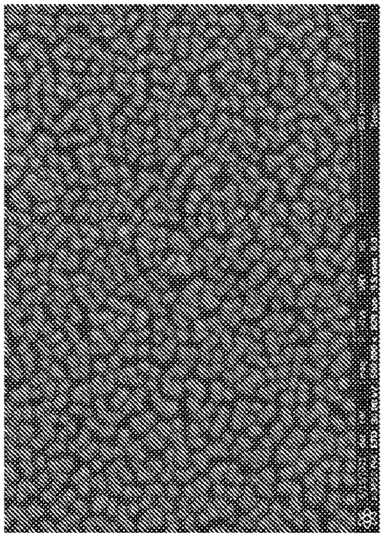

FIG. 5F is a histogram plotting a histogram distribution of particle structures 131 as a function of characteristic particle size, for ETL Sample B 505, ETL Sample C 510, ETL Sample D 515, and ETL Sample E 520, and respective curves fitting the histogram 506, 511, 516, 521.

Table 6 below shows measured transmittance percent reduction values for various samples at various wavelengths.

TABLE 6

| | Wavelength | | | |
|---|---|---|---|---|
| Sample | 450 nm | 550 nm | 700 nm | 850 nm |
| Comparative Sample 1 | 1.5% | <1% | <1% | <1% |
| ETL Sample B (2:98) | 9% | 5% | <1% | <1% |
| ETL Sample C (5:95) | 17% | 11% | 2.4% | 1% |
| ETL Sample D (10:90) | 29% | 24% | 11% | 5% |
| ETL Sample D (20:80) | 33% | 32% | 21% | 13% |

As may be seen, with relatively low concentrations of the ETL as the second patterning material 1511$_2$, there was minimal reduction in transmittance across most wavelengths. However, as the ETL concentration exceeded about 5% vol, a substantial reduction (>10%) was observed at wavelengths of 450 nm and 550 nm in the visible spectrum, without significant reduction in transmittance at wavelengths of 700 nm in the IR spectrum and 850 nm in the NIR spectrum.

For Liq, a number of samples were prepared by co-depositing the first patterning material 1511$_1$ and the Liq in varying ratios, to an average layer thickness of 20 nm on an ITO substrate and thereafter exposing the exposed layer surface 11 thereof to a vapor flux 1632 of Ag to a reference layer thickness of 15 nm.

Four samples were prepared, where the ratio of Liq to the first patterning material 1511$_1$ by % volume were respectively 2:98 (Liq Sample A), 5:95 (Liq Sample B), 10:90 (Liq Sample C), and 20:80 (Liq Sample D).

Liq Sample A exhibited a total surface coverage of 11.1117%, a mean characteristic size of 13.2735 nm, a dispersity of 1.651, a number average of the particle sizes of 13.9619 nm, and a size average of the particle sizes of 17.9398 nm.

Liq Sample B exhibited a total surface coverage of 17.2616%, a mean characteristic size of 15.2667 nm, a dispersity of 1.7914, a number average of the particle sizes of 16.3933 nm, and a size average of the particle sizes of 21.941 nm.

Liq Sample C exhibited a total surface coverage of 32.2093%, a mean characteristic size of 23.6209 nm, a dispersity of 1.6428, a number average of the particle sizes of 25.3038 nm, and a size average of the particle sizes of 32.4322 nm.

FIGS. 5G-5J are respectively SEM micrographs of Liq Sample A, Liq Sample B, Liq Sample C, and Liq Sample D.

Figure 5K:
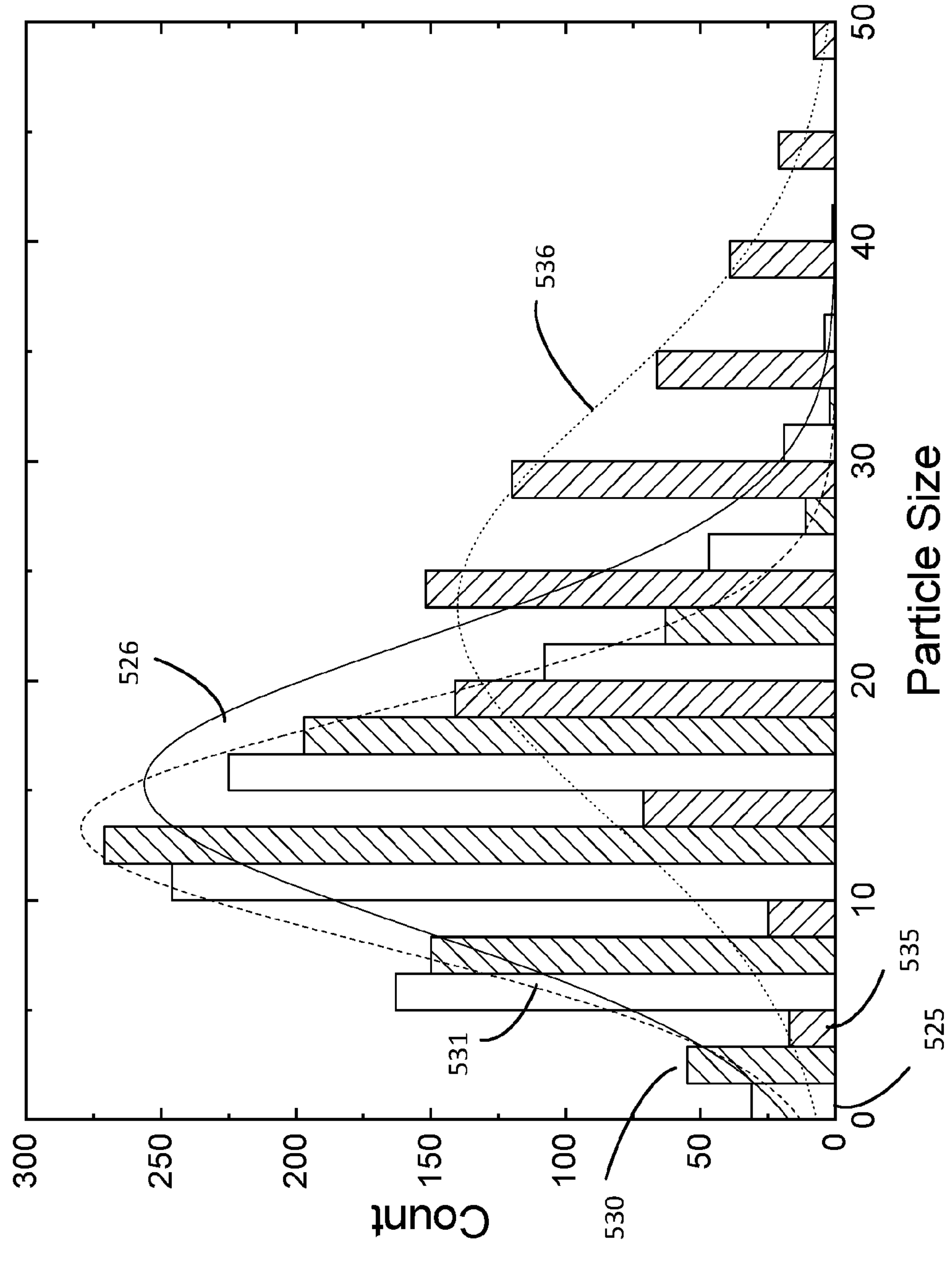
FIG. 5K is a chart of transmittance at various wavelengths based on analysis of the micrographs of FIGS. 5G-5J.
Figure 5N:
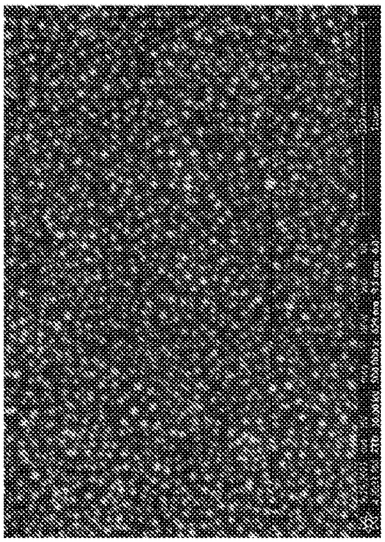
FIGS. 5L-5O are SEM micrographs of samples fabricated in examples of the present disclosure.
Figure 5M:
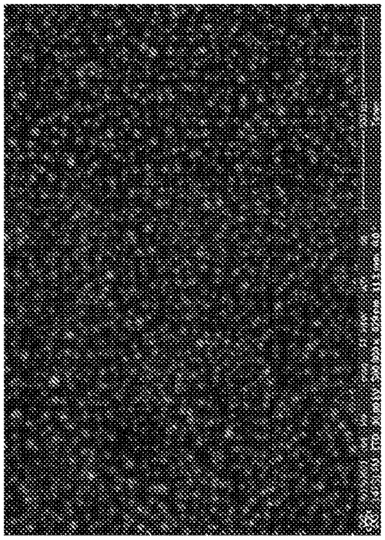
Figure 5L:
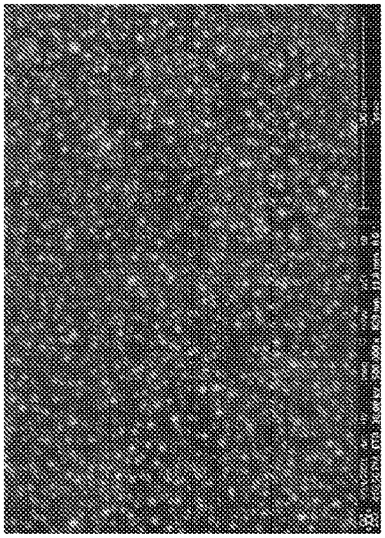
Figure 5O:
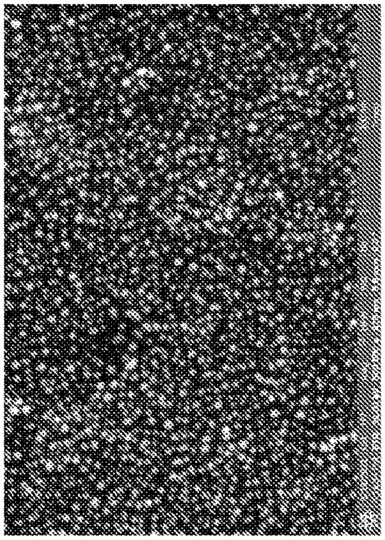

FIG. 5K is a histogram plotting a histogram distribution of particle structures 131 as a function of characteristic particle size, for Liq Sample B 525, Liq Sample A 530, and Liq Sample C 535, and respective curves fitting the histogram 526, 531, 536.

Table 7 below shows measured transmittance reduction percent reduction values for various samples at various wavelengths.

TABLE 7

| | Wavelength | | | | |
|---|---|---|---|---|---|
| Sample | 450 nm | 550 nm | 700 nm | 850 nm | 1,000 nm |
| Comparative Sample 1 | 1.5% | <1% | <1% | <1% | <1% |
| Liq Sample A (2:98) | 7% | 4% | <1% | <1% | <1% |
| Liq Sample B (5:95) | 15% | 10% | 1.5% | <1% | <1% |
| Liq Sample C (10:90) | 34% | 40% | 27.5% | 18% | 11% |

As may be seen, with relatively low concentrations of the Liq as the second patterning material 1511$_2$, there was minimal reduction in transmittance across most wavelengths. However, as Liq concentration exceeded about 5% vol, a substantial reduction (>10%) was observed at wavelengths of 450 nm and 550 nm in the visible spectrum, without significant reduction in transmittance at wavelengths of 700 nm in the IR spectrum and 850 nm and 1,000 nm in the NIR spectrum.

For LiF, a number of samples were prepared by first depositing the ETL material to an average layer thickness of 20 nm on an ITO substrate, then co-depositing the first patterning material $1511_1$ and LiF in varying ratios, to an average layer thickness of 20 nm on the exposed layer surface 11 of the ETL material and thereafter exposing the exposed layer surface 11 thereof to a vapor flux 1632 of Ag to a reference layer thickness of 15 nm.

Four samples were prepared, where the ratio of LiF to the first patterning material $1511_1$ by % volume were respectively 2:98 (LiF Sample A), 5:95 (LiF Sample B), 10:90 (LiF Sample C), and 20:80 (LiF Sample D).

FIGS. 5L-5O are respectively SEM micrographs of LiF Sample A, LiF Sample B, LiF Sample C, and LiF Sample D.

Figure 5P:
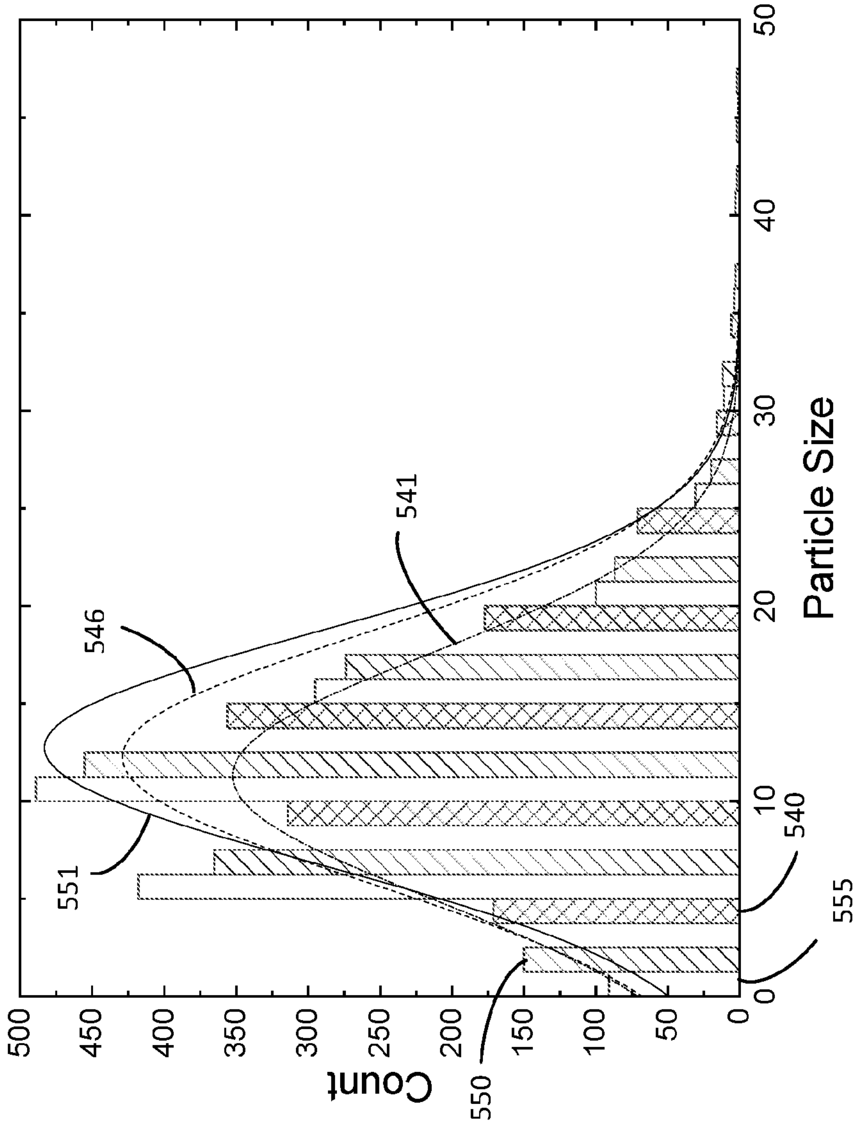
FIG. 5P is a chart of transmittance at various wavelengths based on analysis of the micrographs of FIGS. 5L-5O.

FIG. 5P is a histogram plotting a histogram distribution of particle structures 131 as a function of characteristic particle size, for LiF Sample A 540, LiF Sample B 545, and LiF Sample D 550, and respective curves fitting the histogram 541, 546, 551.

Table 8 below shows measured transmittance reduction percent reduction values for various samples at various wavelengths.

TABLE 8

| | Wavelength | | | | |
|---|---|---|---|---|---|
| Sample | 450 nm | 550 nm | 700 nm | 850 nm | 1,000 nm |
| Comparative Sample 1 | 1.5% | <1% | <1% | <1% | <1% |
| LiF Sample A (2:98) | 2.5% | 1.4% | <1% | <1% | <1% |
| LiF Sample B (5:95) | 6% | 3.4% | <1% | <1% | <1% |
| LiF Sample C (10:90) | 8% | 5% | <1% | <1% | <1% |
| LiF Sample D (20:80) | 11% | 6% | <1% | <1% | <1% |

As may be seen, with relatively low concentrations of LiF as the second patterning material $1511_2$, there was minimal reduction in transmittance across most wavelengths. However, as the LiF concentration exceeded about 10% vol, a noticeable reduction (8%) was observed at wavelength of 450 nm in the visible spectrum, without significant reduction in transmittance at wavelengths of 700 nm in the IR spectrum and 850 nm and 1,000 nm in the NIR spectrum Additionally, it was observed that there was substantially no reduction in transmittance at wavelengths of 700 nm or greater, for a concentration of LiF of up to 20% vol.

Table 9 below shows measured refractive index of the materials used in the above samples at various wavelengths.

TABLE 9

| | Wavelength | | |
|---|---|---|---|
| Material | 460 nm | 500 nm | 550 nm |
| First patterning material | 1.36 | 1.36 | 1.36 |
| ETL Material | 1.89 | 1.86 | 1.83 |
| Liq | 1.68 | 1.66 | 1.64 |
| LiF | 1.40 | 1.40 | 1.40 |

It will be appreciated that, for layers or coatings formed by co-depositing two or more materials, the refractive index of such layers or coatings may be estimated using, by way of non-limiting example, the lever rule. The lever rule may be applied by calculating, for each material constituting such layer or coating, the product of a concentration of the material multiplied by the refractive index of the material, and taking a sum of all of the products calculated for the materials constituting such layer or coating.

Co-Deposition with Dielectric Material

Although not shown, in some non-limiting examples, the particle structures 131 of which the EM radiation-modifying layer 130 may be comprised, may be formed without the use of seeds 132, including without limitation, by co-depositing the deposited material 1631 with a co-deposited dielectric material.

In some non-limiting examples, a ratio of the deposited material 1631 to the co-deposited dielectric material may be in a range of at least one of between about: 50:1-5:1, 30:1-5:1, or 20:1-10:1. In some non-limiting examples, the ratio may be at least one of about: 50:1, 45:1, 40:1, 35:1, 30:1, 25:1, 20:1, 19:1, 12.5:1, 10:1, 7.5:1, or 5:1.

In some non-limiting examples, the co-deposited dielectric material may have an initial sticking probability, against the deposition of the deposited material 1631 with which it may be co-deposited, that may be less than 1.

In some non-limiting examples, a ratio of the deposited material 1631 to the co-deposited dielectric material may vary depending upon the initial sticking probability of the co-deposited dielectric material against the deposition of the deposited material 1631.

In some non-limiting examples, the co-deposited dielectric material may be an organic material. In some non-limiting examples, the co-deposited dielectric material may be a semiconductor. In some non-limiting examples, the co-deposited dielectric material may be an organic semiconductor.

In some non-limiting examples, co-depositing the deposited material 1631 with the co-deposited dielectric material may facilitate formation of particle structures 131 in the EM radiation-modifying layer 130 in the absence of a templating layer comprising the seeds 132.

In some non-limiting examples, co-depositing the deposited material 1631 with the co-deposited dielectric material may facilitate and/or increase absorption, by the EM radiation-modifying layer 130, of EM radiation generally, or in some non-limiting examples, in a wavelength (sub-) range of the EM spectrum, including without limitation, the visible spectrum, and/or a sub-range and/or wavelength thereof, including without limitation, corresponding to a specific colour.

Absorption Around Emissive Regions

Figure 9A:
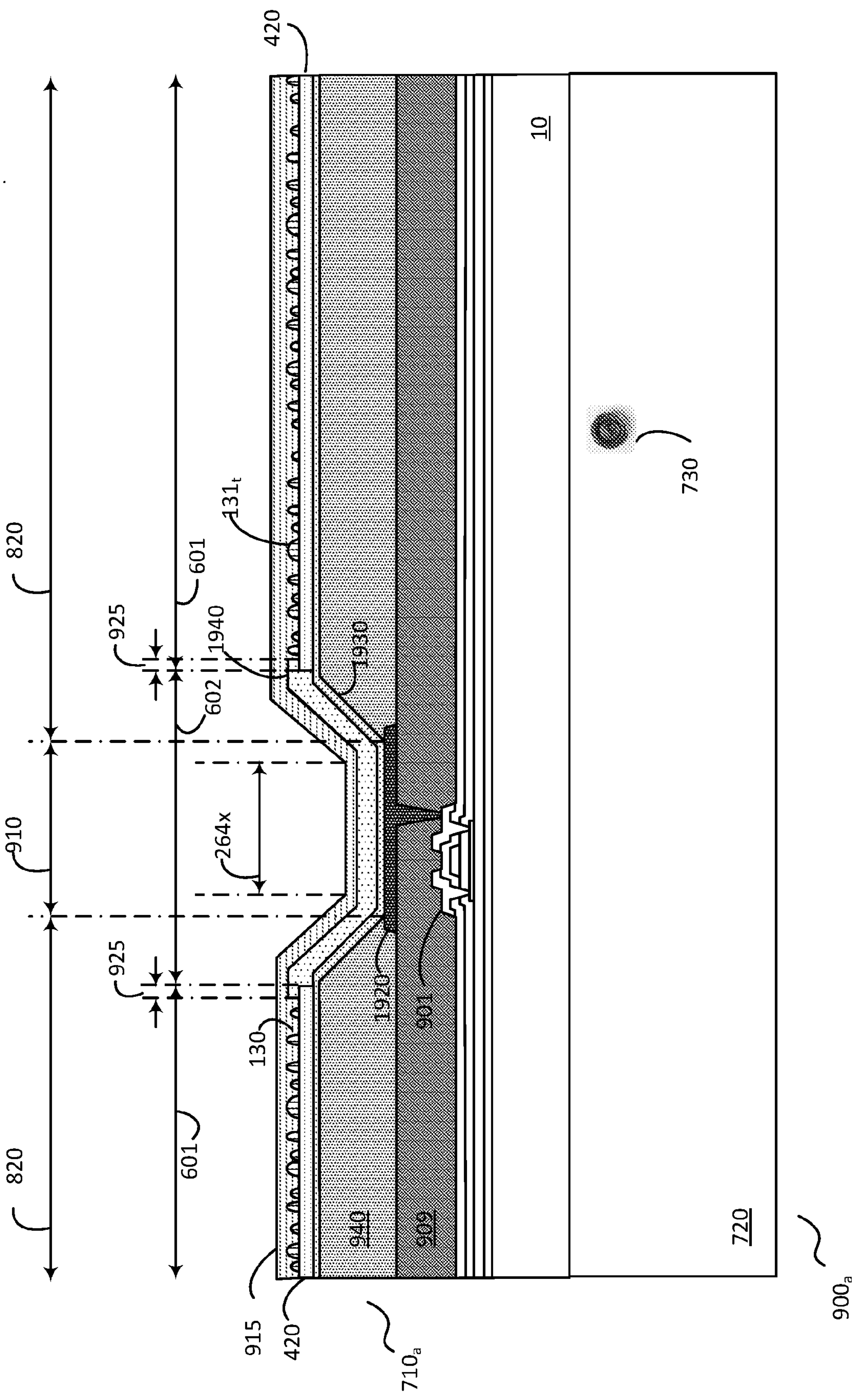
FIGS. 9A-9C are simplified block diagrams from a cross-sectional aspect, of various examples of an example user device having a display panel for covering a body, and at least one under-display component housed therewithin for exchanging EM signals at a non-zero angle to layers of the display panel therethrough, according to an example in the present disclosure.

In some non-limiting examples, the layered semiconductor device 100 may be an opto-electronic device $\mathbf{600}_a$ (FIG. 6A), such as an OLED, comprising at least one emissive region 910 (FIG. 9A). In some non-limiting examples, the emissive region 910 may correspond to at least one semiconducting layer 1930 disposed between a first electrode 1920 (FIG. 19), which in some non-limiting examples, may be an anode, and a second electrode 1940 (FIG. 19), which in some non-limiting examples, may be a cathode. The anode and cathode may be electrically coupled with a power source 1905 (FIG. 19) and respectively generate holes and electrons that migrate toward each other through the at least one semiconducting layer 1930. When a pair of holes and electrons combine, EM radiation in the form of a photon may be emitted.

In some non-limiting examples, the EM radiation-modifying layer 130 may be deposited on and/or over the exposed layer surface 11 of the second electrode 1940.

Figure 6A:
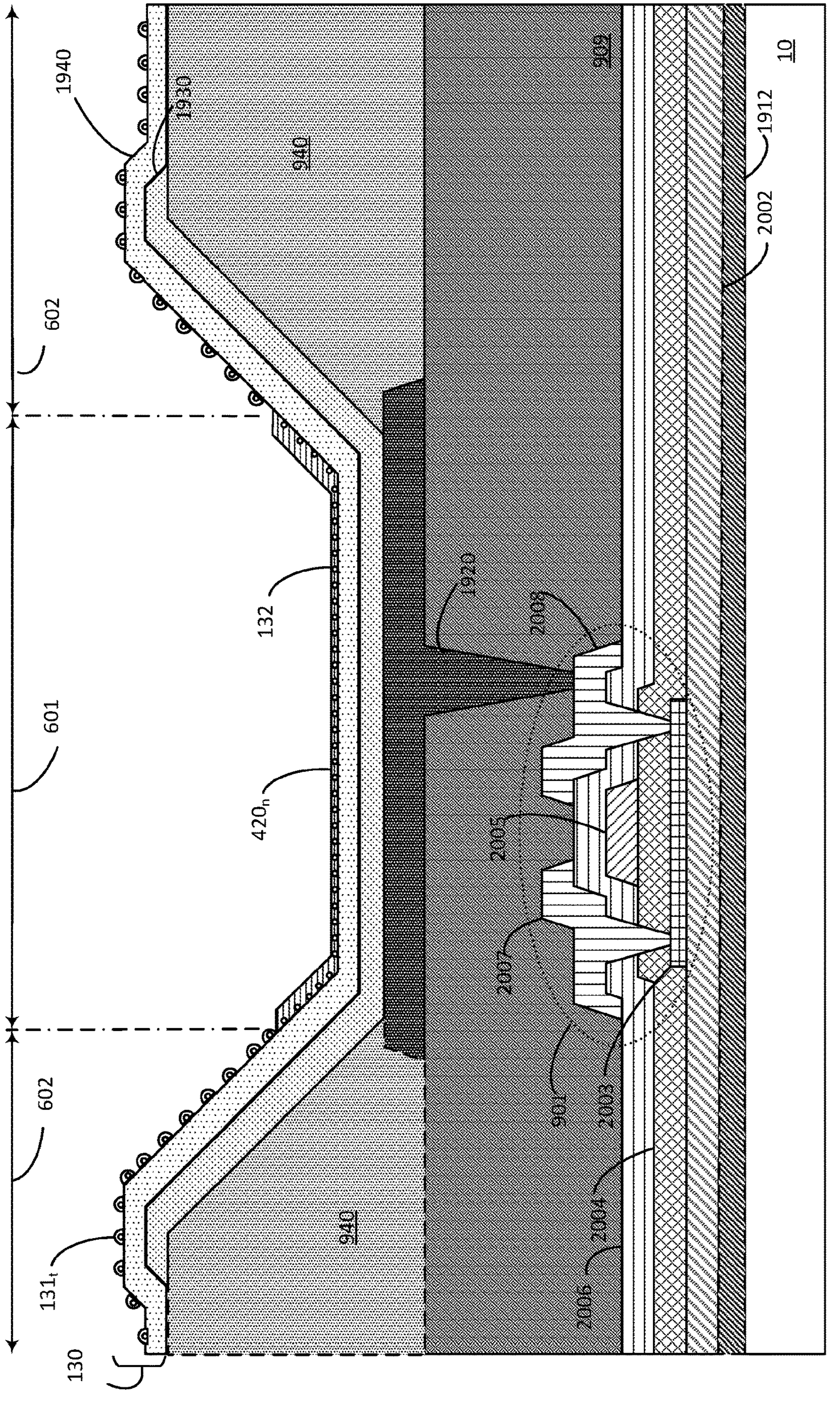
FIG. 6A is a schematic diagram showing the EM radiation-modifying layer of FIG. 1 proximate to an emissive region of the device of FIG. 1 formed by deposition of a patterning coating subsequent to deposition of a plurality of seeds for forming the particle structures according to an example in the present disclosure.

In some non-limiting examples, a lateral aspect of an exposed layer surface 11 of the device 100 may comprise a first portion 601 (FIG. 6A) and a second portion 602 (FIG. 6A). In some non-limiting examples, the second portion 602 may comprise that part of the exposed layer surface 11 of the underlying layer of the device 100 that lies beyond the first portion 601.

In some non-limiting examples, the EM radiation-modifying layer 130 may be omitted, or may not extend, over the first portion 601, but rather may only extend over the second portion 602. In some non-limiting examples, as shown by way of non-limiting example in FIG. 6A, the first portion 601 may correspond, to a greater or lesser extent, to a lateral aspect 2020 (FIG. 20) of at least one non-emissive region 2302 (FIG. 23A) of a version $600_a$ of the device 100, in which the seeds 132 may be deposited before deposition of a non-EM layer patterning coating $420_n$.

Such a non-limiting configuration may be appropriate to enable and/or to maximize transmittance of EM radiation emitted from the at least one emissive region 910, while reducing reflection of external EM radiation incident on an exposed layer surface 11 of the device 100.

Thus, as shown in FIG. 6A, in such a scenario, where the non-EM layer patterning coating $420_n$ may be deposited, not for purposes of depositing the EM radiation-modifying layer 130, but for limiting the lateral extent thereof, the patterning material 1511 of which such non-EM layer patterning coating $420_n$ may be comprised may not exhibit a relatively low initial sticking probability with respect to the deposited material 1631 and/or the seed material, such as discussed above.

Those having ordinary skill in the relevant art will appreciate that in some non-limiting examples, the EM radiation-modifying layer 130 may be omitted from region(s) of the device 100 other than, and/or in addition to, the emissive region(s) 910 of the device 100, and the second portion 602 may, in some examples, correspond to, and/or comprise such other region(s).

In some non-limiting examples, the change and/or shift in absorption may be concentrated in an absorption spectrum that is a (sub-) range of the EM spectrum, including without limitation, the visible spectrum, and/or a sub-range thereof.

In some non-limiting examples, such as shown in FIG. 6A, the non-EM layer patterning coating $420_n$ may be deposited on the exposed layer surface 11, after deposition of the seeds 132 in the templating layer, if any, such that the seeds 132 may be deposited across both the first portion 601 and the second portion 602, and the non-EM layer patterning coating $420_n$ may cover the seeds 132 deposited across the first portion 601.

Figure 6B:
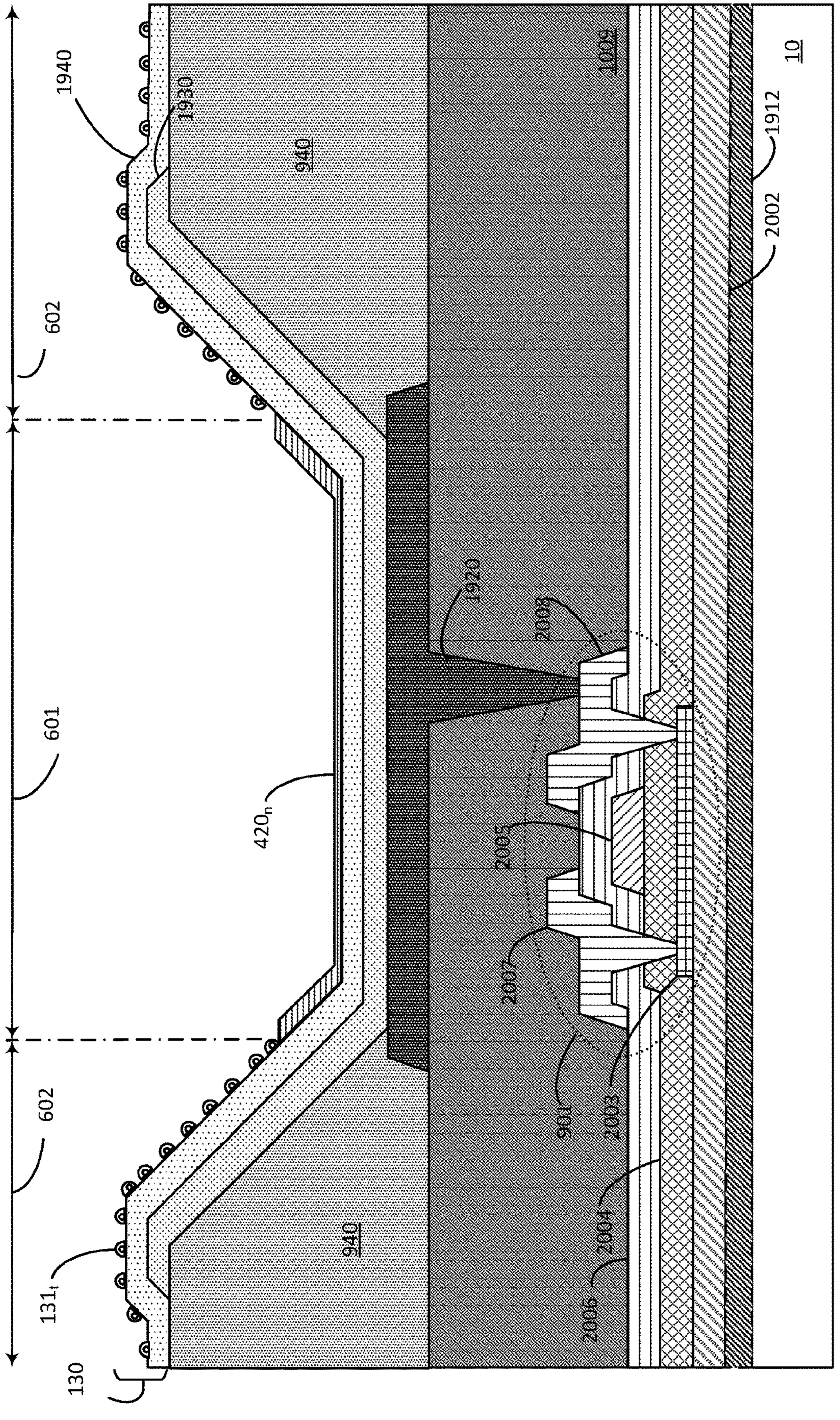
FIG. 6B is a schematic diagram showing a version of the EM radiation-modifying layer of FIG. 6A, formed by deposition of the patterning coating prior to deposition of the plurality of seeds, according to an example in the present disclosure.

In some non-limiting examples, the non-EM layer patterning coating $420_n$ may provide a surface with a relatively low initial sticking probability against the deposition, not only of the deposited material 1631, but also of the seed material. In such examples, such as is shown in the example version $600_b$ of the device 100 in FIG. 6B, the non-EM layer patterning coating $420_n$ may be deposited before, not after, any deposition of the seed material.

After selective deposition of the non-EM layer patterning coating $420_n$ across the first portion 601, a conductive deposited material 1631 may be deposited over the device $600_b$, in some non-limiting examples, using an open mask and/or a mask-free deposition process, but may remain substantially only within the second portion 602, which may be substantially devoid of the patterning coating 420, as, and/or to form, particle structures $131_t$ therein, including without limitation, by coalescing around respective seeds 132, if any, that are not covered by the non-EM layer patterning coating $420_n$.

After selective deposition of the non-EM layer patterning coating $420_n$ across the first portion 601, the seed material, if deposited, may be deposited in the templating layer, across the exposed layer surface 11 of the device $600_b$, in some non-limiting examples, using an open mask and/or a mask-free deposition process, but the seeds 132 may remain substantially only within the second portion 602, which may be substantially devoid of the non-EM layer patterning coating $420_n$.

Further, the deposited material 1631 may be deposited across the exposed layer surface 11 of the device 600, in some non-limiting examples, using an open mask and/or a mask-free deposition process, but the deposited material 1631 may remain substantially only within the second portion 602, which may be substantially devoid of the non-EM layer patterning coating $420_n$, as and/or to form particle structures $131_t$ therein, including without limitation, by coalescing around respective seeds 132.

The non-EM layer patterning coating $420_n$ may provide, within the first portion 601, a surface with a relatively low initial sticking probability against the deposition of the deposited material 1631 and/or the seed material, if any, that may be substantially less than an initial sticking probability against the deposition of the deposited material 1631, and/or the seed material, if any, of the exposed layer surface 11 of the underlying layer of device $600_b$ within the second portion 602.

Thus, the first portion 601 may be substantially devoid of a closed coating 1240 of any seeds 132 and/or of the deposited material 1631 that may be deposited within the second portion 602 to form the particle structures $131_t$, including without limitation, by coalescing around the seeds 132.

Those having ordinary skill in the relevant art will appreciate that, even if some of the deposited material 1631, and/or some of the seed material, remains within the first portion 601, the amount of any such deposited material 1631, and/or seeds 132 formed of the seed material, in the first portion 601, may be substantially less than in the second portion 602, and that any such deposited material 1631 in the first portion 601 may tend to form a discontinuous layer 160 that may be substantially devoid of particle structures 131. Even if some of such deposited material 1631 in the first portion 601 were to form a particle structure $131_d$, including without limitation, about a seed 132 formed of the seed material, the size, height, weight, thickness, shape, profile, and/or spacing of any such particle structures $131_d$ may nevertheless be sufficiently different from that of the particle structures $131_t$ of the EM radiation-modifying layer 130 of the second portion 602, that absorption of EM radiation in the first portion 601 may be substantially less than in the second portion 602, including without limitation, in a wavelength (sub-) range of the EM spectrum, including without limitation, the visible spectrum, and/or a sub-range and/or wavelength thereof, including without limitation, corresponding to a specific colour.

In this fashion, the non-EM layer patterning coating $420_n$ may be selectively deposited, including without limitation, using a shadow mask 1515, to allow the deposited material 1631 to be deposited, including without limitation, using an open mask and/or a mask-free deposition process, so as to form particle structures $131_t$, including without limitation, by coalescing around respective seeds 132.

Those having ordinary skill in the relevant art will appreciate that structures exhibiting relatively low reflectance may, in some non-limiting examples, be suitable for providing an EM radiation-modifying layer 130.

Display Panel

Figure 7:
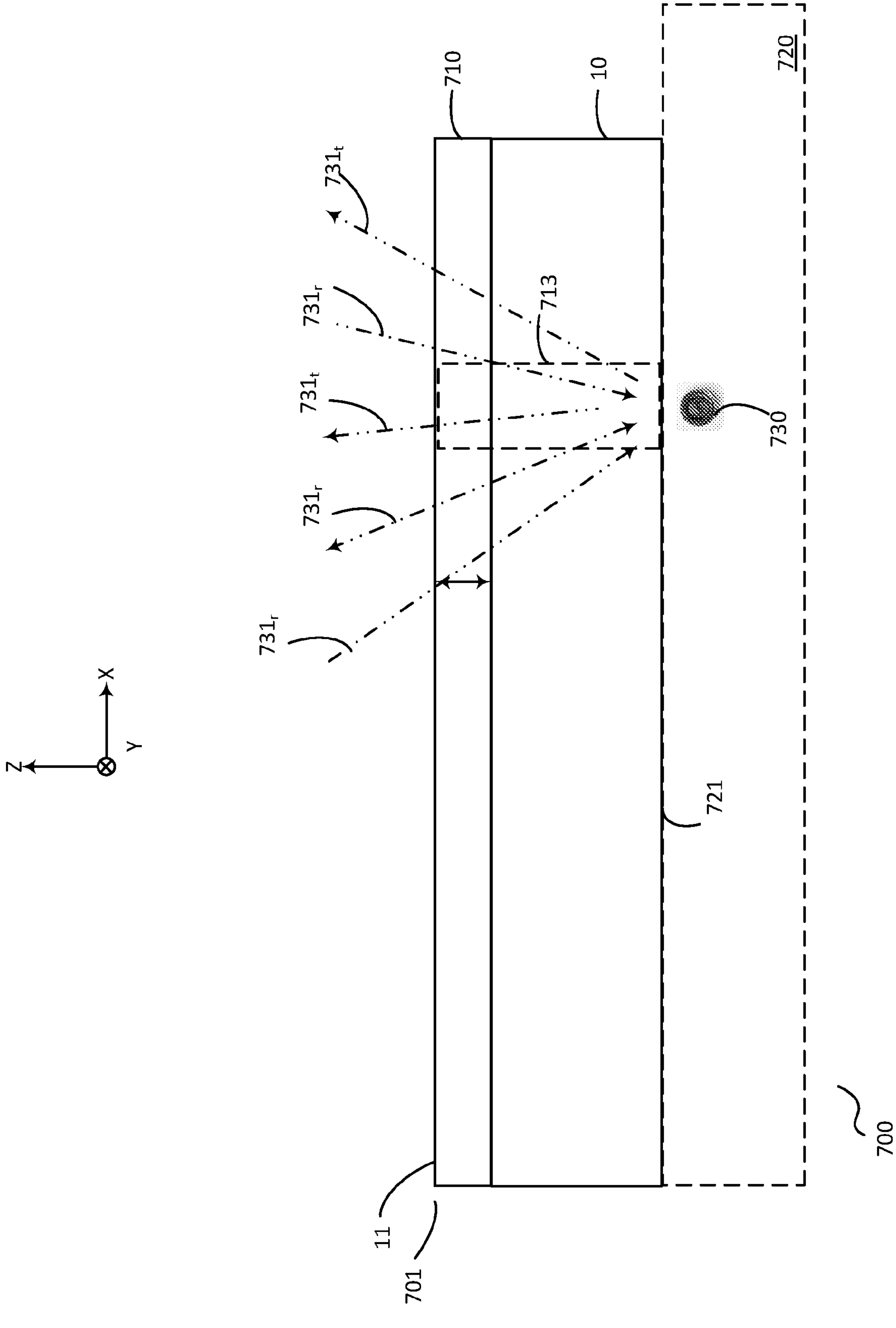
FIG. 7 is a schematic diagram illustrating an example cross-sectional view of an example user device having a display panel having a plurality of layers, comprising at least one aperture therewithin, according to an example in the present disclosure.

Turning now to FIG. 7, there is shown a cross-sectional view of a display panel 710. In some non-limiting examples, the display panel 710 may be a version of the layered semiconductor device 100, including without limitation, the opto-electronic device 700, culminating with an outermost layer that forms a face 701 thereof.

The face 701 of the display panel 710 may extend across a lateral aspect thereof, substantially along a plane defined by the lateral axes.

User Device

In some non-limiting examples, the face 701, and indeed, the entire display panel 710, may act as a face of a user device 700 through which at least one EM signal 731 may be exchanged therethrough at a non-zero angle relative to the plane of the face 701. In some non-limiting examples, the user device 700 may be a computing device, such as, without limitation, a smartphone, a tablet, a laptop, and/or an e-reader, and/or some other electronic device, such as a monitor, a television set, and/or a smart device, including without limitation, an automotive display and/or windshield, a household appliance, and/or a medical, commercial, and/or industrial device.

In some non-limiting examples, the face 701 may correspond to and/or mate with a body 720, and/or an opening 721 therewithin, within which at least one under-display component 730 may be housed.

In some non-limiting examples, the at least one under-display component 730 may be formed integrally, or as an assembled module, with the display panel 710 on a surface thereof opposite to the face 701. In some non-limiting examples, the at least one under-display component 730 may be formed on an exposed layer surface 11 of the substrate 10 of the display panel 710 opposite to the face 701.

In some non-limiting examples, at least one aperture 713 may be formed in the display panel 710 to allow for the exchange of at least one EM signal 731 through the face 701 of the display panel 710, at a non-zero angle to the plane defined by the lateral axes, or concomitantly, the layers of the display panel 710, including without limitation, the face 701 of the display panel 710.

In some non-limiting examples, the at least one aperture 713 may be understood to comprise the absence and/or reduction in thickness and/or opacity of a substantially opaque coating otherwise disposed across the display panel 710. In some non-limiting examples, the at least one aperture 713 may be embodied as a signal transmissive region 820 as described herein.

However, the at least one aperture 713 is embodied, the at least one EM signal 731 may pass therethrough such that it passes through the face 701. As a result, the at least one EM signal 731 may be considered to exclude any EM radiation that may extend along the plane defined by the lateral axes, including without limitation, any electric current that may be conducted across an EM radiation-modifying layer 130 laterally across the display panel 710.

Further, those having ordinary skill in the relevant art will appreciate that the at least one EM signal 731 may be differentiated from EM radiation per se, including without limitation, electric current, and/or an electric field generated thereby, in that the at least one EM signal 731 may convey, either alone, or in conjunction with other EM signals 731, some information content, including without limitation, an identifier by which the at least one EM signal 731 may be distinguished from other EM signals 731. In some non-limiting examples, the information content may be conveyed by specifying, altering, and/or modulating at least one of the wavelength, frequency, phase, timing, bandwidth, resistance, capacitance, impedance, conductance, and/or other characteristic of the at least one EM signal 731.

In some non-limiting examples, the at least one EM signal 731 passing through the at least one aperture 713 of the display panel 710 may comprise at least one photon and, in some non-limiting examples, may have a wavelength spectrum that lies, without limitation, within at least one of the visible spectrum, the IR spectrum, and/or the NIR spectrum. In some non-limiting examples, the at least one EM signal 731 passing through the at least one aperture 713 of the display panel 710 may have a wavelength that lies, without limitation, within the IR and/or NR spectrum.

In some non-limiting examples, the at least one EM signal 731 passing through the at least one aperture 713 of the display panel 710 may comprise ambient light incident thereon.

In some non-limiting examples, the at least one EM signal 731 exchanged through the at least one aperture 713 of the display panel 710 may be transmitted and/or received by the at least one under-display component 730.

In some non-limiting examples, the at least one under-display component 730 may have a size that is greater than a single signal transmissive region 820, but may underlie not only a plurality thereof but also at least one emissive region 910 extending therebetween. Similarly, in some non-limiting examples, the at least one under-display component 730 may have a size that is greater than a single one of the at least one aperture 713.

In some non-limiting examples, the at least one under-display component 730 may comprise a receiver $730_r$ adapted to receive and process at least one received EM signal $731_r$ passing through the at least one aperture 713 from beyond the user device 700. Non-limiting examples of such receiver $730_r$ include an under-display camera (UDC), and/or a sensor, including without limitation, an IR sensor or detector, an NIR sensor or detector, a LIDAR sensing module, a fingerprint sensing module, an optical sensing module, an IR (proximity) sensing module, an iris recognition sensing module, and/or a facial recognition sensing module, and/or a part thereof.

In some non-limiting examples, the at least one under-display component 730 may comprise a transmitter 7301 adapted to emit at least one transmitted EM signal $731_t$ passing through the at least one aperture 713 beyond the user device 700. Non-limiting examples of such transmitter 7301 include a source of EM radiation, including without limitation, a built-in flash, a flashlight, an IR emitter, and/or an NIR emitter, and/or a LIDAR sensing module, a fingerprint sensing module, an optical sensing module, an IR (proximity) sensing module, an iris recognition sensing module, and/or a facial recognition sensing module, and/or a part thereof.

In some non-limiting examples, the at least one EM signal 731 passing through the at least one aperture 713 of the display panel 710 beyond the user device 700, including without limitation, those transmitted EM signals $731_t$ emitted by the at least one under-display component 730 that comprises a transmitter $730_t$, may emanate from the display panel 710, and pass back as emitted EM signals $731_r$ through the at least one aperture 713 of the display panel 710 to at least one under-display component 730 that comprises a receiver $730_r$.

In some non-limiting examples, the under-display component 730 may comprise an IR emitter and an IR sensor. By way of non-limiting example, such under-display component 730 may comprise, as a part, component or module thereof: a dot matrix projector, a time-of-flight (ToF) sensor module, which may operate as a direct ToF and/or indirect ToF sensor, a vertical cavity surface-emitting laser (VCSEL), flood illuminator, NIR imager, folded optics, or a diffractive grating.

In some non-limiting examples, there may be a plurality of under-display components 730 within the user device 700, a first one of which comprises a transmitter 7301 for emitting at least one transmitted EM signal 731$_t$ to pass through the at least one aperture 713, beyond the user device 700, and a second one of which comprises a receiver 730$_r$, for receiving at least one received EM signal 731$_r$. In some non-limiting examples, such transmitter 7301 and receiver 730$_r$ may be embodied in a single, common under-display component 730.

Figure 8A:
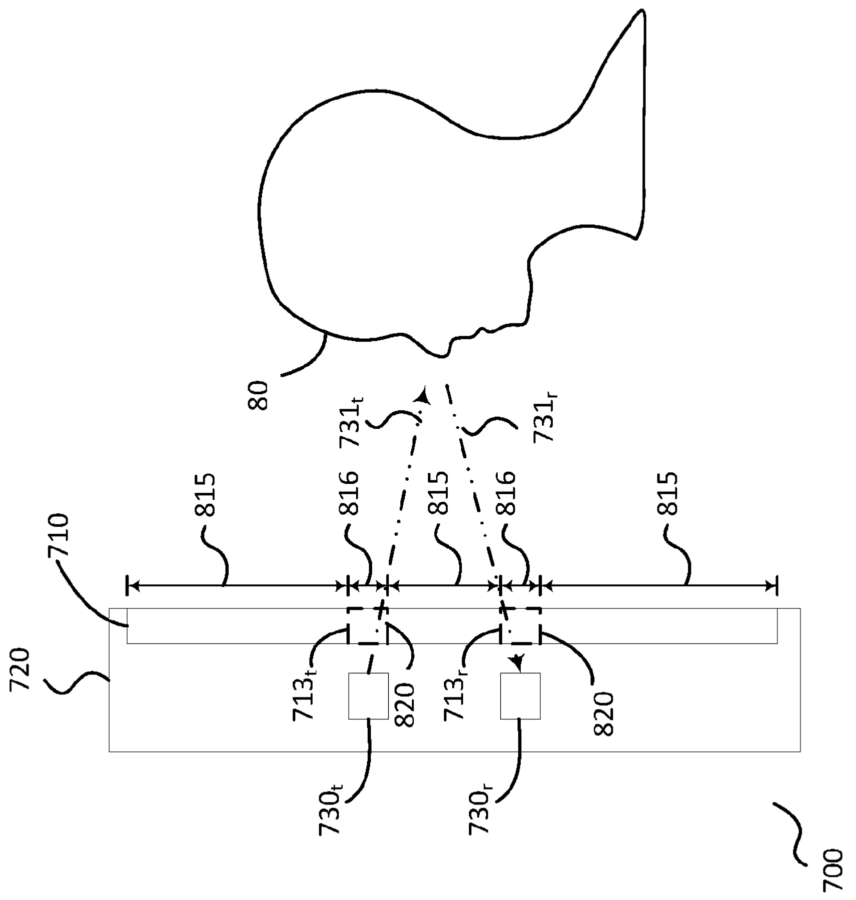
FIG. 8A is a schematic diagram illustrating use of the user device of FIG. 7, where the at least one aperture is embodied by at least one signal transmissive region, to exchange EM radiation in the IR and/or NIR spectrum for purposes of biometric authentication of a user, according to an example in the present disclosure.

This may be seen by way of non-limiting example in FIG. 8A, in which a version of the user device 700 is shown as having a display panel 710 that comprises, in a lateral aspect thereof (shown vertically in the figure), at least one display part 815 adjacent and in some non-limiting examples, separated by at least one signal-exchanging display part 816. The user device 700 houses at least one transmitter 7301 for transmitting at least one transmitted EM signal 731$_t$ through at least one first signal transmissive region 820 in, and in some non-limiting examples, substantially corresponding to, the first signal-exchanging display part 816 beyond the face 701, as well as a receiver 730$_r$ for receiving at least one received EM signal 731$_r$, through at least one second signal transmissive region 820 in, and in some non-limiting examples, substantially corresponding to, the second signal-exchanging display part 816. In some non-limiting examples, the at least one first and second signal-exchanging display part 816 may be the same.

Figure 8C:
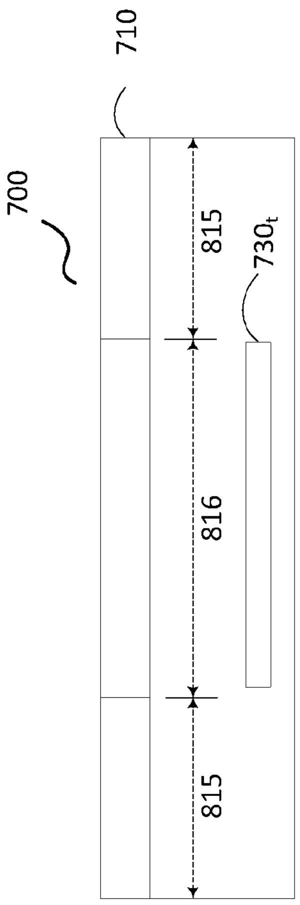
FIG. 8C shows the cross-sectional view taken along the line 8C-8C of the device shown in FIG. 8B.
Figure 8B:
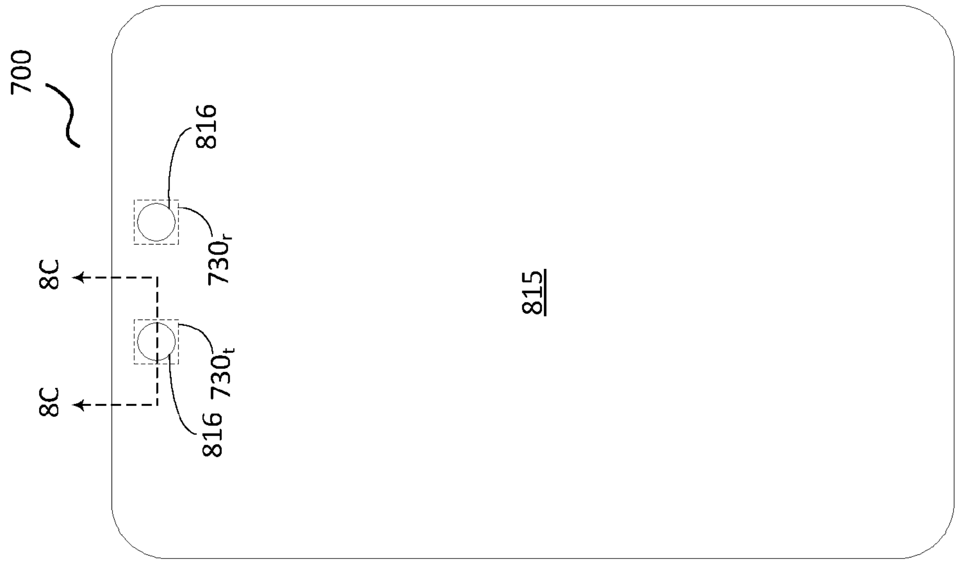
FIG. 8B is a plan view of the user device of FIG. 7 which includes a display panel, according to an example in the present disclosure.

FIG. 8B, which shows a version of the user device 700 in plan according to a non-limiting example, which includes a display panel 710 defining a face of the device 700. The device 700 houses the least one transmitter 7301 and the at least one receiver 730$_r$ arranged beyond the face 701. FIG. 8C shows the cross-sectional view taken along the line 8C-8C of the device 700.

The display panel 710 includes a display part 815 and a signal-exchanging display part 816. The display part 815 includes a plurality of emissive regions 910 (not shown). The signal-exchanging display part 816 includes a plurality of emissive regions 910 (FIG. 9A) (not shown) and a plurality of signal transmissive regions 820. The plurality of emissive regions 910 in the display part 815 and the signal-exchanging display part 816 may correspond to sub-pixels 264*x* of the display panel 710. The plurality of signal transmissive regions 820 in the signal-exchanging display part 816 may be configured to allow EM signals having a wavelength (range) corresponding to the IR spectrum to pass through the entirety of a cross-sectional aspect thereof. The at least one transmitter 7301 and the at least one receiver 730$_r$ may be arranged behind the corresponding signal-exchanging display part 816, such that IR signals may be emitted and received, respectively, by passing through the signal-exchanging display part 816 of the panel 710. In the illustrated non-limiting example, each of the at least one transmitter 7301 and the at least one receiver 730$_r$ is shown as having a corresponding signal-exchanging display part 816 disposed in the path of the signal transmission.

Figure 8E:
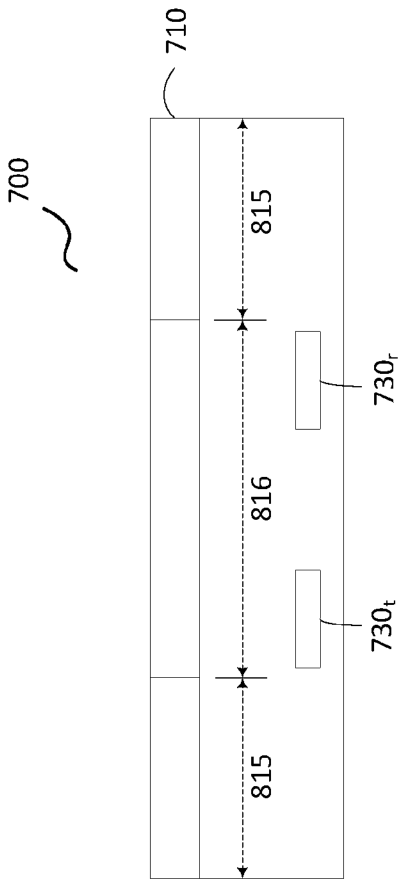
FIG. 8E shows the cross-sectional view taken along the line 8E-8E of the device shown in FIG. 8D.
Figure 8D:
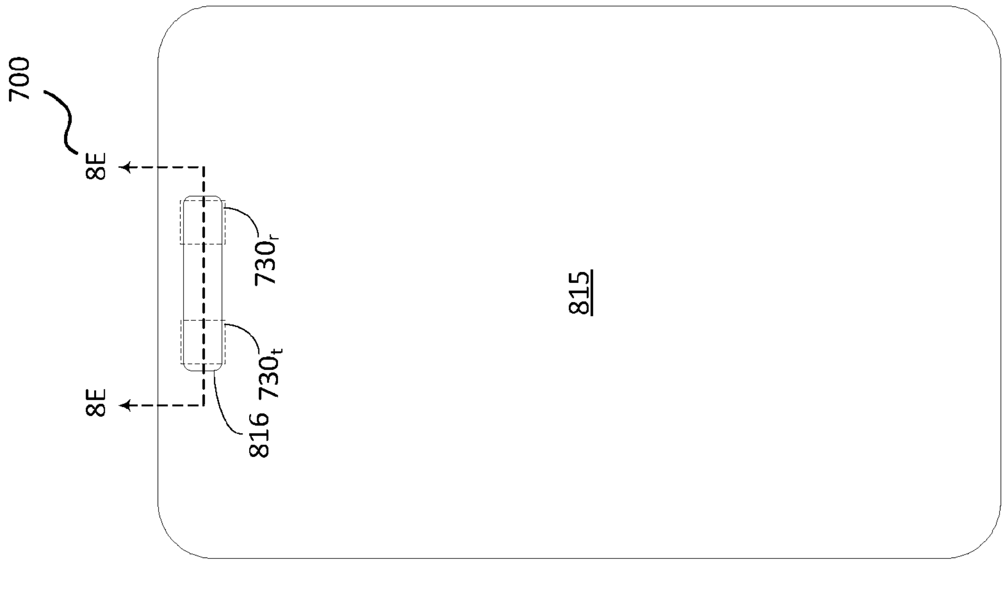
FIG. 8D is a plan view of the user device of FIG. 7 which includes a display panel, according to an example in the present disclosure.
Figure 8G:
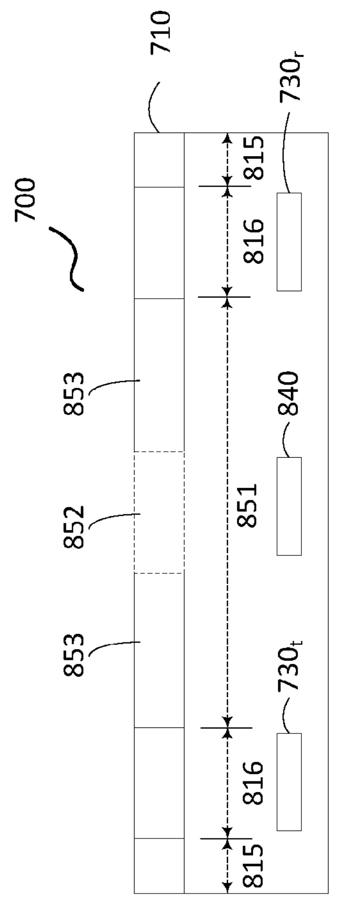
FIG. 8G shows the cross-sectional view taken along the line 8G-8G of the device shown in FIG. 8F.

FIG. 8D shows a version of the user device 700 in plan according to a non-limiting example, wherein at least one transmitter 730$_t$ and the at least one receiver 730$_r$ are both arranged behind a common signal-exchanging display part 816. By way of non-limiting example, the signal-exchanging display part 816 may be elongated along at least one configuration axis in the plan view, such that it extends over both the transmitter 730$_t$ and the receiver 730$_r$. FIG. 8E shows a cross-sectional view taken along the line 8E-8E in FIG. 8D.

Figure 8F:
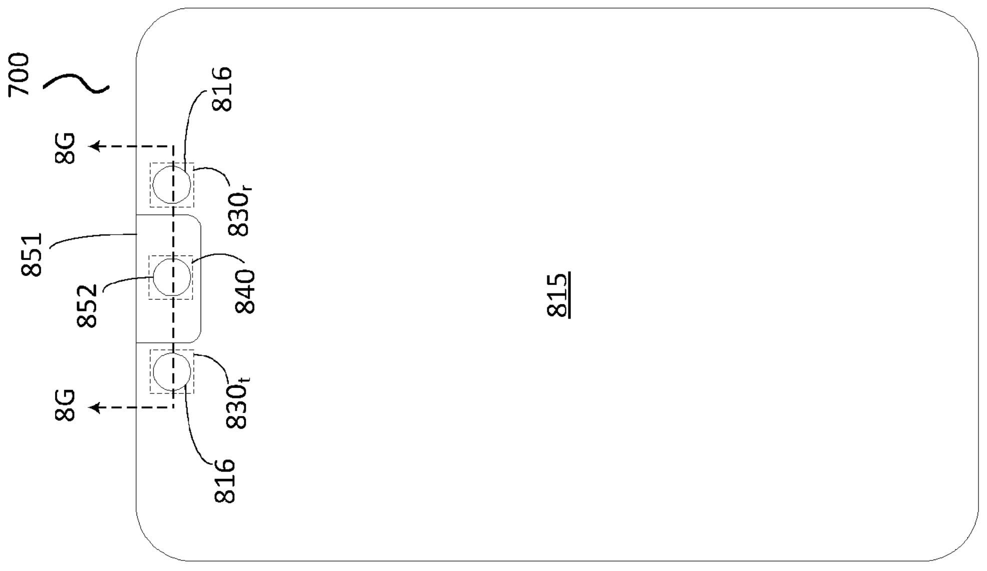
FIG. 8F is a plan view of the user device of FIG. 7 which includes a display panel, according to an example in the present disclosure.

FIG. 8F shows a version of the user device 700 in plan according to a non-limiting example, wherein the display panel 710 further includes a non-display part 851. In some non-limiting examples, the display panel 710 may include the at least one transmitter 7301 and the at least one receiver 730$_r$, each of which may be arranged behind the corresponding signal-exchanging display part 816. The non-display part 851 may be arranged, in plan, adjacent to, and between, the two signal-exchanging display parts 816. The non-display part 851 may be substantially devoid of any emissive regions 910. In some non-limiting examples, the device 700 may house a camera 840 arranged in the non-display part 851. In some non-limiting examples, the non-display part 851 may include a through-hole part 852 which may be arranged to overlap with the camera 840. In some non-limiting examples, the panel 710 in the through-hole part 852 may be substantially devoid of any layers, coatings, and/or components which may be present in the display part 815 and/or the signal-exchanging display part 816. By way of non-limiting example, the panel 710 in the through-hole part 852 may be substantially devoid of any backplane and/or frontplane components, the presence of which may otherwise interfere with an image captured by the camera 840. In some non-limiting examples, cover glass of the panel 710 may extend substantially across the display part 815, the signal-exchanging display part 816, and the through-hole part 852 such that it may be present in all of the foregoing parts of the panel 710. In some non-limiting examples, the panel 710 may further include a polarizer (not shown), which may extend substantially across the display part 815, the signal-exchanging display part 816, and the through-hole part 852 such that it may be present in all of the foregoing parts of the panel 710. In some non-limiting examples, the through-hole part 852 may be substantially devoid of a polarizer in order to enhance the transmission of light through such part of the panel 710.

In some non-limiting examples, the non-display part 851 of the panel 710 may further include a non-through-hole part 853. By way of non-limiting example, the non-through-hole part 853 may be arranged between the through-hole part 852 and the signal-exchanging display part 816 in a lateral aspect. In some non-limiting examples, the non-through-hole part 853 may surround at least a part, or the entirety, of a perimeter of the through-hole part 852. While not specifically shown, the device 700 may comprise additional modules, components, and/or sensors in the part of the device 700 corresponding to the non-through-hole part 853 of the display panel 710.

In some non-limiting examples, the signal-exchanging display part 816 may have a reduced number of, or be substantially devoid of, backplane components that would otherwise hinder or reduce transmission of EM radiation through the signal-exchanging display part 816. By way of non-limiting example, the signal-exchanging display part 816 may be substantially devoid of TFT structures 901, including but not limited to: metal trace lines, capacitors, and/or other opaque or light-absorbing elements. In some non-limiting examples, the emissive regions 910 in the signal-exchanging display part 816 may be electrically coupled with one or more TFT structures 901 located in the non-through-hole part 853 of the non-display part 851. Specifically, the TFT structures 901 for actuating the subpixels 264$x$ in the signal-exchanging display part 816 may be relocated outside of the signal-exchanging display part 816 and within the non-through-hole part 853 of the panel 710, such that a relatively high transmission of EM radiation, at least in the IR spectrum and/or NIR spectrum, through the non-emissive regions 2302 (not shown) within the signal-exchanging display part 816 may be attained. By way of non-limiting example, the TFT structures 901 in the non-through-hole part 853 may be electrically coupled with sub-pixels 264$x$ in the signal-exchanging display part 816 via conductive trace(s). In some non-limiting examples, the transmitter 7301 and the receiver 730$_r$ are arranged adjacent, and/or proximate, to the non-through-hole part 853 in the lateral aspect, such that a distance over which current travels between the TFT structures 901 and the sub-pixels 264$x$ may be reduced.

In some non-limiting examples, the emissive regions 910 may be configured such that at least one of an aperture ratio and a pixel density of thereof may be the same within both the display part 815 and the signal-exchanging display part 816. In some non-limiting examples, the pixel density may be greater than at least one of about: 300 ppi, 350 ppi, 400 ppi, 450 ppi, 500 ppi, 550 ppi, or 600 ppi. In some non-limiting examples, the aperture ratio may be at least one of at least about: 25%, 27%, 30%, 33%, 35%, or 40%. In some non-limiting examples, the emissive regions 910 or pixels 264$x$ of the panel 710 may be substantially identically shaped and arranged between the display part 815 and the signal-exchanging display part 816 to reduce the likelihood of a user detecting visual differences between the display part 815 and the signal-exchanging display part 816 of the panel 710.

Figure 8H:
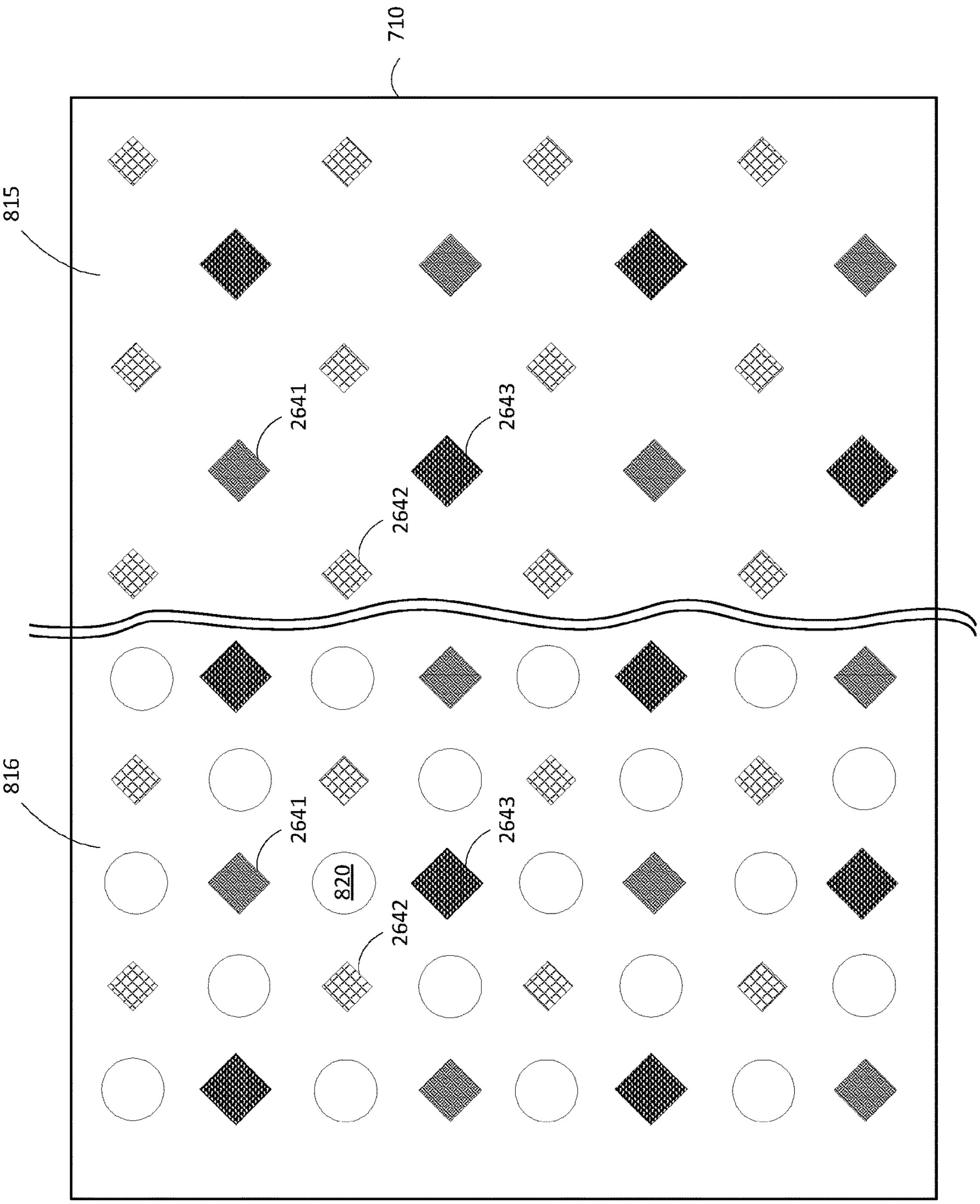
FIG. 8H shows a magnified plan view of portions of the panel according to an example in the present disclosure.

FIG. 8H shows a magnified view, partially cut-away, of parts of the panel 710 in plan, according to a non-limiting example. Specifically, the configuration and layout of emissive regions 910, represented as subpixels 264$x$, in the display part 815 and the signal-exchanging display part 816 is shown. In each part, a plurality of emissive regions 910 may be provided, each corresponding to a sub-pixel 264$x$. In some non-limiting examples, the sub-pixels 264$x$ may correspond to, respectively, R(ed) sub-pixels 2641, G(reen) sub-pixels 2642 and/or B(lue) sub-pixels 2643. In the signal-exchanging display part 816, a plurality of signal transmissive regions 820 may be provided between adjacent sub-pixels 264$x$.

In some non-limiting examples, the display panel 710 may further include a transition region (not shown) between the display part 815 and the signal-exchanging display part 816 wherein the configuration of the emissive regions 910 and/or signal transmissive regions 820 may differ from those of the adjacent display part 815 and/or the signal-exchanging display part 816. In some non-limiting examples, the presence of such transition region may be omitted such that the emissive regions 910 are provided in a substantially continuous repeating pattern across the display part 815 and the signal-exchanging display part 816.

Turning now to FIG. 9A, which is a simplified block diagram of an example version 900$_a$ of the user device 700, although not shown, in some non-limiting examples, a thickness of pixel definition layers (PDLs) 940 in the at least one signal transmissive region 820, in some non-limiting examples, at least in a region laterally spaced apart from neighbouring emissive regions 910, and in some non-limiting examples, of the TFT insulating layer 909, may be reduced in order to enhance a transmittivity and/or a transmittivity angle relative to and through the layers of the face 701.

In some non-limiting examples, a lateral aspect 2010 (FIG. 20) of at least one emissive region 910 may extend across and include at least one TFT structure 901 associated therewith for driving the emissive region 910 along data and/or scan lines (not shown), which, in some non-limiting examples, may be formed of copper (Cu) and/or a transparent conducting oxide (TCO).

In some non-limiting examples, the at least one received EM signal 731$_r$ includes at least a fragment of the at least one transmitted EM signal 731$_t$, which is reflected off, or otherwise returned by, an external surface to the user device 700.

Referring once again to FIG. 8A, in some non-limiting examples, the user device 700 may be configured to cause the at least one transmitter 730$_t$ to emit the at least one transmitted EM signal 731$_t$ and pass through the display panel 710 such that it is incident on a face, profile or other part of a user 80 of the user device 700. A fragment of the at least one transmitted EM signal 731$_t$ incident upon the user 80 is reflected off, or otherwise returned by, the user 80 to generate the at least one received EM signal 731$_r$, which in turn passes through the display panel 710 such that it is received and/or detected by the at least one receiver 730$_r$.

In some non-limiting examples, by causing the at least one transmitter 730$_t$ to generate at least one transmitted EM signal 731$_t$ to be reflected off the user to generate the at least one received EM signal 731$_r$ associated therewith (collectively an EM signal pair 731), which is detected by the at least one receiver 730$_r$, thereby providing biometric authentication of the user 80.

In some non-limiting examples, the at least one transmitter 730$_t$ may be an IR emitter for emitting at least one EM signal 731, having a wavelength range in the IR spectrum and/or the NIR spectrum, as the at least one transmitted IR signal 731$_t$. In some non-limiting examples, the at least one receiver 730$_r$ may be an IR sensor for receiving at least one EM signal 731, having a wavelength in the IR spectrum and/or the NIR spectrum, as the at least one received IR signal 731$_r$.

In some non-limiting examples, the signal transmissive regions 820 of the display panel 710 may be arranged in an array, and the at least one transmitter 730$_t$ and/or the at least one receiver 730$_r$ may be positioned within the user device 700 behind the display panel 710 such that at least one EM signal pair 731 associated therewith is configured to pass through at least one signal transmissive region 820 of the display panel 710.

In some non-limiting examples, the at least one transmitter 7301 and the at least one receiver 730$_r$ may be positioned to allow the at least one EM signal pair 731 associated therewith to pass through a common signal transmissive region 820. In some non-limiting examples, the at least one transmitter 7301 and the at least one receiver 730$_r$ may be positioned to allow the at least one EM signal pair 731 associated therewith to pass through different signal transmissive regions 820.

As shown in FIG. 9A, in the display panel 710, at least one emissive region 910 may have associated therewith, a second portion 602 of the lateral aspect of the display panel 710, in which an exposed layer surface 11 of an underlying layer thereof may have deposited thereon, a closed coating 1240 of the deposited material 1631.

In the display panel 710, at least one signal transmissive region 820 may have associated therewith, a first portion 601 of the lateral aspect of the display panel 710, in which an EM layer patterning coating 420$_e$ may be disposed on an exposed layer surface 11 of an underlying layer, and the exposed layer surface 11 of which, has disposed thereon, an EM radiation-modifying layer 130 comprising a discontinuous layer 160 of at least one particle structure 131$_r$.

In some non-limiting examples, the at least one signal transmissive region 820 may be substantially devoid of a closed coating 1240 of the deposited material 1631.

In some non-limiting examples, the at least one signal transmissive region 820 may facilitate EM radiation absorption therein in at least a wavelength range of the visible spectrum, while allowing EM radiation therethrough in at least a wavelength range of the IR spectrum.

This may allow the at least one transmitted IR signal 731$_t$ and the at least one received IR signal 731$_r$ to be transmitted therethrough, at least to the extent that they lie in the IR spectrum, while absorbing at least a part of these (or other) EM signals 731 to the extent that they lie in the visible spectrum, including EM signals 731 (not shown) in at least a wavelength range of the visible spectrum that may be incident from an external source upon the display panel 710.

In this way, the presence of the IR emitter 730$_t$ and the IR detector 730$_r$ may at least partially be concealed from the user 80 without substantially impeding the at least one transmitted IR signal 731$_t$ and the at least one received IR signal 731$_r$ from being transmitted through the display panel 710, including without limitation, to provide biometric authentication of the user 80.

Such configuration of the display panel 710 may be advantageous, for example to allow the IR emitter 730$_t$ and/or the IR detector 730$_r$ to be positioned within the user device 700 and the at least one signal transmissive regions 820 to be positioned within the lateral extent of the display panel 710, without substantially detracting from the user experience, and/or to facilitate concealment of the IR emitter 730$_t$ and/or the IR detector 730$_r$ from the user 80.

Those having ordinary skill in the relevant art will appreciate that, in some non-limiting examples, the at least one under-display component 730, including without limitation, the IR emitter 730$_t$ and/or the IR detector 730$_r$, may be of a size so as to underlie not only a single signal transmissive region 820, but a plurality of signal transmissive regions 820, and/or at least one emissive region 910 extending therebetween. In such examples, the at least one under-display component 730 may be positioned under such plurality of signal transmissive regions 820 and may exchange EM signals 731 passing at a non-zero angle relative to and through the layers of the display panel 710 through such plurality of signal transmissive regions 820.

In some non-limiting examples, in at least a part of the emissive region 910, the at least one semiconducting layer 1930 may be deposited over the exposed layer surface 11 of the face 701, which in some non-limiting examples, comprise the first electrode 1920.

In some non-limiting examples, the exposed layer surface 11 of the face 701, which may, in some non-limiting examples, comprise the at least one semiconducting layer 1930, may be exposed to an evaporated flux 1512 (FIG. 15) of the patterning material 1511, including without limitation, using a shadow mask 1515, to form a patterning coating 420 in the first portion 601. Whether or not a shadow mask 1515 is employed, the patterning coating 420 may be restricted, in its lateral aspect, substantially to the signal transmissive region(s) 820.

In some non-limiting examples, the exposed layer surface 11 of the face 701 may be exposed to a vapor flux 1632 of the deposited material 1631, including without limitation, in an open mask and/or mask-free deposition process.

In some non-limiting examples, the exposed layer surface 11 of the face 701 within the lateral aspect 2020 of the at least one signal transmissive region 820, may comprise the patterning coating 420. Accordingly, within the lateral aspect 2020 of the at least one signal transmissive region(s) 820, the vapor flux 1632 of the deposited material 1631 incident on the exposed layer surface 11, may form at least one particle structure 131$_t$, on the exposed layer surface 11 of the patterning coating 420, as the EM radiation-modifying layer 130. In some non-limiting examples, a surface coverage of the EM radiation-modifying layer 130 may be no more than at least one of about: 70%, 60%, 50%, 40%, 30%, 25%, 20%, 15%, or 10%.

At the same time, because the patterning coating 420 has been restricted, in its lateral aspect, substantially to the non-emissive regions 2302, in some non-limiting examples, the exposed layer surface 11 of the face 710 within the lateral aspect 2010 of the emissive region(s) 910 may comprise the at least one semiconducting layer 1930. Accordingly, within the second portion 602 of the lateral aspect 2010 of the at least one emissive region 910, the vapor flux 1632 of the deposited material 1631 incident on the exposed layer surface 11, may form a closed coating 1240 of the deposited material 1631 as the second electrode 1940.

Thus, in some non-limiting examples, the patterning coating 420 may serve dual purposes, namely as an EM layer patterning coating 420$_e$ to provide a base for the deposition of the EM layer radiation-modifying layer 130 in the first portion 601, and as a non-EM layer patterning coating 420$_n$ to restrict the lateral extent of the deposition of the deposited material 1631 as the second electrode 1940 to the second portion 602, without employing a shadow mask 1515 during the deposition of the deposited material 1631.

In some non-limiting examples, an average film thickness of the closed coating 1240 of the deposited material 1631 may be at least one of at least about: 5 nm, 6 nm, or 8 nm. In some non-limiting examples, the deposited material 1631 may comprise MgAg.

In some non-limiting examples, the second electrode 1920 may extend partially over the patterning coating 420 in a transition region 925.

Details of the EM Radiation-Modifying Layer

In some non-limiting examples, the EM radiation-modifying layer 130 may comprise at least one particle structure 131$_t$ deposited over the EM layer patterning coating 420$_e$, including without limitation, using a mask-free and/or open mask deposition process.

Without wishing to be limited to any particular theory, it may be postulated that, while the formation of a closed coating 1240 of the deposited material 1631 thereon may be substantially inhibited on the EM layer patterning coating 420$_e$, in some non-limiting examples, when the EM layer patterning coating 420$_e$ is exposed to deposition of the deposited material 1631 thereon, some vapor monomers 1632 of the deposited material 1631 may ultimately form at least one particle structure 131$_t$ of the deposited material 1631 thereon.

Accordingly, the EM radiation-modifying layer 130 may comprise, in some non-limiting examples, a discontinuous layer 160, in some non-limiting examples, that comprises at least one particle structure 131$_t$ of the deposited material 1631. In some non-limiting examples, at least some of the particle structures 131$_t$ may be disconnected from one another. In other words, in some non-limiting examples, the discontinuous coating 130 may comprise features, including particle structures 131$_t$, that may be physically separated from one another, such that the EM radiation-modifying layer 130 does not form a closed coating 1240.

Such EM radiation-modifying layer 130 may, in some non-limiting examples, thus comprise a thin disperse layer of deposited material 1631 formed as particle structures 131$_t$, inserted at, and substantially across the lateral extent of, an interface between the EM layer patterning coating 420$_e$ and at least one covering layer 915 in the display panel 710.

In some non-limiting examples, at least one of the particle structures 131$_t$ of deposited material 1631 in the EM radiation-modifying layer 130 may be in physical contact with an exposed layer surface 11 of the EM layer patterning coating 420$_e$. In some non-limiting examples, substantially all of the particle structures 131$_t$ of deposited material 1631 in the EM radiation-modifying layer 130, may be in physical contact with the exposed layer surface 11 of the EM layer patterning coating 420$_e$.

Without wishing to be bound by any particular theory, it has been found, somewhat surprisingly, that the presence of such a thin, disperse EM radiation-modifying layer 130 of deposited material 1631, including without limitation, at least one particle structure 131$_t$, including without limitation metal particle structures 131$_t$, including without limitation, in a discontinuous layer 160, on an exposed layer surface 11 of the EM layer patterning coating 420$_e$, may exhibit one or more varied characteristics and concomitantly, varied behaviors, including without limitation, optical effects and properties of the display panel 710, as discussed herein. In some non-limiting examples, such effects and properties may be controlled to some extent by judicious selection of at least one of: the characteristic size, size distribution, shape, surface coverage, configuration, deposited density, and/or dispersity of the particle structures 131$_t$ on the EM layer patterning coating 420$_e$.

In some non-limiting examples, the formation of at least one of: the characteristic size, size distribution, shape, surface coverage, configuration, deposited density, and/or dispersity of such EM radiation-modifying layer 130 may be controlled, in some non-limiting examples, by judicious selection of at least one of: at least one characteristic of the patterning material 1511, an average film thickness of the EM layer patterning coating 420$_e$, the introduction of heterogeneities in the EM layer patterning coating 420$_e$, and/or a deposition environment, including without limitation, a temperature, pressure, duration, deposition rate, and/or deposition process for the patterning material 1511 of the EM layer patterning coating 420$_e$.

In some non-limiting examples, the formation of at least one of the characteristic size, size distribution, shape, surface coverage, configuration, deposited density, and/or dispersity of such EM radiation-modifying layer 130 may be controlled, in some non-limiting examples, by judicious selection of at least one of: at least one characteristic of the deposited material 1631, an extent to which the EM layer patterning coating 420$_e$ may be exposed to deposition of the deposited material 1631 (which, in some non-limiting examples may be specified in terms of a thickness of the corresponding discontinuous layer 160), and/or a deposition environment, including without limitation, a temperature, pressure, duration, deposition rate, and/or method of deposition for the deposited material 1631.

In some non-limiting examples, the at least one particle structures 131$_t$ of the EM radiation-modifying layer 130 may be provided such that they exhibit greater absorption in at least a wavelength sub-range of the visible spectrum than in the IR and/or NIR spectrum. In some non-limiting examples, the at least one particle structures 131$_t$ of the EM radiation-modifying layer 130 may be provided such that they absorb EM radiation in at least a wavelength sub-range of the visible spectrum and do not substantially absorb EM radiation in the IR and/or NIR spectrum.

In some non-limiting examples, the EM radiation-modifying layer 130 of deposited material 1631, including without limitation, at least one particle structure 131$_t$, may comprise, and/or act as, a UVA-absorbing coating 130 that may generally absorb EM radiation in the UVA spectrum.

In some non-limiting examples, there may be a benefit to provide such a UVA-absorbing coating 130 to reduce and/or mitigate transmission of UVA radiation through the display panel 710. By way of non-limiting example, the presence of such UVA-absorbing coating 130 may enhance an image quality captured by an under-display component 730 through the display panel 710, by reducing interference caused by UVA radiation.

In some non-limiting examples, the EM radiation-modifying layer 130 may absorb EM radiation in at least a part of the UV spectrum and at least a part of the visible spectrum, while exhibiting reduced and/or substantially no absorption of EM radiation in the IR and/or NIR spectrum.

In some non-limiting examples, the optical effects may be described in terms of its impact on the transmission, and/or absorption wavelength spectrum, including a wavelength range, and/or peak intensity thereof.

Additionally, while the model presented may suggest certain effects imparted on the transmission, and/or absorption of EM radiation passing through such EM radiation-modifying layer 130, in some non-limiting examples, such effects may reflect local effects that may not be reflected on a broad, observable basis.

In some non-limiting examples, the characteristic size of the particle structures 131$_t$ in (an observation window used, of) the EM radiation-modifying layer 130 may reflect a statistical distribution.

In some non-limiting examples, an absorption spectrum intensity may tend to be proportional to a deposited density of the EM radiation-modifying layer 130, for a particular distribution of the characteristic size of the particle structures 131$_t$.

In some non-limiting examples, the characteristic size of the particle structures 131$_t$ in (an observation window used, of) the EM radiation-modifying layer 130, may be concentrated about a single value, and/or in a relatively narrow range.

In some non-limiting examples, the characteristic size of the particle structures 131$_t$ in (an observation window used, of) the EM radiation-modifying layer 130, may be concentrated about a plurality of values, and/or in a plurality of relatively narrow ranges. By way of non-limiting example, the particle structures of the EM radiation-modifying layer 130, may exhibit such multi-modal behavior in which there are a plurality of different values and/or ranges about which the characteristic size of the particle structures 131$_t$ in (an observation window used, of) the EM radiation-modifying layer 130, may be concentrated.

In some non-limiting examples, the EM radiation-modifying layer 130 may comprise a first at least one particle structure 131$_1$, having a first range of characteristic sizes, and a second at least one particle structure 131$_2$, having a second range of characteristic sizes. In some non-limiting examples, the first range of characteristic sizes may correspond to sizes of no more than about 50 nm, and the second range of characteristic sizes may correspond to sizes of at least 50 nm. By way of non-limiting example, the first range of characteristic sizes may correspond to sizes of between about 1-49 nm and the second range of characteristic sizes may correspond to sizes of between about 50-300 nm. In some non-limiting examples, a majority of the first particle structures 131$_1$ may have a characteristic size in a range of at least one of between about: 10-40 nm, 5-30 nm, nm, 15-35 nm, 20-35 nm, or 25-35 nm. In some non-limiting examples, a majority of the second particle structures 131$_2$ may have a characteristic size in a range of at least one of between about: 50-250 nm, 50-200 nm, 60-150 nm, 60-100 nm, or 60-90 nm. In some non-limiting examples, the first particle structures 131$_1$ and the second particle structures 131$_2$ may be interspersed with one another.

A series of five samples was fabricated to study the formation of such multi-modal particle structures 131. Each sample was prepared by depositing, on a glass substrate, an approximately 20 nm thick organic semiconducting layer 1930, followed by an approximately 34 nm thick Ag layer, followed by an approximately nm thick EM layer patterning coating 420$_e$, then subjecting the surface of the EM layer patterning coating 420$_e$ to a vapor flux 1632 of Ag. SEM images of each sample were taken at various magnifications.

Figure 10A:
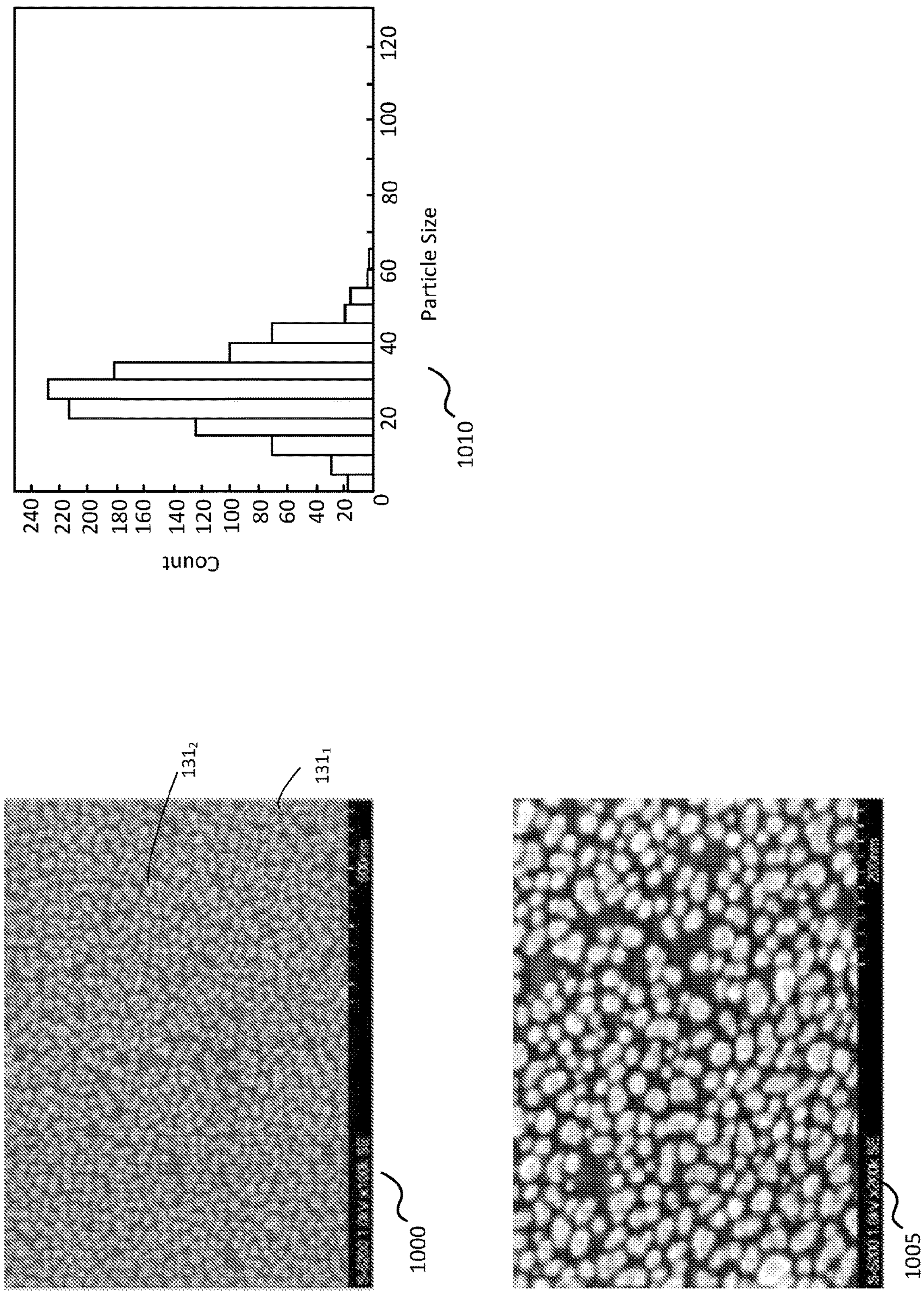
FIGS. 10A-10E each show multiple SEM images of example samples according to an example in the present disclosure, together with a plot of a distribution of a number of particles of various characteristic sizes therein.

FIG. 10A shows a SEM image 1000 of a first sample and a further SEM image 1005 at increased magnification. As may be seen from the image 1000, there are a number of first particle structures 131$_1$ that may tend to be concentrated about a first, small, characteristic size, and a smaller number of second particle structures 131$_2$ that may tend to be concentrated about a second, larger, characteristic size. A plot 1010, of a count of particle structures 131$_t$ as a function of characteristic particle size, may show that a majority of the first particle structures 131$_1$ may be concentrated around about 30 nm. Analysis shows that a surface coverage of the observation window of the image 1000, of the first particle structures 131$_1$ having a characteristic size that is no more than about 50 nm was about 38%, whereas a surface coverage of the observation window of the image 1000, of the second particle structures 131$_2$, having a characteristic size that is at least about 50 nm was about 1%.

Figure 10B:
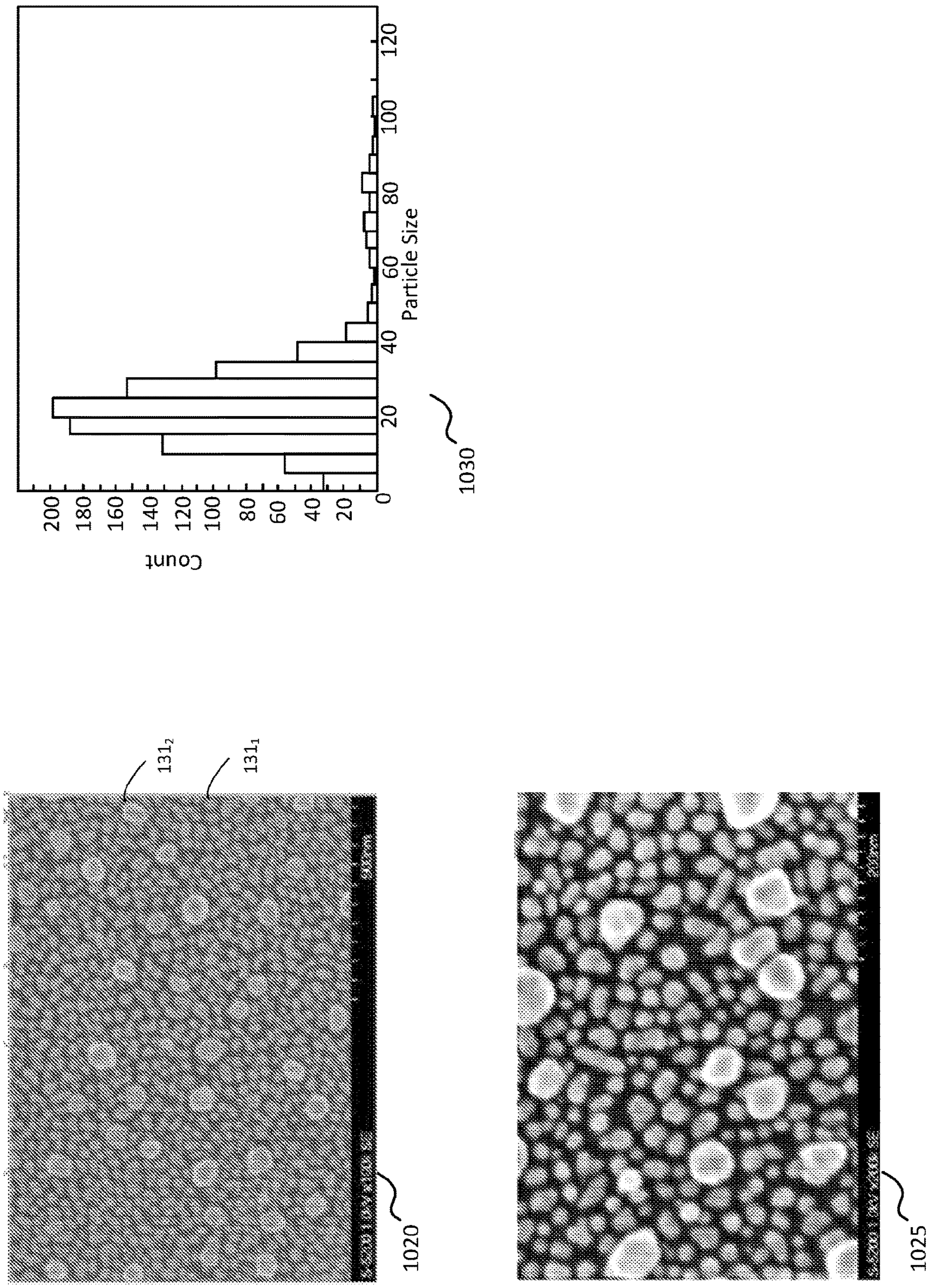

FIG. 10B shows a SEM image 1020 of a second sample and a further SEM image 1025 at increased magnification. As may be seen from the image 1020, while there continue to be a number of first particle structures 131$_1$ that may tend to be concentrated about the first characteristic size, a number of second particle structures 131$_2$ that may tend to be concentrated about the second characteristic size may be greater. Further, such second particle structures 131$_2$ may tend to be more noticeable. A plot 1030, of a count of particle structures 131$_t$ as a function of characteristic particle size, may show two discernible peaks, a large peak of first particle structures 131$_1$ concentrated around about 30 nm and a smaller peak of second particles 131$_2$ concentrated around about 75 nm. Analysis shows that a surface coverage of the observation window of the image 1020, of the first particle structures 131$_1$ having a characteristic size that is no more than about nm was about 23%, whereas a surface coverage of the observation window of the image 1020, of the second particle structures 131$_2$ having a characteristic size that is at least about 50 nm was about 10%.

Figure 10C:
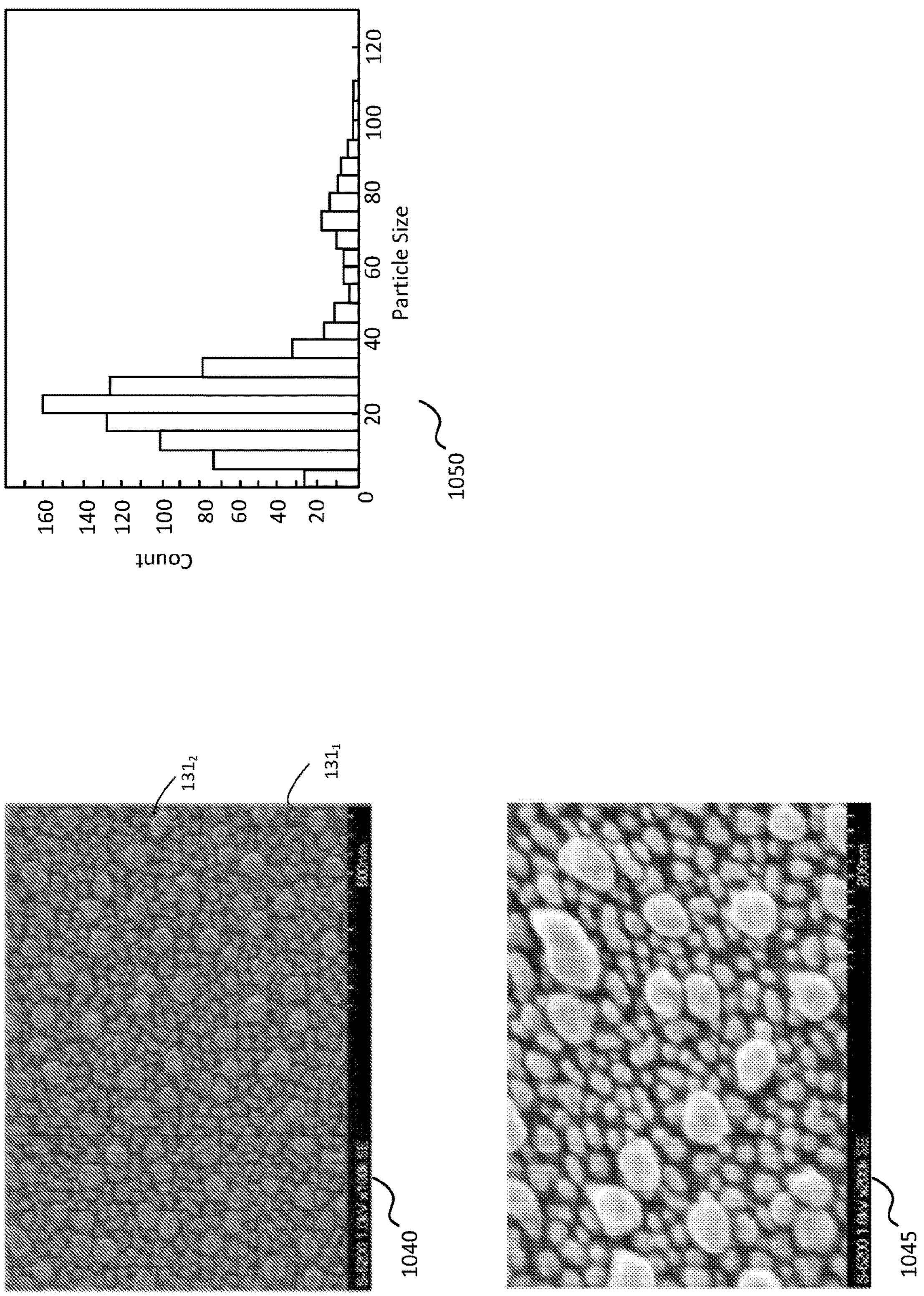

FIG. 10C shows a SEM image 1040 of a third sample and a further SEM image 1045 at increased magnification. As may be seen from the image 1040, while there continue to be a number of first particle structures 131$_1$ that may tend to be concentrated about the first characteristic size, a number of second particle structures 131$_2$ that may tend to be concentrated about the second characteristic size may be even greater than in the second sample A plot 1050, of a count of particle structures 131$_t$ as a function of characteristic particle size, may show two discernible peaks, a large peak of first particle structures 131$_1$ concentrated around about 30 nm, and a smaller (but larger than shown in the plot 1030) peak of second particle structures 131$_2$ concentrated around about 75 nm. Analysis shows that a surface coverage of the observation window of the image 1040, of the first particle structures 131$_1$ having a characteristic size that is no more than about 50 nm was about 19%, whereas a surface coverage of the observation window of the image 1040, of the second particle structures 131$_2$ having a characteristic size that is at least about 50 nm was about 21%.

Figure 10D:
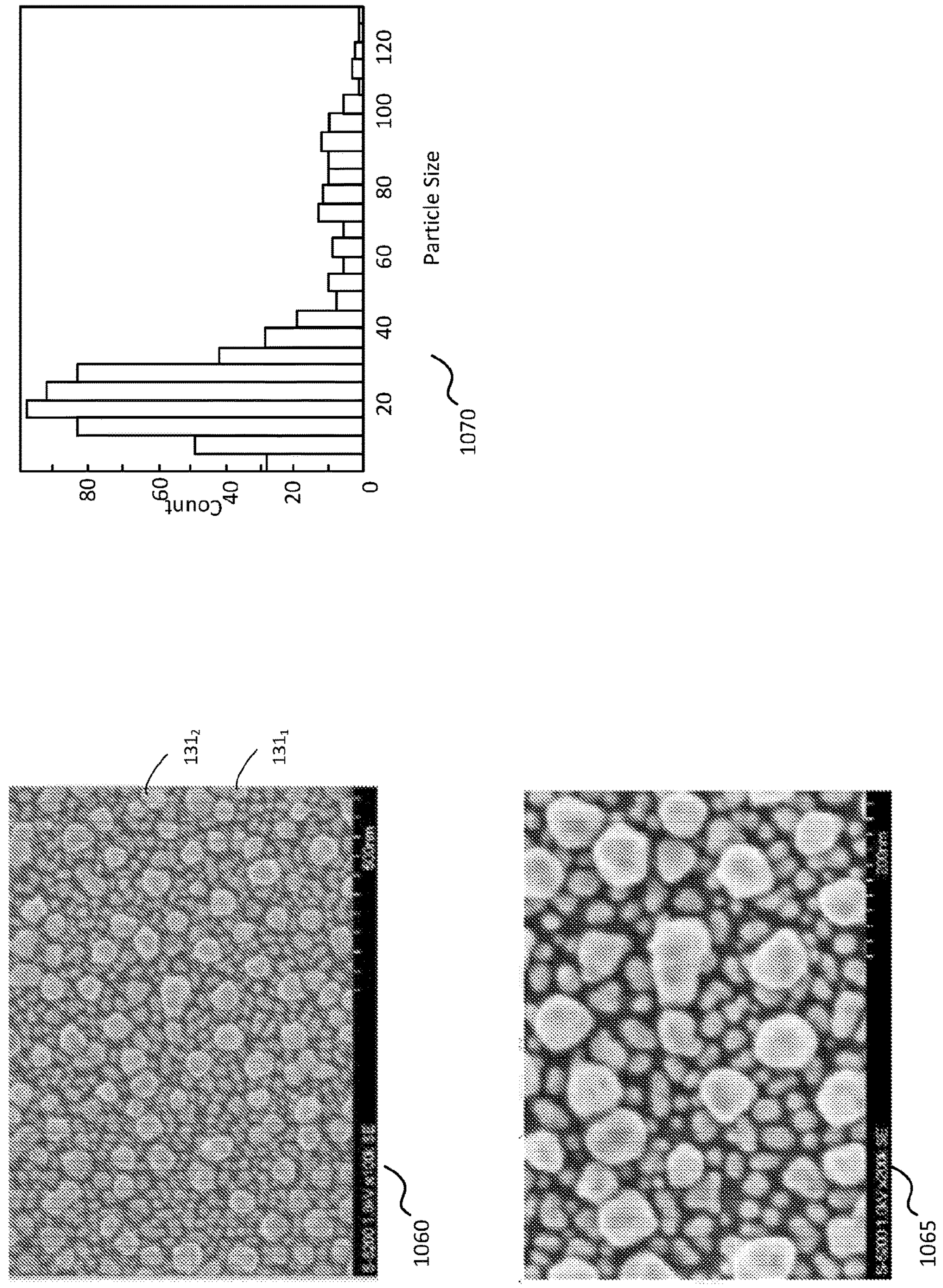

FIG. 10D shows a SEM image 1060 of a fourth sample and a further SEM image 1065 at increased magnification. As may be seen from the image 1060, while there continue to be a number of first particle structures 131$_1$ that may tend to be concentrated about the first characteristic size, a number of second particle structures 131$_2$ that may tend to be concentrated about the second characteristic size may be greater. A plot 1070, of a count of particle structures 131$_t$ as a function of characteristic particle size, may show two discernible peaks, a large peak of first particle structures 131$_1$ concentrated around about 20 nm and a smaller peak of second particle structures 131$_2$ concentrated around about 85 nm. Analysis shows that a surface coverage of the observation window of the image 1060, of the first particle structures 131$_1$ having a characteristic size that is no more than about 50 nm was about 14%, whereas a surface coverage of the observation window of the image 1060, of the second particle structures 131$_2$ having a characteristic size that is at least about 50 nm was about 34%.

Figure 10E:
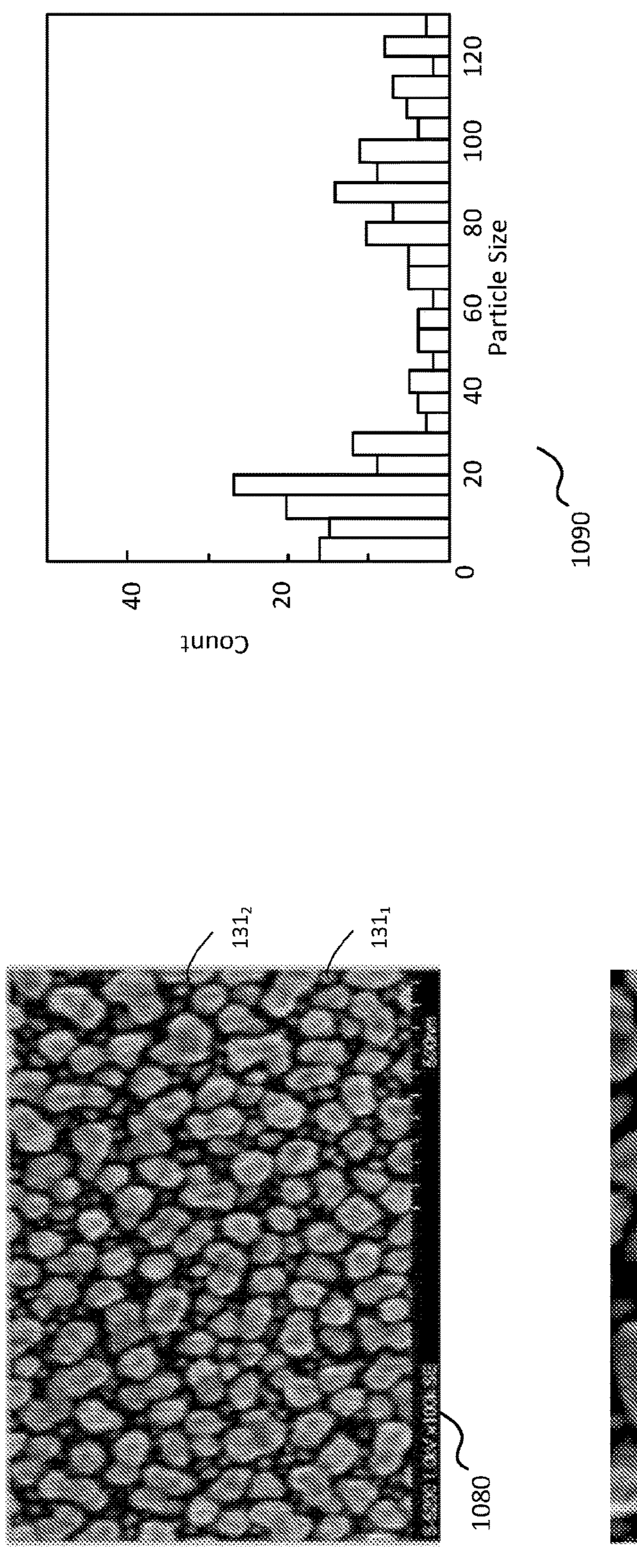

FIG. 10E shows a SEM image 1080 of a fifth sample and a further SEM image 1085 at increased magnification. As may be seen from the image 1080, while there continue to be a number of first particle structures 131$_1$ that may tend to be concentrated about the first characteristic size, a number of second particle structures 131$_2$ that may tend to be concentrated about the second characteristic size may be greater. Indeed, the second particle structures 131$_2$ may tend to predominate. A plot 1090 of a count of particle structures 131$_t$ as a function of characteristic particle size, shows two discernible peaks, a large peak of first particle structures 131$_1$ concentrated around about 15 nm and a smaller peak of second particle structures 131$_2$ concentrated about around 85 nm. Analysis shows that a surface coverage of the observation window of the image 1080, of the first particle structures 131$_1$ having a characteristic size that is no more than about 50 nm was about 3%, whereas a surface coverage of the observation window of the image 1080, of the second particle structure 131$_2$ having a characteristic size that is at least about 50 nm was about 55%.

Without wishing to be limited to any particular theory, it may be postulated that, in some non-limiting examples, such multi-modal behaviour of the EM radiation-modifying layer 130 may be produced by introducing a plurality of nucleation sites for the deposited material 1631 within the EM layer patterning coating 420$_e$, including without limitation, by doping, covering, and/or supplementing the patterning material 1511 with another material that may act as a seed or heterogeneity that may act as such a nucleation site. In some non-limiting examples, it may be postulated that first particle structures 131$_1$ of the first characteristic size may tend to form on the EM layer patterning coating 420$_e$ where there may be substantially no such nucleation sites, and that second particle structures 131$_2$ of the second characteristic size may tend to form at the locations of such nucleation sites.

Those having ordinary skill in the relevant art will appreciate that there may be other mechanisms by which such multi-modal behaviours may be produced.

The foregoing also assumes, as a simplifying assumption, that the NPs modelling each particle structure 131 may have a perfectly spherical shape. Typically, the shape of particle structures 131$_t$ in (an observation window used, of) the EM radiation-modifying layer 130 may be highly dependent upon the deposition process. In some non-limiting examples, a shape of the particle structures 131$_t$ may have a significant impact on the SP excitation exhibited thereby, including without limitation, on a width, wavelength range, and/or intensity of a resonance band, and concomitantly, an absorption band thereof.

In some non-limiting examples, material surrounding the EM radiation-modifying layer 130, whether underlying it (such that the particle structures 131$_t$ may be deposited onto the exposed layer surface 11 thereof) or subsequently disposed on an exposed layer surface 11 of the EM radiation-modifying layer 130, may impact the optical effects generated by the emission and/or transmission of EM radiation and/or EM signals 731 through the EM radiation-modifying layer 130.

It may be postulated that disposing the EM radiation-modifying layer 130 containing the particle structures 131$_t$ on, and/or in physical contact with, and/or proximate to, an exposed layer surface 11 of an EM layer patterning coating 420$_e$ that may be comprised of a material having a low refractive index may, in some non-limiting examples, shift an absorption spectrum of the EM radiation-modifying layer 130.

Since the EM radiation-modifying layer 130 may be arranged to be on, and/or in physical contact with, and/or proximate to, the EM layer patterning coating 420$_e$, the display panel 710 may be configured such that an absorption spectrum of the EM radiation-modifying layer 130 may be tuned and/or modified, due to the presence of the EM layer patterning coating 420$_e$, including without limitation such that such absorption spectrum may substantially overlap and/or may not overlap with at least a wavelength (sub-) range of the EM spectrum, including without limitation, the visible spectrum, the UV spectrum, and/or the IR spectrum.

In some non-limiting examples, the EM layer patterning coating 420$_e$, and/or the patterning material 1511, in some non-limiting examples, when deposited as a film, and/or coating in a form, and under similar circumstances to the deposition of the EM layer patterning coating 420$_e$ within the display panel 710, may have a first surface energy that may no more than a second surface energy of the deposited material 1631, in some non-limiting examples, when deposited as a film, and/or coating in a form, and under similar circumstances to the deposition of the EM radiation-modifying layer 130, within the display panel 710.

In some non-limiting examples, a quotient of the second surface energy/the first surface energy may be at least one of at least about: 1, 5, 10, or 20.

In some non-limiting examples, a surface coverage of an area of the EM layer patterning coating 420$_e$ by the at least one particle structures 131$_t$ deposited thereon, may be no more than a maximum threshold percentage coverage.

In some non-limiting examples, the particle structures 131$_t$, in the context of permitting the transmission of EM signals 731 in the IR spectrum and/or NIR spectrum passing at a non-zero angle relative to the layers of the face 701 through the signal transmissive region(s) 820 of the face 701 of the display panel 710, may have a characteristic size that may lie in a range of at least one of between about: 1-200 nm, 1-150 nm, 1-100 nm, 1-50 nm, 1-40 nm, 1-30 nm, 1-20 nm, 5-20 nm, or 8-15 nm.

In some non-limiting examples, the particle structures 131$_t$, in the context of permitting the transmission of EM signals 731 in the IR spectrum and/or NIR spectrum passing at a non-zero angle relative to the layers of the face 701 through the signal transmissive region(s) 820 of the face 701 of the display panel 710, may have a mean and/or median feature size of at least one of between about: 5-100 nm, 5-50 nm, 5-40 nm, 5-30 nm, 5-25 nm, 5-20 nm, or 8-15 nm. By way of non-limiting example, such mean and/or median dimension may correspond to the mean diameter and/or the median diameter, respectively, of the particle structures 131$_t$ of the EM radiation-modifying layer 130.

In some non-limiting examples, a majority of the particle structures 131$_t$, in the context of permitting the transmission of EM signals 731 in the IR spectrum and/or NIR spectrum passing at a non-zero angle relative to the layers of the face 701 through the signal transmissive region(s) 820 of the face 701 of the display panel 710, may have a maximum feature size of at least one of no more than about: 100 nm, 80 nm, 50 nm, 40 nm, 30 nm, 25 nm, 20 nm, or 15 nm.

In some non-limiting examples, a percentage of the particle structures 131$_t$, in the context of permitting the transmission of EM signals 731 in the IR spectrum and/or NIR spectrum passing at a non-zero angle relative to the layers of the face 701 through the signal transmissive region(s) 820 of the face 701 of the display panel 710, that may have such a maximum feature size, may be at least one of at least about: 70%, 60%, 50%, 40%, 30%, 25%, 20%, 15%, or 10% of the area of the EM radiation-modifying layer 130.

In some non-limiting examples, the particle structures 131$_t$ may be configured to permit the transmission of EM signals 731 in the IR spectrum and/or NIR spectrum passing at a non-zero angle relative to the layers of the face 701 through the signal transmissive region(s) 820 of the face 701 of the display panel 710, while absorbing EM signals 731 in at least a sub-range of the visible spectrum and/or the UV spectrum. In some non-limiting examples, such particle structures 131$_t$ may have: (i) a percentage coverage of at least one of between about: 10-50%, 10-45%, 12-40%, 15-40%, 15-35%, 18-35%, 20-35%, or 20-30%, (ii) a majority of the particle structures 131$_t$ may have a maximum feature size of at least one of at least about: 40 nm, 35 nm, 30 nm, 25 nm, or 20 nm; and (iii) a mean and/or median feature size of at least one of between about: 5-40 nm, 5-30 nm, 8-nm 10-30 nm, 8-25 nm, 10-25 nm, 8-20 nm, 10-15 nm, or 8-15 nm.

In some non-limiting examples, the resonance imparted by the at least one particle structure 131$_t$ for enhancing the transmission of EM signals 731 passing at a non-zero angle relative to the layers of the face 701 through the non-emissive region(s) 2302 of the face 701 of the display panel 710, may be tuned by judicious selection of at least one of a characteristic size, size distribution, shape, surface coverage, configuration, dispersity, and/or material of the particle structures 131$_t$.

In some non-limiting examples, the resonance may be tuned by varying the deposited thickness of the deposited material 1631.

In some non-limiting examples, the resonance may be tuned by varying the average film thickness of the EM layer patterning coating 420$_e$.

In some non-limiting examples, the resonance may be tuned by varying the thickness of the at least one covering layer 915. In some non-limiting examples, the thickness of the at least one covering layer 915 may be in the range of 0 nm (corresponding to the absence of the at least one covering layer 915) to a value that exceeds the characteristic of the deposited particle structures 131$_t$.

In some non-limiting examples, the resonance may be tuned by altering the composition of metal in the deposited material 1631 to alter the dielectric constant of the deposited particle structures 131$_t$.

In some non-limiting examples, the resonance may be tuned by doping the patterning material 1511 with an organic material having a different composition.

In some non-limiting examples, the resonance may be tuned by selecting and/or modifying a patterning material 1511 to have a specific refractive index and/or a specific extraction coefficient.

In some non-limiting examples, the resonance may be tuned by selecting and/or modifying the material deposited as the at least one covering layer 915 to have a specific refractive index and/or a specific extinction coefficient. By way of non-limiting example, typical organic CPL materials may have a refractive index in the range of between about: 1.7-2.0, whereas $SiON_x$, a material typically used as a TFE material, may have a refractive index that may exceed about 2.4. Concomitantly, $SiON_x$ may have a high extinction coefficient that may impact the desired resonance characteristics.

Those having ordinary skill in the relevant art will appreciate that additional parameters and/or values and/or ranges thereof may become apparent as being suitable to tune the resonance imparted by the EM radiation-modifying layer 130 for allowing transmission of EM signals 731 passing at a non-zero angle relative to the layers of the face 701 through the non-emissive region(s) 2302 of the face 701 of the display panel 710 and/or enhancing absorption of EM radiation, which by way of non-limiting example may be visible light, incident upon the face 701 of the display panel 710.

Those having ordinary skill in the relevant art will appreciate that while certain values and/or ranges of these parameters may be suitable to tune the resonance imparted by the EM radiation-modifying layer 130 for enhancing the transmission of EM signals 731 passing at a non-zero angle relative to the layers of the face 701 through the non-emissive region(s) 2302 of the face 701 of the display panel 710, other values and/or ranges of such parameters may be appropriate for other purposes, beyond the enhancement of the transmission of EM signals 731, including increasing the performance, stability, reliability, and/or lifetime of the face 701, and in some non-limiting examples, to ensure deposition of a suitable second electrode 1940 in the second portion 602, in the emissive region(s) 910 thereof, to facilitate emission of EM radiation thereby.

Additionally, those having ordinary skill in the relevant art will appreciate that there may be additional parameters and/or values and/or ranges that may be suitable for such other purposes.

In some non-limiting examples, the vapor flux 1632 of the deposited material 1631 incident on the exposed layer surface 11 of the face 701 within the second portion 602 (that is, beyond the lateral aspect of the first portion 601, in which the exposed layer surface 11 of the face 701 is of the EM layer patterning coating 420$_e$), may be at a rate and/or for a duration that it may not form a closed coating 1240 of the deposited material 1631 thereon, even in the absence of the EM layer patterning coating 420$_e$. In such scenario, the vapor flux 1632 of the deposited material 1631 on the exposed layer surface 11, within the lateral aspect of the second portion 602, may also form at least one particle structure 131$_d$ thereon, including without limitation, as a discontinuous layer 160, as shown in FIG. 9B.

Figure 9B:
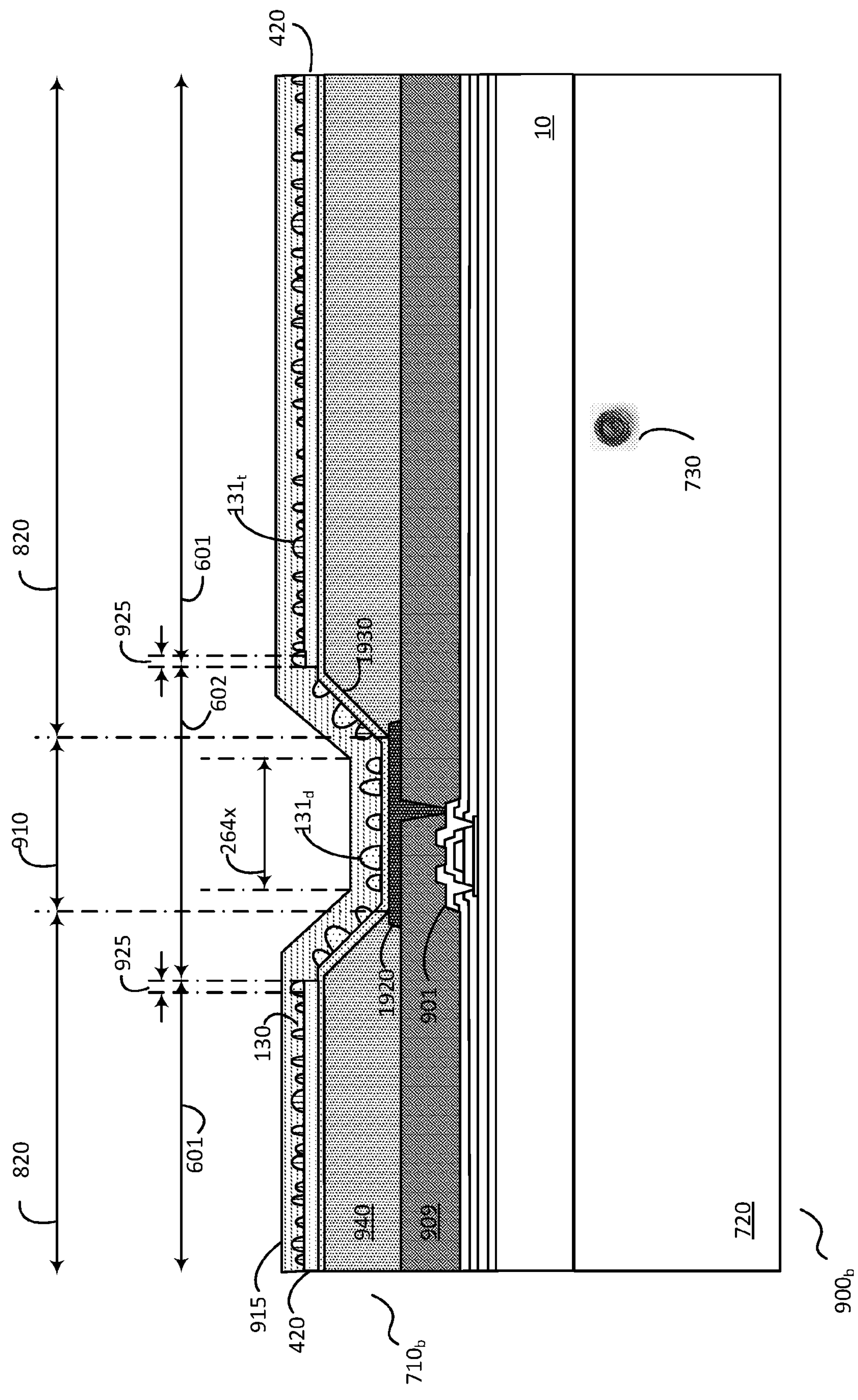

FIG. 9B is a simplified block diagram of an example version 900$_b$ of the user device 700. In the display panel 710$_b$ thereof, when the vapor flux 1632 of the deposited material 1631 is incident on the exposed layer surface 11, rather than forming a closed coating 1240 as the second electrode 1940 in the second portion 602, as in the face 701, a discontinuous layer 160 may be formed in the second portion 602, comprising at least one particle structure 131$_d$. Where the at least one particle structures 131$_d$ are electrically coupled, the discontinuous layer 160 may serve as a second electrode 1940.

In some non-limiting examples, the characteristic size, size distribution, shape, surface coverage, configuration, deposited density, and/or dispersity of the at least one particle structure 131$_t$ of the EM radiation-modifying layer 130 in the first portion 601 may be different from that of the at least one particle structure 131$_d$ of the discontinuous layer 160 forming the second electrode 1940 in the second portion 602.

In some non-limiting examples, the characteristic size of the at least one particle structure 131$_t$ of the EM radiation-modifying layer 130 in the first portion 601 may exceed the characteristic size of the at least one particle structure 131$_d$ of the discontinuous layer 160 forming the second electrode 1940 in the second portion 602.

In some non-limiting examples, the surface coverage of the at least one particle structure 131$_t$ of the EM radiation-modifying layer 130 in the first portion 601 may exceed the surface coverage of the at least one particle structure 131$_d$ of the discontinuous layer 160 forming the second electrode 1940 in the second portion 602.

In some non-limiting examples, the deposited density of the at least one particle structure 131$_t$ of the EM radiation-modifying layer 130 in the first portion 601 may exceed the deposited density of the at least one particle structure 131$_d$ of the discontinuous layer 160 forming the second electrode 1940 in the second portion 602.

In some non-limiting examples, the characteristic size, size distribution, shape, surface coverage, configuration, deposited density, and/or dispersity of the at least one particle structure 131$_d$ of the discontinuous layer 160 forming the second electrode 1940 in the second portion 602 may be such to allow them to be electrically coupled.

In some non-limiting examples, the characteristic size of the at least one particle structure 131$_d$ of the discontinuous layer 160 forming the second electrode 1940 in the second portion 602 may exceed the characteristic size of the at least one particle structure 131$_t$ of the EM radiation-modifying layer 130 in the first portion 601.

In some non-limiting examples, the surface coverage of the at least one particle structure 131$_d$ of the discontinuous layer 160 forming the second electrode 1940 in the second portion 602 may exceed the surface coverage of the at least one particle structure 131$_t$ of the EM radiation-modifying layer 130 in the first portion 601.

In some non-limiting examples, the deposited density of the at least one particle structure 131$_d$ of the discontinuous layer 160 forming the second electrode 1940 in the second portion 602 may exceed the deposited density of the at least one particle structure 131$_t$ of the EM radiation-modifying layer 130 in the first portion 601.

In some non-limiting examples, the at least one particle structure 131$_d$ of the discontinuous layer 160 forming the second electrode 1940 may extend partially over the EM layer patterning coating $420_e$ in the transition region 925.

Figure 9C:
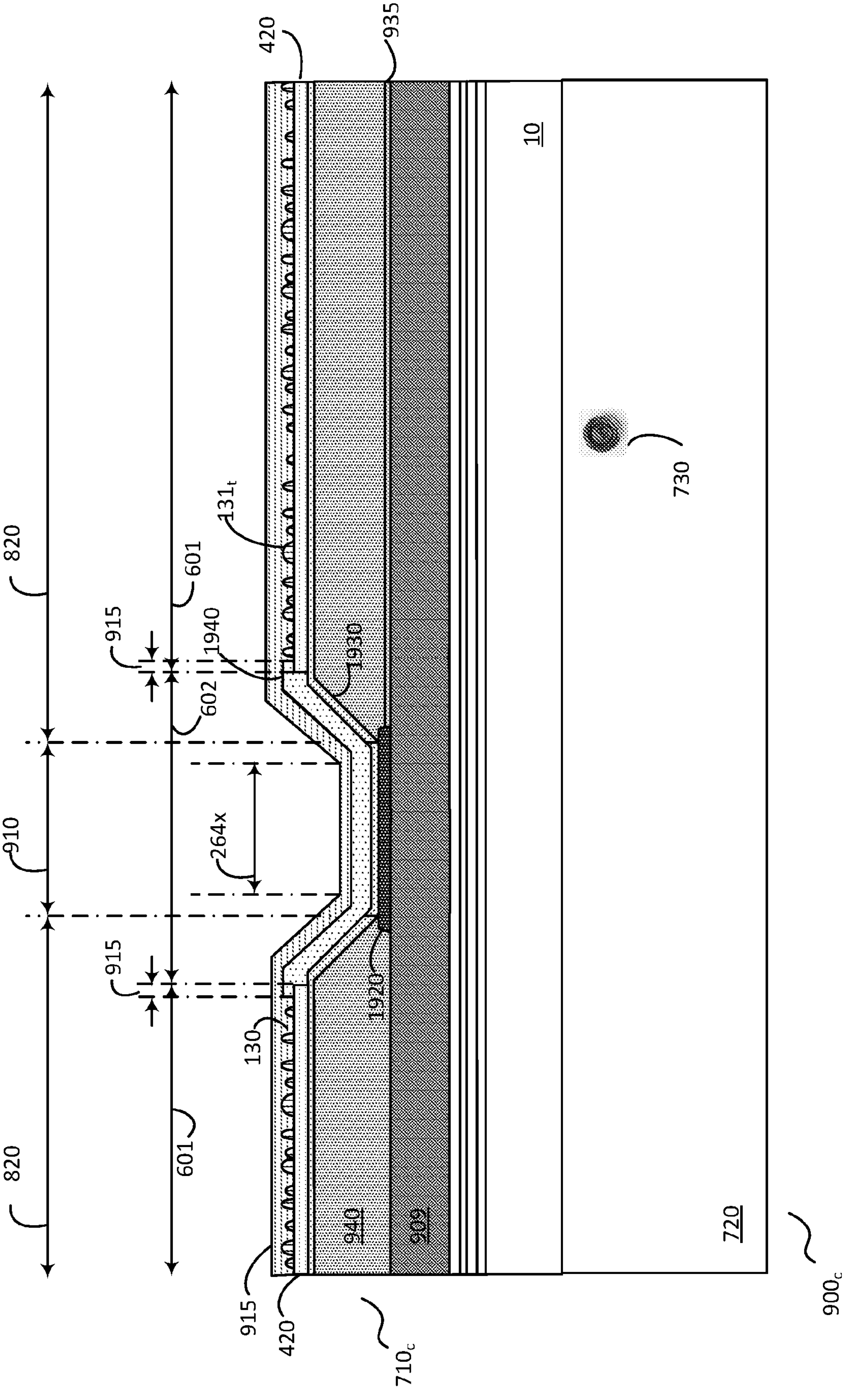

FIG. 9C is a simplified block diagram of an example version $900_c$ of the user device 700. In the display panel $710_b$ of FIG. 9B, the at least one TFT structure 901 for driving the emissive region 910 in the second portion 602 of the lateral aspect of the display panel $710_b$ may be co-located with the emissive region 910 within the second portion 602 of the lateral aspect of the display panel 710*b* and the first electrode 1920 may extend through the TFT insulating layer 909 to be electrically coupled through the at least one driving circuit incorporating such at least one TFT structure 901 to a terminal of the power source 1905 and/or to ground.

By contrast, in the display panel $710_c$ of FIG. 9C, there is no TFT structure 901 co-located with the emissive region 910 that it drives, within the second portion 602 of the lateral aspect of the face 701. Accordingly, the first electrode 1920 of the display panel 7106 does not extend through the TFT insulating layer 909.

Rather, the at least one TFT structure 901 for driving the emissive region 910 in the second portion 602 of the lateral aspect of the display panel 7106 is located elsewhere within the lateral aspect thereof (not shown), and a conductive channel 935 may extend within the lateral aspect of the display panel 710G beyond the second portion 602 thereof on an exposed layer surface 11 of the display panel 7106, which in some non-limiting examples, may be the TFT insulating layer 909. In some non-limiting examples, the conductive channel 935 may extend across at least part of the first portion 601 of the lateral aspect of the display panel 7106. In some non-limiting examples, the conductive channel 935 may have an average film thickness so as to maximize the transmissivity of EM signals 731 passing at a non-zero angle to the layers of the face 701 therethrough. In some non-limiting examples, the conductive channel 935 may be formed of Cu and/or a TCO.

A series of samples were fabricated to analyze the features of the EM radiation-modifying layer 130 formed on the exposed layer surface 11 of the EM layer patterning coating $420_e$, following exposure of such exposed layer surface 11 to a vapor flux 1632 of Ag.

A sample was fabricated by depositing an organic material to provide the EM layer patterning coating $420_e$ on a silicon (Si) substrate. The exposed layer surface 11 of the EM layer patterning coating $420_e$ was then subjected to a vapor flux 1632 of Ag until a reference thickness of 8 nm was reached. Following the exposure of the exposed layer surface 11 of the EM layer patterning coating $420_e$ to the vapor flux 1632, the formation of a discontinuous layer 160 in the form of discrete particle structures $131_t$ of Ag on the exposed layer surface 11 of the EM layer patterning coating $420_e$ was observed.

Figure 11B:
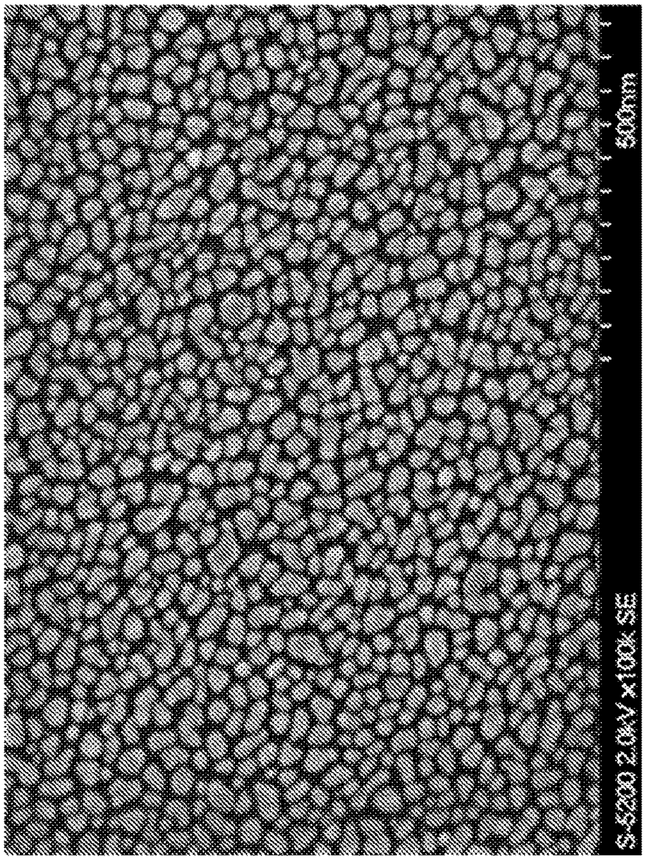
FIGS. 11A-11B are SEM micrographs of samples fabricated in examples of the present disclosure.
Figure 11A:
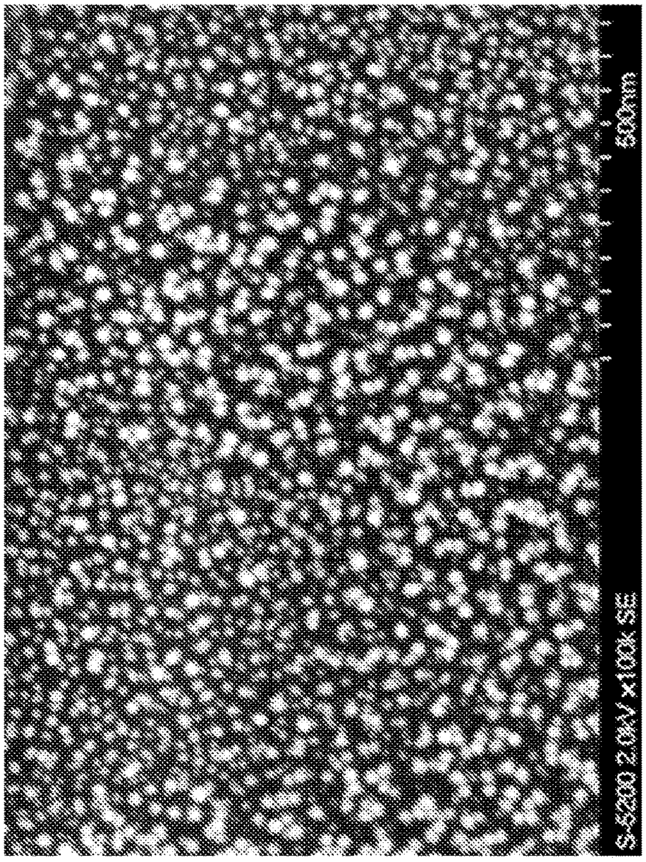
Figure 11C:
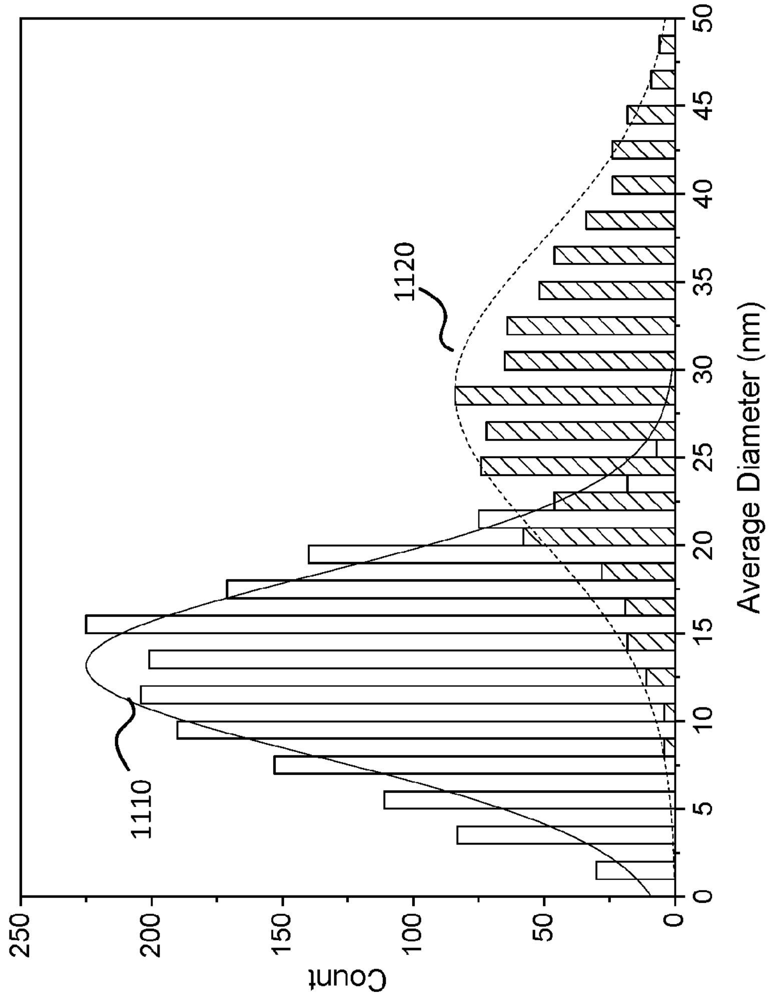
FIG. 11C is a chart of average diameter based on analysis of the micrographs of FIGS. 11A-11B.

The features of such discontinuous layer 160 was characterized by SEM to measure the size of the discrete particle structures $131_t$ of Ag deposited on the exposed layer surface 11 of the EM layer patterning coating $420_e$. Specifically, an average diameter of each discrete particle structure $131_t$ was calculated by measuring the surface area occupied thereby when the exposed layer surface 11 of the EM layer patterning coating $420_e$ was viewed in plan, and calculating an average diameter upon fitting the area occupied by each particle structures $131_t$ with a circle having an equivalent area. The SEM micrograph of the sample is shown in FIG. 11A, and FIG. 11C shows a distribution of average diameters 1110 obtained by this analysis. For comparison, a reference sample was prepared in which 8 nm of Ag was deposited directly on an Si substrate. The SEM micrograph of such reference sample is shown in FIG. 11B, and analysis 1120 of this micrograph is also reflected in FIG. 11C.

As may be seen, a median size of the discrete Ag particle structures $131_t$ on the exposed layer surface 11 of the EM layer patterning coating $420_e$ was found to be approximately 13 nm, while a median grain size of the Ag film deposited on the Si substrate in the reference sample was found to be approximately 28 nm. An area percentage of the exposed layer surface 11 of the EM layer patterning coating $420_e$ covered by the discrete Ag particle structures $131_t$ of the discontinuous layer 160 in the analyzed part of the sample was found to be approximately 22.5%, while the percentage of the exposed layer surface 11 of the Si substrate covered by the Ag grains in the reference sample was found to be approximately 48.5%.

Additionally, a glass sample was prepared using substantially identical processes, by depositing an EM layer patterning coating $420_e$ and a discontinuous layer 160 of Ag particle structures $131_t$ on a glass substrate, and this sample (Sample B) was analyzed in order to determine the effects of the discontinuous layer 160 on transmittance through the sample. Comparative glass samples were fabricated by depositing an EM layer patterning coating $420_e$ on a glass substrate (Comparative Sample A), and by depositing an 8 nm thick Ag coating directly on a glass substrate (Comparative Sample C). The transmittance of EM radiation, expressed as a percentage of intensity of EM radiation detected upon the EM radiation passing through each sample, was measured at various wavelengths for each sample and summarized in Table 10 below:

TABLE 10

| | Wavelength | | | |
|---|---|---|---|---|
| | 450 nm | 550 nm | 700 nm | 850 nm |
| Comparative Sample A | 90% | 90% | 90% | 90% |
| Sample B | 54% | 80% | 85% | 88% |
| Comparative Sample C | 37% | 30% | 46% | 60% |

As may be seen, Sample B exhibited relatively low EM radiation transmittance of about 54% at a wavelength of 450 nm in the visible spectrum, due to EM radiation absorption caused by the presence of the EM radiation-modifying layer 130, while exhibiting a relatively high EM radiation transmittance of about 88% at a wavelength of 850 nm in the NIR spectrum. Since Comparative Sample A exhibited transmittance of about 90% at a wavelength of 850 nm, it will be appreciated that the presence of the EM radiation-modifying layer 130 did not substantially attenuate the transmission of EM radiation, including without limitation, EM signals 731, at such wavelength. Comparative Sample C exhibited a relatively low transmittance of 30-40% in the visible spectrum and a lower transmittance at a wavelength of 850 nm in the NIR spectrum relative to Sample B.

For the purposes of the foregoing analysis, small particle structures $131_t$ below a threshold area of no more than about: 10 $nm^2$ at a 500 nm scale and of no more than about: 2.5 $nm^2$ at a 200 nm scale were disregarded as these approached the resolution of the images.

Covering Layer

In some non-limiting examples, at least one covering layer 915 may be provided in the form of at least one layer of an outcoupling and/or encapsulation coating of the display panel 710, including without limitation, an outcoupling layer, a CPL, a layer of a TFE, a polarizing layer, or other physical layer and/or coating that may be deposited upon the display panel 710 as part of the manufacturing process. In some non-limiting examples, the at least one covering layer 915 may comprise lithium fluoride (LiF).

In some non-limiting examples, a CPL may be deposited over the entire surface of the device 300. The function of the CPL in general may be to promote outcoupling of light emitted by the device 300, thus enhancing the external quantum efficiency (EQE).

In some non-limiting examples, at least one covering layer 915 may be deposited at least partially across the lateral extent of the face 701, in some non-limiting examples, at least partially covering the at least one particle structure $\mathbf{131}_t$ of the EM radiation-modifying layer 130 in the first portion 601, and forming an interface with the EM layer patterning coating $\mathbf{420}_e$ at the exposed layer surface 11 thereof. In some non-limiting examples, the at least one covering layer 915 may also at least partially cover the second electrode 1920 in the second portion 602.

In some non-limiting examples, the at least one covering layer 915 may have a high refractive index. In some non-limiting examples, the at least one covering layer 915 may have a refractive index that exceeds a refractive index of the EM layer patterning coating $\mathbf{420}_e$.

In some non-limiting examples, the display panel 710 may be provided, at the interface with the exposed layer surface 11 of the EM layer patterning coating $\mathbf{420}_e$, with an air gap and/or air interface, whether during, or subsequent to, manufacture, and/or in operation. Thus, in some non-limiting examples, such air gap and/or air interface may be considered as the at least one covering layer 915. In some non-limiting examples, the display panel 710 may be provided with both a CPL and an air gap, wherein the EM radiation-modifying coating 120 may be covered by the CPL and the air gap may be disposed on or over the CPL.

In some non-limiting examples, at least one of the particle structures $\mathbf{131}_t$ of deposited material 1631 in the EM radiation-modifying layer 130 may be in physical contact with the at least one covering layer 915. In some non-limiting examples, substantially all of the particle structures $\mathbf{131}_t$ of the deposited material 1631 in the EM radiation-modifying layer 130 may be in physical contact with the at least one covering layer 915.

Those having ordinary skill in the relevant art will appreciate that there may be additional layers introduced at various stage of manufacture that are not shown.

In some non-limiting examples, the thin disperse EM radiation-modifying layer 130 of particle structures $\mathbf{131}_t$ in the first portion 601, at an interface between the patterning layer 420, comprising a patterning material 1511 having a low refractive index and the at least one covering layer 915, including without limitation, a CPL, comprising a material that may have a high refractive index, may enhance outcoupling of at least one EM signal 731 passing through the signal transmissive region(s) 820 of the face 701 of the display panel 710 at a non-zero angle relative to the layers of the face 701.

Patterning

Those having ordinary skill in the relevant art will appreciate that further particulars of patterning a deposited material 1631 using a patterning coating 420 (whether or not for purposes of forming an EM radiation-modifying layer 130) will now be described.

In some non-limiting examples, in the first portion 601, a patterning coating 420, which may, in some non-limiting examples, be an NIC, comprising a patterning material 1511, which in some non-limiting examples, may be an NIC material, may be selectively deposited as a closed coating 1240 on the exposed layer surface 11 of an underlying layer, including without limitation, a substrate 10, of the device 100, only in the first portion 601. However, in the second portion 602, the exposed layer surface 11 of the underlying layer may be substantially devoid of a closed coating 1240 of the patterning material 1511.

Patterning Coating

Figure 12:
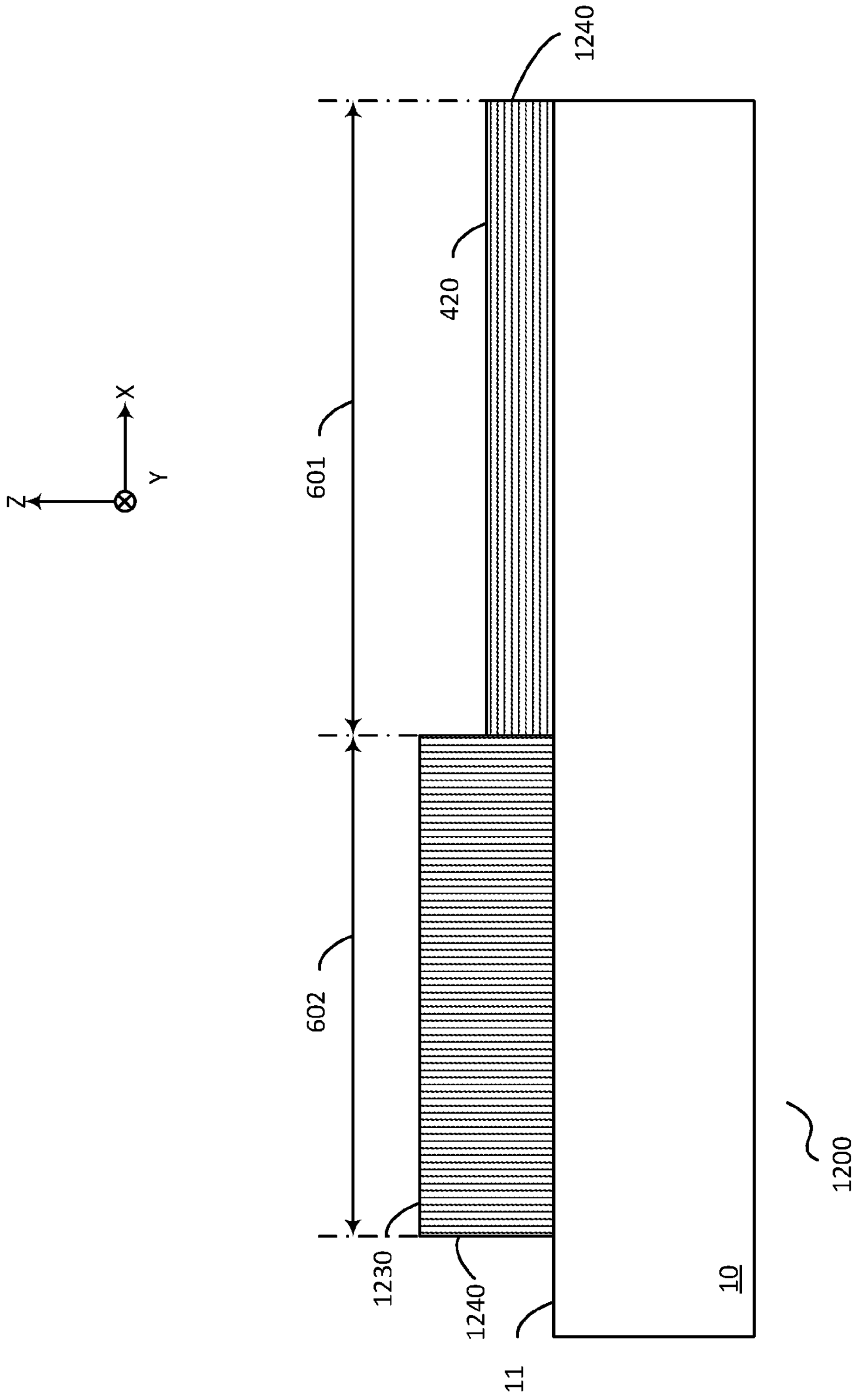
FIG. 12 is a simplified block diagram from a cross-sectional aspect, of an example device having a plurality of layers in a lateral aspect, formed by selective deposition of a patterning coating in a first portion of the lateral aspect, followed by deposition of a closed coating of deposited material in a second portion thereof, according to an example in the present disclosure.

FIG. 12 is a cross-sectional view of a layered semiconductor device 1200, of which the device 100 may, in some non-limiting examples, be a version thereof. The patterning coating 420 may comprise a patterning material 1511. In some non-limiting examples, the patterning coating 420 may comprise a closed coating 1240 of the patterning material 1511.

The patterning coating 420 may provide an exposed layer surface 11 with a relatively low initial sticking probability (in some non-limiting examples, under the conditions identified in the dual QCM technique described by Walker et al.) against the deposition of deposited material 1631, which, in some non-limiting examples, may be substantially less than the initial sticking probability against the deposition of the deposited material 1631 of the exposed layer surface 11 of the underlying layer of the device 1200, upon which the patterning coating 420 has been deposited.

Because of the low initial sticking probability of the patterning coating 420, and/or the patterning material 1511, in some non-limiting examples, when deposited as a film, and/or coating in a form, and under similar circumstances to the deposition of the patterning coating 420 within the device 1200, against the deposition of the deposited material 1631, the first portion 601 comprising the patterning coating 420 may be substantially devoid of a closed coating 1240 of the deposited material 1631.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may have an initial sticking probability against the deposition of the deposited material 1631, that is no more than at least one of about: 0.9, 0.3, 0.2, 0.15, 0.1, 0.08, 0.05, 0.03, 0.02, 0.01, 0.005, 0.003, 0.001, 0.0008, 0.0005, 0.0003, or 0.0001.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may have an initial sticking probability against the deposition of Ag, and/or Mg that is no more than at least one of about: 0.9, 0.3, 0.2, 0.15, 0.1, 0.08, 0.05, 0.03, 0.02, 0.01, 0.008, 0.005, 0.001, 0.0008, 0.0005, 0.0003, or 0.0001.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may have an initial sticking probability against the deposition of a deposited material 1631 of at least one of between about: 0.15-0.0001, 0.1-0.0003, 0.08-0.0005, 0.08-0.0008, 0.05-0.001, 0.03-0.0003, 0.03-0.0005, 0.03-0.0008, 0.03-0.001, 0.03-0.005, 0.03-0.03-0.01, 0.02-0.0001, 0.02-0.0003, 0.02-0.0005, 0.02-0.0008, 0.02-0.001, 0.02-0.008, 0.02-0.01, 0.01-0.0001, 0.01-0.0003, 0.01-0.0005, 0.01-0.01-0.001, 0.01-0.005, 0.01-0.008, 0.008-0.0001, 0.008-0.0003, 0.008-

0.008-0.0008, 0.008-0.001, 0.008-0.005, 0.005-0.0001, 0.005-0.0003, 0.005-0.0008, or 0.005-0.001.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may have an initial sticking probability against the deposition of a plurality of deposited materials 1631 that is no more than a threshold value. In some non-limiting examples, such threshold value may be at least one of about: 0.3, 0.2, 0.18, 0.15, 0.13, 0.1, 0.08, 0.05, 0.03, 0.01, 0.008, 0.005, 0.003, or 0.001.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may have an initial sticking probability that is less than such threshold value against the deposition of a plurality of deposited materials 1631 selected from at least one of: Ag, Mg, Yb, cadmium (Cd), and zinc (Zn). In some further non-limiting examples, the patterning coating 420 may exhibit an initial sticking probability of or below such threshold value against the deposition of a plurality of deposited materials 1631 selected from at least one of: Ag, Mg, and Yb.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may exhibit an initial sticking probability against the deposition of a first deposited material 1631 of, or below, a first threshold value, and an initial sticking probability against the deposition of a second deposited material 1631 of, or below, a second threshold value. In some non-limiting examples, the first deposited material 1631 may be Ag, and the second deposited material 1631 may be Mg. In some other non-limiting examples, the first deposited material 1631 may be Ag, and the second deposited material 1631 may be Yb. In some other non-limiting examples, the first deposited material 1631 may be Yb, and the second deposited material 1631 may be Mg. In some non-limiting examples, the first threshold value may exceed the second threshold value.

In some non-limiting examples, the patterning coating 420, and/or the patterning material 1511, in some non-limiting examples, when deposited as a film, and/or coating in a form, and under circumstances similar to the deposition of the patterning coating 420 within the device 1200 may have a transmittance for EM radiation of at least a threshold transmittance value, after being subjected to a vapor flux 1632 (FIG. 16) of the deposited material 1631, including without limitation, Ag.

In some non-limiting examples, such transmittance may be measured after exposing the exposed layer surface 11 of the patterning coating 420 and/or the patterning material 1511, formed as a thin film, to a vapor flux 1632 of the deposited material 1631, including without limitation, Ag, under typical conditions that may be used for depositing an electrode of an opto-electronic device, which by way of non-limiting example, may be a cathode of an organic light-emitting diode (OLED) device.

In some non-limiting examples, the conditions for subjecting the exposed layer surface 11 to the vapor flux 1632 of the deposited material 1631, including without limitation, Ag, may be as follows: (i) vacuum pressure of about $10^{-4}$ Torr or $10^{-5}$ Torr; (ii) the vapor flux 1632 of the deposited material 1631, including without limitation, Ag being substantially consistent with a reference deposition rate of about 1 angstrom (A)/sec, which by way of non-limiting example, may be monitored and/or measured using a QCM; and (iii) the exposed layer surface 11 being subjected to the vapor flux 1632 of the deposited material 1631, including without limitation, Ag until a reference average layer thickness of about 15 nm is reached, and upon such reference average layer thickness being attained, the exposed layer surface 11 not being further subjected to the vapor flux 1632 of the deposited material 1631, including without limitation, Ag.

In some non-limiting examples, the exposed layer surface 11 being subjected to the vapor flux 1632 of the deposited material 1631, including without limitation, Ag may be substantially at room temperature (e.g. about 25° C.). In some non-limiting examples, the exposed layer surface 11 being subjected to the vapor flux 1632 of the deposited material 1631, including without limitation, Ag may be positioned about 65 cm away from an evaporation source by which the deposited material 1631, including without limitation, Ag, is evaporated.

In some non-limiting examples, the threshold transmittance value may be measured at a wavelength in the visible spectrum. By way of non-limiting example, the threshold transmittance value may be measured at a wavelength of about 460 nm. In some non-limiting examples, the threshold transmittance value may be measured at a wavelength in the IR and/or NIR spectrum. By way of non-limiting example, the threshold transmittance value may be measured at a wavelength of about 700 nm, 900 nm, or about 1000 nm. In some non-limiting examples, the threshold transmittance value may be expressed as a percentage of incident EM power that may be transmitted through a sample. In some non-limiting examples, the threshold transmittance value may be at least one of at least about: 60%, 65%, 70%, 75%, 80%, 85%, or 90%.

In some non-limiting examples, there may be a positive correlation between the initial sticking probability of the patterning coating 420, and/or the patterning material 1511, in some non-limiting examples, when deposited as a film, and/or coating in a form, and under circumstances similar to the deposition of the patterning coating 420 within the device 1200, against the deposition of the deposited material 1631 and an average layer thickness of the deposited material 1631 thereon.

It would be appreciated by a person having ordinary skill in the relevant art that high transmittance may generally indicate an absence of a closed coating 1240 of the deposited material 1631, which by way of non-limiting example, may be Ag. On the other hand, low transmittance may generally indicate presence of a closed coating 1240 of the deposited material 1631, including without limitation, Ag, Mg, and/or Yb, since metallic thin films, particularly when formed as a closed coating 1240, may exhibit a high degree of absorption of EM radiation.

It may be further postulated that exposed layer surfaces 11 exhibiting low initial sticking probability with respect to the deposited material 1631, including without limitation, Ag, Mg, and/or Yb, may exhibit high transmittance. On the other hand, exposed layer surfaces 11 exhibiting high sticking probability with respect to the deposited material 1631, including without limitation, Ag, Mg, and/or Yb, may exhibit low transmittance.

A series of samples was fabricated to measure the transmittance of an example material, as well as to visually observe whether or not a closed coating 1240 of Ag was formed on the exposed layer surface 11 of such example material. Each sample was prepared by depositing, on a glass substrate, an approximately 50 nm thick coating of an example material, then subjecting the exposed layer surface 11 of the coating to a vapor flux 1632 of Ag at a rate of about 1 Å/sec until a reference layer thickness of about 15 nm was reached. Each sample was then visually analyzed and the transmittance through each sample was measured.

The molecular structures of the example materials used in the samples herein are set out in Table 11 below:

TABLE 11

| Material | Molecular Structure/Name |
|---|---|
| HT211 | 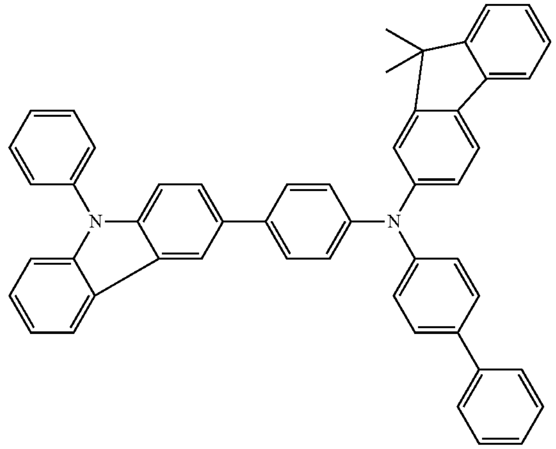 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] |
| HT01 | 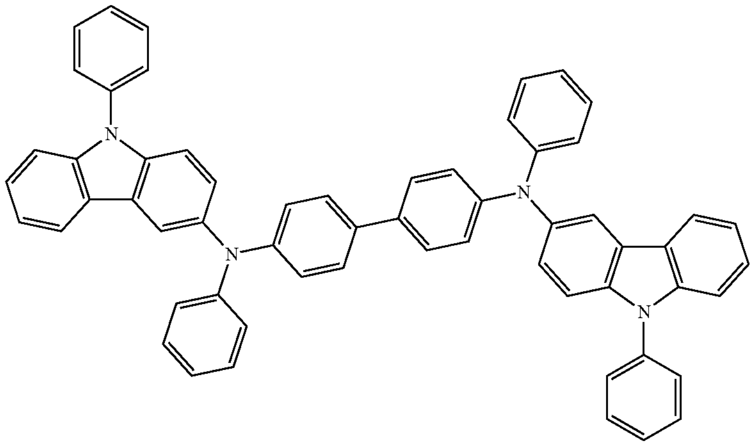 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1] |
| TAZ | 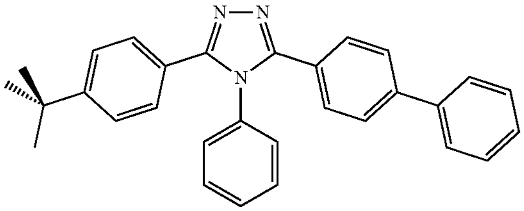 |
| BAlq | 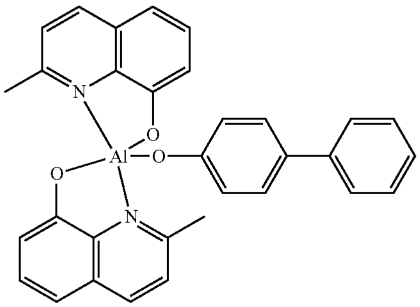 |

TABLE 11-continued
| Material | Molecular Structure/Name |
|---|---|
| Liq | 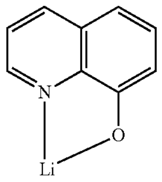 |
| Example Material 1 | 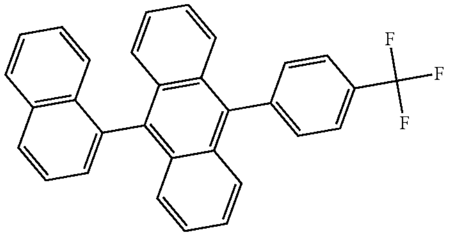 [SMILES: FC(F)(F)c1ccc(-c2c3ccccc3c(-c3cccc4ccccc34)c3ccccc23)cc1] |
| Example Material 2 | 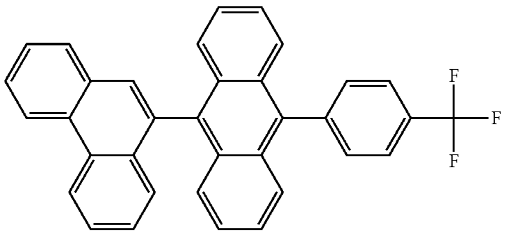 [SMILES: FC(F)(F)c1ccc(-c2c3ccccc3c(-c3cc4ccccc4c4ccccc34)c3ccccc23)cc1] |
| Example Material 3 | 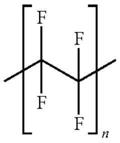 |

TABLE 11-continued
| Material | Molecular Structure/Name |
| --- | --- |
| Example Material 4 | 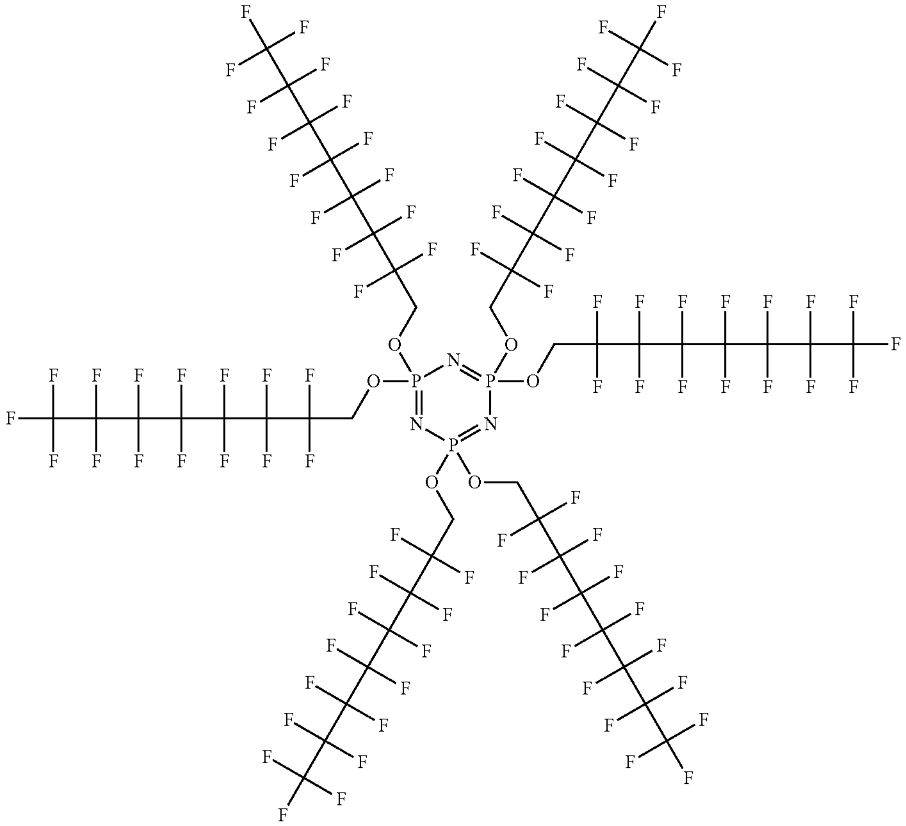 [SMILES: FC(F)(F)C(F)(F)C(F)(F)C(F)(F)C(F)(F)C(F)(F)C(F)(F)COP1(OCC(F)(F)C(F)(F)C(F)(F)C(F)(F)C(F)(F)C(F)(F)C(F)(F)F)=NP(OCC(F)(F)C(F)(F)C(F)(F)C(F)(F)C(F)(F)C(F)(F)C(F)(F)F)(OCC(F)(F)C(F)(F)C(F)(F)C(F)(F)C(F)(F)C(F)(F)C(F)(F)F)=NP(OCC(F)(F)C(F)(F)C(F)(F)C(F)(F)C(F)(F)C(F)(F)C(F)(F)F)(OCC(F)(F)C(F)(F)C(F)(F)C(F)(F)C(F)(F)C(F)(F)C(F)(F)F)=N1] |
| Example Material 5 | 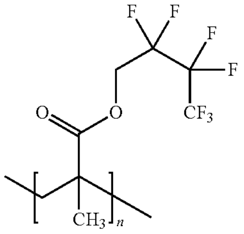 |
| Example Material 6 | 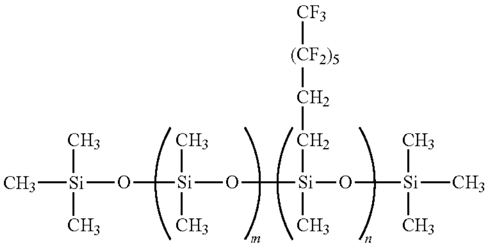 |
| Example Material 7 | 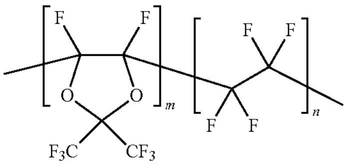 |

TABLE 11-continued

| Material | Molecular Structure/Name |
|---|---|
| Example Material 8 | 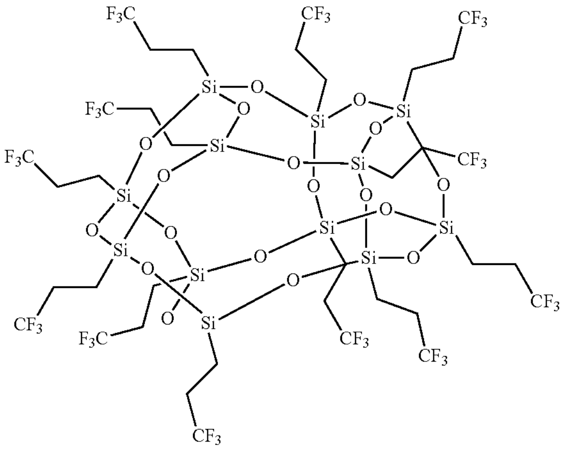 |
| Example Material 9 | 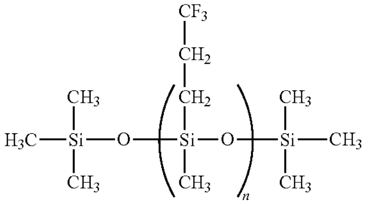 |

The samples in which a substantially closed coating 1240 of Ag had formed were visually identified, and the presence of such coating in these samples was further confirmed by measurement of transmittance therethrough, which showed transmittance of no more than about 50% at a wavelength of about 460 nm.

The samples in which no closed coating 1240 of Ag had formed were also identified, and the absence of such coating in these samples was further confirmed by measurement of transmittance therethrough, which showed transmittance in excess of about 70% at a wavelength of about 460 nm.

The results are summarized in Table 12 below:

TABLE 12

| Material | Closed Coating of Ag? |
|---|---|
| HT211 | Present |
| HT01 | Present |
| TAZ | Present |
| Balq | Present |
| Liq | Present |
| Example Material 1 | Present |
| Example Material 2 | Present |
| Example Material 3 | Not Present |
| Example Material 4 | Not Present |
| Example Material 5 | Not Present |
| Example Material 6 | Not Present |
| Example Material 7 | Not Present |
| Example Material 8 | Not Present |
| Example Material 9 | Not Present |

Based on the foregoing, it was found that the materials used in the first 7 samples in Tables 11 and 12 (HT211 to Example Material 2) may be less suitable for inhibiting the deposition of the deposited material 1631 thereon, including without limitation, Ag, and/or Ag-containing materials.

On the other hand, it was found that Example Material 3 to Example Material 9 may be suitable, at least in some non-limiting applications, to act as a patterning coating 420 for inhibiting the deposition of the deposited material 1631 thereon, including without limitation, Ag, and/or Ag-containing materials.

In some non-limiting examples, the patterning coating 420, and/or the patterning material 1511, in some non-limiting examples, when deposited as a film, and/or coating in a form, and under circumstances similar to the deposition of the patterning coating 420 within the device 1200, may have a surface energy of no more than at least one of about: 24 dynes/cm, 22 dynes/cm, 20 dynes/cm, 18 dynes/cm, 16 dynes/cm, 15 dynes/cm, 13 dynes/cm, 12 dynes/cm, or 11 dynes/cm.

In some non-limiting examples, the surface energy may be at least one of at least about: 6 dynes/cm, 7 dynes/cm, or 8 dynes/cm.

In some non-limiting examples, the surface energy may be at least one of between about: 10-20 dynes/cm, or 13-19 dynes/cm.

In some non-limiting examples, the critical surface tension of a surface may be determined according to the Zisman method, as further detailed in W. A. Zisman, *Advances in Chemistry* 43 (1964), pp. 1-51.

By way of non-limiting example, a series of samples was fabricated to measure the critical surface tension of the surfaces formed by the various materials. The results of the measurement are summarized in Table 13 below:

TABLE 13

| Material | Critical Surface Tension (dynes/cm) |
|---|---|
| HT211 | 25.6 |
| HT01 | >24 |
| TAZ | 22.4 |
| BAlq | 25.9 |

TABLE 13-continued

| Material | Critical Surface Tension (dynes/cm) |
|---|---|
| Liq | 24 |
| Example Material 1 | 26.3 |
| Example Material 2 | 24.8 |
| Example Material 3 | 19 |
| Example Material 4 | 7.6 |
| Example Material 5 | 15.9 |
| Example Material 6 | <20 |
| Example Material 7 | 13.1 |
| Example Material 8 | 20 |
| Example Material 9 | 18.9 |

Based on the foregoing measurement of the critical surface tension in Table 13 and the previous observation regarding the presence or absence of a substantially closed coating 1240 of Ag, it was found that materials that form low surface energy surfaces when deposited as a coating, which by way of non-limiting example, may be those having a critical surface tension of at least one of between about: 13-20 dynes/cm, or 13-19 dynes/cm, may be suitable for forming the patterning coating 420 to inhibit deposition of a deposited material 1631 thereon, including without limitation, Ag, and/or Ag-containing materials.

Without wishing to be bound by any particular theory, it may be postulated that materials that form a surface having a surface energy lower than, by way of non-limiting example, about 13 dynes/cm, may be less suitable as a patterning material 1511 in certain applications, as such materials may exhibit relatively poor adhesion to layer(s) surrounding such materials, exhibit a low melting point, and/or exhibit a low sublimation temperature.

In some non-limiting examples, the patterning coating 420, and/or the patterning material 1511, in some non-limiting examples, when deposited as a film, and/or coating in a form, and under circumstances similar to the deposition of the patterning coating 420 within the device 1200, may have a low refractive index.

In some non-limiting examples, the patterning coating 420, and/or the patterning material 1511, in some non-limiting examples, when deposited as a film, and/or coating in a form, and under circumstances similar to the deposition of the patterning coating 420 within the device 1200, may have a refractive index for EM radiation at a wavelength of 550 nm that may be no more than at least one of about: 1.55, 1.5, 1.45, 1.43, 1.4, 1.39, 1.37, 1.35, 1.32, or 1.3.

Without wishing to be bound by any particular theory, it has been observed that providing the patterning coating 420 having a low refractive index may, at least in some devices 1200, enhance transmission of external EM radiation through the second portion 602 thereof. By way of non-limiting example, devices 1200 including an air gap therein, which may be arranged near or adjacent to the patterning coating 420, may exhibit a higher transmittance when the patterning coating 420 has a low refractive index relative to a similarly configured device in which such low-index patterning coating 420 was not provided.

By way of non-limiting example, a series of samples was fabricated to measure the refractive index at a wavelength of 550 nm for the coatings formed by some of the various example materials. The results of the measurement are summarized in Table 14 below:

TABLE 14

| Material | Refractive Index |
|---|---|
| HT211 | 1.76 |
| HT01 | 1.80 |
| TAZ | 1.69 |
| BAlq | 1.69 |
| Liq | 1.64 |
| Example Material 2 | 1.72 |
| Example Material 3 | 1.37 |
| Example Material 5 | 1.38 |
| Example Material 7 | 1.3 |

Based on the foregoing measurement of refractive index in Table 14, and the previous observation regarding the presence or absence of a substantially closed coating 1240 of Ag in Table 12, it was found that materials that form a low refractive index coating, which by way of non-limiting example, may be those having a refractive index of no more than at least one of about: 1.4 or 1.38, may be suitable for forming the patterning coating 420 to inhibit deposition of a deposited material 1631 thereon, including without limitation, Ag, and/or an Ag-containing materials.

In some non-limiting examples, the patterning coating 420, and/or the patterning material 1511, in some non-limiting examples, when deposited as a film, and/or coating in a form, and under similar circumstances to the deposition of the patterning coating 420 within the device 1200, may have an extinction coefficient that may be no more than about 0.01 for photons at a wavelength that is at least one of at least about: 600 nm, 500 nm, 460 nm, 420 nm, or 410 nm.

In some non-limiting examples, the patterning coating 420, and/or the patterning material 1511, in some non-limiting examples, when deposited as a film, and/or coating in a form, and under circumstances similar to the deposition of the patterning coating 420 within the device 1200, may not substantially attenuate EM radiation passing therethrough, in at least the visible spectrum.

In some non-limiting examples, the patterning coating 420, and/or the patterning material 1511, when deposited as a film, and/or coating in a form, and under circumstances similar to the deposition of the patterning coating 420 within the device 1200, may not substantially attenuate EM radiation passing therethrough, in at least the IR spectrum and/or the NIR spectrum.

In some non-limiting examples, the patterning coating 420, and/or the patterning material 1511, in some non-limiting examples, when deposited as a film, and/or coating in a form, and under circumstances similar to the deposition of the patterning coating 420 within the device 1200, may have an extinction coefficient that may be at least one of at least about: 0.05, 0.1, 0.2, or 0.5 for EM radiation at a wavelength shorter than at least one of at least about: 400 nm, 390 nm, 380 nm, or 370 nm.

In this way, the patterning coating 420, and/or the patterning material 1511, when deposited as a film, and/or coating in a form, and under circumstances similar to the deposition of the patterning coating 420 within the device 1200, may absorb EM radiation in the UVA spectrum incident upon the device 1200, thereby reducing a likelihood that EM radiation in the UVA spectrum may impart undesirable effects in terms of device performance, device stability, device reliability, and/or device lifetime.

In some non-limiting examples, the patterning coating 420, and/or the patterning material 1511, in some non-limiting examples, when deposited as a film, and/or coating in a form, and under circumstances similar to the deposition of the patterning coating 420 within the device 1200, may have a glass transition temperature that is no more than at least one of about: 300° C., 150° C., 130° C., 30° C., −30° C., or −50° C.

In some non-limiting examples, the patterning material 1511 may have a sublimation temperature of at least one of between about: 100-320° C., 120-300° C., 140-280° C., or 150-250° C. In some non-limiting examples, such sublimation temperature may allow the patterning material 1511 to be readily deposited as a coating using PVD.

The sublimation temperature of a material may be determined using various methods apparent to those having ordinary skill in the relevant art, including without limitation, by heating the material under high vacuum in a crucible and by determining a temperature that may be attained to:

- observe commencement of the deposition of the material onto a surface on a QCM mounted a fixed distance from the crucible;
- observe a specific deposition rate, by way of non-limiting example, 0.1 Å/sec, onto a surface on a QCM mounted a fixed distance from the crucible; and/or
- reach a threshold vapor pressure of the material, by way of non-limiting example, about $10^{-4}$ or $10^{-5}$ Torr.

In some non-limiting examples, the sublimation temperature of a material may be determined by heating the material in an evaporation source under a high vacuum environment, by way of non-limiting example, about $10^{-4}$ Torr, and by determining a temperature that may be attained to cause the material to evaporate, thus generating a vapor flux sufficient to cause deposition of the material, by way of non-limiting example, at a deposition rate of about 0.1 Å/sec onto a surface on a QCM mounted a fixed distance from the source.

In some non-limiting examples, the QCM may be mounted about 65 cm away from the crucible for the purpose of determining the sublimation temperature.

In some non-limiting examples, the patterning coating 420, and/or the patterning material 1511, may comprise a fluorine (F) atom and/or an Si atom. By way of non-limiting example, the patterning material 1511 for forming the patterning coating 420 may be a compound that includes F and/or Si.

In some non-limiting examples, the patterning material 1511 may comprise a compound that comprises F. In some non-limiting examples, the patterning material 1511 may comprise a compound that comprises F and a carbon (C) atom. In some non-limiting examples, the patterning material 1511 may comprise a compound that comprises F and C in an atomic ratio corresponding to a quotient of F/C of at least one of at least about: 1, 1.5, or 2. In some non-limiting examples, an atomic ratio of F to C may be determined by counting all of the F atoms present in the compound structure, and for C atoms, counting solely the spa hybridized C atoms present in the compound structure. In some non-limiting examples, the patterning material 1511 may comprise a compound that comprises, as part of its molecular sub-structure, a moiety comprising F and C in an atomic ratio corresponding to a quotient of F/C of at least about: 1, 1.5, or 2.

In some non-limiting examples, the compound of the patterning material 1511 may comprise an organic-inorganic hybrid material.

In some non-limiting examples, the patterning material 1511 may be, or comprise, an oligomer.

In some non-limiting examples, the patterning material 1511 may be, or comprise, a compound having a molecular structure containing a backbone and at least one functional group bonded to the backbone. In some non-limiting examples, the backbone may be an inorganic moiety, and the at least one functional group may be an organic moiety.

In some non-limiting examples, such compound may have a molecular structure comprising a siloxane group. In some non-limiting examples, the siloxane group may be a linear, branched, or cyclic siloxane group. In some non-limiting examples, the backbone may be, or comprise, a siloxane group. In some non-limiting examples, the backbone may be, or comprise, a siloxane group and at least one functional group containing F. In some non-limiting examples, the at least one functional group comprising F may be a fluoroalkyl group. Non-limiting examples of such compound include fluoro-siloxanes. Non-limiting examples of such compound are Example Material 6 and Example Material 9.

In some non-limiting examples, the compound may have a molecular structure comprising a silsesquioxane group. In some non-limiting examples, the silsesquioxane group may be a POSS. In some non-limiting examples, the backbone may be, or comprise, a silsesquioxane group. In some non-limiting examples, the backbone may be, or comprise, a silsesquioxane group and at least one functional group comprising F. In some non-limiting examples, the at least one functional group comprising F may be a fluoroalkyl group. Non-limiting examples of such compound include fluoro-silsesquioxane and/or fluoro-POSS. A non-limiting example of such compound is Example Material 8.

In some non-limiting examples, the compound may have a molecular structure comprising a substituted or unsubstituted aryl group, and/or a substituted or unsubstituted heteroaryl group. In some non-limiting examples, the aryl group may be phenyl, or naphthyl. In some non-limiting examples, at least one C atom of an aryl group may be substituted by a heteroatom, which by way of non-limiting example may be O, N, and/or S, to derive a heteroaryl group. In some non-limiting examples, the backbone may be, or comprise, a substituted or unsubstituted aryl group, and/or a substituted or unsubstituted heteroaryl group. In some non-limiting examples, the backbone may be, or comprise, a substituted or unsubstituted aryl group, and/or a substituted or unsubstituted heteroaryl group and at least one functional group comprising F. In some non-limiting examples, the at least one functional group comprising F may be a fluoroalkyl group.

In some non-limiting examples, the compound may have a molecular structure comprising a substituted or unsubstituted, linear, branched, or cyclic hydrocarbon group. In some non-limiting examples, one or more C atoms of the hydrocarbon group may be substituted by a heteroatom, which by way of non-limiting example may be O, N, and/or S.

In some non-limiting examples, the compound may have a molecular structure comprising a phosphazene group. In some non-limiting examples, the phosphazene group may be a linear, branched, or cyclic phosphazene group. In some non-limiting examples, the backbone may be, or comprise, a phosphazene group. In some non-limiting examples, the backbone may be, or comprise, a phosphazene group and at least one functional group comprising F. In some non-limiting examples, the at least one functional group comprising F may be a fluoroalkyl group. Non-limiting examples of such compound include fluoro-phosphazenes. A non-limiting example of such compound is Example Material 4.

In some non-limiting examples, the compound may be a fluoropolymer. In some non-limiting examples, the compound may be a block copolymer comprising F. In some non-limiting examples, the compound may be an oligomer. In some non-limiting examples, the oligomer may be a fluorooligomer. In some non-limiting examples, the compound may be a block oligomer comprising F. Non-limiting examples, of fluoropolymers and/or fluorooligomers are those having the molecular structure of Example Material 3, Example Material 5, and/or Example Material 7.

In some non-limiting examples, the compound may be a metal complex. In some non-limiting examples, the metal complex may be an organo-metal complex. In some non-limiting examples, the organo-metal complex may comprise F. In some non-limiting examples, the organo-metal complex may comprise at least one ligand comprising F. In some non-limiting examples, the at least one ligand comprising F may be, or comprise, a fluoroalkyl group.

In some non-limiting examples, the patterning material 1511 may be, or comprise, an organic-inorganic hybrid material.

In some non-limiting examples, the patterning material 1511 may comprise a plurality of different materials.

In some non-limiting examples, a molecular weight of the compound of the patterning material 1511 may be no more than at least one of about: 5,000 g/mol, 4,500 g/mol, 4,000 g/mol, 3,800 g/mol, or 3,500 g/mol.

In some non-limiting examples, the molecular weight of the compound of the patterning material 1511 may be at least one of at least about: 1,500 g/mol, 1,700 g/mol, 2,000 g/mol, 2,200 g/mol, or 2,500 g/mol.

Without wishing to be bound by any particular theory, it may be postulated that, for compounds that are adapted to form surfaces with relatively low surface energy, there may be an aim, in at least some applications, for the molecular weight of such compounds to be at least one of between about: 1,500-g/mol, 1,500-4,500 g/mol, 1,700-4,500 g/mol, 2,000-4,000 g/mol, 2,200-4,000 g/mol, or 2,500-3,800 g/mol.

Without wishing to be bound by any particular theory, it may be postulated that such compounds may exhibit at least one property that may be suitable for forming a coating, and/or layer having: (i) a relatively high melting point, by way of non-limiting example, of at least 100° C., (ii) a relatively low surface energy, and/or (iii) a substantially amorphous structure, when deposited, by way of non-limiting example, using vacuum-based thermal evaporation processes.

In some non-limiting examples, a percentage of the molar weight of such compound that may be attributable to the presence of F atoms, may be at least one of between about: 40-90%, 45-85%, 50-80%, 55-75%, or 60-75%. In some non-limiting examples, F atoms may constitute a majority of the molar weight of such compound.

In some non-limiting examples, the patterning coating 420 may be disposed in a pattern that may be defined by at least one region therein that may be substantially devoid of a closed coating 1240 of the patterning coating 420. In some non-limiting examples, the at least one region may separate the patterning coating 420 into a plurality of discrete fragments thereof. In some non-limiting examples, the plurality of discrete fragments of the patterning coating 420 may be physically spaced apart from one another in the lateral aspect thereof. In some non-limiting examples, the plurality of the discrete fragments of the patterning coating 420 may be arranged in a regular structure, including without limitation, an array or matrix, such that in some non-limiting examples, the discrete fragments of the patterning coating 420 may be configured in a repeating pattern.

In some non-limiting examples, at least one of the plurality of the discrete fragments of the patterning coating 420 may each correspond to an emissive region 910.

In some non-limiting examples, an aperture ratio of the emissive regions 910 may be no more than at least one of about: 50%, 40%, 30%, or 20%.

In some non-limiting examples, the patterning coating 420 may be formed as a single monolithic coating.

In some non-limiting examples, the patterning coating 420 may have and/or provide, including without limitation, because of the patterning material 1511 used and/or the deposition environment, at least one nucleation site for the deposited material 1631.

In some non-limiting examples, the patterning coating 420 may be doped, covered, and/or supplemented with another material that may act as a seed or heterogeneity, to act as such a nucleation site for the deposited material 1631. In some non-limiting examples, such other material may comprise an NPC 1820 material. In some non-limiting examples, such other material may comprise an organic material, such as by way of non-limiting example, a polycyclic aromatic compound, and/or a material comprising a non-metallic element such as, without limitation, at least one of: O, S, N, or C, whose presence might otherwise be a contaminant in the source material, equipment used for deposition, and/or the vacuum chamber environment. In some non-limiting examples, such other material may be deposited in a layer thickness that is a fraction of a monolayer, to avoid forming a closed coating 1240 thereof. Rather, the monomers of such other material may tend to be spaced apart in the lateral aspect so as form discrete nucleation sites for the deposited material.

In some non-limiting examples, the patterning coating 420 may act as an optical coating. In some non-limiting examples, the patterning coating 420 may modify at least one property, and/or characteristic of EM radiation (including without limitation, in the form of photons) emitted by the device 1200. In some non-limiting examples, the patterning coating 420 may exhibit a degree of haze, causing emitted EM radiation to be scattered. In some non-limiting examples, the patterning coating 420 may comprise a crystalline material for causing EM radiation transmitted therethrough to be scattered. Such scattering of EM radiation may facilitate enhancement of the outcoupling of EM radiation from the device 1200 in some non-limiting examples. In some non-limiting examples, the patterning coating 420 may initially be deposited as a substantially non-crystalline, including without limitation, substantially amorphous, coating, whereupon, after deposition thereof, the patterning coating 420 may become crystallized and thereafter serve as an optical coupling.

A material which is suitable for use in providing the patterning coating 420 may generally have a low surface energy when deposited as a thin film or coating on a surface. In some non-limiting examples, a material with a low surface energy may exhibit low intermolecular forces. In some non-limiting examples, a material with low intermolecular forces may exhibit a low melting point. In some non-limiting examples, a material with low melting point may not be suitable for use in some applications that call for high temperature reliability, by way of non-limiting example, of up to at least one of about: 60° C., 85° C., or 100° C., due to changes in physical properties of the coating or material at operating temperatures approaching the melting point of the material. By way of non-limiting example, a material with a melting point of 120° C. may not be suitable for an application which counts on high temperature reliability up to 100° C. Accordingly, a material with a higher melting point may be suitable at least in some applications that call for high temperature reliability. Without wishing to be bound by any particular theory, it is now postulated that a material with a relatively high surface energy may be suitable at least in some applications that call for a high temperature reliability.

In some non-limiting examples, a material with low intermolecular forces may exhibit a low sublimation temperature. In some non-limiting examples, a material having a low sublimation temperature, may not be suitable for manufacturing processes that call for a high degree of control over a layer thickness of a deposited film of the material. By way of non-limiting example, for materials with sublimation temperature less than about: 140° C., 120° C., 110° C., 100° C., or 90° C., it may be difficult to control the deposition rate and layer thickness of a film deposited using vacuum thermal evaporation or other methods in the art. In some non-limiting examples, a material with a higher sublimation temperature may be suitable in at least some applications that call for a high degree of control over the film thickness. Without wishing to be bound by any particular theory, it may now be postulated that a material with a relatively high surface energy may be suitable at least in some applications that call for a high degree of control over the film thickness.

In general, a material with a low surface energy may exhibit a large or wide optical gap which, by way of non-limiting example, may correspond to the HOMO-LUMO gap of the material. At least some materials with large or wide optical gap and/or HOMO-LUMO gap may exhibit relatively weak or no photoluminescence in the visible spectrum, deep B(lue) region thereof, and/or the near UV spectrum. By way of non-limiting example, such material may exhibit limited photoluminescence upon being subjected to EM radiation having a wavelength of about 365 nm, which is a common wavelength of the radiation source used in fluorescence microscopy. The presence of such materials, especially when deposited for example as a thin film, may be challenging to detect using standard optical detection techniques such as fluorescence microscopy due to the material exhibiting limited photoluminescence. This may pose difficulty for applications in which the material is selectively deposited, for example through an FMM, over part(s) of a substrate 10, as there may be an aim, to determine, following the deposition of the material, the part(s) in which such materials are present. In some non-limiting examples, a material with a relatively small HOMO-LUMO gap may be suitable in applications to detect a film of the material using optical techniques. In some non-limiting examples, a material with higher surface energy may be suitable for applications to detect of a film of the material using optical techniques.

In some non-limiting examples, there may be an aim to provide a patterning coating 420 for causing formation of a discontinuous layer 160 of at least one particle structure 131, upon the patterning coating 420 being subjected to a vapor flux 1632 of a deposited material 1631. In at least some applications, the patterning coating 420 may exhibit a sufficiently low initial sticking probability such that a closed coating 1240 of the deposited material 1631 may be formed in the second portion 602, which may be substantially devoid of the patterning coating 420, while the discontinuous layer 160 of at least one particle structure 131 having at least one characteristic may be formed in the first portion 601 on the patterning coating 420. In some non-limiting examples, there may be an aim to form a discontinuous layer 160 of at least one particle structure 131 of a deposited material 1631, which may be, by way of non-limiting example, of a metal or metal alloy, in the second portion 602, while depositing a closed coating 1240 of the deposited material 1631 having a thickness of, for example, no more than at least one of about: 100 nm, 50 nm, 25 nm, or 15 nm. In some non-limiting examples, a relative amount of the deposited material 1631 deposited as a discontinuous layer 160 of at least one particle structure 131 in the first portion 601 may correspond to at least one of between about: 1-50%, 2-25%, 5-20%, or 7-10% of the amount of the deposited material 1631 deposited as a closed coating 1240 in the second portion 602, which by way of non-limiting example may correspond to a thickness of no more than at least one of about: 100 nm, 75 nm, 50 nm, 25 nm, or 15 nm.

Without wishing to be bound by any particular theory, it has now been found that a patterning coating 420 containing a material which, when deposited as a thin film, exhibits a relatively high surface energy, may, in some non-limiting examples, form a discontinuous layer 160 of at least one particle structure 131 of a deposited material 1631 in the first portion 601, and a closed coating 1240 of the deposited material 1631 in the second portion 602, including without limitation, in cases where the thickness of the closed coating is, by way of non-limiting example, no more than at least one of about: 100 nm, 75 nm, 50 nm, 25 nm, or 15 nm.

In some non-limiting examples, the patterning coating 420 may comprise a plurality of materials. In some non-limiting examples, the patterning coating 420 may comprise a first material and a second material.

In some non-limiting examples, at least one of the plurality of materials of the patterning coating 420 may serve as an NIC when deposited as a thin film.

In some non-limiting examples, at least one of the plurality of materials of the patterning coating 420 may serve as an NIC when deposited as a thin film, and another material thereof may form an NPC 1820 when deposited as a thin film. In some non-limiting examples, the first material may form an NPC 1820 when deposited as a thin film, and the second material may form an NIC when deposited as a thin film. In some non-limiting examples, the presence of the first material in the patterning coating 420 may result in an increased initial sticking probability thereof compared to cases in which the patterning coating 420 is formed of the second material and is substantially devoid of the first material.

In some non-limiting examples, at least one of the materials of the patterning coating 420 may be adapted to form a surface having a low surface energy when deposited as a thin film. In some non-limiting examples, the first material, when deposited as a thin film, may be adapted to form a surface having a lower surface energy than a surface provided by a thin film comprising the second material.

In some non-limiting examples, the patterning coating 420 may exhibit photoluminescence, including without limitation, by comprising a material which exhibits photoluminescence.

In some non-limiting examples, the patterning coating 420 may exhibit photoluminescence at a wavelength corresponding to the UV spectrum and/or visible spectrum. In some non-limiting examples, photoluminescence may occur at a wavelength (range) corresponding to the UV spectrum, including but not limited to the UVA spectrum, and/or UVB spectrum. In some non-limiting examples, photoluminescence may occur at a wavelength (range) corresponding to the visible spectrum. In some non-limiting examples, photoluminescence may occur at a wavelength (range) corresponding to deep blue or near UV.

In some non-limiting examples, the first material may have a first optical gap, and the second material may have a second optical gap. In some non-limiting examples, the second optical gap may exceed the first optical gap. In some non-limiting examples, a difference between the first optical gap and the second optical gap may exceed at least one of about: 0.3 eV, 0.5 eV, 0.7 eV, 1 eV, 1.3 eV, 1.5 eV, 1.7 eV, 2 eV, 2.5 eV, and/or 3 eV.

In some non-limiting examples, the first optical gap may be no more than at least one of about: 4.1 eV, 3.5 eV, or 3.4 eV. In some non-limiting examples, the second optical gap may exceed at least one of about: 3.4 eV, 3.5 eV, 4.1 eV, 5 eV, or 6.2 eV.

In some non-limiting examples, the first optical gap and/or the second optical gap may correspond to the HOMO-LUMO gap.

In some non-limiting examples, the first material may exhibit photoluminescence at a wavelength corresponding to the UV spectrum and/or visible spectrum. In some non-limiting examples, photoluminescence may occur at a wavelength corresponding to the UV spectrum, including but not limited to the UVA spectrum and/or the UVB spectrum. In some non-limiting examples, photoluminescence may occur at a wavelength corresponding to the visible spectrum. In some non-limiting examples, photoluminescence may occur at a wavelength corresponding to a deep B(lue) region of the visible spectrum.

In some non-limiting examples, the first material may exhibit photoluminescence at a wavelength corresponding to the visible spectrum, and the second material may not exhibit substantial photoluminescence at any wavelength corresponding to the visible spectrum.

In some non-limiting examples, at least one of the materials of the patterning coating 420 that may exhibit photoluminescence may comprise at least one of: a conjugated bond, an aryl moiety, donor-acceptor group, or a heavy metal complex.

By way of non-limiting example, photoluminescence of a coating and/or a material may be observed through a photoexcitation process. In a photoexcitation process, the coating and/or material may be subjected to EM radiation emitted by a source, including without limitation, a UV lamp. When the emitted EM radiation is absorbed by the coating and/or material, the electrons thereof may be temporarily excited. Following excitation, at least one relaxation process may occur, including without limitation, fluorescence and/or phosphorescence, in which EM radiation may be emitted from the coating and/or material. The EM radiation emitted from the coating and/or material during such process may be detected, for example by a photodetector, to characterize the photoluminescence properties of the coating and/or material. As used herein, the wavelength of photoluminescence, in relation to a coating and/or material, may generally refer to a wavelength of EM radiation emitted by such coating and/or material as a result of relaxation of electrons from an excited state. As would be understood by a person skilled in the art, a wavelength of light emitted by the coating and/or material as a result of the photoexcitation process may in some non-limiting examples, be longer than a wavelength of radiation used to initiate photoexcitation. Photoluminescence may be detected and/or characterized using various techniques known in the art, including but not limited to fluorescence microscopy. As used herein, a photoluminescent coating or material may be a coating or material that exhibits photoluminescence at a wavelength when irradiated with an excitation radiation at a certain wavelength. In some non-limiting examples, a photoluminescent coating or material may exhibit photoluminescence at a wavelength that exceeds about 365 nm upon being irradiated with an excitation radiation having a wavelength of 365 nm. A photoluminescent coating may be detected on a substrate 10 using standard optical techniques including without limitation, fluorescence microscopy, which may quantify, measure, and/or investigate the presence of such coating or material.

In some non-limiting examples, an optical gap of the various coatings and/or materials, including without limitation, the first optical gap and/or the second optical gap, may correspond to an energy gap of the coating and/or material from which EM radiation is absorbed or emitted during the photoexcitation process.

In some non-limiting examples, photoluminescence may be detected and/or characterized by subjecting the coating and/or material to EM radiation having a wavelength corresponding to the UV spectrum, including without limitation, the UVA spectrum or the UVB spectrum. In some non-limiting examples, EM radiation for initiating photoexcitation may have a wavelength of about 365 nm.

In some non-limiting examples, the second material may not substantially exhibit photoluminescence at any wavelength corresponding to the visible spectrum. In some non-limiting examples, the second material may not exhibit photoluminescence upon being subjected to EM radiation having a wavelength of at least one of at least about: 300 nm, 320 nm, 350 nm, or 365 nm. In some non-limiting examples, the second material may exhibit insignificant and/or no detectable absorption when subjected to such EM radiation. In some non-limiting examples, the second optical gap of the second material may be wider than the photon energy of the EM radiation emitted by the source, such that the second material does not undergo photoexcitation when subjected to such EM radiation. However, in some non-limiting examples, the patterning coating 420 containing such second material may nevertheless exhibit photoluminescence upon being subjected to EM radiation due to the first material exhibiting photoluminescence. In some non-limiting examples, the presence of the patterning coating 420 may be detected and/or observed using routine characterization techniques such as fluorescence microscopy upon deposition of the patterning coating 420.

In some non-limiting examples, a concentration, including without limitation by weight, of the first material in the patterning coating 420 may be no more than that of the second material in the patterning coating 420. In some non-limiting examples, the patterning coating 420 may comprise at least one of at least about: 0.1 wt. %, 0.2 wt. %, 0.5 wt. %, 0.8 wt. %, 1 wt. %, 3 wt. %, 5 wt. %, 8 wt. %, 10 wt. %, 15 wt. %, or 20 wt. %, of the first material. in some non-limiting examples, the patterning coating 420 may comprise at least one of no more than about: 50 wt. %, 40 wt. %, 30 wt. %, 25 wt. %, 20 wt. %, 15 wt. %, 10 wt. %, 8 wt. %, 5 wt. %, 3 wt. %, or 1 wt. %, of the first material. In some non-limiting examples, a remainder of the patterning coating 420 may be substantially comprised of the second material. In some non-limiting examples, the patterning coating 420 may comprise additional materials, including without limitation, a third material, and/or a fourth material.

In some non-limiting examples, at least one of the materials of the patterning coating 420, including without limitation, the first material and/or the second material, may comprise at least one of F and Si. By way of non-limiting example, at least one of the first material and the second material may comprise at least one of F and Si. In some further non-limiting examples, the first material may comprise F and/or Si, and the second material may comprise F and/or Si. In some non-limiting examples, the first material and the second material both may comprise F. In some non-limiting examples, the first material and the second material both may comprise Si. In some non-limiting examples, each of the first material and the second material may comprise F and/or Si.

In some non-limiting examples, at least one material of the first material and the second material may comprise both F and Si. In some non-limiting examples, one of the first material and the second material may not comprise F and/or Si. In some non-limiting examples, the second material may comprise F and/or Si, and the first material may not comprise F and/or Si.

In some non-limiting examples, at least one of the materials of the patterning coating 420, which for example may be the first material and/or the second material, may comprise F, and at least one of the other materials of the patterning coating 420 may comprise a $sp^2$ carbon. In some non-limiting examples, at least one of the materials of the patterning coating 420, which for example may be the first material and/or the second material, may comprise F, and at least one of the other materials of the patterning coating 420 may comprise a $sp^3$ carbon. In some non-limiting examples, at least one of the materials of the patterning coating 420, which for example may be the first material and/or the second material, may comprise F and a $sp^3$ carbon, and at least one of the other materials of the patterning coating 420 may comprise a $sp^2$ carbon. In some non-limiting examples, at least one of the materials of the patterning coating 420, which for example may be the first material and/or the second material, may comprise F and a $sp^3$ carbon wherein all F bonded to a carbon (C) may be bonded to a $sp^3$ carbon, and at least one of the other materials of the patterning coating 420 may comprise a $sp^2$ carbon. In some non-limiting examples, at least one of the materials of the patterning coating 420, which for example may be the first material and/or the second material, may comprise F and a $sp^3$ carbon wherein all F bonded to C may be bonded to an $sp^3$ carbon, and at least one of the other materials of the patterning coating 420 may comprise a $sp^2$ carbon and may not comprise F. By way of non-limiting example, in any of the foregoing non-limiting examples, "at least one of the materials of the patterning coating 420" may correspond to the second material, and the "at least one of the other materials of the patterning coating 420" may correspond to the first material.

As would be appreciated by those having ordinary skill in the relevant art, the presence of materials in a coating which comprises at least one of: F, $sp^2$ carbon, $sp^3$ carbon, an aromatic hydrocarbon moiety, and/or other functional groups or moieties may be detected using various methods known in the art, including by way of non-limiting example, an X-ray Photoelectron Spectroscopy (XPS).

In some non-limiting examples, at least one of the materials of the patterning coating 420, which by way of non-limiting example may be the first material and/or the second material, may comprise F, and at least one of the other materials of the patterning coating 420 may comprise an aromatic hydrocarbon moiety. In some non-limiting examples, at least one of the materials of the patterning coating 420, which for example may be the first material and/or the second material, may comprise F, and at least one of the materials of the patterning coating 420 may not comprise an aromatic hydrocarbon moiety. In some non-limiting examples, at least one of the materials of the patterning coating 420, which for example may be the first material and/or the second material, may comprise F and may not comprise an aromatic hydrocarbon moiety, and at least one of the other materials of the patterning coating 420 may comprise an aromatic hydrocarbon moiety. In some non-limiting examples, at least one of the materials of the patterning coating 420, which for example may be the first material and/or the second material, may comprise F and may not comprise an aromatic hydrocarbon moiety, and at least one of the other materials of the patterning coating 420 may comprise an aromatic hydrocarbon moiety and may not comprise F. Non-limiting examples of the aromatic hydrocarbon moiety include at least one of: substituted polycyclic aromatic hydrocarbon moiety, unsubstituted polycyclic aromatic hydrocarbon moiety, substituted phenyl moiety, and unsubstituted phenyl moiety.

In some non-limiting examples, at least one of the materials of the patterning coating 420, which for example may be the first material and/or the second material, may comprise F, and at least one of the other materials of the patterning coating 420 may comprise a polycyclic aromatic hydrocarbon moiety. In some non-limiting examples, at least one of the materials of the patterning coating 420, which for example may be the first material and/or the second material, may comprise F, and at least one of the materials of the patterning coating 420 may not comprise a polycyclic aromatic hydrocarbon moiety. In some non-limiting examples, at least one of the materials of the patterning coating 420, which for example may be the first material and/or the second material, may comprise F and may not comprise a polycyclic aromatic hydrocarbon moiety, and at least one of the other materials of the patterning coating 420 may comprise a polycyclic aromatic hydrocarbon moiety. In some non-limiting examples, at least one of the materials of the patterning coating 420, which for example may be the first material and/or the second material, may comprise F and may not comprise a polycyclic aromatic hydrocarbon moiety, and at least one of the other materials of the patterning coating 420 may comprise a polycyclic aromatic hydrocarbon moiety and may not comprise F.

In some non-limiting examples, at least one of the materials of the patterning coating 420, which for example may be the first material and/or the second material, may comprise at least one of a fluorocarbon moiety and a siloxane moiety, and at least one of the other materials of the patterning coating 420 may comprise a polycyclic aromatic hydrocarbon moiety. In some non-limiting examples, at least one of the materials of the patterning coating 420, which for example may be the first material and/or the second material, may comprise at least one of a fluorocarbon moiety and a siloxane moiety, and at least one of the materials of the patterning coating 420 may not comprise a polycyclic aromatic hydrocarbon moiety. In some non-limiting examples, at least one of the materials of the patterning coating 420, which for example may be the first material and/or the second material, may comprise at least one of a fluorocarbon moiety and a siloxane moiety and may not comprise a polycyclic aromatic hydrocarbon moiety, and at least one of the other materials of the patterning coating 420 may comprise a polycyclic aromatic hydrocarbon moiety. In some non-limiting examples, at least one of the materials of the patterning coating 420, which for example may be the first material and/or the second material, may comprise at least one of a fluorocarbon moiety and a siloxane moiety and may not comprise a polycyclic aromatic hydrocarbon moiety, and at least one of the other materials of the patterning coating 420 may comprise a polycyclic aromatic hydrocarbon moiety and may not comprise a fluorocarbon moiety or a siloxane moiety.

In some non-limiting examples, at least one of the materials of the patterning coating 420, which for example may be the first material and/or the second material, may comprise F, and at least one of the other materials of the patterning coating 420 may comprise a phenyl moiety. In some non-limiting examples, at least one of the materials of the patterning coating 420, which for example may be the first material and/or the second material, may comprise F, and at least one of the materials of the patterning coating 420 may not comprise a phenyl moiety. In some non-limiting examples, at least one of the materials of the patterning coating 420, which for example may be the first material and/or the second material, may comprise F and may not comprise a phenyl moiety, and at least one of the other materials of the patterning coating 420 may comprise a phenyl moiety. In some non-limiting examples, at least one of the materials of the patterning coating 420, which for example may be the first material and/or the second material, may comprise F and may not comprise a phenyl moiety, and at least one of the other materials of the patterning coating 420 may comprise a phenyl moiety and may not comprise F.

In some non-limiting examples, at least one of the materials of the patterning coating 420, which for example may be the first material and/or the second material, may comprise at least one of a fluorocarbon moiety and a siloxane moiety, and at least one of the other materials of the patterning coating 420 may comprise a phenyl moiety. In some non-limiting examples, at least one of the materials of the patterning coating 420, which for example may be the first material and/or the second material, may comprise at least one of a fluorocarbon moiety and a siloxane moiety, and at least one of the materials of the patterning coating 420 may not comprise a phenyl moiety. In some non-limiting examples, at least one of the materials of the patterning coating 420, which for example may be the first material and/or the second material, may comprise at least one of a fluorocarbon moiety and a siloxane moiety and may not comprise a phenyl moiety, and at least one of the other materials of the patterning coating 420 may comprise a phenyl moiety. In some non-limiting examples, at least one of the materials of the patterning coating 420, which for example may be the first material and/or the second material, may comprise at least one of a fluorocarbon moiety and a siloxane moiety and may not comprise a phenyl moiety, and at least one of the other materials of the patterning coating 420 may comprise a phenyl moiety and may not comprise a fluorocarbon moiety or a siloxane moiety.

In general, the molecular structures and/or molecular compositions of the materials of the patterning coating 420, which for example may be the first material and the second material, may be different from one another. In some non-limiting examples, the materials may be selected such that they possess at least one property which is substantially similar to, or different from, one another, including without limitation, at least one of: a molecular structure of a monomer, a monomer backbone, and/or a functional group; a presence of a common element; a similarity in molecular structure; a characteristic surface energy; a refractive index; a molecular weight; and a thermal property, including without limitation, a melting temperature, a sublimation temperature, a glass transition temperature, or a thermal decomposition temperature.

A characteristic surface energy, as used herein particularly with respect to a material, may generally refer to a surface energy determined from such material. By way of non-limiting example, a characteristic surface energy may be measured from a surface formed by the material deposited and/or coated in a thin film form. Various methods and theories for determining the surface energy of a solid are known. By way of non-limiting example, a surface energy may be calculated or derived based on a series of contact angle measurements, in which various liquids may be brought into contact with a surface of a solid to measure the contact angle between the liquid-vapor interface and the surface. In some non-limiting examples, a surface energy of a solid surface may be equal to the surface tension of a liquid with the highest surface tension that completely wets the surface. By way of non-limiting example, a Zisman plot may be used to determine a highest surface tension value that would result in complete wetting (i.e. contact angle of 0°) of the surface.

In some non-limiting examples, at least one of the first material and the second material of the patterning coating 420 may be an oligomer.

In some non-limiting examples, the first material may comprise a first oligomer, and the second material may comprise a second oligomer. Each of the first oligomer and the second oligomer may comprise a plurality of monomers.

In some non-limiting examples, at least a fragment of the molecular structure of the at least one of the materials of the patterning coating 420, which may for example be the first material and/or the second material, may be represented by the following formula:

$$(Mon)_n \quad (I)$$

where:

Mon represents a monomer, and n is an integer of at least 2.

In some non-limiting examples, n may be an integer of at least one of between about: 2-00, 2-50, 3-20, 3-15, 3-10, or 3-7.

In some non-limiting examples, the molecular structure of the first material and the second material of the patterning coating 420 may each be independently represented by Formula (I). By way of non-limiting example, the monomer and/or n of the first material may be different from that of the second material. In some non-limiting examples, n of the first material may be the same as n of the second material. In some non-limiting examples, n of the first material may be different from n of the second material. In some non-limiting examples, the first material and the second material may be oligomers.

In some non-limiting examples, the monomer may comprise at least one of F and Si.

In some non-limiting examples, the monomer may comprise a functional group. In some non-limiting examples, at least one functional group of the monomer may have a low surface tension. In some non-limiting examples, at least one functional group of the monomer may comprise at least one of F and Si. Non-limiting examples of such functional group include at least one of: a fluorocarbon group and a siloxane group. In some non-limiting examples, the monomer may comprise a silsesquioxane group.

While some non-limiting examples have been described herein with reference to a first material and a second material, it will be appreciated that the patterning coating may further include at least one additional material, and descriptions regarding the molecular structures and/or properties of the first material, the second material, the first oligomer, and/or the second oligomer may be applicable with respect to additional materials which may be contained in the patterning coating.

The surface tension attributable to a fragment of a molecular structure, including without limitation, a monomer, a monomer backbone unit, a linker, or a functional group, may be determined using various known method in the art. A non-limiting example of such method includes the use of a Parachor, such as may be further described, by way of non-limiting example, in "Conception and Significance of the Parachor", *Nature* 196: 890-891. In some non-limiting examples, at least one functional group of the monomer may have a surface tension of no more than at least one of about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, or 10 dynes/cm.

In some non-limiting examples, the monomer may comprise at least one of a $CF_2$ and a $CF_2H$ moiety. In some non-limiting examples, the monomer may comprise at least one of a $CF_2$ and a $CF_3$ moiety. In some non-limiting examples, the monomer may comprise a $CH_2CF_3$ moiety. In some non-limiting examples, the monomer may comprise at least one of C and O. In some non-limiting examples, the monomer may comprise a fluorocarbon monomer. In some non-limiting examples, the monomer may comprise at least one of: a vinyl fluoride moiety, a vinylidene fluoride moiety, a tetrafluoroethylene moiety, a chlorotrifluoroethylene moiety, a hexafluoropropylene moiety, or a fluorinated 1,3-dioxole moiety.

In some non-limiting examples, the monomer may comprise a monomer backbone and a functional group. In some non-limiting examples, the functional group may be bonded, either directly or via a linker group, to the monomer backbone. In some non-limiting examples, the monomer may comprise the linker group, and the linker group may be bonded to the monomer backbone and to the functional group. In some non-limiting examples, the monomer may comprise a plurality of functional groups, which may be the same or different from one another. In such examples, each functional group may be bonded, either directly or via a linker group, to the monomer backbone. In some non-limiting examples, where a plurality of functional groups is present, a plurality of linker groups may also be present.

In some non-limiting examples, the molecular structure of at least one of the materials of the patterning coating 420, which may be the first material and/or the second material, may comprise a plurality of different monomers. In some non-limiting examples, such molecular structure may comprise monomer species that have different molecular composition and/or molecular structure. Non-limiting examples of such molecular structure include those represented by the following formulae:

$$(Mon^A)_k(Mon^B)_m \quad (I-1)$$

$$(Mon^A)_k(Mon^A)_m(Mon^C)_o \quad (I-2)$$

where:

$Mon^A$, $Mon^B$, and $Mon^C$ each represent a monomer specie, and k, m, and o each represent an integer of at least 2.

In some non-limiting examples, k, m, and o each represent an integer of at least one of between about: 2-100, 2-50, 3-20, 3-15, 3-10, or 3-7. Those having ordinary skill in the relevant art will appreciate that various non-limiting examples and descriptions regarding monomer, Mon, may be applicable with respect to each of $Mon^A$, $Mon^B$, and $Mon^C$.

In some non-limiting examples, the monomer may be represented by the following formula:

$$M\text{-}(L\text{-}R_x)_y \quad (II)$$

where:

M represents the monomer backbone unit,

L represents the linker group,

R represents the functional group, x is an integer between 1 and 4, and y is an integer between 1 and 3.

In some non-limiting examples, the linker group may be represented by at least one of: a single bond, O, N, NH, C, CH, $CH_2$, and S.

Various non-limiting examples of the functional group which have been described herein may apply with respect to R of Formula (II). In some non-limiting examples, the functional group R may comprise an oligomer unit, and the oligomer unit may further comprise a plurality of functional group monomer units. In some non-limiting examples, a functional group monomer unit may be at least one of: $CH_2$ or $CF_2$. In some non-limiting examples, a functional group may comprise a $CH_2CF_3$ moiety. For example, such functional group monomer units may be bonded together to form at least one of: an alkyl or an fluoroalkyl oligomer unit. In some non-limiting examples, the oligomer unit may further comprise a functional group terminal unit. In some non-limiting examples, the functional group terminal unit may be arranged at a terminal end of the oligomer unit and bonded to a functional group monomer unit. In some non-limiting examples, the terminal end at which the functional group terminal unit may be arranged may correspond to a fragment of the functional group that may be distal to the monomer backbone unit. In some non-limiting examples, the functional group terminal unit may comprise at least one of: $CF_2H$ or $CF_3$.

In some non-limiting examples, the monomer backbone unit M may have a high surface tension. In some non-limiting examples, the monomer backbone unit may have a higher surface tension than at least one of the functional group(s) R bonded thereto. In some non-limiting examples, the monomer backbone unit may have a higher surface tension than any functional group R bonded thereto.

In some non-limiting examples, the monomer backbone unit may have a surface tension of at least one of at least about: 25 dynes/cm, 30 dynes/cm, 40 dynes/cm, 50 dynes/cm, 75 dynes/cm, 100 dynes/cm; 150 dynes/cm, 200 dynes/cm, 250 dynes/cm, 500 dynes/cm, 1,000 dynes/cm, 1,500 dynes/cm, or 2,000 dynes/cm.

In some non-limiting examples, the monomer backbone unit may comprise phosphorus (P) and N, including without limitation, a phosphazene, in which there is a double bond between P and N and may be represented as "NP" or as "N═P". In some non-limiting examples, the monomer backbone unit may comprise Si and O, including without limitation, silsesquioxane, which may be represented as $SiO_{3/2}$.

In some non-limiting examples, at least a portion of the molecular structure of the at least one of the materials of the patterning coating 420, which may for example be the first material and/or the second material, is represented by the following formula:

$$(NP\text{-}(L\text{-}R_x)_y)_n \quad (III)$$

where:

NP represents the phosphazene monomer backbone unit,

L represents the linker group,

R represents the functional group, x is an integer between 1 and 4, y is an integer between 1 and 3, and n is an integer of at least 2.

In some non-limiting examples, the molecular structure of the first material and/or the second material may be represented by Formula (III). In some non-limiting examples, at least one of the first material and the second material may be a cyclophosphazene. In some non-limiting examples, the molecular structure of the cyclophosphazene may be represented by Formula (III).

In some non-limiting examples, L may represent oxygen, x may be 1, and R may represent a fluoroalkyl group. In some non-limiting examples, at least a fragment of the molecular structure of the at least one material of the patterning coating 420, which may for example be the first material and/or the second material, may be represented by the following formula:

$$(NP(OR_f)_2)_n \quad \text{(IV)}$$

where:

$R_f$ represents the fluoroalkyl group, and n is an integer between 3 and 7.

In some non-limiting examples, the fluoroalkyl group may comprise at least one of: a $CF_2$ group, a $CF_2H$ group, $CH_2CF_3$ group, and a $CF_3$ group. In some non-limiting examples, the fluoroalkyl group may be represented by the following formula:

(V)

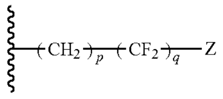

where:

p is an integer of 1 to 5;

q is an integer of 6 to 20; and

Z represents hydrogen or F.

In some non-limiting examples, p may be 1 and q may be an integer between 6 and 20.

In some non-limiting examples, the fluoroalkyl group $R_f$ in Formula (IV) may be represented by Formula (V).

In some non-limiting examples, at least a fragment of the molecular structure of at least one of the materials of the patterning coating 420, which may for example be the first material and/or the second material, may be represented by the following formula:

$$(SiO_{3/2}\text{-}(L\text{-}R))_n \quad \text{(VI)}$$

where:

L represents the linker group,

R represents the functional group, and n is an integer between 6 and 12.

In some non-limiting embodiments, L may represent the presence of at least one of: a single bond, O, substituted alkyl, or unsubstituted alkyl. In some non-limiting examples, n may be 8, 10, or 12. In some non-limiting examples R may comprise a functional group with low surface tension. In some non-limiting examples, R may comprise at least one of: a F-containing group and a Si-containing group. In some non-limiting examples, R may comprise at least one of: a fluorocarbon group and a siloxane-containing group. In some non-limiting examples, R may comprise at least one of: a $CF_2$ group and a $CF_2H$ group. In some non-limiting examples, R may comprise at least one of: a $CF_2$ and a $CF_3$ group. In some non-limiting examples, R may comprise a $CH_2CF_3$ group. In some non-limiting examples, the material represented by Formula (VI) may be a polyoctahedral silsesquioxane.

In some non-limiting examples, at least a fragment of the molecular structure of at least one of the materials of the patterning coating 420, which may for example be the first material and/or the second material, may be represented by the following formula:

$$(SiO_{3/2}\text{—}R_f)_n \quad \text{(VII)}$$

where:

n is an integer of 6-12, and $R_f$ represents a fluoroalkyl group.

In some non-limiting examples n may be 8, 10, or 12. In some non-limiting examples, $R_f$ may comprise a functional group with low surface tension. In some non-limiting examples, $R_f$ may comprise at least one of: a $CF_2$ moiety and a $CF_2H$ moiety. In some non-limiting examples, $R_f$ may comprise at least one of: a $CF_2$ moiety and a $CF_3$ moiety. In some non-limiting examples, $R_f$ may comprise a $CH_2CF_3$ moiety. In some non-limiting examples, the material represented by Formula (VII) may be a polyoctahedral silsesquioxane.

In some non-limiting examples, the fluoroalkyl group, $R_f$, in Formula (VII) may be represented by Formula (V).

In some non-limiting examples, at least a fragment of the molecular structure of at least one of the materials of the patterning coating 420, which may for example be the first material and/or the second material, may be represented by the following formula:

$$(SiO_{3/2}\text{—}(CH_2)_x(CF_3))_n \quad \text{(VIII)}$$

where:

x is an integer between 1 and 5, and n is an integer between 6 and 12.

In some non-limiting examples, n may be 8, 10, or 12.

In some non-limiting examples, the compound represented by Formula (VIII) may be a polyoctahedral silsesquioxane.

In some non-limiting examples, the functional group R and/or the fluoroalkyl group $R_f$ may be selected independently upon each occurrence of such group in any of the foregoing formulae. It will also be appreciated that any of the foregoing formulae may represent a sub-structure of the compound, and additional groups or moieties may be present, which are not explicitly shown in the above formulae. It will also be appreciated that various formulae provided in the present application may represent linear, branched, cyclic, cyclo-linear, and/or cross-linked structures.

In some non-limiting examples, the patterning coating 420 may comprise at least one material represented by at least one of the following Formulae: (I), (I-1), (I-2), (II), (III), (IV), (VI), (VII), and (VIII), and at least one material exhibiting at least one of the following characteristics: (a) includes an aromatic hydrocarbon moiety, (b) includes an sp2 carbon, (c) includes a phenyl moiety, (d) has a characteristic surface energy greater than about 20 dynes/cm, and (e) exhibits photoluminescence, including without limitation, exhibiting photoluminescence at a wavelength of at least about 365 nm upon being irradiated by an excitation radiation having a wavelength of about 365 nm.

In some non-limiting examples, the patterning coating may further comprise a third material that is different from the first material and the second material. In some non-limiting examples, the third material may comprise, a common monomer with at least one of the first material and the second material.

In some non-limiting examples, a difference in the sublimation temperature of the plurality of materials of the patterning coating 420, including but not limited to a difference between the first material and the second material, may be no more than at least one of about: 5° C., 10° C., 15° C., 20° C., 30° C., 40° C., or In some non-limiting examples, at least one of the materials of the patterning coating 420, including without limitation, the first material and/or the second material, may comprise at least one of F and Si, and the sublimation temperatures of the materials of the patterning coating 420 may differ by no more than at least one of about: 5° C., 10° C., 15° C., 20° C., 25° C., 40° C., or 50° C. In some non-limiting examples, at least one of the materials of the patterning coating 420, including without limitation, the first material and/or the second material, may comprise at least one of: a fluorocarbon moiety and a siloxane moiety, and the sublimation temperatures of the materials of the patterning coating 420 may differ by no more than at least one of about: 5° C., 10° C., 15° C., 20° C., 25° C., 40° C., or 50° C.

In some non-limiting examples, a difference in a melting temperature of the plurality of materials of the patterning coating 420, including but not limited to a difference between the first NIC material and the second NIC material, may be no more than at least one of about: 5° C., 10° C., 15° C., 20° C., 30° C., 40° C., or 50° C. In some non-limiting examples, at least one of the materials of the patterning coating 420, including without limitation, the first material and/or the second material, may comprise at least one of: F and Si, and the melting temperatures of the materials of the patterning coating 420 may differ by no more than at least one of about: 5° C., 15° C., 20° C., 25° C., 40° C., or 50° C. In some non-limiting examples, at least one of the materials of the patterning coating 420, including without limitation, the first material and/or the second material, may comprise at least one of: a fluorocarbon moiety and a siloxane moiety, and the melting temperatures of the materials of the patterning coating 420 may differ by no more than at least one of about: 5° C., 10° C., 15° C., 20° C., 25° C., 40° C., or 50° C.

In some non-limiting examples, at least one of the materials of the patterning coating 420, including without limitation, the first material and/or the second material, may have a low characteristic surface energy. In some non-limiting examples, at least one of the materials of the patterning coating 420, including without limitation, the first material and/or the second material, may have a low characteristic surface energy, and at least one of the materials of the patterning coating 420 may comprise at least one of: F and Si. In some non-limiting examples, at least one of the materials of the patterning coating 420, including without limitation, the first material and/or the second material, may a low characteristic surface energy, may comprise at least one of F and Si, and at least one other material of the patterning coating 420 may have a high characteristic surface energy. In some non-limiting examples, the presence of F and Si may be accounted for by the presence of a fluorocarbon moiety and a siloxane moiety, respectively. In some non-limiting examples, at least one of the materials, including without limitation, the second material, may have a low characteristic surface energy of at least one of between about: 10-20 dynes/cm, 12-20 dynes/cm, 15-20 dynes/cm, or 17-19 dynes/cm, and another material, including without limitation, the first material, may have a high characteristic surface energy of at least one of between about: 20-100 dynes/cm, 20-50 dynes/cm, or 25-45 dynes/cm. In some non-limiting examples, at least one of the materials may comprise at least one of: F and Si. In some non-limiting examples, the second material may comprise at least one of: F and Si.

In some non-limiting examples, at least one of the materials of the patterning coating 420, including without limitation, the second material, may a low characteristic surface energy of no more than about 20 dynes/cm and may comprise at least one of: F and/or Si, and another material, including without limitation, the first material, may have a characteristic surface energy of at least about 20 dynes/cm.

In some non-limiting examples, at least one of the materials of the patterning coating 420, including without limitation, the second material, may a low characteristic surface energy of no more than about 20 dynes/cm and may comprise at least one of: a fluorocarbon moiety and a siloxane moiety, and another material of the patterning coating 420, including without limitation, the first material, may have a characteristic surface energy of at least about 20 dynes/cm.

In some non-limiting examples, the surface energy of each of the two or more materials of the patterning coating 420, including but not limited to those of the first material and the second material, is less than about 25 dynes/cm, less than about 21 dynes/cm, less than about 20 dynes/cm, less than about 19 dynes/cm, less than about 18 dynes/cm, less than about 17 dynes/cm, less than about 16 dynes/cm, less than about 15 dynes/cm, less than about 14 dynes/cm, less than about 13 dynes/cm, less than about 12 dynes/cm, less than about 11 dynes/cm, or less than about 10 dynes/cm.

In some non-limiting examples, a refractive index at a wavelength at least one of 500 nm and 460 nm of at least one of the materials of the patterning coating 420, including without limitation, the first material and the second material, may be no more than at least one of about: 1.5, 1.45, 1.44, 1.43, 1.42, or 1.41. In some non-limiting examples, the patterning coating 420 may comprise at least one material that exhibits photoluminescence, and the patterning coating 420 may have a refractive index, at a wavelength of at least one of: 500 nm and 460 nm, of no more than at least one of about: 1.5, 1.45, 1.44, 1.43, 1.42, or 1.41.

In some non-limiting examples, a molecular weight of at least one of the materials of the patterning coating 420, including without limitation, the first material and the second material, may exceed at least one of about: 750, 1,000, 1,500, 2,000, 2,500, or 3,000.

In some non-limiting examples, a molecular weight of at least one of the materials of the patterning coating 420, including without limitation, the first material and the second material, may be no more than at least one of about: 10,000, 7,500, or 5,000.

In some non-limiting examples, the patterning coating 420 may comprise a plurality of materials exhibiting similar thermal properties, wherein at least one of the materials may exhibit photoluminescence. In some non-limiting examples, the patterning coating 420 may comprise a plurality of materials with similar thermal properties, wherein at least one of the materials may photoluminescence, and wherein at least one of the materials, may comprise F or Si. In some non-limiting examples, the patterning coating 420 may comprise a plurality of materials with similar thermal properties, including without limitation, a melting temperature or a sublimation temperature of the materials, wherein at least one of the materials may exhibit photoluminescence at a wavelength of at least about 365 nm when excited by a radiation having an excitation wavelength of about 365 nm, and wherein at least one of the materials may comprise at least one of: F and Si.

In some non-limiting examples, the patterning coating 420 may comprise a plurality of having at least one of: at least one common element or at least one common sub-structure, wherein at least one of the materials may exhibit photoluminescence. In some non-limiting examples, at least one of the materials, may comprise F and Si. In some non-limiting examples, the patterning coating 420 may comprise a plurality of materials with similar thermal properties, wherein at least one of the materials may exhibit photoluminescence at a wavelength that exceeds at least one of about 365 nm when excited by a radiation having an excitation wavelength of about 365 nm, and wherein at least one of the materials, may comprise at least one of: F and Si. In some non-limiting examples, the at least one common element may comprise at least one of: F and Si. In some non-limiting examples, the at least one common sub-structure may comprise at least one of: fluorocarbon, fluoroalkyl and siloxyl.

In some non-limiting examples, a method for manufacturing an opto-electronic device 700 may comprise actions of: depositing a patterning coating on a first exposed layer surface 11 of the device 700 in a first portion 601 of a lateral aspect thereof; and depositing a deposited material 1631 on a second exposed layer surface 11 of the device 700 in a second portion 602 of the lateral aspect thereof. An initial sticking probability against deposition of the deposited material 1631 onto an exposed layer surface 11 of the patterning coating 420 in the first portion 601, may be substantially less than the initial sticking probability against deposition of the deposited material 1631 onto an exposed layer surface 11 in the second portion 602, such that the exposed layer surface 11 of the patterning coating 420 in the first portion 601 may be substantially devoid of a closed coating 1240 of the deposited material 1631. The patterning coating 420 deposited on the first exposed layer surface 11 of the device 700 may comprises a first material and a second material.

In some non-limiting examples, depositing the patterning coating 420 on the first exposed layer surface 11 of the device 700 may comprise providing a mixture containing a plurality of materials, and causing the mixture to be deposited onto the first exposed layer surface 11 of the device 700 to form the patterning coating 420 thereon. In some non-limiting examples, the mixture may comprise the first material and the second material. In some non-limiting examples, the first material and the second material may both be deposited onto the first exposed layer surface 11 to form the patterning coating 420 thereon.

In some non-limiting examples, the mixture containing the plurality of materials may be deposited onto the first exposed layer surface 11 of the device 700 by a PVD process, including without limitation, thermal evaporation. In some non-limiting examples, the patterning coating 420 may be formed by evaporating the mixture from a common evaporation source and causing the mixture to be deposited on the first exposed layer surface 11 of the device 700. In some non-limiting examples, the mixture containing, by way of non-limiting example, the first material and the second material, may be placed in a common crucible and/or evaporation source to be heated under vacuum. Once the evaporation temperature of the materials is reached, a vapor flux 1632 generated therefrom may be directed towards the first exposed layer surface 11 of the device 700 to cause the deposition of the patterning coating 420 thereon.

In some non-limiting examples, the patterning coating 420 may be deposited by co-evaporation of the first material and the second material. In some non-limiting examples, the first material may be evaporated from a first crucible and/or first evaporation source, and the second material may be concurrently evaporated from a second crucible and/or second evaporation source such that the mixture may be formed in the vapor phase, and may be co-deposited onto the first exposed layer surface 11 to provide the patterning coating 420 thereon.

In order to evaluate properties of certain example patterning coatings 420 containing at least two materials, a series of samples were fabricated by depositing, in vacuo, an approximately 20 nm thick layer of an organic material that may be used as an HTL material, followed by depositing, over the organic material layer, a nucleation modifying coating having varying compositions as summarized in Table 15 below.

TABLE 15

| Sample Identifier | Composition of Nucleation Modifying Coating |
|---|---|
| Sample 1 | Patterning Material (15 nm) |
| Sample 2 | Patterning Material: PL Material 1 (0.5%, 15 nm) |
| Sample 3 | Patterning Material: PL Material 2 (0.5%, 15 nm) |
| Sample 4 | PL Material 1 (10 nm) |
| Sample 5 | PL Material 2 (10 nm) |
| Sample 6 | No nucleation modifying coating provided |

In the present example, the Patterning Material was selected such that, for example when deposited as a thin film, the Patterning Material exhibits a low initial sticking probability against deposition of the deposited material(s) 1631, including without limitation, at least one of: Ag and Yb.

In the present example, PL Material 1 and PL Material 2 were selected such that, by way of non-limiting example, when deposited as a thin film, each of PL Material 1 and PL Material 2 may exhibit photoluminescence detectable by standard optical measurement techniques including without limitation, fluorescence microscopy.

In Table 15, Sample 1 is a comparison sample in which the nucleation modifying coating was provided by depositing the Patterning Material. Sample 2 is an example sample in which the nucleation modifying coating was provided by co-depositing the Patterning Material and PL Material 1 together to form a coating containing PL Material 1 in a concentration of 0.5 vol. %. Sample 3 is an example sample in which the nucleation modifying coating was provided by co-depositing the Patterning Material and PL Material 2 together to form a coating containing PL Material 2 in a concentration of 0.5 vol. %. Sample 4 is a comparison sample in which the nucleation modifying coating was provided by depositing PL Material 1. Sample 5 is a comparison sample in which the nucleation modifying coating was provided by depositing PL Material 2. Sample 6 is a comparison sample in which no nucleation modifying coating was provided over the organic material layer.

Figure 13:
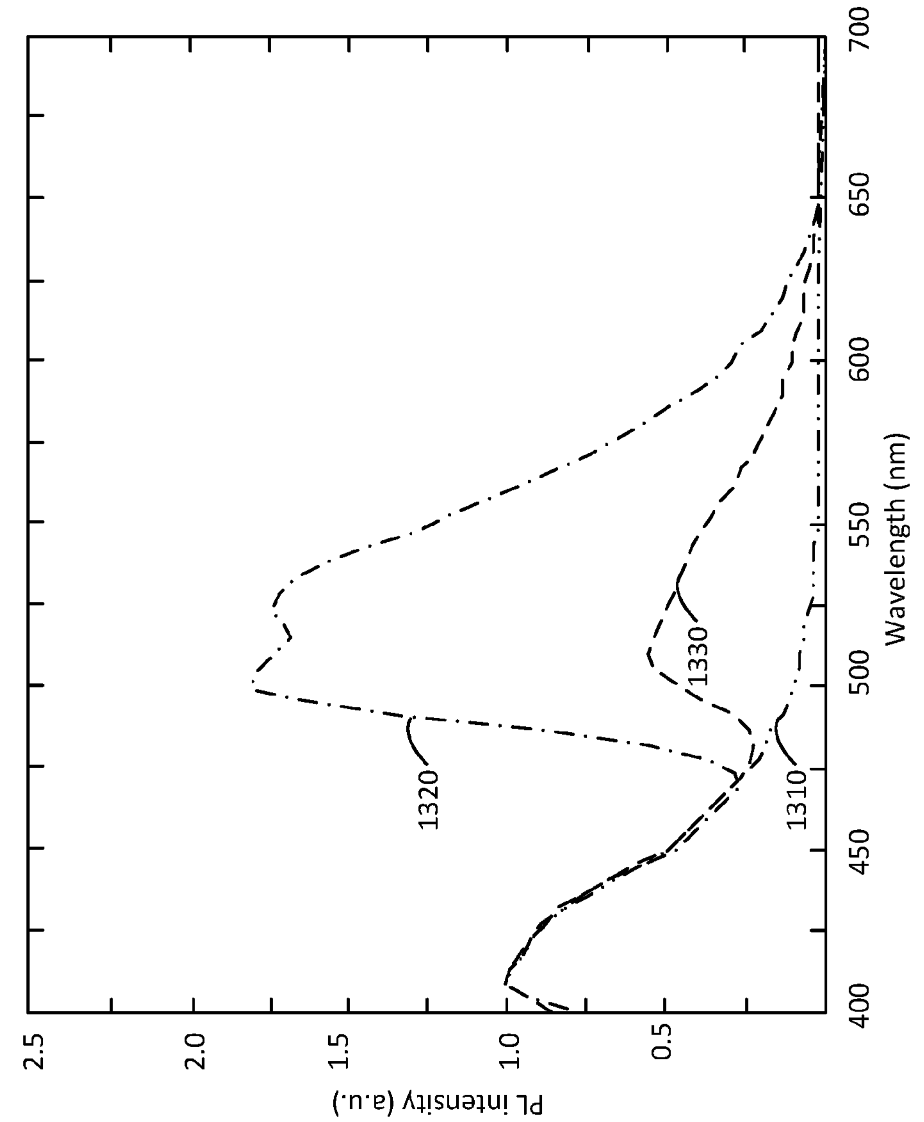
FIG. 13 is a plot of photoluminescence intensity as a function of wavelength for various experimental samples.

The photoluminescence (PL) response of each of Sample 1 1310, Sample 2 1320, and Sample 3 1330, and Sample 6 (not shown) were measured and plotted as shown in FIG. 13. It was observed that the PL intensities of Sample 1 and Sample 6 were identical, thus indicating that the Patterning Material does not exhibit photoluminescence in the detected wavelength range. For sake of simplicity, the PL intensity of Sample 6 was not plotted in FIG. 13. For each of Sample 2 and Sample 3, photoluminescence was detected in wavelengths of around 500 nm to about 600 nm.

Each of Samples 1 to 6 was then subjected to an open mask deposition of Yb, followed by Ag. Specifically, the surfaces of the nucleation modifying coatings formed by the above materials were subjected to an open mask deposition of Yb, followed by Ag. More specifically, each sample was subjected to a Yb vapor flux 1632 until a reference thickness of about 1 nm was reached, followed by an Ag vapor flux 1632 until a reference thickness of about 12 nm was reached. Once the samples were fabricated, optical transmission measurements were taken to determine the relative amount of Yb and/or Ag deposited on the exposed layer surface 11 of the nucleation modifying coatings. As will be appreciated, samples having relatively little to no metal present thereon may be substantially transparent, while samples with metal deposited thereon, particularly as a closed coating 1240, may generally exhibit a substantially lower light transmittance. Accordingly, the relative performance of various example coatings as a patterning coating 420 may be assessed by measuring the EM radiation transmission, which may directly correlates to an amount or thickness of metallic deposited material deposited thereon from deposition of either of both of the Yb of Ag.

Figure 14:
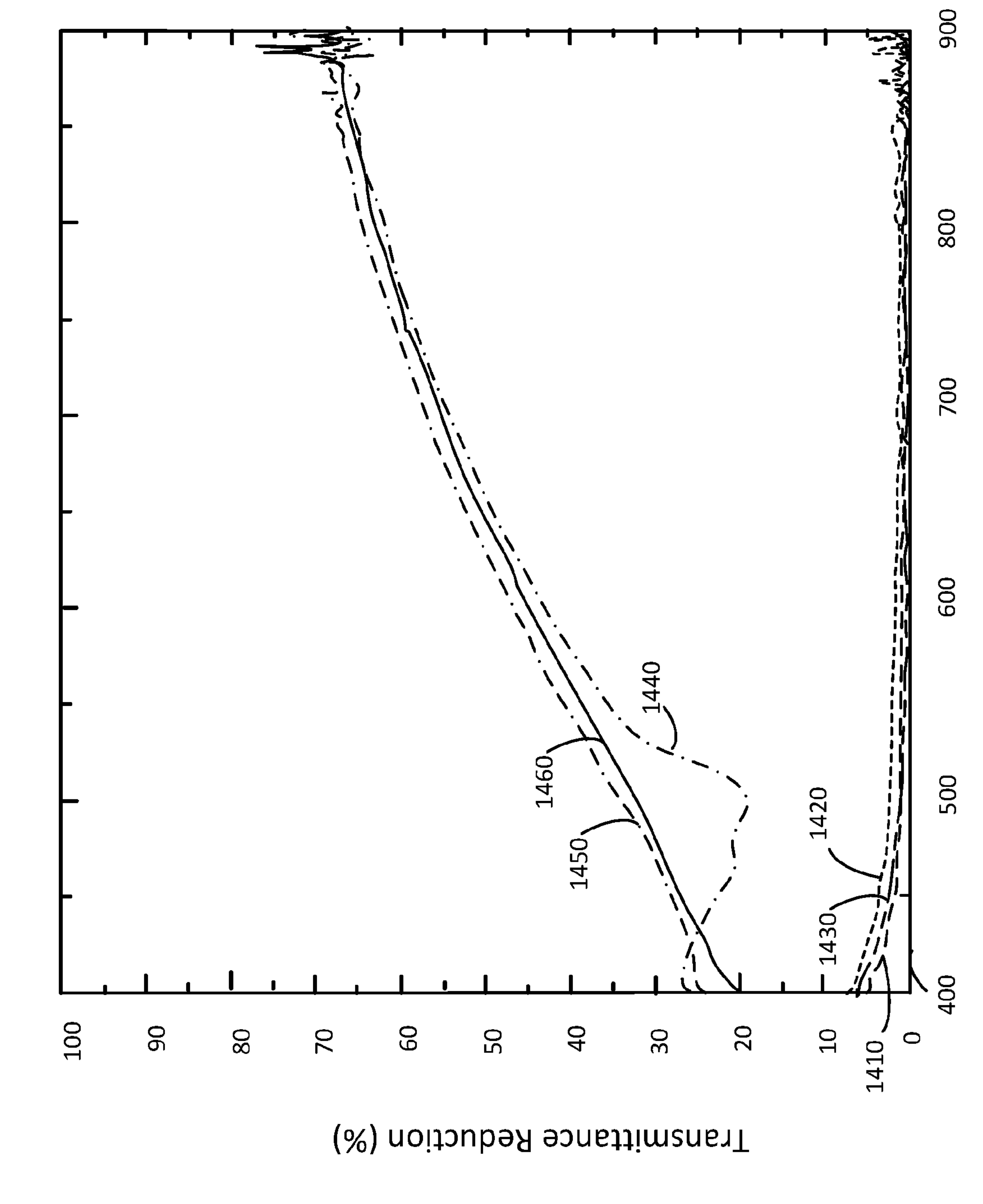
FIG. 14 is a plot of transmittance reduction as a function of wavelength for various experimental samples.

The reduction in optical transmittance as a function of wavelength of each of Sample 1 1410, Sample 2 1420, Sample 3 1430, Sample 4 1440, Sample 5 1450, and Sample 6 1460 were measured and plotted as shown in FIG. 14. Additionally, a reduction in optical transmittance at a wavelength of 600 nm after each sample was subjected to an Ag vapor flux was measured and summarized in Table 16 below.

TABLE 16

| Sample Identifier | Transmittance Reduction (%) at $\lambda$ = 600 nm |
|---|---|
| Sample 1 | <1% |
| Sample 2 | <2% |
| Sample 3 | <1% |
| Sample 4 | 43% |
| Sample 5 | 47% |
| Sample 6 | 45% |

Specifically, the transmittance reduction (%) for each sample in Table 15 was determined by measuring the light transmission through the sample before and after the exposure to the Yb and Ag vapor flux 1632, and expressing the reduction in the EM radiation transmittance as a percentage.

As may be seen, Sample 1, Sample 2, and Sample 3 exhibited a relatively low transmittance reduction of less than 2%, or in the case of Samples 1 and 3, less than 1%. Accordingly, it may be observed that the nucleation modifying coatings provided for these samples acted as an NIC. By contrast, Sample 4, Sample 5, and Sample 6 each exhibited a transmittance reduction of 43%, 47%, and 45%, respectively. Accordingly, the nucleation modifying coatings provided for these samples did not act as an NIC but may have indeed acted as an NPC 1820.

Moreover, it was found that Sample 1, in which the patterning coating 420 was comprised of substantially only the NIC Material, did not exhibit photoluminescence. However, Sample 2 and Sample 3 in which the patterning coating 420 comprised PL Material 1 and PL Material 2, respectively, in addition to the NIC material, were found to exhibit photoluminescence while also acting as an NIC by providing a surface with low initial sticking probability against the deposition of the deposited material 1631.

Deposited Layer

In some non-limiting examples, in the second portion 602 of the lateral aspect of the device 1200, a deposited layer 1230 comprising a deposited material 1631 may be disposed as a closed coating 1240 on an exposed layer surface 11 of an underlying layer, including without limitation, the substrate 10.

In some non-limiting examples, the deposited layer 1230 may comprise a deposited material 1631.

In some non-limiting examples, the deposited material 1631 may comprise an element selected from at least one of: potassium (K), sodium (Na), lithium (Li), barium (Ba), cesium (Cs), Yb, Ag, gold (Au), Cu, aluminum (Al), Mg, Zn, Cd, tin (Sn), or yttrium (Y). In some non-limiting examples, the element may comprise at least one of: K, Na, Li, Ba, Cs, Yb, Ag, Au, Cu, Al, and/or Mg. In some non-limiting examples, the element may comprise at least one of: Cu, Ag, and/or Au. In some non-limiting examples, the element may be Cu. In some non-limiting examples, the element may be Al. In some non-limiting examples, the element may comprise at least one of: Mg, Zn, Cd, or Yb. In some non-limiting examples, the element may comprise at least one of: Mg, Ag, Al, Yb, or Li. In some non-limiting examples, the element may comprise at least one of: Mg, Ag, or Yb. In some non-limiting examples, the element may comprise at least one of: Mg, or Ag. In some non-limiting examples, the element may be Ag.

In some non-limiting examples, the deposited material 1631 may be and/or comprise a pure metal. In some non-limiting examples, the deposited material 1631 may be at least one of: pure Ag or substantially pure Ag. In some non-limiting examples, the substantially pure Ag may have a purity of at least one of at least about: 95%, 99%, 99.9%, 99.99%, 99.999%, or 99.9995%. In some non-limiting examples, the deposited material 1631 may be at least one of: pure Mg or substantially pure Mg. In some non-limiting examples, the substantially pure Mg may have a purity of at least one of at least about: 95%, 99%, 99.9%, 99.99%, 99.999%, or 99.9995%.

In some non-limiting examples, the deposited material 1631 may comprise an alloy. In some non-limiting examples, the alloy may be at least one of: an Ag-containing alloy, an Mg-containing alloy, or an AgMg-containing alloy. In some non-limiting examples, the AgMg-containing alloy may have an alloy composition that may range from about 1:10 (Ag:Mg) to about 10:1 by volume.

In some non-limiting examples, the deposited material 1631 may comprise other metals in place of, and/or in combination with, Ag. In some non-limiting examples, the deposited material 1631 may comprise an alloy of Ag with at least one other metal. In some non-limiting examples, the deposited material 1631 may comprise an alloy of Ag with at least one of: Mg, or Yb. In some non-limiting examples, such alloy may be a binary alloy having a composition between about 5-95 vol. % Ag, with the remainder being the other metal. In some non-limiting examples, the deposited material 1631 may comprise Ag and Mg. In some non-limiting examples, the deposited material 1631 may comprise an Ag:Mg alloy having a composition between about 1:10-10:1 by volume. In some non-limiting examples, the deposited material 1631 may comprise Ag and Yb. In some non-limiting examples, the deposited material 1631 may comprise a Yb:Ag alloy having a composition between about 1:20-10:1 by volume. In some non-limiting examples, the deposited material 1631 may comprise Mg and Yb. In some non-limiting examples, the deposited material 1631 may comprise an Mg:Yb alloy. In some non-limiting examples, the deposited material 1631 may comprise Ag, Mg, and Yb. In some non-limiting examples, the deposited layer 1230 may comprise an Ag:Mg:Yb alloy.

In some non-limiting examples, the deposited layer 1230 may comprise at least one additional element. In some non-limiting examples, such additional element may be a non-metallic element. In some non-limiting examples, the non-metallic element may be at least one of: O, S, N, or C. It will be appreciated by those having ordinary skill in the relevant art that, in some non-limiting examples, such additional element(s) may be incorporated into the deposited layer 1230 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the deposited layer 1230. In some non-limiting examples, a concentration of the non-metallic element in the deposited material 1631 may be no more than at least one of about: 1%, 0.1%, 0.01%, 0.001%, 0.00001%, 0.000001%, or 0.0000001%. In some non-limiting examples, the deposited layer 1230 may have a composition in which a combined amount of and C therein may be no more than at least one of about: 10%, 5%, 1%, 0.1%, 0.001%, 0.0001%, 0.00001%, 0.000001%, or 0.0000001%.

It has now been found, somewhat surprisingly, that reducing a concentration of certain non-metallic elements in the deposited layer 1230, particularly in cases wherein the deposited layer 1230 may be substantially comprised of metal(s), and/or metal alloy(s), may facilitate selective deposition of the deposited layer 1230. Without wishing to be bound by any particular theory, it may be postulated that certain non-metallic elements, such as, by way of non-limiting example, O, or C, when present in the vapor flux 1632 of the deposited layer 1230, and/or in the deposition chamber, and/or environment, may be deposited onto the surface of the patterning coating 420 to act as nucleation sites for the metallic element(s) of the deposited layer 1230. It may be postulated that reducing a concentration of such non-metallic elements that could act as nucleation sites may facilitate reducing an amount of deposited material 1631 deposited on the exposed layer surface 11 of the patterning coating 420.

In some non-limiting examples, the deposited material 1631 may be deposited on a metal-containing underlying layer. In some non-limiting examples, the deposited material 1631 and the underlying layer thereunder may comprise a common metal.

In some non-limiting examples, the deposited layer 1230 may comprise a plurality of layers of the deposited material 1631. In some non-limiting examples, the deposited material 1631 of a first one of the plurality of layers may be different from the deposited material 1631 of a second one of the plurality of layers. In some non-limiting examples, the deposited layer 1230 may comprise a multilayer coating. In some non-limiting examples, such multilayer coating may be at least one of: Yb/Ag, Yb/Mg, Yb/Mg:Ag, Yb/Yb:Ag, Yb/Ag/Mg, or Yb/Mg/Ag.

In some non-limiting examples, the deposited material 1631 may comprise a metal having a bond dissociation energy, of no more than at least one of about: 300 kJ/mol, 200 kJ/mol, 165 kJ/mol, 150 kJ/mol, 100 kJ/mol, 50 kJ/mol, or 20 kJ/mol.

In some non-limiting examples, the deposited material 1631 may comprise a metal having an electronegativity that is no more than at least one of about: 1.4, 1.3, or 1.2.

In some non-limiting examples, a sheet resistance of the deposited layer 1230 may generally correspond to a sheet resistance of the deposited layer 1230, measured or determined in isolation from other components, layers, and/or parts of the device 100. In some non-limiting examples, the deposited layer 1230 may be formed as a thin film. Accordingly, in some non-limiting examples, the characteristic sheet resistance for the deposited layer 1230 may be determined, and/or calculated based on the composition, thickness, and/or morphology of such thin film. In some non-limiting examples, the sheet resistance may be no more than at least one of about: 10Ω/□, 5Ω/□, 1Ω/□, 0.5Ω/□, 0.2Ω/□, or 0.1Ω/□.

In some non-limiting examples, the deposited layer 1230 may be disposed in a pattern that may be defined by at least one region therein that is substantially devoid of a closed coating 1240 of the deposited layer 1230. In some non-limiting examples, the at least one region may separate the deposited layer 1230 into a plurality of discrete fragments thereof. In some non-limiting examples, each discrete fragment of the deposited layer 1230 may be a distinct second portion 602. In some non-limiting examples, the plurality of discrete fragments of the deposited layer 1230 may be physically spaced apart from one another in the lateral aspect thereof. In some non-limiting examples, at least two of such plurality of discrete fragments of the deposited layer 1230 may be electrically coupled. In some non-limiting examples, at least two of such plurality of discrete fragments of the deposited layer 1230 may be each electrically coupled with a common conductive layer or coating, including without limitation, the underlying surface, to allow the flow of electrical current between them. In some non-limiting examples, at least two of such plurality of discrete fragments of the deposited layer 1230 may be electrically insulated from one another.

Selective Deposition Using Patterning Coatings

Figure 15:
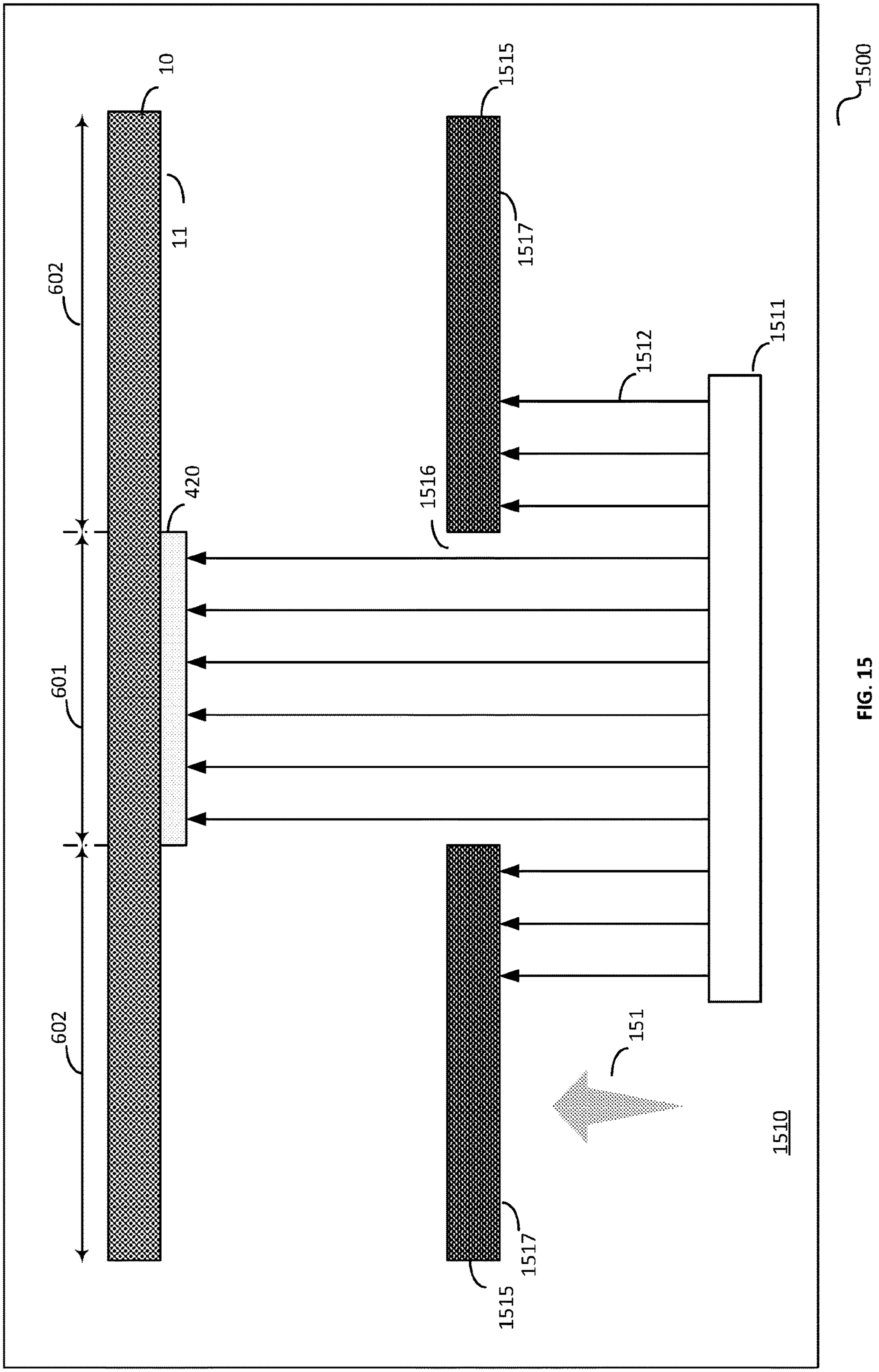
FIG. 15 is a schematic diagram showing an example process for depositing a patterning coating in a pattern on an exposed layer surface of an underlying layer in an example version of the device of FIG. 12, according to an example in the present disclosure.

FIG. 15 is an example schematic diagram illustrating a non-limiting example of an evaporative deposition process, shown generally at 1500, in a chamber 1510, for selectively depositing a patterning coating 420 onto a first portion 601 of an exposed layer surface 11 of the underlying layer.

In the process 1500, a quantity of a patterning material 1511 is heated under vacuum, to evaporate, and/or sublime the patterning material 1511. In some non-limiting examples, the patterning material 1511 may comprise entirely, and/or substantially, a material used to form the patterning coating 420. In some non-limiting examples, such material may comprise an organic material.

An evaporated flux 1512 of the patterning material 1511 may flow through the chamber 1510, including in a direction indicated by arrow 151, toward the exposed layer surface 11. When the evaporated flux 1512 is incident on the exposed layer surface 11, the patterning coating 420 may be formed thereon.

In some non-limiting examples, as shown in the figure for the process 1500, the patterning coating 420 may be selectively deposited only onto a portion, in the example illustrated, the first portion 601, of the exposed layer surface 11, by the interposition, between the evaporated flux 1512 and the exposed layer surface 11, of a shadow mask 1515, which in some non-limiting examples, may be an FMM. In some non-limiting examples, such a shadow mask 1515 may, in some non-limiting examples, be used to form relatively small features, with a feature size on the order of tens of microns or smaller.

The shadow mask 1515 may have at least one aperture 1516 extending therethrough such that a part of the evaporated flux 1512 passes through the aperture 1516 and may be incident on the exposed layer surface 11 to form the patterning coating 420. Where the evaporated flux 1512 does not pass through the aperture 1516 but is incident on the surface 1517 of the shadow mask 1515, it is precluded from being disposed on the exposed layer surface 11 to form the patterning coating 420. In some non-limiting examples, the shadow mask 1515 may be configured such that the evaporated flux 1512 that passes through the aperture 1516 may be incident on the first portion 601 but not the second portion 602. The second portion 602 of the exposed layer surface 11 may thus be substantially devoid of the patterning coating 420. In some non-limiting examples (not shown), the patterning material 1511 that is incident on the shadow mask 1515 may be deposited on the surface 1517 thereof.

Accordingly, a patterned surface may be produced upon completion of the deposition of the patterning coating 420.

Figure 16:
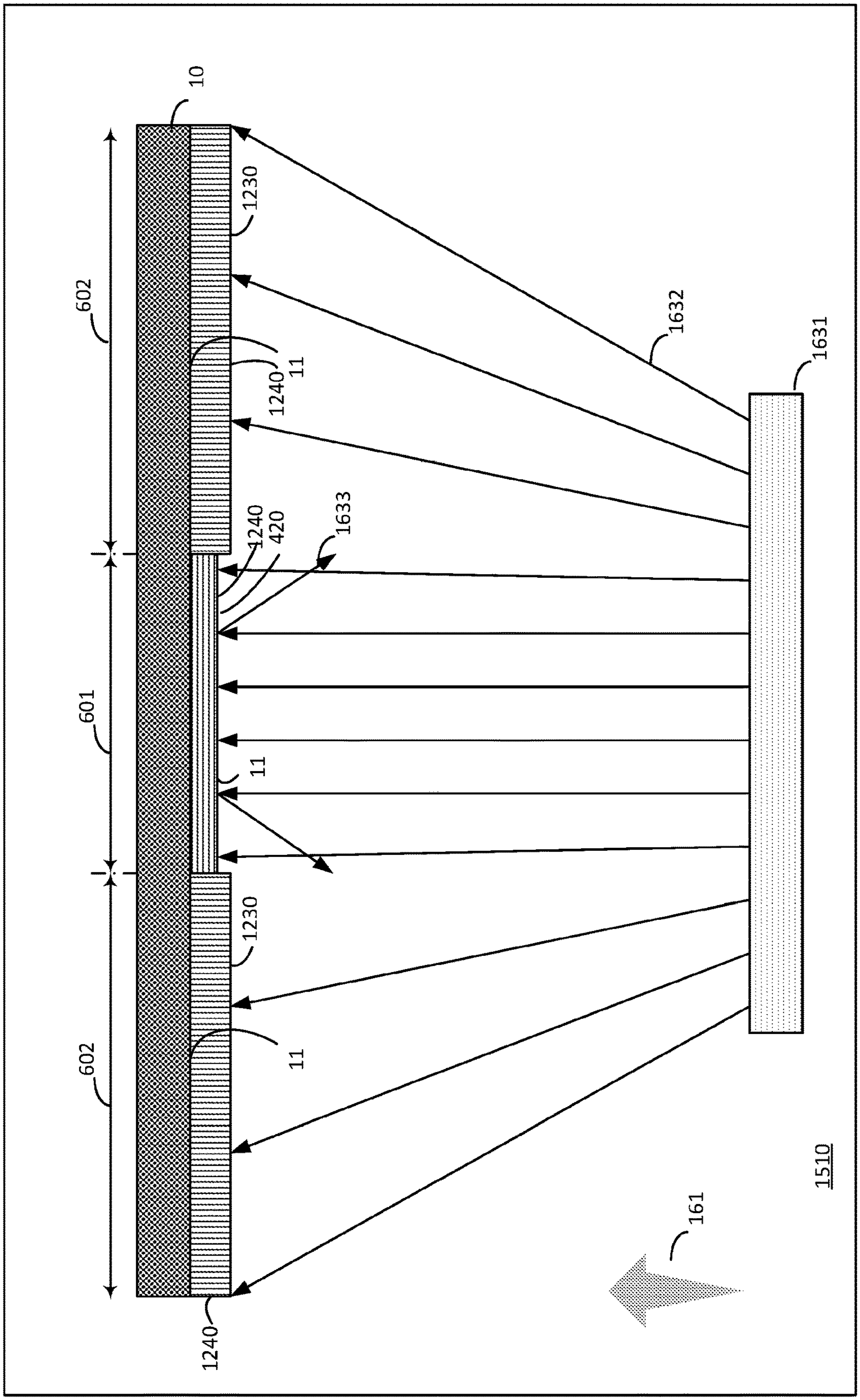
FIG. 16 is a schematic diagram showing an example process for depositing a deposited material in the second portion on an exposed layer surface that comprises the deposited pattern of the patterning coating of FIG. 12 where the patterning coating is a nucleation-inhibiting coating (NIC)

FIG. 16 is an example schematic diagram illustrating a non-limiting example of a result of an evaporative process, shown generally at 1600$_a$, in a chamber 1510, for selectively depositing a closed coating 1240 of a deposited layer 1230 onto the second portion 602 of an exposed layer surface 11 of the underlying layer that is substantially devoid of the patterning coating 420 that was selectively deposited onto the first portion 601, including without limitation, by the evaporative process 1500 of FIG. 15.

In some non-limiting examples, the deposited layer 1230 may be comprised of a deposited material 1631, in some non-limiting examples, comprising at least one metal. It will be appreciated by those having ordinary skill in the relevant art that typically, a vaporization temperature of an organic material is low relative to the vaporization temperature of metals, such as may be employed as a deposited material 1631.

Thus, in some non-limiting examples, there may be fewer constraints in employing a shadow mask 1515 to selectively deposit a patterning coating 420 in a pattern, relative to directly patterning the deposited layer 1230 using such shadow mask 1515.

Once the patterning coating 420 has been deposited on the first portion 601 of the exposed layer surface 11 of the underlying layer, a closed coating 1240 of the deposited material 1631 may be deposited, on the second portion 602 of the exposed layer surface 11 that is substantially devoid of the patterning coating 420, as the deposited layer 1230.

In the process 1600$_a$, a quantity of the deposited material 1631 may be heated under vacuum, to evaporate, and/or sublime the deposited material 1631. In some non-limiting examples, the deposited material 1631 may comprise entirely, and/or substantially, a material used to form the deposited layer 1230.

An evaporated flux 1632 of the deposited material 1631 may be directed inside the chamber 1510, including in a direction indicated by arrow 161, toward the exposed layer surface 11 of the first portion 601 and of the second portion 602. When the evaporated flux 1632 is incident on the second portion 602 of the exposed layer surface 11, a closed coating 1240 of the deposited material 1631 may be formed thereon as the deposited layer 1230.

In some non-limiting examples, deposition of the deposited material 1631 may be performed using an open mask and/or mask-free deposition process.

It will be appreciated by those having ordinary skill in the relevant art that, contrary to that of a shadow mask 1515, the feature size of an open mask may be generally comparable to the size of a device 1200 being manufactured.

It will be appreciated by those having ordinary skill in the relevant art that, in some non-limiting examples, the use of an open mask may be omitted. In some non-limiting examples, an open mask deposition process described herein may alternatively be conducted without the use of an open mask, such that an entire target exposed layer surface 11 may be exposed.

Indeed, as shown in FIG. 16, the evaporated flux 1632 may be incident both on an exposed layer surface 11 of the patterning coating 420 across the first portion 601 as well as the exposed layer surface 11 of the underlying layer across the second portion 602 that is substantially devoid of the patterning coating 420.

Since the exposed layer surface 11 of the patterning coating 420 in the first portion 601 may exhibit a relatively low initial sticking probability against the deposition of the deposited material 1631 relative to the exposed layer surface 11 of the underlying layer in the second portion 602, the deposited layer 1230 may be selectively deposited substantially only on the exposed layer surface 11, of the underlying layer in the second portion 602, that is substantially devoid of the patterning coating 420. By contrast, the evaporated flux 1632 incident on the exposed layer surface 11 of the patterning coating 420 across the first portion 601 may tend to not be deposited (as shown 1633), and the exposed layer surface 11 of the patterning coating 420 across the first portion 601 may be substantially devoid of a closed coating 1240 of the deposited layer 1230.

In some non-limiting examples, an initial deposition rate, of the evaporated flux 1632 on the exposed layer surface 11 of the underlying layer in the second portion 602, may exceed at least one of about: 200 times, 550 times, 900 times, 1,000 times, 1,500 times, 1,900 times, or 2,000 times an initial deposition rate of the evaporated flux 1632 on the exposed layer surface 11 of the patterning coating 420 in the first portion 601.

Thus, the combination of the selective deposition of a patterning coating 420 in FIG. 15 using a shadow mask 1515 and the open mask and/or mask-free deposition of the deposited material 1631 may result in a version 1600$_a$ of the device 1200 shown in FIG. 16.

After selective deposition of the patterning coating 420 across the first portion 601, a closed coating 1240 of the deposited material 1631 may be deposited over the device 1600$_a$ as the deposited layer 1230, in some non-limiting examples, using an open mask and/or a mask-free deposition process, but may remain substantially only within the second portion 602, which is substantially devoid of the patterning coating 420.

The patterning coating 420 may provide, within the first portion 601, an exposed layer surface 11 with a relatively low initial sticking probability, against the deposition of the deposited material 1631, and that is substantially less than the initial sticking probability, against the deposition of the deposited material 1631, of the exposed layer surface 11 of the underlying material of the device 1600$_a$ within the second portion 602.

Thus, the first portion 601 may be substantially devoid of a closed coating 1240 of the deposited material 1631.

While the present disclosure contemplates the patterned deposition of the patterning coating 420 by an evaporative deposition process, involving a shadow mask 1515, those having ordinary skill in the relevant art will appreciate that, in some non-limiting examples, this may be achieved by any suitable deposition process, including without limitation, a micro-contact printing process.

While the present disclosure contemplates the patterning coating 420 being an NIC, those having ordinary skill in the relevant art will appreciate that, in some non-limiting examples, the patterning coating 420 may be an NPC 1820. In such examples, the portion (such as, without limitation, the first portion 601) in which the NPC 1820 has been deposited may, in some non-limiting examples, have a closed coating 1240 of the deposited material 1631, while the other portion (such as, without limitation, the second portion 602) may be substantially devoid of a closed coating 1240 of the deposited material 1631.

In some non-limiting examples, an average layer thickness of the patterning coating 420 and of the deposited layer 1230 deposited thereafter may be varied according to a variety of parameters, including without limitation, a given application and given performance characteristics. In some non-limiting examples, the average layer thickness of the patterning coating 420 may be comparable to, and/or substantially no more than an average layer thickness of the deposited layer 1230 deposited thereafter. Use of a relatively thin patterning coating 420 to achieve selective patterning of a deposited layer 1230 may be suitable to provide flexible devices 1200. In some non-limiting examples, a relatively thin patterning coating 420 may provide a relatively planar surface on which a barrier coating or other thin film encapsulation (TFE) layer 2650, may be deposited. In some non-limiting examples, providing such a relatively planar surface for application of such barrier coating 2650 may increase adhesion thereof to such surface.

Edge Effects

Patterning Coating Transition Region

Figure 17A:
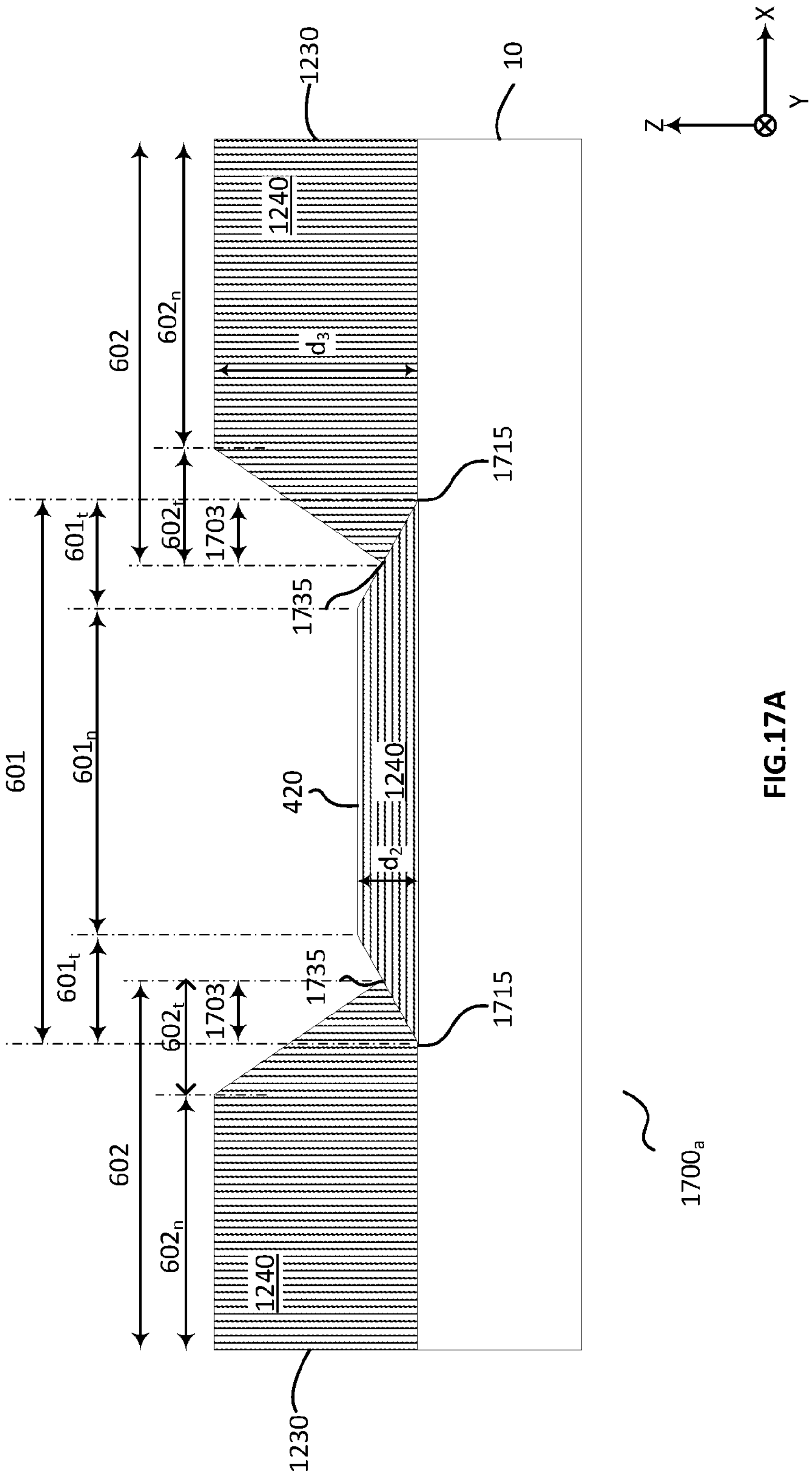
FIG. 17A is a schematic diagram illustrating an example version of the device of FIG. 12 in a cross-sectional view.
Figure 17B:
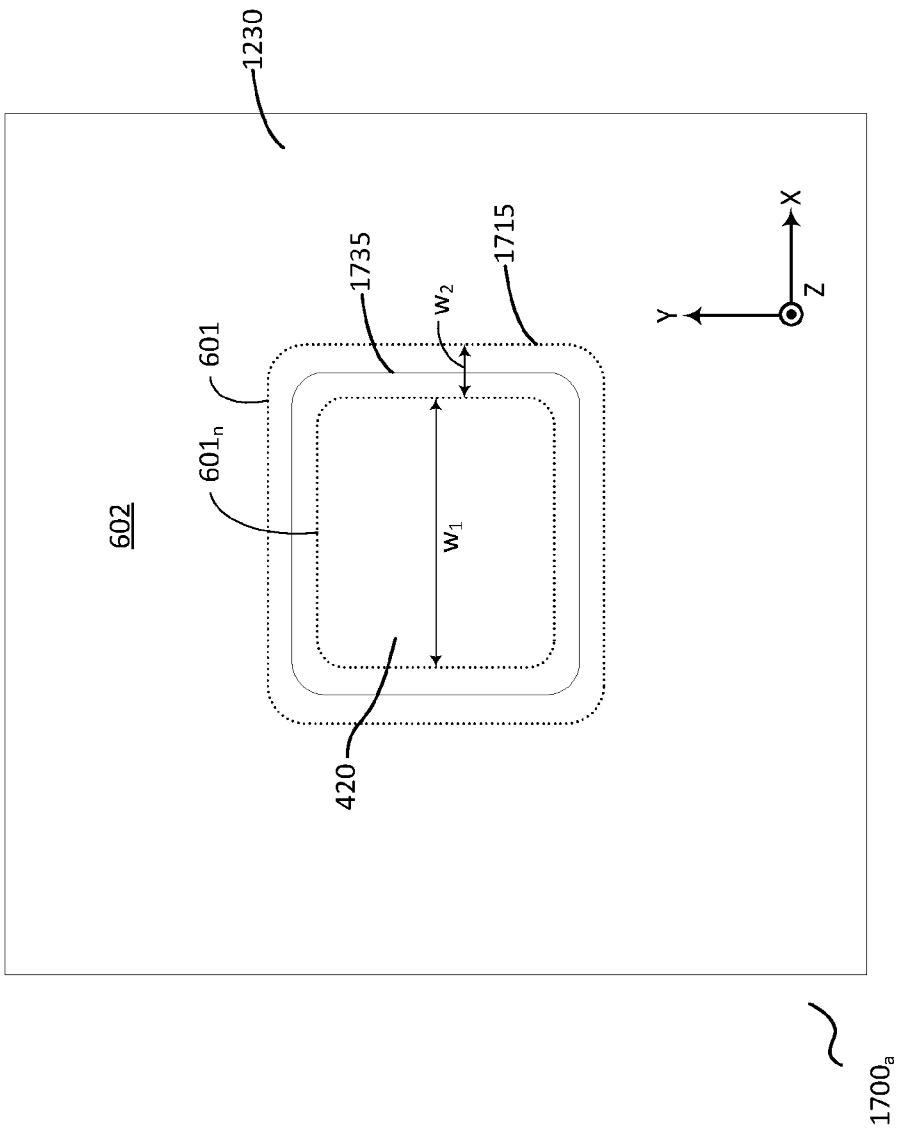
FIG. 17B is a schematic diagram illustrating the device of FIG. 17A in a complementary plan view.

Turning to FIG. 17A, there may be shown a version $\mathbf{1700}_a$ of the device 1200 of FIG. 12 that may show in exaggerated form, an interface between the patterning coating 420 in the first portion 601 and the deposited layer 1230 in the second portion 602. FIG. 17B may show the device $\mathbf{1700}_a$ in plan.

As may be better seen in FIG. 17B, in some non-limiting examples, the patterning coating 420 in the first portion 601 may be surrounded on all sides by the deposited layer 1230 in the second portion 602, such that the first portion 601 may have a boundary that is defined by the further extent or edge 1715 of the patterning coating 420 in the lateral aspect along each lateral axis. In some non-limiting examples, the patterning coating edge 1715 in the lateral aspect may be defined by a perimeter of the first portion 601 in such aspect.

In some non-limiting examples, the first portion 601 may comprise at least one patterning coating transition region $\mathbf{601}_t$, in the lateral aspect, in which a thickness of the patterning coating 420 may transition from a maximum thickness to a reduced thickness. The extent of the first portion 601 that does not exhibit such a transition may be identified as a patterning coating non-transition part $\mathbf{601}_n$ of the first portion 601. In some non-limiting examples, the patterning coating 420 may form a substantially closed coating 1240 in the patterning coating non-transition part $\mathbf{601}_n$ of the first portion 601.

In some non-limiting examples, the patterning coating transition region $\mathbf{601}_t$ may extend, in the lateral aspect, between the patterning coating non-transition part $\mathbf{601}_n$ of the first portion 601 and the patterning coating edge 1715.

In some non-limiting examples, in plan, the patterning coating transition region $\mathbf{601}_t$ may surround, and/or extend along a perimeter of, the patterning coating non-transition part $\mathbf{601}_n$ of the first portion 601.

In some non-limiting examples, along at least one lateral axis, the patterning coating non-transition part $\mathbf{601}_n$ may occupy the entirety of the first portion 601, such that there is no patterning coating transition region $\mathbf{601}_t$ between it and the second portion 602.

As illustrated in FIG. 17A, in some non-limiting examples, the patterning coating 420 may have an average film thickness $d_2$ in the patterning coating non-transition part $\mathbf{601}_n$ of the first portion 601 that may be in a range of at least one of between about: 1-100 nm, 2-50 nm, 3-30 nm, 4-20 nm, 5-15 nm, 5-10 nm, or 1-10 nm. In some non-limiting examples, the average film thickness $d_2$ of the patterning coating 420 in the patterning coating non-transition part $\mathbf{601}_n$ of the first portion 601 may be substantially the same, or constant, thereacross. In some non-limiting examples, an average layer thickness $d_2$ of the patterning coating 420 may remain, within the patterning coating non-transition part $\mathbf{601}_n$, within at least one of about: 95%, or 90% of the average film thickness $d_2$ of the patterning coating 420.

In some non-limiting examples, the average film thickness $d_2$ may be between about 1-100 nm. In some non-limiting examples, the average film thickness $d_2$ may be no more than at least one of about: 80 nm, 60 nm, 50 nm, 40 nm, 30 nm, 20 nm, 15 nm, or 10 nm. In some non-limiting examples, the average film thickness $d_2$ of the patterning coating 420 may exceed at least one of about: 3 nm, 5 nm, or 8 nm.

In some non-limiting examples, the average film thickness $d_2$ of the patterning coating 420 in the patterning coating non-transition part $\mathbf{601}_n$ of the first portion 601 may be no more than about 10 nm. Without wishing to be bound by any particular theory, it has been found, somewhat surprisingly, that a non-zero average film thickness $d_2$ of the patterning coating 420 that is no more than about 10 nm may, at least in some non-limiting examples, provide certain advantages for achieving, by way of non-limiting example, enhanced patterning contrast of the deposited layer 1230, relative to a patterning coating 420 having an average film thickness $d_2$ in the patterning coating non-transition part $\mathbf{601}_n$ of the first portion 601 in excess of 10 nm.

In some non-limiting examples, the patterning coating 420 may have a patterning coating thickness that decreases from a maximum to a minimum within the patterning coating transition region $\mathbf{601}_t$. In some non-limiting examples, the maximum may be at, and/or proximate to, a boundary between the patterning coating transition region $\mathbf{601}_t$ and the patterning coating non-transition part $\mathbf{601}_n$ of the first portion 601. In some non-limiting examples, the minimum may be at, and/or proximate to, the patterning coating edge 1715. In some non-limiting examples, the maximum may be the average film thickness $d_2$ in the patterning coating non-transition part $\mathbf{601}_n$ of the first portion 601. In some non-limiting examples, the maximum may be no more than at least one of about: 95% or 90% of the average film thickness $d_2$ in the patterning coating non-transition part $\mathbf{601}_n$ of the first portion 601. In some non-limiting examples, the minimum may be in a range of between about 0-0.1 nm.

In some non-limiting examples, a profile of the patterning coating thickness in the patterning coating transition region $\mathbf{601}_t$ may be sloped, and/or follow a gradient. In some non-limiting examples, such profile may be tapered. In some non-limiting examples, the taper may follow a linear, non-linear, parabolic, and/or exponential decaying profile.

In some non-limiting examples, the patterning coating 420 may completely cover the underlying surface in the patterning coating transition region $\mathbf{601}_t$. In some nonlimiting examples, at least a part of the underlying layer may be left uncovered by the patterning coating 420 in the patterning coating transition region $\mathbf{601}_t$. In some non-limiting examples, the patterning coating 420 may comprise a substantially closed coating 1240 in at least a part of the patterning coating transition region $\mathbf{601}_t$ and/or at least a part of the patterning coating non-transition part $\mathbf{601}_n$.

In some non-limiting examples, the patterning coating 420 may comprise a discontinuous layer 160 in at least a part of the patterning coating transition region $\mathbf{601}_t$ and/or at least a part of the patterning coating non-transition part $\mathbf{601}_n$.

In some non-limiting examples, at least a part of the patterning coating 420 in the first portion 601 may be substantially devoid of a closed coating 1240 of the deposited layer 1230. In some non-limiting examples, at least a part of the exposed layer surface 11 of the first portion 601 may be substantially devoid of a closed coating 1240 of the deposited layer 1230 or of the deposited material 1631.

In some non-limiting examples, along at least one lateral axis, including without limitation, the X-axis, the patterning coating non-transition part $\mathbf{601}_n$ may have a width of $w_1$, and the patterning coating transition region $\mathbf{601}_t$ may have a width of $w_2$. In some non-limiting examples, the patterning coating non-transition part $\mathbf{601}_n$ may have a cross-sectional area that, in some non-limiting examples, may be approximated by multiplying the average film thickness $d_2$ by the width $w_1$. In some non-limiting examples, the patterning coating transition region $\mathbf{601}_t$ may have a cross-sectional area that, in some non-limiting examples, may be approximated by multiplying an average film thickness across the patterning coating transition region $\mathbf{601}_t$ by the width $w_1$.

In some non-limiting examples, $w_1$ may exceed $w_2$. In some non-limiting examples, a quotient of $w_1/w_2$ may be at least one of at least about: 5, 10, 50, 100, 500, 1,000, 1,500, 5,000, 10,000, 50,000, or 100,000.

In some non-limiting examples, at least one of $w_1$ and $w_2$ may exceed the average film thickness $d_1$ of the underlying layer.

In some non-limiting examples, at least one of $w_1$ and $w_2$ may exceed dz. In some non-limiting examples, both $w_1$ and $w_2$ may exceed dz. In some non-limiting examples, $w_1$ and $w_2$ both may exceed $d_1$, and $d_1$ may exceed dz.

Deposited Layer Transition Region

As may be better seen in FIG. 17B, in some non-limiting examples, the patterning coating 420 in the first portion 601 may be surrounded by the deposited layer 1230 in the second portion 602 such that the second portion 602 has a boundary that is defined by the further extent or edge 1735 of the deposited layer 1230 in the lateral aspect along each lateral axis. In some non-limiting examples, the deposited layer edge 1735 in the lateral aspect may be defined by a perimeter of the second portion 602 in such aspect.

In some non-limiting examples, the second portion 602 may comprise at least one deposited layer transition region $\mathbf{602}_t$, in the lateral aspect, in which a thickness of the deposited layer 1230 may transition from a maximum thickness to a reduced thickness. The extent of the second portion 602 that does not exhibit such a transition may be identified as a deposited layer non-transition part $\mathbf{602}_n$ of the second portion 602. In some non-limiting examples, the deposited layer 1230 may form a substantially closed coating 1240 in the deposited layer non-transition part $\mathbf{602}_n$ of the second portion 602.

In some non-limiting examples, in plan, the deposited layer transition region $\mathbf{602}_t$ may extend, in the lateral aspect, between the deposited layer non-transition part $\mathbf{602}_n$ of the second portion 602 and the deposited layer edge 1735.

In some non-limiting examples, in plan, the deposited layer transition region $\mathbf{602}_t$ may surround, and/or extend along a perimeter of, the deposited layer non-transition part $\mathbf{602}_n$ of the second portion 602.

In some non-limiting examples, along at least one lateral axis, the deposited layer non-transition part $\mathbf{602}_n$ of the second portion 602 may occupy the entirety of the second portion 602, such that there is no deposited layer transition region $\mathbf{602}_t$ between it and the first portion 601.

As illustrated in FIG. 17A, in some non-limiting examples, the deposited layer 1230 may have an average film thickness $d_3$ in the deposited layer non-transition part $\mathbf{602}_n$ of the second portion 602 that may be in a range of at least one of between about: 1-500 nm, 5-200 nm, 5-40 nm, 10-30 nm, or 10-100 nm. In some non-limiting examples, $d_3$ may exceed at least one of about: 10 nm, 50 nm, or 100 nm. In some non-limiting examples, the average film thickness $d_3$ of the deposited layer 1230 in the deposited layer non-transition part 6021 of the second portion 602 may be substantially the same, or constant, thereacross.

In some non-limiting examples, $d_3$ may exceed the average film thickness $d_1$ of the underlying layer.

In some non-limiting examples, a quotient $d_3/d_1$ may be at least one of at least about: 1.5, 2, 5, 10, 20, 50, or 100. In some non-limiting examples, the quotient $d_3/d_1$ may be in a range of at least one of between about: 0.1-10, or 0.2-40.

In some non-limiting examples, $d_3$ may exceed an average film thickness $d_2$ of the patterning coating 420.

In some non-limiting examples, a quotient $d_3/d_2$ may be at least one of at least about: 1.5, 2, 5, 10, 20, 50, or 100. In some non-limiting examples, the quotient $d_3/d_2$ may be in a range of at least one of between about: 0.2-10, or 0.5-40.

In some non-limiting examples, $d_3$ may exceed $d_2$ and $d_2$ may exceed $d_1$. In some other non-limiting examples, $d_3$ may exceed $d_1$ and $d_1$ may exceed dz.

In some non-limiting examples, a quotient $d_2/d_1$ may be between at least one of about: 0.2-3, or 0.1-5.

In some non-limiting examples, along at least one lateral axis, including without limitation, the X-axis, the deposited layer non-transition part $\mathbf{602}_n$ of the second portion 602 may have a width of $w_3$. In some non-limiting examples, the deposited layer non-transition part $\mathbf{602}_n$ of the second portion 602 may have a cross-sectional area $a_3$ that, in some non-limiting examples, may be approximated by multiplying the average film thickness $d_3$ by the width $w_3$.

In some non-limiting examples, $w_3$ may exceed the width $w_1$ of the patterning coating non-transition part $\mathbf{601}_n$. In some non-limiting examples, $w_1$ may exceed $w_3$.

In some non-limiting examples, a quotient $w_1/w_3$ may be in a range of at least one of between about: 0.1-10, 0.2-5, 0.3-3, or 0.4-2. In some non-limiting examples, a quotient $w_3/w_1$ may be at least one of at least about: 1, 2, 3, or 4.

In some non-limiting examples, $w_3$ may exceed the average film thickness $d_3$ of the deposited layer 1230.

In some non-limiting examples, a quotient $w_3/d_3$ may be at least one of at least about: 10, 50, 100, or 500. In some non-limiting examples, the quotient $w_3/d_3$ may be no more than about 100,000.

In some non-limiting examples, the deposited layer 1230 may have a thickness that decreases from a maximum to a minimum within the deposited layer transition region $\mathbf{602}_t$. In some non-limiting examples, the maximum may be at, and/or proximate to, the boundary between the deposited layer transition region $\mathbf{602}_t$ and the deposited layer non-transition part 602 of the second portion 602. In some non-limiting examples, the minimum may be at, and/or proximate to, the deposited layer edge 1735. In some non-limiting examples, the maximum may be the average film thickness $d_3$ in the deposited layer non-transition part 602$_n$ of the second portion 602. In some non-limiting examples, the minimum may be in a range of between about 0-0.1 nm. In some non-limiting examples, the minimum may be the average film thickness $d_3$ in the deposited layer non-transition part 602$_n$ of the second portion 602.

In some non-limiting examples, a profile of the thickness in the deposited layer transition region 602$_t$ may be sloped, and/or follow a gradient. In some non-limiting examples, such profile may be tapered. In some non-limiting examples, the taper may follow a linear, non-linear, parabolic, and/or exponential decaying profile.

Figure 17C:
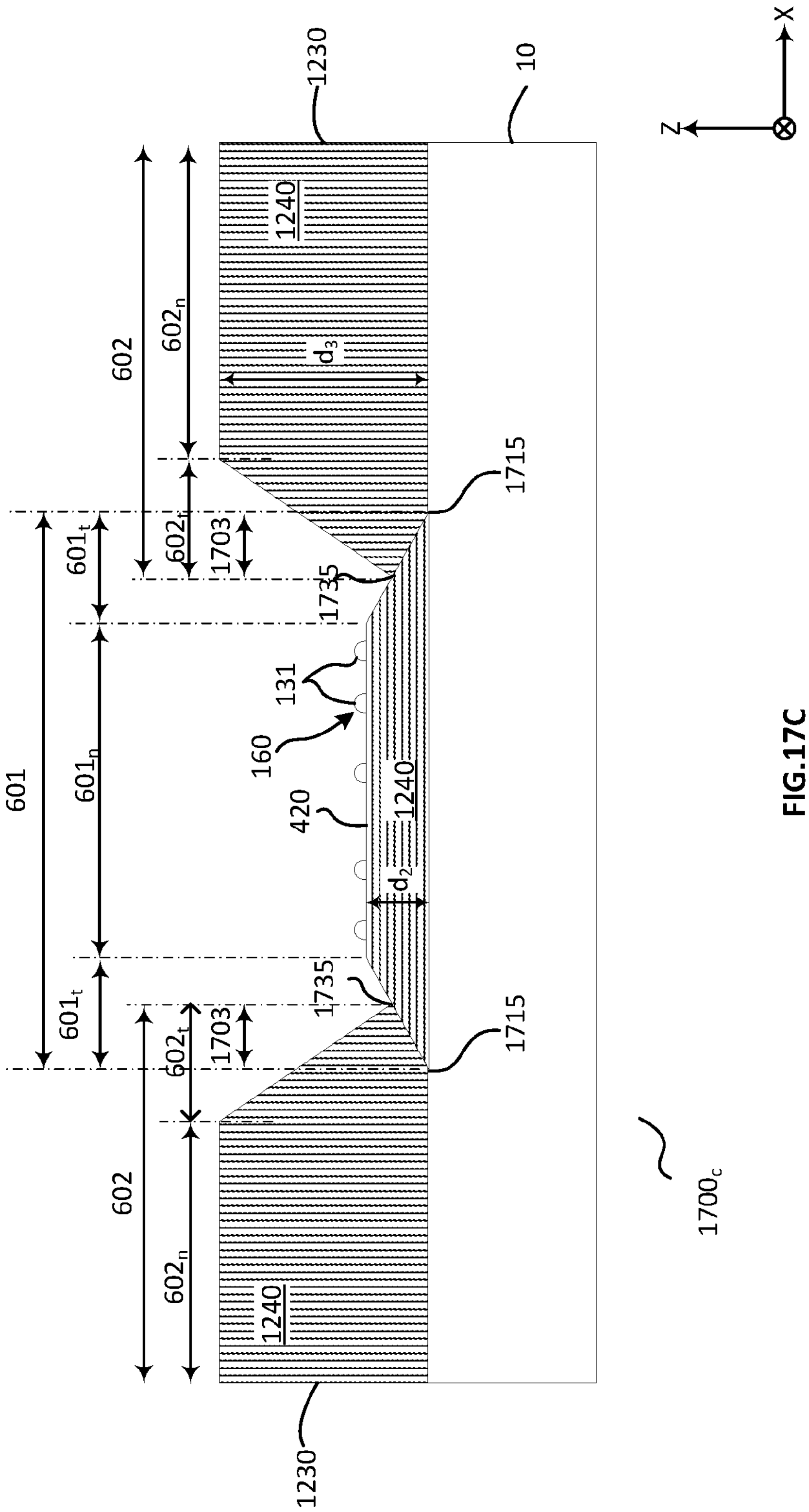
FIG. 17C is a schematic diagram illustrating an example version of the device of FIG. 12 in a cross-sectional view.
Figure 17D:
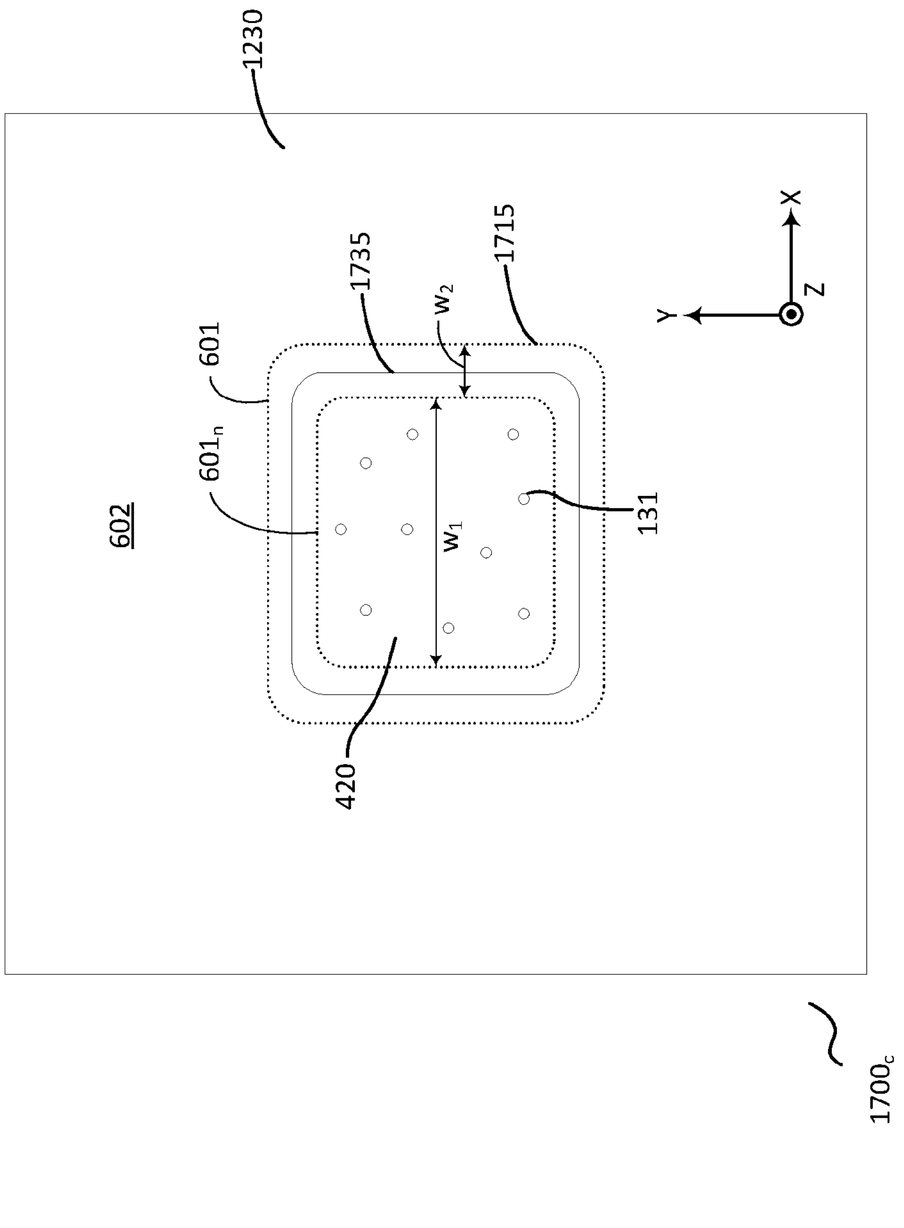
FIG. 17D is a schematic diagram illustrating the device of FIG. 17C in a complementary plan view.
Figure 17E:
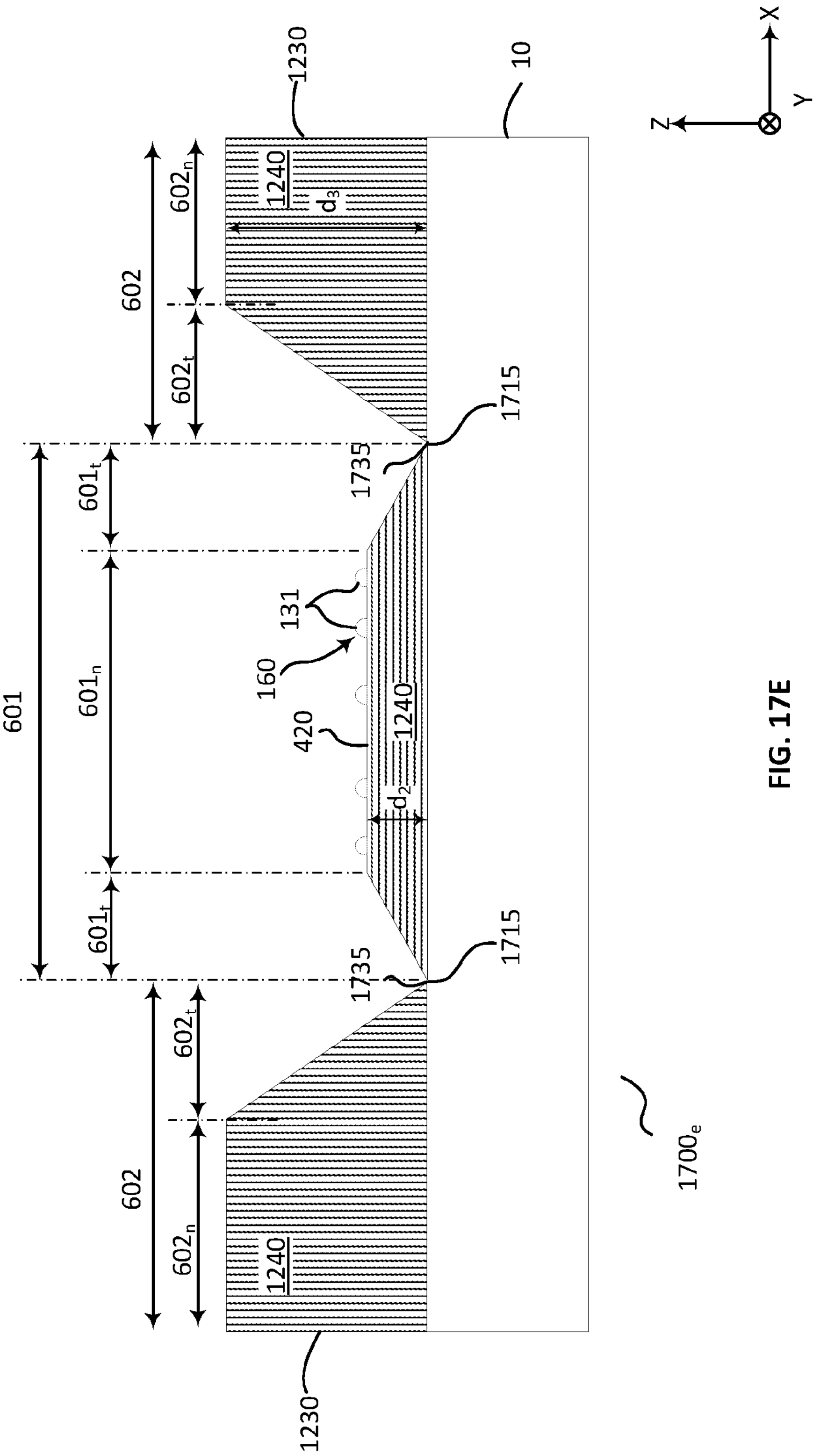
FIG. 17E is a schematic diagram illustrating an example of the device of FIG. 12 in a cross-sectional view.

In some non-limiting examples, as shown by way of non-limiting example in the example version 1700$_e$ in FIG. 17E of the device 1200, the deposited layer 1230 may completely cover the underlying surface in the deposited layer transition region 602$_t$. In some non-limiting examples, the deposited layer 1230 may comprise a substantially closed coating 1240 in at least a part of the deposited layer transition region 602$_t$. In some non-limiting examples, at least a part of the underlying surface may be uncovered by the deposited layer 1230 in the deposited layer transition region 602$_t$.

In some non-limiting examples, the deposited layer 1230 may comprise a discontinuous layer 160 in at least a part of the deposited layer transition region 602$_t$.

Those having ordinary skill in the relevant art will appreciate that, while not explicitly illustrated, the patterning material 1511 may also be present to some extent at an interface between the deposited layer 1230 and an underlying layer. Such material may be deposited as a result of a shadowing effect, in which a deposited pattern is not identical to a pattern of a mask and may, in some non-limiting examples, result in some evaporated patterning material 1511 being deposited on a masked part of a target exposed layer surface 11. By way of non-limiting example, such material may form as particle structures 131 and/or as a thin film having a thickness that may be substantially no more than an average thickness of the patterning coating 420.

Overlap

In some non-limiting examples, the deposited layer edge 1735 may be spaced apart, in the lateral aspect from the patterning coating transition region 601$_t$ of the first portion 601, such that there is no overlap between the first portion 601 and the second portion 602 in the lateral aspect.

In some non-limiting examples, at least a part of the first portion 601 and at least a part of the second portion 602 may overlap in the lateral aspect. Such overlap may be identified by an overlap portion 1703, such as may be shown by way of non-limiting example in FIG. 17A, in which at least a part of the second portion 602 overlaps at least a part of the first portion 601.

Figure 17F:
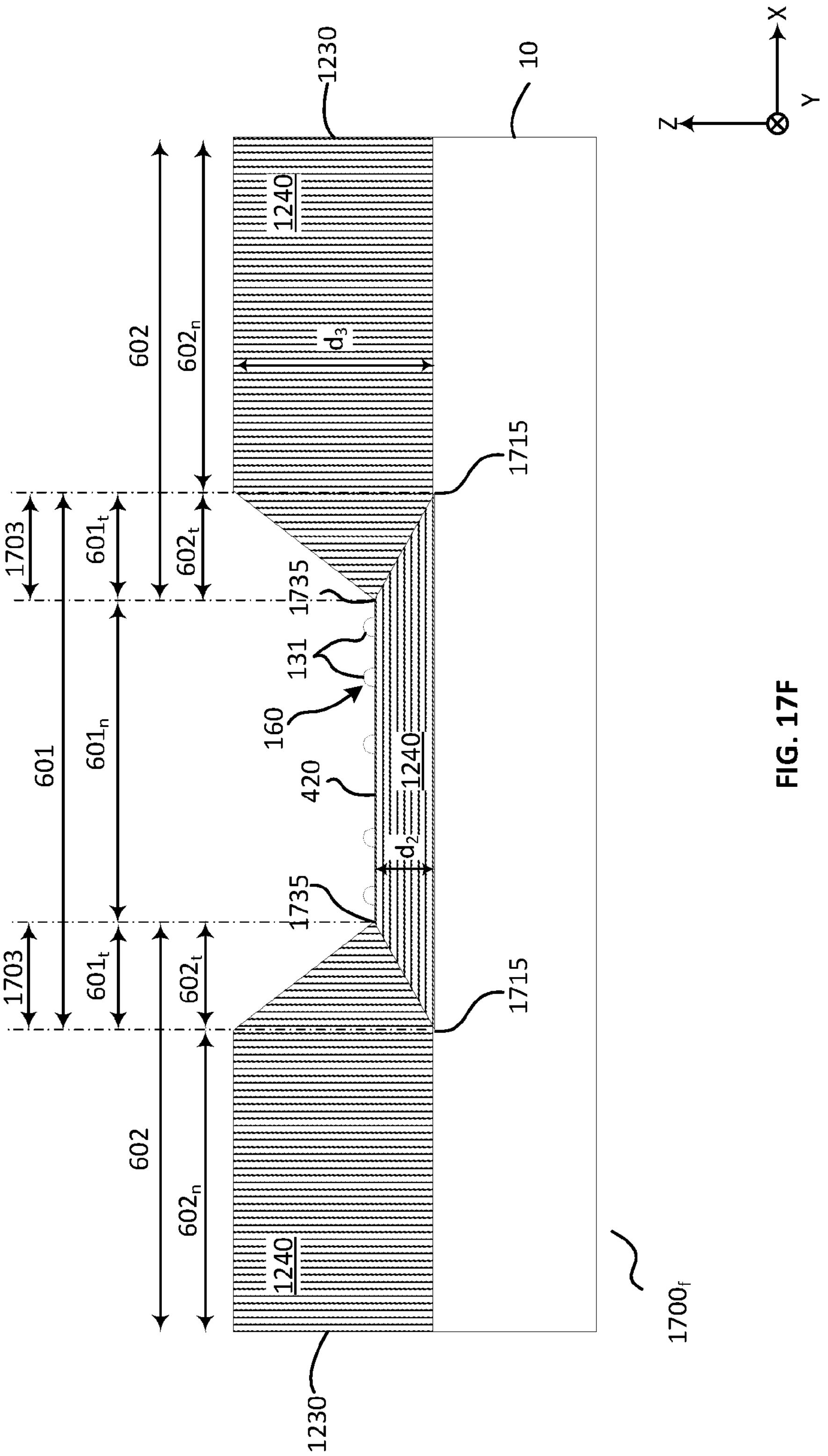
FIG. 17F is a schematic diagram illustrating an example of the device of FIG. 12 in a cross-sectional view.

In some non-limiting examples, as shown by way of non-limiting example in FIG. 17F, at least a part of the deposited layer transition region 602$_t$ may be disposed over at least a part of the patterning coating transition region 601$_t$. In some non-limiting examples, at least a part of the patterning coating transition region 601$_t$ may be substantially devoid of the deposited layer 1230, and/or the deposited material 1631. In some non-limiting examples, the deposited material 1631 may form a discontinuous layer 160 on an exposed layer surface 11 of at least a part of the patterning coating transition region 601$_t$.

Figure 17G:
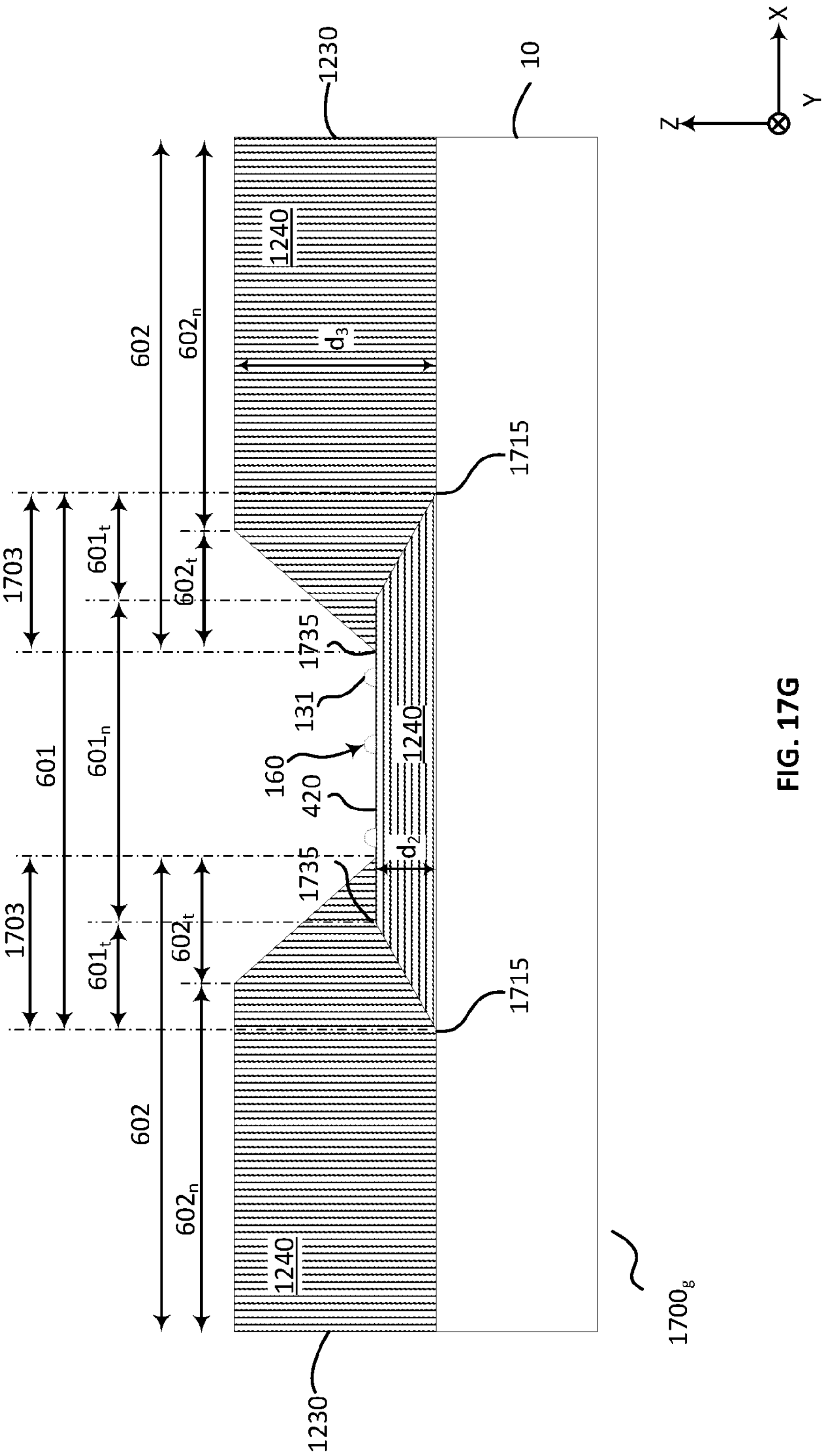
FIG. 17G is a schematic diagram illustrating an example of the device of FIG. 12 in a cross-sectional view.

In some non-limiting examples, as shown by way of non-limiting example in FIG. 17G, at least a part of the deposited layer transition region 602$_t$ may be disposed over at least a part of the patterning coating non-transition part 601$_n$ of the first portion 601.

Although not shown, those having ordinary skill in the relevant art will appreciate that, in some non-limiting examples, the overlap portion 1703 may reflect a scenario in which at least a part of the first portion 601 overlaps at least a part of the second portion 602.

Thus, in some non-limiting examples, at least a part of the patterning coating transition region 601$_t$ may be disposed over at least a part of the deposited layer transition region 602$_t$. In some non-limiting examples, at least a part of the deposited layer transition region 602$_t$ may be substantially devoid of the patterning coating 420, and/or the patterning material 1511. In some non-limiting examples, the patterning material 1511 may form a discontinuous layer 160 on an exposed layer surface of at least a part of the deposited layer transition region 602$_t$.

In some non-limiting examples, at least a part of the patterning coating transition region 601$_t$ may be disposed over at least a part of the deposited layer non-transition part 602$_n$ of the second portion 602.

In some non-limiting examples, the patterning coating edge 1715 may be spaced apart, in the lateral aspect, from the deposited layer non-transition part 602$_n$ of the second portion 602.

In some non-limiting examples, the deposited layer 1230 may be formed as a single monolithic coating across both the deposited layer non-transition part 602$_n$ and the deposited layer transition region 602$_t$ of the second portion 602.

Edge Effects of Patterning Coatings and Deposited Layers

FIGS. 18A-18I describe various potential behaviours of patterning coatings 420 at a deposition interface with deposited layers 1230.

Figure 18A:
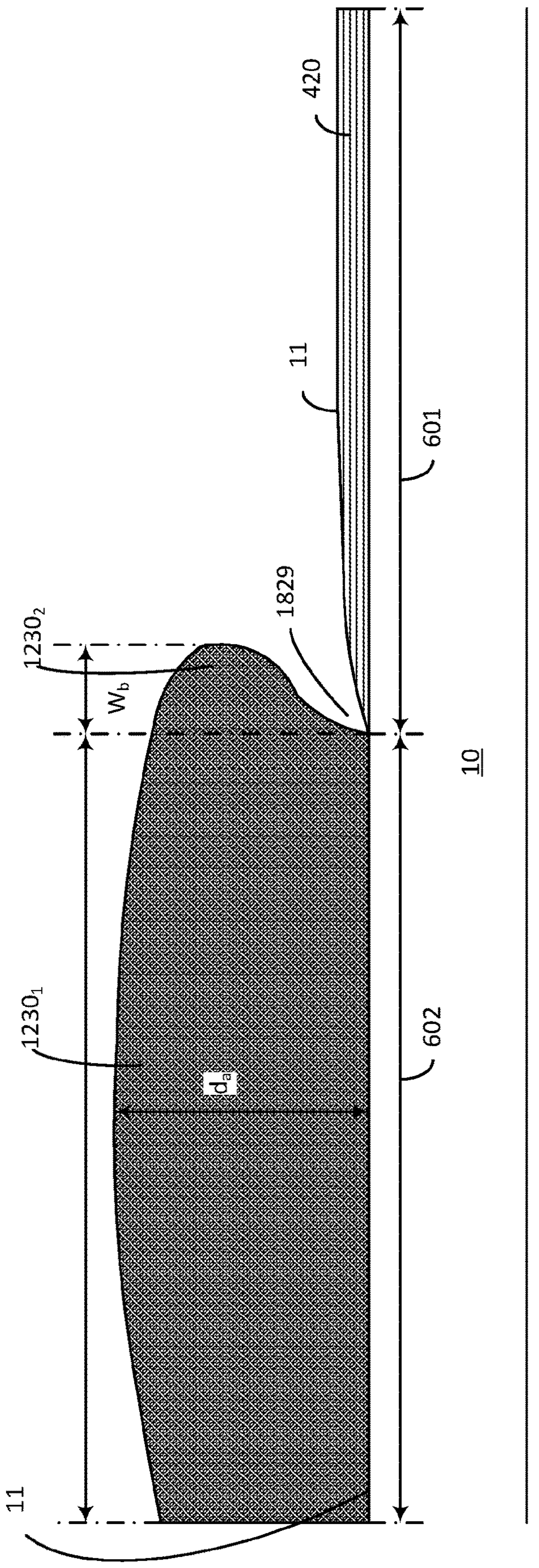
FIGS. 18A-18I are schematic diagrams that show various potential behaviours of a patterning coating at a deposition interface with a deposited layer in an example version of the device of FIG. 12 according to various examples in the present disclosure.

Turning to FIG. 18A, there may be shown a first example of a part of an example version 1800 of the device 1200 at a patterning coating deposition boundary. The device 1800 may comprise a substrate 10 having an exposed layer surface 11. A patterning coating 420 may be deposited over a first portion 601 of the exposed layer surface 11. A deposited layer 1230 may be deposited over a second portion 602 of the exposed layer surface 11. As shown, by way of non-limiting example, the first portion 601 and the second portion 602 may be distinct and non-overlapping parts of the exposed layer surface 11.

The deposited layer 1230 may comprise a first part 1230$_1$ and a second part 1230$_2$. As shown, by way of non-limiting example, the first part 1230$_1$ of the deposited layer 1230 may substantially cover the second portion 602 and the second part 1230$_2$ of the deposited layer 1230 may partially project over, and/or overlap a first part of the patterning coating 420.

In some non-limiting examples, since the patterning coating 420 may be formed such that its exposed layer surface 11 exhibits a relatively low initial sticking probability against deposition of the deposited material 1631, there may be a gap 1829 formed between the projecting, and/or overlapping second part 1230$_2$ of the deposited layer 1230 and the exposed layer surface 11 of the patterning coating 420. As a result, the second part 1230$_2$ may not be in physical contact with the patterning coating 420 but may be spaced-apart therefrom by the gap 1829 in a cross-sectional aspect. In some non-limiting examples, the first part 1230$_1$ of the deposited layer 1230 may be in physical contact with the patterning coating 420 at an interface, and/or boundary between the first portion 601 and the second portion 602.

In some non-limiting examples, the projecting, and/or overlapping second part 1230$_2$ of the deposited layer 1230 may extend laterally over the patterning coating 420 by a comparable extent as an average layer thickness $d_a$ of the first part 1230$_1$ of the deposited layer 1230. By way of non-limiting example, as shown, a width $w_b$ of the second part 1230$_2$ may be comparable to the average layer thickness $d_a$ of the first part 1230$_1$. In some non-limiting examples, a ratio of a width $w_b$ of the second part 1230$_2$ by an average layer thickness $d_a$ of the first part 1230$_1$ may be in a range of at least one of between about: 1:1-1:3, 1:1-1:1.5, or 1:1-1:2. While the average layer thickness $d_a$ may in some non-limiting examples be relatively uniform across the first part 1230$_1$, in some non-limiting examples, the extent to which the second part 1230$_2$ may project, and/or overlap with the patterning coating 420 (namely $w_b$) may vary to some extent across different parts of the exposed layer surface 11.

Figure 18B:
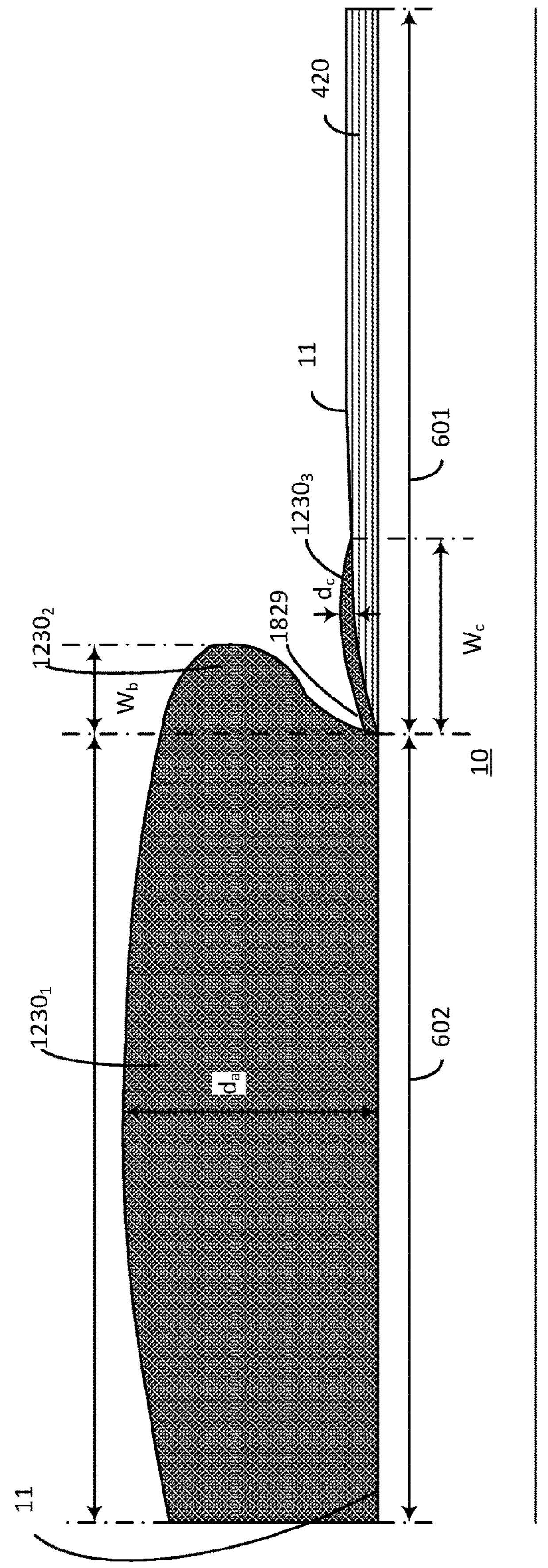
Figure 18C:
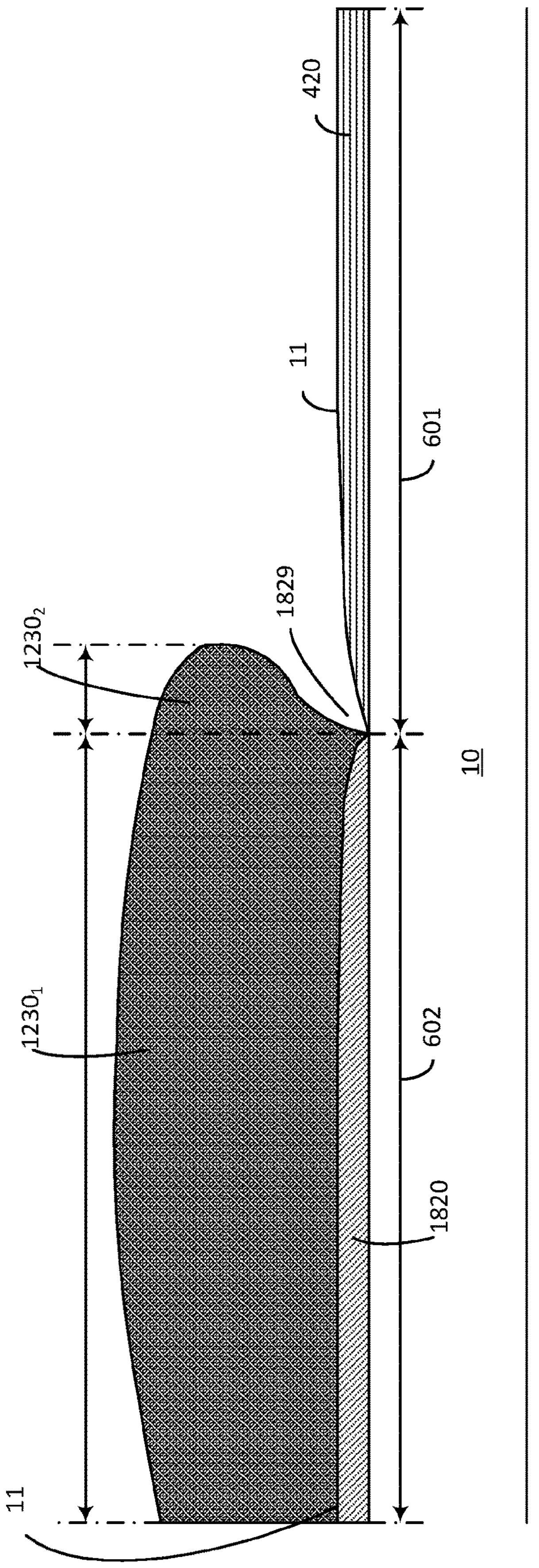

Turning now to FIG. 18B, the deposited layer 1230 may be shown to include a third part 1230$_3$ disposed between the second part 1230$_2$ and the patterning coating 420. As shown, the second part 1230$_2$ of the deposited layer 1230 may extend laterally over and is longitudinally spaced apart from the third part 1230$_3$ of the deposited layer 1230 and the third part 1230$_3$ may be in physical contact with the exposed layer surface 11 of the patterning coating 420. An average layer thickness $d_c$ of the third part 1230$_3$ of the deposited layer 1230 may be no more than, and in some non-limiting examples, substantially less than, the average layer thickness $d_a$ of the first part 1230$_1$ thereof. In some non-limiting examples, a width we of the third part 1230$_3$ may exceed the width $w_b$ of the second part 1230$_2$. In some non-limiting examples, the third part 1230$_3$ may extend laterally to overlap the patterning coating 420 to a greater extent than the second part 1230$_2$. In some non-limiting examples, a ratio of a width $w_c$ of the third part 1230$_3$ by an average layer thickness $d_a$ of the first part 1230$_1$ may be in a range of at least one of between about: 1:2-3:1, or 1:1.2-2.5:1. While the average layer thickness $d_a$ may in some non-limiting examples be relatively uniform across the first part 1230$_1$, in some non-limiting examples, the extent to which the third part 1230$_3$ may project, and/or overlap with the patterning coating 420 (namely may vary to some extent across different parts of the exposed layer surface 11.

In some non-limiting examples, the average layer thickness of the third part 1230$_3$ may not exceed about 5% of the average layer thickness $d_a$ of the first part 1230$_1$. By way of non-limiting example, $d_c$ may be no more than at least one of about: 4%, 3%, 2%, 1%, or 0.5% of $d_a$. Instead of, and/or in addition to, the third part 1230$_3$ being formed as a thin film, as shown, the deposited material 1631 of the deposited layer 1230 may form as particle structures 131 on a part of the patterning coating 420. By way of non-limiting example, such particle structures 131 may comprise features that are physically separated from one another, such that they do not form a continuous layer.

Turning now to FIG. 18C, an NPC 1820 may be disposed between the substrate 10 and the deposited layer 1230. The NPC 1820 may be disposed between the first part 1230$_1$ of the deposited layer 1230 and the second portion 602 of the substrate 10. The NPC 1820 is illustrated as being disposed on the second portion 602 and not on the first portion 601, where the patterning coating 420 has been deposited. The NPC 1820 may be formed such that, at an interface, and/or boundary between the NPC 1820 and the deposited layer 1230, a surface of the NPC 1820 may exhibit a relatively high initial sticking probability against deposition of the deposited material 1631. As such, the presence of the NPC 1820 may promote the formation, and/or growth of the deposited layer 1230 during deposition.

Figure 18D:
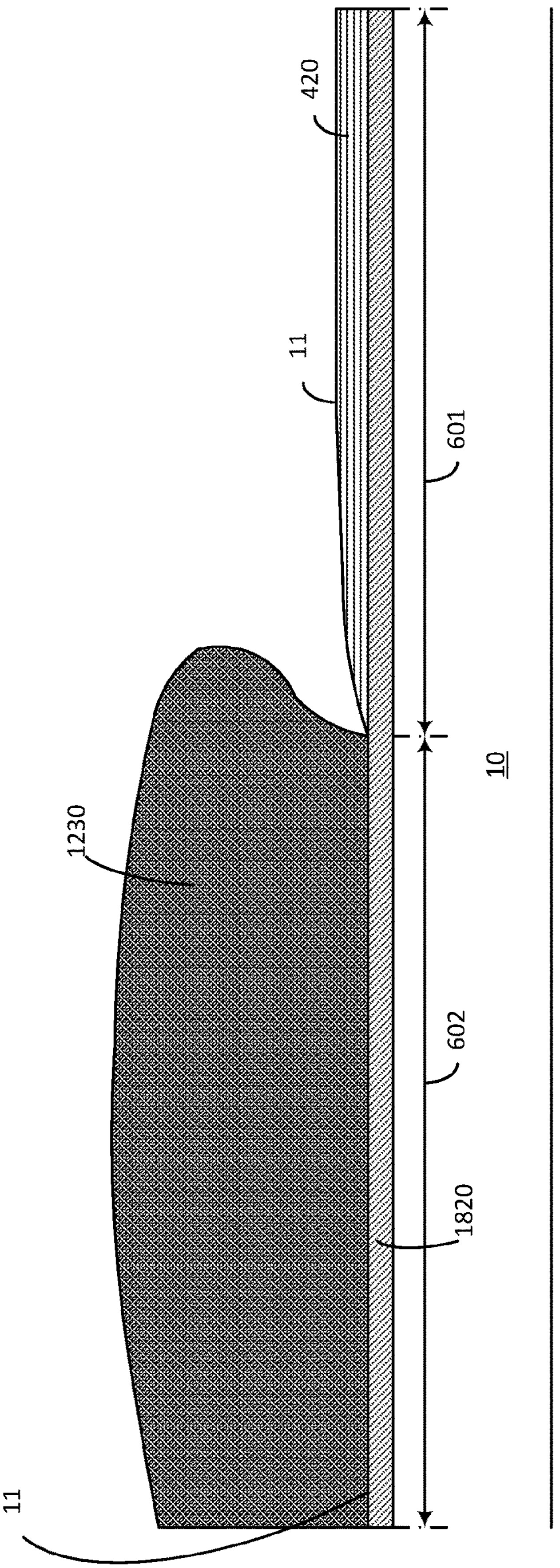

Turning now to FIG. 18D, the NPC 1820 may be disposed on both the first portion 601 and the second portion 602 of the substrate 10 and the patterning coating 420 may cover a part of the NPC 1820 disposed on the first portion 601. Another part of the NPC 1820 may be substantially devoid of the patterning coating 420 and the deposited layer 1230 may cover such part of the NPC 1820.

Figure 18E:
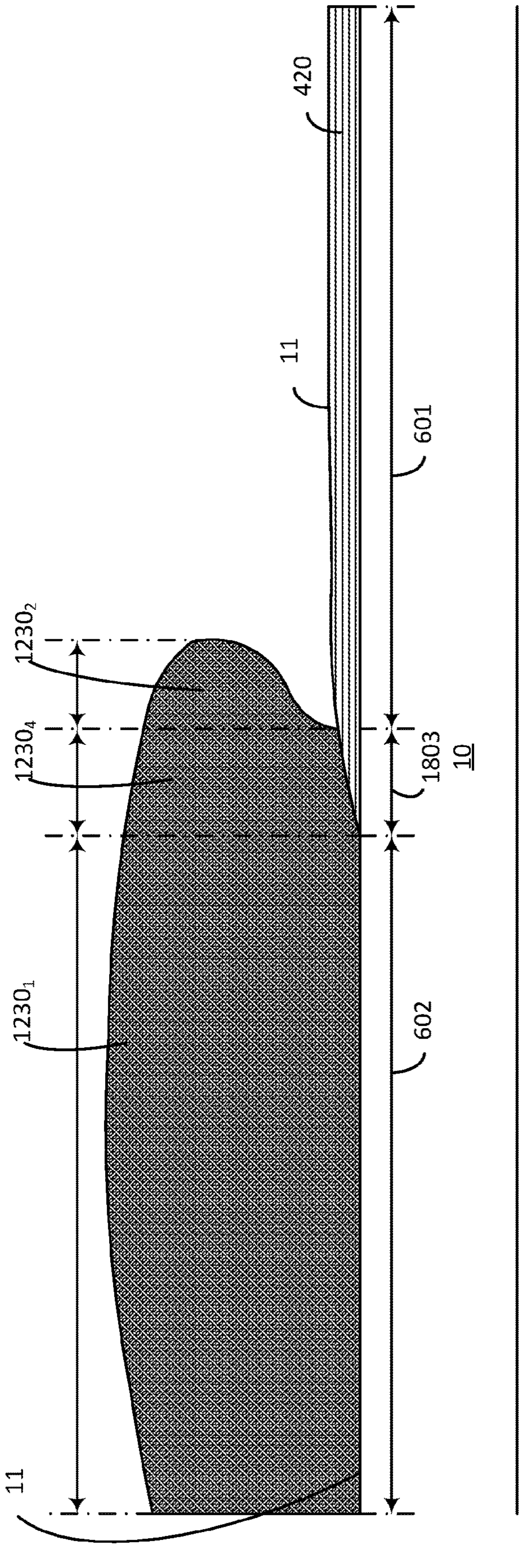

Turning now to FIG. 18E, the deposited layer 1230 may be shown to partially overlap a part of the patterning coating 420 in a third portion 1803 of the substrate 10. In some non-limiting examples, in addition to the first part 1230$_1$ and the second part 1230$_2$, the deposited layer 1230 may further include a fourth part 1230$_4$. As shown, the fourth part 1230$_4$ of the deposited layer 1230 may be disposed between the first part 1230$_1$ and the second part 1230$_2$ of the deposited layer 1230 and the fourth part 1230$_4$ may be in physical contact with the exposed layer surface 11 of the patterning coating 420. In some non-limiting examples, the overlap in the third portion 1803 may be formed as a result of lateral growth of the deposited layer 1230 during an open mask and/or mask-free deposition process. In some non-limiting examples, while the exposed layer surface 11 of the patterning coating 420 may exhibit a relatively low initial sticking probability against deposition of the deposited material 1631, and thus a probability of the material nucleating on the exposed layer surface 11 may be low, as the deposited layer 1230 grows in thickness, the deposited layer 1230 may also grow laterally and may cover a subset of the patterning coating 420 as shown.

Figure 18F:
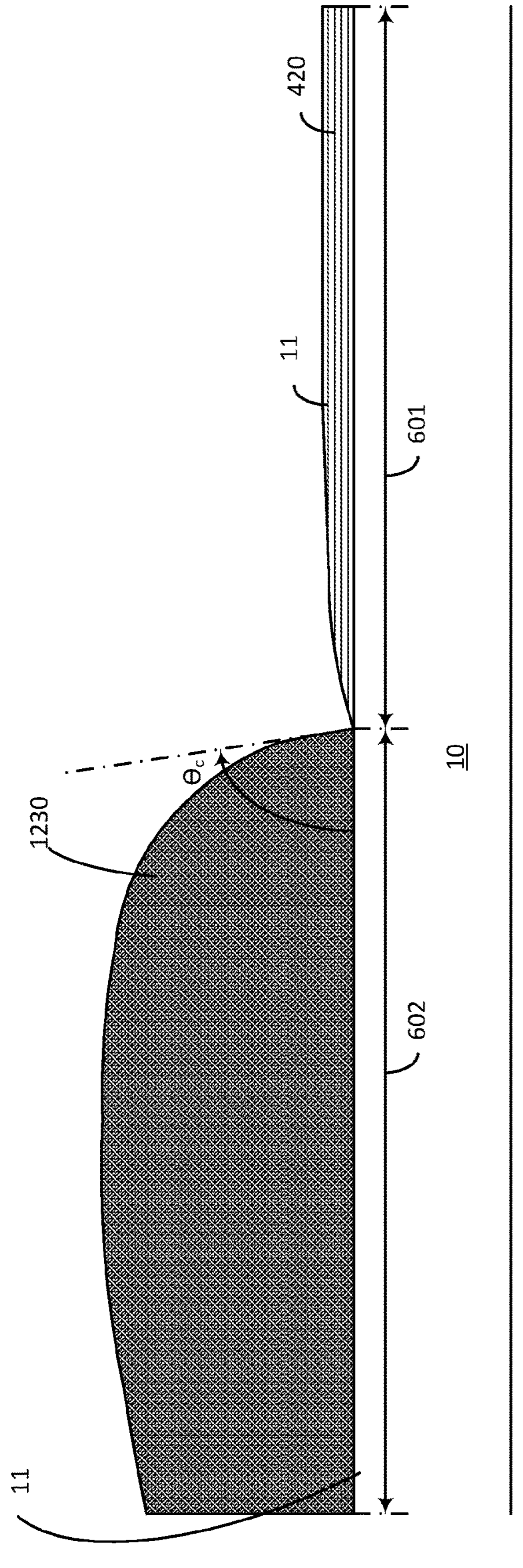

Turning now to FIG. 18F the first portion 601 of the substrate 10 may be coated with the patterning coating 420 and the second portion 602 adjacent thereto may be coated with the deposited layer 1230. In some non-limiting examples, it has been observed that conducting an open mask and/or mask-free deposition of the deposited layer 1230 may result in the deposited layer 1230 exhibiting a tapered cross-sectional profile at, and/or near an interface between the deposited layer 1230 and the patterning coating 420.

In some non-limiting examples, an average layer thickness of the deposited layer 1230 at, and/or near the interface may be less than an average layer thickness $d_3$ of the deposited layer 1230. While such tapered profile may be shown as being curved, and/or arched, in some non-limiting examples, the profile may, in some non-limiting examples be substantially linear, and/or non-linear. By way of non-limiting example, an average layer thickness $d_3$ of the deposited layer 1230 may decrease, without limitation, in a substantially linear, exponential, and/or quadratic fashion in a region proximal to the interface.

It has been observed that a contact angle $\theta_c$ of the deposited layer 1230 at, and/or near the interface between the deposited layer 1230 and the patterning coating 420 may vary, depending on properties of the patterning coating 420, such as a relative initial sticking probability. It may be further postulated that the contact angle $\theta_c$ of the nuclei may, in some non-limiting examples, dictate the thin film contact angle of the deposited layer 1230 formed by deposition. Referring to FIG. 18F by way of non-limiting example, the contact angle $\theta_c$ may be determined by measuring a slope of a tangent of the deposited layer 1230 at and/or near the interface between the deposited layer 1230 and the patterning coating 420. In some non-limiting examples, where the cross-sectional taper profile of the deposited layer 1230 may be substantially linear, the contact angle $\theta_c$ may be determined by measuring the slope of the deposited layer 1230 at, and/or near the interface. As will be appreciated by those having ordinary skill in the relevant art, the contact angle $\theta_c$ may be generally measured relative to a non-zero angle of the underlying layer. In the present disclosure, for purposes of simplicity of illustration, the patterning coating 420 and the deposited layer 1230 may be shown deposited on a planar surface. However, those having ordinary skill in the relevant art will appreciate that the patterning coating 420 and the deposited layer 1230 may be deposited on non-planar surfaces.

Figure 18G:
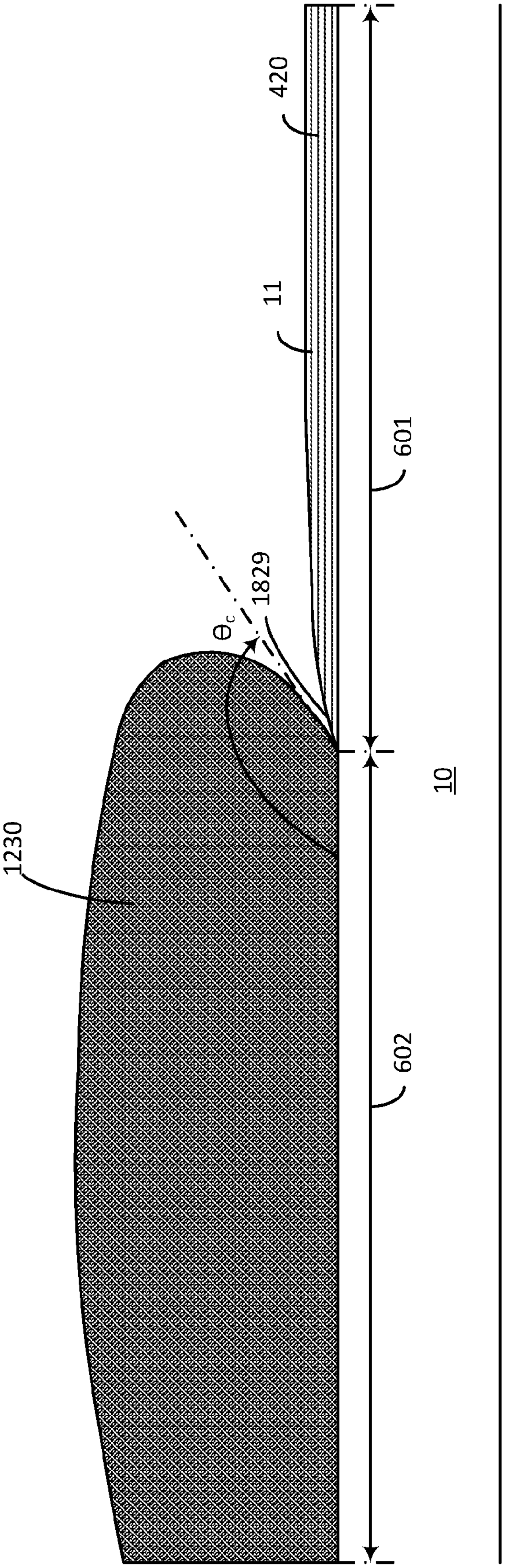

In some non-limiting examples, the contact angle $\theta_c$ of the deposited layer 1230 may exceed about 90°. Referring now to FIG. 18G, by way of non-limiting example, the deposited layer 1230 may be shown as including a part extending past the interface between the patterning coating 420 and the deposited layer 1230 and may be spaced apart from the patterning coating 420 by a gap 1829. In such non-limiting scenario, the contact angle $\theta_c$ may, in some non-limiting examples, exceed 90°.

In some non-limiting examples, it may be advantageous to form a deposited layer 1230 exhibiting a relatively high contact angle $\theta_c$. By way of non-limiting example, the contact angle $\theta_c$ may exceed at least one of about: 10°, 15°, 25°, 30°, 35°, 40°, 50°, 70°, 75°, or 80°. By way of non-limiting example, a deposited layer 1230 having a relatively high contact angle $\theta_c$ may allow for creation of finely patterned features while maintaining a relatively high aspect ratio. By way of non-limiting example, there may be an aim to form a deposited layer 1230 exhibiting a contact angle $\theta_c$ greater than about 90°. By way of non-limiting example, the contact angle $\theta_c$ may exceed at least one of about: 90°, 95°, 100°, 105°, 110° 120°, 130°, 135°, 140°, 145°, 150°, or 170°.

Figure 18H:
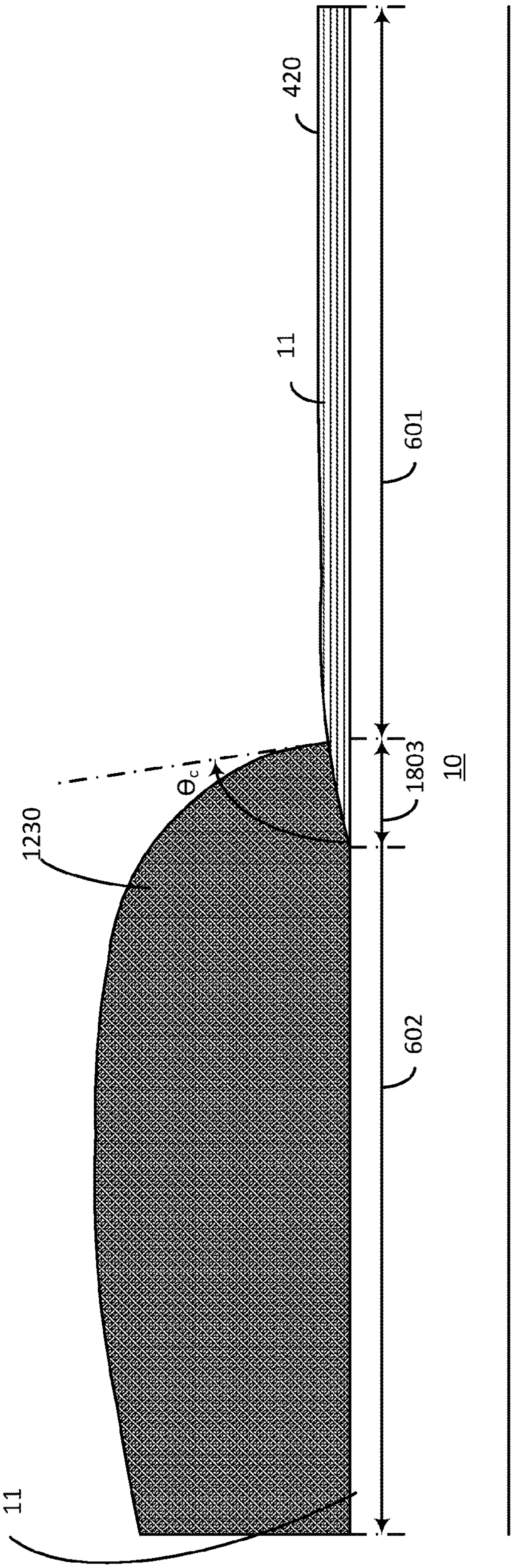
Figure 18I:
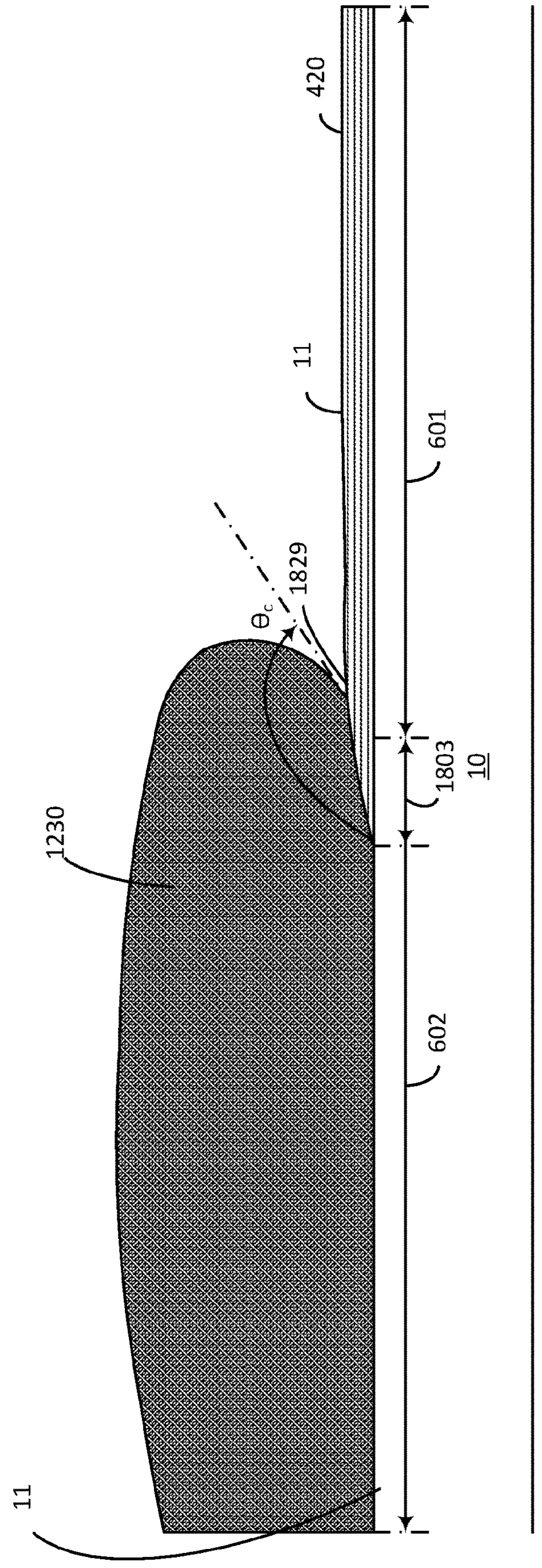

Turning now to FIGS. 18H-18I, the deposited layer 1230 may partially overlap a part of the patterning coating 420 in the third portion 1803 of the substrate 10, which may be disposed between the first portion 601 and the second portion 602 thereof. As shown, the subset of the deposited layer 1230 partially overlapping a subset of the patterning coating 420 may be in physical contact with the exposed layer surface 11 thereof. In some non-limiting examples, the overlap in the third portion 1803 may be formed because of lateral growth of the deposited layer 1230 during an open mask and/or mask-free deposition process. In some non-limiting examples, while the exposed layer surface 11 of the patterning coating 420 may exhibit a relatively low initial sticking probability against deposition of the deposited material 1631 and thus the probability of the material nucleating on the exposed layer surface 11 is low, as the deposited layer 1230 grows in thickness, the deposited layer 1230 may also grow laterally and may cover a subset of the patterning coating 420.

In the case of FIGS. 18H-18I, the contact angle $\theta_c$ of the deposited layer 1230 may be measured at an edge thereof near the interface between it and the patterning coating 420, as shown. In FIG. 181, the contact angle $\theta_c$ may exceed about 90°, which may in some non-limiting examples result in a subset of the deposited layer 1230 being spaced apart from the patterning coating 420 by the gap 1829.

Particle Structure

In some non-limiting examples, such as may be shown in FIG. 17C, there may be at least one particle, including without limitation, a nanoparticle (NP), an island, a plate, a disconnected cluster, and/or a network (collectively particle structure 131) disposed on an exposed layer surface 11 of an underlying layer. In some non-limiting examples, the underlying layer may be the patterning coating 420 in the first portion 601. In some non-limiting examples, the at least one particle structure 131 may be disposed on an exposed layer surface 11 of the patterning coating 420. In some non-limiting examples, there may be a plurality of such particle structures 131.

In some non-limiting examples, the at least one particle structure 131 may comprise a particle material 135. In some non-limiting examples, the particle material 135 may be the same as the deposited material 1631 in the deposited layer 1230.

In some non-limiting examples, the particle material 135 in the discontinuous layer 160 in the first portion 601, the deposited material 1631 in the deposited layer 1230, and/or a material of which the underlying layer thereunder may be comprised, may comprise a common metal.

In some non-limiting examples, the particle material 135 may comprise an element selected from at least one of: K, Na, Li, Ba, Cs, Yb, Ag, Au, Cu, Al, Mg, Zn, Cd, Sn, or Y. In some non-limiting examples, the element may comprise at least one of: K, Na, Li, Ba, Cs, Yb, Ag, Au, Cu, Al, or Mg. In some non-limiting examples, the element may comprise at least one of: Cu, Ag, or Au. In some non-limiting examples, the element may be Cu. In some non-limiting examples, the element may be Al. In some non-limiting examples, the element may comprise at least one of: Mg, Zn, Cd, or Yb. In some non-limiting examples, the element may comprise at least one of: Mg, Ag, Al, Yb, or Li. In some non-limiting examples, the element may comprise at least one of: Mg, Ag, or Yb. In some non-limiting examples, the element may comprise at least one of: Mg, or Ag. In some non-limiting examples, the element may be Ag.

In some non-limiting examples, the particle material 135 may comprise a pure metal. In some non-limiting examples, the at least one particle structure 131 may be a pure metal. In some non-limiting examples, the at least one particle structure 131 may be at least one of: pure Ag or substantially pure Ag. In some non-limiting examples, the substantially pure Ag may have a purity of at least one of at least about: 95%, 99%, 99.9%, 99.99%, 99.999%, or 99.9995%. In some non-limiting examples, the at least one particle structure 131 may be at least one of: pure Mg or substantially pure Mg. In some non-limiting examples, the substantially pure Mg may have a purity of at least one of at least about: 95%, 99%, 99.9%, 99.99%, 99.999%, or 99.9995%.

In some non-limiting examples, the at least one particle structure 131 may comprise an alloy. In some non-limiting examples, the alloy may be at least one of: an Ag-containing alloy, an Mg-containing alloy, or an AgMg-containing alloy. In some non-limiting examples, the AgMg-containing alloy may have an alloy composition that may range from about 1:10 (Ag:Mg) to about 10:1 by volume.

In some non-limiting examples, the particle material 135 may comprise other metals in place of, or in combination with Ag. In some non-limiting examples, the particle material 135 may comprise an alloy of Ag with at least one other metal. In some non-limiting examples, the particle material 135 may comprise an alloy of Ag with at least one of: Mg, or Yb. In some non-limiting examples, such alloy may be a binary alloy having a composition of between about: 5-95 vol. % Ag, with the remainder being the other metal. In some non-limiting examples, the particle material 135 may comprise Ag and Mg. In some non-limiting examples, the particle material 135 may comprise an Ag:Mg alloy having a composition of between about 1:10-10:1 by volume. In some non-limiting examples, the particle material 135 may comprise Ag and Yb. In some non-limiting examples, the particle material 135 may comprise a Yb:Ag alloy having a composition of between about 1:20-10:1 by volume. In some non-limiting examples, the particle material 135 may comprise Mg and Yb. In some non-limiting examples, the particle material 135 may comprise an Mg:Yb alloy. In some non-limiting examples, the particle material 135 may comprise an Ag:Mg:Yb alloy.

In some non-limiting examples, the at least one particle structure 131 may comprise at least one additional element. In some non-limiting examples, such additional element may be a non-metallic element. In some non-limiting examples, the non-metallic material may be at least one of: O, S, N, or C. It will be appreciated by those having ordinary skill in the relevant art that, in some non-limiting examples, such additional element(s) may be incorporated into the at least one particle structure 131 as a contaminant, due to the presence of such additional element(s) in the source material, equipment used for deposition, and/or the vacuum chamber environment. In some non-limiting examples, such additional element(s) may form a compound together with other element(s) of the at least one particle structure 131. In some non-limiting examples, a concentration of the non-metallic element in the deposited material 1631 may be no more than at least one of about: 1%, 0.1%, 0.01%, 0.001%, 0.0001%, 0.00001%, 0.000001%, or In some non-limiting examples, the at least one particle structure 131 may have a composition in which a combined amount of 0 and C therein is no more than at least one of about: 10%, 5%, 1%, 0.1%, 0.01%, 0.001%, 0.0001%, 0.000001%, or 0.0000001%.

In some non-limiting examples, the presence of the at least one particle structure 131, including without limitation, NPs, including without limitation, in a discontinuous layer 160, on an exposed layer surface 11 of the patterning coating 420 may affect some optical properties of the device 1700.

In some non-limiting examples, such plurality of particle structures 131 may form a discontinuous layer 160.

Without wishing to be limited to any particular theory, it may be postulated that, while the formation of a closed coating 1240 of the deposited material 1631 may be substantially inhibited by and/or on the patterning coating 420, in some non-limiting examples, when the patterning coating 420 is exposed to deposition of the deposited material 1631 thereon, some vapor monomers 1632 of the deposited material 1631 may ultimately form at least one particle structure 131 of the deposited material 1631 thereon.

In some non-limiting examples, at least some of the particle structures 131 may be disconnected from one another. In other words, in some non-limiting examples, the discontinuous layer 160 may comprise features, including particle structures 131, that may be physically separated from one another, such that the particle structures 131 do not form a closed coating 1240. Accordingly, such discontinuous layer 160 may, in some non-limiting examples, thus comprise a thin disperse layer of deposited material 1631 formed as particle structures 131, inserted at, and/or substantially across the lateral extent of, an interface between the patterning coating 420 and at least one covering layer 915 in the device 100.

In some non-limiting examples, at least one of the particle structures 131 of deposited material 1631 may be in physical contact with an exposed layer surface 11 of the patterning coating 420. In some non-limiting examples, substantially all of the particle structures 131 of deposited material 1631 may be in physical contact with the exposed layer surface 11 of the patterning coating 420.

Without wishing to be bound by any particular theory, it has been found, somewhat surprisingly, that the presence of such a thin, disperse discontinuous layer 160 of deposited material 1631, including without limitation, at least one particle structure 131, including without limitation, metal particle structures 131, on an exposed layer surface 11 of the patterning coating 420, may exhibit at least one varied characteristic and concomitantly, varied behaviour, including without limitation, optical effects and properties of the device 100, as discussed herein. In some non-limiting examples, such effects and properties may be controlled to some extent by judicious selection of at least one of: the characteristic size, size distribution, shape, surface coverage, configuration, deposited density, and/or dispersity of the particle structures 131 on the patterning coating 420.

In some non-limiting examples, the formation of at least one of: the characteristic size, size distribution, shape, surface coverage, configuration, deposited density, and/or dispersity of such discontinuous layer 160 may be controlled, in some non-limiting examples, by judicious selection of at least one of: at least one characteristic of the patterning material 1511, an average film thickness $d_2$ of the patterning coating 420, the introduction of heterogeneities in the patterning coating 420, and/or a deposition environment, including without limitation, a temperature, pressure, duration, deposition rate, and/or deposition process for the patterning coating 420.

In some non-limiting examples, the formation of at least one of the characteristic size, size distribution, shape, surface coverage, configuration, deposited density, and/or dispersity of such discontinuous layer 160 may be controlled, in some non-limiting examples, by judicious selection of at least one of: at least one characteristic of the particle material 135 (which may be the deposited material 1631), an extent to which the patterning coating 420 may be exposed to deposition of the particle material 135 (which, in some non-limiting examples may be specified in terms of a thickness of the corresponding discontinuous layer 160), and/or a deposition environment, including without limitation, a temperature, pressure, duration, deposition rate, and/or method of deposition for the particle material 135.

In some non-limiting examples, the discontinuous layer 160 may be deposited in a pattern across the lateral extent of the patterning coating 420.

In some non-limiting examples, the discontinuous layer 160 may be disposed in a pattern that may be defined by at least one region therein that is substantially devoid of the at least one particle structure 131.

In some non-limiting examples, the characteristics of such discontinuous layer 160 may be assessed, in some non-limiting examples, somewhat arbitrarily, according to at least one of several criteria, including without limitation, a characteristic size, size distribution, shape, configuration, surface coverage, deposited distribution, dispersity, and/or a presence, and/or extent of aggregation instances of the particle material 135, formed on a part of the exposed layer surface 11 of the underlying layer.

In some non-limiting examples, an assessment of the discontinuous layer 160 according to such at least one criterion, may be performed on, including without limitation, by measuring, and/or calculating, at least one attribute of the discontinuous layer 160, using a variety of imaging techniques, including without limitation, at least one of: transmission electron microscopy (TEM), atomic force microscopy (AFM), and/or scanning electron microscopy (SEM).

Those having ordinary skill in the relevant art will appreciate that such an assessment of the discontinuous layer 160 may depend, to a greater, and/or lesser extent, by the extent, of the exposed layer surface 11 under consideration, which in some non-limiting examples may comprise an area, and/or region thereof. In some non-limiting examples, the discontinuous layer 160 may be assessed across the entire extent, in a first lateral aspect, and/or a second lateral aspect that is substantially transverse thereto, of the exposed layer surface 11. In some non-limiting examples, the discontinuous layer 160 may be assessed across an extent that comprises at least one observation window applied against (a part of) the discontinuous layer 160.

In some non-limiting examples, the at least one observation window may be located at at least one of: a perimeter, interior location, and/or grid coordinate of the lateral aspect of the exposed layer surface 11. In some non-limiting examples, a plurality of the at least one observation windows may be used in assessing the discontinuous layer 160.

In some non-limiting examples, the observation window may correspond to a field of view of an imaging technique applied to assess the discontinuous layer 160, including without limitation, at least one of: TEM, AFM, and/or SEM. In some non-limiting examples, the observation window may correspond to a given level of magnification, including without limitation, at least one of: 2.00 μm, 1.00 μm, 500 nm, or 200 nm.

In some non-limiting examples, the assessment of the discontinuous layer 160, including without limitation, at least one observation window used, of the exposed layer surface 11 thereof, may involve calculating, and/or measuring, by any number of mechanisms, including without limitation, manual counting, and/or known estimation techniques, which may, in some non-limiting examples, may comprise curve, polygon, and/or shape fitting techniques.

In some non-limiting examples, the assessment of the discontinuous layer 160, including without limitation, at least one observation window used, of the exposed layer surface 11 thereof, may involve calculating, and/or measuring an average, median, mode, maximum, minimum, and/or other probabilistic, statistical, and/or data manipulation of a value of the calculation, and/or measurement.

In some non-limiting examples, one of the at least one criterion by which such discontinuous layer 160 may be assessed, may be a surface coverage of the deposited material 1631 on such (part of the) discontinuous layer 160. In some non-limiting examples, the surface coverage may be represented by a (non-zero) percentage coverage by such deposited material 1631 of such (part of the) discontinuous layer 160. In some non-limiting examples, the percentage coverage may be compared to a maximum threshold percentage coverage.

In some non-limiting examples, a (part of a) discontinuous layer 160 having a surface coverage that may be substantially no more than the maximum threshold percentage coverage, may result in a manifestation of different optical characteristics that may be imparted by such part of the discontinuous layer 160, to EM radiation passing therethrough, whether transmitted entirely through the device 100, and/or emitted thereby, relative to EM radiation passing through a part of the discontinuous layer 160 having a surface coverage that substantially exceeds the maximum threshold percentage coverage.

In some non-limiting examples, one measure of a surface coverage of an amount of an electrically conductive material on a surface may be a (EM radiation) transmittance, since in some non-limiting examples, electrically conductive materials, including without limitation, metals, including without limitation: Ag, Mg, or Yb, attenuate, and/or absorb EM radiation.

Those having ordinary skill in the relevant art will appreciate that in some non-limiting examples, surface coverage may be understood to encompass one or both of particle size, and deposited density. Thus, in some non-limiting examples, a plurality of these three criteria may be positively correlated. Indeed, in some non-limiting examples, a criterion of low surface coverage may comprise some combination of a criterion of low deposited density with a criterion of low particle size.

In some non-limiting examples, one of the at least one criterion by which such discontinuous layer 160 may be assessed, may be a characteristic size of the constituent particle structures 131.

In some non-limiting examples, the at least one particle structure 131 of the discontinuous layer 160, may have a characteristic size that is no more than a maximum threshold size. Non-limiting examples of the characteristic size may include at least one of: height, width, length, and/or diameter.

In some non-limiting examples, substantially all of the particle structures 131, of the discontinuous layer 160 may have a characteristic size that lies within a specified range.

In some non-limiting examples, such characteristic size may be characterized by a characteristic length, which in some non-limiting examples, may be considered a maximum value of the characteristic size. In some non-limiting examples, such maximum value may extend along a major axis of the particle structure 131. In some non-limiting examples, the major axis may be understood to be a first dimension extending in a plane defined by the plurality of lateral axes. In some non-limiting examples, a characteristic width may be identified as a value of the characteristic size of the particle structure 131 that may extend along a minor axis of the particle structure 131. In some non-limiting examples, the minor axis may be understood to be a second dimension extending in the same plane but substantially transverse to the major axis.

In some non-limiting examples, the characteristic length of the at least one particle structure 131, along the first dimension, may be no more than the maximum threshold size.

In some non-limiting examples, the characteristic width of the at least one particle structure 131, along the second dimension, may be no more than the maximum threshold size.

In some non-limiting examples, a size of the constituent particle structures 131, in the (part of the) discontinuous layer 160, may be assessed by calculating, and/or measuring a characteristic size of such at least one particle structure 131, including without limitation, a mass, volume, length of a diameter, perimeter, major, and/or minor axis thereof.

In some non-limiting examples, one of the at least one criterion by which such discontinuous layer 160 may be assessed, may be a deposited density thereof.

In some non-limiting examples, the characteristic size of the particle structure 131 may be compared to a maximum threshold size.

In some non-limiting examples, the deposited density of the particle structures 131 may be compared to a maximum threshold deposited density.

In some non-limiting examples, at least one of such criteria may be quantified by a numerical metric. In some non-limiting examples, such a metric may be a calculation of a dispersity D that describes the distribution of particle (area) sizes in a deposited layer 1230 of particle structures 131, in which:

$$D=\frac{\overline{S_s}}{\overline{S_n}} \tag{1}$$

where:

$$\overline{S_s}=\frac{\sum_{i=1}^{n}S_i^2}{\sum_{i=1}^{n}S_i},\ \overline{S_n}=\frac{\sum_{i=1}^{n}S_i}{n}, \tag{2}$$

n is the number of particle structures 131 in a sample area,
$S_i$ is the (area) size of the $i^{th}$ particle structure 131,
$\overline{S}_n$ is the number average of the particle (area) sizes and
$\overline{S}_s$ is the (area) size average of the particle (area) sizes.

Those having ordinary skill in the relevant art will appreciate that the dispersity is roughly analogous to a polydispersity index (PDI) and that these averages are roughly analogous to the concepts of number average molecular weight and weight average molecular weight familiar in organic chemistry, but applied to an (area) size, as opposed to a molecular weight of a sample particle structure 131.

Those having ordinary skill in the relevant will also appreciate that while the concept of dispersity may, in some non-limiting examples, be considered a three-dimensional volumetric concept, in some non-limiting examples, the dispersity may be considered to be a two-dimensional concept. As such, the concept of dispersity may be used in connection with viewing and analyzing two-dimensional images of the deposited layer 1230, such as may be obtained by using a variety of imaging techniques, including without limitation, at least one of: TEM, AFM and/or SEM. It is in such a two-dimensional context, that the equations set out above are defined.

In some non-limiting examples, the dispersity and/or the number average of the particle (area) size and the (area) size average of the particle (area) size may involve a calculation of at least one of: the number average of the particle diameters and the (area) size average of the particle diameters:

$$\overline{d_n}=2\sqrt{\frac{\overline{S_n}}{\pi}},\ \overline{d_s}=2\sqrt{\frac{\overline{S_s}}{\pi}} \tag{3}$$

In some non-limiting examples, the deposited material, including without limitation as particle structures 131, of the at least one deposited layer 1230, may be deposited by a mask-free and/or open mask deposition process.

In some non-limiting examples, the particle structures 131 may have a substantially round shape. In some non-limiting examples, the particle structures 131 may have a substantially spherical shape.

For purposes of simplification, in some non-limiting examples, it may be assumed that a longitudinal extent of each particle structure 131 may be substantially the same (and, in any event, may not be directly measured from a SEM image in plan) so that the (area) size of the particle structure 131 may be represented as a two-dimensional area coverage along the pair of lateral axes. In the present disclosure, a reference to an (area) size may be understood to refer to such two-dimensional concept, and to be differentiated from a size (without the prefix "area") that may be understood to refer to a one-dimensional concept, such as a linear dimension.

Indeed, in some early investigations, it appears that, in some non-limiting examples, the longitudinal extent, along the longitudinal axis, of such particle structures 131, may tend to be small relative to the lateral extent (along at least one of the lateral axes), such that the volumetric contribution of the longitudinal extent thereof may be much less than that of such lateral extent. In some non-limiting examples, this may be expressed by an aspect ratio (a ratio of a longitudinal extent to a lateral extent) that may be no more than 1. In some non-limiting examples, such aspect ratio may be at least one of about: 1:10, 1:20, 1:50, 1:75, or 1:300.

In this regard, the assumption set out above (that the longitudinal extent is substantially the same and can be ignored) to represent the particle structure 131 as a two-dimensional area coverage may be appropriate.

Those having ordinary skill in the relevant art will appreciate, having regard to the non-determinative nature of the deposition process, especially in the presence of defects, and/or anomalies on the exposed layer surface 11 of the underlying material, including without limitation, heterogeneities, including without limitation, at least one of: a step edge, a chemical impurity, a bonding site, a kink, and/or a contaminant thereon, and consequently the formation of particle structures 131 thereon, the non-uniform nature of coalescence thereof as the deposition process continues, and in view of the uncertainty in the size, and/or position of observation windows, as well as the intricacies and variability inherent in the calculation, and/or measurement of their characteristic size, spacing, deposited density, degree of aggregation, and the like, there may be considerable variability in terms of the features, and/or topology within observation windows.

In the present disclosure, for purposes of simplicity of illustration, certain details of deposited materials 1631, including without limitation, thickness profiles, and/or edge profiles of layer(s) have been omitted.

Those having ordinary skill in the relevant art will appreciate that certain metal NPs, whether or not as part of a discontinuous layer 160 of deposited material 1631, including without limitation, at least one particle structure 131, may exhibit surface plasmon (SP) excitations, and/or coherent oscillations of free electrons, with the result that such NPs may absorb, and/or scatter light in a wavelength (sub-) range of the EM spectrum, including without limitation, the visible spectrum, and/or a sub-range thereof. The optical response, including without limitation, the (sub-) range of the EM spectrum over which absorption may be concentrated (absorption spectrum), refractive index, and/or extinction coefficient, of such localized SP (LSP) excitations, and/or coherent oscillations, may be tailored by varying properties of such NPs, including without limitation, at least one of: a characteristic size, size distribution, shape, surface coverage, configuration, deposition density, dispersity, and/or property, including without limitation, material, and/or degree of aggregation, of the nanostructures, and/or a medium proximate thereto.

Such optical response, in respect of photon-absorbing coatings, may include absorption of photons incident thereon, thereby reducing reflection. In some non-limiting examples, the absorption may be concentrated in a wavelength (sub-) range of the EM spectrum, including without limitation, the visible spectrum, and/or a sub-range thereof. In some non-limiting examples, employing a photon-absorbing layer as part of an opto-electronic device may reduce reliance on a polarizer therein.

It has been reported in Fusella et al., "Plasmonic enhancement of stability and brightness in organic light-emitting devices", *Nature* 2020, 585, at 379-382 ("Fusella et al."), that the stability of an OLED device may be enhanced by incorporating an NP-based outcoupling layer above the cathode layer to extract energy from the plasmon modes. The NP-based outcoupling layer was fabricated by spin-casting cubic Ag NPs on top of an organic layer on top of a cathode. However, since most commercial OLED devices are fabricated using vacuum-based processing, spin-casting from solution may not constitute an appropriate mechanism for forming such an NP-based outcoupling layer above the cathode.

It has been discovered that such an NP-based outcoupling layer above the cathode may be fabricated in vacuum (and thus, may be suitable for use in a commercial OLED fabrication process), by depositing a metal deposited material 1631 in a discontinuous layer 160 onto a patterning coating 420, which in some non-limiting examples, may be, and/or be deposited on, the cathode. Such process may avoid the use of solvents or other wet chemicals that may cause damage to the OLED device, and/or may adversely impact device reliability.

In some non-limiting examples, the presence of such a discontinuous layer 160 of deposited material 1631, including without limitation, at least one particle structure 131, may contribute to enhanced extraction of EM radiation, performance, stability, reliability, and/or lifetime of the device.

In some non-limiting examples, the existence, in a layered device 100, of at least one discontinuous layer 160, on, and/or proximate to the exposed layer surface 11 of a patterning coating 420, and/or, in some non-limiting examples, and/or proximate to the interface of such patterning 110 with at least one covering layer 915, may impart optical effects to EM signals, including without limitation, photons, emitted by the device, and/or transmitted therethrough.

Those having ordinary skill in the relevant art will appreciate that, while a simplified model of the optical effects is presented herein, other models, and/or explanations may be applicable.

In some non-limiting examples, the presence of such a discontinuous layer 160 of the deposited material 1631, including without limitation, at least one particle structure 131, may reduce, and/or mitigate crystallization of thin film layers, and/or coatings disposed adjacent in the longitudinal aspect, including without limitation, the patterning coating 420, and/or at least one covering layer 915, thereby stabilizing the property of the thin film(s) disposed adjacent thereto, and, in some non-limiting examples, reducing scattering. In some non-limiting examples, such thin film may be, and/or comprise at least one layer of an outcoupling, and/or encapsulating coating 2350 (FIG. 23C) of the device 100, including without limitation, a capping layer (CPL).

In some non-limiting examples, the presence of such a discontinuous layer 160 of deposited material 1631, including without limitation, at least one particle structure 131, may provide an enhanced absorption in at least a part of the UV spectrum. In some non-limiting examples, controlling the characteristics of such particle structures 131, including without limitation, at least one of: characteristic size, size distribution, shape, surface coverage, configuration, deposited density, dispersity, deposited material 1631, and refractive index, of the particle structures 131, may facilitate controlling the degree of absorption, wavelength range and peak wavelength of the absorption spectrum, including in the UV spectrum. Enhanced absorption of EM radiation in at least a part of the UV spectrum may be advantageous, for example, for improving device performance, stability, reliability, and/or lifetime.

In some non-limiting examples, the optical effects may be described in terms of its impact on the transmission, and/or absorption wavelength spectrum, including a wavelength range, and/or peak intensity thereof.

Additionally, while the model presented may suggest certain effects imparted on the transmission, and/or absorption of photons passing through such discontinuous layer 160, in some non-limiting examples, such effects may reflect local effects that may not be reflected on a broad, observable basis.

Opto-Electronic Device

FIG. 19 is a simplified block diagram from a cross-sectional aspect, of an example electro-luminescent device 1900 according to the present disclosure. In some non-limiting examples, the device 1900 is an OLED.

The device 1900 may comprise a substrate 10, upon which a frontplane 1910, comprising a plurality of layers, respectively, a first electrode 1920, at least one semiconducting layer 1930, and a second electrode 1940, are disposed. In some non-limiting examples, the frontplane 1910 may provide mechanisms for photon emission, and/or manipulation of emitted photons.

In some non-limiting examples, the deposited layer 1230 and the underlying layer may together form at least a part of at least one of the first electrode 1920 and the second electrode 1940 of the device 1900. In some non-limiting examples, the deposited layer 1230 and the underlying layer thereunder may together form at least a part of a cathode of the device 1900.

In some non-limiting examples, the device 1900 may be electrically coupled with a power source 1905. When so coupled, the device 1900 may emit photons as described herein.

Substrate

In some examples, the substrate 10 may comprise a base substrate 1912. In some examples, the base substrate 1912 may be formed of material suitable for use thereof, including without limitation, an inorganic material, including without limitation, Si, glass, metal (including without limitation, a metal foil), sapphire, and/or other inorganic material, and/or an organic material, including without limitation, a polymer, including without limitation, a polyimide, and/or an Si-based polymer. In some examples, the base substrate 1912 may be rigid or flexible. In some examples, the substrate 10 may be defined by at least one planar surface. In some non-limiting examples, the substrate 10 may have at least one surface that supports the remaining frontplane 1910 components of the device 1900, including without limitation, the first electrode 1920, the at least one semiconducting layer 1930, and/or the second electrode 1940.

In some non-limiting examples, such surface may be an organic surface, and/or an inorganic surface.

In some examples, the substrate 10 may comprise, in addition to the base substrate 1912, at least one additional organic, and/or inorganic layer (not shown nor specifically described herein) supported on an exposed layer surface 11 of the base substrate 1912.

In some non-limiting examples, such additional layers may comprise, and/or form at least one organic layer, which may comprise, replace, and/or supplement at least one of the at least one semiconducting layers 1930.

In some non-limiting examples, such additional layers may comprise at least one inorganic layer, which may comprise, and/or form at least one electrode, which in some non-limiting examples, may comprise, replace, and/or supplement the first electrode 1920, and/or the second electrode 1940.

In some non-limiting examples, such additional layers may comprise, and/or be formed of, and/or as a backplane 1915. In some non-limiting examples, the backplane 1915 may contain power circuitry, and/or switching elements for driving the device 1900, including without limitation, electronic TFT structure(s) 901, and/or component(s) thereof, that may be formed by a photolithography process, which may not be provided under, and/or may precede the introduction of a low pressure (including without limitation, a vacuum) environment.

Backplane and TFT Structure(s) Embodied Therein

In some non-limiting examples, the backplane 1915 of the substrate 10 may comprise at least one electronic, and/or opto-electronic component, including without limitation, transistors, resistors, and/or capacitors, such as which may support the device 1900 acting as an active-matrix, and/or a passive matrix device. In some non-limiting examples, such structures may be a thin-film transistor (TFT) structure 901.

Non-limiting examples of TFT structures 901 include top-gate, bottom-gate, n-type and/or p-type TFT structures 901. In some non-limiting examples, the TFT structure 901 may incorporate any at least one of amorphous Si (a-Si), indium gallium zinc oxide (IGZO), and/or low-temperature polycrystalline Si (LTPS).

First Electrode

The first electrode 1920 may be deposited over the substrate 10. In some non-limiting examples, the first electrode 1920 may be electrically coupled with a terminal of the power source 1905, and/or to ground. In some non-limiting examples, the first electrode 1920 may be so coupled through at least one driving circuit which in some non-limiting examples, may incorporate at least one TFT structure 901 in the backplane 1915 of the substrate 10.

In some non-limiting examples, the first electrode 1920 may comprise an anode, and/or a cathode. In some non-limiting examples, the first electrode 1920 may be an anode.

In some non-limiting examples, the first electrode 1920 may be formed by depositing at least one thin conductive film, over (a part of) the substrate 10. In some non-limiting examples, there may be a plurality of first electrodes 1920, disposed in a spatial arrangement over a lateral aspect of the substrate 10. In some non-limiting examples, at least one of such at least one first electrodes 1920 may be deposited over (a part of) a TFT insulating layer 909 disposed in a lateral aspect in a spatial arrangement. If so, in some non-limiting examples, at least one of such at least one first electrodes 1920 may extend through an opening of the corresponding TFT insulating layer 909 to be electrically coupled with an electrode of the TFT structures 901 in the backplane 1915.

In some non-limiting examples, the at least one first electrode 1920, and/or at least one thin film thereof, may comprise various materials, including without limitation, at least one metallic material, including without limitation, Mg, Al, calcium (Ca), Zn, Ag, Cd, Ba, or Yb, or combinations of any plurality thereof, including without limitation, alloys containing any of such materials, at least one metal oxide, including without limitation, a TCO, including without limitation, ternary compositions such as, without limitation, fluorine tin oxide (FTO), indium zinc oxide (IZO), or ITO, or combinations of any plurality thereof, or in varying proportions, or combinations of any plurality thereof in at least one layer, any at least one of which may be, without limitation, a thin film.

Second Electrode

The second electrode 1940 may be deposited over the at least one semiconducting layer 1930. In some non-limiting examples, the second electrode 1940 may be electrically coupled with a terminal of the power source 1905, and/or with ground. In some non-limiting examples, the second electrode 1940 may be so coupled through at least one driving circuit, which in some non-limiting examples, may incorporate at least one TFT structure 901 in the backplane 1915 of the substrate 10.

In some non-limiting examples, the second electrode 1940 may comprise an anode, and/or a cathode. In some non-limiting examples, the second electrode 1940 may be a cathode.

In some non-limiting examples, the second electrode 1940 may be formed by depositing a deposited layer 1230, in some non-limiting examples, as at least one thin film, over (a part of) the at least one semiconducting layer 1930. In some non-limiting examples, there may be a plurality of second electrodes 1940, disposed in a spatial arrangement over a lateral aspect of the at least one semiconducting layer 1930.

In some non-limiting examples, the at least one second electrode 1940 may comprise various materials, including without limitation, at least one metallic materials, including without limitation, Mg, Al, Ca, Zn, Ag, Cd, Ba, or Yb, or combinations of any plurality thereof, including without limitation, alloys containing any of such materials, at least one metal oxides, including without limitation, a TCO, including without limitation, ternary compositions such as, without limitation, FTO, IZO, or ITO, or combinations of any plurality thereof, or in varying proportions, or zinc oxide (ZnO), or other oxides containing indium (In), or Zn, or combinations of any plurality thereof in at least one layer, and/or at least one non-metallic materials, any at least one of which may be, without limitation, a thin conductive film. In some non-limiting examples, for a Mg:Ag alloy, such alloy composition may range between about 1:9-9:1 by volume.

In some non-limiting examples, the deposition of the second electrode 1940 may be performed using an open mask and/or a mask-free deposition process.

In some non-limiting examples, the second electrode 1940 may comprise a plurality of such layers, and/or coatings. In some non-limiting examples, such layers, and/or coatings may be distinct layers, and/or coatings disposed on top of one another.

In some non-limiting examples, the second electrode 1940 may comprise a Yb/Ag bi-layer coating. By way of non-limiting example, such bi-layer coating may be formed by depositing a Yb coating, followed by an Ag coating. In some non-limiting examples, a thickness of such Ag coating may exceed a thickness of the Yb coating.

In some non-limiting examples, the second electrode 1940 may be a multi-layer electrode 1940 comprising at least one metallic layer, and/or at least one oxide layer.

In some non-limiting examples, the second electrode 1940 may comprise a fullerene and Mg.

By way of non-limiting example, such coating may be formed by depositing a fullerene coating followed by an Mg coating. In some non-limiting examples, a fullerene may be dispersed within the Mg coating to form a fullerene-containing Mg alloy coating. Non-limiting examples of such coatings are described in United States Patent Application Publication No. 2015/0287846 published 8 Oct. 2015, and/or in PCT International Application No. PCT/IB2017/054970 filed 15 Aug. 2017 and published as WO2018/033860 on 22 Feb. 2018.

Semiconducting Layer

In some non-limiting examples, the at least one semiconducting layer 1930 may comprise a plurality of layers 1931, 1933, 1935, 1937, 1939, any of which may be disposed, in some non-limiting examples, in a thin film, in a stacked configuration, which may include, without limitation, at least one of a hole injection layer (HIL) 1931, a hole transport layer (HTL) 1933, an emissive layer (EML) 1935, an electron transport layer (ETL) 1937, and/or an electron injection layer (EIL) 1939.

In some non-limiting examples, the at least one semiconducting layer 1930 may form a "tandem" structure comprising a plurality of EMLs 1935. In some non-limiting examples, such tandem structure may also comprise at least one charge generation layer (CGL).

Those having ordinary skill in the relevant art will readily appreciate that the structure of the device 1900 may be varied by omitting, and/or combining at least one of the semiconductor layers 1931, 1933, 1935, 1937, 1939.

Further, any of the layers 1931, 1933, 1935, 1937, 1939 of the at least one semiconducting layer 1930 may comprise any number of sub-layers. Still further, any of such layers 1931, 1933, 1935, 1937, 1939, and/or sub-layer(s) thereof may comprise various mixture(s), and/or composition gradient(s). In addition, those having ordinary skill in the relevant art will appreciate that the device 1900 may comprise at least one layer comprising inorganic, and/or organometallic materials and may not be necessarily limited to devices comprised solely of organic materials. By way of non-limiting example, the device 1900 may comprise at least one QD.

In some non-limiting examples, the HIL 1931 may be formed using a hole injection material, which may facilitate injection of holes by the anode.

In some non-limiting examples, the HTL 1933 may be formed using a hole transport material, which may, in some non-limiting examples, exhibit high hole mobility.

In some non-limiting examples, the ETL 1937 may be formed using an electron transport material, which may, in some non-limiting examples, exhibit high electron mobility.

In some non-limiting examples, the EIL 1939 may be formed using an electron injection material, which may facilitate injection of electrons by the cathode.

In some non-limiting examples, the EML 1935 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter, and/or a plurality of any combination of these.

In some non-limiting examples, the device 1900 may be an OLED in which the at least one semiconducting layer 1930 comprises at least an EML 1935 interposed between conductive thin film electrode 1920, 1940, whereby, when a potential difference is applied across them, holes may be injected into the at least one semiconducting layer 1930 through the anode and electrons may be injected into the at least one semiconducting layer 1930 through the cathode, migrate toward the EML 1935 and combine to emit EM radiation in the form of photons.

In some non-limiting examples, the device 1900 may be an electro-luminescent QD device in which the at least one semiconducting layer 1930 may comprise an active layer comprising at least one QD. When current may be provided by the power source 1905 to the first electrode 1920 and second electrode 1940, photons may be emitted from the active layer comprising the at least one semiconducting layer 1930 between them.

Those having ordinary skill in the relevant art will readily appreciate that the structure of the device 1900 may be varied by the introduction of at least one additional layer (not shown) at appropriate position(s) within the at least one semiconducting layer 1930 stack, including without limitation, a hole blocking layer (HBL) (not shown), an electron blocking layer (EBL) (not shown), an additional charge transport layer (CTL) (not shown), and/or an additional charge injection layer (CIL) (not shown).

In some non-limiting examples, including where the OLED device 1900 comprises a lighting panel, an entire lateral aspect of the device 1900 may correspond to a single emissive element. As such, the substantially planar cross-sectional profile shown in FIG. 19 may extend substantially along the entire lateral aspect of the device 1900, such that EM radiation is emitted from the device 1900 substantially along the entirety of the lateral extent thereof. In some non-limiting examples, such single emissive element may be driven by a single driving circuit of the device 1900.

In some non-limiting examples, including where the OLED device 1900 comprises a display module, the lateral aspect of the device 1900 may be sub-divided into a plurality of emissive regions 910 of the device 1900, in which the cross-sectional aspect of the device structure 1900, within each of the emissive region(s) 910, may cause EM radiation to be emitted therefrom when energized.

Emissive Regions

Figure 20:
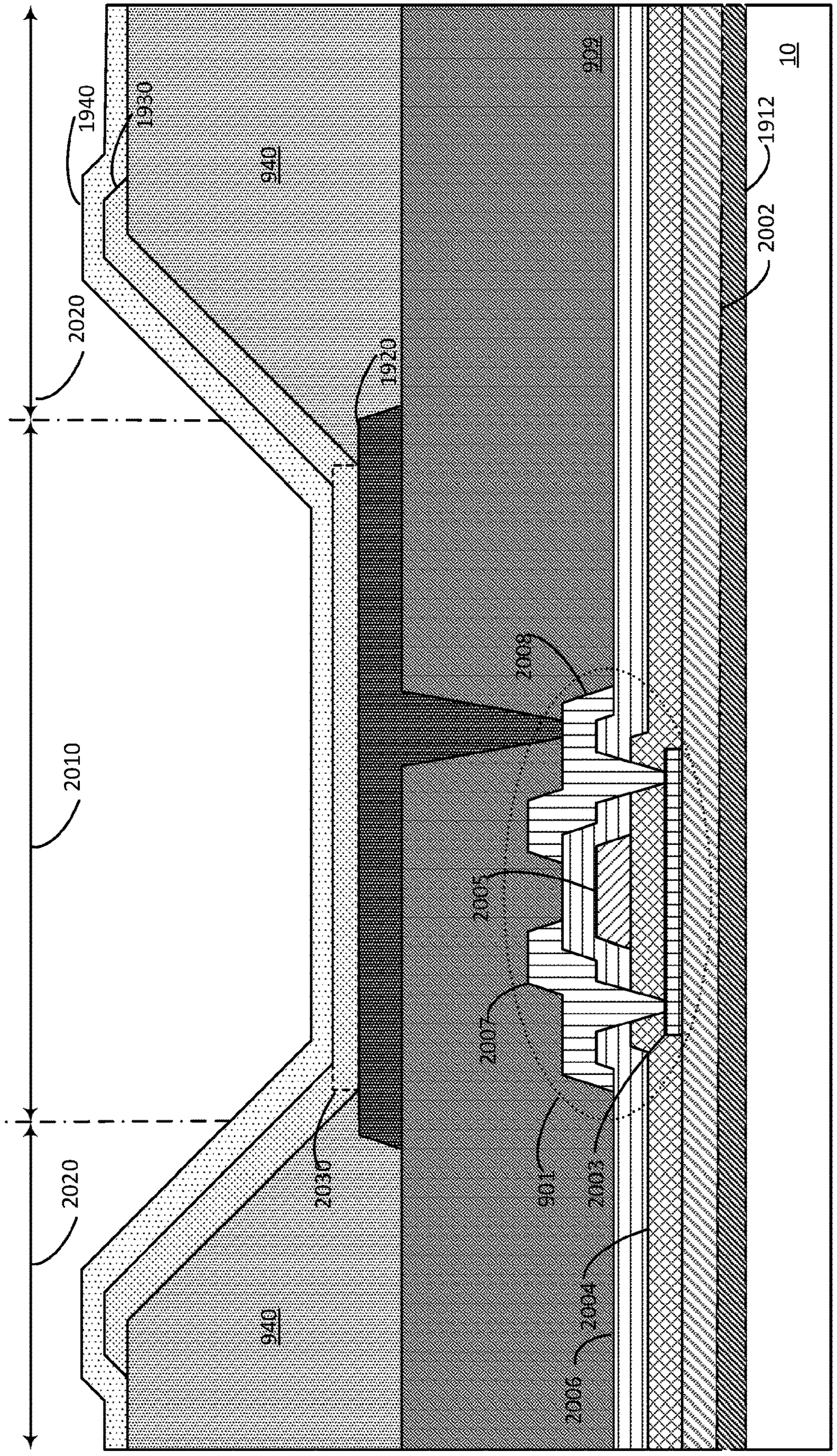
FIG. 20 is a cross-sectional view of the device of FIG. 19.

In some non-limiting examples, such as may be shown by way of non-limiting example in FIG. 20, an active region 2030 of an emissive region 910 may be defined to be bounded, in the transverse aspect, by the first electrode 1920 and the second electrode 1940, and to be confined, in the lateral aspect, to an emissive region 910 defined by the first electrode 1920 and the second electrode 1940. Those having ordinary skill in the relevant art will appreciate that the lateral extent 2010 of the emissive region 910, and thus the lateral boundaries of the active region 2030, may not correspond to the entire lateral aspect of either, or both, of the first electrode 1920 and the second electrode 1940. Rather, the lateral extent 2010 of the emissive region 910 may be substantially no more than the lateral extent of either of the first electrode 1920 and the second electrode 1940. By way of non-limiting example, parts of the first electrode 1920 may be covered by the PDL(s) 940 and/or parts of the second electrode 1940 may not be disposed on the at least one semiconducting layer 1930, with the result, in either, or both, scenarios, that the emissive region 910 may be laterally constrained.

In some non-limiting examples, individual emissive regions 910 of the device 1900 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by at least one feature thereof, including without limitation, a wavelength of EM radiation emitted by the emissive region 910 thereof, a shape of such emissive region 910, a dimension (along either, or both of, the first, and/or second lateral direction(s)), an orientation (relative to either, and/or both of the first, and/or second lateral direction(s)), and/or a spacing (relative to either, or both of, the first, and/or second lateral direction(s)) from a previous element in the pattern. In some non-limiting examples, the pattern may repeat in either, or both of, the first and/or second lateral direction(s).

In some non-limiting examples, each individual emissive region 910 of the device 1900 may be associated with, and driven by, a corresponding driving circuit within the backplane 1915 of the device 1900, for driving an OLED structure for the associated emissive region 910. In some non-limiting examples, including without limitation, where the emissive regions 910 may be laid out in a regular pattern extending in both the first (row) lateral direction and the second (column) lateral direction, there may be a signal line in the backplane 1915, corresponding to each row of emissive regions 910 extending in the first lateral direction and a signal line, corresponding to each column of emissive regions 910 extending in the second lateral direction. In such a non-limiting configuration, a signal on a row selection line may energize the respective gates of the switching TFT structure(s) 901 electrically coupled therewith and a signal on a data line may energize the respective sources of the switching TFT structure(s) 901 electrically coupled therewith, such that a signal on a row selection line/data line pair may electrically couple and energise, by the positive terminal of the power source 1905, the anode of the OLED structure of the emissive region 910 associated with such pair, causing the emission of a photon therefrom, the cathode thereof being electrically coupled with the negative terminal of the power source 1905.

Figure 31A:
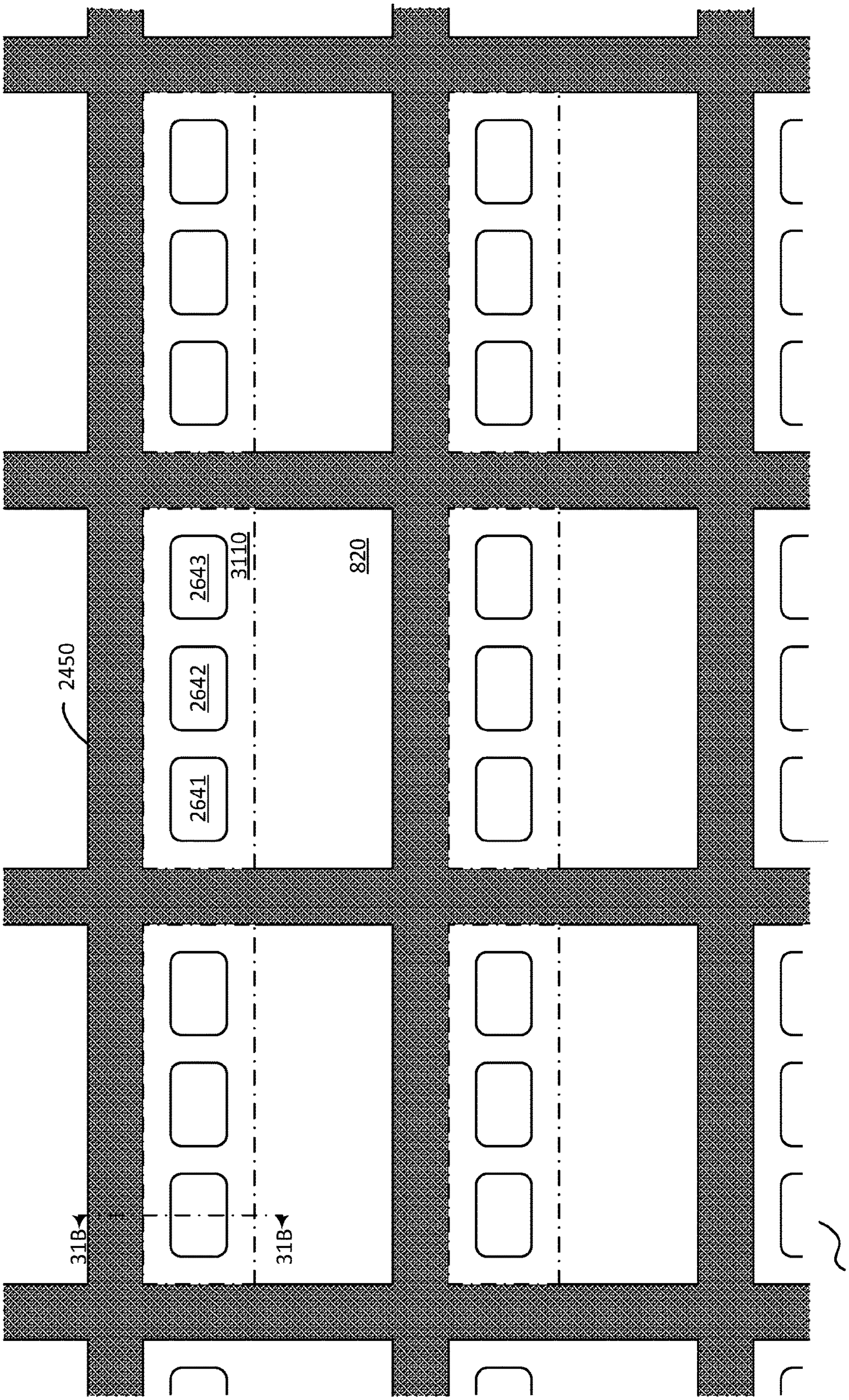
FIG. 31A is a schematic diagram illustrating, in plan view, an example of a transparent version of the device of FIG. 19 comprising at least one example pixel region and at least one example light-transmissive region, with at least one auxiliary electrode according to an example in the present disclosure.

In some non-limiting examples, each emissive region 910 of the device 1900 may correspond to a single display pixel 3110 (FIG. 31A). In some non-limiting examples, each pixel 3110 may emit light at a given wavelength spectrum. In some non-limiting examples, the wavelength spectrum may correspond to a colour in, without limitation, the visible spectrum.

In some non-limiting examples, each emissive region 910 of the device 1900 may correspond to a sub-pixel 264*x* (FIG. 26A) of a display pixel 3110. In some non-limiting examples, a plurality of sub-pixels 264*x* may combine to form, or to represent, a single display pixel 3110.

In some non-limiting examples, a single display pixel 3110 may be represented by three sub-pixels 224*x* pixels 264*x*. In some non-limiting examples, the three sub-pixels 224*x* pixels 264*x* may be denoted as, respectively, R(ed) sub-pixels 2641, G(reen) sub-pixels 2642, and/or B(lue) sub-pixels 2643. In some non-limiting examples, a single display pixel 3110 may be represented by four sub-pixels 264*x*, in which three of such sub-pixels 264*x* may be denoted as R(ed), G(reen) and B(lue) sub-pixels 264*x* and the fourth sub-pixel 264*x* may be denoted as a W(hite) sub-pixel 264*x*. In some non-limiting examples, the emission spectrum of the EM radiation emitted by a given sub-pixel 264*x* may correspond to the colour by which the sub-pixel 264*x* is denoted. In some non-limiting examples, the wavelength of the EM radiation may not correspond to such colour, but further processing may be performed, in a manner apparent to those having ordinary skill in the relevant art, to transform the wavelength to one that does so correspond.

Since the wavelength of sub-pixels 264*x* of different colours may be different, the optical characteristics of such sub-pixels 264*x* may differ, especially if a common electrode 1920, 1940 having a substantially uniform thickness profile may be employed for sub-pixels 264*x* of different colours.

When a common electrode 1920, 1940 having a substantially uniform thickness may be provided as the second electrode 1940 in a device 1900, the optical performance of the device 1900 may not be readily be fine-tuned according to an emission spectrum associated with each (sub-)pixel 3110/264*x*. The second electrode 1940 used in such OLED devices 1900 may in some non-limiting examples, be a common electrode 1920, 1940 coating a plurality of (sub-) pixels 3110/264*x*. By way of non-limiting example, such common electrode 1920, 1940 may be a relatively thin conductive film having a substantially uniform thickness across the device 1900. While efforts have been made in some non-limiting examples, to tune the optical microcavity effects associated with each (sub-)pixel 3110/264*x* color by varying a thickness of organic layers disposed within different (sub-)pixel(s) 3110/264*x*, such approach may, in some non-limiting examples, provide a significant degree of tuning of the optical microcavity effects in at least some cases. In addition, in some non-limiting examples, such approach may be difficult to implement in an OLED display production environment.

As a result, the presence of optical interfaces created by numerous thin-film layers and coatings with different refractive indices, such as may in some non-limiting examples be used to construct opto-electronic devices including without limitation OLED devices 1900, may create different optical microcavity effects for sub-pixels 264*x* of different colours.

Some factors that may impact an observed microcavity effect in a device 1900 include, without limitation, a total path length (which in some non-limiting examples may correspond to a total thickness (in the longitudinal aspect) of the device 1900 through which EM radiation emitted therefrom will travel before being outcoupled) and the refractive indices of various layers and coatings.

In some non-limiting examples, modulating a thickness of an electrode 1920, 1940 in and across a lateral aspect 2010 of emissive region(s) 910 of a (sub-)pixel 3110/264*x* may impact the microcavity effect observable. In some non-limiting examples, such impact may be attributable to a change in the total optical path length.

In some non-limiting examples, a change in a thickness of the electrode 1920, 1940 may also change the refractive index of EM radiation passing therethrough, in some non-limiting examples, in addition to a change in the total optical path length. In some non-limiting examples, this may be particularly the case where the electrode 1920, 1940 may be formed of at least one deposited layer 1230.

In some non-limiting examples, the optical properties of the device 1900, and/or in some non-limiting examples, across the lateral aspect 2010 of emissive region(s) 910 of a (sub-)pixel 3110/264*x* that may be varied by modulating at least one optical microcavity effect, may include, without limitation, the emission spectrum, the intensity (including without limitation, luminous intensity), and/or angular distribution of emitted EM radiation, including without limitation, an angular dependence of a brightness, and/or color shift of the emitted EM radiation.

In some non-limiting examples, a subpixel 264*x* may be associated with a first set of other subpixels 264*x* to represent a first display pixel 3110 and also with a second set of other sub-pixels 264*x* to represent a second display pixel 3110, so that the first and second display pixels 3110 may have associated therewith, the same sub-pixel(s) 264*x*.

The pattern, and/or organization of sub-pixels 264*x* into display pixels 3110 continues to develop. All present and future patterns, and/or organizations are considered to fall within the scope of the present disclosure.

Non-Emissive Regions

In some non-limiting examples, the various emissive regions 910 of the device 1900 may be substantially surrounded and separated by, in at least one lateral direction, at least one non-emissive region 2302, in which the structure, and/or configuration along the cross-sectional aspect, of the device structure 1900 shown, without limitation, in FIG. 19, may be varied, to substantially inhibit EM radiation to be emitted therefrom. In some non-limiting examples, the non-emissive regions 2302 may comprise those regions in the lateral aspect, that are substantially devoid of an emissive region 910.

Thus, as shown in the cross-sectional view of FIG. 20, the lateral topology of the various layers of the at least one semiconducting layer 1930 may be varied to define at least one emissive region 910, surrounded (at least in one lateral direction) by at least one non-emissive region 2302.

In some non-limiting examples, the emissive region 910 corresponding to a single display (sub-)pixel 3110/264*x* may be understood to have a lateral aspect 2010, surrounded in at least one lateral direction by at least one non-emissive region 2302 having a lateral aspect 2020.

A non-limiting example of an implementation of the cross-sectional aspect of the device 1900 as applied to an emissive region 910 corresponding to a single display (sub-) pixel 3110/264*x* of an OLED display 1900 will now be described. While features of such implementation are shown to be specific to the emissive region 910, those having ordinary skill in the relevant art will appreciate that in some non-limiting examples, more than one emissive region 910 may encompass common features.

In some non-limiting examples, the first electrode 1920 may be disposed over an exposed layer surface 11 of the device 1900, in some non-limiting examples, within at least a part of the lateral aspect 2010 of the emissive region 910. In some non-limiting examples, at least within the lateral aspect 2010 of the emissive region 910 of the (sub-)pixel(s) 3110/264*x*, the exposed layer surface 11, may, at the time of deposition of the first electrode 1920, comprise the TFT insulating layer 909 of the various TFT structures 901 that make up the driving circuit for the emissive region 910 corresponding to a single display (sub-)pixel 3110/264*x*.

In some non-limiting examples, the TFT insulating layer 909 may be formed with an opening extending therethrough to permit the first electrode 1920 to be electrically coupled with one of the TFT electrodes 2005, 2007, 2008, including, without limitation, as shown in FIG. 20, the TFT drain electrode 2008.

Those having ordinary skill in the relevant art will appreciate that the driving circuit comprises a plurality of TFT structures 901. In FIG. 20, for purposes of simplicity of illustration, only one TFT structure 901 may be shown, but it will be appreciated by those having ordinary skill in the relevant art, that such TFT structure 901 may be representative of such plurality thereof and/or at least one component thereof, that comprise the driving circuit.

In a cross-sectional aspect, the configuration of each emissive region 910 may, in some non-limiting examples, be defined by the introduction of at least one PDL 940 substantially throughout the lateral aspects 2020 of the surrounding non-emissive region(s) 2302. In some non-limiting examples, the PDLs 940 may comprise an insulating organic, and/or inorganic material.

In some non-limiting examples, the PDLs 940 may be deposited substantially over the TFT insulating layer 909, although, as shown, in some non-limiting examples, the PDLs 940 may also extend over at least a part of the deposited first electrode 1920, and/or its outer edges.

In some non-limiting examples, as shown in FIG. 20, the cross-sectional thickness, and/or profile of the PDLs 940 may impart a substantially valley-shaped configuration to the emissive region 910 of each (sub-)pixel 3110/264*x* by a region of increased thickness along a boundary of the lateral aspect 2020 of the surrounding non-emissive region 2302 with the lateral aspect of the surrounded emissive region 910, corresponding to a (sub-)pixel 3110/264*x*.

In some non-limiting examples, the profile of the PDLs 940 may have a reduced thickness beyond such valley-shaped configuration, including without limitation, away from the boundary between the lateral aspect 2020 of the surrounding non-emissive region 2302 and the lateral aspect 2010 of the surrounded emissive region 910, in some non-limiting examples, substantially well within the lateral aspect 2020 of such non-emissive region 2302.

While the PDL(s) 940 have been generally illustrated as having a linearly sloped surface to form a valley-shaped configuration that define the emissive region(s) 910 surrounded thereby, those having ordinary skill in the relevant art will appreciate that in some non-limiting examples, at least one of the shape, aspect ratio, thickness, width, and/or configuration of such PDL(s) 940 may be varied. By way of non-limiting example, a PDL 940 may be formed with a more steep or more gradually sloped part. In some non-limiting examples, such PDL(s) 940 may be configured to extend substantially normally away from a surface on which it is deposited, that may cover at least one edges of the first electrode 1920. In some non-limiting examples, such PDL(s) 940 may be configured to have deposited thereon at least one semiconducting layer 1930 by a solution-processing technology, including without limitation, by printing, including without limitation, ink-jet printing.

In some non-limiting examples, the at least one semiconducting layer 1930 may be deposited over the exposed layer surface 11 of the device 1900, including at least a part of the lateral aspect 2010 of such emissive region 910 of the (sub-)pixel(s) 3110/264*x*. In some non-limiting examples, at least within the lateral aspect 2010 of the emissive region 910 of the (sub-)pixel(s) 3110/264*x*, such exposed layer surface 11, may, at the time of deposition of the at least one semiconducting layer 1930 (and/or layers 1931, 1933, 1935, 1937, 1939 thereof), comprise the first electrode 1920.

In some non-limiting examples, the at least one semiconducting layer 1930 may also extend beyond the lateral aspect 2010 of the emissive region 910 of the (sub-)pixel(s) 3110/264*x* and at least partially within the lateral aspects 2020 of the surrounding non-emissive region(s) 2302. In some non-limiting examples, such exposed layer surface 11 of such surrounding non-emissive region(s) 2302 may, at the time of deposition of the at least one semiconducting layer 1930, comprise the PDL(s) 940.

In some non-limiting examples, the second electrode 1940 may be disposed over an exposed layer surface 11 of the device 1900, including at least a part of the lateral aspect 2010 of the emissive region 910 of the (sub-)pixel(s) 3110/264*x*. In some non-limiting examples, at least within the lateral aspect of the emissive region 910 of the (sub-)pixel(s) 3110/264*x*, such exposed layer surface 11, may, at the time of deposition of the second electrode 1920, comprise the at least one semiconducting layer 1930.

In some non-limiting examples, the second electrode 1940 may also extend beyond the lateral aspect 2010 of the emissive region 910 of the (sub-) pixel(s) 3110/264*x* and at least partially within the lateral aspects 2020 of the surrounding non-emissive region(s) 2302. In some non-limiting examples, such exposed layer surface 11 of such surrounding non-emissive region(s) 2302 may, at the time of deposition of the second electrode 1940, comprise the PDL(s) 940.

In some non-limiting examples, the second electrode 1940 may extend throughout substantially all or a substantial part of the lateral aspects 2020 of the surrounding non-emissive region(s) 2302.

Selective Deposition of Patterned Electrode

In some non-limiting examples, the ability to achieve selective deposition of the deposited material 1631 in an open mask and/or mask-free deposition process by the prior selective deposition of a patterning coating 420, may be employed to achieve the selective deposition of a patterned electrode 1920, 1940, 2450 (FIG. 24), and/or at least one layer thereof, of an opto-electronic device, including without limitation, an OLED device 1900, and/or a conductive element electrically coupled therewith.

In this fashion, the selective deposition of a patterning coating 420 in FIG. 20 using a shadow mask 1515, and the open mask and/or mask-free deposition of the deposited material 1631, may be combined to effect the selective deposition of at least one deposited layer 1230 to form a device feature, including without limitation, a patterned electrode 1920, 1940, 2450, and/or at least one layer thereof, and/or a conductive element electrically coupled therewith, in the device 1900 shown in FIG. 19, without employing a shadow mask 1515 within the deposition process for forming the deposited layer 1230. In some non-limiting examples, such patterning may permit, and/or enhance the transmissivity of the device 1900.

A number of non-limiting examples of such patterned electrode 1920, 1940, 2450, and/or at least one layer thereof, and/or a conductive element electrically coupled therewith, to impart various structural and/or performance capabilities to such devices 1900 will now be described.

As a result of the foregoing, there may be an aim to selectively deposit, across the lateral aspect 2010 of the emissive region 910 of a (sub-)pixel 3110/264*x*, and/or the lateral aspect 2020 of the non-emissive region(s) 2302 surrounding the emissive region 910, a device feature, including without limitation, at least one of the first electrode 1920, the second electrode 1940, the auxiliary electrode 2450, and/or a conductive element electrically coupled therewith, in a pattern, on an exposed layer surface 11 of a frontplane 1910 of the device 1900. In some non-limiting examples, the first electrode 1920, the second electrode 1940, and/or the auxiliary electrode 2450, may be deposited in at least one of a plurality of deposited layers 1230.

Figure 21:
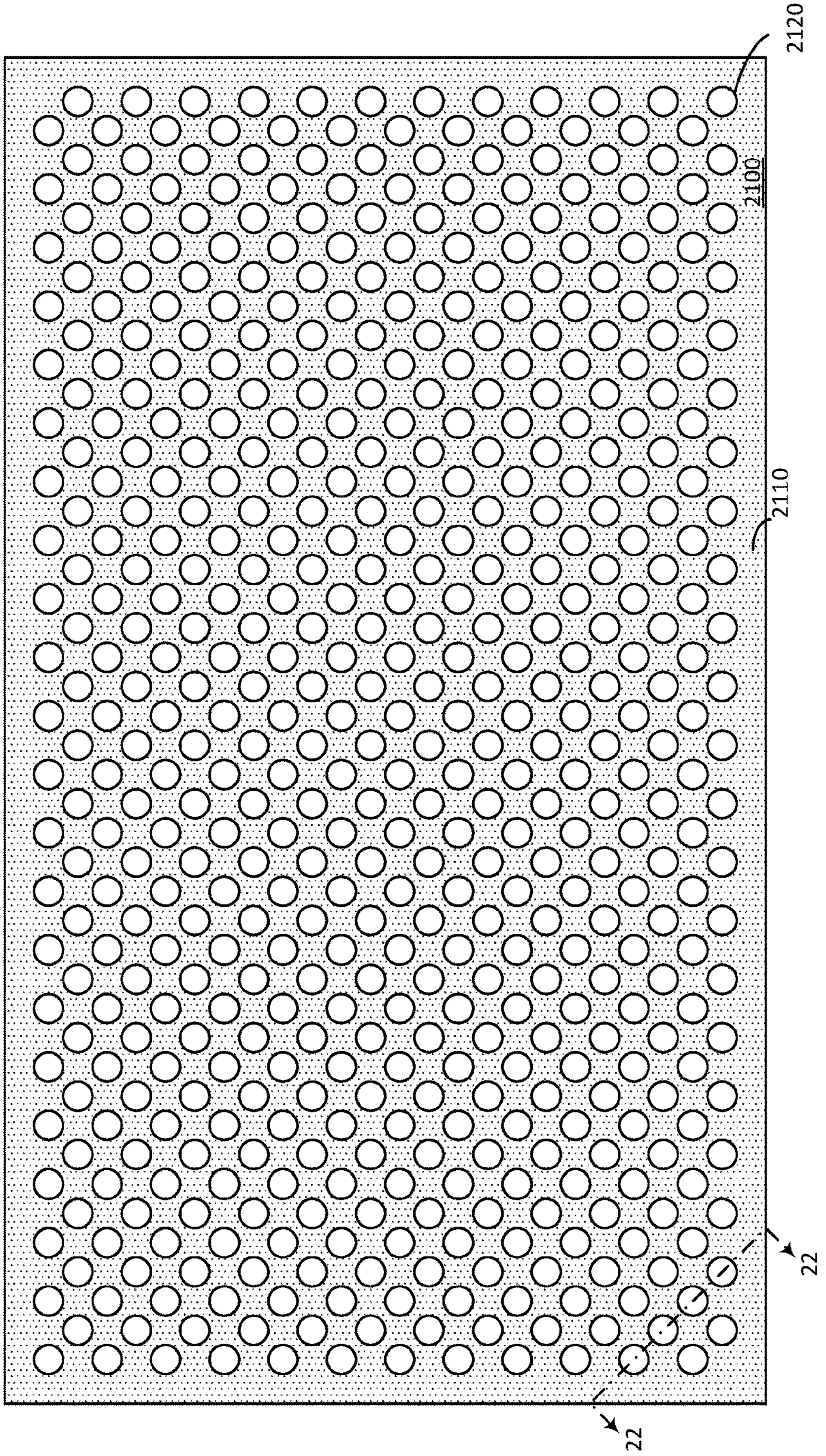
FIG. 21 is a schematic diagram illustrating, in plan, an example patterned electrode suitable for use in a version of the device of FIG. 19, according to an example in the present disclosure.

FIG. 21 may show an example patterned electrode 2100 in plan, in the figure, the second electrode 1940 suitable for use in an example version 2200 (FIG. 22) of the device 1900. The electrode 2100 may be formed in a pattern 2110 that comprises a single continuous structure, having or defining a patterned plurality of apertures 2120 therewithin, in which the apertures 2120 may correspond to regions of the device 2200 where there is no cathode.

In the figure, by way of non-limiting example, the pattern 2110 may be disposed across the entire lateral extent of the device 2200, without differentiation between the lateral aspect(s) 2010 of emissive region(s) 910 corresponding to (sub-)pixel(s) 3110/264*x* and the lateral aspect(s) 2020 of non-emissive region(s) 2302 surrounding such emissive region(s) 910. Thus, the example illustrated may correspond to a device 2200 that may be substantially transmissive relative to EM radiation incident on an external surface thereof, such that a substantial part of such externally-incident EM radiation may be transmitted through the device 2200, in addition to the emission (in a top-emission, bottom-emission, and/or double-sided emission) of EM radiation generated internally within the device 2200 as disclosed herein.

The transmittivity of the device 2200 may be adjusted, and/or modified by altering the pattern 2110 employed, including without limitation, an average size of the apertures 2120, and/or a spacing, and/or density of the apertures 2120.

Figure 22:
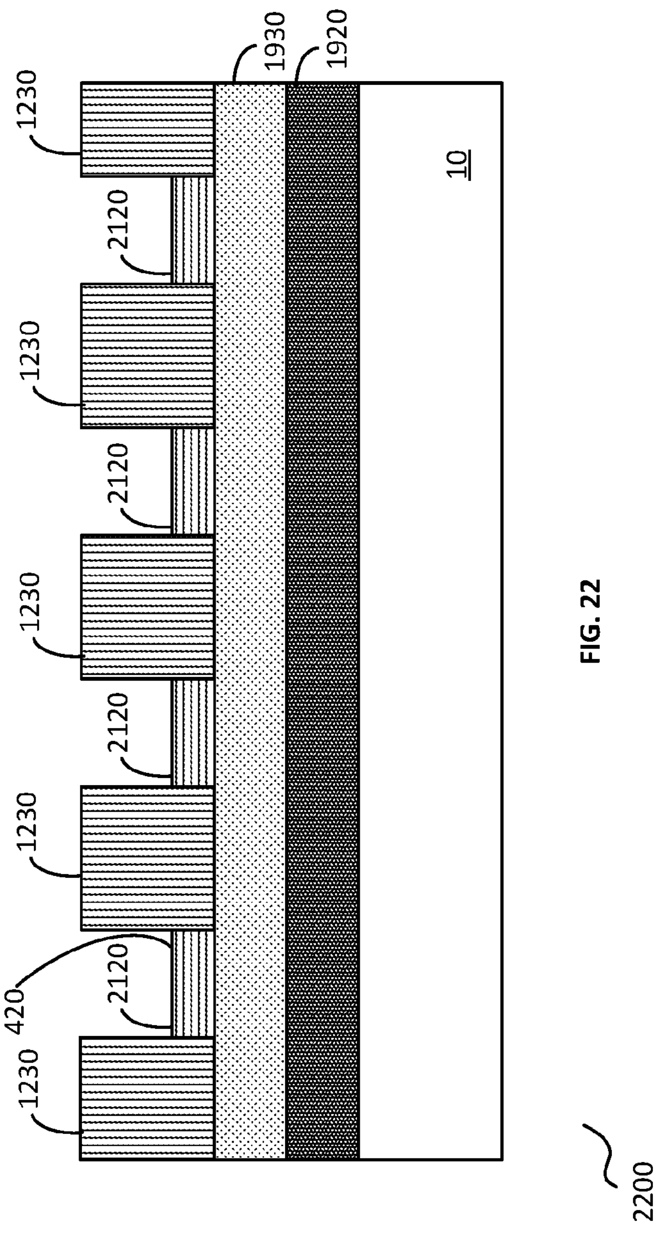
FIG. 22 is a schematic diagram illustrating an example cross-sectional view of the device of FIG. 21 taken along line 22-22.

Turning now to FIG. 22, there may be shown a cross-sectional view of the device 2200, taken along line 22-22 in FIG. 21. In the figure, the device 2200 may be shown as comprising the substrate 10, the first electrode 1920 and the at least one semiconducting layer 1930.

A patterning coating 420 may be selectively disposed in a pattern substantially corresponding to the pattern 2110 on the exposed layer surface 11 of the underlying layer.

A deposited layer 1230 suitable for forming the patterned electrode 2100, which in the figure is the second electrode 1940, may be disposed on substantially all of the exposed layer surface 11 of the underlying layer, using an open mask and/or a mask-free deposition process. The underlying layer may comprise both regions of the patterning coating 420, disposed in the pattern 2110, and regions of the at least one semiconducting layer 1930, in the pattern 2110 where the patterning coating 420 has not been deposited. In some non-limiting examples, the regions of the patterning coating 420 may correspond substantially to a first portion 601 comprising the apertures 2120 shown in the pattern 2110.

Because of the nucleation-inhibiting properties of those regions of the pattern 2110 where the patterning coating 420 was disposed (corresponding to the apertures 2120), the deposited material 1631 disposed on such regions may tend to not remain, resulting in a pattern of selective deposition of the deposited layer 1230, that may correspond substantially to the remainder of the pattern 2110, leaving those regions of the first portion 601 of the pattern 2110 corresponding to the apertures 2120 substantially devoid of a closed coating 1240 of the deposited layer 1230.

In other words, the deposited layer 1230 that will form the cathode may be selectively deposited substantially only on a second portion 602 comprising those regions of the at least one semiconducting layer 1930 that surround but do not occupy the apertures 2120 in the pattern 2110.

Figure 23A:
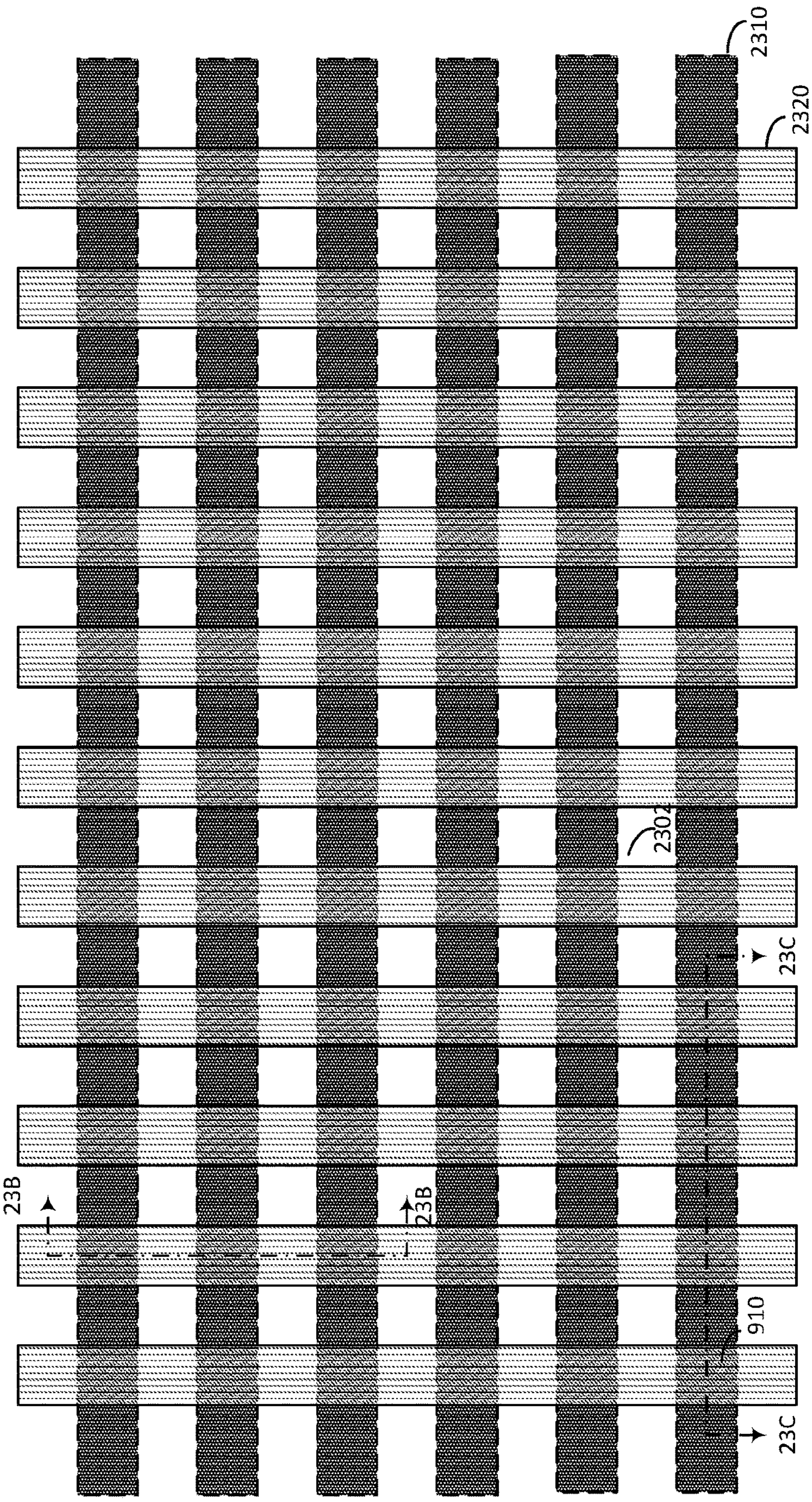
FIG. 23A is a schematic diagram illustrating, in plan view, a plurality of example patterns of electrodes suitable for use in an example version of the device of FIG. 19 according to an example in the present disclosure.

FIG. 23A may show, in plan view, a schematic diagram showing a plurality of patterns 2310, 2320 of electrodes 1920, 1940, 2450.

In some non-limiting examples, the first pattern 2310 may comprise a plurality of elongated, spaced-apart regions that extend in a first lateral direction. In some non-limiting examples, the first pattern 2310 may comprise a plurality of first electrode 1920. In some non-limiting examples, a plurality of the regions that comprise the first pattern 2310 may be electrically coupled.

In some non-limiting examples, the second pattern 2320 may comprise a plurality of elongated, spaced-apart regions that extend in a second lateral direction. In some non-limiting examples, the second lateral direction may be substantially normal to the first lateral direction. In some non-limiting examples, the second pattern 2320 may comprise a plurality of second electrodes 1940. In some non-limiting examples, a plurality of the regions that comprise the second pattern 2320 may be electrically coupled.

In some non-limiting examples, the first pattern 2310 and the second pattern 2320 may form part of an example version, shown generally at 2300, of the device 1900.

In some non-limiting examples, the lateral aspect(s) 2010 of emissive region(s) 910 corresponding to (sub-)pixel(s) 3110/264*x* may be formed where the first pattern 2310 overlaps the second pattern 2320. In some non-limiting examples, the lateral aspect(s) 2020 of non-emissive region(s) 2302 may correspond to any lateral aspect other than the lateral aspect(s) 2010.

In some non-limiting examples, a first terminal, which, in some non-limiting examples, may be a positive terminal, of the power source 1905, may be electrically coupled with at least one electrode 1920, 1940, 2450 of the first pattern 2310. In some non-limiting examples, the first terminal may be coupled with the at least one electrode 1920, 1940, 2450 of the first pattern 2310 through at least one driving circuit. In some non-limiting examples, a second terminal, which, in some non-limiting examples, may be a negative terminal, of the power source 1905, may be electrically coupled with at least one electrode 1920, 1940, 2450 of the second pattern 2320. In some non-limiting examples, the second terminal may be coupled with the at least one electrode 1920, 1940, 2450 of the second pattern 2320 through the at least one driving circuit.

Figure 23B:
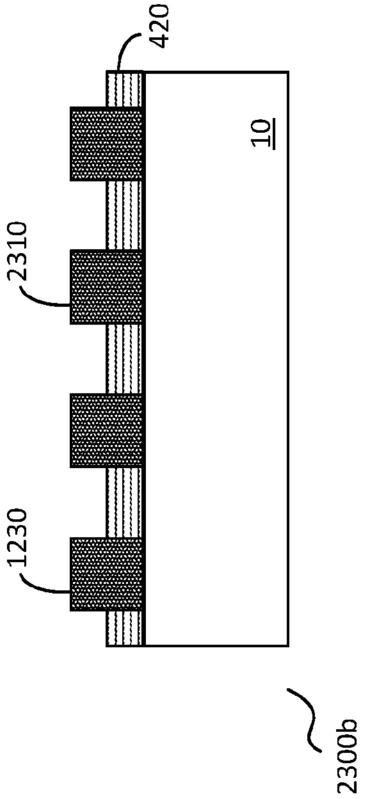
FIG. 23B is a schematic diagram illustrating an example cross-sectional view, at an intermediate stage, of the device of FIG. 23A taken along line 23B-23B.

Turning now to FIG. 23B, there may be shown a cross-sectional view of the device 2300, at a deposition stage 2300*b*, taken along line 23B-23B in FIG. 23A. In the figure, the device 2300 at the stage 2300*b* may be shown as comprising the substrate 10.

A patterning coating 420 may be selectively disposed in a pattern substantially corresponding to the inverse of the first pattern 2310 on the exposed layer surface 11 of the underlying layer, which, as shown in the figure, may be the substrate 10.

A deposited layer 1230 suitable for forming the first pattern 2310 of electrode 1920, 1940, 2450, which in the figure is the first electrode 1920, may be disposed on substantially all of the exposed layer surface 11 of the underlying layer, using an open mask and/or a mask-free deposition process. The underlying layer may comprise both regions of the patterning coating 420, disposed in the inverse of the first pattern 2310, and regions of the substrate 10, disposed in the first pattern 2310 where the patterning coating 420 has not been deposited. In some non-limiting examples, the regions of the substrate 10 may correspond substantially to the elongated spaced-apart regions of the first pattern 2310, while the regions of the patterning coating 420 may correspond substantially to a first portion 601 comprising the gaps therebetween.

Because of the nucleation-inhibiting properties of those regions of the first pattern 2310 where the patterning coating 420 was disposed (corresponding to the gaps therebetween), the deposited material 1631 disposed on such regions may tend to not remain, resulting in a pattern of selective deposition of the deposited layer 1230, that may correspond substantially to elongated spaced-apart regions of the first pattern 2310, leaving a first portion 601 comprising the gaps therebetween substantially devoid of a closed coating 1240 of the deposited layer 1230.

In other words, the deposited layer 1230 that may form the first pattern 2310 of electrode 1920, 1940, 2450 may be selectively deposited substantially only on a second portion 602 comprising those regions of the substrate 10 that define the elongated spaced-apart regions of the first pattern 2310.

Figure 23C:
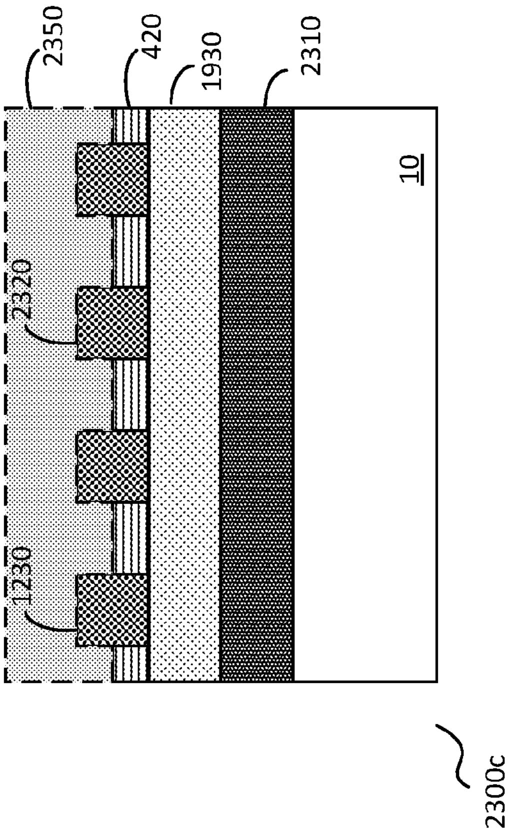
FIG. 23C is a schematic diagram illustrating an example cross-sectional view of the device of FIG. 23A taken along line 23C-23C.

Turning now to FIG. 23C, there may be shown a cross-sectional view 2300*c* of the device 2300, taken along line 23C-23C in FIG. 23A. In the figure, the device 2300 may be shown as comprising the substrate 10; the first pattern 2310 of electrode 1920 deposited as shown in FIG. 23B, and the at least one semiconducting layer(s) 1930.

In some non-limiting examples, the at least one semiconducting layer(s) 1930 may be provided as a common layer across substantially all of the lateral aspect(s) of the device 2300.

A patterning coating 420 may be selectively disposed in a pattern substantially corresponding to the second pattern 2320 on the exposed layer surface 11 of the underlying layer, which, as shown in the figure, is the at least one semiconducting layer 1930.

A deposited layer 1230 suitable for forming the second pattern 2320 of electrode 1920, 1940, 2450, which in the figure is the second electrode 1940, may be disposed on substantially all of the exposed layer surface 11 of the underlying layer, using an open mask and/or a mask-free deposition process. The underlying layer may comprise both regions of the patterning coating 420, disposed in the inverse of the second pattern 2320, and regions of the at least one semiconducting layer(s) 1930, in the second pattern 2320 where the patterning coating 420 has not been deposited. In some non-limiting examples, the regions of the at least one semiconducting layer(s) 1930 may correspond substantially to a first portion 601 comprising the elongated spaced-apart regions of the second pattern 2320, while the regions of the patterning coating 420 may correspond substantially to the gaps therebetween.

Because of the nucleation-inhibiting properties of those regions of the second pattern 2320 where the patterning coating 420 was disposed (corresponding to the gaps therebetween), the deposited layer 1230 disposed on such regions may tend not to remain, resulting in a pattern of selective deposition of the deposited layer 1230, that may correspond substantially to elongated spaced-apart regions of the second pattern 2320, leaving the first portion 601 comprising the gaps therebetween substantially devoid of a closed coating 1240 of the deposited layer 1230.

In other words, the deposited layer 1230 that may form the second pattern 2320 of electrode 1920, 1940, 2450 may be selectively deposited substantially only on a second portion 602 comprising those regions of the at least one semiconducting layer 1930 that define the elongated spaced-apart regions of the second pattern 2320.

In some non-limiting examples, an average layer thickness of the patterning coating 420 and of the deposited layer 1230 deposited thereafter for forming either, or both, of the first pattern 2310, and/or the second pattern 2320 of electrode 1920, 2450 may be varied according to a variety of parameters, including without limitation, a given application and given performance characteristics. In some non-limiting examples, the average layer thickness of the patterning coating 420 may be comparable to, and/or substantially less than an average layer thickness of the deposited layer 1230 deposited thereafter. Use of a relatively thin patterning coating 420 to achieve selective patterning of a deposited layer 1230 deposited thereafter may be suitable to provide flexible devices 1900. In some non-limiting examples, a relatively thin patterning coating 420 may provide a relatively planar surface on which a barrier coating 2350 may be deposited. In some non-limiting examples, providing such a relatively planar surface for application of the barrier coating 2350 may increase adhesion of the barrier coating 2350 to such surface.

At least one of the first pattern 2310 of electrode 1920, 1940, 2450 and at least one of the second pattern 2320 of electrode 1920, 1940, 2450 may be electrically coupled with the power source 1905, whether directly, and/or, in some non-limiting examples, through their respective driving circuit(s) to control EM radiation emission from the lateral aspect(s) 2010 of the emissive region(s) 910 corresponding to (sub-)pixel(s) 3110/264*x*.

Auxiliary Electrode

Those having ordinary skill in the relevant art will appreciate that the process of forming the second electrode 1940 in the second pattern 2320 shown in FIGS. 23A-23C may, in some non-limiting examples, be used in similar fashion to form an auxiliary electrode 2450 for the device 1900. In some non-limiting examples, the second electrode 1940 thereof may comprise a common electrode, and the auxiliary electrode 2450 may be deposited in the second pattern 2320, in some non-limiting examples, above or in some non-limiting examples below, the second electrode 1940 and electrically coupled therewith. In some non-limiting examples, the second pattern 2320 for such auxiliary electrode 2450 may be such that the elongated spaced-apart regions of the second pattern 2320 lie substantially within the lateral aspect(s) 2020 of non-emissive region(s) 2302 surrounding the lateral aspect(s) 2010 of emissive region(s) 910 corresponding to (sub-)pixel(s) 3110/264*x*. In some non-limiting examples, the second pattern 2320 for such auxiliary electrodes 2450 may be such that the elongated spaced-apart regions of the second pattern 2320 lie substantially within the lateral aspect(s) 2010 of emissive region(s) 910 corresponding to (sub-)pixel(s) 3110/264*x*, and/or the lateral aspect(s) 2020 of non-emissive region(s) 2302 surrounding them.

Figure 24:
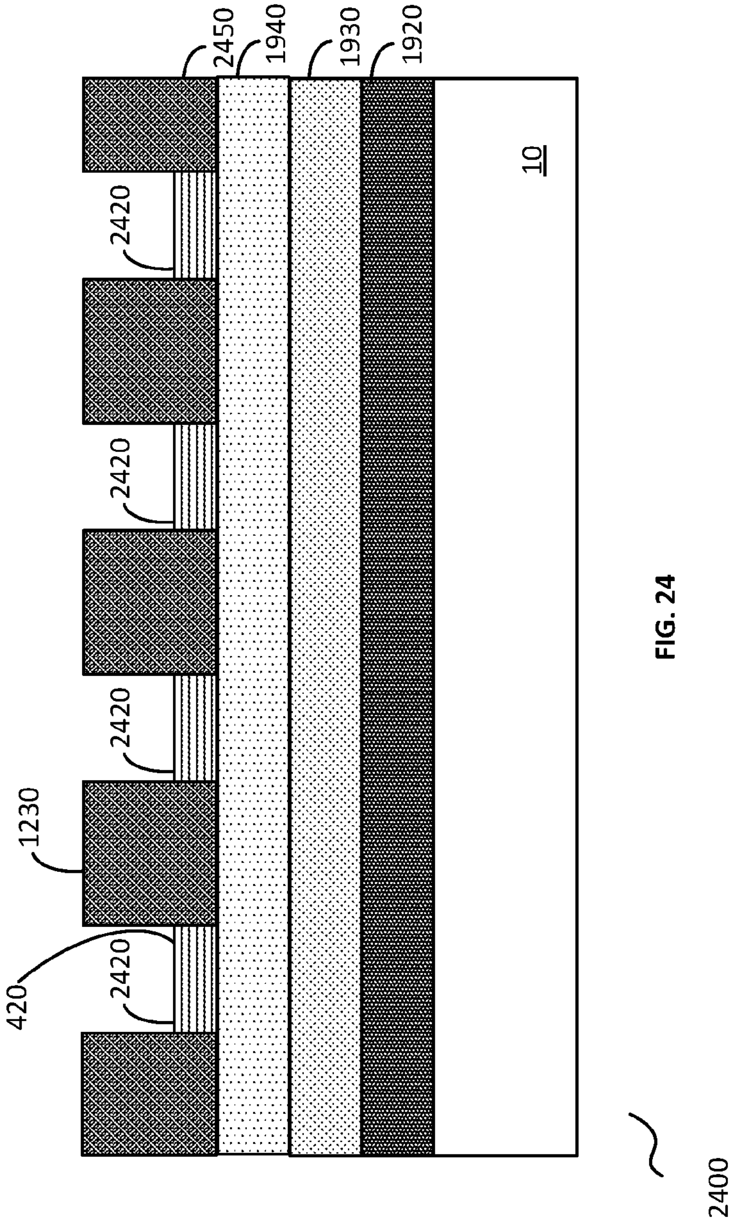
FIG. 24 is a schematic diagram illustrating a cross-sectional view of an example version of the device of FIG. 19, having an example patterned auxiliary electrode according to an example in the present disclosure.

FIG. 24 may show an example cross-sectional view of an example version 2400 of the device 1900 that is substantially similar thereto, but further may comprise at least one auxiliary electrode 2450 disposed in a pattern above and electrically coupled (not shown) with the second electrode 1940.

The auxiliary electrode 2450 may be electrically conductive. In some non-limiting examples, the auxiliary electrode 2450 may be formed by at least one metal, and/or metal oxide. Non-limiting examples of such metals include Cu, Al, molybdenum (Mo), or Ag. By way of non-limiting example, the auxiliary electrode 2450 may comprise a multi-layer metallic structure, including without limitation, one formed by Mo/Al/Mo. Non-limiting examples of such metal oxides include ITO, ZnO, IZO, or other oxides containing In, or Zn. In some non-limiting examples, the auxiliary electrode 2450 may comprise a multi-layer structure formed by a combination of at least one metal and at least one metal oxide, including without limitation, Ag/ITO, Mo/ITO, ITO/Ag/ITO, or ITO/Mo/ITO. In some non-limiting examples, the auxiliary electrode 2450 comprises a plurality of such electrically conductive materials.

The device 2400 may be shown as comprising the substrate 10, the first electrode 1920 and the at least one semiconducting layer 1930.

The second electrode 1940 may be disposed on substantially all of the exposed layer surface 11 of the at least one semiconducting layer 1930.

In some non-limiting examples, particularly in a top-emission device 2400, the second electrode 1940 may be formed by depositing a relatively thin conductive film layer (not shown) in order, by way of non-limiting example, to reduce optical interference (including, without limitation, attenuation, reflections, and/or diffusion) related to the presence of the second electrode 1940. In some non-limiting examples, as discussed elsewhere, a reduced thickness of the second electrode 1940, may generally increase a sheet resistance of the second electrode 1940, which may, in some non-limiting examples, reduce the performance, and/or efficiency of the device 2400. By providing the auxiliary electrode 2450 that may be electrically coupled with the second electrode 1940, the sheet resistance and thus, the IR drop associated with the second electrode 1940, may, in some non-limiting examples, be decreased.

In some non-limiting examples, the device 2400 may be a bottom-emission, and/or double-sided emission device 2400. In such examples, the second electrode 1940 may be formed as a relatively thick conductive layer without substantially affecting optical characteristics of such a device 2400. Nevertheless, even in such scenarios, the second electrode 1940 may nevertheless be formed as a relatively thin conductive film layer (not shown), by way of non-limiting example, so that the device 2400 may be substantially transmissive relative to EM radiation incident on an external surface thereof, such that a substantial part of such externally-incident EM radiation may be transmitted through the device 2400, in addition to the emission of EM radiation generated internally within the device 2400 as disclosed herein.

A patterning coating 420 may be selectively disposed in a pattern on the exposed layer surface 11 of the underlying layer, which, as shown in the figure, may be the second electrode 1940. In some non-limiting examples, as shown in the figure, the patterning coating 420 may be disposed, in a first portion 601 of the pattern, as a series of parallel rows 2420 that may correspond to the lateral aspects 2020 of the non-emissive regions 2302.

A deposited layer 1230 suitable for forming the patterned auxiliary electrode 2450, may be disposed on substantially all of the exposed layer surface 11 of the underlying layer, using an open mask and/or a mask-free deposition process. The underlying layer may comprise both regions of the patterning coating 420, disposed in the pattern of rows 2420, and regions of the second electrode 1940 where the patterning coating 420 has not been deposited.

Because of the nucleation-inhibiting properties of those rows 2420 where the patterning coating 420 was disposed, the deposited material 1631 disposed on such rows 2420 may tend to not remain, resulting in a pattern of selective deposition of the deposited layer 1230, that may correspond substantially to at least one second portion 602 of the pattern, leaving the first portion 601 comprising the rows 2420 substantially devoid of a closed coating 1240 of the deposited layer 1230.

In other words, the deposited layer 1230 that may form the auxiliary electrode 2450 may be selectively deposited substantially only on a second portion 602 comprising those regions of the at least one semiconducting layer 1930, that surround but do not occupy the rows 2420.

In some non-limiting examples, selectively depositing the auxiliary electrode 2450 to cover only certain rows 2420 of the lateral aspect of the device 2400, while other regions thereof remain uncovered, may control, and/or reduce optical interference related to the presence of the auxiliary electrode 2450.

In some non-limiting examples, the auxiliary electrode 2450 may be selectively deposited in a pattern that may not be readily detected by the naked eye from a typical viewing distance.

In some non-limiting examples, the auxiliary electrode 2450 may be formed in devices other than OLED devices, including for decreasing an effective resistance of the electrodes of such devices.

The ability to pattern electrodes 1920, 1940, 2450, including without limitation, the second electrode 1940, and/or the auxiliary electrode 2450 without employing a shadow mask 1515 during the high-temperature deposited layer 1230 deposition process by employing a patterning coating 420, including without limitation, the process depicted in FIG. 15, may allow numerous configurations of auxiliary electrodes 2450 to be deployed.

In some non-limiting examples, the auxiliary electrode 2450 may be disposed between neighbouring emissive regions 910 and electrically coupled with the second electrode 1940. In non-limiting examples, a width of the auxiliary electrode 2450 may be less than a separation distance between the neighbouring emissive regions 910. As a result, there may exist a gap within the at least one non-emissive region 2302 on each side of the auxiliary electrode 2450. In some non-limiting examples, such an arrangement may reduce a likelihood that the auxiliary electrode 2450 would interfere with an optical output of the device 2400, in some non-limiting examples, from at least one of the emissive regions 910. In some non-limiting examples, such an arrangement may be appropriate where the auxiliary electrode 2450 is relatively thick (in some non-limiting examples, greater than several hundred nm, and/or on the order of a few microns in thickness). In some non-limiting examples, an aspect ratio of the auxiliary electrode 2450 may exceed about 0.05, such as at least one of at least about: 0.1, 0.2, 0.5, 0.8, 1, or 2. By way of non-limiting example, a height (thickness) of the auxiliary electrode 2450 may exceed about 50 nm, such as at least one of at least about: 80 nm, 100 nm, 200 nm, 500 nm, 700 nm, 1,000 nm, 1,500 nm, 1,700 nm, or 2,000 nm.

Figure 25:
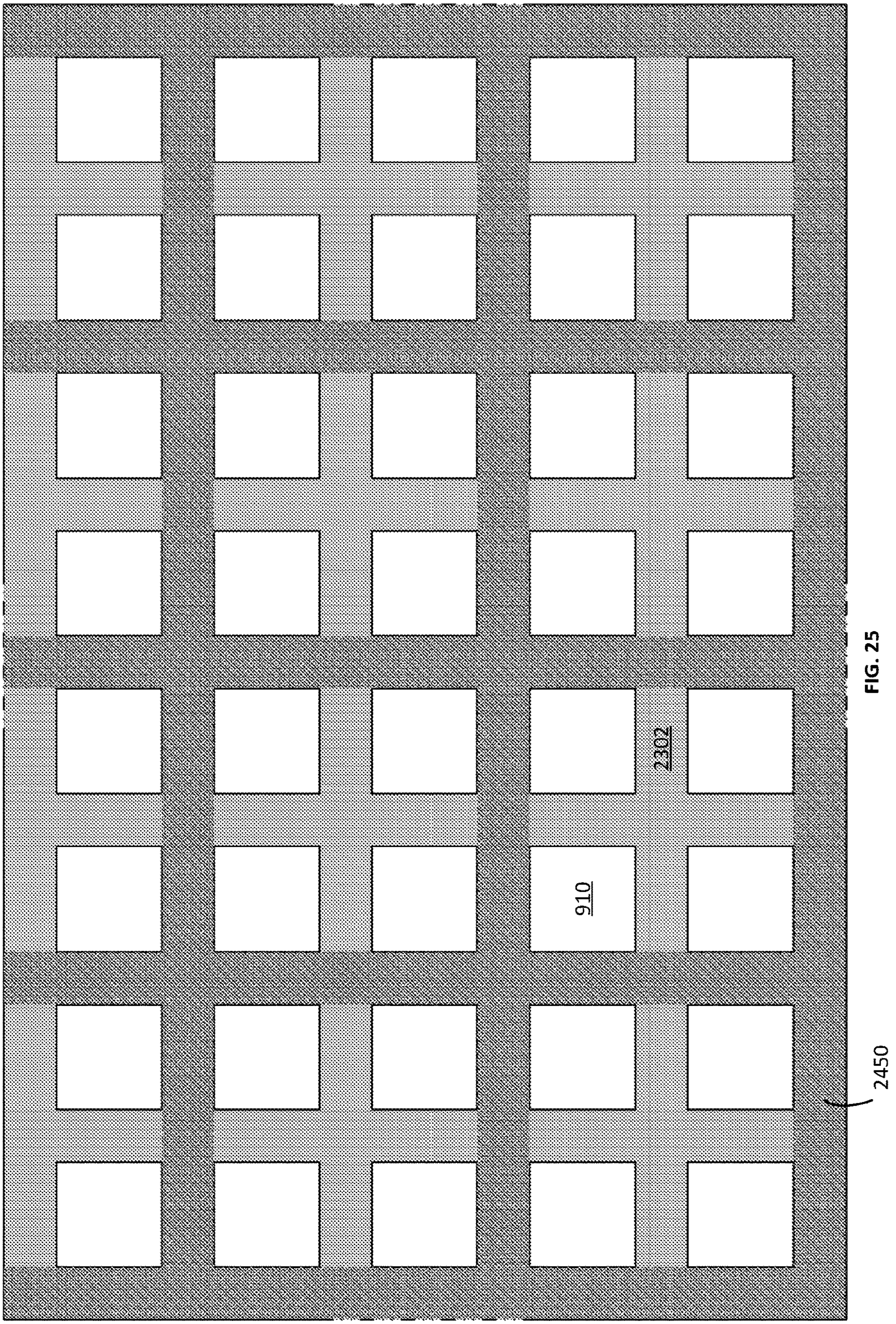
FIG. 25 is a schematic diagram illustrating, in plan view an example pattern of an auxiliary electrode overlaying at least one emissive region and at least one non-emissive region according to an example in the present disclosure.

FIG. 25 may show, in plan view, a schematic diagram showing an example of a pattern 2450 of the auxiliary electrode 2450 formed as a grid that may be overlaid over both the lateral aspects 2010 of emissive regions 910, which may correspond to (sub-)pixel(s) 3110/264*x* of an example version 2500 of device 1900, and the lateral aspects 2020 of non-emissive regions 2302 surrounding the emissive regions 910.

In some non-limiting examples, the auxiliary electrode pattern 2450 may extend substantially only over some but not all of the lateral aspects 2020 of non-emissive regions 2302, to not substantially cover any of the lateral aspects 2010 of the emissive regions 910.

Those having ordinary skill in the relevant art will appreciate that while, in the figure, the pattern 2450 of the auxiliary electrode 2450 may be shown as being formed as a continuous structure such that all elements thereof are both physically connected to and electrically coupled with one another and electrically coupled with at least one electrode 1920, 1940, 2450, which in some non-limiting examples may be the first electrode 1920, and/or the second electrode 1940, in some non-limiting examples, the pattern 2450 of the auxiliary electrode 2450 may be provided as a plurality of discrete elements of the pattern 2450 of the auxiliary electrode 2450 that, while remaining electrically coupled with one another, may not be physically connected to one another. Even so, such discrete elements of the pattern 2450 of the auxiliary electrode 2450 may still substantially lower a sheet resistance of the at least one electrode 1920, 1940, 2450 with which they are electrically coupled, and consequently of the device 2500, to increase an efficiency of the device 2500 without substantially interfering with its optical characteristics.

In some non-limiting examples, auxiliary electrodes 2450 may be employed in devices 2500 with a variety of arrangements of (sub-)pixel(s) 3110/264*x*. In some non-limiting examples, the (sub-)pixel 3110/264*x* arrangement may be substantially diamond-shaped.

Figure 26A:
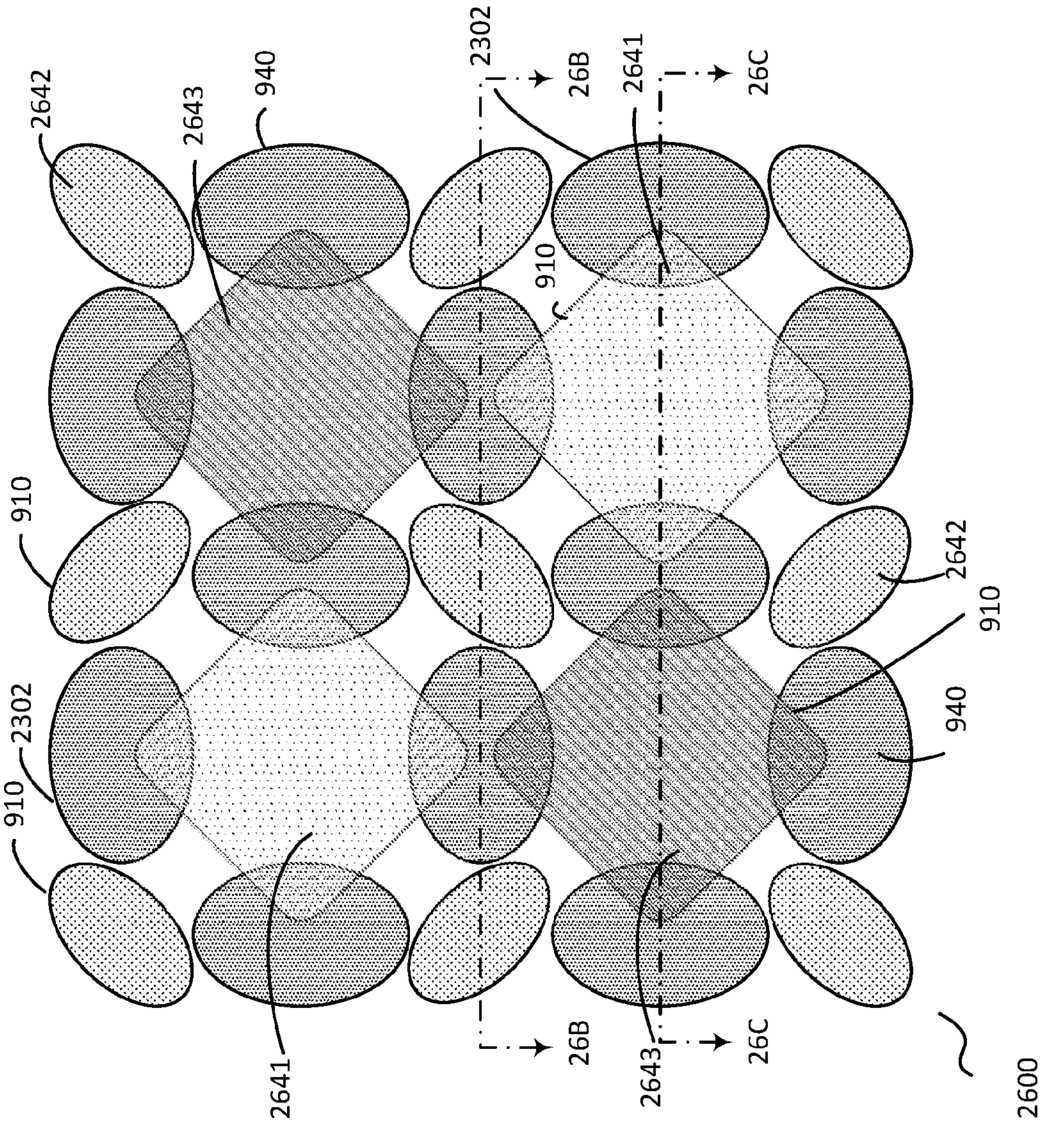
FIG. 26A is a schematic diagram illustrating, in plan view, an example pattern of an example version of the device of FIG. 19 having a plurality of groups of emissive regions in a diamond configuration according to an example in the present disclosure.

By way of non-limiting example, FIG. 26A may show, in plan, in an example version 2600 of device 1900, a plurality of groups 2641-2643 of emissive regions 910 each corresponding to a sub-pixel 264*x*, surrounded by the lateral aspects of a plurality of non-emissive regions 2302 comprising PDLs 940 in a diamond configuration. In some non-limiting examples, the configuration may be defined by patterns 2641-2643 of emissive regions 910 and PDLs 940 in an alternating pattern of first and second rows.

In some non-limiting examples, the lateral aspects 2020 of the non-emissive regions 2302 comprising PDLs 940 may be substantially elliptically shaped. In some non-limiting examples, the major axes of the lateral aspects 2020 of the non-emissive regions 2302 in the first row may be aligned and substantially normal to the major axes of the lateral aspects 2020 of the non-emissive regions 2302 in the second row. In some non-limiting examples, the major axes of the lateral aspects 2020 of the non-emissive regions 2302 in the first row may be substantially parallel to an axis of the first row.

In some non-limiting examples, a first group 2641 of emissive regions 910 may correspond to sub-pixels 264*x* that emit EM radiation at a first wavelength, in some non-limiting examples the sub-pixels 264*x* of the first group 2641 may correspond to R(ed) sub-pixels 2641. In some non-limiting examples, the lateral aspects 2010 of the emissive regions 910 of the first group 2641 may have a substantially diamond-shaped configuration. In some non-limiting examples, the emissive regions 910 of the first group 2641 may lie in the pattern of the first row, preceded and followed by PDLs 940. In some non-limiting examples, the lateral aspects 2010 of the emissive regions 910 of the first group 2641 may slightly overlap the lateral aspects 2020 of the preceding and following non-emissive regions 2302 comprising PDLs 940 in the same row, as well as of the lateral aspects 2020 of adjacent non-emissive regions 2302 comprising PDLs 940 in a preceding and following pattern of the second row.

In some non-limiting examples, a second group 2642 of emissive regions 910 may correspond to sub-pixels 264*x* that emit EM radiation at a second wavelength, in some non-limiting examples the sub-pixels 264*x* of the second group 2642 may correspond to G(reen) sub-pixels 2642. In some non-limiting examples, the lateral aspects 2010 of the emissive regions 910 of the second group 2641 may have a substantially elliptical configuration. In some non-limiting examples, the emissive regions 910 of the second group 2641 may lie in the pattern of the second row, preceded and followed by PDLs 940. In some non-limiting examples, a major axis of some of the lateral aspects 2010 of the emissive regions 910 of the second group 2641 may be at a first angle, which in some non-limiting examples, may be 45° relative to an axis of the second row. In some non-limiting examples, a major axis of others of the lateral aspects 2010 of the emissive regions 910 of the second group 2641 may be at a second angle, which in some non-limiting examples may be substantially normal to the first angle. In some non-limiting examples, the emissive regions 910 of the second group 2642, whose lateral aspects 2010 may have a major axis at the first angle, may alternate with the emissive regions 910 of the second group 2642, whose lateral aspects 2010 may have a major axis at the second angle.

In some non-limiting examples, a third group 2643 of emissive regions 910 may correspond to sub-pixels 264*x* that emit EM radiation at a third wavelength, in some non-limiting examples the sub-pixels 264*x* of the third group 2643 may correspond to B(lue) sub-pixels 2643. In some non-limiting examples, the lateral aspects 2010 of the emissive regions 910 of the third group 2643 may have a substantially diamond-shaped configuration. In some non-limiting examples, the emissive regions 910 of the third group 2643 may lie in the pattern of the first row, preceded and followed by PDLs 940. In some non-limiting examples, the lateral aspects 2010 of the emissive regions 910 of the third group 2643 may slightly overlap the lateral aspects 2020 of the preceding and following non-emissive regions 2302 comprising PDLs 940 in the same row, as well as of the lateral aspects 2020 of adjacent non-emissive regions 2302 comprising PDLs 940 in a preceding and following pattern of the second row. In some non-limiting examples, the pattern of the second row may comprise emissive regions 910 of the first group 2641 alternating emissive regions 910 of the third group 2643, each preceded and followed by PDLs 940.

Figure 26B:
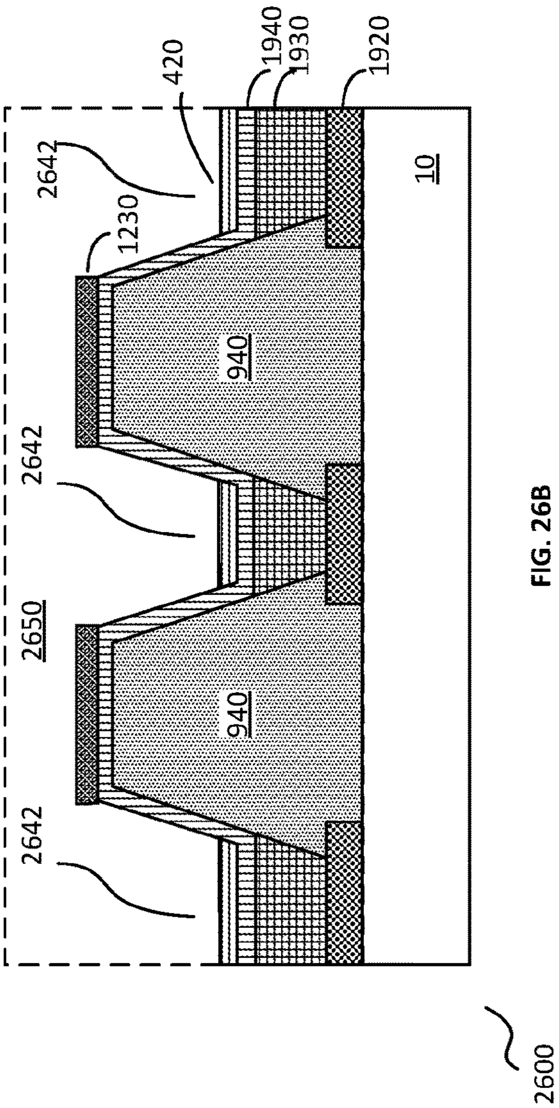
FIG. 26B is a schematic diagram illustrating an example cross-sectional view of the device of FIG. 26A taken along line 26B-26B.

Turning now to FIG. 26B, there may be shown an example cross-sectional view of the device 2600, taken along line 26B-26B in FIG. 26A. In the figure, the device 2600 may be shown as comprising a substrate 10 and a plurality of elements of a first electrode 1920, formed on an exposed layer surface 11 thereof. The substrate 10 may comprise the base substrate 1912 (not shown for purposes of simplicity of illustration), and/or at least one TFT structure 901 (not shown for purposes of simplicity of illustration), corresponding to and for driving each sub-pixel 264*x*. PDLs 940 may be formed over the substrate 10 between elements of the first electrode 1920, to define emissive region(s) 910 over each element of the first electrode 1920, separated by non-emissive region(s) 2302 comprising the PDL(s) 940. In the figure, the emissive region(s) 910 may all correspond to the second group 2642.

In some non-limiting examples, at least one semiconducting layer 1930 may be deposited on each element of the first electrode 1920, between the surrounding PDLs 940.

In some non-limiting examples, a second electrode 1940, which in some non-limiting examples, may be a common cathode, may be deposited over the emissive region(s) 910 of the second group 2642 to form the G(reen) sub-pixel(s) 2642 thereof and over the surrounding PDLs 940.

In some non-limiting examples, a patterning coating 420 may be selectively deposited over the second electrode 1940 across the lateral aspects 2010 of the emissive region(s) 910 of the second group 2642 of G(reen) sub-pixels 2642 to allow selective deposition of a deposited layer 1230 over parts of the second electrode 1940 that may be substantially devoid of the patterning coating 420, namely across the lateral aspects 2020 of the non-emissive region(s) 2302 comprising the PDLs 940. In some non-limiting examples, the deposited layer 1230 may tend to accumulate along the substantially planar parts of the PDLs 940, as the deposited layer 1230 may tend to not remain on the inclined parts of the PDLs 940 but may tend to descend to a base of such inclined parts, which may be coated with the patterning coating 420. In some non-limiting examples, the deposited layer 1230 on the substantially planar parts of the PDLs 940 may form at least one auxiliary electrode 2450 that may be electrically coupled with the second electrode 1940.

In some non-limiting examples, the device 2600 may comprise a CPL, and/or an outcoupling layer. By way of non-limiting example, such CPL, and/or outcoupling layer may be provided directly on a surface of the second electrode 1940, and/or a surface of the patterning coating 420. In some non-limiting examples, such CPL, and/or outcoupling layer may be provided across the lateral aspect of at least one emissive region 910 corresponding to a (sub-) 3110/264*x*.

In some non-limiting examples, the patterning coating 420 may also act as an index-matching coating. In some non-limiting examples, the patterning coating 420 may also act as an outcoupling layer.

In some non-limiting examples, the device 2600 may comprise an encapsulation layer 2650. Non-limiting examples of such encapsulation layer 2650 include a glass cap, a barrier film, a barrier adhesive, a barrier coating 2350, and/or a TFE layer such as shown in dashed outline in the figure, provided to encapsulate the device 2600. In some non-limiting examples, the TFE layer 2650 may be considered a type of barrier coating 2350.

In some non-limiting examples, the encapsulation layer 2650 may be arranged above at least one of the second electrode 1940, and/or the patterning coating 420. In some non-limiting examples, the device 2600 may comprise additional optical, and/or structural layers, coatings, and components, including without limitation, a polarizer, a color filter, an anti-reflection coating, an anti-glare coating, cover glass, and/or an optically clear adhesive (OCA).

Figure 26C:
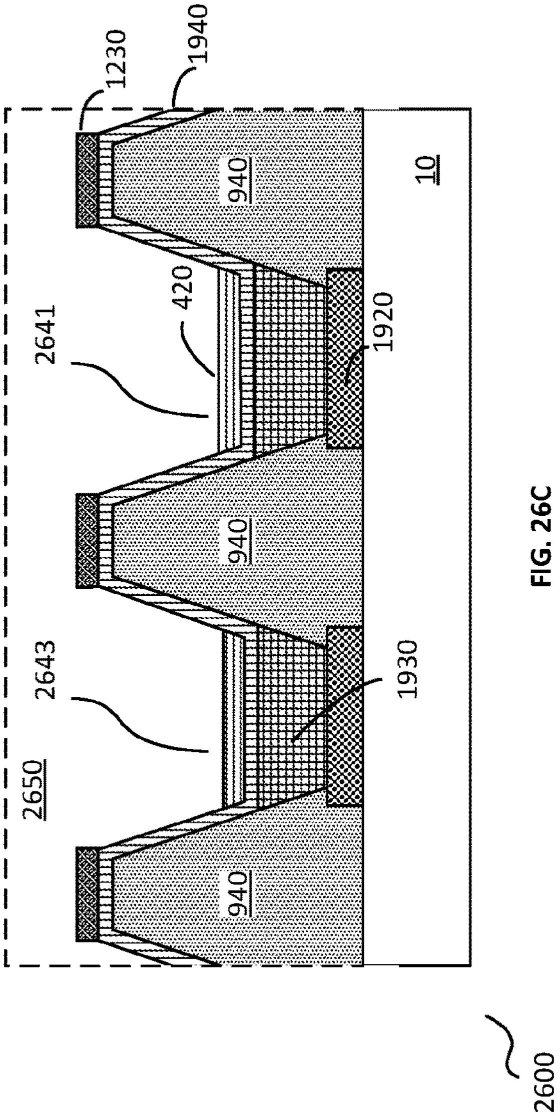
FIG. 26C is a schematic diagram illustrating an example cross-sectional view of the device of FIG. 26A taken along line 26C-26C.

Turning now to FIG. 26C, there may be shown an example cross-sectional view of the device 2600, taken along line 26C-26C in FIG. 26A. In the figure, the device 2600 may be shown as comprising a substrate 10 and a plurality of elements of a first electrode 1920, formed on an exposed layer surface 11 thereof. PDLs 940 may be formed over the substrate 10 between elements of the first electrode 1920, to define emissive region(s) 910 over each element of the first electrode 1920, separated by non-emissive region(s) 2302 comprising the PDL(s) 940. In the figure, the emissive region(s) 910 may correspond to the first group 2641 and to the third group 2643 in alternating fashion.

In some non-limiting examples, at least one semiconducting layer 1930 may be deposited on each element of the first electrode 1920, between the surrounding PDLs 940.

In some non-limiting examples, a second electrode 1940, which in some non-limiting examples, may be a common cathode, may be deposited over the emissive region(s) 910 of the first group 2641 to form the R(ed) sub-pixel(s) 2641 thereof, over the emissive region(s) 910 of the third group 2643 to form the B(lue) sub-pixel(s) 2643 thereof, and over the surrounding PDLs 940.

In some non-limiting examples, a patterning coating 420 may be selectively deposited over the second electrode 1940 across the lateral aspects 2010 of the emissive region(s) 910 of the first group 2641 of R(ed) sub-pixels 2641 and of the third group 2643 of B(lue) sub-pixels 2643 to allow selective deposition of a deposited layer 1230 over parts of the second electrode 1940 that may be substantially devoid of the patterning coating 420, namely across the lateral aspects 2020 of the non-emissive region(s) 2302 comprising the PDLs 940. In some non-limiting examples, the deposited layer 1230 may tend to accumulate along the substantially planar parts of the PDLs 940, as the deposited layer 1230 may tend to not remain on the inclined parts of the PDLs 940 but may tend to descend to a base of such inclined parts, which are coated with the patterning coating 420. In some non-limiting examples, the deposited layer 1230 on the substantially planar parts of the PDLs 940 may form at least one auxiliary electrode 2450 that may be electrically coupled with the second electrode 1940.

Figure 27:
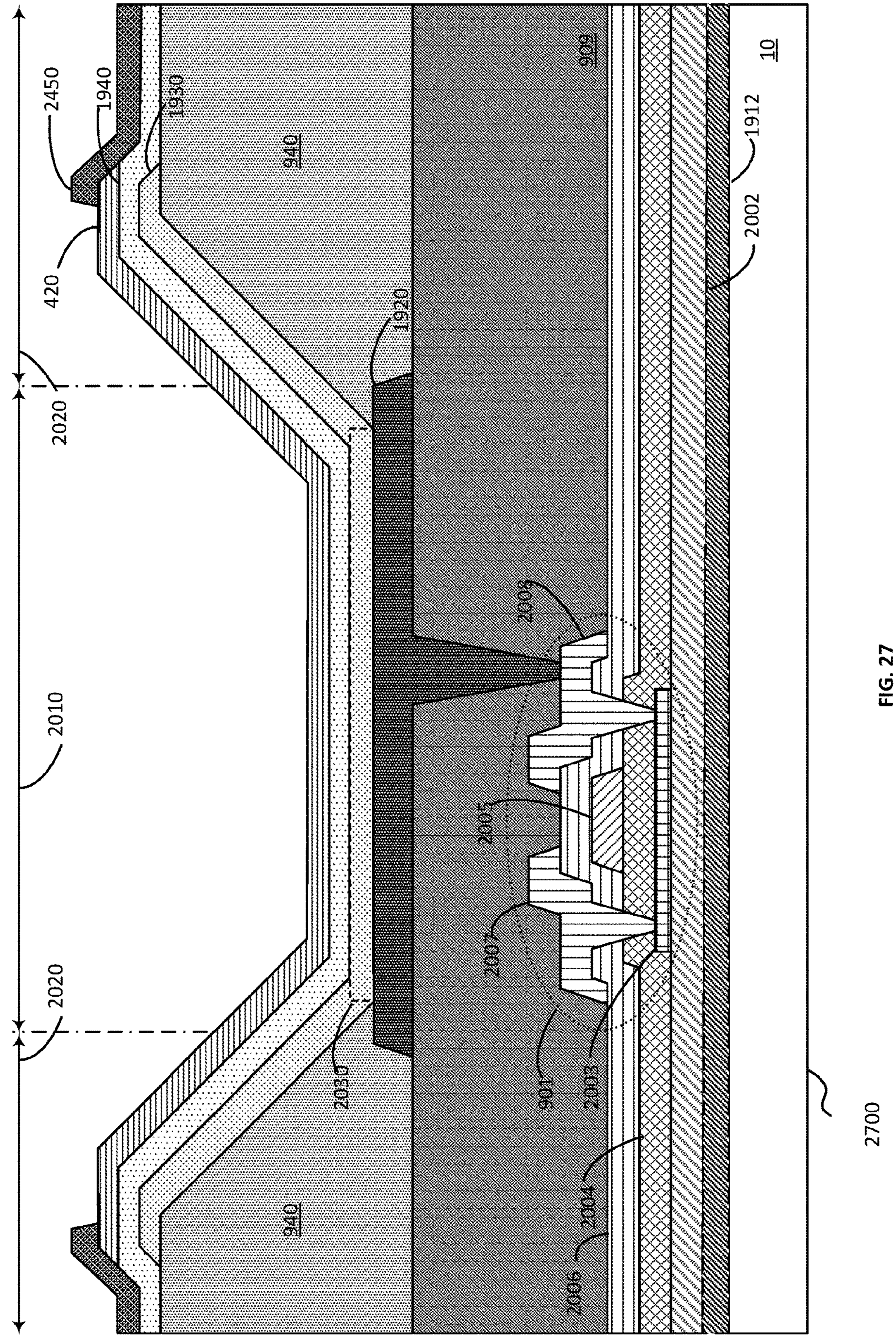
FIG. 27 is a schematic diagram illustrating an example cross-sectional view of an example version of the device of FIG. 20 with additional example deposition steps according to an example in the present disclosure.

Turning now to FIG. 27, there may be shown an example version 2700 of the device 1900, which may encompass the device shown in cross-sectional view in FIG. 20, but with additional deposition steps that are described herein.

The device 2700 may show a patterning coating 420 selectively deposited over the exposed layer surface 11 of the underlying layer, in the figure, the second electrode 1940, within a first portion 601 of the device 2700, corresponding substantially to the lateral aspect 2010 of emissive region(s) 910 corresponding to (sub-)pixel(s) 3110/264*x* and not within a second portion 602 of the device 2700, corresponding substantially to the lateral aspect(s) 2020 of non-emissive region(s) 2302 surrounding the first portion 601.

In some non-limiting examples, the patterning coating 420 may be selectively deposited using a shadow mask 1515.

The patterning coating 420 may provide, within the first portion 601, an exposed layer surface 11 with a relatively low initial sticking probability against deposition of a deposited material 1631 to be thereafter deposited as a deposited layer 1230 to form an auxiliary electrode 2450.

After selective deposition of the patterning coating 420, the deposited material 1631 may be deposited over the device 2700 but may remain substantially only within the second portion 602, which may be substantially devoid of any patterning coating 420, to form the auxiliary electrode 2450.

In some non-limiting examples, the deposited material 1631 may be deposited using an open mask and/or a mask-free deposition process.

The auxiliary electrode 2450 may be electrically coupled with the second electrode 1940 to reduce a sheet resistance of the second electrode 1940, including, as shown, by lying above and in physical contact with the second electrode 1940 across the second portion that may be substantially devoid of any patterning coating 420.

In some non-limiting examples, the deposited layer 1230 may comprise substantially the same material as the second electrode 1940, to ensure a high initial sticking probability against deposition of the deposited material 1631 in the second portion 602.

In some non-limiting examples, the second electrode 1940 may comprise substantially pure Mg, and/or an alloy of Mg and another metal, including without limitation, Ag. In some non-limiting examples, an Mg:Ag alloy composition may range from about 1:9-9:1 by volume. In some non-limiting examples, the second electrode 1940 may comprise metal oxides, including without limitation, ternary metal oxides, such as, without limitation, ITO, and/or IZO, and/or a combination of metals, and/or metal oxides.

In some non-limiting examples, the deposited layer 1230 used to form the auxiliary electrode 2450 may comprise substantially pure Mg.

Figure 28:
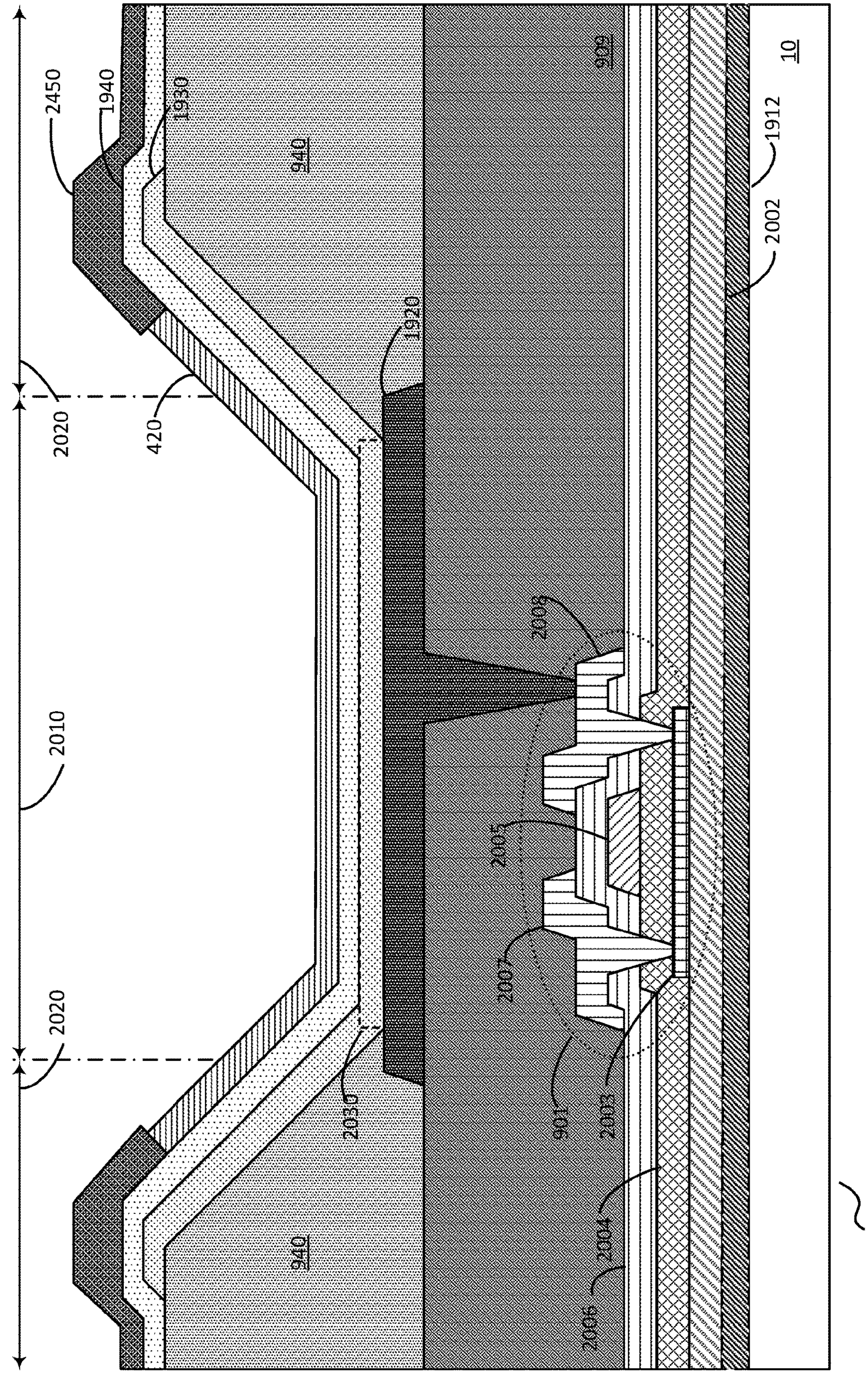
FIG. 28 is a schematic diagram illustrating an example cross-sectional view of an example version of the device of FIG. 20 with additional example deposition steps according to an example in the present disclosure.

Turning now to FIG. 28, there may be shown an example version 2800 of the device 1900, which may encompass the device shown in cross-sectional view in FIG. 20, but with additional deposition steps that are described herein.

The device 2800 may show a patterning coating 420 selectively deposited over the exposed layer surface 11 of the underlying layer, in the figure, the second electrode 1940, within a first portion 601 of the device 2800, corresponding substantially to a part of the lateral aspect 2010 of emissive region(s) 910 corresponding to (sub-)pixel(s) 3110/264*x*, and not within a second portion 602. In the figure, the first portion 601 may extend partially along the extent of an inclined part of the PDLs 940 defining the emissive region(s) 910.

In some non-limiting examples, the patterning coating 420 may be selectively deposited using a shadow mask 1515.

The patterning coating 420 may provide, within the first portion 601, an exposed layer surface 11 with a relatively low initial sticking probability against deposition of a deposited material 1631 to be thereafter deposited as a deposited layer 1230 to form an auxiliary electrode 2450.

After selective deposition of the patterning coating 420, the deposited material 1631 may be deposited over the device 2800 but may remain substantially only within the second portion 602, which may be substantially devoid of patterning coating 420, to form the auxiliary electrode 2450. As such, in the device 2800, the auxiliary electrode 2450 may extend partly across the inclined part of the PDLs 940 defining the emissive region(s) 910.

In some non-limiting examples, the deposited layer 1230 may be deposited using an open mask and/or a mask-free deposition process.

The auxiliary electrode 2450 may be electrically coupled with the second electrode 1940 to reduce a sheet resistance of the second electrode 1940, including, as shown, by lying above and in physical contact with the second electrode 1940 across the second portion 602 that may be substantially devoid of patterning coating 420.

In some non-limiting examples, the material of which the second electrode 1940 may be comprised, may not have a high initial sticking probability against deposition of the deposited material 1631.

Figure 29:
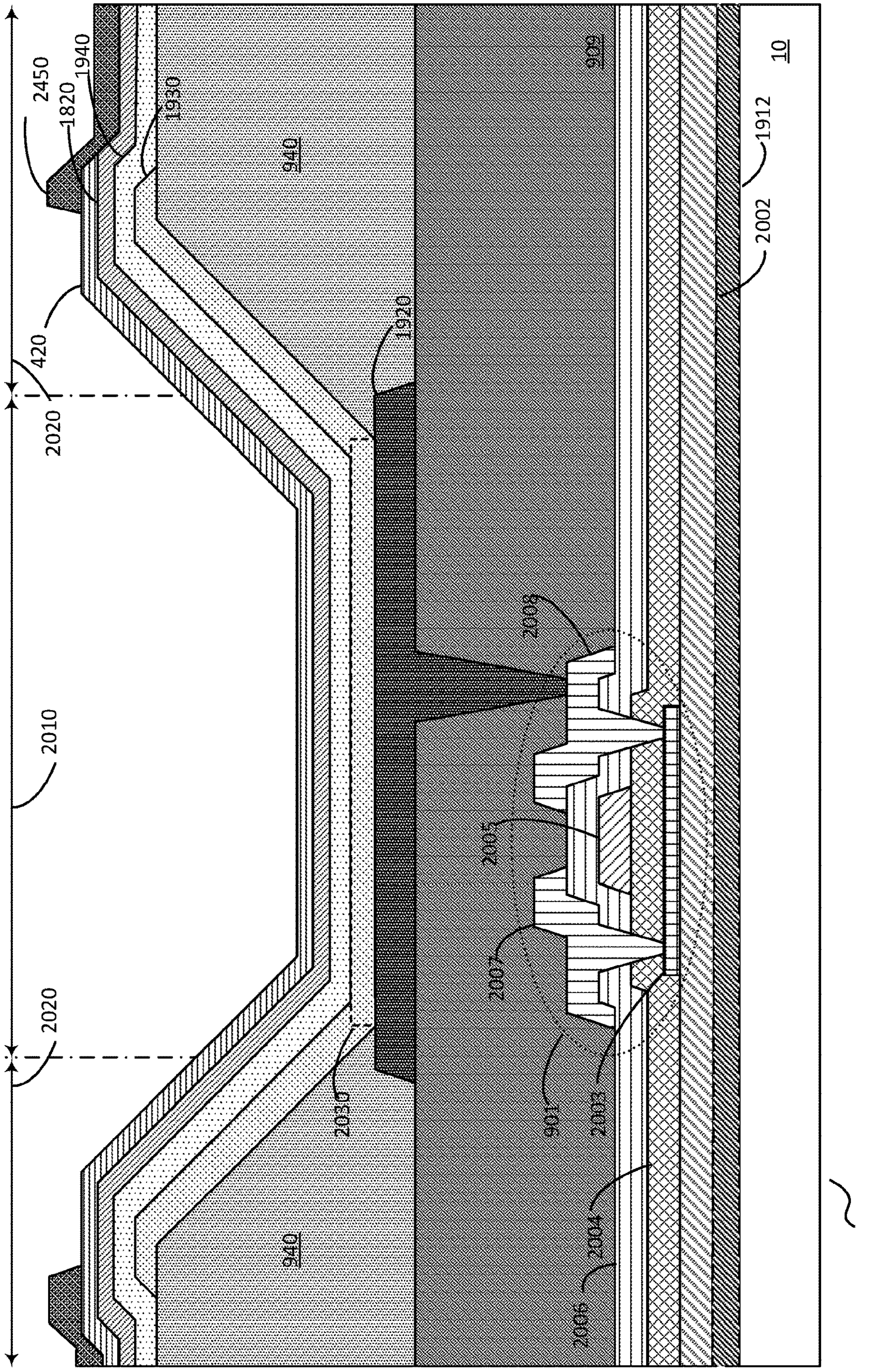
FIG. 29 is a schematic diagram illustrating an example cross-sectional view of an example version of the device of FIG. 20 with additional example deposition steps according to an example in the present disclosure.

FIG. 29 may illustrate such a scenario, in which there may be shown an example version 2900 of the device 1900, which may encompass the device shown in cross-sectional view in FIG. 20, but with additional deposition steps that are described herein.

The device 2900 may show an NPC 1820 deposited over the exposed layer surface 11 of the underlying material, in the figure, the second electrode 1940.

In some non-limiting examples, the NPC 1820 may be deposited using an open mask and/or a mask-free deposition process.

Thereafter, a patterning coating 420 may be deposited selectively deposited over the exposed layer surface 11 of the underlying material, in the figure, the NPC 1820, within a first portion 601 of the device 2900, corresponding substantially to a part of the lateral aspect 2010 of emissive region(s) 910 corresponding to (sub-)pixel(s) 3110/264*x*, and not within a second portion 602 of the device 2900, corresponding substantially to the lateral aspect(s) 2020 of non-emissive region(s) 2302 surrounding the first portion 601.

In some non-limiting examples, the patterning coating 420 may be selectively deposited using a shadow mask 1515.

The patterning coating 420 may provide, within the first portion 601, an exposed layer surface 11 with a relatively low initial sticking probability against deposition of a deposited material 1631 to be thereafter deposited as a deposited layer 1230 to form an auxiliary electrode 2450.

After selective deposition of the patterning coating 420, the deposited material 1631 may be deposited over the device 2900 but may remain substantially only within the second portion 602, which may be substantially devoid of patterning coating 420, to form the auxiliary electrode 2450.

In some non-limiting examples, the deposited layer 1230 may be deposited using an open mask and/or a mask-free deposition process.

The auxiliary electrode 2450 may be electrically coupled with the second electrode 1940 to reduce a sheet resistance thereof. While, as shown, the auxiliary electrode 2450 may not be lying above and in physical contact with the second electrode 1940, those having ordinary skill in the relevant art will nevertheless appreciate that the auxiliary electrode 2450 may be electrically coupled with the second electrode 1940 by several well-understood mechanisms. By way of non-limiting example, the presence of a relatively thin film (in some non-limiting examples, of up to about 50 nm) of a patterning coating 420 may still allow a current to pass therethrough, thus allowing a sheet resistance of the second electrode 1940 to be reduced.

Figure 30:
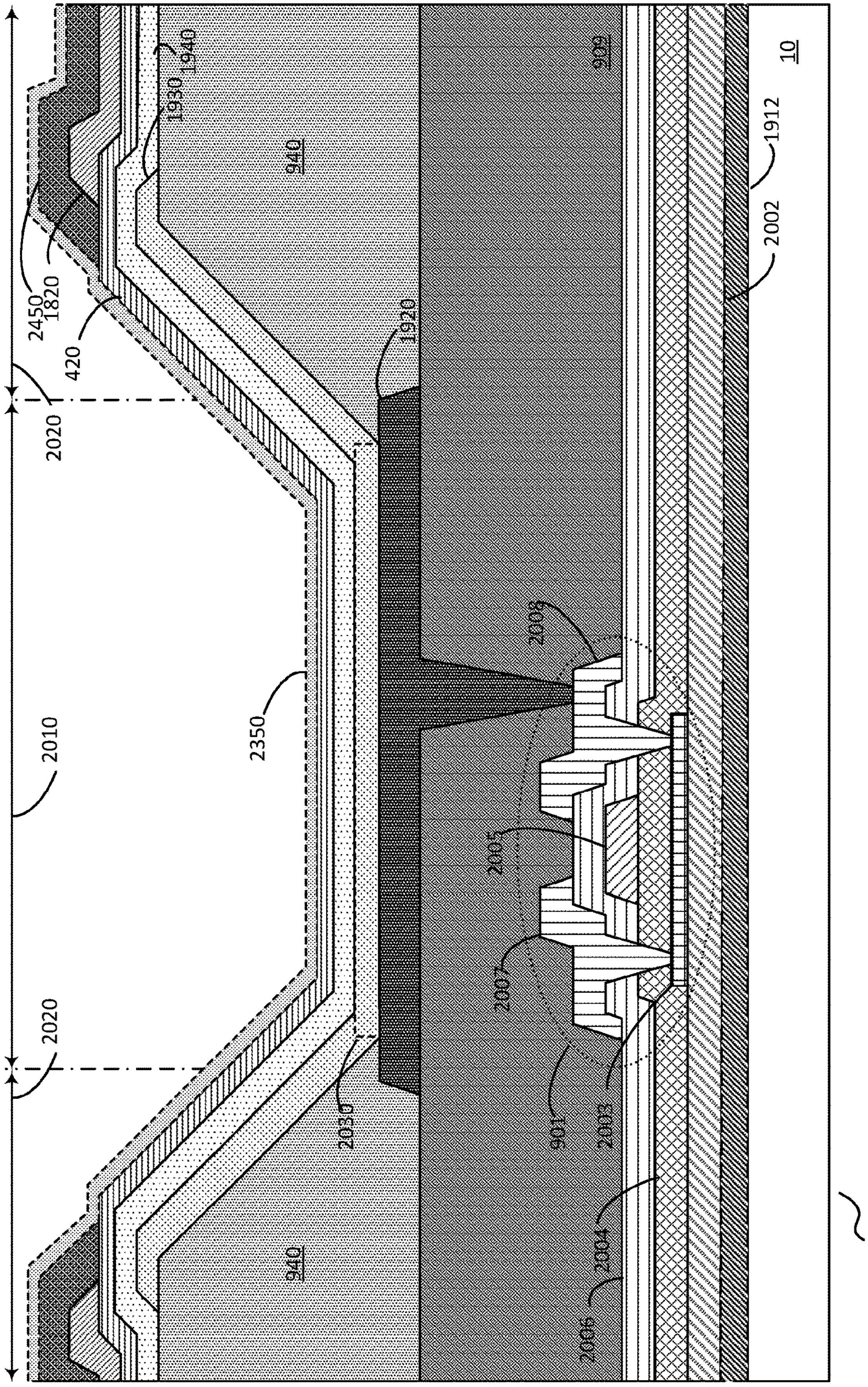
FIG. 30 is a schematic diagram illustrating an example cross-sectional view of an example version of the device of FIG. 20 with additional example deposition steps according to an example in the present disclosure.

Turning now to FIG. 30, there may be shown an example version 3000 of the device 1900, which may encompass the device shown in cross-sectional view in FIG. 20, but with additional deposition steps that are described herein.

The device 3000 may show a patterning coating 420 deposited over the exposed layer surface 11 of the underlying material, in the figure, the second electrode 1940.

In some non-limiting examples, the patterning coating 420 may be deposited using an open mask and/or a mask-free deposition process.

The patterning coating 420 may provide an exposed layer surface 11 with a relatively low initial sticking probability against deposition of a deposited material 1631 to be thereafter deposited as a deposited layer 1230 to form an auxiliary electrode 2450.

After deposition of the patterning coating 420, an NPC 1820 may be selectively deposited over the exposed layer surface 11 of the underlying layer, in the figure, the patterning coating 420, corresponding substantially to a part of the lateral aspect 2020 of non-emissive region(s) 2302, and surrounding a second portion 602 of the device 3000, corresponding substantially to the lateral aspect(s) 2010 of emissive region(s) 910 corresponding to (sub-)pixel(s) 3110/264*x*.

In some non-limiting examples, the NPC 1820 may be selectively deposited using a shadow mask 1515.

The NPC 1820 may provide, within the first portion 601, an exposed layer surface 11 with a relatively high initial sticking probability against deposition of a deposited material 1631 to be thereafter deposited as a deposited layer 1230 to form an auxiliary electrode 2450.

After selective deposition of the NPC 1820, the deposited material 1631 may be deposited over the device 3000 but may remain substantially where the patterning coating 420 has been overlaid with the NPC 1820, to form the auxiliary electrode 2450.

In some non-limiting examples, the deposited layer 1230 may be deposited using an open mask and/or a mask-free deposition process.

The auxiliary electrode 2450 may be electrically coupled with the second electrode 1940 to reduce a sheet resistance of the second electrode 1940.

Transparent OLED

Because the OLED device 1900 may emit EM radiation through either, or both, of the first electrode 1920 (in the case of a bottom-emission, and/or a double-sided emission device), as well as the substrate 10, and/or the second electrode 1940 (in the case of a top-emission, and/or double-sided emission device), there may be an aim to make either, or both of, the first electrode 1920, and/or the second electrode 1940 substantially photon- (or light)-transmissive ("transmissive"), in some non-limiting examples, at least across a substantial part of the lateral aspect of the emissive region(s) 910 of the device 1900. In the present disclosure, such a transmissive element, including without limitation, an electrode 1920, 1940, a material from which such element may be formed, and/or property thereof, may comprise an element, material, and/or property thereof that is substantially transmissive ("transparent"), and/or, in some non-limiting examples, partially transmissive ("semi-transparent"), in some non-limiting examples, in at least one wavelength range.

A variety of mechanisms may be adopted to impart transmissive properties to the device 1900, at least across a substantial part of the lateral aspect of the emissive region(s) 910 thereof.

In some non-limiting examples, including without limitation, where the device 1900 is a bottom-emission device, and/or a double-sided emission device, the TFT structure(s) 901 of the driving circuit associated with an emissive region 910 of a (sub-)pixel 3110/264*x*, which may at least partially reduce the transmissivity of the surrounding substrate 10, may be located within the lateral aspect 2020 of the surrounding non-emissive region(s) 2302 to avoid impacting the transmissive properties of the substrate 10 within the lateral aspect 2010 of the emissive region 910.

In some non-limiting examples, where the device 1900 is a double-sided emission device, in respect of the lateral aspect 2010 of an emissive region 910 of a (sub-)pixel 3110/264*x*, a first one of the electrodes 1920, 1940 may be made substantially transmissive, including without limitation, by at least one of the mechanisms disclosed herein, in respect of the lateral aspect 2010 of neighbouring, and/or adjacent (sub-)pixel(s) 3110/264*x*, a second one of the electrodes 1920, 1940 may be made substantially transmissive, including without limitation, by at least one of the mechanisms disclosed herein. Thus, the lateral aspect 2010 of a first emissive region 910 of a (sub-)pixel 3110/264*x* may be made substantially top-emitting while the lateral aspect 2010 of a second emissive region 910 of a neighbouring (sub-)pixel 3110/264*x* may be made substantially bottom-emitting, such that a subset of the (sub-)pixel(s) 3110/264*x* may be substantially top-emitting and a subset of the (sub-)pixel(s) 3110/264*x* may be substantially bottom-emitting, in an alternating (sub-)pixel 3110/264*x* sequence, while only a single electrode 1920, 1940 of each (sub-)pixel 3110/264*x* may be made substantially transmissive.

In some non-limiting examples, a mechanism to make an electrode 1920, 1940, in the case of a bottom-emission device, and/or a double-sided emission device, the first electrode 1920, and/or in the case of a top-emission device, and/or a double-sided emission device, the second electrode 1940, transmissive, may be to form such electrode 1920, 1940 of a transmissive thin film.

In some non-limiting examples, an electrically conductive deposited layer 1230, in a thin film, including without limitation, those formed by a depositing a thin conductive film layer of a metal, including without limitation, Ag, Al, and/or by depositing a thin layer of a metallic alloy, including without limitation, an Mg:Ag alloy, and/or a Yb:Ag alloy, may exhibit transmissive characteristics. In some non-limiting examples, the alloy may comprise a composition ranging from between about 1:9-9:1 by volume. In some non-limiting examples, the electrode 1920, 1940 may be formed of a plurality of thin conductive film layers of any combination of deposited layers 1230, any at least one of which may be comprised of TCOs, thin metal films, thin metallic alloy films, and/or any combination of any of these.

In some non-limiting examples, especially in the case of such thin conductive films, a relatively thin layer thickness may be up to substantially a few tens of nm to contribute to enhanced transmissive qualities but also favorable optical properties (including without limitation, reduced microcavity effects) for use in an OLED device 1900.

In some non-limiting examples, a reduction in the thickness of an electrode 1920, 1940 to promote transmissive qualities may be accompanied by an increase in the sheet resistance of the electrode 1920, 1940.

In some non-limiting examples, a device 1900 having at least one electrode 1920, 1940 with a high sheet resistance may create a large current resistance (IR) drop when coupled with the power source 1905, in operation. In some non-limiting examples, such an IR drop may be compensated for, to some extent, by increasing a level of the power source 1905. However, in some non-limiting examples, increasing the level of the power source 1905 to compensate for the IR drop due to high sheet resistance, for at least one (sub-)pixel 3110/264*x* may call for increasing the level of a voltage to be supplied to other components to maintain effective operation of the device 1900.

In some non-limiting examples, to reduce power supply demands for a device 1900 without significantly impacting an ability to make an electrode 1920, 1940 substantially transmissive (by employing at least one thin film layer of any combination of TCOs, thin metal films, and/or thin metallic alloy films), an auxiliary electrode 2450 may be formed on the device 1900 to allow current to be carried more effectively to various emissive region(s) 910 of the device 1900, while at the same time, reducing the sheet resistance and its associated IR drop of the transmissive electrode 1920, 1940.

In some non-limiting examples, a sheet resistance specification, for a common electrode 1920, 1940 of a display device 1900, may vary according to several parameters, including without limitation, a (panel) size of the device 1900, and/or a tolerance for voltage variation across the device 1900. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 2450 to comply with such specification for various panel sizes.

By way of non-limiting example, for a top-emission device, the second electrode 1940 may be made transmissive. On the other hand, in some non-limiting examples, such auxiliary electrode 2450 may not be substantially transmissive but may be electrically coupled with the second electrode 1940, including without limitation, by deposition of a conductive deposited layer 1230 therebetween, to reduce an effective sheet resistance of the second electrode 1940.

In some non-limiting examples, such auxiliary electrode 2450 may be positioned, and/or shaped in either, or both of, a lateral aspect, and/or cross-sectional aspect to not interfere with the emission of photons from the lateral aspect of the emissive region 910 of a (sub-)pixel 3110/264*x*.

In some non-limiting examples, a mechanism to make the first electrode 1920, and/or the second electrode 1940, may be to form such electrode 1920, 1940 in a pattern across at least a part of the lateral aspect of the emissive region(s) 910 thereof, and/or in some non-limiting examples, across at least a part of the lateral aspect 2020 of the non-emissive region(s) 2302 surrounding them. In some non-limiting examples, such mechanism may be employed to form the auxiliary electrode 2450 in a position, and/or shape in either, or both of, a lateral aspect, and/or cross-sectional aspect to not interfere with the emission of photons from the lateral aspect 2010 of the emissive region 910 of a (sub-)pixel 3110/264*x*, as discussed above.

In some non-limiting examples, the device 1900 may be configured such that it may be substantially devoid of a conductive oxide material in an optical path of EM radiation emitted by the device 1900. By way of non-limiting example, in the lateral aspect 2010 of at least one emissive region 910 corresponding to a (sub-)pixel 3110/264*x*, at least one of the layers, and/or coatings deposited after the at least one semiconducting layer 1930, including without limitation, the second electrode 1940, the patterning coating 420, and/or any other layers, and/or coatings deposited thereon, may be substantially devoid of any conductive oxide material. In some non-limiting examples, being substantially devoid of any conductive oxide material may reduce absorption, and/or reflection of EM radiation emitted by the device 1900. By way of non-limiting example, conductive oxide materials, including without limitation, ITO, and/or IZO, may absorb EM radiation in at least the B(lue) region of the visible spectrum, which may, in generally, reduce efficiency, and/or performance of the device 1900.

In some non-limiting examples, a combination of these, and/or other mechanisms may be employed.

Additionally, in some non-limiting examples, in addition to rendering at least one of the first electrode 1920, the second electrode 1940, and/or the auxiliary electrode 2450, substantially transmissive across at least across a substantial part of the lateral aspect 2010 of the emissive region 910 corresponding to the (sub-) pixel(s) 3110/264*x* of the device 1900, to allow EM radiation to be emitted substantially across the lateral aspect 2010 thereof, there may be an aim to make at least one of the lateral aspect(s) 2020 of the surrounding non-emissive region(s) 2302 of the device 1900 substantially transmissive in both the bottom and top directions, to render the device 1900 substantially transmissive relative to EM radiation incident on an external surface thereof, such that a substantial part of such externally-incident EM radiation may be transmitted through the device 1900, in addition to the emission (in a top-emission, bottom-emission, and/or double-sided emission) of EM radiation generated internally within the device 1900 as disclosed herein.

Turning now to FIG. 31A, there may be shown an example view in plan of a transmissive (transparent) version, shown generally at 3100, of the device 1900. In some non-limiting examples, the device 3100 may be an active matrix OLED (AMOLED) device having a plurality of pixels or pixel regions 3110 and a plurality of transmissive regions 820. In some non-limiting examples, at least one auxiliary electrode 2450 may be deposited on an exposed layer surface 11 of an underlying material between the pixel region(s) 3110, and/or the transmissive region(s) 820.

In some non-limiting examples, each pixel region 3110 may comprise a plurality of emissive regions 910 each corresponding to a sub-pixel 264*x*. In some non-limiting examples, the sub-pixels 264*x* may correspond to, respectively, R(ed) sub-pixels 2641, G(reen) sub-pixels 2642, and/or B(lue) sub-pixels 2643.

In some non-limiting examples, each transmissive region 820 may be substantially transparent and allows EM radiation to pass through the entirety of a cross-sectional aspect thereof.

Figure 31B:
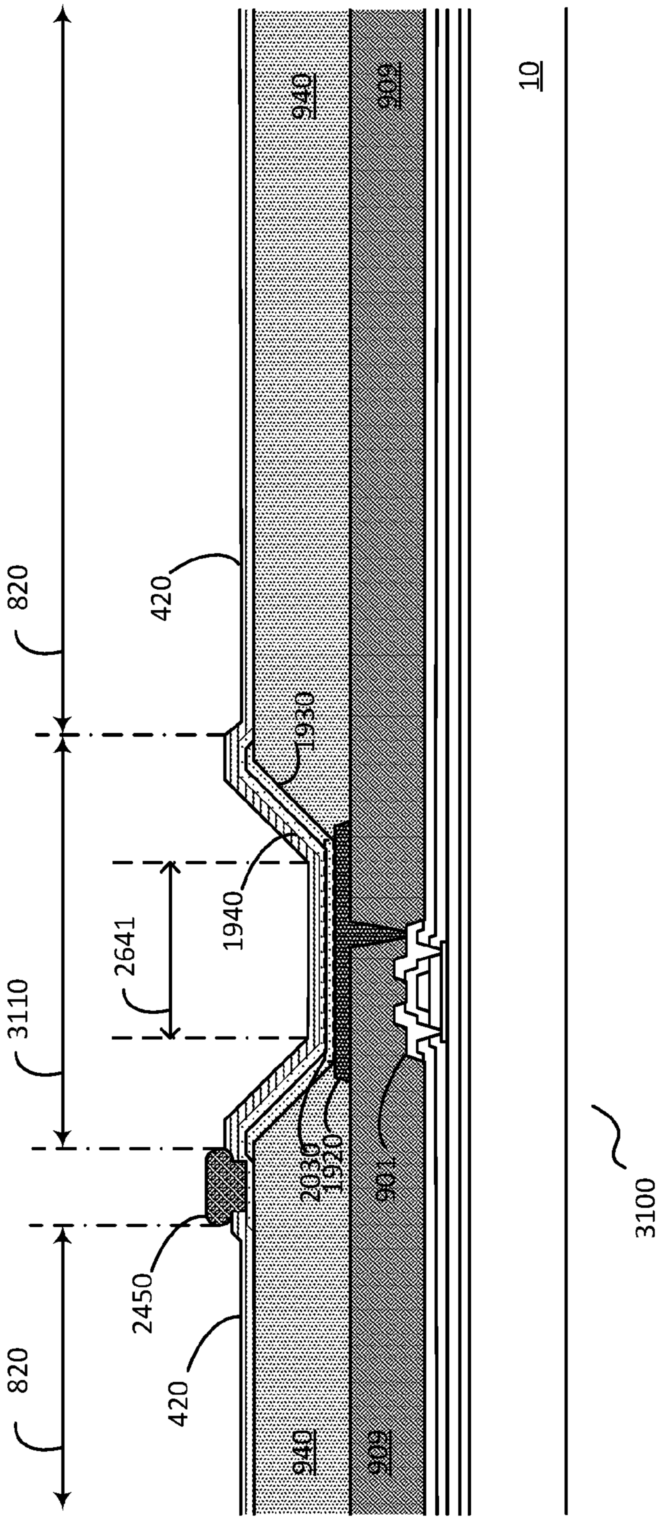
FIG. 31B is a schematic diagram illustrating an example cross-sectional view of the device of FIG. 31A taken along line 31B-31B.

Turning now to FIG. 31B, there may be shown an example cross-sectional view of a version 3100 of the device 1900, taken along line 31B-31B in FIG. 31A. In the figure, the device 3100 may be shown as comprising a substrate 10, a TFT insulating layer 909 and a first electrode 1920 formed on a surface of the TFT insulating layer 909. In some non-limiting examples, the substrate 10 may comprise the base substrate 1912 (not shown for purposes of simplicity of illustration), and/or at least one TFT structure 901, corresponding to, and for driving, each sub-pixel 264*x* positioned substantially thereunder and electrically coupled with the first electrode 1920 thereof. In some non-limiting examples, PDL(s) 940 may be formed in non-emissive regions 2302 over the substrate 10, to define emissive region(s) 910 also corresponding to each sub-pixel 264*x*, over the first electrode 1920 corresponding thereto. In some non-limiting examples, the PDL(s) 940 may cover edges of the first electrode 1920.

In some non-limiting examples, at least one semiconducting layer 1930 may be deposited over exposed region(s) of the first electrode 1920 and, in some non-limiting examples, at least parts of the surrounding PDLs 940.

In some non-limiting examples, a second electrode 1940 may be deposited over the at least one semiconducting layer(s) 1930, including over the pixel region 3110 to form the sub-pixel(s) 264*x* thereof and, in some non-limiting examples, at least partially over the surrounding PDLs 940 in the transmissive region 820.

In some non-limiting examples, a patterning coating 420 may be selectively deposited over first portion(s) 601 of the device 3100, comprising both the pixel region 3110 and the transmissive region 820 but not the region of the second electrode 1940 corresponding to the auxiliary electrode 2450 comprising second portion(s) 602 thereof.

In some non-limiting examples, the entire exposed layer surface 11 of the device 3100 may then be exposed to a vapor flux 1632 of the deposited material 1631, which in some non-limiting examples may be Mg. The deposited layer 1230 may be selectively deposited over second portion(s) 602 of the second electrode 1940 that may be substantially devoid of the patterning coating 420 to form an auxiliary electrode 2450 that may be electrically coupled with and in some non-limiting examples, in physical contact with uncoated parts of the second electrode 1940.

At the same time, the transmissive region 820 of the device 3100 may remain substantially devoid of any materials that may substantially affect the transmission of EM radiation therethrough. In particular, as shown in the figure, the TFT structure 901 and the first electrode 1920 may be positioned, in a cross-sectional aspect, below the sub-pixel 264*x* corresponding thereto, and together with the auxiliary electrode 2450, may lie beyond the transmissive region 820. As a result, these components may not attenuate or impede light from being transmitted through the transmissive region 820. In some non-limiting examples, such arrangement may allow a viewer viewing the device 3100 from a typical viewing distance to see through the device 3100, in some non-limiting examples, when all the (sub-)pixel(s) 3110/264*x* may not be emitting, thus creating a transparent device 3100.

While not shown in the figure, in some non-limiting examples, the device 3100 may further comprise an NPC 1820 disposed between the auxiliary electrode 2450 and the second electrode 1940. In some non-limiting examples, the NPC 1820 may also be disposed between the patterning coating 420 and the second electrode 1940.

In some non-limiting examples, the patterning coating 420 may be formed concurrently with the at least one semiconducting layer(s) 1930. By way of non-limiting example, at least one material used to form the patterning coating 420 may also be used to form the at least one semiconducting layer(s) 1930. In such non-limiting example, several stages for fabricating the device 3100 may be reduced.

Those having ordinary skill in the relevant art will appreciate that in some non-limiting examples, various other layers, and/or coatings, including without limitation those forming the at least one semiconducting layer(s) 1930, and/or the second electrode 1940, may cover a part of the transmissive region 820, especially if such layers, and/or coatings are substantially transparent. In some non-limiting examples, the PDL(s) 940 may have a reduced thickness, including without limitation, by forming a well therein, which in some non-limiting examples may be similar to the well defined for emissive region(s) 910, to further facilitate transmission of EM radiation through the transmissive region 820.

Those having ordinary skill in the relevant art will appreciate that (sub-) pixel(s) 3110/264*x* arrangements other than the arrangement shown in FIGS. 31A and 31B may, in some non-limiting examples, be employed.

Those having ordinary skill in the relevant art will appreciate that arrangements of the auxiliary electrode(s) 2450 other than the arrangement shown in FIGS. 31A and 31B may, in some non-limiting examples, be employed. By way of non-limiting example, the auxiliary electrode(s) 2450 may be disposed between the pixel region 3110 and the transmissive region 820. By way of non-limiting example, the auxiliary electrode(s) 2450 may be disposed between sub-pixel(s) 264*x* within a pixel region 3110.

Figure 32A:
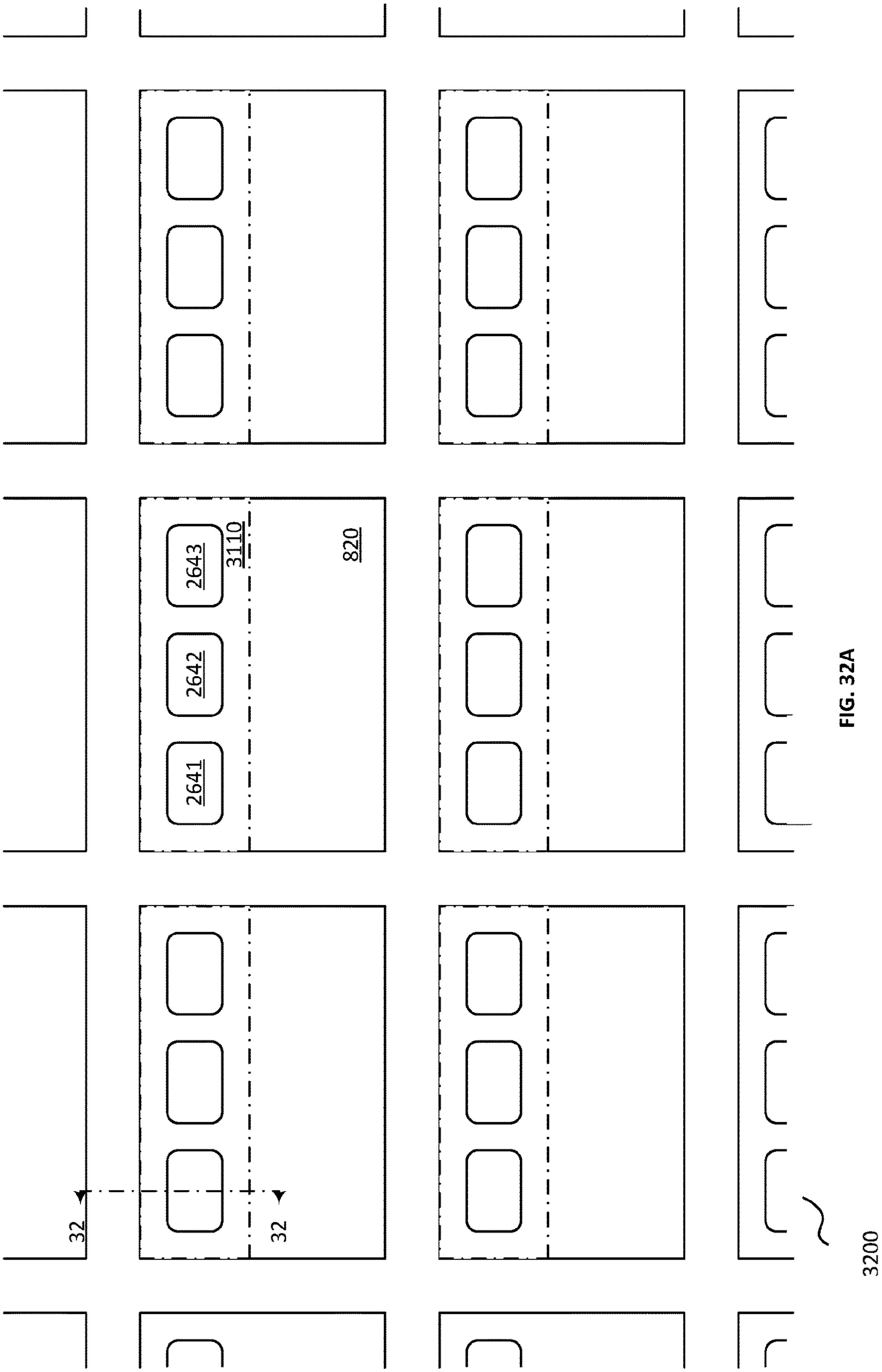
FIG. 32A is a schematic diagram illustrating, in plan view, an example of a transparent version of the device of FIG. 19 comprising at least one example pixel region and at least one example light-transmissive region according to an example in the present disclosure.

Turning now to FIG. 32A, there may be shown an example plan view of a transparent version, shown generally at 3200, of the device 1900. In some non-limiting examples, the device 3200 may be an AMOLED device having a plurality of pixel regions 3110 and a plurality of transmissive regions 820. The device 3200 may differ from device 3100 in that no auxiliary electrode(s) 2450 lie between the pixel region(s) 3110, and/or the transmissive region(s) 820.

In some non-limiting examples, each pixel region 3110 may comprise a plurality of emissive regions 910, each corresponding to a sub-pixel 264*x*. In some non-limiting examples, the sub-pixels 264*x* may correspond to, respectively, R(ed) sub-pixels 2641, G(reen) sub-pixels 2642, and/or B(lue) sub-pixels 2643.

In some non-limiting examples, each transmissive region 820 may be substantially transparent and may allow light to pass through the entirety of a cross-sectional aspect thereof.

Figure 32B:
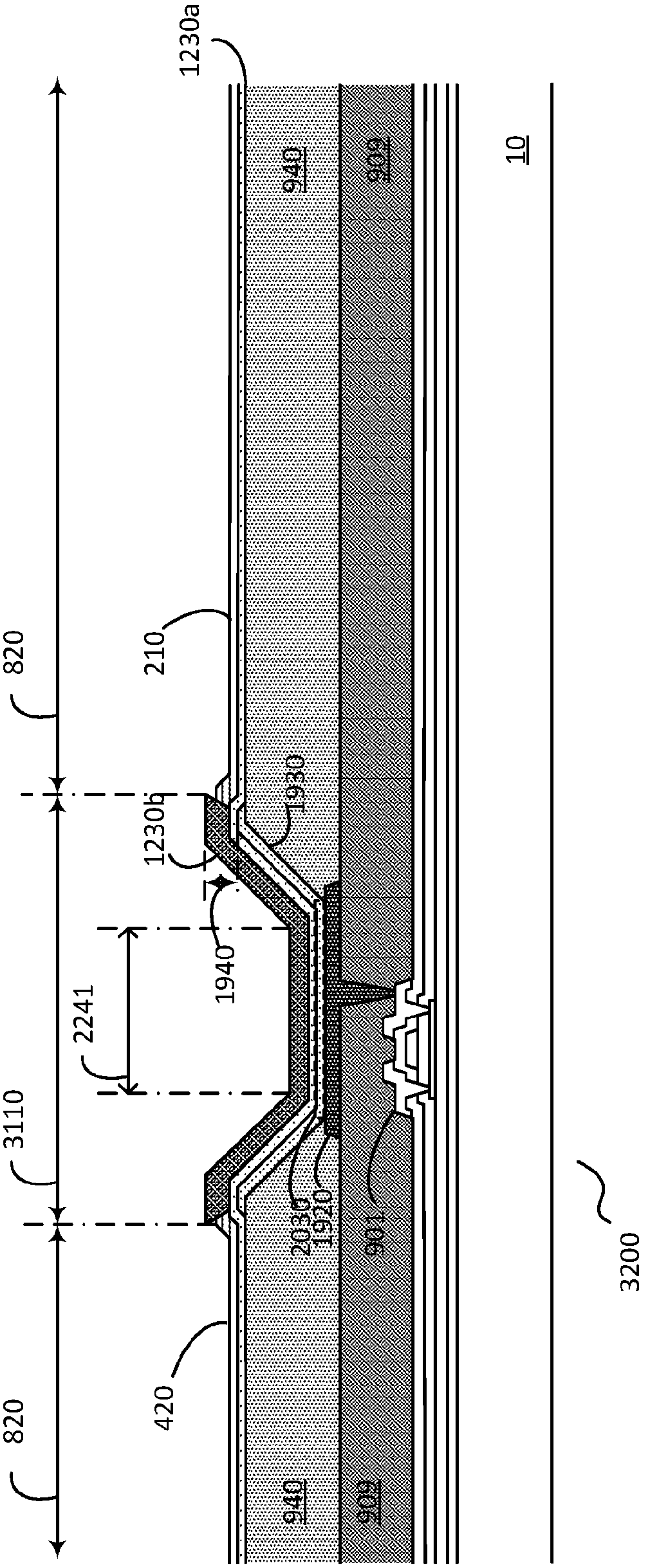
FIG. 32B is a schematic diagram illustrating an example cross-sectional view of the device of FIG. 32A taken along line 32-32.

Turning now to FIG. 32B, there may be shown an example cross-sectional view of the device 3200, taken along line 32-32 in FIG. 32A. In the figure, the device 3200 may be shown as comprising a substrate 10, a TFT insulating layer 909 and a first electrode 1920 formed on a surface of the TFT insulating layer 909. The substrate 10 may comprise the base substrate 1912 (not shown for purposes of simplicity of illustration), and/or at least one TFT structure 901 corresponding to, and for driving, each sub-pixel 264*x* positioned substantially thereunder and electrically coupled with the first electrode 1920 thereof. PDL(s) 940 may be formed in non-emissive regions 2302 over the substrate 10, to define emissive region(s) 910 also corresponding to each sub-pixel 264*x*, over the first electrode 1920 corresponding thereto. The PDL(s) 940 cover edges of the first electrode 1920.

In some non-limiting examples, at least one semiconducting layer 1930 may be deposited over exposed region(s) of the first electrode 1920 and, in some non-limiting examples, at least parts of the surrounding PDLs 940.

In some non-limiting examples, a first deposited layer 1230*a* may be deposited over the at least one semiconducting layer(s) 1930, including over the pixel region 3110 to form the sub-pixel(s) 264*x* thereof and over the surrounding PDLs 940 in the transmissive region 820. In some non-limiting examples, the average layer thickness of the first deposited layer 1230*a* may be relatively thin such that the presence of the first deposited layer 1230*a* across the transmissive region 820 does not substantially attenuate transmission of EM radiation therethrough. In some non-limiting examples, the first deposited layer 1230*a* may be deposited using an open mask and/or mask-free deposition process.

In some non-limiting examples, a patterning coating 420 may be selectively deposited over first portions 601 of the device 3200, comprising the transmissive region 820.

In some non-limiting examples, the entire exposed layer surface 11 of the device 3200 may then be exposed to a vapor flux 1632 of the deposited material 1631, which in some non-limiting examples may be Mg, to selectively deposit a second deposited layer 1230*b*, over second portion (s) 602 of the first deposited layer 1230*a* that may be substantially devoid of the patterning coating 420, in some examples, the pixel region 3110, such that the second deposited layer 1230*b* may be electrically coupled with and in some non-limiting examples, in physical contact with uncoated parts of the first deposited layer 1230*a*, to form the second electrode 1940.

In some non-limiting examples, an average layer thickness of the first deposited layer 1230*a* may be no more than an average layer thickness of the second deposited layer 1230*b*. In this way, relatively high transmittance may be maintained in the transmissive region 820, over which only the first deposited layer 1230*a* may extend. In some non-limiting examples, an average layer thickness of the first deposited layer 1230*a* may be no more than at least one of about: 30 nm, 25 nm, 20 nm, 15 nm, 10 nm, 8 nm, or 5 nm. In some non-limiting examples, an average layer thickness of the second deposited layer 1230*b* may be no more than at least one of about: 30 nm, 25 nm, 20 nm, 15 nm, 10 nm, or 8 nm.

Thus, in some non-limiting examples, an average layer thickness of the second electrode 1940 may be no more than about 40 nm, and/or in some non-limiting examples, at least one of between about: 5-30 nm, 10-25 nm, or 15-25 nm.

In some non-limiting examples, the average layer thickness of the first deposited layer 1230*a* may exceed the average layer thickness of the second deposited layer 1230*b*. In some non-limiting examples, the average layer thickness of the first deposited layer 1230*a* and the average layer thickness of the second deposited layer 1230*b* may be substantially the same.

In some non-limiting examples, at least one deposited material 1631 used to form the first deposited layer 1230*a* may be substantially the same as at least one deposited material 1631 used to form the second deposited layer 1230*b*. In some non-limiting examples, such at least one deposited material 1631 may be substantially as described herein in respect of the first electrode 1920, the second electrode 1940, the auxiliary electrode 2450, and/or a deposited layer 1230 thereof.

In some non-limiting examples, the first deposited layer 1230*a* may provide, at least in part, the functionality of an EIL 1939, in the pixel region 3110. Non-limiting examples, of the deposited material 1631 for forming the first deposited layer 1230*a* include Yb, which for example, may be about 1-3 nm in thickness.

In some non-limiting examples, the transmissive region 820 of the device 3200 may remain substantially devoid of any materials that may substantially inhibit the transmission of EM radiation, including without limitation, EM signals, including without limitation, in the IR spectrum and/or NIR spectrum, therethrough. In particular, as shown in the figure, the TFT structure 909, and/or the first electrode 1920 may be positioned, in a cross-sectional aspect below the sub-pixel 264*x* corresponding thereto and beyond the transmissive region 820. As a result, these components may not attenuate or impede EM radiation from being transmitted through the transmissive region 820. In some non-limiting examples, such arrangement may allow a viewer viewing the device 3200 from a typical viewing distance to see through the device 3200, in some non-limiting examples, when the (sub-)pixel(s) 3110/264*x* are not emitting, thus creating a transparent AMOLED device 3200.

In some non-limiting examples, such arrangement may also allow an IR emitter 730$_t$ and/or an IR detector 730$_r$ to be arranged behind the AMOLED device 3200 such that EM signals, including without limitation, in the IR and/or NIR spectrum, to be exchanged through the AMOLED device 3200 by such under-display components 730.

While not shown in the figure, in some non-limiting examples, the device 3200 may further comprise an NPC 1820 disposed between the second deposited layer 1230*b* and the first deposited layer 1230*a*. In some non-limiting examples, the NPC 1820 may also be disposed between the patterning coating 420 and the first deposited layer 1230*a*.

In some non-limiting examples, the patterning coating 420 may be formed concurrently with the at least one semiconducting layer(s) 1930. By way of non-limiting example, at least one material used to form the patterning coating 420 may also be used to form the at least one semiconducting layer(s) 1930. In such non-limiting example, several stages for fabricating the device 3200 may be reduced.

Those having ordinary skill in the relevant art will appreciate that in some non-limiting examples, various other layers, and/or coatings, including without limitation those forming the at least one semiconducting layer(s) 1930, and/or the first deposited layer 1230*a*, may cover a part of the transmissive region 820, especially if such layers, and/or coatings are substantially transparent. In some non-limiting examples, the PDL(s) 940 may have a reduced thickness, including without limitation, by forming a well therein, which in some non-limiting examples may be similar to the well defined for emissive region(s) 910, to further facilitate transmission of EM radiation through the transmissive region 820.

Those having ordinary skill in the relevant art will appreciate that (sub-) pixel(s) 3110/264*x* arrangements other than the arrangement shown in FIGS. 32A and 32B may, in some non-limiting examples, be employed.

Figure 32C:
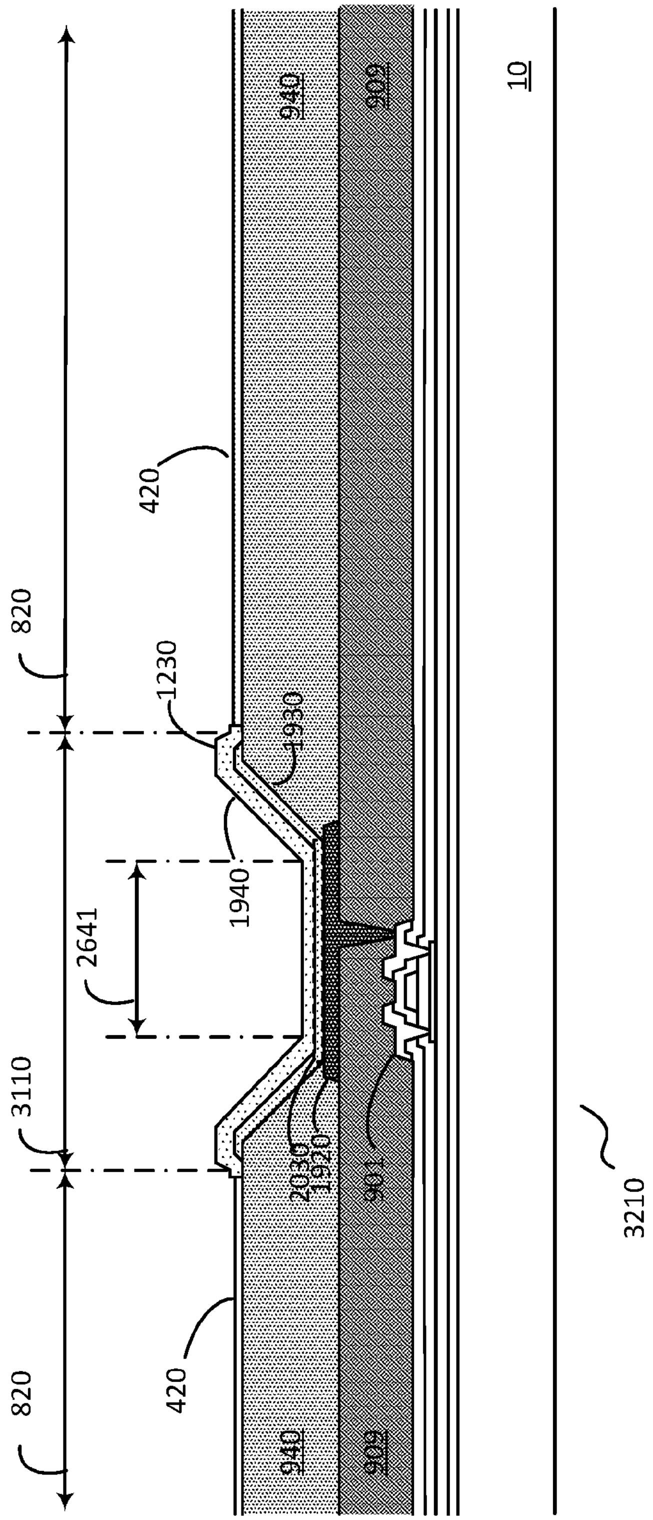
FIG. 32C is a schematic diagram illustrating an example cross-sectional view of the device of FIG. 32A taken along line 32-32.

Turning now to FIG. 32C, there may be shown an example cross-sectional view of a different version 3210 of the device 1900, taken along the same line 32-32 in FIG. 32A. In the figure, the device 3210 may be shown as comprising a substrate 10, a TFT insulating layer 909 and a first electrode 1920 formed on a surface of the TFT insulating layer 909. The substrate 10 may comprise the base substrate 1912 (not shown for purposes of simplicity of illustration), and/or at least one TFT structure 901 corresponding to and for driving each sub-pixel 264*x* positioned substantially thereunder and electrically coupled with the first electrode 1920 thereof. PDL(s) 940 may be formed in non-emissive regions 2302 over the substrate 10, to define emissive region(s) 910 also corresponding to each sub-pixel 264*x*, over the first electrode 1920 corresponding thereto. The PDL(s) 940 may cover edges of the first electrode 1920.

In some non-limiting examples, at least one semiconducting layer 1930 may be deposited over exposed region(s) of the first electrode 1920 and, in some non-limiting examples, at least parts of the surrounding PDLs 940.

In some non-limiting examples, a patterning coating 420 may be selectively deposited over first portions 601 of the device 3210, comprising the transmissive region 820.

In some non-limiting examples, a deposited layer 1230 may be deposited over the at least one semiconducting layer(s) 1930, including over the pixel region 3110 to form the sub-pixel(s) 264*x* thereof but not over the surrounding PDLs 940 in the transmissive region 820. In some non-limiting examples, the first deposited layer 1230*a* may be deposited using an open mask and/or mask-free deposition process. In some non-limiting examples, such deposition may be effected by exposing the entire exposed layer surface 11 of the device 3210 to a vapor flux 1632 of the deposited material 1631, which in some non-limiting examples may be Mg, to selectively deposit the deposited layer 1230 over second portions 602 of the at least one semiconducting layer(s) 1930 that are substantially devoid of the patterning coating 420, in some non-limiting examples, the pixel region 3110, such that the deposited layer 1230 may be deposited on the at least one semiconducting layer(s) 1930 to form the second electrode 1940.

In some non-limiting examples, the transmissive region 820 of the device 3210 may remain substantially devoid of any materials that may substantially affect the transmission of EM radiation therethrough, including without limitation, EM signals, including without limitation, in the IR and/or NIR spectrum. In particular, as shown in the figure, the TFT structure 901, and/or the first electrode 1920 may be positioned, in a cross-sectional aspect below the sub-pixel 264*x* corresponding thereto and beyond the transmissive region 820. As a result, these components may not attenuate or impede EM radiation from being transmitted through the transmissive region 820. In some non-limiting examples, such arrangement may allow a viewer viewing the device 3210 from a typical viewing distance to see through the device 3210, in some non-limiting examples, when the (sub-)pixel(s) 3110/264*x* are not emitting, thus creating a transparent AMOLED device 3210.

By providing a transmissive region 820 that may be free, and/or substantially devoid of any deposited layer 1230, the transmittance in such region 520 may, in some non-limiting examples, be favorably enhanced, by way of non-limiting example, by comparison to the device 3200 of FIG. 32B.

While not shown in the figure, in some non-limiting examples, the device 3210 may further comprise an NPC 1820 disposed between the deposited layer 1230 and the at least one semiconducting layer(s) 1930. In some non-limiting examples, the NPC 1820 may also be disposed between the patterning coating 420 and the PDL(s) 940.

While not shown in FIGS. 32B and 32C for sake of simplicity, those having ordinary skill in the relevant art will appreciate that in some non-limiting examples, an EM radiation-modifying layer 130 may be disposed thereon, to facilitate absorption of EM radiation in the transmissive region 820 in at least a part of the visible spectrum, while allowing EM signals 731 having a wavelength in at least a part of the IR and/or NIR spectrum to be exchanged through the device in the transmissive region 820.

In some non-limiting examples, the patterning coating 420 may be formed concurrently with the at least one semiconducting layer(s) 1930. By way of non-limiting example, at least one material used to form the patterning coating 420 may also be used to form the at least one semiconducting layer(s) 1930. In such non-limiting example, several stages for fabricating the device 3210 may be reduced.

In some non-limiting examples, at least one layer of the at least one semiconducting layer 1930 may be deposited in the transmissive region 820 to provide the patterning coating 420. By way of non-limiting example, the ETL 1937 of the at least one semiconducting layer 1930 may be a patterning coating 420 that may be deposited in both the emissive region 910 and the transmissive region 820 during the deposition of the at least one semiconducting layer 1930. The EIL 1939 may then be selectively deposited in the emissive region 910 over the ETL 1937, such that the exposed layer surface 11 of the ETL 1937 in the transmissive region 820 may be substantially devoid of the EIL 1939. The exposed layer surface 11 of the EIL 1939 in the emissive region 910 and the exposed layer surface of the ETL 1937, which acts as the patterning coating 420, may then be exposed to a vapor flux 1632 of the deposited material 1631 to form a closed coating 1240 of the deposited layer 1230 on the EIL 1939 in the emissive region 910, and a discontinuous layer 160 of the deposited material 1631 on the EIL 1939 in the transmissive region 820.

Those having ordinary skill in the relevant art will appreciate that in some non-limiting examples, various other layers, and/or coatings, including without limitation those forming the at least one semiconducting layer(s) 1930, and/or the deposited layer 1230, may cover a part of the transmissive region 820, especially if such layers, and/or coatings are substantially transparent. In some non-limiting examples, the PDL(s) 940 may have a reduced thickness, including without limitation, by forming a well therein, which in some non-limiting examples may be similar to the well defined for emissive region(s) 910, to further facilitate transmission of EM radiation through the transmissive region 820.

Those having ordinary skill in the relevant art will appreciate that (sub-) pixel(s) 3110/264*x* arrangements other than the arrangement shown in FIGS. 32A and 32C may, in some non-limiting examples, be employed.

Selective Deposition to Modulate Electrode Thickness Over Emissive Region(s)

As discussed above, modulating the thickness of an electrode 1920, 1940, 2450 in and across a lateral aspect 2010 of emissive region(s) 910 of a (sub-) pixel 3110/264*x* may impact the microcavity effect observable. In some non-limiting examples, selective deposition of at least one deposited layer 1230 through deposition of at least one patterning coating 420, including without limitation, an NIC and/or an NPC 1820, in the lateral aspects 2010 of emissive region(s) 910 corresponding to different sub-pixel(s) 264*x* in a pixel region 3110 may allow the optical microcavity effect in each emissive region 910 to be controlled, and/or modulated to optimize desirable optical microcavity effects on a sub-pixel 264*x* basis, including without limitation, an emission spectrum, a luminous intensity, and/or an angular dependence of a brightness, and/or a color shift of emitted light.

Such effects may be controlled by independently modulating an average layer thickness and/or a number of the deposited layer(s) 1230, disposed in each emissive region 910 of the sub-pixel(s) 264*x*. By way of non-limiting example, the average layer thickness of a second electrode 1940 disposed over a B(lue) sub-pixel 2643 may be less than the average layer thickness of a second electrode 1940 disposed over a G(reen) sub-pixel 2642, and the average layer thickness of a second electrode 1940 disposed over a G(reen) sub-pixel 2642 may be less than the average layer thickness of a second electrode 1940 disposed over a R(ed) sub-pixel 2641.

In some non-limiting examples, such effects may be controlled to an even greater extent by independently modulating the average layer thickness and/or a number of the deposited layers 1230, but also of the patterning coating 420 and/or an NPC 1820, deposited in part(s) of each emissive region 910 of the sub-pixel(s) 264*x*.

Figure 33:
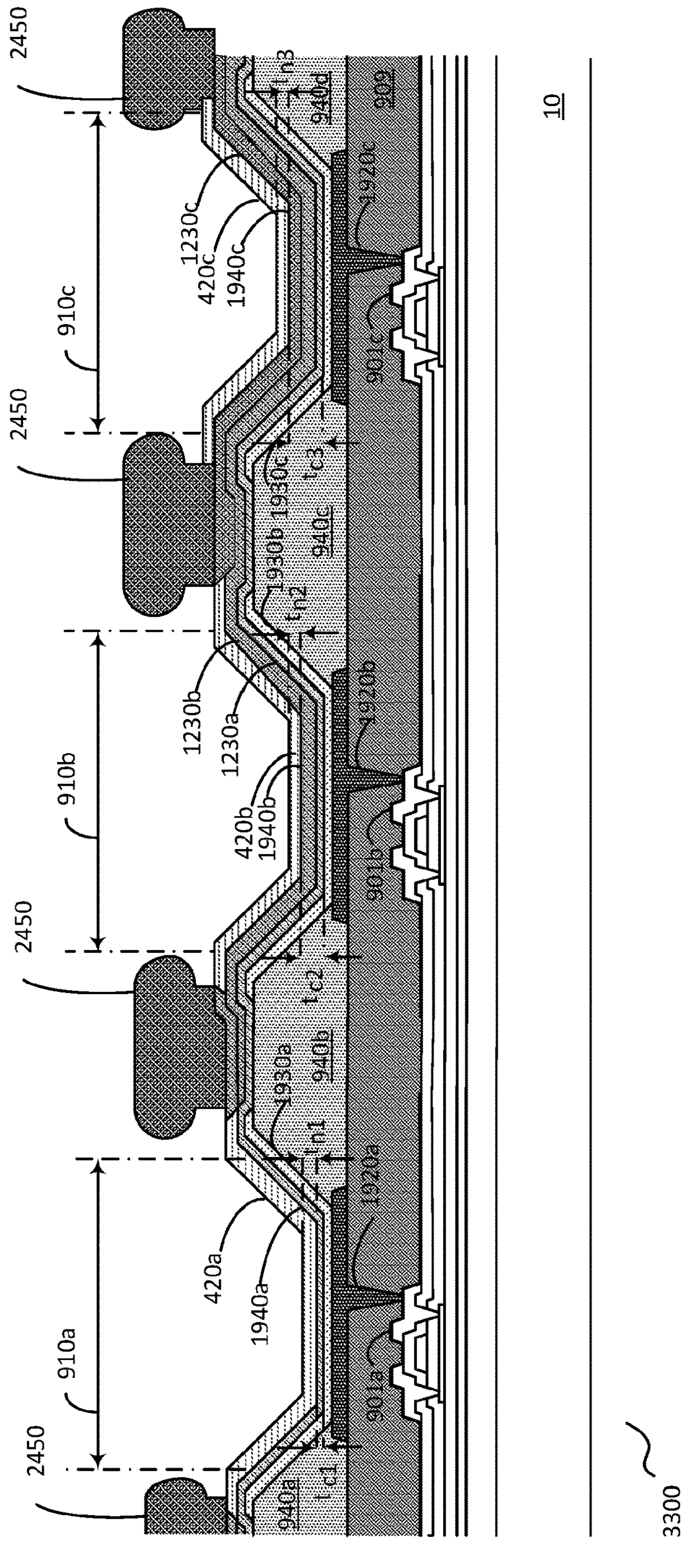
FIG. 33 is a schematic diagram that may show example stages of an example process for manufacturing an example version of the device of FIG. 20 having sub-pixel regions having a second electrode of different thickness according to an example in the present disclosure.

As shown by way of non-limiting example in FIG. 33, there may be deposited layer(s) 1230 of varying average layer thickness selectively deposited for emissive region(s) 910 corresponding to sub-pixel(s) 264*x*, in some non-limiting examples, in a version 3300 of an OLED display device 1900, having different emission spectra. In some non-limiting examples, a first emissive region 910*a* may correspond to a sub-pixel 264*x* configured to emit EM radiation of a first wavelength, and/or emission spectrum, and/or in some non-limiting examples, a second emissive region 910*b* may correspond to a sub-pixel 264*x* configured to emit EM radiation of a second wavelength, and/or emission spectrum. In some non-limiting examples, a device 3300 may comprise a third emissive region 910*c* that may correspond to a sub-pixel 264*x* configured to emit EM radiation of a third wavelength, and/or emission spectrum.

In some non-limiting examples, the first wavelength may be less than, greater than, and/or equal to at least one of the second wavelength, and/or the third wavelength. In some non-limiting examples, the second wavelength may be less than, greater than, and/or equal to at least one of the first wavelength, and/or the third wavelength. In some non-limiting examples, the third wavelength may be less than, greater than, and/or equal to at least one of the first wavelength, and/or the second wavelength.

In some non-limiting examples, the device 3300 may also comprise at least one additional emissive region 910 (not shown) that may in some non-limiting examples be configured to emit EM radiation having a wavelength, and/or emission spectrum that is substantially identical to at least one of the first emissive region 910*a*, the second emissive region 910*b*, and/or the third emissive region 910*c*.

In some non-limiting examples, the patterning coating 420 may be selectively deposited using a shadow mask 1515 that may also have been used to deposit the at least one semiconducting layer 1930 of the first emissive region 910*a*. In some non-limiting examples, such shared use of a shadow mask 1515 may allow the optical microcavity effect(s) to be tuned for each sub-pixel 264*x* in a cost-effective manner.

The device 3300 may be shown as comprising a substrate 10, a TFT insulating layer 909 and a plurality of first electrodes 1920, formed on an exposed layer surface 11 of the TFT insulating layer 909.

In some non-limiting examples, the substrate 10 may comprise the base substrate 1912 (not shown for purposes of simplicity of illustration), and/or at least one TFT structure 901 corresponding to, and for driving, a corresponding emissive region 910, each having a corresponding sub-pixel 264*x*, positioned substantially thereunder and electrically coupled with its associated first electrode 1920. PDL(s) 940 may be formed over the substrate 10, to define emissive region(s) 910. In some non-limiting examples, the PDL(s) 940 may cover edges of their respective first electrode 1920.

In some non-limiting examples, at least one semiconducting layer 1930 may be deposited over exposed region(s) of their respective first electrode 1920 and, in some non-limiting examples, at least parts of the surrounding PDLs 940.

In some non-limiting examples, a first deposited layer 1230*a* may be deposited over the at least one semiconducting layer(s) 1930. In some non-limiting examples, the first deposited layer 1230*a* may be deposited using an open mask and/or mask-free deposition process. In some non-limiting examples, such deposition may be effected by exposing the entire exposed layer surface 11 of the device 3300 to a vapor flux 1632 of deposited material 1631, which in some non-limiting examples may be Mg, to deposit the first deposited layer 1230*a* over the at least one semiconducting layer(s) 1930 to form a first layer of the second electrode 1940*a* (not shown), which in some non-limiting examples may be a common electrode, at least for the first emissive region 910*a*. Such common electrode may have a first thickness tis in the first emissive region 910*a*. In some non-limiting examples, the first thickness tis may correspond to a thickness of the first deposited layer 1230*a*.

In some non-limiting examples, a first patterning coating 420*a* may be selectively deposited over first portions 601 of the device 3300, comprising the first emissive region 910*a*.

In some non-limiting examples, a second deposited layer 1230*b* may be deposited over the device 3300. In some non-limiting examples, the second deposited layer 1230*b* may be deposited using an open mask and/or mask-free deposition process. In some non-limiting examples, such deposition may be effected by exposing the entire exposed layer surface 11 of the device 3300 to a vapor flux 1632 of deposited material 1631, which in some non-limiting examples may be Mg, to deposit the second deposited layer 1230*b* over the first deposited layer 1230*a* that may be substantially devoid of the first patterning coating 420*a*, in some examples, the second and third emissive regions 910*b*, 910*c*, and/or at least part(s) of the non-emissive region(s) 2302 in which the PDLs 940 lie, such that the second deposited layer 1230*b* may be deposited on the second portion(s) 402 of the first deposited layer 1230*a* that are substantially devoid of the first patterning coating 420*a* to form a second layer of the second electrode 1940*b* (not shown), which in some non-limiting examples, may be a common electrode, at least for the second emissive region 910*b*. In some non-limiting examples, such common electrode may have a second thickness $t_{c2}$ in the second emissive region 910*b*. In some non-limiting examples, the second thickness $t_{c2}$ may correspond to a combined average layer thickness of the first deposited layer 1230*a* and of the second deposited layer 1230*b* and may in some non-limiting examples exceed the first thickness tis.

In some non-limiting examples, a second patterning coating 420*b* may be selectively deposited over further first portions 601 of the device 3300, comprising the second emissive region 910*b*.

In some non-limiting examples, a third deposited layer 1230*c* may be deposited over the device 3300. In some non-limiting examples, the third deposited layer 1230*c* may be deposited using an open mask and/or mask-free deposition process. In some non-limiting examples, such deposition may be effected by exposing the entire exposed layer surface 11 of the device 3300 to a vapor flux 1632 of deposited material 1631, which in some non-limiting examples may be Mg, to deposit the third deposited layer 1230*c* over the second deposited layer 1230*b* that may be substantially devoid of either the first patterning coating 420*a* or the second patterning coating 420*b*, in some examples, the third emissive region 910*c*, and/or at least part(s) of the non-emissive region 2302 in which the PDLs 940 lie, such that the third deposited layer 1230*c* may be deposited on the further second portion(s) 602 of the second deposited layer 1230*b* that are substantially devoid of the second patterning coating 420*b* to form a third layer of the second electrode 1940*c* (not shown), which in some nonlimiting examples, may be a common electrode, at least for the third emissive region 910_c_. In some non-limiting examples, such common electrode may have a third thickness $t_{c3}$ in the third emissive region 910_c_. In some non-limiting examples, the third thickness $t_{c3}$ may correspond to a combined thickness of the first deposited layer 1230_a_, the second deposited layer 1230_b_ and the third deposited layer 1230_c_ and may in some non-limiting examples exceed either, or both of, the first thickness td and the second thickness $t_{c2}$.

In some non-limiting examples, a third patterning coating 420_c_ may be selectively deposited over additional first portions 601 of the device 3300, comprising the third emissive region 910_c_.

In some non-limiting examples, at least one auxiliary electrode 2450 may be disposed in the non-emissive region(s) 2302 of the device 3300 between neighbouring emissive regions 910 thereof and in some non-limiting examples, over the PDLs 940. In some non-limiting examples, the deposited layer 1230 used to deposit the at least one auxiliary electrode 2450 may be deposited using an open mask and/or mask-free deposition process. In some non-limiting examples, such deposition may be effected by exposing the entire exposed layer surface 11 of the device 3300 to a vapor flux 1632 of deposited material 1631, which in some non-limiting examples may be Mg, to deposit the deposited layer 1230 over the exposed parts of the first deposited layer 1230_a_, the second deposited layer 1230_b_ and the third deposited layer 1230_c_ that may be substantially devoid of any of the first patterning coating 420_a_ the second patterning coating 420_b_, and/or the third patterning coating 420_c_, such that the deposited layer 1230 may be deposited on an additional second portion 602 comprising the exposed part(s) of the first deposited layer 1230_a_, the second deposited layer 1230_b_, and/or the third deposited layer 1230_c_ that may be substantially devoid of any of the first patterning coating 420_a_, the second patterning coating 420_b_, and/or the third patterning coating 420_c_ to form the at least one auxiliary electrode 2450. In some non-limiting examples, each of the at least one auxiliary electrodes 2450 may be electrically coupled with a respective one of the second electrodes 1940. In some non-limiting examples, each of the at least one auxiliary electrode 2450 may be in physical contact with such second electrode 1940.

In some non-limiting examples, the first emissive region 910_a_, the second emissive region 910_b_ and the third emissive region 910_c_ may be substantially devoid of a closed coating 1240 of the deposited material 1631 used to form the at least one auxiliary electrode 2450.

In some non-limiting examples, at least one of the first deposited layer 1230_a_, the second deposited layer 1230_b_, and/or the third deposited layer 1230_c_ may be transmissive, and/or substantially transparent in at least a part of the visible spectrum. Thus, in some non-limiting examples, the second deposited layer 1230_b_, and/or the third deposited layer 1230_a_ (and/or any additional deposited layer(s) 1230) may be disposed on top of the first deposited layer 1230_a_ to form a multi-coating electrode 1920, 1940, 2450 that may also be transmissive, and/or substantially transparent in at least a part of the visible spectrum. In some non-limiting examples, the transmittance of any of the at least one of the first deposited layer 1230_a_, the second deposited layer 1230_b_, the third deposited layer 1230_c_, any additional deposited layer(s) 12301230, and/or the multi-coating electrode 1920, 1940, 2450 may exceed at least one of about: 30%, 40% 45%, 50%, 60%, 70%, 75%, or 80% in at least a part of the visible spectrum.

In some non-limiting examples, an average layer thickness of the first deposited layer 1230_a_, the second deposited layer 1230_b_, and/or the third deposited layer 1230_c_ may be made relatively thin to maintain a relatively high transmittance. In some non-limiting examples, an average layer thickness of the first deposited layer 1230_a_ may be at least one of between about: 5-30 nm, 8-25 nm, or 10-20 nm. In some non-limiting examples, an average layer thickness of the second deposited layer 1230_b_ may be at least one of between about: 1-25 nm, 1-nm, 1-15 nm, 1-10 nm, or 3-6 nm. In some non-limiting examples, an average layer thickness of the third deposited layer 1230_c_ may be at least one of between about: 1-25 nm, 1-20 nm, 1-15 nm, 1-10 nm, or 3-6 nm. In some non-limiting examples, a thickness of a multi-coating electrode formed by a combination of the first deposited layer 1230_a_, the second deposited layer 1230_b_, the third deposited layer 1230_c_, and/or any additional deposited layer(s) 1230 may be at least one of between about: 6-35 nm, 10-30 nm, 10-25 nm, or 12-18 nm.

In some non-limiting examples, a thickness of the at least one auxiliary electrode 2450 may exceed an average layer thickness of the first deposited layer 1230_a_, the second deposited layer 1230_b_, the third deposited layer 1230_c_, and/or a common electrode. In some non-limiting examples, the thickness of the at least one auxiliary electrode 2450 may exceed at least one of about: 50 nm, 80 nm, 100 nm, 150 nm, 200 nm, 300 nm, 400 nm, 500 nm, 700 nm, 800 nm, 1 μm, 1.2 μm, 1.5 μm, 2 μm, 2.5 μm, or 3 μm.

In some non-limiting examples, the at least one auxiliary electrode 2450 may be substantially non-transparent, and/or opaque. However, since the at least one auxiliary electrode 2450 may be, in some non-limiting examples, provided in a non-emissive region 2302 of the device 3300, the at least one auxiliary electrode 2450 may not cause or contribute to significant optical interference. In some non-limiting examples, the transmittance of the at least one auxiliary electrode 2450 may be no more than at least one of about: 50%, 70%, 80%, 85%, 90%, or 95% in at least a part of the visible spectrum.

In some non-limiting examples, the at least one auxiliary electrode 2450 may absorb EM radiation in at least a part of the visible spectrum.

In some non-limiting examples, an average layer thickness of the first patterning coating 420_a_, the second patterning coating 420_b_, and/or the third patterning coating 420_c_ disposed in the first emissive region 910_a_, the second emissive region 910_b_, and/or the third emissive region 910_c_ respectively, may be varied according to a colour, and/or emission spectrum of EM radiation emitted by each emissive region 910. In some non-limiting examples, the first patterning coating 420_a_ may have a first patterning coating thickness $t_{n1}$, the second patterning coating 420_b_ may have a second patterning coating thickness $t_{n2}$, and/or the third patterning coating 420_c_ may have a third patterning coating thickness $t_{n3}$. In some non-limiting examples, the first patterning coating thickness $t_{n1}$, the second patterning coating thickness $t_{n2}$, and/or the third patterning coating thickness $t_{n3}$, may be substantially the same. In some non-limiting examples, the first patterning coating thickness $t_{n1}$, the second patterning coating thickness $t_{n2}$, and/or the third patterning coating thickness $t_{n3}$, may be different from one another.

In some non-limiting examples, the device 3300 may also comprise any number of emissive regions 910_a_-910_c_, and/or (sub-)pixel(s) 3110/264_x_ thereof. In some non-limiting examples, a device may comprise a plurality of pixels 3110, wherein each pixel 3110 comprises two, three or more sub-pixel(s) 264*x*.

Those having ordinary skill in the relevant art will appreciate that the specific arrangement of (sub-)pixel(s) 3110/264*x* may be varied depending on the device design. In some non-limiting examples, the sub-pixel(s) 264*x* may be arranged according to known arrangement schemes, including without limitation, RGB side-by-side, diamond, and/or PenTile®.

Figure 34:
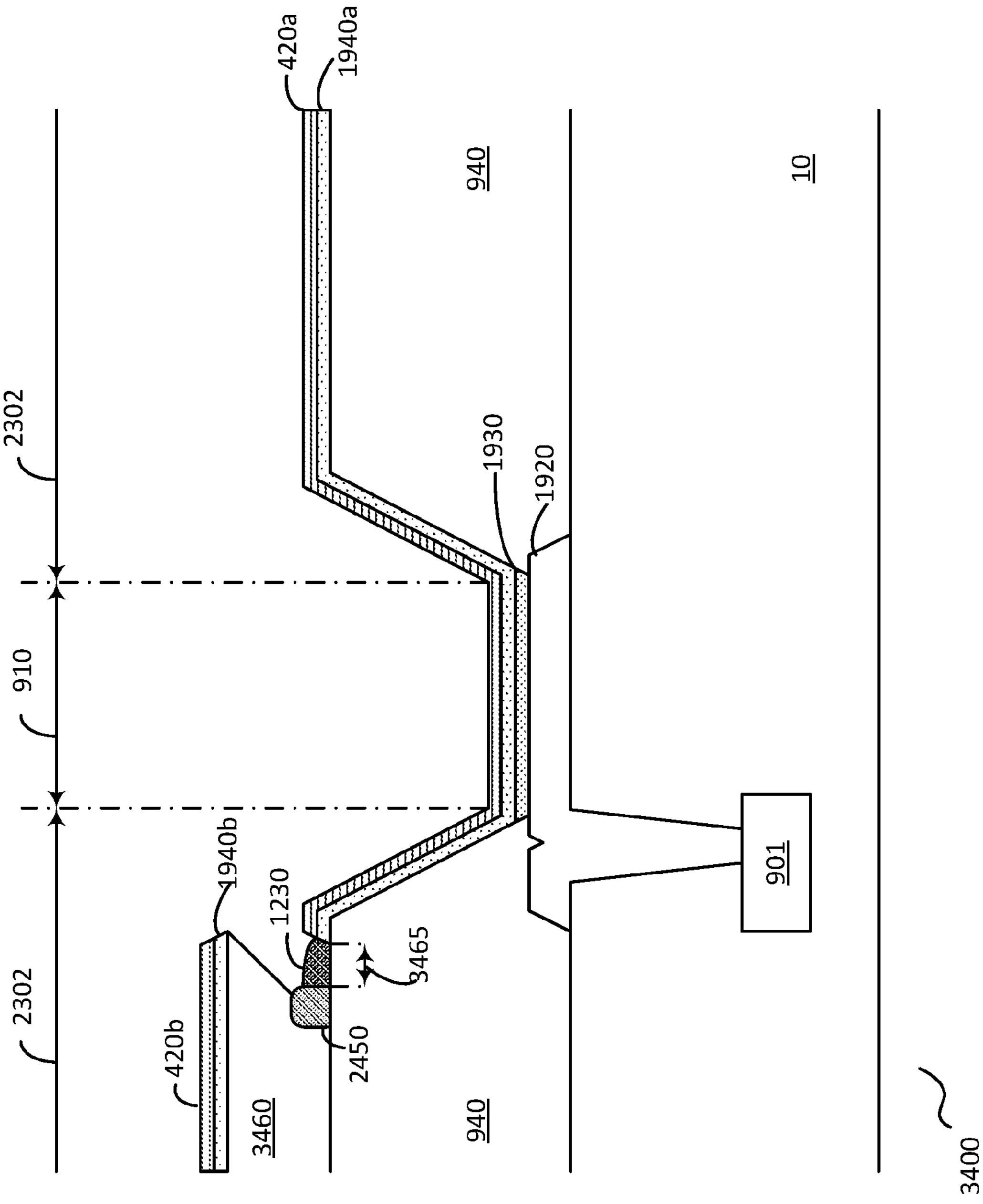
FIG. 34 is a schematic diagram illustrating an example cross-sectional view of an example version of the device of FIG. 19 in which a second electrode is coupled with an auxiliary electrode according to an example in the present disclosure.

Conductive Coating for Electrically Coupling an Electrode to an Auxiliary Electrode Turning to FIG. 34, there may be shown a cross-sectional view of an example version 3400 of the device 1900. The device 3400 may comprise in a lateral aspect, an emissive region 910 and an adjacent non-emissive region 2302.

In some non-limiting examples, the emissive region 910 may correspond to a sub-pixel 264*x* of the device 3400. The emissive region 910 may have a substrate 10, a first electrode 1920, a second electrode 1940 and at least one semiconducting layer 1930 arranged therebetween.

The first electrode 1920 may be disposed on an exposed layer surface 11 of the substrate 10. The substrate 10 may comprise a TFT structure 901, that may be electrically coupled with the first electrode 1920. The edges, and/or perimeter of the first electrode 1920 may generally be covered by at least one PDL 940.

The non-emissive region 2302 may have an auxiliary electrode 2450 and a first part of the non-emissive region 2302 may have a projecting structure 3460 arranged to project over and overlap a lateral aspect of the auxiliary electrode 2450. The projecting structure 3460 may extend laterally to provide a sheltered region 3465. By way of non-limiting example, the projecting structure 3460 may be recessed at, and/or near the auxiliary electrode 2450 on at least one side to provide the sheltered region 3465. As shown, the sheltered region 3465 may in some non-limiting examples, correspond to a region on a surface of the PDL 940 that may overlap with a lateral projection of the projecting structure 3460. The non-emissive region 2302 may further comprise a deposited layer 1230 disposed in the sheltered region 3465. The deposited layer 1230 may electrically couple the auxiliary electrode 2450 with the second electrode 1940.

A patterning coating 420*a* may be disposed in the emissive region 910 over the exposed layer surface 11 of the second electrode 1940. In some non-limiting examples, an exposed layer surface 11 of the projecting structure 3460 may be coated with a residual thin conductive film from deposition of a thin conductive film to form a second electrode 1940. In some non-limiting examples, an exposed layer surface 11 of the residual thin conductive film may be coated with a residual patterning coating 420*b* from deposition of the patterning coating 420.

However, because of the lateral projection of the projecting structure 3460 over the sheltered region 3465, the sheltered region 3465 may be substantially devoid of patterning coating 420. Thus, when a deposited layer 1230 may be deposited on the device 3400 after deposition of the patterning coating 420, the deposited layer 1230 may be deposited on, and/or migrate to the sheltered region 3465 to couple the auxiliary electrode 2450 to the second electrode 1940.

Those having ordinary skill in the relevant art will appreciate that a non-limiting example has been shown in FIG. 34 and that various modifications may be apparent. By way of non-limiting example, the projecting structure 3460 may provide a sheltered region 3465 along at least two of its sides. In some non-limiting examples, the projecting structure 3460 may be omitted and the auxiliary electrode 2450 may comprise a recessed portion that may define the sheltered region 3465. In some non-limiting examples, the auxiliary electrode 2450 and the deposited layer 1230 may be disposed directly on a surface of the substrate 10, instead of the PDL 940.

Selective Deposition of Optical Coating

In some non-limiting examples, a device (not shown), which in some non-limiting examples may be an opto-electronic device, may comprise a substrate 10, a patterning coating 420 and an optical coating. The patterning coating 420 may cover, in a lateral aspect, a first lateral portion 601 of the substrate 10. The optical coating may cover, in a lateral aspect, a second lateral portion 602 of the substrate 10. At least a part of the patterning coating 420 may be substantially devoid of a closed coating 1240 of the optical coating.

In some non-limiting examples, the optical coating may be used to modulate optical properties of EM radiation being transmitted, emitted, and/or absorbed by the device, including without limitation, plasmon modes. By way of non-limiting example, the optical coating may be used as an optical filter, index-matching coating, optical outcoupling coating, scattering layer, diffraction grating, and/or parts thereof.

In some non-limiting examples, the optical coating may be used to modulate at least one optical microcavity effect in the device by, without limitation, tuning the total optical path length, and/or the refractive index thereof. At least one optical property of the device may be affected by modulating at least one optical microcavity effect including without limitation, the output EM radiation, including without limitation, an angular dependence of an intensity thereof, and/or a wavelength shift thereof. In some non-limiting examples, the optical coating may be a non-electrical component, that is, the optical coating may not be configured to conduct, and/or transmit electrical current during normal device operations.

In some non-limiting examples, the optical coating may be formed of any deposited material 1631, and/or may employ any mechanism of depositing a deposited layer 1230 as described herein.

Partition and Recess

Figure 35:
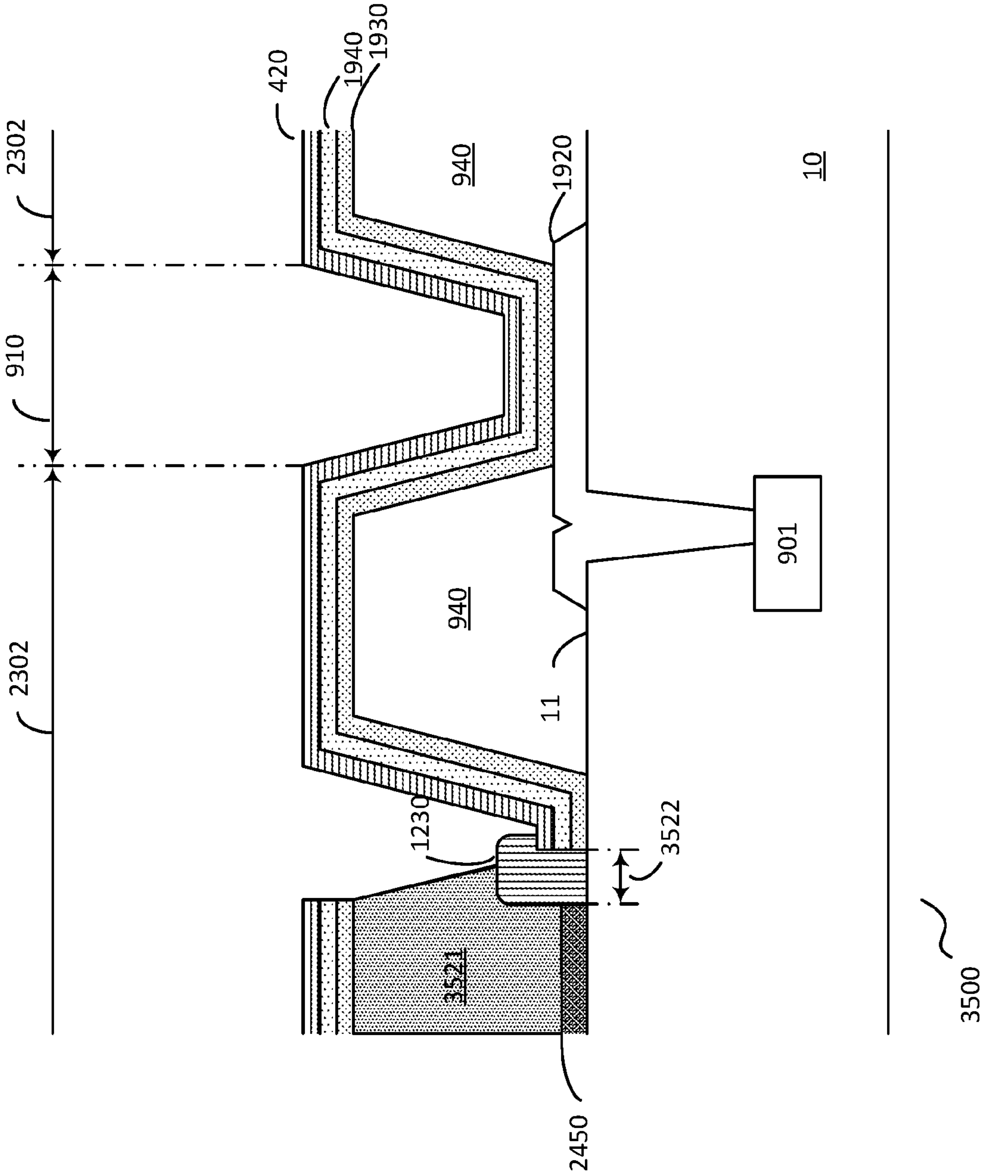
FIG. 35 is a schematic diagram illustrating an example cross-sectional view of an example version of the device of FIG. 19 having a partition and a sheltered region, such as a recess, in a non-emissive region thereof according to an example in the present disclosure.

Turning to FIG. 35, there may be shown a cross-sectional view of an example version 3500 of the device 1900. The device 3500 may comprise a substrate 10 having an exposed layer surface 11. The substrate 10 may comprise at least one TFT structure 901. By way of non-limiting example, the at least one TFT structure 901 may be formed by depositing and patterning a series of thin films when fabricating the substrate 10, in some non-limiting examples, as described herein.

The device 3500 may comprise, in a lateral aspect, an emissive region 910 having an associated lateral aspect 2010 and at least one adjacent non-emissive region 2302, each having an associated lateral aspect 2020. The exposed layer surface 11 of the substrate 10 in the emissive region 910 may be provided with a first electrode 1920, that may be electrically coupled with the at least one TFT structure 901. A PDL 940 may be provided on the exposed layer surface 11, such that the PDL 940 covers the exposed layer surface 11 as well as at least one edge, and/or perimeter of the first electrode 1920. The PDL 940 may, in some non-limiting examples, be provided in the lateral aspect 2020 of the non-emissive region 2302. The PDL 940 may define a valley-shaped configuration that may provide an opening that generally may correspond to the lateral aspect 2010 of the emissive region 910 through which a layer surface of the first electrode 1920 may be exposed. In some non-limiting examples, the device 3500 may comprise a plurality of such openings defined by the PDLs 940, each of which may correspond to a (sub-)pixel 3110/264*x* region of the device 3500.

As shown, in some non-limiting examples, a partition 3521 may be provided on the exposed layer surface 11 in the lateral aspect 2020 of a non-emissive region 2302 and, as described herein, may define a sheltered region 3465, such as a recess 3522. In some non-limiting examples, the recess 3522 may be formed by an edge of a lower section of the partition 3521 being recessed, staggered, and/or offset with respect to an edge of an upper section of the partition 3521 that may overlap, and/or project beyond the recess 3522.

In some non-limiting examples, the lateral aspect 2010 of the emissive region 910 may comprise at least one semiconducting layer 1930 disposed over the first electrode 1920, a second electrode 1940, disposed over the at least one semiconducting layer 1930, and a patterning coating 420 disposed over the second electrode 1940. In some non-limiting examples, the at least one semiconducting layer 1930, the second electrode 1940 and the patterning coating 420 may extend laterally to cover at least the lateral aspect 2020 of a part of at least one adjacent non-emissive region 2302. In some non-limiting examples, as shown, the at least one semiconducting layer 1930, the second electrode 1940 and the patterning coating 420 may be disposed on at least a part of at least one PDL 940 and at least a part of the partition 3521. Thus, as shown, the lateral aspect 2010 of the emissive region 910, the lateral aspect 2020 of a part of at least one adjacent non-emissive region 2302, a part of at least one PDL 940, and at least a part of the partition 3521, together may make up a first portion 601, in which the second electrode 1940 may lie between the patterning coating 420 and the at least one semiconducting layer 1930.

An auxiliary electrode 2450 may be disposed proximate to, and/or within the recess 3522 and a deposited layer 1230 may be arranged to electrically couple the auxiliary electrode 2450 with the second electrode 1940. Thus as shown, in some non-limiting examples, the recess 3522 may comprise a second portion 602, in which the deposited layer 1230 is disposed on the exposed layer surface 11.

In some non-limiting examples, in depositing the deposited layer 1230, at least a part of the evaporated flux 1632 of the deposited material 1631 may be directed at a non-normal angle relative to a lateral plane of the exposed layer surface 11. By way of non-limiting example, at least a part of the evaporated flux 1632 may be incident on the device 3500 at a non-zero angle of incidence that is, relative to such lateral plane of the exposed layer surface 11, no more than at least one of about: 90°, 85°, 80°, 75°, 70°, 60°, or 50°. By directing an evaporated flux 1632 of a deposited material 1631, including at least a part thereof incident at a non-normal angle, at least one exposed layer surface 11 of, and/or in the recess 3522 may be exposed to such evaporated flux 1632.

In some non-limiting examples, a likelihood of such evaporated flux 1632 being precluded from being incident onto at least one exposed layer surface 11 of, and/or in the recess 3522 due to the presence of the partition 3521, may be reduced since at least a part of such evaporated flux 1632 may be flowed at a non-normal angle of incidence.

In some non-limiting examples, at least a part of such evaporated flux 1632 may be non-collimated. In some non-limiting examples, at least a part of such evaporated flux 1632 may be generated by an evaporation source that is a point source, a linear source, and/or a surface source.

In some non-limiting examples, the device 3500 may be displaced during deposition of the deposited layer 1230. By way of non-limiting example, the device 3500, and/or the substrate 10 thereof, and/or any layer(s) deposited thereon, may be subjected to a displacement that is angular, in a lateral aspect, and/or in an aspect substantially parallel to the cross-sectional aspect.

In some non-limiting examples, the device 3500 may be rotated about an axis that substantially normal to the lateral plane of the exposed layer surface 11 while being subjected to the evaporated flux 1632.

In some non-limiting examples, at least a part of such evaporated flux 1632 may be directed toward the exposed layer surface 11 of the device 3500 in a direction that is substantially normal to the lateral plane of the exposed layer surface 11.

Without wishing to be bound by a particular theory, it may be postulated that the deposited material 1631 may nevertheless be deposited within the recess 3522 due to lateral migration, and/or desorption of adatoms adsorbed onto the exposed layer surface 11 of the patterning coating 420. In some non-limiting examples, it may be postulated that any adatoms adsorbed onto the exposed layer surface 11 of the patterning coating 420 may tend to migrate, and/or desorb from such exposed layer surface 11 due to unfavorable thermodynamic properties of the exposed layer surface 11 for forming a stable nucleus. In some non-limiting examples, it may be postulated that at least some of the adatoms migrating, and/or desorbing off such exposed layer surface 11 may be re-deposited onto the surfaces in the recess 3522 to form the deposited layer 1230.

In some non-limiting examples, the deposited layer 1230 may be formed such that the deposited layer 1230 may be electrically coupled with both the auxiliary electrode 2450 and the second electrode 1940. In some non-limiting examples, the deposited layer 1230 may be in physical contact with at least one of the auxiliary electrode 2450, and/or the second electrode 1940. In some non-limiting examples, an intermediate layer may be present between the deposited layer 1230 and at least one of the auxiliary electrode 2450, and/or the second electrode 1940. However, in such example, such intermediate layer may not substantially preclude the deposited layer 1230 from being electrically coupled with the at least one of the auxiliary electrode 2450, and/or the second electrode 1940. In some non-limiting examples, such intermediate layer may be relatively thin and be such as to permit electrical coupling therethrough. In some non-limiting examples, a sheet resistance of the deposited layer 1230 may be no more than a sheet resistance of the second electrode 1940.

As shown in FIG. 35, the recess 3522 may be substantially devoid of the second electrode 1940. In some non-limiting examples, during the deposition of the second electrode 1940, the recess 3522 may be masked, by the partition 3521, such that the evaporated flux 1632 of the deposited material 1631 for forming the second electrode 1940 may be substantially precluded from being incident on at least one exposed layer surface 11 of, and/or in, the recess 3522. In some non-limiting examples, at least a part of the evaporated flux 1632 of the deposited material 1631 for forming the second electrode 1940 may be incident on at least one exposed layer surface 11 of, and/or in, the recess 3522, such that the second electrode 1940 may extend to cover at least a part of the recess 3522.

In some non-limiting examples, the auxiliary electrode 2450, the deposited layer 1230, and/or the partition 3521 may be selectively provided in certain region(s) of a display panel 710. In some non-limiting examples, any of these features may be provided at, and/or proximate to, at least one edge of such display panel for electrically coupling at least one element of the frontplane 1910, including without limitation, the second electrode 1940, to at least one element of the backplane 1915. In some non-limiting examples, providing such features at, and/or proximate to, such edges may facilitate supplying and distributing electrical current to the second electrode 1940 from an auxiliary electrode 2450 located at, and/or proximate to, such edges. In some non-limiting examples, such configuration may facilitate reducing a bezel size of the display panel.

In some non-limiting examples, the auxiliary electrode 2450, the deposited layer 1230, and/or the partition 3521 may be omitted from certain regions(s) of such display panel 710. In some non-limiting examples, such features may be omitted from parts of the display panel 710, including without limitation, where a relatively high pixel density may be provided, other than at, and/or proximate to, at least one edge thereof.

Aperture in Non-Emissive Region

Figure 36A:
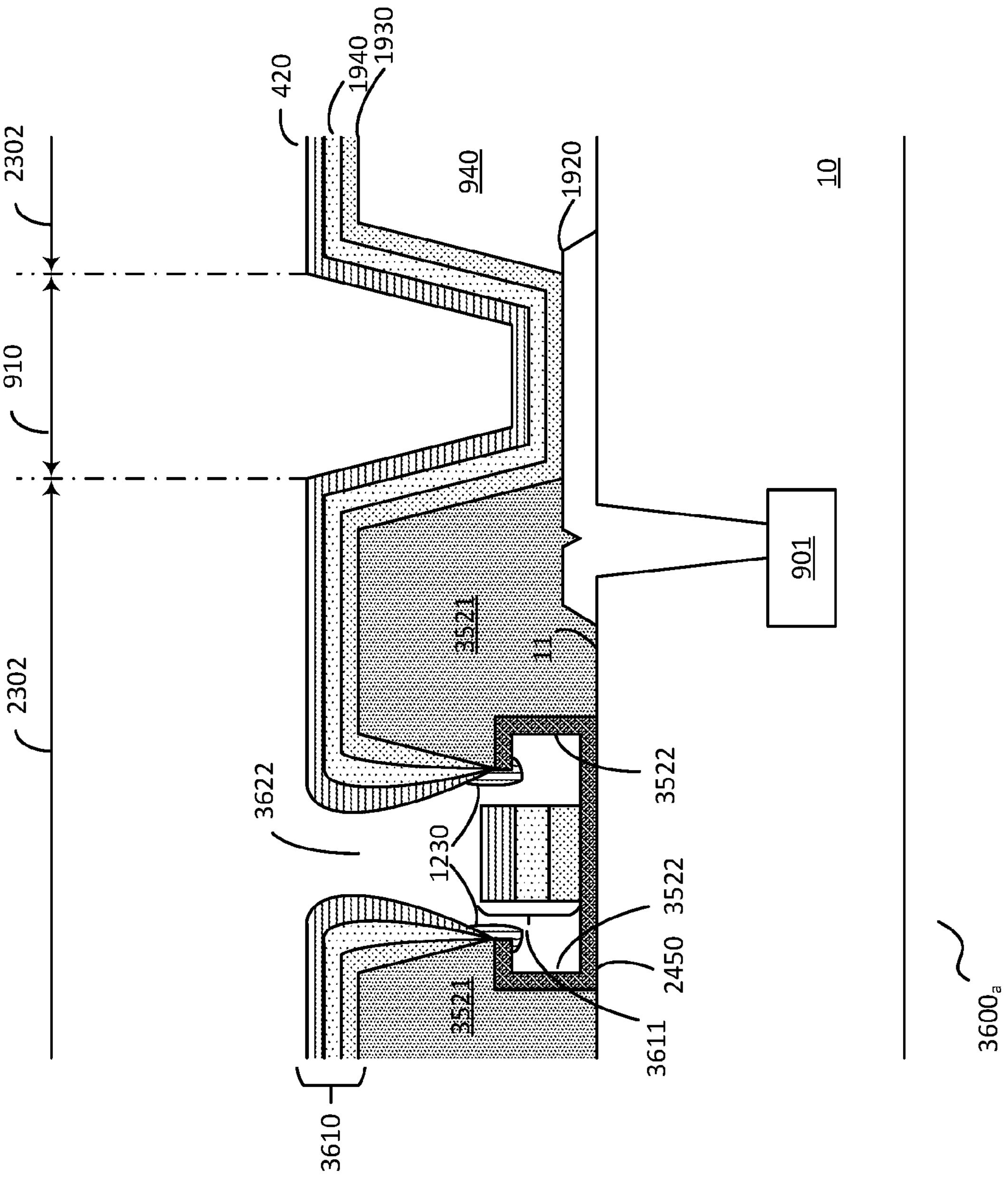
FIGS. 36A-36B are schematic diagrams that show example cross-sectional views of an example version of the device of FIG. 19 having a partition and a sheltered region, such as an aperture, in a non-emissive region, according to various examples in the present disclosure.

Turning now to FIG. 36A, there may be shown a cross-sectional view of an example version 3600$_a$ of the device 1900. The device 3600$_a$ may differ from the device 3500 in that a pair of partitions 3521 in the non-emissive region 2302 may be disposed in a facing arrangement to define a sheltered region 3465, such as an aperture 3622, therebetween. As shown, in some non-limiting examples, at least one of the partitions 3521 may function as a PDL 940 that covers at least an edge of the first electrode 1920 and that defines at least one emissive region 910. In some non-limiting examples, at least one of the partitions 3521 may be provided separately from a PDL 940.

A sheltered region 3465, such as the recess 3522, may be defined by at least one of the partitions 3521. In some non-limiting examples, the recess 3522 may be provided in a part of the aperture 3622 proximal to the substrate 10. In some non-limiting examples, the aperture 3622 may be substantially elliptical when viewed in plan. In some non-limiting examples, the recess 3522 may be substantially annular when viewed in plan and surround the aperture 3622.

In some non-limiting examples, the recess 3522 may be substantially devoid of materials for forming each of the layers of a device stack 3610, and/or of a residual device stack 3611.

In these figures, a device stack 3610 may be shown comprising the at least one semiconducting layer 1930, the second electrode 1940 and the patterning coating 420 deposited on an upper section of the partition 3521.

In these figures, a residual device stack 3611 may be shown comprising the at least one semiconducting layer 1930, the second electrode 1940 and the patterning coating 420 deposited on the substrate 10 beyond the partition 3521 and recess 3522. From comparison with FIG. 35, it may be seen that the residual device stack 3611 may, in some non-limiting examples, correspond to the semiconductor layer 1930, second electrode 1940 and the patterning coating 420 as it approaches the recess 3522 at, and/or proximate to, a lip of the partition 3521. In some non-limiting examples, the residual device stack 3611 may be formed when an open mask and/or mask-free deposition process is used to deposit various materials of the device stack 3610.

In some non-limiting examples, the residual device stack 3611 may be disposed within the aperture 3622. In some non-limiting examples, evaporated materials for forming each of the layers of the device stack 3610 may be deposited within the aperture 3622 to form the residual device stack 3611 therein.

In some non-limiting examples, the auxiliary electrode 2450 may be arranged such that at least a part thereof is disposed within the recess 3622. As shown, in some non-limiting examples, the auxiliary electrode 2450 may be arranged within the aperture 3622, such that the residual device stack 3611 is deposited onto a surface of the auxiliary electrode 2450.

A deposited layer 1230 may be disposed within the aperture 3622 for electrically coupling the second electrode 1940 with the auxiliary electrode 2450. By way of non-limiting example, at least a part of the deposited layer 1230 may be disposed within the recess 3522.

Figure 36B:
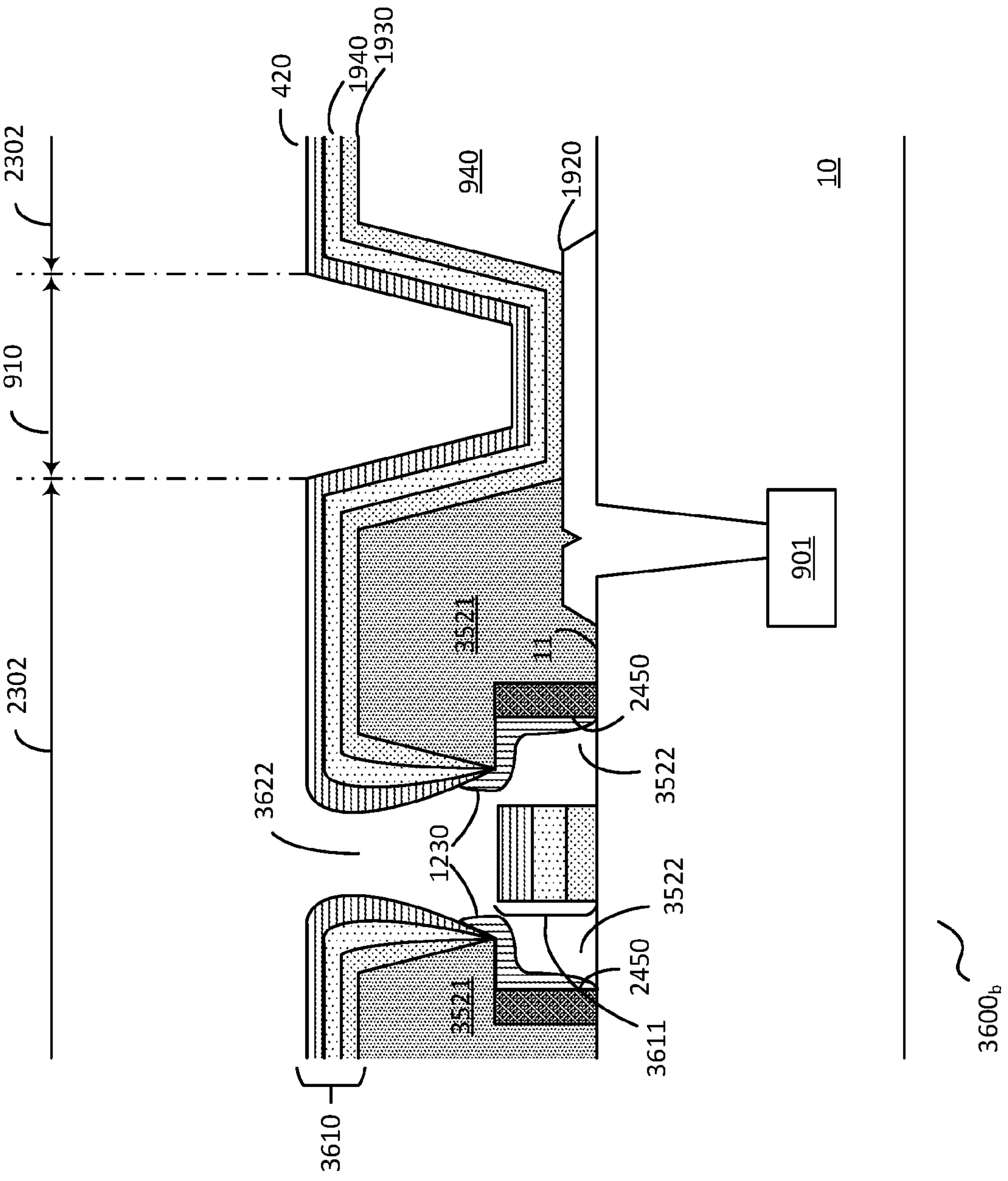

Turning now to FIG. 36B, there may be shown a cross-sectional view of a further example of the device 3600$_b$. As shown, the auxiliary electrode 2450 may be arranged to form at least a part of a side of the partition 3521. As such, the auxiliary electrode 2450 may be substantially annular, when viewed in plan view, and may surround the aperture 3622. As shown, in some non-limiting examples, the residual device stack 3611 may be deposited onto an exposed layer surface 11 of the substrate 10.

In some non-limiting examples, the partition 3521 may comprise, and/or be formed by, an NPC 1820. By way of non-limiting example, the auxiliary electrode 2450 may act as an NPC 1820.

In some non-limiting examples, the NPC 1820 may be provided by the second electrode 1940, and/or a portion, layer, and/or material thereof. In some non-limiting examples, the second electrode 1940 may extend laterally to cover the exposed layer surface 11 arranged in the sheltered region 3465. In some non-limiting examples, the second electrode 1940 may comprise a lower layer thereof and a second layer thereof, wherein the second layer thereof may be deposited on the lower layer thereof. In some non-limiting examples, the lower layer of the second electrode 1940 may comprise an oxide such as, without limitation, ITO, IZO, or ZnO. In some non-limiting examples, the upper layer of the second electrode 1940 may comprise a metal such as, without limitation, at least one of Ag, Mg, Mg:Ag, Yb/Ag, other alkali metals, and/or other alkali earth metals.

In some non-limiting examples, the lower layer of the second electrode 1940 may extend laterally to cover a surface of the sheltered region 3465, such that it forms the NPC 1820. In some non-limiting examples, at least one surface defining the sheltered region 3465 may be treated to form the NPC 1820. In some non-limiting examples, such NPC 1820 may be formed by chemical, and/or physical treatment, including without limitation, subjecting the surface(s) of the sheltered region 3465 to a plasma, UV, and/or UV-ozone treatment.

Without wishing to be bound to any particular theory, it may be postulated that such treatment may chemically, and/or physically alter such surface(s) to modify at least one property thereof. By way of non-limiting example, such treatment of the surface(s) may increase a concentration of C—O, and/or C—OH bonds on such surface(s), may increase a roughness of such surface(s), and/or may increase a concentration of certain species, and/or functional groups, including without limitation, halogens, nitrogen-containing functional groups, and/or oxygen-containing functional groups to thereafter act as an NPC 1820.

Diffraction Reduction

It has been discovered that, in some non-limiting examples, the at least one EM signal 731 passing through the at least one signal transmissive region 820 may be impacted by a diffraction characteristic of a diffraction pattern imposed by a shape of the at least one signal transmissive region 820.

At least in some non-limiting examples, a display panel 710 that causes at least one EM signal 731 to pass through the at least one signal transmissive region 820 that is shaped to exhibit a distinctive and non-uniform diffraction pattern, may interfere with the capture of an image and/or EM radiation pattern represented thereby.

By way of non-limiting example, such diffraction pattern may interfere with an ability to facilitate mitigating interference by such diffraction pattern, that is, to permit an under-display component 730 to be able to accurately receive and process such image or pattern, even with the application of optical post-processing techniques, or to allow a viewer of such image and/or pattern through such display panel 710 to discern information contained therein.

In some non-limiting examples, a distinctive and/or non-uniform diffraction pattern may result from a shape of the at least one signal transmissive region 820 that may cause distinct and/or angularly separated diffraction spikes in the diffraction pattern.

In some non-limiting examples, a first diffraction spike may be distinguished from a second proximate diffraction spike by simple observation, such that a total number of diffraction spikes along a full angular revolution may be counted. However, in some non-limiting examples, especially where the number of diffraction spikes is large, it may be more difficult to identify individual diffraction spikes. In such circumstances, the distortion effect of the resulting diffraction pattern may in fact facilitate mitigation of the interference caused thereby, since the distortion effect tends to be blurred and/or distributed more evenly. Such blurring and/or more even distribution of the distortion effect may, in some non-limiting examples, be more amenable to mitigation, including without limitation, by optical post-processing techniques, in order to recover the original image and/or information contained therein.

In some non-limiting examples, an ability to facilitate mitigation of the interference caused by the diffraction pattern may increase as the number of diffraction spikes increases.

In some non-limiting examples, a distinctive and non-uniform diffraction pattern may result from a shape of the at least one signal transmissive region 820 that increase a length of a pattern boundary within the diffraction pattern between region(s) of high intensity of EM radiation and region(s) of low intensity of EM radiation as a function of a pattern circumference of the diffraction pattern and/or that reduces a ratio of the pattern circumference relative to the length of the pattern boundary thereof.

Without wishing to be bound by any specific theory, it may be postulated that display panels 710 having closed boundaries of light transmissive regions 820 defined by a corresponding signal transmissive region 820 that are polygonal may exhibit a distinctive and non-uniform diffraction pattern that may adversely impact an ability to facilitate mitigation of interference caused by the diffraction pattern, relative to a display panel 710 having closed boundaries of light transmissive regions 820 defined by a corresponding signal transmissive region 820 that is non-polygonal.

In the present disclosure, the term "polygonal" may refer generally to shapes, figures, closed boundaries, and/or perimeters formed by a finite number of linear and/or straight segments and the term "non-polygonal" may refer generally to shapes, figures, closed boundaries, and/or perimeters that are not polygonal. By way of non-limiting example, a closed boundary formed by a finite number of linear segments and at least one non-linear or curved segment may be considered non-polygonal.

Without wishing to be bound by a particular theory, it may be postulated that when a closed boundary of an EM radiation transmissive region 820 defined by a corresponding signal transmissive region 820 comprises at least one non-linear and/or curved segment, EM signals incident thereon and transmitted therethrough may exhibit a less distinctive and/or more uniform diffraction pattern that facilitates mitigation of interference caused by the diffraction pattern.

In some non-limiting examples, a display panel 710 having a closed boundary of the EM radiation transmissive regions 820 defined by a corresponding signal transmissive region 820 that is substantially elliptical and/or circular may further facilitate mitigation of interference caused by the diffraction pattern.

In some non-limiting examples, a signal transmissive region 820 may be defined by a finite plurality of convex rounded segments. In some non-limiting examples, at least some of these segments coincide at a concave notch or peak.

Removal of Selective Coating

In some non-limiting examples, the patterning coating 420 may be removed after deposition of the deposited layer 1230, such that at least a part of a previously exposed layer surface 11 of an underlying material covered by the patterning coating 420 may become exposed once again. In some non-limiting examples, the patterning coating 420 may be selectively removed by etching, and/or dissolving the patterning coating 420, and/or by employing plasma, and/or solvent processing techniques that do not substantially affect or erode the deposited layer 1230.

Figures 37A, 37B, 37C:
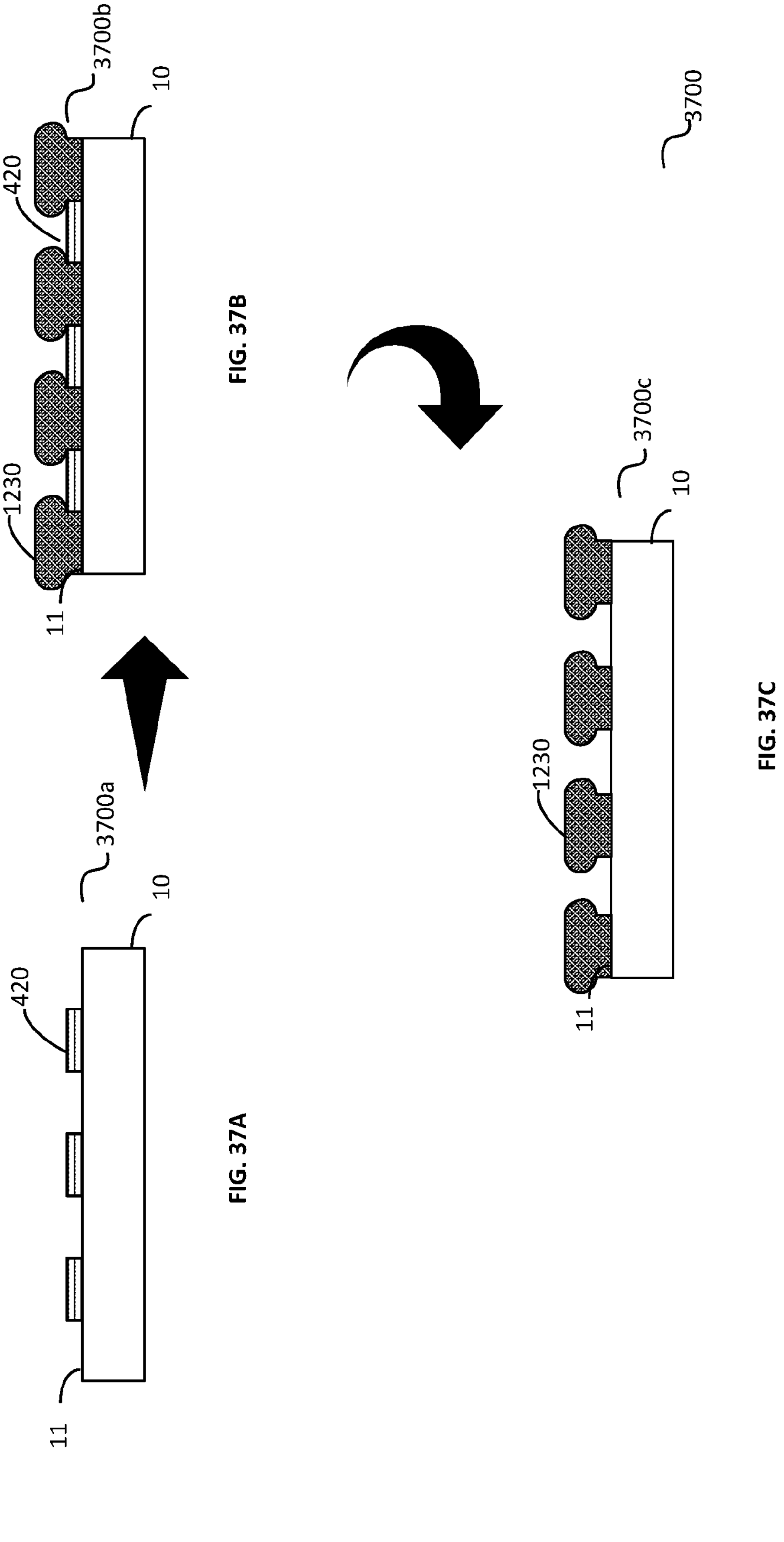
FIGS. 37A-37C are schematic diagrams that show example stages of an example process for depositing a deposited layer in a pattern on an exposed layer surface of an example version of the device of FIG. 19 by selective deposition and subsequent removal process, according to an example in the present disclosure.

Turning now to FIG. 37A, there may be shown an example cross-sectional view of an example version 3700 of the device 1900, at a deposition stage 3700*a*, in which a patterning coating 420 may have been selectively deposited on a first portion 601 of an exposed layer surface 11 of an underlying material. In the figure, the underlying material may be the substrate 10.

In FIG. 37B, the device 3700 may be shown at a deposition stage 3700*b*, in which a deposited layer 1230 may be deposited on the exposed layer surface 11 of the underlying material, that is, on both the exposed layer surface 11 of patterning coating 420 where the patterning coating 420 may have been deposited during the stage 3700*a*, as well as the exposed layer surface 11 of the substrate 10 where that patterning coating 420 may not have been deposited during the stage 3700*a*. Because of the nucleation-inhibiting properties of the first portion 601 where the patterning coating 420 may have been disposed, the deposited layer 1230 disposed thereon may tend to not remain, resulting in a pattern of selective deposition of the deposited layer 1230, that may correspond to a second portion 602, leaving the first portion 601 substantially devoid of the deposited layer 1230.

In FIG. 37C, the device 3700 may be shown at a deposition stage 3700*c*, in which the patterning coating 420 may have been removed from the first portion 601 of the exposed layer surface 11 of the substrate 10, such that the deposited layer 1230 deposited during the stage 3700*b* may remain on the substrate 10 and regions of the substrate 10 on which the patterning coating 420 may have been deposited during the stage 3700*a* may now be exposed or uncovered.

In some non-limiting examples, the removal of the patterning coating 420 in the stage 3700*c* may be effected by exposing the device 3700 to a solvent, and/or a plasma that reacts with, and/or etches away the patterning coating 420 without substantially impacting the deposited layer 1230.

Thin Film Formation

The formation of thin films during vapor deposition on an exposed layer surface 11 of an underlying layer may involve processes of nucleation and growth.

During initial stages of film formation, a sufficient number of vapor monomers 1632 which in some non-limiting examples may be molecules, and/or atoms of a deposited material 1631 in vapor form 1632) may typically condense from a vapor phase to form initial nuclei on the exposed layer surface 11 presented of an underlying layer. As vapor monomers 1632 may impinge on such surface, a characteristic size, and/or deposited density of these initial nuclei may increase to form small particle structures 131. Non-limiting examples of a dimension to which such characteristic size refers may include a height, width, length, and/or diameter of such particle structure 131.

After reaching a saturation island density, adjacent particle structures 131 may typically start to coalesce, increasing an average characteristic size of such particle structures 131, while decreasing a deposited density thereof.

With continued vapor deposition of monomers 1632, coalescence of adjacent particle structures 131 may continue until a substantially closed coating 1240 may eventually be deposited on an exposed layer surface 11 of an underlying layer. The behaviour, including optical effects caused thereby, of such closed coatings 1240 may be generally relatively uniform, consistent, and unsurprising.

There may be at least three basic growth modes for the formation of thin films, in some non-limiting examples, culminating in a closed coating 1240: 1) island (Volmer-Weber), 2) layer-by-layer (Frank-van der Merwe), and 3) Stranski-Krastanov.

Island growth may typically occur when stale clusters of monomers 1632 nucleate on an exposed layer surface 11 and grow to form discrete islands. This growth mode may occur when the interaction between the monomers 1632 is stronger than that between the monomers 1632 and the surface.

The nucleation rate may describe how many nuclei of a given size (where the free energy does not push a cluster of such nuclei to either grow or shrink) ("critical nuclei") may be formed on a surface per unit time. During initial stages of film formation, it may be unlikely that nuclei will grow from direct impingement of monomers 1632 on the surface, since the deposited density of nuclei is low, and thus the nuclei may cover a relatively small fraction of the surface (e.g., there are large gaps/spaces between neighboring nuclei). Therefore, the rate at which critical nuclei may grow may typically depend on the rate at which adatoms (e.g., adsorbed monomers 1632) on the surface migrate and attach to nearby nuclei.

Figure 38:
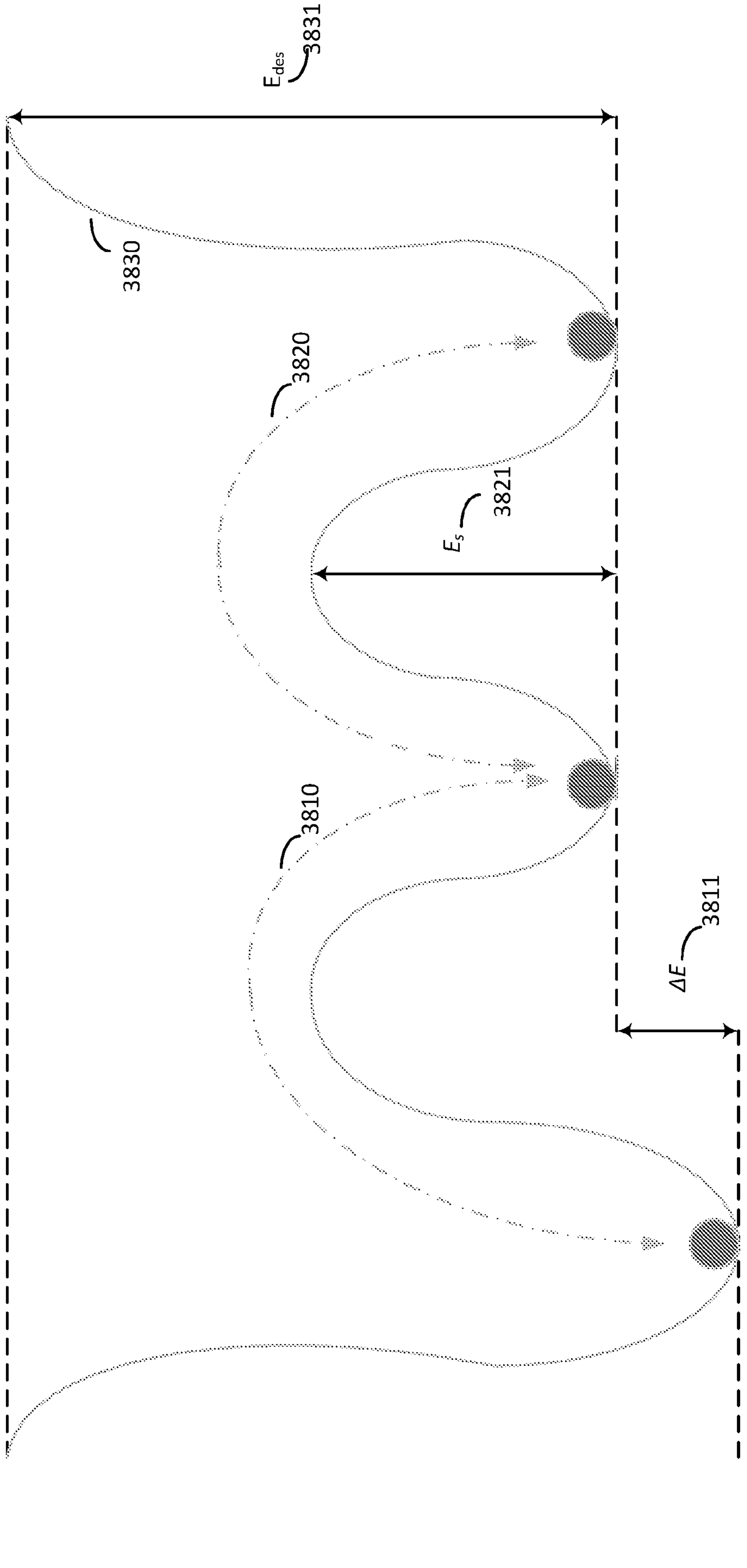
FIG. 38 is an example energy profile illustrating relative energy states of an adatom absorbed onto a surface according to an example in the present disclosure.

An example of an energy profile of an adatom adsorbed onto an exposed layer surface 11 of an underlying material is illustrated in FIG. 38. Specifically, FIG. 38 may illustrate example qualitative energy profiles corresponding to: an adatom escaping from a local low energy site (3810); diffusion of the adatom on the exposed layer surface 11 (3820); and desorption of the adatom (3830).

In 3810, the local low energy site may be any site on the exposed layer surface 11 of an underlying layer, onto which an adatom will be at a lower energy. Typically, the nucleation site may comprise a defect, and/or an anomaly on the exposed layer surface 11, including without limitation, a ledge, a step edge, a chemical impurity, a bonding site, and/or a kink ("heterogeneity").

Sites of substrate heterogeneity may increase an energy involved to desorb the adatom from the surface $E_{des}$ 3831, leading to a higher deposited density of nuclei observed at such sites. Also, impurities or contamination on a surface may also increase $E_{des}$ 3831, leading to a higher deposited density of nuclei. For vapor deposition processes, conducted under high vacuum conditions, the type and deposited density of contaminants on a surface may be affected by a vacuum pressure and a composition of residual gases that make up that pressure.

Once the adatom is trapped at the local low energy site, there may typically, in some non-limiting examples, be an energy barrier before surface diffusion takes place. Such energy barrier may be represented as ΔE 3811 in FIG. 38. In some non-limiting examples, if the energy barrier ΔE 3811 to escape the local low energy site is sufficiently large, the site may act as a nucleation site.

In 3820, the adatom may diffuse on the exposed layer surface 11. By way of non-limiting example, in the case of localized absorbates, adatoms may tend to oscillate near a minimum of the surface potential and migrate to various neighboring sites until the adatom is either desorbed, and/or is incorporated into growing islands 131 formed by a cluster of adatoms, and/or a growing film. In FIG. 38, the activation energy associated with surface diffusion of adatoms may be represented as $E_s$ 3811.

In 3830, the activation energy associated with desorption of the adatom from the surface may be represented as $E_{des}$ 3831. Those having ordinary skill in the relevant art will appreciate that any adatoms that are not desorbed may remain on the exposed layer surface 11. By way of non-limiting example, such adatoms may diffuse on the exposed layer surface 11, become part of a cluster of adatoms that form islands 131 on the exposed layer surface 11, and/or be incorporated as part of a growing film, and/or coating.

After adsorption of an adatom on a surface, the adatom may either desorb from the surface, or may migrate some distance on the surface before either desorbing, interacting with other adatoms to form a small cluster, or attaching to a growing nucleus. An average amount of time that an adatom may remain on the surface after initial adsorption may be given by:

$$\tau_s = 1/\nu \exp(E_{des}/kT) \qquad \text{(TF1)}$$

In the above equation:

v is a vibrational frequency of the adatom on the surface, k is the Botzmann constant, and T is temperature.

From Equation TF1 it may be noted that the lower the value of $E_{des}$ 3831, the easier it may be for the adatom to desorb from the surface, and hence the shorter the time the adatom may remain on the surface. A mean distance an adatom can diffuse may be given by, $$X = \alpha_0 \exp(E_{des} - E_s/2kT \qquad \text{(TF2)}$$

where:

$\alpha_0$ is a lattice constant.

For low values of $E_{des}$ 3831, and/or high values of $E_s$ 3821, the adatom may diffuse a shorter distance before desorbing, and hence may be less likely to attach to growing nuclei or interact with another adatom or cluster of adatoms.

During initial stages of formation of a deposited layer of particle structures 131, adsorbed adatoms may interact to form particle structures 131, with a critical concentration of particle structures 131 per unit area being given by, $$N_i/n_0=|N_1/n_0|^i \exp(E_i/kT) \quad \text{(TF3)}$$

where:

$E_i$ is an energy involved to dissociate a critical cluster containing i adatoms into separate adatoms, $n_0$ is a total deposited density of adsorption sites, and $N_1$ is a monomer deposited density given by:

$$N_1=\dot{R}\tau_s \quad \text{(TF4)}$$

where:

$\dot{R}$ is a vapor impingement rate.

Typically, i may depend on a crystal structure of a material being deposited and may determine a critical size of particle structures 131 to form a stable nucleus.

A critical monomer supply rate for growing particle structures 131 may be given by the rate of vapor impingement and an average area over which an adatom can diffuse before desorbing:

$$\dot{R}X^2 = \alpha_0^2 \exp\left(\frac{E_{des}-E_s}{kT}\right) \quad \text{(TF5)}$$

The critical nucleation rate may thus be given by the combination of the above equations:

$$\dot{N}_i = \dot{R}\alpha_0^2 n_0 \left(\frac{\dot{R}}{vn_0}\right)^i \exp\left(\frac{(i+1)E_{des}-E_s+E_i}{kT}\right) \quad \text{(TF6)}$$

From the above equation, it may be noted that the critical nucleation rate may be suppressed for surfaces that have a low desorption energy for adsorbed adatoms, a high activation energy for diffusion of an adatom, are at high temperatures, and/or are subjected to vapor impingement rates.

Under high vacuum conditions, a flux 1632 of molecules that may impinge on a surface (per $cm^2$-sec) may be given by:

$$\phi = 3.513 \times 10^{22} \frac{P}{MT} \quad \text{(TF7)}$$

where:

P is pressure, and

M is molecular weight.

Therefore, a higher partial pressure of a reactive gas, such as $H_2O$, may lead to a higher deposited density of contamination on a surface during vapor deposition, leading to an increase in Ede, 3831 and hence a higher deposited density of nuclei.

In the present disclosure, "nucleation-inhibiting" may refer to a coating, material, and/or a layer thereof, that may have a surface that exhibits an initial sticking probability against deposition of a deposited material 1631 thereon, that may be close to 0, including without limitation, less than about 0.3, such that the deposition of the deposited material 1631 on such surface may be inhibited.

In the present disclosure, "nucleation-promoting" may refer to a coating, material, and/or a layer thereof, that has a surface that exhibits an initial sticking probability against deposition of a deposited material 1631 thereon, that may be close to 1, including without limitation, greater than about 0.7, such that the deposition of the deposited material 1631 on such surface may be facilitated.

Without wishing to be bound by a particular theory, it may be postulated that the shapes and sizes of such nuclei and the subsequent growth of such nuclei into islands 131 and thereafter into a thin film may depend upon various factors, including without limitation, interfacial tensions between the vapor, the surface, and/or the condensed film nuclei.

One measure of a nucleation-inhibiting, and/or nucleation-promoting property of a surface may be the initial sticking probability of the surface against the deposition of a given deposited material 1631.

In some non-limiting examples, the sticking probability S may be given by:

$$S = \frac{N_{ads}}{N_{total}} \quad \text{(TF8)}$$

where:

$N_{ads}$ is a number of adatoms that remain on an exposed layer surface 11 (that is, are incorporated into a film), and $N_{total}$ is a total number of impinging monomers on the surface.

A sticking probability S equal to 1 may indicate that all monomers 1632 that impinge on the surface are adsorbed and subsequently incorporated into a growing film. A sticking probability S equal to 0 may indicate that all monomers 1632 that impinge on the surface are desorbed and subsequently no film may be formed on the surface.

A sticking probability S of a deposited material 1631 on various surfaces may be evaluated using various techniques of measuring the sticking probability Sc including without limitation, a dual quartz crystal microbalance (QCM) technique as described by Walker et al., *J. Phys. Chem. C* 2007, 111, 765 (2006).

As the deposited density of a deposited material 1631 may increase (e.g., increasing average film thickness), a sticking probability S may change.

An initial sticking probability $S_0$ may therefore be specified as a sticking probability S of a surface prior to the formation of any significant number of critical nuclei. One measure of an initial sticking probability $S_0$ may involve a sticking probability S of a surface against the deposition of a deposited material 1631 during an initial stage of deposition thereof, where an average film thickness of the deposited material 1631 across the surface is at or below a threshold value. In the description of some non-limiting examples a threshold value for an initial sticking probability may be specified as, by way of non-limiting example, 1 nm. An average sticking probability $\overline{S}$ may then be given by:

$$\overline{S}=S_0(1-A_{nuc})+S_{nuc}(A_{nuc}) \quad \text{(TF9)}$$

where:

$S_{nuc}$ is a sticking probability S of an area covered by particle structures 131, and $A_{nuc}$ is a percentage of an area of a substrate surface covered by particle structures 131.

By way of non-limiting example, a low initial sticking probability may increase with increasing average film thickness. This may be understood based on a difference in sticking probability between an area of an exposed layer surface 11 with no particle structures 131, by way of non-limiting example, a bare substrate 10, and an area with a high deposited density. By way of non-limiting example, a monomer 1632 that may impinge on a surface of a particle structure 131 may have a sticking probability that may approach 1.

Based on the energy profiles 3810, 3820, 3830 shown in FIG. 38, it may be postulated that materials that exhibit relatively low activation energy for desorption ($E_{des}$ 3831), and/or relatively high activation energy for surface diffusion ($E_s$ 3821), may be deposited as a patterning coating 420, and may be suitable for use in various applications.

Without wishing to be bound by a particular theory, it may be postulated that, in some non-limiting examples, the relationship between various interfacial tensions present during nucleation and growth may be dictated according to Young's equation in capillarity theory:

$$\gamma_{sv}=\gamma_{fs}+\gamma_{vf}\cos\theta \quad \text{(TF10)}$$

where:

- $\gamma_{sv}$ (FIG. 39) corresponds to the interfacial tension between the substrate 10 and vapor 1632,
- $\gamma_{fs}$ (FIG. 39) corresponds to the interfacial tension between the deposited material 1631 and the substrate 10,
- $\gamma_{vf}$ (FIG. 39) corresponds to the interfacial tension between the vapor 1632 and the film, and
- $\theta$ is the film nucleus contact angle.

Figure 39:
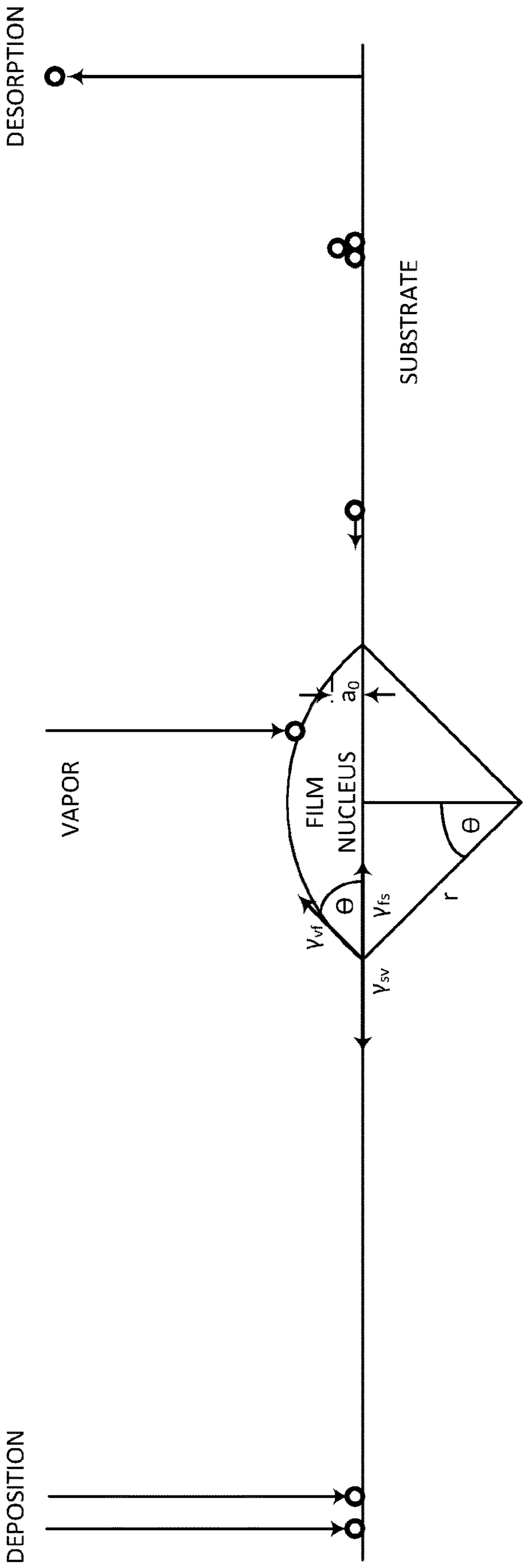
FIG. 39 is a schematic diagram illustrating the formation of a film nucleus according to an example in the present disclosure.

FIG. 39 may illustrate the relationship between the various parameters represented in this equation.

On the basis of Young's equation (Equation (TF10)), it may be derived that, for island growth, the film nucleus contact angle may exceed 0 and therefore: $\gamma_{sv}<\gamma_{fs}+\gamma_{vf}$.

For layer growth, where the deposited material 1631 may "wet" the substrate 10, the nucleus contact angle θ may be equal to 0, and therefore: $\gamma_{sv}=\gamma_{fs}+\gamma_{vf}$.

For Stranski-Krastanov growth, where the strain energy per unit area of the film overgrowth may be large with respect to the interfacial tension between the vapor 1632 and the deposited material 1631: $\gamma_{sv}>\gamma_{fs}+\gamma_{vf}$.

Without wishing to be bound by any particular theory, it may be postulated that the nucleation and growth mode of a deposited material 1631 at an interface between the patterning coating 420 and the exposed layer surface 11 of the substrate 10, may follow the island growth model, where $\theta>0$.

Particularly in cases where the patterning coating 420 may exhibit a relatively low initial sticking probability (in some non-limiting examples, under the conditions identified in the dual QCM technique described by Walker et. al) against deposition of the deposited material 1631, there may be a relatively high thin film contact angle of the deposited material 1631.

On the contrary, when a deposited material 1631 may be selectively deposited on an exposed layer surface 11 without the use of a patterning coating 420, by way of non-limiting example, by employing a shadow mask 1515, the nucleation and growth mode of such deposited material 1631 may differ. In particular, it has been observed that a coating formed using a shadow mask 1515 patterning process may, at least in some non-limiting examples, exhibit relatively low thin film contact angle of less than about 10°.

It has now been found, somewhat surprisingly, that in some non-limiting examples, a patterning coating 420 (and/or the patterning material 1511 of which it is comprised) may exhibit a relatively low critical surface tension.

Those having ordinary skill in the relevant art will appreciate that a "surface energy" of a coating, layer, and/or a material constituting such coating, and/or layer, may generally correspond to a critical surface tension of the coating, layer, and/or material. According to some models of surface energy, the critical surface tension of a surface may correspond substantially to the surface energy of such surface.

Generally, a material with a low surface energy may exhibit low intermolecular forces. Generally, a material with low intermolecular forces may readily crystallize or undergo other phase transformation at a lower temperature in comparison to another material with high intermolecular forces. In at least some applications, a material that may readily crystallize or undergo other phase transformations at relatively low temperatures may be detrimental to the long-term performance, stability, reliability, and/or lifetime of the device.

Without wishing to be bound by a particular theory, it may be postulated that certain low energy surfaces may exhibit relatively low initial sticking probabilities and may thus be suitable for forming the patterning coating 420.

Without wishing to be bound by any particular theory, it may be postulated that, especially for low surface energy surfaces, the critical surface tension may be positively correlated with the surface energy. By way of non-limiting example, a surface exhibiting a relatively low critical surface tension may also exhibit a relatively low surface energy, and a surface exhibiting a relatively high critical surface tension may also exhibit a relatively high surface energy.

In reference to Young's equation (Equation (TF10)), a lower surface energy may result in a greater contact angle, while also lowering the $\gamma_{sv}$, thus enhancing the likelihood of such surface having low wettability and low initial sticking probability with respect to the deposited material 1631.

The critical surface tension values, in various non-limiting examples, herein may correspond to such values measured at around normal temperature and pressure (NTP), which in some non-limiting examples, may correspond to a temperature of 20° C., and an absolute pressure of 1 atm. In some non-limiting examples, the critical surface tension of a surface may be determined according to the Zisman method, as further detailed in Zisman, W. A., "*Advances in Chemistry*" 43 (1964), p. 1-51.

In some non-limiting examples, the exposed layer surface 11 of the patterning coating 420 may exhibit a critical surface tension of no more than at least one of about: 20 dynes/cm, 19 dynes/cm, 18 dynes/cm, 17 dynes/cm, 16 dynes/cm, 15 dynes/cm, 13 dynes/cm, 12 dynes/cm, or 11 dynes/cm.

In some non-limiting examples, the exposed layer surface 11 of the patterning coating 420 may exhibit a critical surface tension of at least one of at least about: 6 dynes/cm, 7 dynes/cm, 8 dynes/cm, 9 dynes/cm, and 10 dynes/cm.

Those having ordinary skill in the relevant art will appreciate that various methods and theories for determining the surface energy of a solid may be known. By way of non-limiting example, the surface energy may be calculated, and/or derived based on a series of measurements of contact angle, in which various liquids are brought into contact with a surface of a solid to measure the contact angle between the liquid-vapor interface and the surface. In some non-limiting examples, the surface energy of a solid surface may be equal to the surface tension of a liquid with the highest surface tension that completely wets the surface. By way of non-limiting example, a Zisman plot may be used to determine the highest surface tension value that would result in a contact angle of 0° with the surface. According to some theories of surface energy, various types of interactions between solid surfaces and liquids may be considered in determining the surface energy of the solid. By way of non-limiting example, according to some theories, including without limitation, the Owens/Wendt theory, and/or Fowkes' theory, the surface energy may comprise a dispersive component and a non-dispersive or "polar" component.

Without wishing to be bound by a particular theory, it may be postulated that, in some non-limiting examples, the contact angle of a coating of deposited material 1631 may be determined, based at least partially on the properties (including, without limitation, initial sticking probability) of the patterning coating 420 onto which the deposited material 1631 is deposited. Accordingly, patterning materials 1511 that allow selective deposition of deposited materials 1631 exhibiting relatively high contact angles may provide some benefit.

Those having ordinary skill in the relevant art will appreciate that various methods may be used to measure a contact angle θ, including without limitation, the static, and/or dynamic sessile drop method and the pendant drop method.

In some non-limiting examples, the activation energy for desorption ($E_{des}$ 3831) (in some non-limiting examples, at a temperature T of about 300K) may be no more than at least one of about: 2 times, 1.5 times, 1.3 times, 1.2 times, 1.0 times, 0.8 times, or 0.5 times, the thermal energy. In some non-limiting examples, the activation energy for surface diffusion ($E_s$ 3821) (in some non-limiting examples, at a temperature of about 300K) may exceed at least one of about: 1.0 times, 1.5 times, 1.8 times, 2 times, 3 times, 5 times, 7 times, or 10 times the thermal energy.

Without wishing to be bound by a particular theory, it may be postulated that, during thin film nucleation and growth of a deposited material 1631 at, and/or near an interface between the exposed layer surface 11 of the underlying layer and the patterning coating 420, a relatively high contact angle between the edge of the deposited material 1631 and the underlying layer may be observed due to the inhibition of nucleation of the solid surface of the deposited material 1631 by the patterning coating 420. Such nucleation inhibiting property may be driven by minimization of surface energy between the underlying layer, thin film vapor and the patterning coating 420.

One measure of a nucleation-inhibiting, and/or nucleation-promoting property of a surface may be an initial deposition rate of a given (electrically conductive) deposited material 1631, on the surface, relative to an initial deposition rate of the same deposited material 1631 on a reference surface, where both surfaces are subjected to, and/or exposed to an evaporation flux of the deposited material 1631.

Definitions

In some non-limiting examples, the opto-electronic device may be an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor, and/or a television set.

In some non-limiting examples, the opto-electronic device may be an organic photo-voltaic (OPV) device that converts photons into electricity. In some non-limiting examples, the opto-electronic device may be an electro-luminescent quantum dot (QD) device.

In the present disclosure, unless specifically indicated to the contrary, reference will be made to OLED devices, with the understanding that such disclosure could, in some examples, equally be made applicable to other opto-electronic devices, including without limitation, an OPV, and/or QD device, in a manner apparent to those having ordinary skill in the relevant art.

The structure of such devices may be described from each of two aspects, namely from a cross-sectional aspect, and/or from a lateral (plan view) aspect.

In the present disclosure, a directional convention may be followed, extending substantially normally to the lateral aspect described above, in which the substrate may be the "bottom" of the device, and the layers may be disposed on "top" of the substrate. Following such convention, the second electrode may be at the top of the device shown, even if (as may be the case in some examples, including without limitation, during a manufacturing process, in which at least one layers may be introduced by means of a vapor deposition process), the substrate may be physically inverted, such that the top surface, in which one of the layers, such as, without limitation, the first electrode, may be disposed, may be physically below the substrate, to allow the deposition material (not shown) to move upward and be deposited upon the top surface thereof as a thin film.

In the context of introducing the cross-sectional aspect herein, the components of such devices may be shown in substantially planar lateral strata. Those having ordinary skill in the relevant art will appreciate that such substantially planar representation may be for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device may be shown below in its cross-sectional aspect as a substantially stratified structure, in the plan view aspect discussed below, such device may illustrate a diverse topography to define features, each of which may substantially exhibit the stratified profile discussed in the cross-sectional aspect.

In the present disclosure, the terms "layer" and "strata" may be used interchangeably to refer to similar concepts.

The thickness of each layer shown in the figures may be illustrative only and not necessarily representative of a thickness relative to another layer.

For purposes of simplicity of description, in the present disclosure, a combination of a plurality of elements in a single layer may be denoted by a colon ":", while a plurality of (combination(s) of) elements comprising a plurality of layers in a multi-layer coating may be denoted by separating two such layers by a slash "/". In some non-limiting examples, the layer after the slash may be deposited after, and/or on the layer preceding the slash.

For purposes of illustration, an exposed layer surface of an underlying material, onto which a coating, layer, and/or material may be deposited, may be understood to be a surface of such underlying material that may be presented for deposition of the coating, layer, and/or material thereon, at the time of deposition.

Those having ordinary skill in the relevant art will appreciate that when a component, a layer, a region, and/or a portion thereof, is referred to as being "formed", "disposed", and/or "deposited" on, and/or over another underlying material, component, layer, region, and/or portion, such formation, disposition, and/or deposition may be directly, and/or indirectly on an exposed layer surface (at the time of such formation, disposition, and/or deposition) of such underlying material, component, layer, region, and/or portion, with the potential of intervening material(s), component(s), layer(s), region(s), and/or portion(s) therebetween.

In the present disclosure, the terms "overlap", and/or "overlapping" may refer generally to a plurality of layers, and/or structures arranged to intersect a cross-sectional axis extending substantially normally away from a surface onto which such layers, and/or structures may be disposed.

While the present disclosure discusses thin film formation, in reference to at least one layer or coating, in terms of vapor deposition, those having ordinary skill in the relevant art will appreciate that, in some non-limiting examples, various components of the device may be selectively deposited using a wide variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), chemical vapor deposition (CVD) (including without limitation, plasma-enhanced CVD (PECVD), and/or organic vapor phase deposition (OVPD)), laser annealing, laser-induced thermal imaging (LITI) patterning, atomic-layer deposition (ALD), coating (including without limitation, spin-coating, $d_1$ coating, line coating, and/or spray coating), and/or combinations thereof (collectively "deposition process").

Some processes may be used in combination with a shadow mask, which may, in some non-limiting examples, may be an open mask, and/or fine metal mask (FMM), during deposition of any of various layers, and/or coatings to achieve various patterns by masking, and/or precluding deposition of a deposited material on certain parts of a surface of an underlying material exposed thereto.

In the present disclosure, the terms "evaporation", and/or "sublimation" may be used interchangeably to refer generally to deposition processes in which a source material is converted into a vapor, including without limitation, by heating, to be deposited onto a target surface in, without limitation, a solid state. As will be understood, an evaporation deposition process may be a type of PVD process where at least one source material is evaporated, and/or sublimed under a low pressure (including without limitation, a vacuum) environment to form vapor monomers, and deposited on a target surface through de-sublimation of the at least one evaporated source material. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source), and/or any other type of evaporation source.

In some non-limiting examples, a deposition source material may be a mixture. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness, a film thickness, and/or an average layer, and/or film thickness, of a material, irrespective of the mechanism of deposition thereof, may refer to an amount of the material deposited on a target exposed layer surface, which corresponds to an amount of the material to cover the target surface with a uniformly thick layer of the material having the referenced layer thickness. By way of non-limiting example, depositing a layer thickness of 10 nm of material may indicate that an amount of the material deposited on the surface may correspond to an amount of the material to form a uniformly thick layer of the material that may be 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material 1631 having an actual thickness greater than 10 nm, or other parts of the deposited material 1631 having an actual thickness of no more than 10 nm. A certain layer thickness of a material deposited on a surface may thus correspond, in some non-limiting examples, to an average thickness of the deposited material across the target surface.

In the present disclosure, a reference to a reference layer thickness may refer to a layer thickness of the deposited material (such as Mg), that may be deposited on a reference surface exhibiting a high initial sticking probability or initial sticking coefficient (that is, a surface having an initial sticking probability that is about, and/or close to 1.0). The reference layer thickness may not indicate an actual thickness of the deposited material deposited on a target surface (such as, without limitation, a surface of a patterning coating). Rather, the reference layer thickness may refer to a layer thickness of the deposited material that would be deposited on a reference surface, in some non-limiting examples, a surface of a quartz crystal, positioned inside a deposition chamber for monitoring a deposition rate and the reference layer thickness, upon subjecting the target surface and the reference surface to identical vapor flux 1632 of the deposited material for the same deposition period. Those having ordinary skill in the relevant art will appreciate that in the event that the target surface and the reference surface are not subjected to identical vapor flux simultaneously during deposition, an appropriate tooling factor may be used to determine, and/or to monitor the reference layer thickness.

In the present disclosure, a reference deposition rate may refer to a rate at which a layer of the deposited material would grow on the reference surface, if it were identically positioned and configured within a deposition chamber as the sample surface.

In the present disclosure, a reference to depositing a number X of monolayers of material may refer to depositing an amount of the material to cover a given area of an exposed layer surface with X single layer(s) of constituent monomers of the material, such as, without limitation, in a closed coating.

In the present disclosure, a reference to depositing a fraction of a monolayer of a material may refer to depositing an amount of the material to cover such fraction of a given area of an exposed layer surface with a single layer of constituent monomers of the material. Those having ordinary skill in the relevant art will appreciate that due to, by way of non-limiting example, possible stacking, and/or clustering of monomers, an actual local thickness of a deposited material across a given area of a surface may be non-uniform. By way of non-limiting example, depositing 1 monolayer of a material may result in some local regions of the given area of the surface being uncovered by the material, while other local regions of the given area of the surface may have multiple atomic, and/or molecular layers deposited thereon.

In the present disclosure a target surface (and/or target region(s) thereof) may be considered to be "substantially devoid of", "substantially free of", and/or "substantially uncovered by" a material if there may be a substantial absence of the material on the target surface as determined by any suitable determination mechanism.

In the present disclosure, the terms "sticking probability" and "sticking coefficient" may be used interchangeably.

In the present disclosure, the term "nucleation" may reference a nucleation stage of a thin film formation process, in which monomers in a vapor phase condense onto a surface to form nuclei.

In the present disclosure, in some non-limiting examples, as the context dictates, the terms "patterning coating" and "patterning material" may be used interchangeably to refer to similar concepts, and references to a patterning coating herein, in the context of being selectively deposited to pattern a deposited layer may, in some non-limiting examples, be applicable to a patterning material in the context of selective deposition thereof to pattern a deposited material, and/or an electrode coating material.

Similarly, in some non-limiting examples, as the context dictates, the term "patterning coating" and "patterning material" may be used interchangeably to refer to similar concepts, and reference to an NPC herein, in the context of being selectively deposited to pattern a deposited layer may, in some non-limiting examples, be applicable to an NPC in the context of selective deposition thereof to pattern a deposited material, and/or an electrode coating.

While a patterning material may be either nucleation-inhibiting or nucleation-promoting, in the present disclosure, unless the context dictates otherwise, a reference herein to a patterning material is intended to be a reference to an NIC.

In some non-limiting examples, reference to a patterning coating may signify a coating having a specific composition as described herein.

In the present disclosure, the terms "deposited layer", "conductive coating", and "electrode coating" may be used interchangeably to refer to similar concepts and references to a deposited layer herein, in the context of being patterned by selective deposition of a patterning coating, and/or an NPC may, in some non-limiting examples, be applicable to a deposited layer in the context of being patterned by selective deposition of a patterning material. In some non-limiting examples, reference to an electrode coating may signify a coating having a specific composition as described herein. Similarly, in the present disclosure, the terms "deposited layer material", "deposited material", "conductive coating material", and "electrode coating material" may be used interchangeably to refer to similar concepts and references to a deposited material herein.

In the present disclosure, it will be appreciated by those having ordinary skill in the relevant art that an organic material may comprise, without limitation, a wide variety of organic molecules, and/or organic polymers. Further, it will be appreciated by those having ordinary skill in the relevant art that organic materials that are doped with various inorganic substances, including without limitation, elements, and/or inorganic compounds, may still be considered organic materials. Still further, it will be appreciated by those having ordinary skill in the relevant art that various organic materials may be used, and that the processes described herein are generally applicable to an entire range of such organic materials. Still further, it will be appreciated by those having ordinary skill in the relevant art that organic materials that contain metals, and/or other organic elements, may still be considered as organic materials. Still further, it will be appreciated by those having ordinary skill in the relevant art that various organic materials may be molecules, oligomers, and/or polymers.

As used herein, an organic-inorganic hybrid material may generally refer to a material that comprises both an organic component and an inorganic component. In some non-limiting examples, such organic-inorganic hybrid material may comprise an organic-inorganic hybrid compound that comprises an organic moiety and an inorganic moiety. Non-limiting examples of such organic-inorganic hybrid compounds include those in which an inorganic scaffold is functionalized with at least one organic functional group. Non-limiting examples of such organic-inorganic hybrid materials include those comprising at least one of: a siloxane group, a silsesquioxane group, a polyhedral oligomeric silsesquioxane (POSS) group, a phosphazene group, and a metal complex.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is no more than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

As used herein, an oligomer may generally refer to a material which includes at least two monomer units or monomers. As would be appreciated by a person skilled in the art, an oligomer may differ from a polymer in at least one aspect, including but not limited to: (1) the number of monomer units contained therein; (2) the molecular weight; and (3) other material properties, and/or characteristics. By way of non-limiting example, further description of polymers and oligomers may be found in Naka K. (2014) *Monomers, Oligomers, Polymers, and Macromolecules* (*Overview*), and in Kobayashi S., Müllen K. (eds.) *Encyclopedia of Polymeric Nanomaterials*, Springer, Berlin, Heidelberg.

An oligomer or a polymer may generally include monomer units that may be chemically bonded together to form a molecule. Such monomer units may be substantially identical to one another such that the molecule is primarily formed by repeating monomer units, or the molecule may include plurality different monomer units. Additionally, the molecule may include at least one terminal unit, which may be different from the monomer units of the molecule. An oligomer or a polymer may be linear, branched, cyclic, cyclo-linear, and/or cross-linked. An oligomer or a polymer may include a plurality of different monomer units which are arranged in a repeating pattern, and/or in alternating blocks of different monomer units.

In the present disclosure, the term "semiconducting layer(s)" may be used interchangeably with "organic layer(s)" since the layers in an OLED device may in some non-limiting examples, may comprise organic semiconducting materials.

In the present disclosure, an inorganic substance may refer to a substance that primarily includes an inorganic material. In the present disclosure, an inorganic material may comprise any material that is not considered to be an organic material, including without limitation, metals, glasses, and/or minerals.

In the present disclosure, the terms "EM radiation", "photon", and "light" may be used interchangeably to refer to similar concepts. In the present disclosure, EM radiation may have a wavelength that lies in the visible spectrum, in the infrared (IR) region (IR spectrum), near IR region (NIR spectrum), ultraviolet (UV) region (UV spectrum), and/or UVA region (UVA spectrum) (which may correspond to a wavelength range between about 315-400 nm) thereof, and/or UVB region (UVB spectrum) (which may correspond to a wavelength between about 280-315 nm) thereof.

In the present disclosure, the term "visible spectrum" as used herein, generally refers to at least one wavelength in the visible part of the EM spectrum.

As would be appreciated by those having ordinary skill in the relevant art, such visible part may correspond to any wavelength between about 380-740 nm. In general, electro-luminescent devices may be configured to emit, and/or transmit EM radiation having wavelengths in a range of between about 425-725 nm, and more specifically, in some non-limiting examples, EM radiation having peak emission wavelengths of 456 nm, 528 nm, and 624 nm, corresponding to B(lue), G(reen), and R(ed) sub-pixels, respectively. Accordingly, in the context of such electro-luminescent devices, the visible part may refer to any wavelength between about 425-725 nm, or between about 456-624 nm. EM radiation having a wavelength in the visible spectrum may, in some non-limiting examples, also be referred to as "visible light" herein.

In the present disclosure, the term "emission spectrum" as used herein, generally refers to an electroluminescence spectrum of light emitted by an opto-electronic device. By way of non-limiting example, an emission spectrum may be detected using an optical instrument, such as, by way of non-limiting example, a spectrophotometer, which may measure an intensity of EM radiation across a wavelength range.

In the present disclosure, the term "onset wavelength", as used herein, may generally refer to a lowest wavelength at which an emission is detected within an emission spectrum.

In the present disclosure, the term "peak wavelength", as used herein, may generally refer to a wavelength at which a maximum luminous intensity is detected within an emission spectrum.

In some non-limiting examples, the onset wavelength may be less than the peak wavelength. In some non-limiting examples, the onset wavelength $\lambda_{onset}$ may correspond to a wavelength at which a luminous intensity is no more than at least one of about: 10%, 5%, 3%, 1%, 0.5%, 0.1%, or 0.01%, of the luminous intensity at the peak wavelength.

In some non-limiting examples, an emission spectrum that lies in the R(ed) part of the visible spectrum may be characterized by a peak wavelength that may lie in a wavelength range of about 600-640 nm and in some non-limiting examples, may be substantially about 620 nm.

In some non-limiting examples, an emission spectrum that lies in the G(reen) part of the visible spectrum may be characterized by a peak wavelength that may lie in a wavelength range of about 510-540 nm and in some non-limiting examples, may be substantially about 530 nm.

In some non-limiting examples, an emission spectrum that lies in the B(lue) part of the visible spectrum may be characterized by a peak wavelength $\lambda_{max}$ that may lie in a wavelength range of about 450-460 nm and in some non-limiting examples, may be substantially about 455 nm.

In the present disclosure, the term "IR signal" as used herein, may generally refer to EM radiation having a wavelength in an IR subset (IR spectrum) of the EM spectrum. An IR signal may, in some non-limiting examples, have a wavelength corresponding to a near-infrared (NIR) subset (NIR spectrum) thereof. By way of non-limiting example, an NIR signal may have a wavelength of at least one of between about: 750-1400 nm, 750-1300 nm, 800-1300 nm, 800-1200 nm, 850-1300 nm, or 900-1300 nm.

In the present disclosure, the term "absorption spectrum", as used herein, may generally refer to a wavelength (sub-) range of the EM spectrum over which absorption may be concentrated.

In the present disclosure, the terms "absorption edge", "absorption discontinuity", and/or "absorption limit" as used herein, may generally refer to a sharp discontinuity in the absorption spectrum of a substance. In some non-limiting examples, an absorption edge may tend to occur at wavelengths where the energy of absorbed EM radiation may correspond to an electronic transition, and/or ionization potential.

In the present disclosure, the term "extinction coefficient" as used herein, may generally refer to a degree to which an EM coefficient may be attenuated when propagating through a material. In some non-limiting examples, the extinction coefficient may be understood to correspond to the imaginary component k of a complex refractive index. In some non-limiting examples, the extinction coefficient of a material may be measured by a variety of methods, including without limitation, by ellipsometry.

In the present disclosure, the terms "refractive index", and/or "index", as used herein to describe a medium, may refer to a value calculated from a ratio of the speed of light in such medium relative to the speed of light in a vacuum. In the present disclosure, particularly when used to describe the properties of substantially transparent materials, including without limitation, thin film layers, and/or coatings, the terms may correspond to the real part, n, in the expression N=n+ik, in which N may represent the complex refractive index and k may represent the extinction coefficient.

As would be appreciated by those having ordinary skill in the relevant art, substantially transparent materials, including without limitation, thin film layers, and/or coatings, may generally exhibit a relatively low extinction coefficient value in the visible spectrum, and therefore the imaginary component of the expression may have a negligible contribution to the complex refractive index. On the other hand, light-transmissive electrodes formed, for example, by a metallic thin film, may exhibit a relatively low refractive index value and a relatively high extinction coefficient value in the visible spectrum. Accordingly, the complex refractive index, N, of such thin films may be dictated primarily by its imaginary component k In the present disclosure, unless the context dictates otherwise, reference without specificity to a refractive index may be intended to be a reference to the real part n of the complex refractive index N.

In some non-limiting examples, there may be a generally positive correlation between refractive index and transmittance, or in other words, a generally negative correlation between refractive index and absorption. In some non-limiting examples, the absorption edge of a substance may correspond to a wavelength at which the extinction coefficient approaches 0.

It will be appreciated that the refractive index, and/or extinction coefficient values described herein may correspond to such value(s) measured at a wavelength in the visible spectrum. In some non-limiting examples, the refractive index, and/or extinction coefficient value may correspond to the value measured at wavelength(s) of about 456 nm which may correspond to a peak emission wavelength of a B(lue) subpixel, about 528 nm which may correspond to a peak emission wavelength of a G(reen) subpixel, and/or about 624 nm which may correspond to a peak emission wavelength of a R(ed) subpixel. In some non-limiting examples, the refractive index, and/or extinction coefficient value described herein may correspond to a value measured at a wavelength of about 589 nm, which may approximately correspond to the Fraunhofer D-line.

In the present disclosure, the concept of a pixel may be discussed on conjunction with the concept of at least one sub-pixel thereof. For simplicity of description only, such composite concept may be referenced herein as a "(sub-) pixel" and such term may be understood to suggest either, or both of, a pixel, and/or at least one sub-pixel thereof, unless the context dictates otherwise.

In some nonlimiting examples, one measure of an amount of a material on a surface may be a percentage coverage of the surface by such material. In some non-limiting examples, surface coverage may be assessed using a variety of imaging techniques, including without limitation, TEM, AFM, and/or SEM.

In the present disclosure, the terms "particle", "island", and "cluster" may be used interchangeably to refer to similar concepts.

In the present disclosure, for purposes of simplicity of description, the terms "coating film", "closed coating", and/or "closed film", as used herein, may refer to a thin film structure, and/or coating of a deposited material used for a deposited layer, in which a relevant part of a surface may be substantially coated thereby, such that such surface may be not substantially exposed by or through the coating film deposited thereon.

In the present disclosure, unless the context dictates otherwise, reference without specificity to a thin film may be intended to be a reference to a substantially closed coating.

In some non-limiting examples, a closed coating, in some non-limiting examples, of a deposited layer, and/or a deposited material, may be disposed to cover a part of an underlying surface, such that, within such part, no more than at least one of about: 40%, 30%, 25%, 20%, 15%, 10%, 5%, 3%, or 1% of the underlying surface therewithin may be exposed by, or through, the closed coating.

Those having ordinary skill in the relevant art will appreciate that a closed coating may be patterned using various techniques and processes, including without limitation, those described herein, to deliberately leave a part of the exposed layer surface of the underlying surface to be exposed after deposition of the closed coating. In the present disclosure, such patterned films may nevertheless be considered to constitute a closed coating, if, by way of non-limiting example, the thin film, and/or coating that is deposited, within the context of such patterning, and between such deliberately exposed parts of the exposed layer surface of the underlying surface, itself substantially comprises a closed coating.

Those having ordinary skill in the relevant art will appreciate that, due to inherent variability in the deposition process, and in some non-limiting examples, to the existence of impurities in either, or both of, the deposited materials, in some non-limiting examples, the deposited material, and the exposed layer surface of the underlying material, deposition of a thin film, using various techniques and processes, including without limitation, those described herein, may nevertheless result in the formation of small apertures, including without limitation, pin-holes, tears, and/or cracks, therein. In the present disclosure, such thin films may nevertheless be considered to constitute a closed coating, if, by way of non-limiting example, the thin film, and/or coating that is deposited substantially comprises a closed coating and meets any specified percentage coverage criterion set out, despite the presence of such apertures.

In the present disclosure, for purposes of simplicity of description, the term "discontinuous layer" as used herein, may refer to a thin film structure, and/or coating of a material used for a deposited layer, in which a relevant part of a surface coated thereby, may be neither substantially devoid of such material, nor forms a closed coating thereof. In some non-limiting examples, a discontinuous layer of a deposited material may manifest as a plurality of discrete islands disposed on such surface.

In the present disclosure, for purposes of simplicity of description, the result of deposition of vapor monomers onto an exposed layer surface of an underlying material, that has not (yet) reached a stage where a closed coating has been formed, may be referred to as a "intermediate stage layer". In some non-limiting examples, such an intermediate stage layer may reflect that the deposition process has not been completed, in which such an intermediate stage layer may be considered as an interim stage of formation of a closed coating. In some non-limiting examples, an intermediate stage layer may be the result of a completed deposition process, and thus constitute a final stage of formation in and of itself.

In some non-limiting examples, an intermediate stage layer may more closely resemble a thin film than a discontinuous layer but may have apertures, and/or gaps in the surface coverage, including without limitation, at least one dendritic projection, and/or at least one dendritic recess. In some non-limiting examples, such an intermediate stage layer may comprise a fraction of a single monolayer of the deposited material such that it does not form a closed coating.

In the present disclosure, for purposes of simplicity of description, the term "dendritic", with respect to a coating, including without limitation, the deposited layer, may refer to feature(s) that resemble a branched structure when viewed in a lateral aspect. In some non-limiting examples, the deposited layer may comprise a dendritic projection, and/or a dendritic recess. In some non-limiting examples, a dendritic projection may correspond to a part of the deposited layer that exhibits a branched structure comprising a plurality of short projections that are physically connected and extend substantially outwardly. In some non-limiting examples, a dendritic recess may correspond to a branched structure of gaps, openings, and/or uncovered parts of the deposited layer that are physically connected and extend substantially outwardly. In some non-limiting examples, a dendritic recess may correspond to, including without limitation, a mirror image, and/or inverse pattern, to the pattern of a dendritic projection. In some non-limiting examples, a dendritic projection, and/or a dendritic recess may have a configuration that exhibits, and/or mimics a fractal pattern, a mesh, a web, and/or an interdigitated structure.

In some non-limiting examples, sheet resistance may be a property of a component, layer, and/or part that may alter a characteristic of an electric current passing through such component, layer, and/or part. In some non-limiting examples, a sheet resistance of a coating may generally correspond to a characteristic sheet resistance of the coating, measured, and/or determined in isolation from other components, layers, and/or parts of the device.

In the present disclosure, a deposited density may refer to a distribution, within a region, which in some non-limiting examples may comprise an area, and/or a volume, of a deposited material therein. Those having ordinary skill in the relevant art will appreciate that such deposited density may be unrelated to a density of mass or material within a particle structure itself that may comprise such deposited material. In the present disclosure, unless the context dictates otherwise, reference to a deposited density, and/or to a density, may be intended to be a reference to a distribution of such deposited material, including without limitation, as at least one particle, within an area.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, by way of non-limiting example, be determined based on known literature including without limitation, Luo, Yu-Ran, "*Bond Dissociation Energies*" (2010).

Without wishing to be bound by a particular theory, it is postulated that providing an NPC may facilitate deposition of the deposited layer onto certain surfaces.

Non-limiting examples of suitable materials for forming an NPC may comprise without limitation, at least one metal, including without limitation, alkali metals, alkaline earth metals, transition metals, and/or post-transition metals, metal fluorides, metal oxides, and/or fullerene.

Non-limiting examples of such materials may comprise Ca, Ag, Mg, Yb, ITO, IZO, ZnO, ytterbium fluoride ($YbF_3$), magnesium fluoride ($MgF_2$), and/or cesium fluoride (CsF).

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell, and which may be, without limitation, spherical, and/or semi-spherical in shape. In some non-limiting examples, a fullerene molecule may be designated as $C_n$, where n may be an integer corresponding to several carbon atoms included in a carbon skeleton of the fullerene molecule. Non-limiting examples of fullerene molecules include $C_n$, where n may be in the range of 50 to 250, such as, without limitation, $C_{60}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube, and/or a cylindrical shape, including without limitation, single-walled carbon nanotubes, and/or multi-walled carbon nanotubes.

Based on findings and experimental observations, it may be postulated that nucleation promoting materials, including without limitation, fullerenes, metals, including without limitation, Ag, and/or Yb, and/or metal oxides, including without limitation, ITO, and/or IZO, as discussed further herein, may act as nucleation sites for the deposition of a deposited layer, including without limitation Mg.

In some non-limiting examples, suitable materials for use to form an NPC, may include those exhibiting or characterized as having an initial sticking probability for a material of a deposited layer of at least one of at least about: 0.4, 0.5, 0.6, 0.7, 0.75, 0.8, 0.9, 0.93, 0.95, 0.98, or 0.99.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, no more than a monolayer of an NPC, including without limitation, fullerene, may be provided on the treated surface to act as nucleation sites for deposition of Mg.

In some non-limiting examples, treating a surface by depositing several monolayers of an NPC thereon may result in a higher number of nucleation sites and accordingly, a higher initial sticking probability.

Those having ordinary skill in the relevant art will appreciate than an amount of material, including without limitation, fullerene, deposited on a surface, may be more, or less than one monolayer. By way of non-limiting example, such surface may be treated by depositing at least one of about: 0.1, 1, 10, or more monolayers of a nucleation promoting material, and/or a nucleation inhibiting material.

In some non-limiting examples, an average layer thickness of the NPC deposited on an exposed layer surface of underlying material(s) may be at least one of between about: 1-5 nm, or 1-3 nm.

Where features or aspects of the present disclosure may be described in terms of Markush groups, it will be appreciated by those having ordinary skill in the relevant art that the present disclosure may also be thereby described in terms of any individual member of sub-group of members of such Markush group.

Terminology

References in the singular form may include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" may be used expansively and in an open-ended fashion, and thus should be interpreted to mean "including, but not limited to". The terms "example" and "exemplary" may be used simply to identify instances for illustrative purposes and should not be interpreted as limiting the scope of the invention to the stated instances. In particular, the term "exemplary" should not be interpreted to denote or confer any laudatory, beneficial, or other quality to the expression with which it is used, whether in terms of design, performance or otherwise.

Further, the term "critical", especially when used in the expressions "critical nuclei", "critical nucleation rate", "critical concentration", "critical cluster", "critical monomer", "critical particle structure size", and/or "critical surface tension" may be a term familiar to those having ordinary skill in the relevant art, including as relating to or being in a state in which a measurement or point at which some quality, property or phenomenon undergoes a definite change. As such, the term "critical" should not be interpreted to denote or confer any significance or importance to the expression with which it is used, whether in terms of design, performance, or otherwise.

The terms "couple" and "communicate" in any form may be intended to mean either a direct connection or indirect connection through some interface, device, intermediate component, or connection, whether optically, electrically, mechanically, chemically, or otherwise.

The terms "on" or "over" when used in reference to a first component relative to another component, and/or "covering" or which "covers" another component, may encompass situations where the first component is directly on (including without limitation, in physical contact with) the other component, as well as cases where at least one intervening component is positioned between the first component and the other component.

Directional terms such as "upward", "downward", "left" and "right" may be used to refer to directions in the drawings to which reference is made unless otherwise stated. Similarly, words such as "inward" and "outward" may be used to refer to directions toward and away from, respectively, the geometric center of the device, area or volume or designated parts thereof. Moreover, all dimensions described herein may be intended solely to be by way of example of purposes of illustrating certain examples and may not be intended to limit the scope of the disclosure to any examples that may depart from such dimensions as may be specified.

As used herein, the terms "substantially", "substantial", "approximately", and/or "about" may be used to denote and account for small variations. When used in conjunction with an event or circumstance, such terms may refer to instances in which the event or circumstance occurs precisely, as well as instances in which the event or circumstance occurs to a close approximation. By way of non-limiting example, when used in conjunction with a numerical value, such terms may refer to a range of variation of no more than about ±10% of such numerical value, such as no more than at least one of about: ±5%, ±4%, ±3%, ±2%, ±1%, ±0.5%, ±0.1%, or ±0.05%.

As used herein, the phrase "consisting substantially of" may be understood to include those elements specifically recited and any additional elements that do not materially affect the basic and novel characteristics of the described technology, while the phrase "consisting of" without the use of any modifier, may exclude any element not specifically recited.

As will be understood by those having ordinary skill in the relevant art, for any and all purposes, particularly in terms of providing a written description, all ranges disclosed herein may also encompass any and all possible sub-ranges, and/or combinations of sub-ranges thereof. Any listed range may be easily recognized as sufficiently describing, and/or enabling the same range being broken down at least into equal fractions thereof, including without limitation, halves, thirds, quarters, fifths, tenths etc. As a non-limiting example, each range discussed herein may be readily be broken down into a lower third, middle third, and/or upper third, etc.

As will also be understood by those having ordinary skill in the relevant art, all language, and/or terminology such as "up to", "at least", "greater than", "less than", and the like, may include, and/or refer the recited range(s) and may also refer to ranges that may be subsequently broken down into sub-ranges as discussed herein.

As will be understood by those having ordinary skill in the relevant art, a range may include each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are merely illustrative of the scope of the present disclosure.

It should be appreciated that the present disclosure, which is described by the claims and not by the implementation details provided, and which can be modified by varying, omitting, adding or replacing, and/or in the absence of any element(s), and/or limitation(s) with alternatives, and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in at least one of the above-described examples, whether or not described and illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects, and examples of the disclosure, as well as specific examples thereof, are intended to encompass both structural and functional equivalents thereof and to cover and embrace all suitable changes in technology. Additionally, it is intended that such equivalents include both currently known equivalents as well as equivalents developed in the future, i.e., any elements developed that perform the same function, regardless of structure.

CLAUSES

The present disclosure includes, without limitation, the following clauses:

The device according to at least one clause herein wherein the patterning coating comprises a patterning material.

The device according to at least one clause herein, wherein an initial sticking probability against deposition of the deposited material of the patterning coating is no more than an initial sticking probability against deposition of the deposited material of the exposed layer surface.

The device according to at least one clause herein, wherein the patterning coating is substantially devoid of a closed coating of the deposited material.

The device according to at least one clause herein, wherein at least one of the patterning coating and the patterning material has an initial sticking probability against deposition of the deposited material that is no more than at least one of about: 0.9, 0.3, 0.2, 0.15, 0.1, 0.08, 0.05, 0.03, 0.02, 0.01, 0.008, 0.005, 0.001, 0.0008, 0.0005, 0.0003, and 0.0001.

The device according to at least one clause herein, wherein at least one of the patterning coating and the patterning material has an initial sticking probability against deposition of at least one of silver (Ag) and magnesium (Mg) that is no more than at least one of about: 0.9, 0.3, 0.2, 0.15, 0.1, 0.08, 0.05, 0.03, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of the deposited material of at least one of between about: 0.15-0.0001, 0.1-0.0003, 0.08-0.0005, 0.08-0.0008, 0.05-0.001, 0.03-0.03-0.0003, 0.03-0.0005, 0.03-0.0008, 0.03-0.001, 0.03-0.005, 0.03-0.03-0.01, 0.02-0.0001, 0.02-0.0003, 0.02-0.0005, 0.02-0.0008, 0.02-0.001, 0.02-0.008, 0.02-0.01, 0.01-0.0001, 0.01-0.0003, 0.01-0.0005, 0.01-0.01-0.001, 0.01-0.005, 0.01-0.008, 0.008-0.0001, 0.008-0.0003, 0.008-0.008-0.0008, 0.008-0.001, 0.008-0.005, 0.005-0.0001, 0.005-0.0003, 0.005-0.0008, and 0.005-0.001.

The device according to at least one clause herein, wherein at least one of the patterning coating and the patterning material has an initial sticking probability against deposition of the deposited material that is no more than a threshold value that is at least one of about: 0.3, 0.2, 0.18, 0.15, 0.13, 0.1, 0.08, 0.03, 0.02, 0.01, 0.008, 0.005, 0.003, and 0.001.

The device according to at least one clause herein, wherein at least one of the patterning coating and the patterning material has an initial sticking probability against the deposition of at least one of: Ag, Mg, ytterbium (Yb), cadmium (Cd), and zinc (Zn), that is no more than the threshold value.

The device according to at least one clause herein, wherein the threshold value has a first threshold value against the deposition of a first deposited material and a second threshold value against the deposition of a second deposited material.

The device according to at least one clause herein, wherein the first deposited material is Ag and the second deposited material is Mg.

The device according to at least one clause herein, wherein the first deposited material is Ag and the second deposited material is Yb.

The device according to at least one clause herein, wherein the first deposited material is Yb and the second deposited material is Mg.

The device according to at least one clause herein, wherein the first threshold value exceeds the second threshold value.

The device according to at least one clause herein, wherein at least one of the patterning coating and the patterning material has a transmittance for EM radiation of at least a threshold transmittance value after being subjected to a vapor flux 1632 of the deposited material.

The device according to at least one clause herein, wherein the threshold transmittance value is measured at a wavelength in the visible spectrum.

The device according to at least one clause herein, wherein the threshold transmittance value is at least one of at least about 60%, 65%, 70%, 75%, 80%, 85%, and 90% of incident EM power transmitted therethrough.

The device according to at least one clause herein, wherein at least one of the patterning coating and the patterning material has a surface energy of no more than at least one of about: 24 dynes/cm, 22 dynes/cm, 20 dynes/cm, 18 dynes/cm, 16 dynes/cm, 15 dynes/cm, 13 dynes/cm, 12 dynes/cm, and 11 dynes/cm.

The device according to at least one clause herein, wherein at least one of the patterning coating and the patterning material has a surface energy that is at least one of at least about: 6 dynes/cm, 7 dynes/cm, and 8 dynes/cm.

The device according to at least one clause herein, wherein at least one of the patterning coating and the patterning material has a surface energy that is at least one of between about: 10-20 dynes/cm, and 13-19 dynes/cm.

The device according to at least one clause herein, wherein at least one of the patterning coating and the patterning material has a refractive index for EM radiation at a wavelength of 550 nm that is no more than at least one of about: 1.55, 1.5, 1.45, 1.43, 1.4, 1.39, 1.37, 1.35, 1.32, and 1.3

The device according to at least one clause herein, wherein at least one of the patterning coating and the patterning material has an extinction coefficient that is no more than about 0.01 for photons at a wavelength that exceeds at least one of about: 600 nm, 500 nm, 460 nm, 420 nm, and 410 nm.

The device according to at least one clause herein, wherein at least one of the patterning coating and the patterning material has an extinction coefficient that is at least one of at least about: 0.05, 0.1, 0.2, 0.5 for EM radiation at a wavelength shorter than at least one of at least about: 400 nm, 390 nm, 380 nm, and 370 nm.

The device according to at least one clause herein, wherein at least one of the patterning coating and the patterning material has a glass transition temperature that is no more than at least one of about: 300° C., 150° C., 130° C., 30° C., −30° C., and −50° C.

The device according to at least one clause herein, wherein the patterning material has a sublimation temperature of at least one of between about: 100-320° C., 120-300° C., 140-280° C., and 150-250° C.

The device according to at least one clause herein, wherein at least one of the patterning coating and the patterning material comprises at least one of a fluorine atom and a silicon atom.

The device according to at least one clause herein, wherein the patterning coating comprises fluorine and carbon.

The device according to at least one clause herein, wherein an atomic ratio of a quotient of fluorine by carbon is at least one of about: 1, 1.5, and 2.

The device according to at least one clause herein, wherein the patterning coating comprises an oligomer.

The device according to at least one clause herein, wherein the patterning coating comprises a compound having a molecular structure containing a backbone and at least one functional group bonded thereto.

The device according to at least one clause herein, wherein the compound comprises at least one of: a siloxane group, a silsesquioxane group, an aryl group, a heteroaryl group, a fluoroalkyl group, a hydrocarbon group, a phosphazene group, a fluoropolymer, and a metal complex.

The device according to at least one clause herein, wherein a molecular weight of the compound is no more than at least one of about: 5,000 g/mol, 4,500 g/mol, 4,000 g/mol, 3,800 g/mol, and 3,500 g/mol.

The device according to at least one clause herein, wherein the molecular weight is at least about: 1,500 g/mol, 1,700 g/mol, 2,000 g/mol, 2,200 g/mol, and 2,500 g/mol.

The device according to at least one clause herein, wherein the molecular weight is at least one of between about: 1,500-5,000 g/mol, 1,500-4,500 g/mol, 1,700-4,500 g/mol, 2,000-4,000 g/mol, 2,200-4,000 g/mol, and 2,500-3,800 g/mol.

The device according to at least one clause herein, wherein a percentage of a molar weight of the compound that is attributable to a presence of fluorine atoms, is at least one of between about: 40-90%, 45-85%, 50-80%, 55-75%, and 60-75%.

The device according to at least one clause herein, wherein fluorine atoms comprise a majority of the molar weight of the compound.

The device according to at least one clause herein, wherein the patterning material comprises an organic-inorganic hybrid material.

The device according to at least one clause herein, wherein the patterning coating has at least one nucleation site for the deposited material.

The device according to at least one clause herein, wherein the patterning coating is supplemented with a seed material that acts as a nucleation site for the deposited material.

The device according to at least one clause herein, wherein the seed material comprises at least one of: a nucleation promoting coating (NPC) material, an organic material, a polycyclic aromatic compound, and a material comprising a non-metallic element selected from at least one of oxygen (O), sulfur (S), nitrogen (N), and carbon (C).

The device according to at least one clause herein, wherein the patterning coating acts as an optical coating.

The device according to at least one clause herein, wherein the patterning coating modifies at least one of a property and a characteristic of EM radiation emitted by the device.

The device according to at least one clause herein, wherein the patterning coating comprises a crystalline material.

The device according to at least one clause herein, wherein the patterning coating is deposited as a non-crystalline material and becomes crystallized after deposition.

The device according to at least one clause herein, wherein the deposited layer comprises a deposited material.

The device according to at least one clause herein, wherein the deposited material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), and yttrium (Y).

The device according to at least one clause herein, wherein the deposited material comprises a pure metal.

The device according to at least one clause herein, wherein the deposited material is selected from at least one of pure Ag and substantially pure Ag.

The device according to at least one clause herein, wherein the substantially pure Ag has a purity of at least one of at least about: 95%, 99%, 99.9%, 99.99%, 99.999%, and 99.9995%.

The device according to at least one clause herein, wherein the deposited material is selected from at least one of pure Mg and substantially pure Mg.

The device according to at least one clause herein, wherein the substantially pure Mg has a purity of at least one of at least about: 95%, 99%, 99.9%, 99.99%, 99.999%, or 99.9995%.

The device according to at least one clause herein, wherein the deposited material comprises an alloy.

The device according to at least one clause herein, wherein the deposited material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the deposited material comprises at least one metal other than Ag.

The device according to at least one clause herein, wherein the deposited material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the deposited material comprises an Mg:Yb alloy.

The device according to at least one clause herein, wherein the deposited material comprises an Ag:Mg:Yb alloy.

The device according to at least one clause herein, wherein the deposited layer comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is no more than at least one of about: 1%, 0.1%, 0.01%, 0.001%, 0.0001%, 0.00001%, 0.000001%, and 0.0000001%.

The device according to at least one clause herein, wherein the deposited layer has a composition in which a combined amount of 0 and C is no more than at least one of about: 10%, 5%, 1%, 0.1%, 0.01%, 0.001%, 0.0001%, 0.00001%, 0.000001%, and 0.0000001%.

The device according to at least one clause herein, wherein the non-metallic element acts as a nucleation site for the deposited material on the NIC.

The device according to at least one clause herein, wherein the deposited material and the underlying layer comprise a common metal.

The device according to at least one clause herein, the deposited layer comprises a plurality of layers of the deposited material.

The device according to at least one clause herein, a deposited material of a first one of the plurality of layers is different from a deposited material of a second one of the plurality of layers.

The device according to at least one clause herein, wherein the deposited layer comprises a multilayer coating.

The device according to at least one clause herein, wherein the multilayer coating is at least one of: Yb/Ag, Yb/Mg, Yb/Mg:Ag, Yb/Yb:Ag, Yb/Ag/Mg, and Yb/Mg/Ag.

The device according to at least one clause herein, wherein the deposited material comprises a metal having a bond dissociation energy of no more than at least one of about: 300 kJ/mol, 200 kJ/mol, 165 kJ/mol, 150 kJ/mol, 100 kJ/mol, 50 kJ/mol, and 20 kJ/mol.

The device according to at least one clause herein, wherein the deposited material comprises a metal having an electronegativity of no more than at least one of about: 1.4, 1.3, and 1.2.

The device according to at least one clause herein, wherein a sheet resistance of the deposited layer is no more than at least one of about: 10Ω/□, 5Ω/□, 1Ω/□, 0.5Ω/□, 0.2Ω/□, and 0.1Ω/□.

The device according to at least one clause herein, wherein the deposited layer is disposed in a pattern defined by at least one region therein that is substantially devoid of a closed coating thereof.

The device according to at least one clause herein, wherein the at least one region separates the deposited layer into a plurality of discrete fragments thereof.

The device according to at least one clause herein, wherein at least two discrete fragments are electrically coupled.

The device according to at least one clause herein, wherein the patterning coating has a boundary defined by a patterning coating edge.

The device according to at least one clause herein, wherein the patterning coating comprises at least one patterning coating transition region and a patterning coating non-transition part.

The device according to at least one clause herein, wherein the at least one patterning coating transition region transitions from a maximum thickness to a reduced thickness.

The device according to at least one clause herein, wherein the at least one patterning coating transition region extends between the patterning coating non-transition part and the patterning coating edge.

The device according to at least one clause herein, wherein the patterning coating has an average film thickness in the patterning coating non-transition part that is in a range of at least one of between about: 1-100 nm, 2-50 nm, 3-30 nm, 4-20 nm, 5-15 nm, 5-10 nm, and 1-10 nm.

The device according to at least one clause herein, wherein a thickness of the patterning coating in the patterning coating non-transition part is within at least one of about: 95%, and 90% of the average film thickness of the NIC.

The device according to at least one clause herein, wherein the average film thickness is no more than at least one of about: 80 nm, 60 nm, 50 nm, 40 nm, 30 nm, 20 nm, 15 nm, and 10 nm.

The device according to at least one clause herein, wherein the average film thickness exceeds at least one of about: 3 nm, 5 nm, and 8 nm.

The device according to at least one clause herein, wherein the average film thickness is no more than about 10 nm.

The device according to at least one clause herein, wherein the patterning coating has a patterning coating thickness that decreases from a maximum to a minimum within the patterning coating transition region.

The device according to at least one clause herein, wherein the maximum is proximate to a boundary between the patterning coating transition region and the patterning coating non-transition part.

The device according to at least one clause herein, wherein the maximum is a percentage of the average film thickness that is at least one of about: 100%, 95%, and 90%.

The device according to at least one clause herein, wherein the minimum is proximate to the patterning coating edge.

The device according to at least one clause herein, wherein the minimum is in a range of between about: 0-0.1 nm.

The device according to at least one clause herein, wherein a profile of the patterning coating thickness is at least one of sloped, tapered, and defined by a gradient.

The device according to at least one clause herein, wherein the tapered profile follows at least one of a linear, non-linear, parabolic, and exponential decaying profile.

The device according to at least one clause herein, wherein a non-transition width along a lateral axis of the patterning coating non-transition region exceeds a transition width along the axis of the patterning coating transition region.

The device according to at least one clause herein, wherein a quotient of the non-transition width by the transition width is at least one of at least about: 5, 10, 20, 50, 100, 500, 1,000, 1,500, 5,000, 10,000, 50,000, or 100,000.

The device according to at least one clause herein, wherein at least one of the non-transition width and the transition width exceeds an average film thickness of the underlying layer.

The device according to at least one clause herein, wherein at least one of the non-transition width and the transition width exceeds the average film thickness of the patterning coating.

The device according to at least one clause herein, wherein the average film thickness of the underlying layer exceeds the average film thickness of the patterning coating.

The device according to at least one clause herein, wherein the deposited layer has a boundary defined by a deposited layer edge.

The device according to at least one clause herein, wherein the deposited layer comprises at least one deposited layer transition region and a deposited layer non-transition part.

The device according to at least one clause herein, wherein the at least one deposited layer transition region transitions from a maximum thickness to a reduced thickness.

The device according to at least one clause herein, wherein the at least one deposited layer transition region extends between the deposited layer non-transition part and the deposited layer edge.

The device according to at least one clause herein, wherein the deposited layer has an average film thickness in the deposited layer non-transition part that is in a range of at least one of between about: 1-500 nm, 5-200 nm, 5-40 nm, 10-30 nm, and 10-100 nm.

The device according to at least one clause herein, wherein the average film thickness exceeds at least one of about: 10 nm, 50 nm, and 100 nm.

The device according to at least one clause herein, wherein the average film thickness of is substantially constant thereacross.

The device according to at least one clause herein, wherein the average film thickness exceeds an average film thickness of the underlying layer.

The device according to at least one clause herein, wherein a quotient of the average film thickness of the deposited layer by the average film thickness of the underlying layer is at least one of at least about: 1.5, 2, 5, 10, 20, 50, and 100.

The device according to at least one clause herein, wherein the quotient is in a range of at least one of between about: 0.1-10, and 0.2-40.

The device according to at least one clause herein, wherein the average film thickness of the deposited layer exceeds an average film thickness of the patterning coating.

The device according to at least one clause herein, wherein a quotient of the average film thickness of the deposited layer by the average film thickness of the patterning coating is at least one of at least about: 1.5, 2, 5, 10, 20, 50, and 100.

The device according to at least one clause herein, wherein the quotient is in a range of at least one of between about: 0.2-10, and 0.5-40.

The device according to at least one clause herein, wherein a deposited layer non-transition width along a lateral axis of the deposited layer non-transition part exceeds a patterning coating non-transition width along the axis of the patterning coating non-transition part.

The device according to at least one clause herein, wherein a quotient of the patterning coating non-transition width by the deposited layer non-transition width is at least one of between about: 0.1-10, 0.2-5, 0.3-3, and 0.4-2.

The device according to at least one clause herein, wherein a quotient of the deposited layer non-transition width by the patterning coating non-transition width is at least one of at least: 1, 2, 3, and 4.

The device according to at least one clause herein, wherein the deposited layer non-transition width exceeds the average film thickness of the deposited layer.

The device according to at least one clause herein, wherein a quotient of the deposited layer non-transition width by the average film thickness is at least one of at least about: 10, 50, 100, and 500.

The device according to at least one clause herein, wherein the quotient is no more than about 100,000.

The device according to at least one clause herein, wherein the deposited layer has a deposited layer thickness that decreases from a maximum to a minimum within the deposited layer transition region.

The device according to at least one clause herein, wherein the maximum is proximate to a boundary between the deposited layer transition region and the deposited layer non-transition part.

The device according to at least one clause herein, wherein the maximum is the average film thickness.

The device according to at least one clause herein, wherein the minimum is proximate to the deposited layer edge.

The device according to at least one clause herein, wherein the minimum is in a range of between about: 0-0.1 nm.

The device according to at least one clause herein, wherein the minimum is the average film thickness.

The device according to at least one clause herein, wherein a profile of the deposited layer thickness is at least one of sloped, tapered, and defined by a gradient.

The device according to at least one clause herein, wherein the tapered profile follows at least one of a linear, non-linear, parabolic, and exponential decaying profile.

The device according to at least one clause herein, wherein the deposited layer comprises a discontinuous layer in at least a part of the deposited layer transition region.

The device according to at least one clause herein, wherein the deposited layer overlaps the patterning coating in an overlap portion.

The device according to at least one clause herein, wherein the patterning coating overlaps the deposited layer in an overlap portion.

The device according to at least one clause herein, further comprising at least one particle structure disposed on an exposed layer surface of an underlying layer.

The device according to at least one clause herein, wherein the underlying layer is the patterning coating.

The device according to at least one clause herein, wherein the at least one particle structure comprises a particle material.

The device according to at least one clause herein, wherein the particle material is the same as the deposited material.

The device according to at least one clause herein, wherein at least two of the particle material, the deposited material, and a material of which the underlying layer is comprised, comprises a common metal.

The device according to at least one clause herein, wherein the particle material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), and yttrium (Y).

The device according to at least one clause herein, wherein the particle material comprises a pure metal.

The device according to at least one clause herein, wherein the particle material is selected from at least one of pure Ag and substantially pure Ag.

The device according to at least one clause herein, wherein the substantially pure Ag has a purity of at least one of at least about: 95%, 99%, 99.9%, 99.99%, 99.999%, and 99.9995%.

The device according to at least one clause herein, wherein the particle material is selected from at least one of pure Mg and substantially pure Mg.

The device according to at least one clause herein, wherein the substantially pure Mg has a purity of at least one of at least about: 95%, 99%, 99.9%, 99.99%, 99.999%, or 99.9995%.

The device according to at least one clause herein, wherein the particle material comprises an alloy.

The device according to at least one clause herein, wherein the particle material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the particle material comprises at least one metal other than Ag.

The device according to at least one clause herein, wherein the particle material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the particle material comprises an Mg:Yb alloy.

The device according to at least one clause herein, wherein the particle material comprises an Ag:Mg:Yb alloy.

The device according to at least one clause herein, wherein the at least one particle structure comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is no more than at least one of about: 1%, 0.1%, 0.01%, 0.001%, 0.0001%, 0.00001%, 0.000001%, and 0.0000001%.

The device according to at least one clause herein, wherein the at least one particle structure has a composition in which a combined amount of 0 and C is no more than at least one of about: 10%, 5%, 1%, 0.1%, 0.01%, 0.001%, 0.0001%, 0.00001%, 0.000001%, and 0.0000001%.

The device according to at least one clause herein, wherein the at least one particle is disposed at an interface between the patterning coating and at least one covering layer in the device.

The device according to at least one clause herein, wherein the at least one particle is in physical contact with an exposed layer surface of the patterning coating.

The device according to at least one clause herein, wherein the at least one particle structure affects at least one optical property of the device.

The device according to at least one clause herein, wherein the at least one optical property is controlled by selection of at least one property of the at least one particle structure selected from at least one of: a characteristic size, a size distribution, a shape, a surface coverage, a configuration, a deposited density, and a dispersity.

The device according to at least one clause herein, wherein the at least one property of the at least one particle structure is controlled by selection of at least one of: at least one characteristic of the patterning material, an average film thickness of the patterning coating, at least one heterogeneity in the patterning coating, and a deposition environment for the patterning coating, selected from at least one of a temperature, pressure, duration, deposition rate, and deposition process.

The device according to at least one clause herein, wherein the at least one property of the at least one particle structure is controlled by selection of at least one of: at least one characteristic of the particle material, an extent to which the patterning coating is exposed to deposition of the particle material, a thickness of the discontinuous layer, and a deposition environment for the particle material, selected from at least one of a temperature, pressure, duration, deposition rate, and deposition process.

The device according to at least one clause herein, wherein the at least one particle structures are disconnected from one another.

The device according to at least one clause herein, wherein the at least one particle structure forms a discontinuous layer.

The device according to at least one clause herein, wherein the discontinuous layer is disposed in a pattern defined by at least one region therein that is substantially devoid of the at least one particle structure.

The device according to at least one clause herein, wherein a characteristic of the discontinuous layer is determined by an assessment according to at least one criterion selected from at least one of: a characteristic size, size distribution, shape, configuration, surface coverage, deposited distribution, dispersity, presence of aggregation instances, and extent of such aggregation instances.

The device according to at least one clause herein, wherein the assessment is performed by determining at least one attribute of the discontinuous layer by an applied imaging technique selected from at least one of: electron microscopy, atomic force microscopy, and scanning electron microscopy.

The device according to at least one clause herein, wherein the assessment is performed across an extent defined by at least one observation window.

The device according to at least one clause herein, wherein the at least one observation window is located at at least one of: a perimeter, interior location, and grid coordinate of the lateral aspect.

The device according to at least one clause herein, wherein the observation window corresponds to a field of view of the applied imaging technique.

The device according to at least one clause herein, wherein the observation window corresponds to a magnification level selected from at least one of: 2.00 μm, 1.00 μm, 500 nm, and 200 nm.

The device according to at least one clause herein, wherein the assessment incorporates at least one of: manual counting, curve fitting, polygon fitting, shape fitting, and an estimation technique.

The device according to at least one clause herein, wherein the assessment incorporates a manipulation selected from at least one of: an average, median, mode, maximum, minimum, probabilistic, statistical, and data calculation.

The device according to at least one clause herein, wherein the characteristic size is determined from at least one of: a mass, volume, diameter, perimeter, major axis, and minor axis of the at least one particle structure.

The device according to at least one clause herein, wherein the dispersity is determined from:

$$D = \frac{\overline{S_s}}{\overline{S_n}}$$

where:

$$\overline{S_s} = \frac{\sum_{i=1}^{n} S_i^2}{\sum_{i=1}^{n} S_i}, \overline{S_n} = \frac{\sum_{i=1}^{n} S_i}{n},$$

n is the number of particles 60 in a sample area, $S_i$ is the (area) size of the $I^{th}$ particle, $\overline{S}_n$ is the number average of the particle (area) sizes; and $\overline{S}_s$ is the (area) size average of the particle (area) sizes.

Accordingly, the specification and the examples disclosed therein are to be considered illustrative only, with a true scope of the disclosure being disclosed by the following numbered claims:

What is claimed is:

1. A semiconductor device having a plurality of layers deposited on a substrate and extending in at least one lateral aspect defined by a lateral axis thereof, comprising:
   - at least one low(er)-index coating disposed on a first layer surface;
   - at least one electromagnetic (EM) radiation-modifying layer embedded within the at least one low(er)-index coating and comprising at least one particle structure comprising a deposited material; wherein embedding the at least one particle structure of the at least one EM radiation-modifying layer within the at least one low (er)-index coating modifies an absorption spectrum of the at least one EM radiation-modifying layer for EM radiation passing at least partially therethrough at a non-zero angle relative to the lateral aspect therein in at least a part of an EM spectrum.

2. The device of claim 1, wherein the at least one low(er)-index coating comprises a lower part disposed between the first layer surface and the at least one EM radiation-modifying layer and an upper part disposed on the at least one EM radiation-modifying layer.

3. The device of claim 2, wherein the lower part comprises a first low(er)-index coating and the second part comprises a second low(er)-index coating.

4. The device of claim 1, further comprising a higher-index medium disposed at an index interface with an exposed layer surface of the plurality of low(er)-index coatings, such that the EM radiation-modifying layer is disposed between the index interface and the first layer surface.

5. The device of claim 4, wherein the higher-index medium comprises an organic compound.

6. The device of claim 4, wherein the higher-index medium comprises a capping layer of the device.

7. The device of claim 4, further comprising an air gap disposed beyond the higher-index medium.

8. The device of claim 4, wherein the higher-index medium comprises a higher-index layer deposited on the index interface.

9. The device of claim 4, wherein the higher-index medium is substantially transparent.

10. The device of claim 4, wherein the higher-index medium comprises lithium fluoride (LiF).

11. The device of claim 4, wherein an extinction coefficient of the higher-index medium is one of no more than about: 0.1, 0.08 0.05, 0.03, and 0.01 in at least a sub-range of a visible range of the EM spectrum.

12. The device of claim 1, wherein the EM radiation-modifying layer comprises a discontinuous layer of the at least one particle cluster.

13. The device of claim 3, wherein the first low(er)-index coating is comprised of a first low-index material and the second low(er)-index coating is comprised of a second low-index material.

14. The device of claim 13, wherein the first low-index material and the second low-index material are the same.

15. The device of claim 13, wherein at least one of: the first low(er)-index coating, the first low-index material, the second low(er)-index coating, and the second low-index material, has a refractive index that is at least one of no more than about: 1.7, 1.6, 1.5, 1.45, 1.4, 1.35, 1.3, and 1.25.

16. The device of claim 13, wherein at least one of: the first low(er)-index coating, the first low-index material, the second low(er)-index coating, and the second low-index material, has a refractive index that is at least one of between about: 1.2-1.6, 1.2-1.5, 1.25-1.45, and 1.25-1.4.

17. The device of claim 13, wherein at least one of: the first low(er)-index coating, the first low-index material, the second low(er)-index coating, and the second low-index material, has an extinction coefficient that is one of no more than about: 0.1, 0.08, 0.05, 0.03, and 0.01 in a visible wavelength range of the EM spectrum.

18. The device of claim 1, wherein at least one of the plurality of low(er)-index coatings is substantially transparent.

19. The device of claim 1, wherein an average layer thickness of at least one of the plurality of low(er)-index coatings is one of no more than about: 60 nm, 50 nm, 40 nm, 30 nm, 20 nm, 10 nm, 8 nm, and 5 nm.

20. The device of claim 1, wherein the absorption capability is at least one of: increasing absorption in, decreasing absorption in, shifting up a wavelength range of, shifting down a wavelength range of, an absorption spectrum of EM radiation passing through the device, and any combination of any of these.

21. The device of claim 1, wherein the part of the EM spectrum corresponds to at least one of: a visible range, an infrared (IR) range, a near-infrared (NIR) range, an ultraviolet (UV) range, a UV-A range, a UV-B range, a sub-range of any of these, and any combination of any of these, of the EM spectrum.

22. The device of claim 1, wherein the deposited material is a metal.

23. The device of claim 1, wherein the deposited material comprises at least one of magnesium, silver, and ytterbium.

24. The device of claim 1, wherein the deposited material is co-deposited with a co-deposited dielectric material.

25. The device of claim 1, wherein the at least one particle structure has a characteristic feature selected from at least one of: a size, size distribution, shape, surface coverage, configuration, deposited density, and composition.

26. The device of claim 25, wherein the at least one particle structure has a percentage coverage of one of between about: 10-50%, 10-45%, 12-40%, 15-40%, 15-35%, 18-35%, 20-35%, and 20-30%.

27. The device of claim 25, wherein a majority of the at least one particle structures have a maximum feature size of no more than one of about: 40 nm, 35 nm, 30 nm, 25 nm, and 20 nm.

28. The device of claim 25, wherein the at least one particle structure has a feature size that is at least one of a mean and a median that is one of between about: 5-40 nm, 5-30 nm, 8-30 nm, 10-30 nm, 8-25 nm, 10-25 nm, 8-20 nm, 10-20 nm, 10-15 nm, and 8-15 nm.

29. The device of claim 1, wherein the at least one particle structure comprises a seed about which the deposited material tends to coalesce.

30. The device of claim 1, further comprising a patterning coating disposed on a second layer surface, wherein:
   - the first layer surface is an exposed layer surface of the patterning coating;
   - an initial sticking probability against deposition of the deposited material on a surface of the patterning coating is substantially less than at least one of: 0.3 and the initial sticking probability against deposition of the deposited material on the second layer surface, such that the patterning coating is substantially devoid of a closed coating of the deposited material.

31. The device of claim 30, wherein the patterning coating comprises at least one patterning material.

32. The device of claim 30, wherein the patterning coating comprises a first patterning material having a first initial sticking probability against deposition of the deposited material and a second patterning material having a second initial sticking probability against deposition of the deposited material, wherein the first initial sticking probability is substantially less than the second initial sticking probability.

33. The device of claim 32, wherein the first patterning material is a nucleation inhibiting coating (NIC) material and the second patterning material is selected from at least one of an electron transport layer (ETL) material, Liq, and lithium fluoride (LiF).

34. The device of claim 1, wherein the layers extend in a first portion and a second portion of the at least one lateral aspect, the at least one EM radiation-modifying layer extends across the first portion, the device adapted to pass at least one EM signal through the first portion, at a non-zero angle relative to the layers.

35. The device of claim 34, wherein the at least one EM signal has a wavelength range in at least a part of at least one of the IR spectrum and the NIR spectrum.

36. The device of claim 34, wherein the first portion is substantially devoid of a closed coating of the deposited material.

37. The device of claim 34, wherein the first portion corresponds to at least part of a signal transmissive region.

38. The device of claim 34, wherein the device is adapted to accept the at least one EM signal therethrough, for exchange with at least one under-display component.

39. The device of claim 38, wherein the at least one under-display component comprises at least one of:

a receiver adapted to receive; and a transmitter adapted to emit, the at least one EM signal passing through the device.

40. The device of claim 39, wherein the receiver is an IR detector and the transmitter is an IR emitter.

41. The device of claim 39, wherein the transmitter emits a first EM signal and the receiver detects a second EM signal that is a reflection of the first EM signal.

42. The device of claim 41, wherein the exchange of the first and second EM signals provides biometric authentication of a user.

43. The device of claim 38, wherein the device forms a display panel of a user device enclosing the under-display component therewith.

44. The device of claim 34, wherein the second portion comprises at least one emissive region for emitting the at least one EM signal at a non-zero angle relative to the layers.

45. The device of claim 44, further comprising at least one semiconducting layer disposed on a layer thereof, wherein:

each emissive region comprises a first electrode and a second electrode, the first electrode is disposed between the substrate and the at least one semiconducting layer, and the at least one semiconducting layer is disposed between the first electrode and the second electrode.

46. The device of claim 45 further comprising at least one closed coating of the deposited material disposed on an exposed layer surface thereof in the second portion.

47. The device of claim 46, wherein the second electrode comprises the at least one closed coating of the deposited material.

* * * * *